US010064276B2

(12) United States Patent
Williams et al.

(10) Patent No.: US 10,064,276 B2

(45) Date of Patent: Aug. 28, 2018

(54) 3D BENDABLE PRINTED CIRCUIT BOARD WITH REDUNDANT INTERCONNECTIONS

(71) Applicant: Applied BioPhotonics, Ltd., Hong Kong (CN)

(72) Inventors: Richard K Williams, Cupertino, CA (US); Keng Hung Lin, Chupei (TW)

(73) Assignee: Adventive IPBank, Luxembourg (LU)

( * ) Notice: Subject to any disclaimer, the term of this patent is extended or adjusted under 35 U.S.C. 154(b) by 266 days.

(21) Appl. No.: 14/919,594

(22) Filed: Oct. 21, 2015

(65) Prior Publication Data

US 2017/0118838 A1 Apr. 27, 2017

(51) Int. Cl.

| | |
|---|---|
| ***H05K 1/00*** | (2006.01) |
| ***H05K 1/14*** | (2006.01) |
| ***H05K 3/00*** | (2006.01) |
| ***H05K 3/02*** | (2006.01) |
| ***H05K 3/06*** | (2006.01) |

(Continued)

(52) U.S. Cl.

CPC ............. *H05K 1/148* (2013.01); *H05K 1/147* (2013.01); *H05K 3/0026* (2013.01); *H05K 3/027* (2013.01); *H05K 3/061* (2013.01); *H05K 3/188* (2013.01); *H05K 3/32* (2013.01); *H05K 3/361* (2013.01); *H05K 3/4038* (2013.01); *H05K 3/4691* (2013.01); *H05K 3/06* (2013.01); *H05K 3/24* (2013.01); *H05K 2201/056* (2013.01); *H05K 2201/058* (2013.01); *H05K 2201/10106* (2013.01); *H05K 2201/2009* (2013.01); *H05K 2203/1327* (2013.01)

(58) Field of Classification Search

CPC ........ H05K 1/148; H05K 1/147; H05K 3/361; H05K 2201/056; H05K 2201/058; H05K 2201/2009; H05K 3/4691

USPC ........................................... 174/254; 361/749

See application file for complete search history.

(56) References Cited

U.S. PATENT DOCUMENTS

| | | | | |
|---|---|---|---|---|
| 4,695,258 A * | 9/1987 | Hanson | .................. | H01R 12/79<br>439/329 |
| 5,244,395 A * | 9/1993 | DeSantis | ................ | H05K 3/366<br>439/65 |

(Continued)

FOREIGN PATENT DOCUMENTS

| | | |
|---|---|---|
| RU | 2481754 C1 | 5/2013 |

OTHER PUBLICATIONS

Akulin A., Proektirovanie gibko-zhestkikh pechatnykh plat. Materialy, konstruktsii i osobennosti proektirovaniya, 2007, N8.

*Primary Examiner* — Sherman Ng

(74) *Attorney, Agent, or Firm* — Patentability Associates; David E. Steuber

(57) ABSTRACT

A rigid-flex PCB includes an array of rigid PCB "islands" interconnected by a flexible PCB formed into flexible connectors. The conductive and insulating layers of the flexible PCB extend into the rigid PCBs, giving the electrical connections to the rigid PCBs added resistance to breakage as the rigid-flex PCB is repeatedly stressed by bending and twisting forces. In addition, the durability of the rigid-flex PCB is enhanced by making the power and signal lines driving the rigid PCBs redundant so that a breakage of a line will not necessarily affect the operation of the rigid PCB to which it is attached. The rigid-flex PCB is particularly applicable to light pads used in phototherapy, wherein LEDs mounted on the rigid-PCBs are powered and controlled through the redundant lines in the flexible PCB.

26 Claims, 266 Drawing Sheets

(51) Int. Cl.

| | |
|---|---|
| ***H05K 3/18*** | (2006.01) |
| ***H05K 3/32*** | (2006.01) |
| ***H05K 3/36*** | (2006.01) |
| ***H05K 3/40*** | (2006.01) |
| ***H05K 3/46*** | (2006.01) |
| *H05K 3/24* | (2006.01) |

(56) References Cited

U.S. PATENT DOCUMENTS

| | | | | |
|---|---|---|---|---|
| 6,034,865 | A * | 3/2000 | Roster | H02B 1/20 361/601 |
| 7,980,863 | B1 * | 7/2011 | Holec | H05K 3/363 439/67 |
| 8,007,286 | B1 * | 8/2011 | Holec | H01R 4/02 439/65 |
| 2011/0299292 | A1 | 12/2011 | Preuschl | |
| 2014/0092034 | A1 | 4/2014 | Franklin et al. | |
| 2015/0189765 | A1 * | 7/2015 | Holec | H01R 4/02 228/104 |
| 2015/0202455 | A1 | 7/2015 | Williams et al. | |

* cited by examiner

106

105

| !!! | Circuit Function | Minimal | Good | Superior |
|---|---|---|---|---|
| Critical | • Primary External Connector, ESD<br>• Power Supply, Regulator, Battery<br>• Logic, DSP, ASP, Clock, A/D<br>• MCU, BIOS, NVM, Firmware<br>• Analog / Digital / USB Control, RF<br>• Safety, OTSD, OCSD, OVP | RF ≥ 2<br>Rigid PCB | RF ≥ 3<br>Rigid PCB | RF ≥ 7<br>Rigid PCB |
| Important | • Unique Sensors, Drivers, LEDs<br>• Block level control and processing<br>• RW Data / Scratch Pad Memory<br>• Secondary External connectors<br>• Antenna for RF Links | RF ≥ 1<br>Rigid PCB | RF ≥ 2<br>Rigid PCB | RF ≥ 4<br>Rigid PCB |
| Basic | • 1-of-n Sensor Array Element<br>• 1-of-n Driver Array Element<br>• 1-of-n LED Array Element<br>• POL Regulator, Local Function<br>• Storage Cap, Interconnect Links | RF ≥ 0<br>Rigid PCB | RF ≥ 1<br>Rigid PCB | RF ≥ 3<br>Rigid PCB |
| Ancillary | • Supplemental Sensors<br>• Monitors, Use Tracking Functions<br>• Indicators<br>• Convenience Features<br>• Tertiary Connectors | RF ≥ 0<br>Rigid PCB | RF ≥ 1<br>Rigid PCB | RF ≥ 2<br>Rigid PCB |

Figure 33

Power Distribution System

Regulated Voltage Power Distribution

Signal Distribution

Flex PCB

Rigid PCB

*post laser flex patterning (flex removed cross section)*

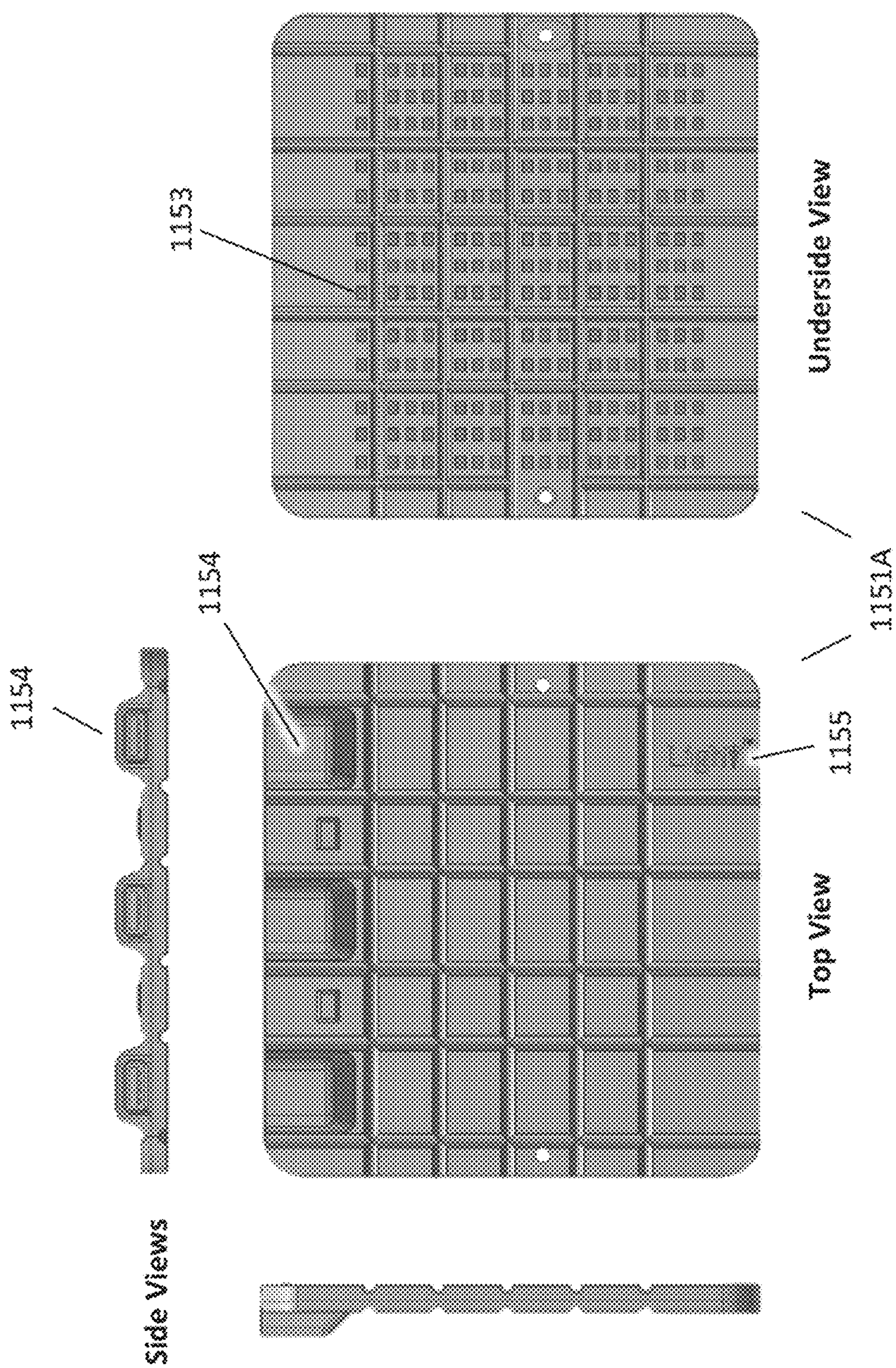
Figure 1018

3D BENDABLE PRINTED CIRCUIT BOARD WITH REDUNDANT INTERCONNECTIONS

FIELD OF THE INVENTION

This invention relates to bendable printed circuit boards with low failure rates during use including methods and apparatus designed for their manufacturing and applications.

BACKGROUND OF THE INVENTION

Printed circuit boards (PCBs) comprise one or more layers of conductors, typically copper, separated by insulting layers such as glass, epoxy, or polyimide on which electronic components are physically mounted, providing mechanical support for electronic circuitry. By soldering components' leads onto the PCB's conductive traces, electronic devices such as integrated circuits, transistors, diodes, resistors, capacitors, inductors, and transformers are electrically interconnected to form electronic circuits. Applications of PCBs include virtually every type of electronic product including cell phones, cameras, lithium ion batteries, tablet computers, notebooks, desktops, servers, network equipment, radios, consumer devices, televisions, set top boxes, industrial electronics, automotive electronics, avionics, and more. FIG. 1 illustrates various examples of printed circuit boards reflecting their diversity in fit, form, and function. In medical, sports, and select consumer electronic devices, PCBs may also be employed in "wearable" electronics, devices that are required to conform to the curved surfaces of the human body.

In electronics, the roles of a PCB are two-fold, firstly mechanical, by functioning as a passive substrate to provide support for electronic components mounted either on the top or alternatively on both the top and bottom of the PCB, and secondly electrical, providing multi-layer interconnections between these components and electrical connectors. In contrast to integrated circuits, where the silicon substrate functions both as mechanical support and the material used to fabricate and form active integrated semiconductor devices, a PCB substrate is "passive" acting only as an insulator. The insulating PCB substrate, also known as a base laminate, may be rigid, flexible, or rigid-flex, as shown in FIG. 2. Rigid PCB 10 comprises an inflexible substrate to which all components and connectors are attached. In contrast flex PCB 11 comprises a flexible circuit board to which components and connectors are attached. Rigid-flex PCBs combine both rigid PCB portion 12 and flex PCB portion 13 combined together into one PCB. Components and connectors may be mounted on either the rigid or flex portions as needed. Each type of PCB offers specific advantages and disadvantages as described in the following sections. A general overview of rigid, flexible, and rigid-flex PCBs is discussed online at https://en.wikipedia.org/wiki/flexible_electronics.

Rigid PCBs

A rigid PCB is one that does not bend, deform, or flex significantly when subjected to mechanical stress. Rigid PCB technology is by far the most popular PCB technology used today, common for any flat or encased product including cell phones, tablets, computers, TVs, and even kitchen appliances. One advantage of a rigid PCB is the substrate absorbs mechanical stress thereby suppressing damage to components and their solder joints. One disadvantage of rigid PCBs is they are intrinsically planar and cannot bend to fit curved surfaces. As such they are not considered good a good solution for bendable or wearable applications.

(Note: As used herein, the term "rigid" is not used in an absolute sense, but rather to mean that the object in question (typically a PCB) does not bend significantly or permanently when exposed to bending forces and will return to its original shape when the bending forces are removed. In particular, the term "rigid," as applied to a PCB, is used in a relative sense to mean that the PCB is more rigid than a flexible PCB to which the rigid PCB is connected.)

Rigid PCB substrates typically comprise phenolic, polyimide, plastic, or other stiff non-conductive materials. One common material used in rigid PCB manufacturing is FR4, an acronym for "fire retardant" material, comprising a woven fiberglass cloth pre-impregnated with epoxy resin. Such substrates may also be referred to as "prepreg" sheets, an abbreviation for preimpregnated bonding sheet. In the manufacturing process known as "lamination", sheets of copper foil are coated, i.e. "laminated" onto the prepreg sheets. During fabrication the combination of pressure and heat activates epoxy resin in the prepreg sheet, causing it to flow conformally between the foil and prepreg sheets, bonding them together. In this context, the term laminate means to unite layers of materials by adhesion or other means into a flat sheet or sandwich, which may be rigid or flexible. The process can be repeated multiple times to create multilayer PCBs. A more detailed description of the well known laminated PCB manufacturing process is described online in the document http://www.4pcb.com/media/presentation-how-to-build-pcb.pdf.

For performing electrical interconnection, rigid PCBs range from single layer PCBs, having only one conductive layer, to multilayer sandwiches comprising four, six or even ten conductive layers of copper "foil" needed for realizing complex systems. In "single layer" PCBs, the copper layer is laminated or plated on only one side of the insulating substrate, with all the components mounted on the same side of the PCB. In "dual-layer" PCBs, the same base insulating laminate is clad with copper on both sides and electronic components may be mounted on either or both surfaces of the PCB. Multi-layer PCBs comprise more than two layers of copper foil clad onto intervening layers of insulating material to form the multi-layer sandwich. The number of layers refers to the number of conductive copper layers in the PCB, e.g. a "four-layer" PCB has four copper layers with three intervening insulating layers together comprising a laminated sandwich of seven layers. The outer copper layers may also be coated with a protective layer for protection against scratches and corrosion, but such protective layers are not considered as part of the lamination process.

Depending on its intended application, copper thickness varies with the amount of copper needed to form each conductive layer in a PCB. Rather than describe each layer by its precise layer thicknesses, for convenience's sake the PCB industry typically describes laminate copper thickness in terms of its "weight", where the layer thickness is linearly proportional to this weight. For historical reasons, PCB industry vernacular refers to copper weight in English units of "ounces" as measured on an area of one square foot. For example, a PCB with 0.5 oz. copper has a copper thickness of 0.7 mils or 17.5 μm; a PCB with 1.0 oz. copper has a metal thickness of 1.4 mils or 35.0 μm, 2 oz. copper has a metal thickness of 2.8 mils or 70 μm, and so on.

Extreme copper thicknesses resulting from 20 oz. to 30 oz. copper can be used for high currents and in power electronics. Thick copper becomes extremely rigid and incurs high stress between the copper and the PCB resulting from differences in the TCE, i.e. the temperature coefficient of expansion, of the dissimilar materials. Extreme stress can lead to a variety of failure modes in a PCB, including board cracking, delamination of the conductive layers, and solder joint cracking.

In PCB manufacturing, copper layers are patterned to form electrical circuits generally through the process of "photolithography". The patterning is performed on a layer-by-layer basis starting with a uniform un-patterned copper laminate clad across the entire planar surface of the insulating substrate. In photolithography, the copper layer to be patterned is first coated with a light sensitive emulsion known as a "photoresist" typically applied in sheets of "dry-film" using heat and pressure. To transfer an image to the resist, an optical mask or "photomask" is used to control which portions of the dry resist sheet are exposed to light and which are not. The photomask is first created using commercially available CAD software resulting in a "gerber file" defining the mask pattern needed for mask manufacturing. The resulting photomask may contain features at the same size as those to be defined on the PCB, or may be optically scaled up or down using an optical instrument known as a "mask aligner" used to align the projected photomask image to any other features already present on the PCB.

Next the photoresist is exposed to light through the patterned mask thereby transferring the image. The photoresist is sensitive to exposure to short wavelength light such a ultraviolet light, but not to longer wavelength visible light, e.g. colors such as yellow or red light. After exposing the photoresist, the resist is "developed" causing the photoresist to be washed away in some regions and retained in others as defined by the portions of the photoresist exposed to light and those is the shadow of the photomask. After developing the photoresist, organic photoresist layer mimics the pattern of the mask through which it was exposed, covering the copper metal in some regions and not in others.

The metal portions that are protected by the photoresist and those that are exposed to etching depend on whether a "positive" or a "negative" photoresist is employed. Positive and negative photoresists react to light in an opposite or complementary manner. Specifically, for positive photoresist, any photoresist regions exposed to light causes the exposed chemical bonds to break, washing away that portion of the photoresist during the developing process. Since photoresist is removed in the light exposed areas, then only in the shadow of the photomask features is photoresist retained, meaning that the remaining photoresist pattern exactly duplicates the photomask features, i.e. dark areas are protected from etching. Everywhere else the metal will be etched away.

In the case of negative photoresist, any photoresist regions exposed to light causes the exposed chemical bonds to cross-link, not break, preserving only the exposed portions of the photoresist during the developing process and washing away the photoresist in the photomask's shadow. Since photoresist is preserved only in the light exposed areas, all dark areas in the mask will be result in unprotected metal to be etched away. The resulting PCB features are therefore exactly opposite, i.e. the negative image, of the photomask.

So the mask polarity, i.e. the dark features and clear portions of the photomask, must correspond to whatever photoresist is employed in the masking operation. After exposure, the photoresist is "hard baked" at a high temperature to strengthen it to withstand prolonged exposure to acid etches. Because the photoresist comprises an organic compound, it is relatively insensitive to exposure to acids, especially after hard baking. The metal is then etched in acid and thereafter the mask is removed. Copper etches generally employ nitric, sulfuric, or hydrofluoric acids either in pure form, diluted by water, or mixed either hydrogen peroxide or some other compound. Ferric chloride or ammonium hydroxide may also be used. The composition of various copper etches can be found online, for example at http://www.cleanroom.byu.edu/wet_etch.phtml.

The photolithographic process must be repeated for each copper layer used. For example, in two-sided PCBs, copper interconnects are laminated on both sides of the intervening insulator and using photolithography, each side must be patterned separately using different masks unique the specific circuit layer. Interconnections of the two sides through the insulating layer are facilitated by conductive vias. A conductive via is a mechanically drilled hole lined or filled with a conductor metal such as a plated metal. The concept of a two layer PCB can be extended to 3, 4, 6 or 8 layer PCBs simply by repeating the processes of lamination, photolithographic patterning, and via formation. Conductive vias may interconnect any two conductive layers, or reach entirely through every layer of the PCB.

Although an entire electronic system can be integrated onto a single rigid PCB, in many instances, the resulting PCB is too large or has the wrong shape to fit in available space. In such cases, the system must be broken into two or more PCBs employing wires or cables between PCBs to facilitate electrical interconnection of the various constituent PCBs. For example, FIG. 3 illustrates an application requiring numerous rigid-PCBs 21 housed in a flexible polymeric pad 22 to form device 20, an LED light-pad used in medical phototherapy applications and designed to bend in one direction in order to conform to various body shapes, e.g. an arm, leg, etc.

As shown, rigid PCBs 21 are interconnected to one another through ribbon cables 27 and associated ribbon cable connectors 28. Using plug and socket type ribbon cable connectors, ideally the inter-board connections electrically behave the same as an on-board connection between two components mounted and connected on a common PCB. In reality, however, the wiring from board-to-board introduces parasitic resistance, capacitance, and inductance that can distort sensitive analog signals, interfere with radio frequency (RF) communication, emit electromagnetic interference (EMI), and limit data communication and clock rates to low frequency operation. These parasitic elements also can adversely impact power distribution and affect voltage regulation accuracy or stability. Moreover, because the flexible pads are positioned in various locations across a patient's body, normal application of the product repeatedly subjects the cable to movement, twisting and pulling.

Repeated movement puts mechanical stress on the solder joint between the wire and the PCB trace, eventually leading to a broken wire or a cracked solder joint, for example on the solder joints connecting discrete wires 24 onto rigid PCB 21 and needed to connect electrically connect rigid PCB 21 to cable 23. In order to reduce stress on the solder joints between the wires and the PCB, strain relief 26 and added support 25 have been included to prevent damage from wire pull during use of device 20. Despite these precautions, electrical connections subjected to repeated flexing, bending, and wire-pull exhibit poor long-term survivability and suffer frequent reliability failures.

Example of PCB interconnection failures include frayed wires 35 and broken wire 36 shown in FIG. 4.

Replacing discrete wires with plugs and connectors can reduce the incidence rate of solder joint failures but introduces several new failure modes including wires being pulled from the plugs in the connector failures 53 and 54 shown in FIG. 5. An alternative interconnection method to eliminate the use of separate wires employs the use of multi-conductor ribbon cables terminated by plug and socket connections In such solutions, sockets are soldered directly onto the PCB and plugs are mechanically and electrically connected to the ribbon cable. To carry the required current, more than one conductor may be required for power connections such as ground or +V (power). In manufacturing, the connector socket is attached onto the PCB at the same time as other components, typically using surface mount technology (SMT) production lines to solder all the components onto the PCB at one time. Attaching the plug to the ribbon cable does not normally utilize solder but instead employs a mechanical technique forcing metal blades to penetrate the ribbon cable's wire insulation connecting each wire in the cable to its own dedicated pin in the plug. During final assembly the plug is pushed into the socket completing the connection.

In applications with repeated movement and flexing, plug and socket connections suffer several failure modes—the most common failure comprising a case where the plug comes loose from the socket and no longer makes a reliable connection between the plug pins and the socket's conductors. Utilizing a clamping socket—a socket that uses tension or a spring-loaded clip to hold the plug securely in place, can largely circumvent socket disconnection failures. Unfortunately, clamping sockets eliminate one failure mode but introduce a new failure mode in the cable. Specifically, if the plug is held tightly in place, during movement, twisting, or pulling, the connection between the ribbon cable and the plug will fail.

Regardless of whether repeated movement or flexing results in an unplugged connector or a broken cable, the interconnection between PCBs will fail and an open circuit will result. In systems comprising a large number of rigid PCBs, e.g. in a series of PCB's used to cover a large area, the number of interconnections further exacerbates the problem with each connector statistically increasing the probability of system failure.

While the use of ribbon cable and their associated plugs and connectors reduce the risk of system failure from wired connection failure-modes such as wire pull or solder joint cracking, ribbon cable is still subject to single point system failure, i.e. where a single wire break results in partial or total system malfunction. For example, if a control wire is broken, the system will not be able to receive commands. In cases where two wires are required to carry the required current, breakage of either wire will cause a single wire to carry too much current leading to excessive voltage drops, overheating, instantaneous wire fusing, or electromigration failure over time.

Insuring PCB connection reliability is especially problematic in applications subject to repeated cycles of flexing. For example, in bendable polymeric pads 73 used in medical phototherapy such as shown in FIG. 6, an integrated circuit comprises a PCB 70 with integrated circuit 71 and LEDs 72 where the components are housed in rigid plastic packages. During phototherapeutic treatment, infrared and (select wavelengths of) visible light 75 from LEDs 72 traverses transparent sanitary barrier 77 penetrating into tissue 76. To insure consistent penetration depth into tissue 76, polymeric pad 73 and flex PCB 70 must bend to match the shape of the body part being treated.

Each flexible polymeric pad is part of a larger system comprising a set of three pads 80*a*, 80*b*, and 80*c* shown in FIG. 7A. Pad 80*a* connects to an electronic driver circuit (not shown) through plug 81 and cable 82 with strain relief and cable connection 83 and to pads 80*b* and 80*c* through connector cables 85*a* and 85*b* and socket 84. The pads are attached to Velcro straps 88 glued in place and bent into shape by pressure from Velcro belt 87. FIG. 7B illustrates the resultant bending in actual use treating knee and leg 91 in medical application 90 and when treating leg 96 in equine veterinarian application 95. In such cases, the flexible polymeric pads 80*a*, 80*b* and 80*c* and their components therein, along with Velcro straps 88, all undergo significant bending stresses and deformation during treatment with repeated flexing cycles each time the pads are reapplied to new patients or treatment areas.

In the event that rigid PCBs are employed, damage to PCBs from deformation as shown in FIG. 8A may include cracked PCB coating 101 in PCB 100 or cracked substrate 103 and broken traces 104 in PCB 102. Another failure mode is cracking of the conductive vias 105 as shown in FIG. 8B. Despite the small size of horizontal hairline crack 106, via 105 is an open circuit. To avoid rigid PCB breakage, a flex PCB can be used for realizing flex circuits as described next.

Flexible PCBs

An alternative solution to implementing a system comprising an array of interconnected rigid PCBs is to utilize a flexible PCB such as shown in FIG. 9. In contrast to rigid PCBs, a flexible PCB is one that bends, flexes, or twists with torque. Flexible PCBs bend on three axes, providing either two-dimensional or full three-dimensional movement depending on their application. Flexible PCBs are often used as a replacement to ribbon cable connectors or to replace rigid PCBs in restricted spaces and tightly assembled electronic devices. Applications employing flex PCBs as interconnects included ink jet printers, flip type cell phones, computer keyboards, and other moving apparatus such as the moving arm in hard disk drive data storage.

Most flex PCBs comprise only passive circuits for interconnection. In some instances flex PCBs may also include components mounted on one or both sides of a flex PCB primarily for fitting into small enclosures such as automotive, industrial and medical device modules. Flex PCBs with attached components are also referred to as flex circuits. Flex PCBs generally utilize much thinner copper layers and thinner insulating substrates than rigid PCBs. Substrates may involve polyester, silk, polyimide, semi-crystalline thermoplastics (also known as PEEK polymers), or flexible plastics and polymeric materials. Like rigid PCBs, flex PCBs may comprise, single, dual or multi-layer constructions generally with conductive vias.

The construction of a flex PCB depends on its intended use. Flex PCBs operating purely as "flex connectors" typically comprise one to four layers and do not contain any components mounted on either side of the flex PCB's surface. In use, such flex-based connectors may be flexed "frequently", i.e. alternating between a flexed (bent) and un-flexed (straight) condition over and over again at regular intervals; flexed "occasionally" seldom changing between flexed and un-flexed states, and flexed "rarely" meaning the shape of the PCB is bent into position during manufacturing and remains unchanged thereafter. In the context of this application, the term "flexing, does not mean simply being in a bent state, but in the metaphor of weightlifting means alternating between being in a straight and bent state repeatedly, generally in repeated cycles.

One common example of a flexed-frequently application includes the flex connector attached to a printer head in an ink jet printer. A flex-occasionally application includes the flex connector connecting a notebook computer's display housed in a hinged lid to the main body of the computer containing its keyboard and motherboard PCB. In this example, each flexing cycle repeats occasionally, i.e. each time the notebook computer is opened and then closed again.

In contrast, flex-infrequently applications of flex PCBs, either for realizing flex PCB connectors or for flex circuits, are best suited for their ability to fit into small, curved, or oddly shaped enclosures as part of the manufacturing process, and are not intended to be used in applications with repeated flexing cycles. Applications of rarely flexed PCBs include a flex connector in a bar type cell phone or a digital camera, where the flexing only occurs infrequently, i.e. when the device is manufactured or repaired. FIG. 9 illustrates several examples of the use of flex PCBs in flex circuitry including flex PCB 112 with numerous ICs and passive components mounted on top of the PCB as shown in the inset 111. Another example of a flex circuit integrates mounted components 114 including a microcontroller and a humidity sensor as well as using the PCB conductive traces as an antenna 113.

Flex PCBs operating as flex circuits typically comprise two to six layers and contain components mounted on one or possibly both sides of the flex PCB. As described, flex PCBs are limited to "rarely-flexed" applications because of the mismatch between the flexible PCB and the rigid components mounted on it. The problematic use of flex circuits, i.e. flex PCBs with mounted components in applications with repeated flexing cycles, damage and breakage occurs because the components themselves do not bend even though the PCB does. Examples of component mounting failures are shown in FIG. 10A where LEDs mounted on a PCB 115 include electrical solder joints 116 connecting the LEDs to the PCB's traces. Cross sectional microphotograph 120Z illustrating copper lead frame 121 attached to the PCB by solder 123, clearly reveals that subjected to repeated bending and deformation, solder cracks 122Z results.

As shown in FIG. 10B, depending on the degree of the bending stress and the frequency of the flexing cycles, the magnitude of the cracks varies widely. For example in contrast to cross-section 120A where solder 123 exhibits no cracking, cross-section 120B exhibits crack 122B damaging around 20% of the solder's attachment width to leadframe 121. By subjecting the PCB to larger stresses or additional flexing cycles, the size of the crack will grow larger. For example, crack 122C in cross section 120C represents damage to over 33% of the solder joint, crack 122D in cross section 120D represents roughly 50% crack damage, and crack 122E in cross section 120E represents a crack 70% of the length of the solder contact to the PCB. In the extreme case shown in cross section 120F, crack 122F extends completely across the solder contact, the lead of leadframe 121 completely separates the lead from the PCB causing an electrically open circuit.

Cracking can also occur on solder joints mounting passive components such as resistors and capacitors. For example in FIG. 10C, cross-section 125 illustrates after repeated stressing passive component 126 attached to PCB by solder 123 exhibits solder cracking 122X. In extreme case shown in cross section 130, flex PCB 132 and conductive trace 133 resulted in cracking 134 of plastic package 131. Other potential defects from repeated flexing includes cracking 138 of bent lead 137 of gull-wing leaded package 138 shown in cross section 135 and solder ball cracking 144 of solder ball 143 connecting BGA or chip-scale package 141 to PCB trace 142 of PCB 146 shown in pictorially in cross section 140 and schematically in FIG. 10D.

The combination of rigid and flex PCBs further exacerbates the problem by requiring connections between the two. Such connections are subject to the same socket-plug failures as ribbon cables described previously.

Rigid-Flexible PCBs

Another variant of a flexible PCB, a rigid-flex PCB is a hybrid of flexible and rigid PCBs laminated into a single PCB with the flexible portion providing an interconnect between large rigid PCBs. Examples of a rigid-flex PCBs are illustrated in FIG. 11A and FIG. 11B. As shown, an intervening flex PCB connects one rigid PCB to another. Examples include a notebook motherboard with the flex PCB acting as an interconnection across the notebook's hinged display module.

As used today, the main advantage of a rigid-flex PCB is it eliminates the need for plugs and sockets to facilitate electrical connections between the rigid PCBs. Each flex PCB is merged into the rigid PCB, in a manner the same as any multiple layer PCB. Interconnection to the flex PCB is accomplished using multilayer via connections shorting rigid PCB layers to flex PCB layers as desired. The main disadvantage is due to the mismatch in mechanical properties between the rigid and flex layers, it is easy to rip the flex PCB by any force applied perpendicular to the plane created by the PCBs near the bar shaped interconnection area, i.e. in the z-direction as illustrated in drawing 170 of FIG. 12A where rigid PCB 171 connects to flex PCB 173 along a thin bar shared intersection expanded in cross section 173. Any substantial force in the z-direction may cause tearing of flex PCB 173 near the rigid PCB.

This unique rigid-flex PCB failure mode is illustrated in the schematic drawing and photo of a torn flex PCB in FIG. 12B. As shown, flex PCB 183 connecting rigid PCB 181 to rigid PCB 182 failed after repeated flexing resulting in flex PCB tear 184 adjacent to rigid PCB 181.

Multi-PCB System Failure

The use of rigid, flex, and rigid-flex PCBs or combinations thereof in multi-PCB electronic systems enables electronics to conform to any arbitrary shape, greatly expanding the application range of electronics. By 3D folding for example, PCBs can be squeezed into enclosures otherwise too small to accommodate required PCB surface areas. By conforming to curves surfaces, PCBs can be fit in motor casings, watch enclosures, miniaturized surveillance cameras, and more. By adjusting to better fit the contours of the human body, wearable electronics for sports applications as well as monitors and therapeutic devices for medical applications can benefit from increased sensor accuracy and improved treatment efficacy.

From an electronics system perspective however, such distributed circuits, i.e. ones where pieces of the circuit are implemented on different PCBs, suffer from numerous system reliability risks associated with communication among the various components. For example, FIG. 13A illustrates distributed electronic system 189A realized across three rigid PCBs 190A, 190B, and 190C and connected by flex PCBs 191A and 191B comprising connections 192 for power 193A, ground 193C and either analog or digital signals 193B as illustrated by the drawing inset expanding the magnification of connections 192 As shown each rigid PCB contains a different circuit or unique function in the overall system. For example, PCB 190A integrates circuit number 1, PCB 190B integrates circuit 2, and circuit 3 is integrated on PCB 190C. Circuit 1, 2 and 3 represent different functions without which the system will malfunction degrading performance or resulting in catastrophic system failure. The failure risk is exacerbated by the required interconnections, in the example shown as flex PCBs 191A and 191B which in a distributed system or in wearable electronics may represent large dimensions relative to the size of the PCBs being interconnected. In such distributed systems, tear 193 to flex PCB 191B may not just sever rigid PCB 190C from the rest of the system but likely can cause the entire system to malfunction or the software to crash. Such distributed systems are sensitive to single point failures and offer little or no protection from mechanical damage to the interconnections between its multiple rigid PCBs.

For example, in distributed electronic system 189B shown in FIG. 13B, tear 194B in the flex PCB results in an open circuit in the conductor carrying power 193A causing a temporary or permanent interruption in power leading to a total system failure. By contrast, in distributed electronic system 189C also in FIG. 13B, tear 194C in the flex PCB results in an open circuit in one or more conductors carrying control signals 193B resulting in system malfunction, affecting normal operation and depending on the function of the interrupted signals, possibly resulting in a total system failure.

Moisture & Corrosion Failures

Another physical mechanism that may result in immediate or gradual system malfunction is moisture-induced electrical failure. In the event that a PCB is immersed in or subjected to any conductive or slightly conductive fluid, an electrical short may result, either impairing or potentially damaging a circuit or system. Common examples of fluids include beverages, fresh water, and salt water. For example, in the photos of FIG. 14A, water damage results in localized defects 197C, 197D and 197E shorting out circuitry and impairing or disabling system operation. In wearable electronics, circuitry and PCBs may also be subjected to rain and to body sweat. Sweat is especially problematic because it contains salt and other electrolytes making it more electrically conductive. Continuous exposure to salty or acidic water can deposit salts on top of a PCB or result in corrosion of the PCB surface as shown in damage to the PCB surface 197B and to electrical leads and solder joints 197A. Failures may comprise electrical shorts or because of corrosion may also result in electrical open circuits. Operation of electrical systems in the presence of fluids, moisture, or high humidity may also result in the growth of conductive filaments as shown in photo 197G in FIG. 14B, or damage to PCB edge connectors as shown by 197F.

Coating flex PCBs with a protective layer is problematic because the coating invariably cracks with repeated flexing. Coating rigid PCBs is beneficial but does not support bendable or wearable PCB applications.

Conclusion

What is needed is a technology able to reliably interconnect a variety of printed circuit boards over a large area bendable to fit any shape, contour or form factor without being sensitive to moisture-related or mechanically induced interconnect failures. Such a system should be applicable to large area distributed systems, to ultra-compact systems, and to medical and wearable electronics designed to fit snuggly against anyone's body or conform to any shape, fixed or adapting to movement without breakage or electrical failure. Ideally, even in the event some breakage does occur, the system would still be able to survive the damage and continue operation even after being broken.

SUMMARY OF THE INVENTION

The above-referenced problems are overcome in an array of rigid printed circuit boards (PCBs) interconnected by a flexible PCB formed into flexible connectors. Each of the rigid PCBs is connected to at least one line, which could be a power line or a signal line. In most embodiments, each rigid PCB is connected to at least two power lines, e.g., a supply voltage line and a ground line, and a plurality of signal lines.

At least one of the rigid PCBs in the array is connected to at least two lines, each of which carries the same power voltage or signal. As a result, if one of the lines should break, the rigid PCB will still receive the power voltage or signal carried by the broken line and will therefore continue to function normally. In many embodiments, the at least two lines connected to the rigid PCB are housed in a flexible PCB.

The at least two lines may comprise a first line and a second line. The first line may be electrically connected between the rigid PCB and a second rigid PCB in the array. The second line may be connected between the rigid PCB and a third rigid PCB in the array.

The at least two lines may comprise a first power line and a second power line, each of the first and second power lines carrying the same power voltage. The first power line is electrically connected between the rigid PCB and a second rigid PCB in the array. The second power line is connected between the rigid PCB and a third rigid PCB in the array.

The at least two lines may comprise a first signal line and a second signal line, each of the first and second signal lines carrying the same signal. The first signal line is electrically connected between the rigid PCB and a second rigid PCB in the array. The second signal line is connected between the rigid PCB and a third rigid PCB in the array.

In some embodiments one of the rigid PCBs in the array is connected to at least a first power line and a second power line, each of the first and second power lines carrying the same power voltage, and to at least a first signal line and a second signal line, each of the first and second signal lines carrying the same signal. The first power line and first signal line are electrically connected to a second rigid PCB in the array and the second power line and the second signal are electrically connected to a third rigid PCB in the array.

In the example above, the rigid PCB has a redundancy factor (RF) of one, meaning that the rigid PCB is connected to one extra line carrying the signal and one extra line carrying the power voltage. The rigid PCB may also be connected to a fourth rigid PCB in the array by a third power line carrying the power voltage and a third signal line carrying the signal, thereby giving it an RF or two. Similarly, the rigid PCB may be connected to any number of additional power lines carrying the power voltage and any number of additional signal lines carrying the signal, giving the rigid PCB any desired RF. Moreover, additional power lines carrying a plurality of power voltages (e.g., $V_1$, $V_2$ . . . $V_n$)—one of which may be a ground voltage—and additional signal lines carrying a plurality of signals ($S_1$, $S_2$ . . . $S_n$) may be connected to the rigid PCB, and each of power lines and signal lines may be multiplied to give it a desired RF. The various power lines and signal lines may have different RFs. For example, critical lines without which the rigid PCB cannot operation may be given a high RF; less important lines may be given a lower RF or no redundancy at all.

Some embodiments comprise an array of rigid PCBs, with each rigid PCB in the array being connected to certain other rigid PCBs in the array by means of flexible connectors (a structure sometimes referred to as a "rigid-flex PCB"), the flexible connectors comprising power and signal lines in a sufficient number to give each rigid PCB a desired RF for each power voltage and signal that it uses. Various components may be mounted on the rigid PCBs.

In one group of embodiments a light-emitting diode (LED) is mounted on each rigid PCB. Such embodiments are particularly useful in the field of phototherapy, as described in application Ser. No. 14/073,371, filed Nov. 6, 2013, Ser. No. 14/460,638, filed Aug. 15, 2014, and Ser. No. 14/461,147, filed Aug. 15, 2014, each of which is incorporated herein by reference in its entirety. For durability and ease of use, the rigid PCBs and flexible PCB may be encased in a flexible (e.g., polymeric) pad, with openings formed in cover to permit the light emitted by the LEDs to reach the body of a patient. The two-dimensional flexibility of the rigid PCB array and flexible PCBs allows the assembly to be wrapped around various body parts—arms, knees, shoulders, etc.

According to one aspect of the invention, the rigid PCB comprises a rigid insulating layer, a patterned conductive layer, a flexible conductive layer and a flexible insulating layer, the flexible conductive layer and flexible insulating layer also being comprised within, and extensions of, the flexible PCB. In the rigid PCB the patterned conductive layer is formed on one surface of the rigid insulating layer. The opposite surface of the rigid insulating layer is bonded to either the flexible conductive layer or the flexible insulating layer. The rigid PCB may also comprise a stack of multiple conductive layers separated by rigid insulating layers. In many embodiments the flexible conductive layer comprises a metal layer.

The patterned conductive layer and a component connected thereto may be electrically connected to the flexible conductive layer. This electrical connection between the patterned conductive layer and the flexible conductive layer may comprise a conductive via extending through the rigid insulating layer.

The rigid and flexible PCBs may comprise a plurality of flexible conductive layers separated from each other and from the surrounding environment by flexible insulating layers. Any one of the rigid or flexible conductive layers may be electrically connection to any of the other rigid or flexible conductive layers by means of a conductive via through one or more of the insulating layers. If a conductive via is required to pass through, without electrically contacting, a conductive layer, the conductive via may be electrically isolated from the conductive layer it must pass through by a layer of insulation of the walls of the via.

The invention also comprises a method of fabricating a rigid-flex PCB. The method comprises attaching a flexible protective cap insulating layer to a flexible conductive layer, attaching a PCB conductive layer to a rigid insulating layer, attaching the rigid insulating layer to the flexible protective cap insulating layer, patterning the PCB conductive layer to form a patterned conductive layer in an area where a rigid PCB is to be located, removing the rigid insulating layer in an area where a flexible connector is to be located. This may be followed by removing the flexible protective cap insulating layer and the flexible conductive layer in an area where neither the rigid PCB nor the flexible PCB is to be located, preferably using a laser beam, thereby to form a flexible connector.

The method may also include one or more of the following steps: photomasking and etching the PCB conductive layer so as to form the patterned conductive layer; photomasking and etching the flexible conductive layer so as to form a patterned flexible conductive layer and filling openings formed thereby in the flexible conductive layer with planarizing insulators; forming a via through the rigid insulating layer and the flexible protective cap insulating layer so as to expose the flexible conductive layer and depositing a conductive material in the via so as to form an electrical connection between the patterned conductive layer and the flexible conductive layer; forming a thru via through the rigid insulating layer, the flexible protective cap insulating layer, and the flexible conductive layer and depositing a conductive material in the thru via; plating a metal layer on the patterned conductive layer; and coating a protective coating on portions of the plated metal layer.

The method may also include depositing an interfacial layer on the flexible protective cap layer. The interfacial layer is treated so as to selectively harden portions of the interfacial layer in the rigid PCB while leaving the portions of the interfacial layer in the flexible PCB in a less rigid state. The interfacial layer may comprise an uncured organic, epoxy or polymeric material and it may be hardened chemically or optically.

An intermediate insulating layer may be attached to the surface of the flexible conductive layer opposite from the flexible protective cap insulating layer, and a "mirror image" of the above-described method may be performed on the intermediate insulating layer to form a rigid PCB on both sides of which components may be mounted, i.e., a two-sided rigid PCB. In such cases, the method may comprise forming a via through the flexible protective cap insulating layers and the flexible conductive layers on both sides of the intermediate insulating layer and depositing a conductive material in the via so as to form an electrical connection between the flexible conductive layers on both sides of the intermediate insulating layer.

More generally, the rigid and flexible PCBs may comprise any number of flexible conductive layers, whether or not the rigid PCB is two-sided. In fact, where multiple lines are connected to a rigid PCB and an RF of two or greater is required for some of those lines, some of the lines will need to cross one another, and the flexible PCB will comprise at least two flexible conductive layers so that the crossing lines do not electrically contact each other. Near the crossing points, a pair of vias between the two flexible conductive layers may be used to route one of the lines under the other lines, a structure referred to herein as a "cross under." Of course, the vias could also be used to route one of the lines over the other.

In many embodiments the steps of patterning the PCB conductive layer and removing the rigid insulating layer will be carried out so as to form an array of PCB "islands" surrounded by flexible conductive material, and the steps of removing the flexible protective cap insulating layer and the flexible conductive layer will be carried out so as to create a web of flexible connectors between the PCB "islands," providing the desired RF for each line running into each of the PCB "islands."

In an alternative method, no rigid conductive layer or PCB conductive layer is used. Instead a "quasi PCB" is formed by printing with a movable print head a relatively thick layer of, for example, a polymeric material or polyimide compound, onto the flexible protective cap layer in areas where "quasi PCBs" are to be located. Openings may be left in the relatively thick layer where vias to the flexible conductive layer are to be formed, and a thinner layer of the same material may be printed onto areas where the flexible PCB are to be located. The thickness of the thinner layer may be calibrated such that an etching process removes the thinner layer while a via is formed in the flexible protective cap layer, exposing the flexible conductive layer, eliminating the need for photomasking. The movable print head may then be used to print a patterned layer of conductive material onto the relatively thick layer and to fill the via and contacting the flexible conductive layer.

Whichever method is used to form the PCBs or quasi-PCBs and flexible PCBs, electronic or other component are then mounted onto the PCBs or quasi-PCBs and the electronic system is protected against mechanical damage, moisture, and other environmental conditions.

For a more thorough understanding the invention in its various aspects, reference is made the following detailed description and drawings.

BRIEF DESCRIPTION OF THE DRAWINGS

In the drawings listed below, components that are generally similar are given like reference numerals.

FIG. 4C is a photograph comparing good and defective PCB solder joints.

FIG. 16F is a schematic representation showing the shortest signal path between rigid PCBs.

FIG. 16K is a schematic representation showing yet another alternate redundant signal path bypassing two signal-path breaks via six rigid PCBs.

FIG. 16L is a schematic representation showing a redundant signal path bypassing two signal-path breaks via four rigid PCBs.

FIG. 17B is a schematic representation of an array of rigid PCBs highlighting a redundant conductive path of a power-bus interconnection facilitated by two rigid and three flex connectors.

FIG. 28B is a simplified block diagram representing a generalized rectangular electrical network topology including vertical end cap interconnections.

FIG. 33 is a table contrasting the partitioning of various circuit functions into circuit components of varying redundancy factors.

FIG. 37D is a schematic example of a redundant power bus for a distributed sensor system.

FIG. 38A is a schematic example of wired-OR over-temperature protection circuit.

FIG. 38B is a schematic example of wired-OR interconnections of multiple over-temperature protections circuits connected to a local sensor interface with $I^2C$ connectivity.

FIG. 38C is a schematic example of parallel distributed diode temperature sensors interconnected to a sensor interface circuit with $I^2C$ connectivity.

FIG. 39A is a schematic example of a digitized diode temperature sensor circuit with PC connectivity.

FIG. 39B is a schematic example of parallel distributed diode temperature sensors interconnected to a digitized interface circuit with $I^2C$ connectivity.

FIG. 39C is a schematic example of multiplexed distributed diode temperature sensors interconnected to a digitized interface circuit with $I^2C$ connectivity.

FIG. 39D is a schematic example discrete diode temperature sensors interconnected to a digitized interface circuit with $I^2C$ connectivity.

FIG. 40A is a schematic example of a basic-level LED drive circuit.

FIG. 40B is a schematic example of a distributed homogeneous array of LED drive circuits.

FIG. 40C is a schematic example of a distributed homogeneous array of LED drive circuits with $I^2C$ connectivity.

FIG. 40D is a schematic example of a ancillary-level (RF=−1) distributed heterogeneous array of LED drive circuits.

Figure 40A:
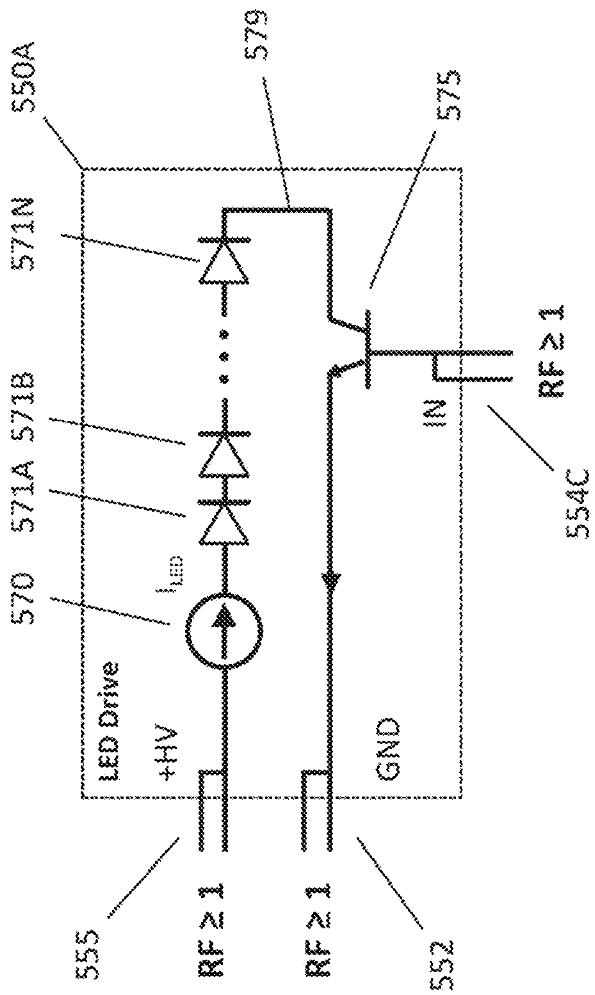
Figure 40B:
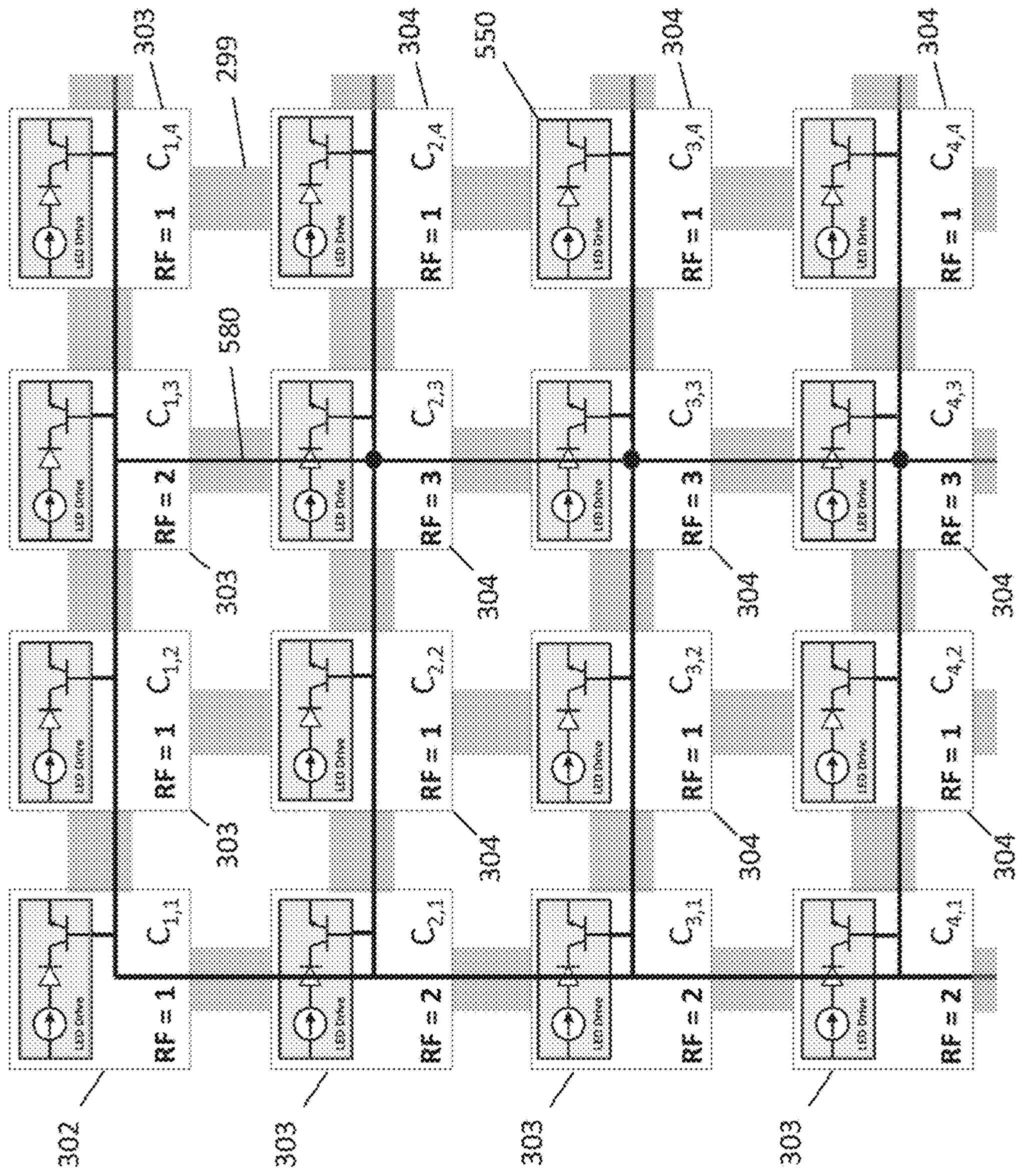
Figure 40C:
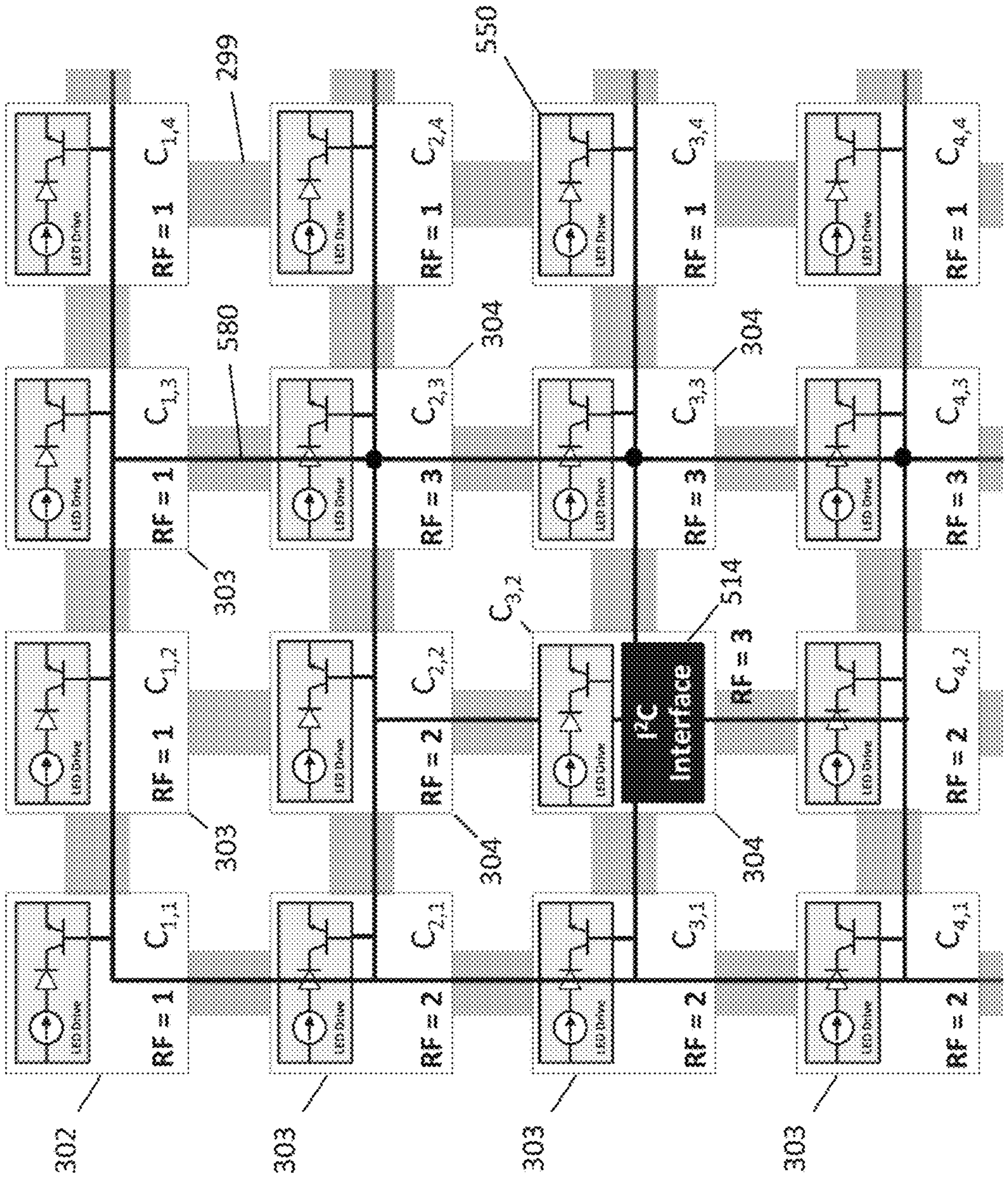
Figure 40D:
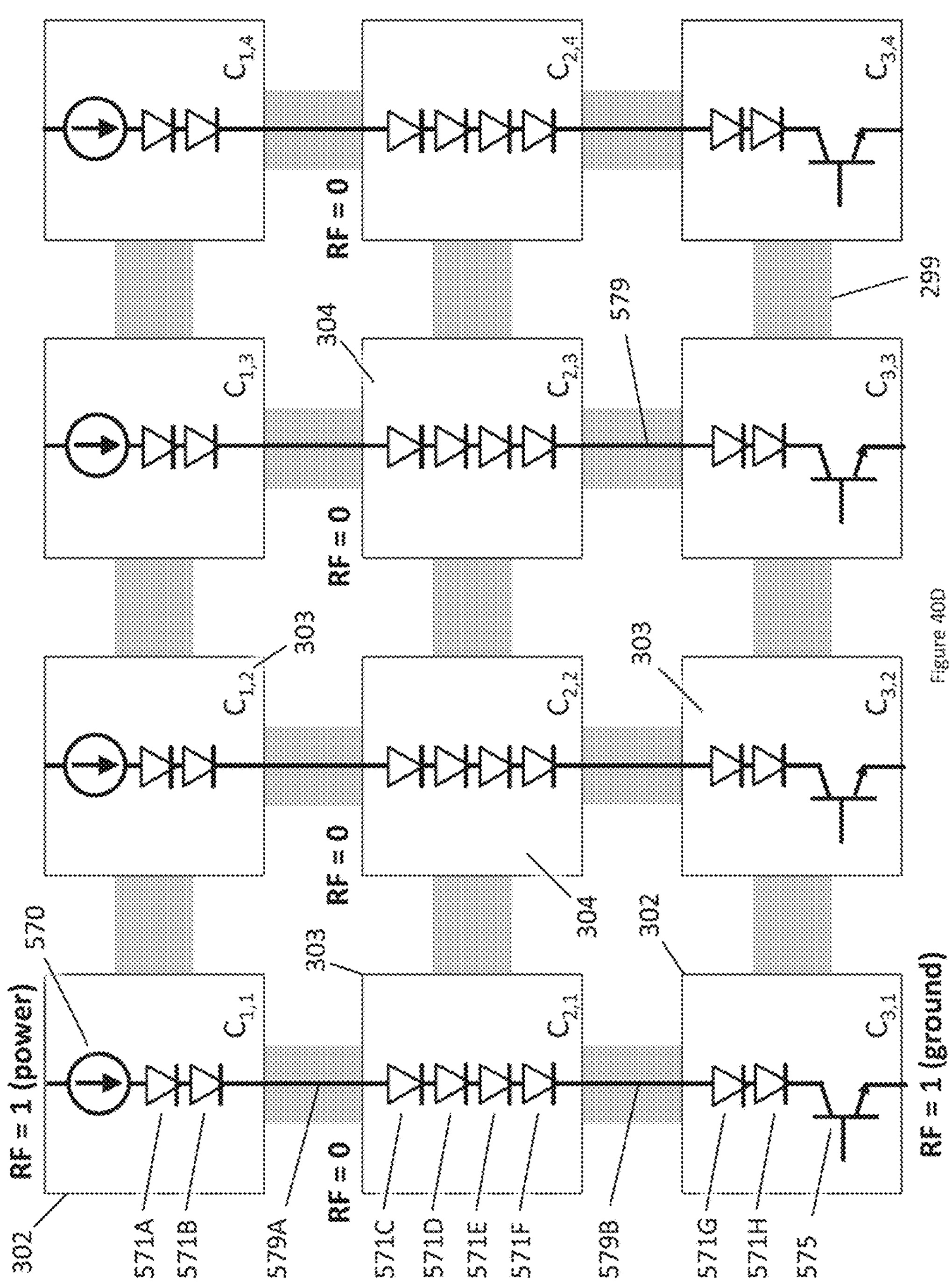
Figure 40E:
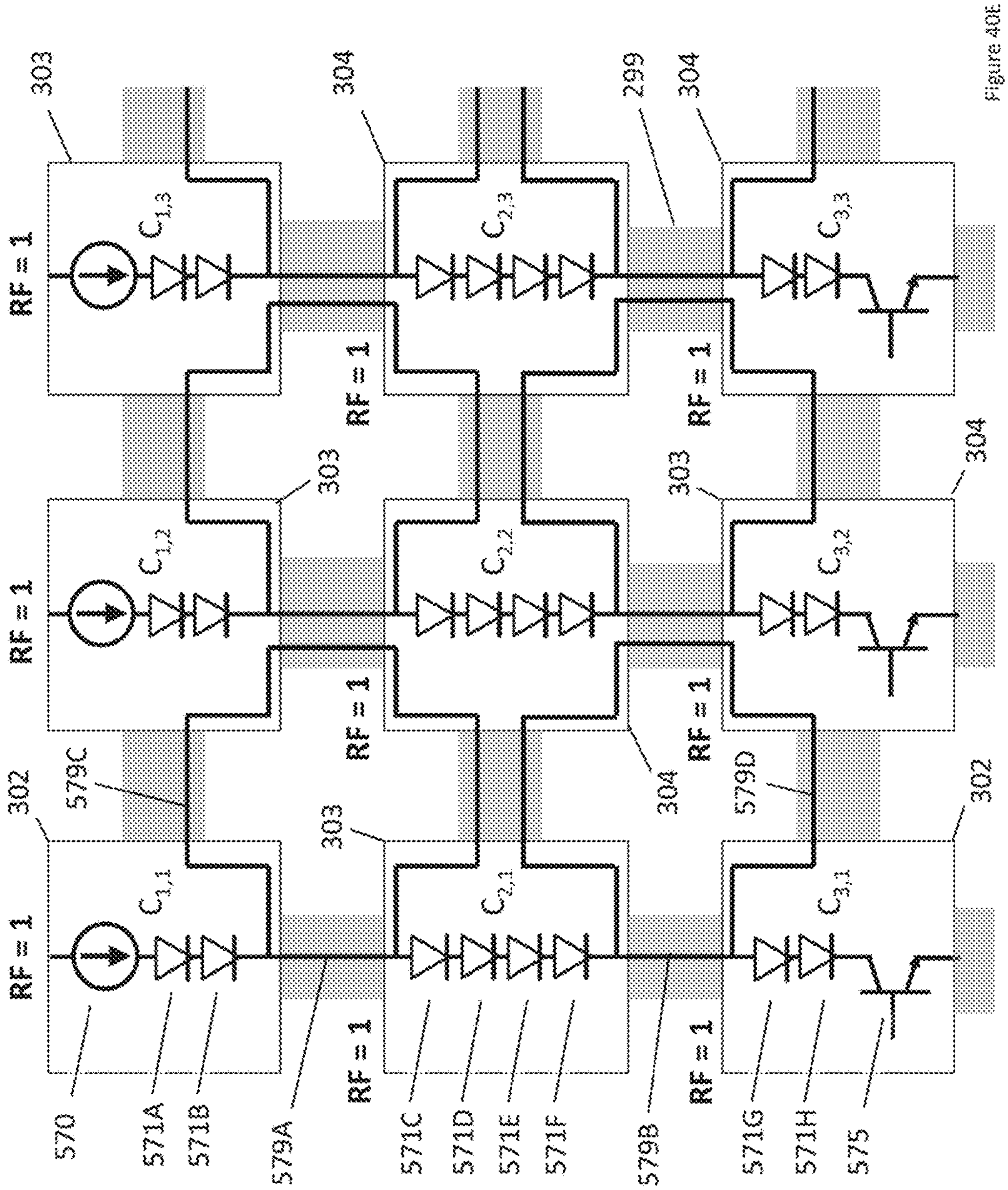

FIG. 40E is a schematic example of a basic-level (RF=2) distributed heterogeneous array of LED drive circuits.

Figure 40F:
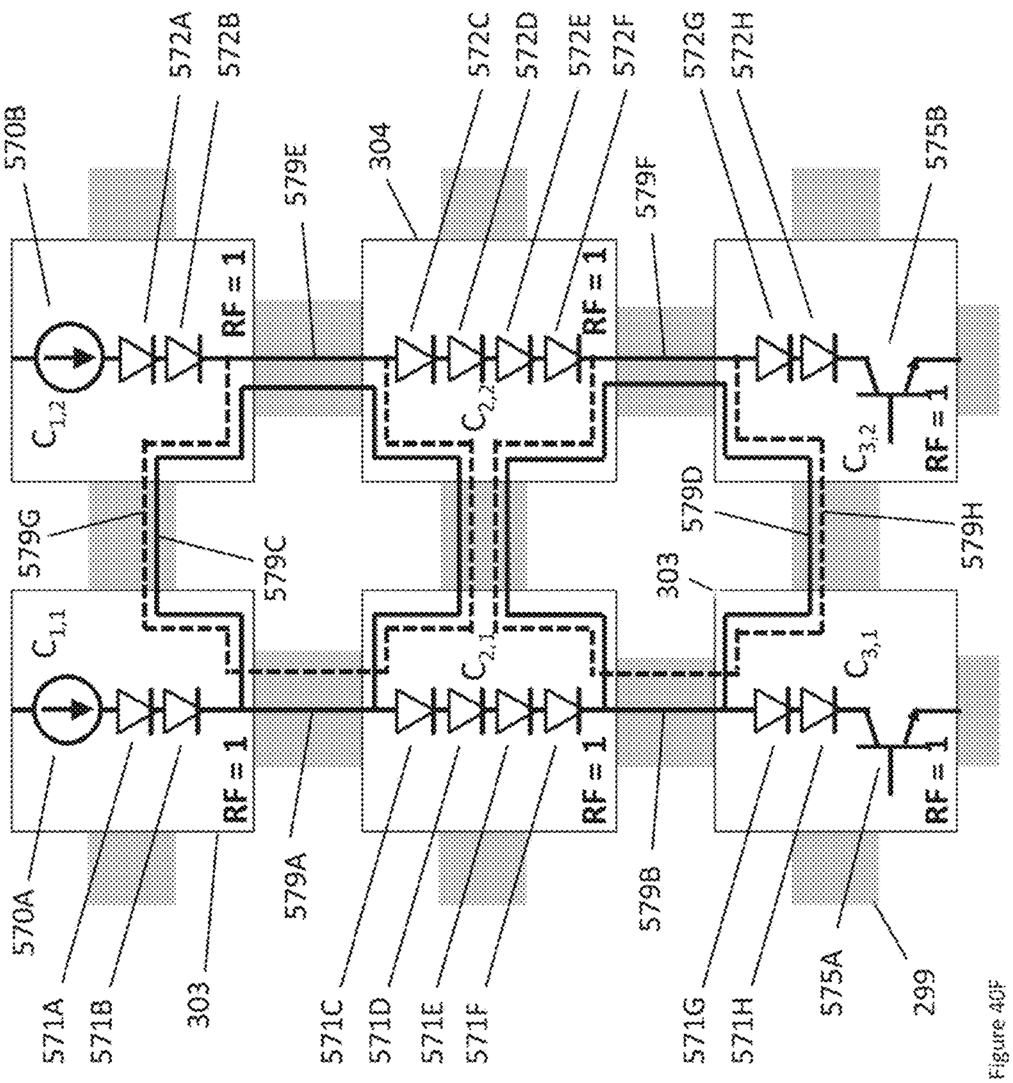

FIG. 40F is a schematic example of an alternate basic-level (RF=2) distributed heterogeneous array of LED drive circuits.

Figure 41:
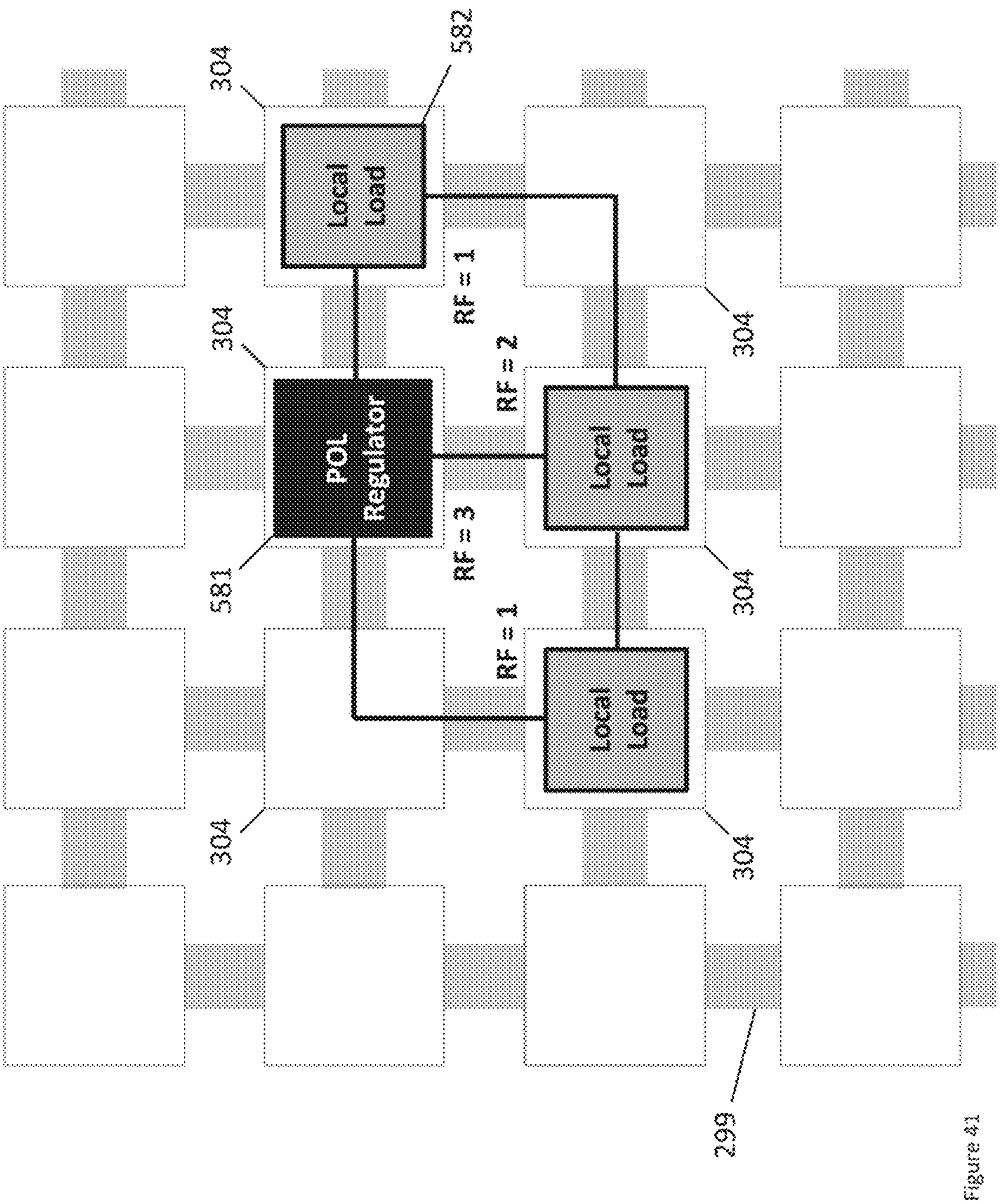

FIG. 41 is a schematic example of a POL regulator and several local electrical loads.

Figure 42:
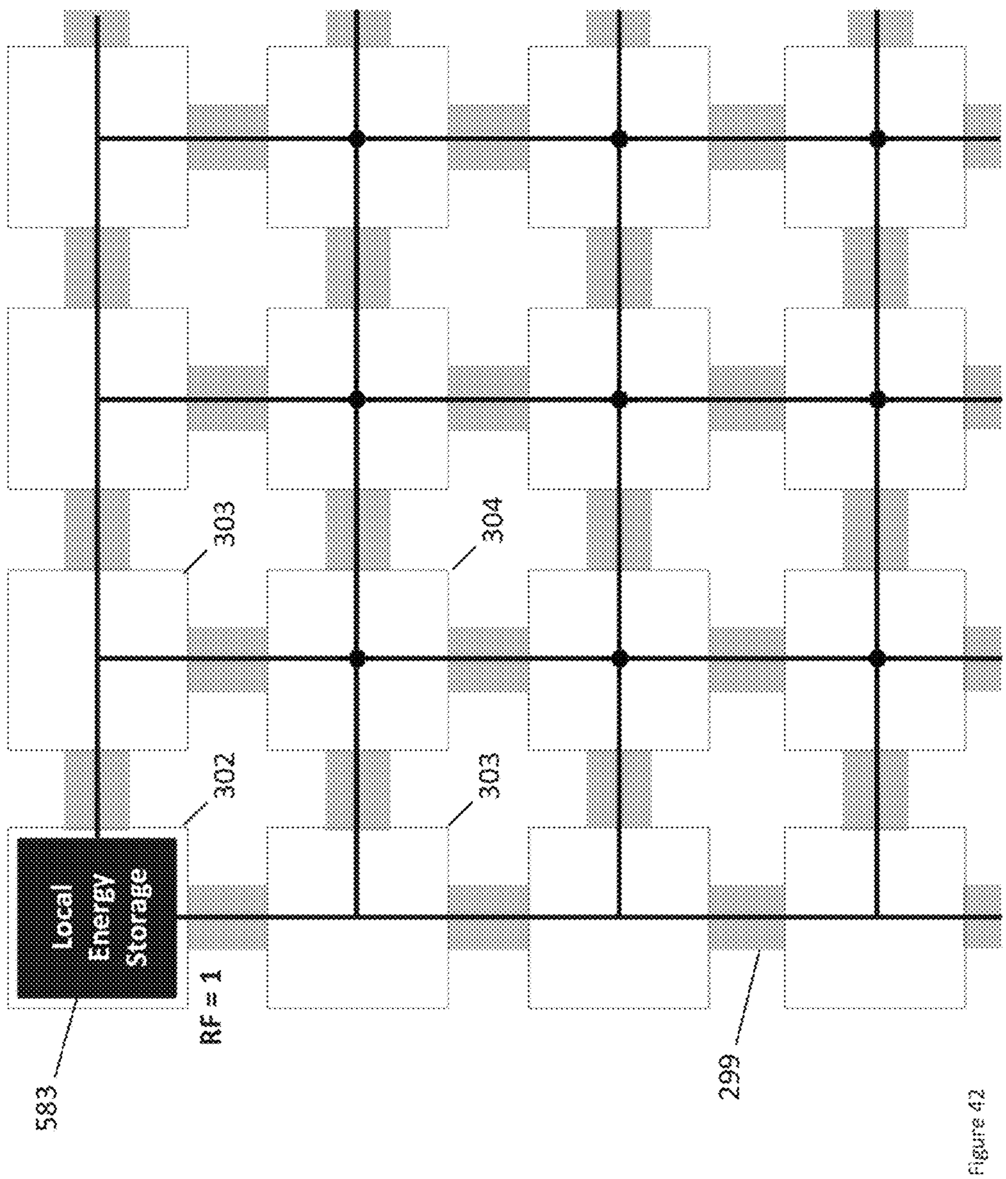

FIG. 42 is a schematic example of a local energy storage circuit and distribution circuit.

Figure 43:
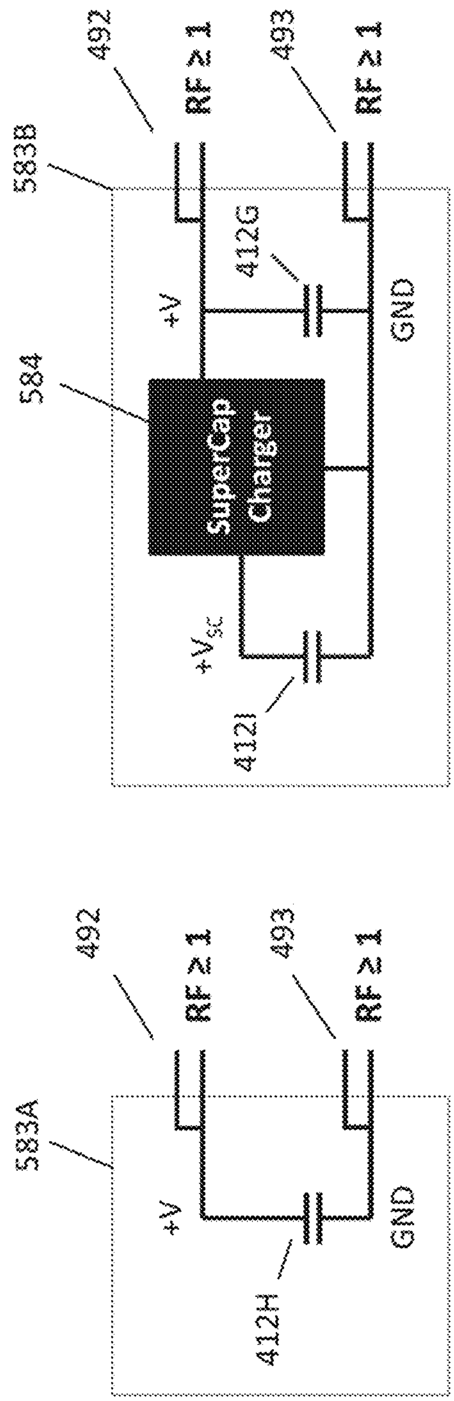

FIG. 43 comprises schematic examples of a local energy storage circuits using capacitors and super-capacitors.

Figure 44:
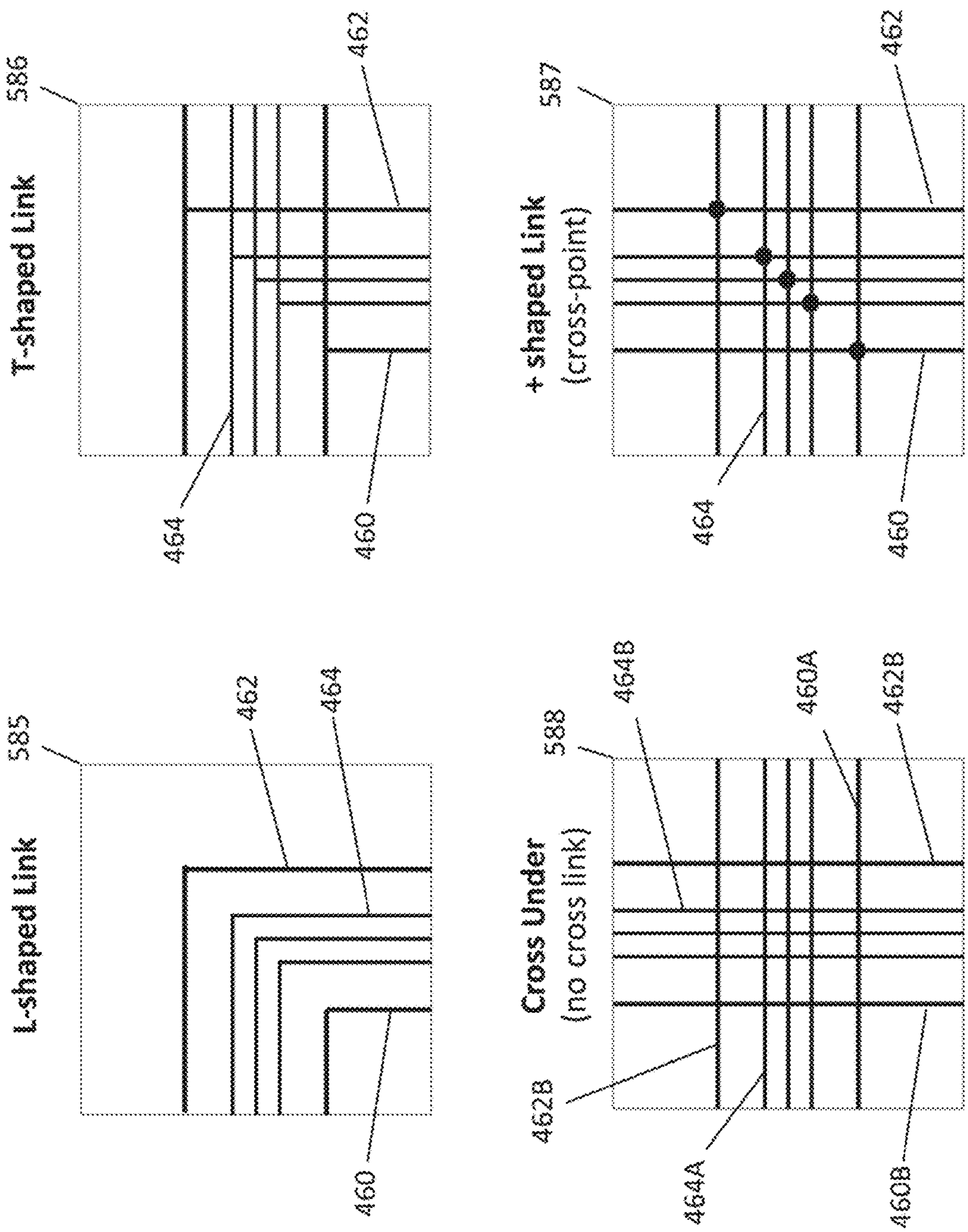

FIG. 44 comprises schematic examples of various shaped connection links and a non-linking cross under.

Figure 45:
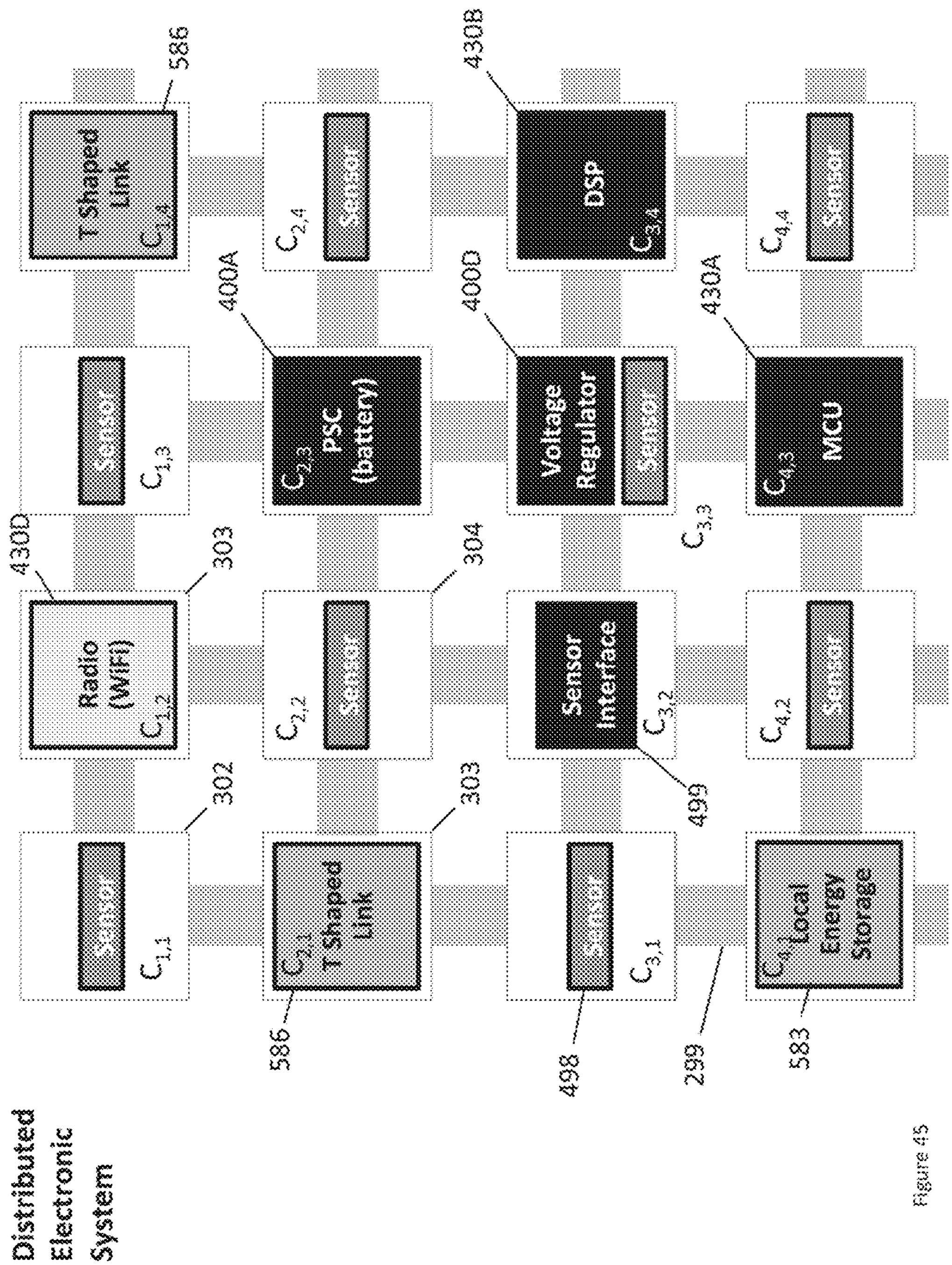

FIG. 45 is a schematic example of a distributed electronic system.

Figure 46A:
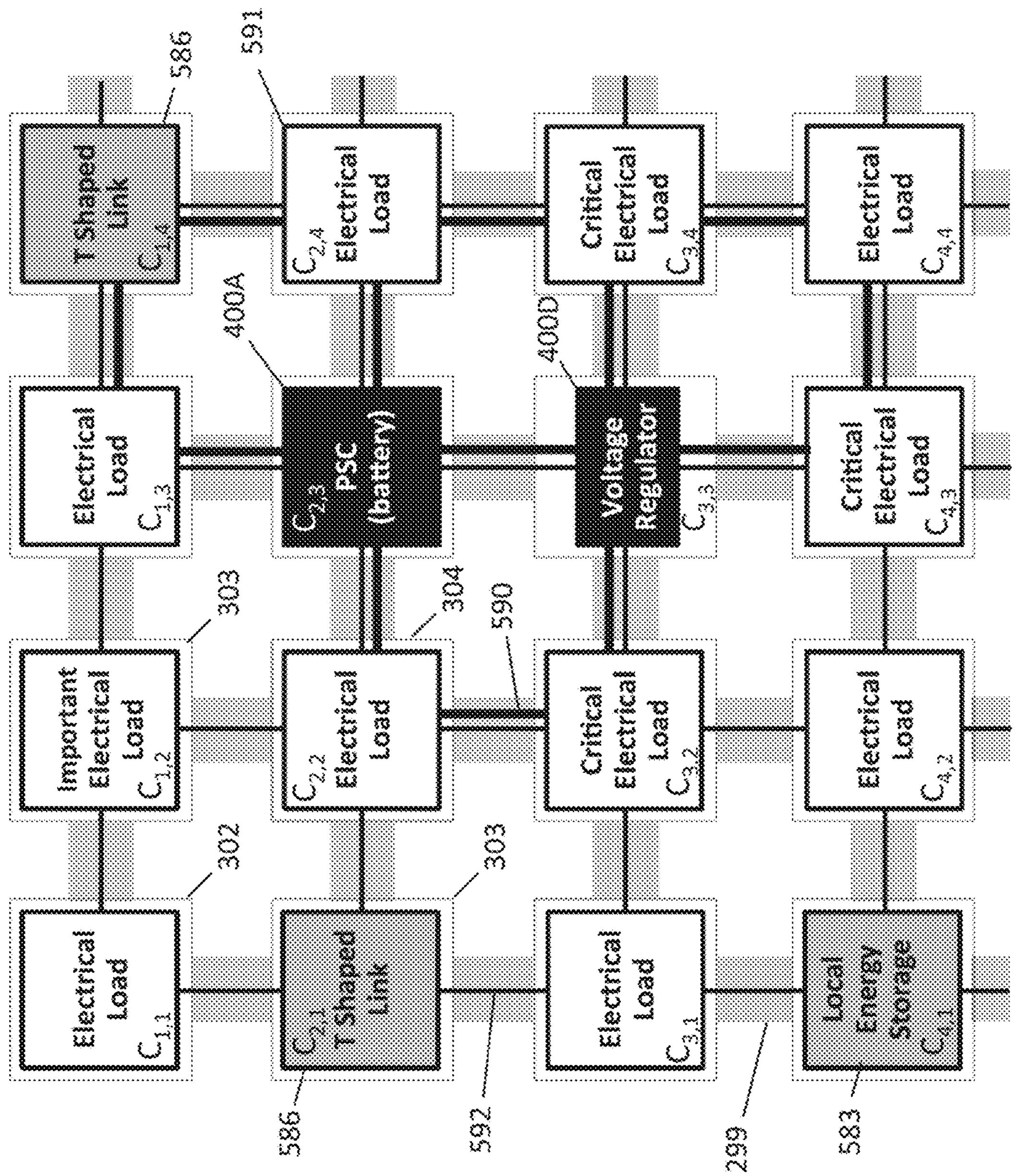

FIG. 46A is a schematic example of a power distribution circuit.

Figure 46B:
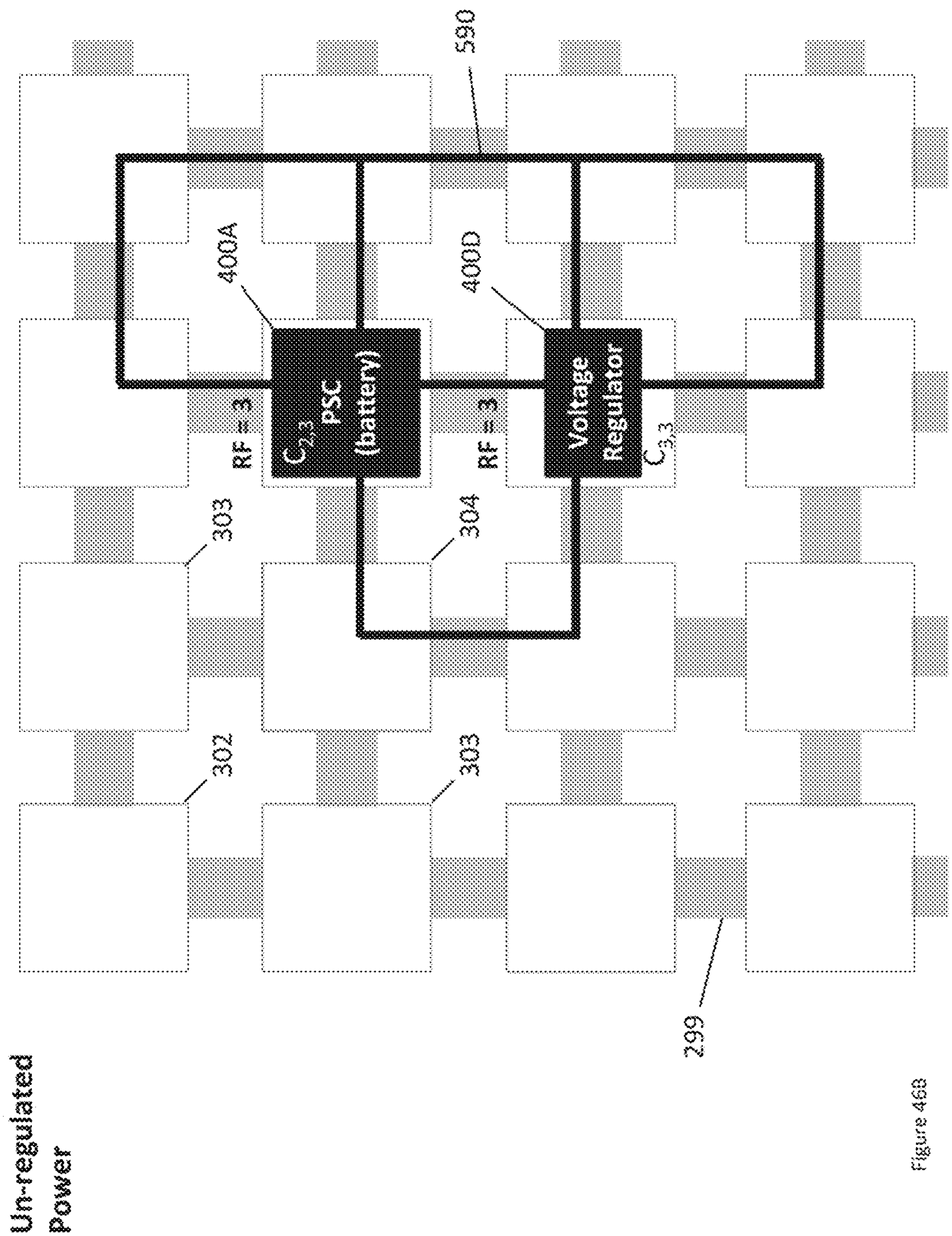

FIG. 46B is a schematic example of a power distribution circuit illustrating unregulated power interconnections.

Figure 46C:
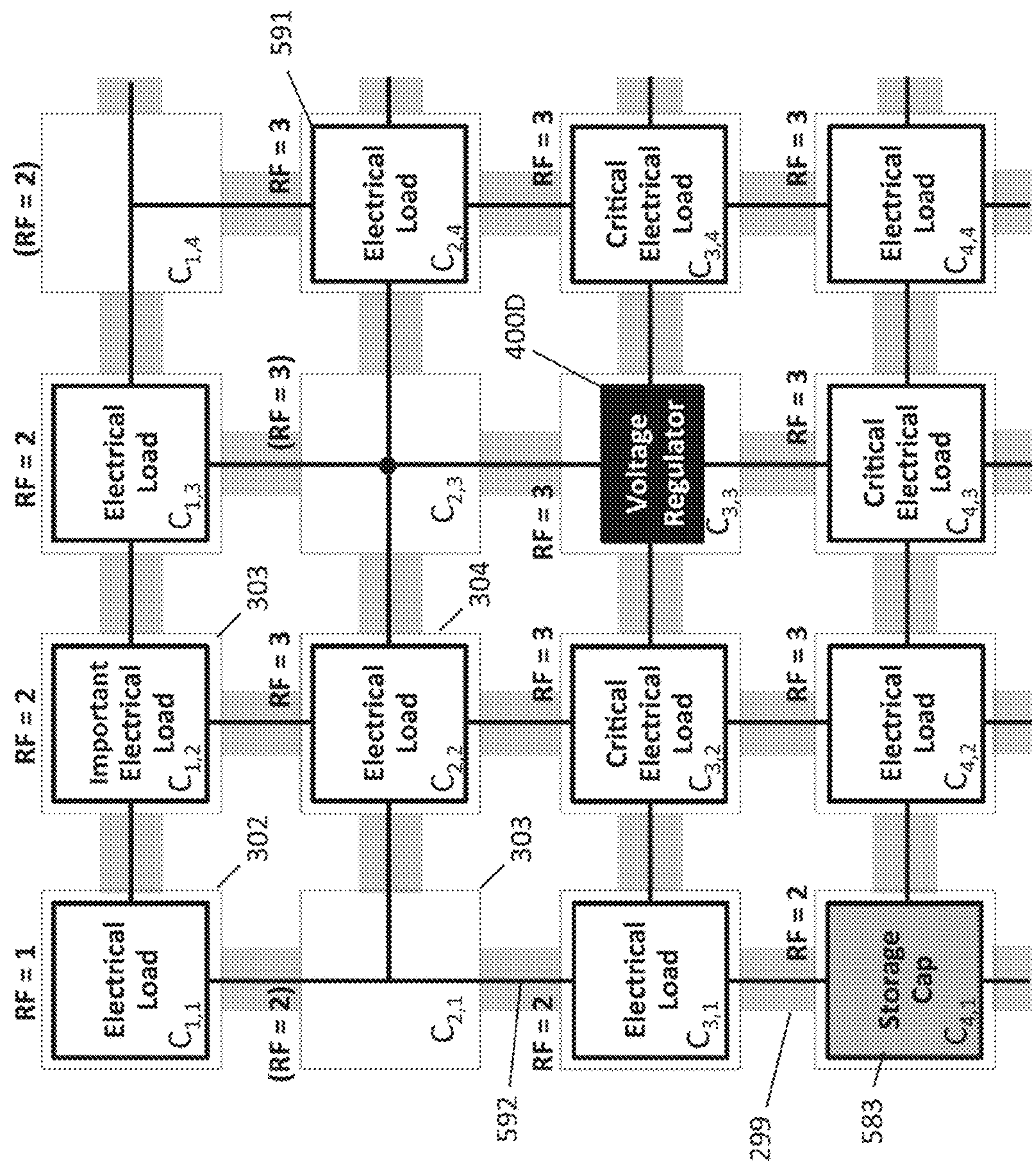

FIG. 46C is a schematic example of a power distribution circuit illustrating regulated-voltage power interconnections.

Figure 47:
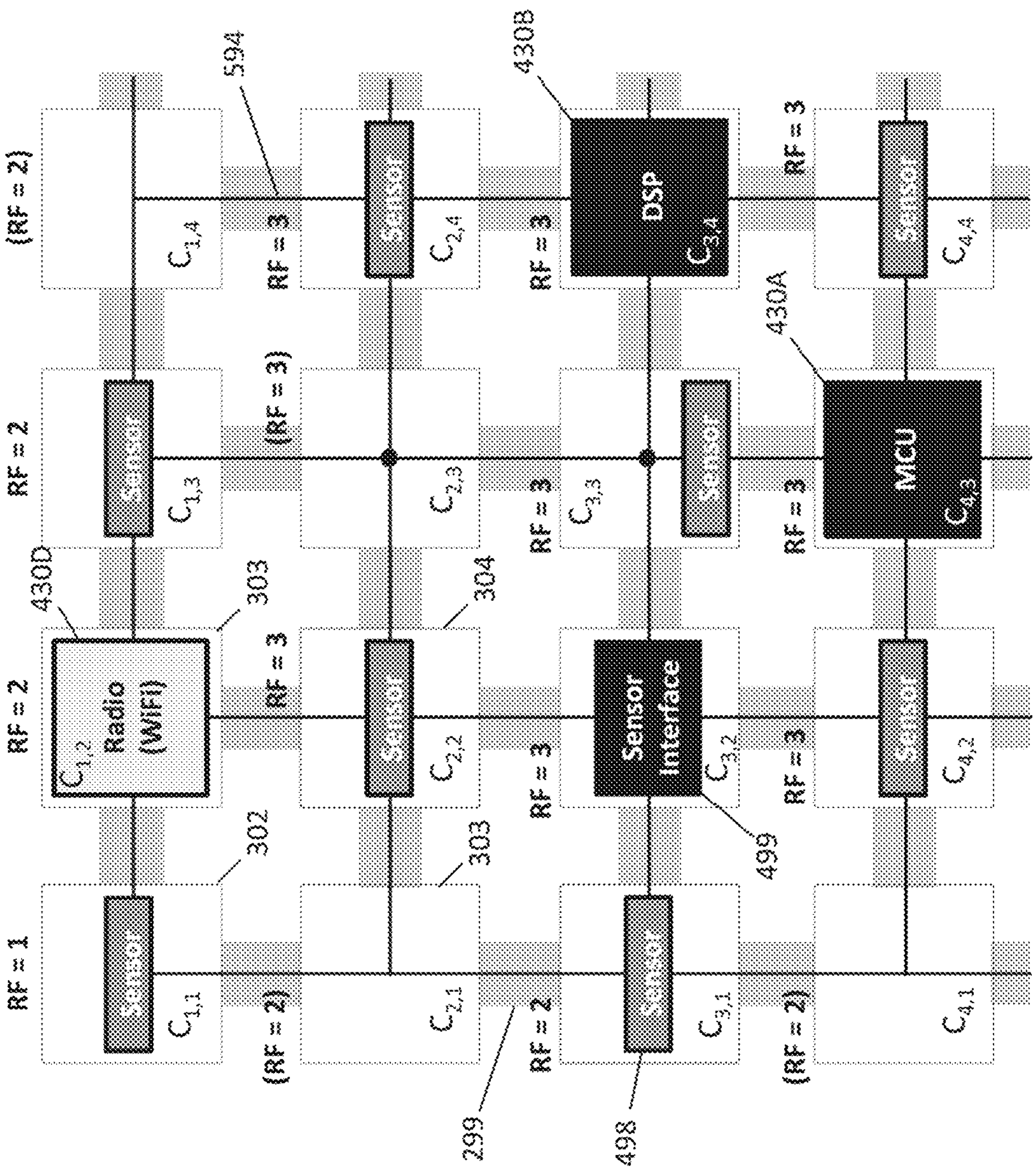

FIG. 47 is a schematic example of signal distribution in a distributed electronic system.

Figure 48:
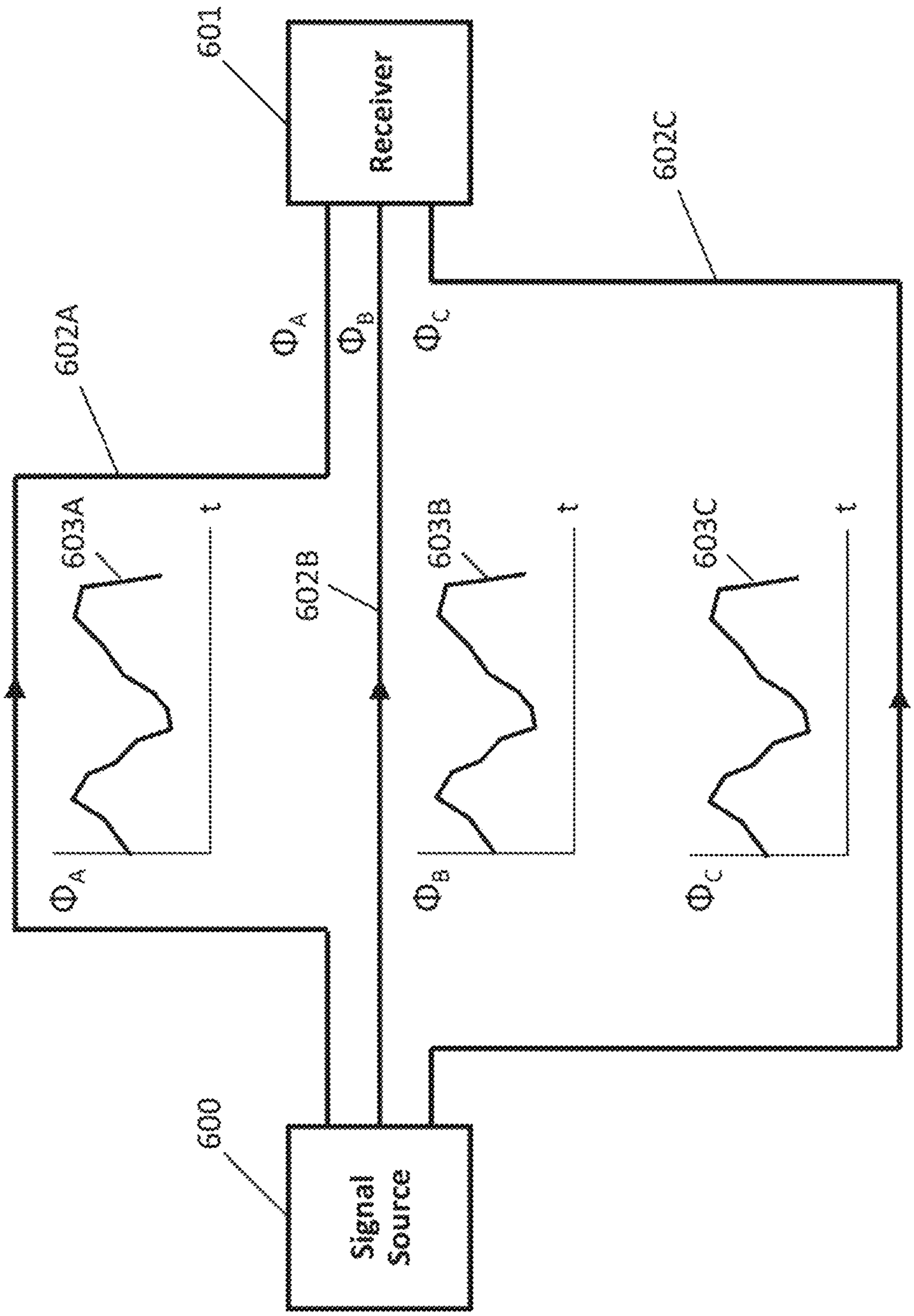

FIG. 48 is an idealized representation of three signal paths in a distributed system carrying identical analog signals.

Figure 49:
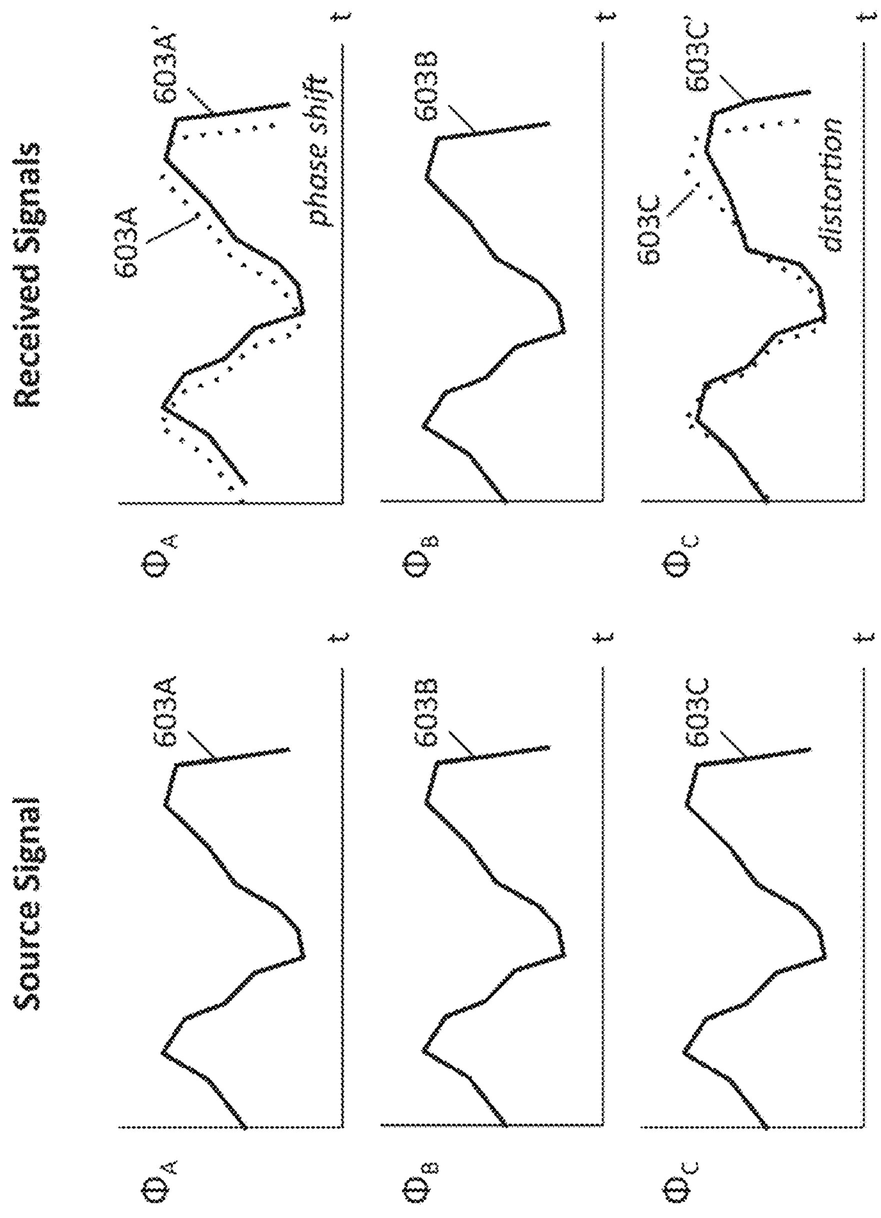

FIG. 49 is a comparison of sent and received analog waveforms over three distinct signal-interconnect paths in a distributed system.

Figure 50A:
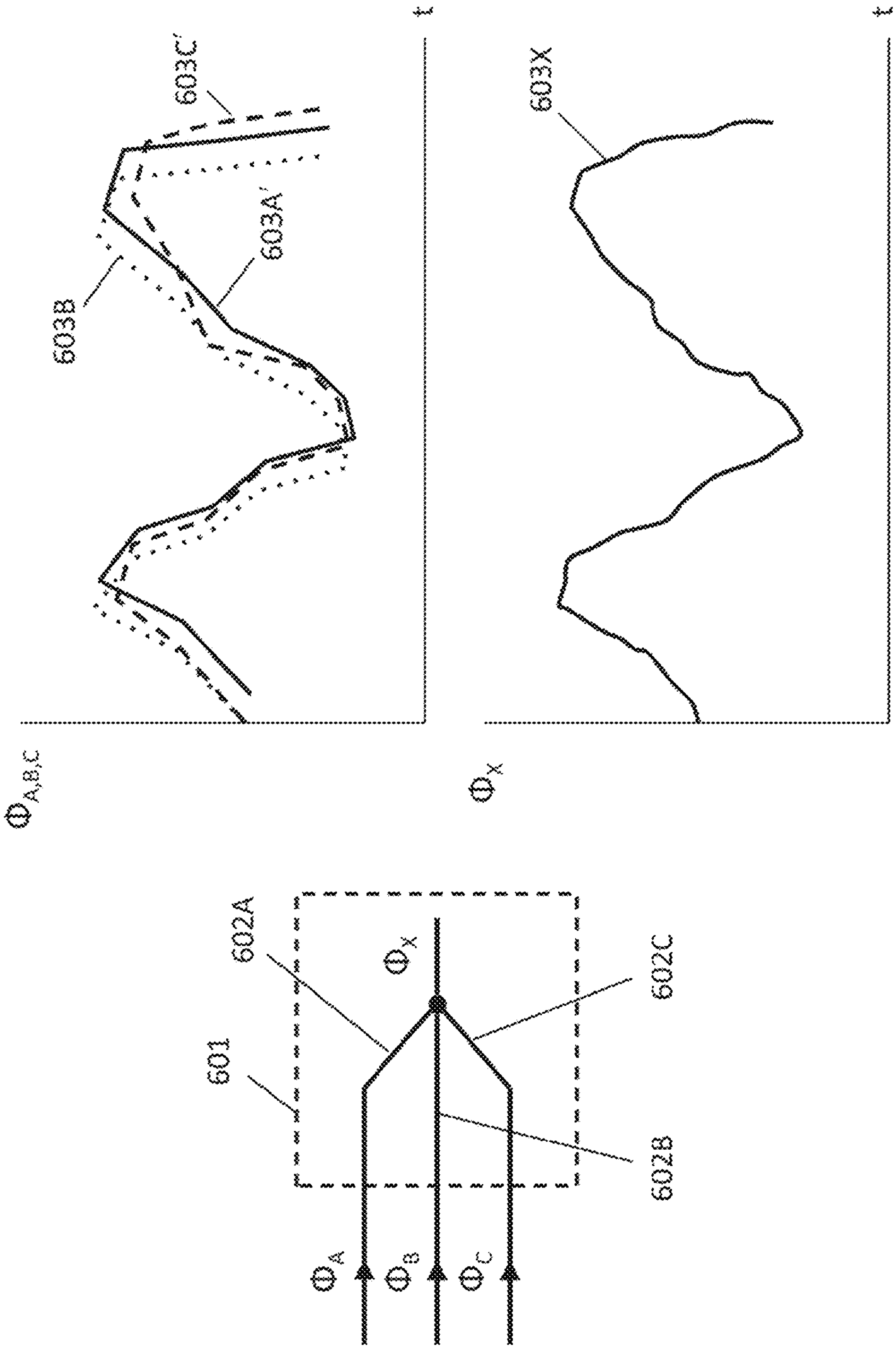
Figure 508:
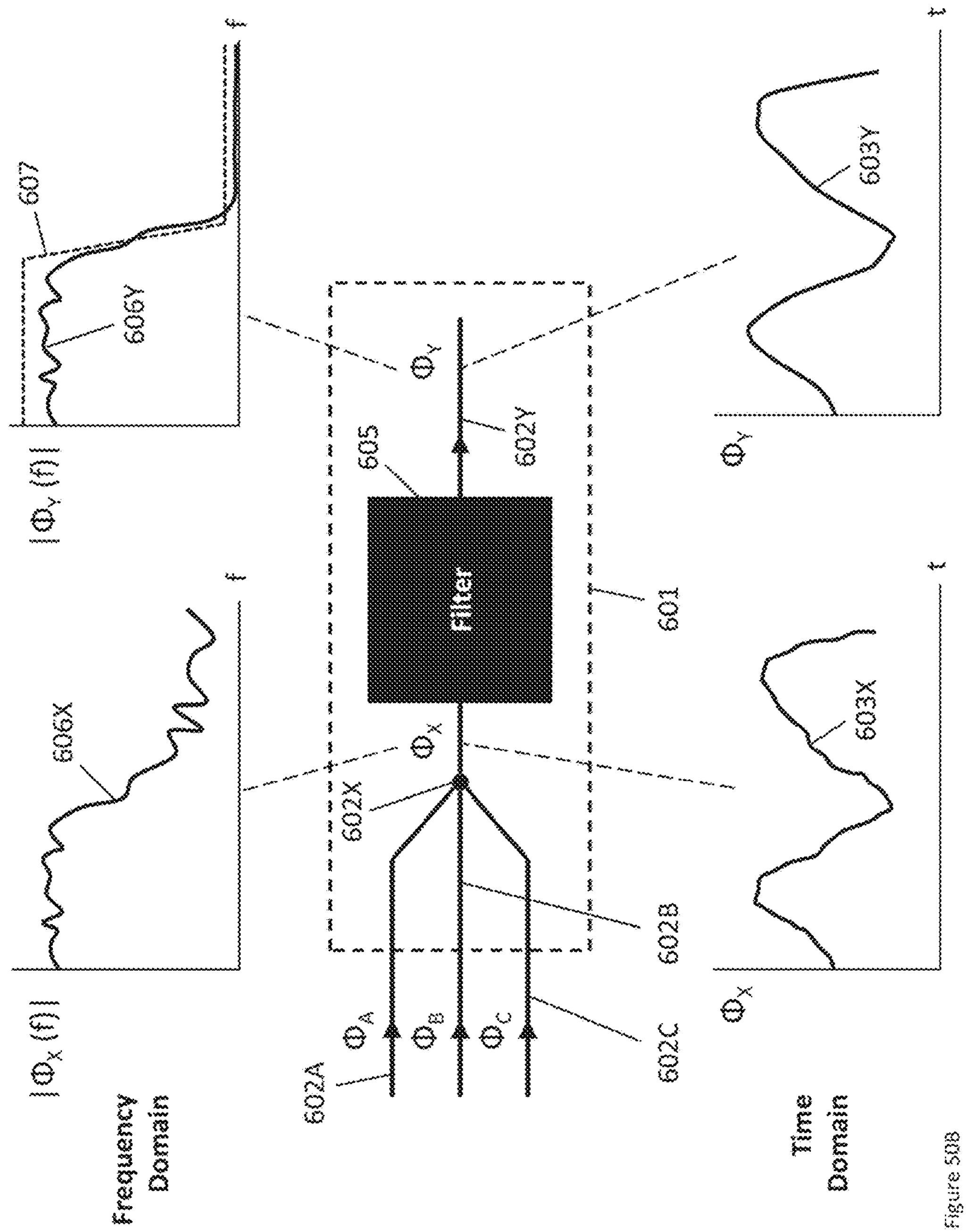

FIG. 50A is a schematic representation of the analog summation of signals over three distinct signal-interconnect paths in a distributed system.

FIG. 50B is a schematic representation filtering the analog summation of signals over three distinct signal-interconnect paths in a distributed system.

Figure 50C:
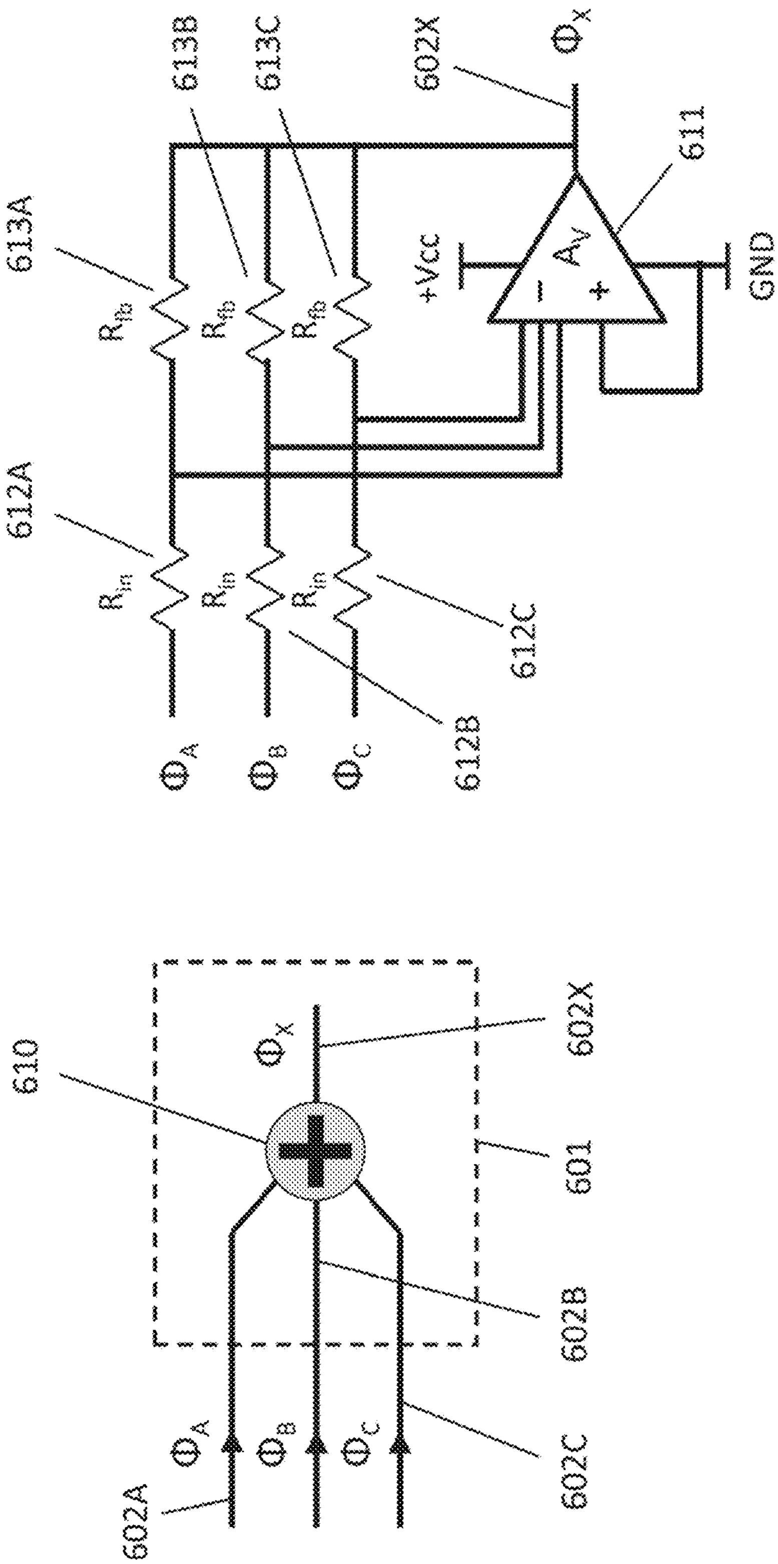

FIG. 50C is a schematic representation of an analog summing node used for mixing analog signals from three distinct signal-interconnect paths in a distributed system.

Figure 50D:
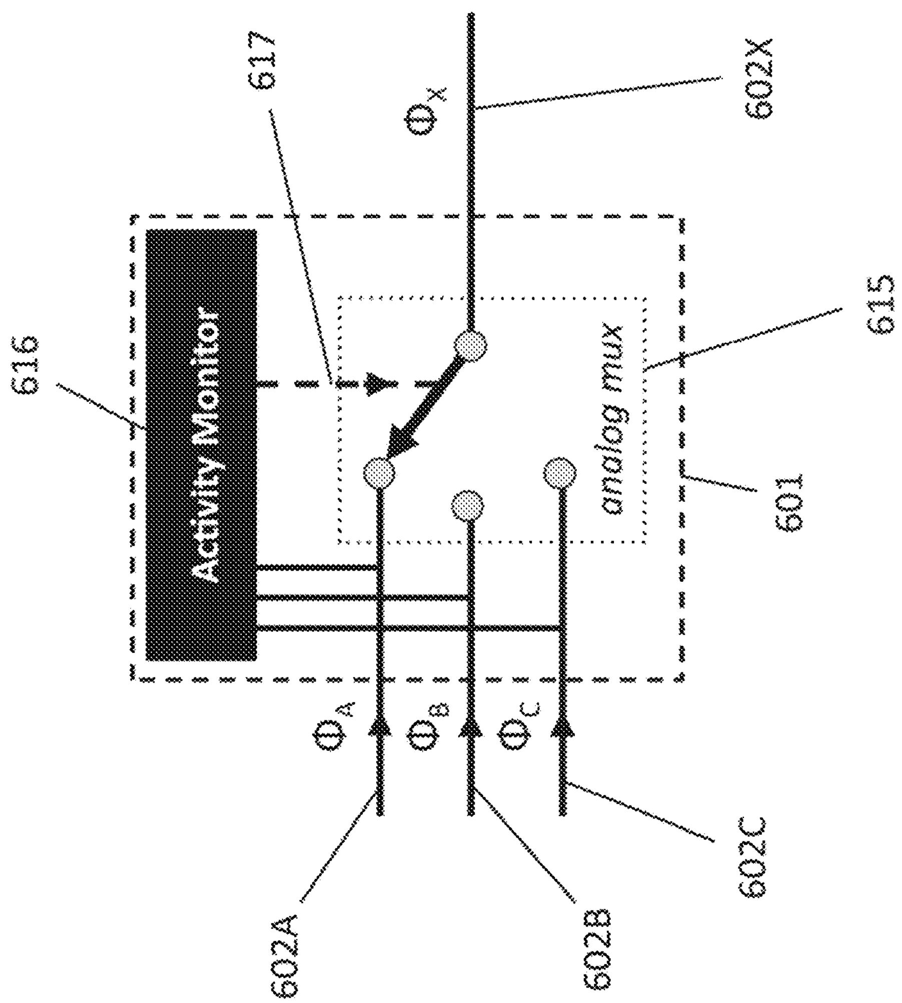

FIG. 50D is a schematic representation of an analog multiplexed signal selector used for selecting a representative signal from three distinct signal-interconnect paths in a distributed system.

Figure 50E:
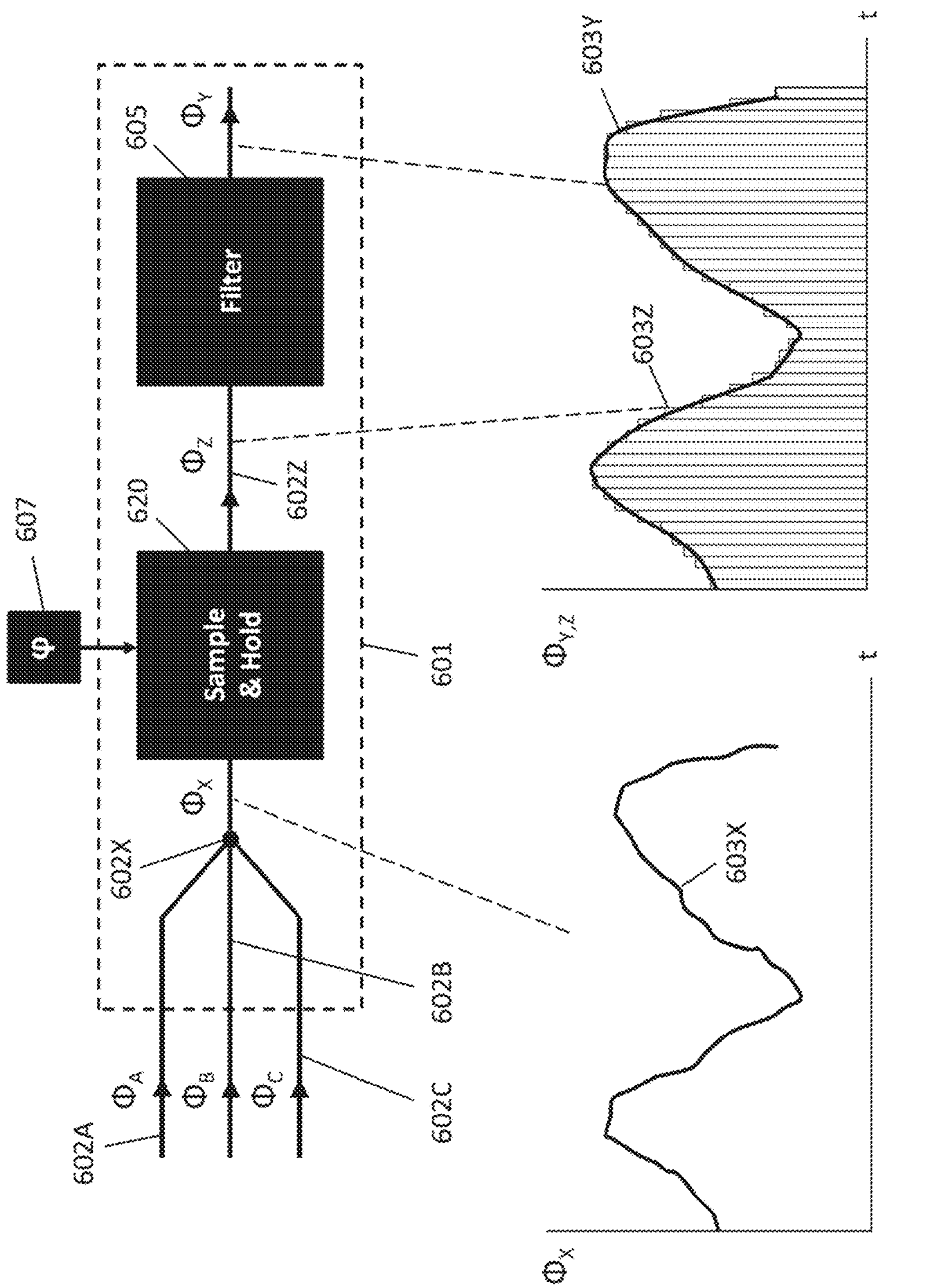

FIG. 50E is a schematic representation of a filtered "sample and hold" function used for mixing analog signals from three distinct signal-interconnect paths in a distributed system.

Figure 51A:
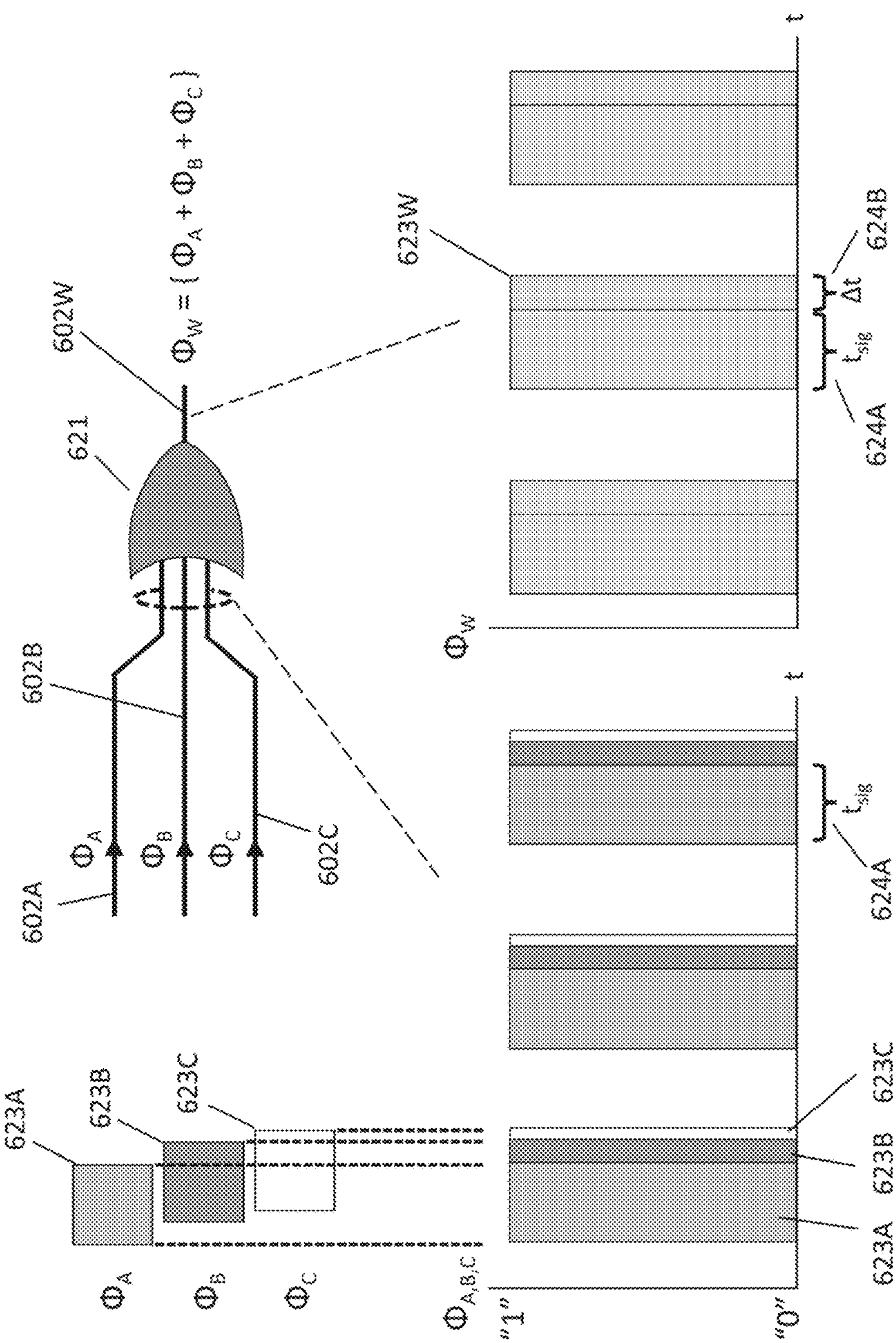

FIG. 51A is a schematic representation of a Boolean logical "OR" gate used to digitally mix digital signals from three distinct signal-interconnect paths in a distributed system.

Figure 51B:
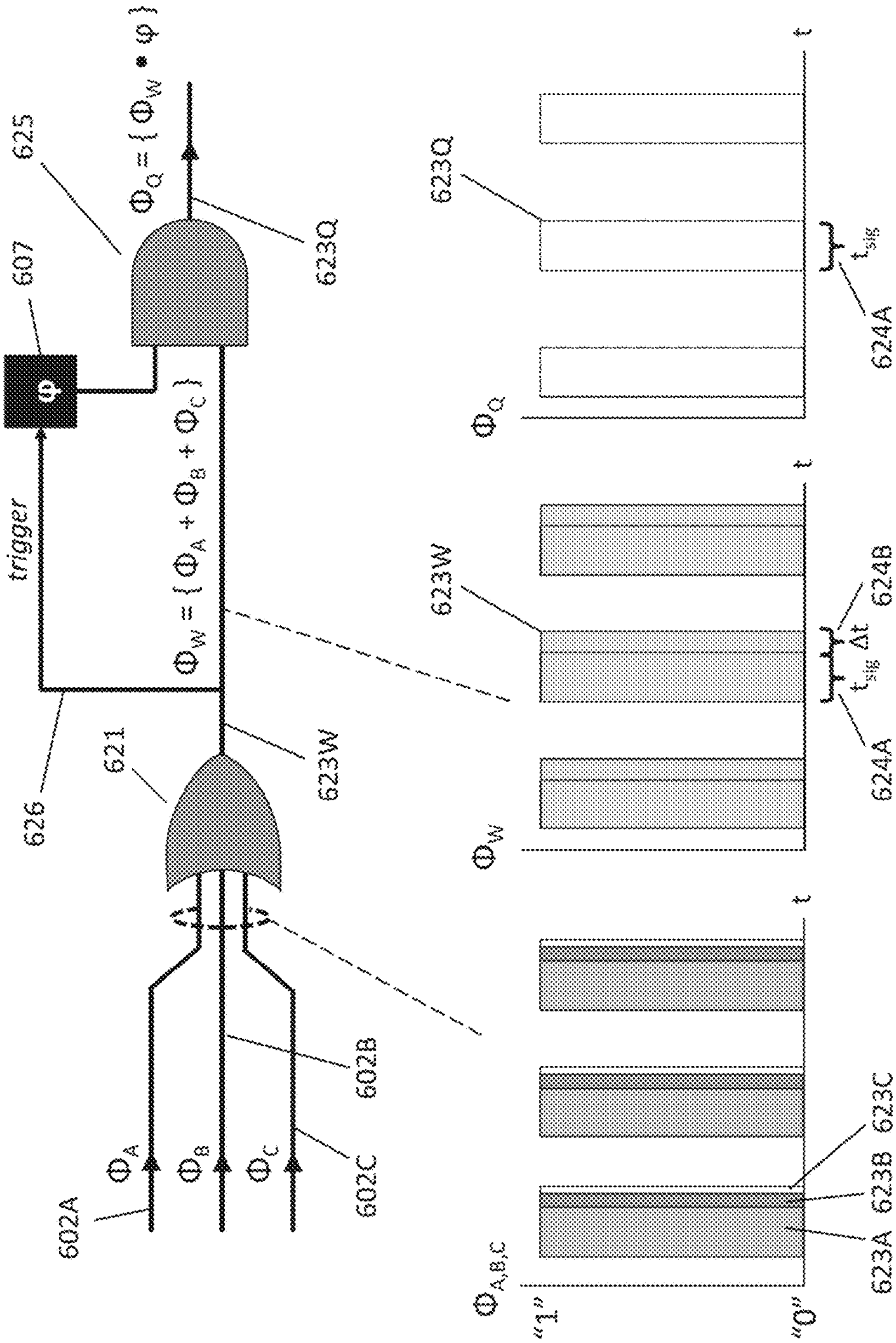

FIG. 51B is a schematic representation of a clocked logic "OR" gate used to digitally mix and filter digital signals from three distinct signal-interconnect paths in a distributed system.

Figure 52:
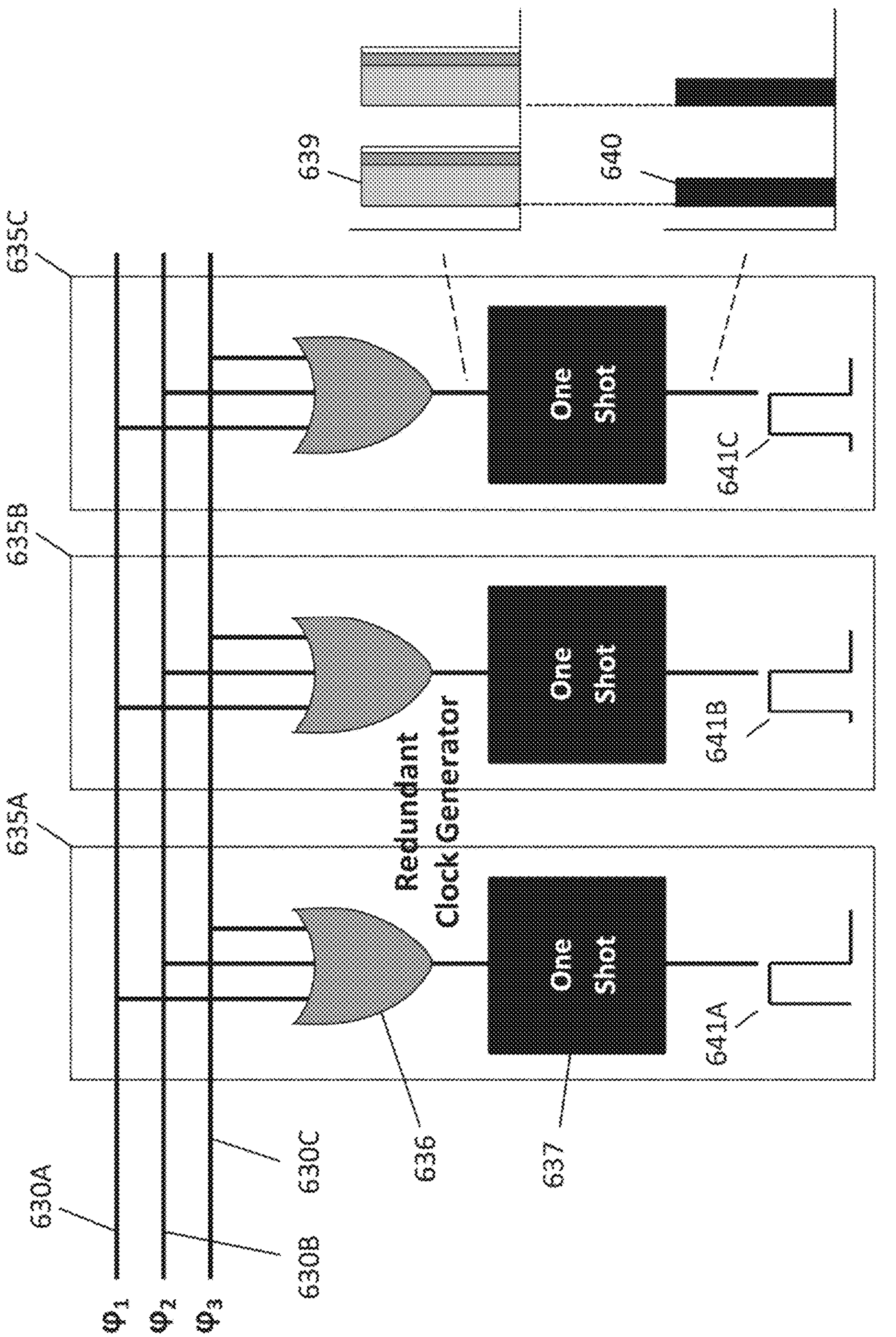

FIG. 52 is a schematic of a clock select circuit.

Figure 53A:
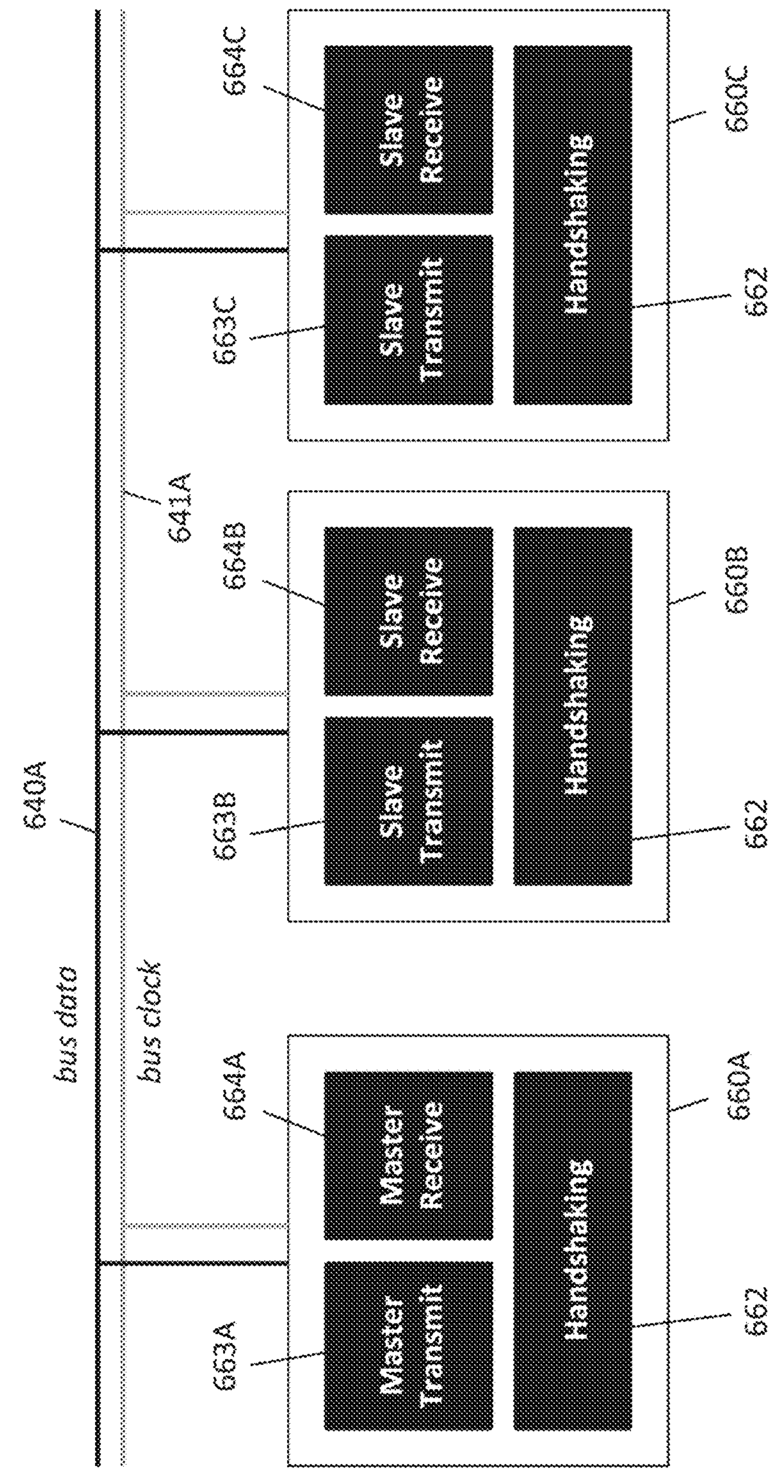

FIG. 53A is a schematic of a conventional master-slave system architecture using serial communication.

Figure 53B:
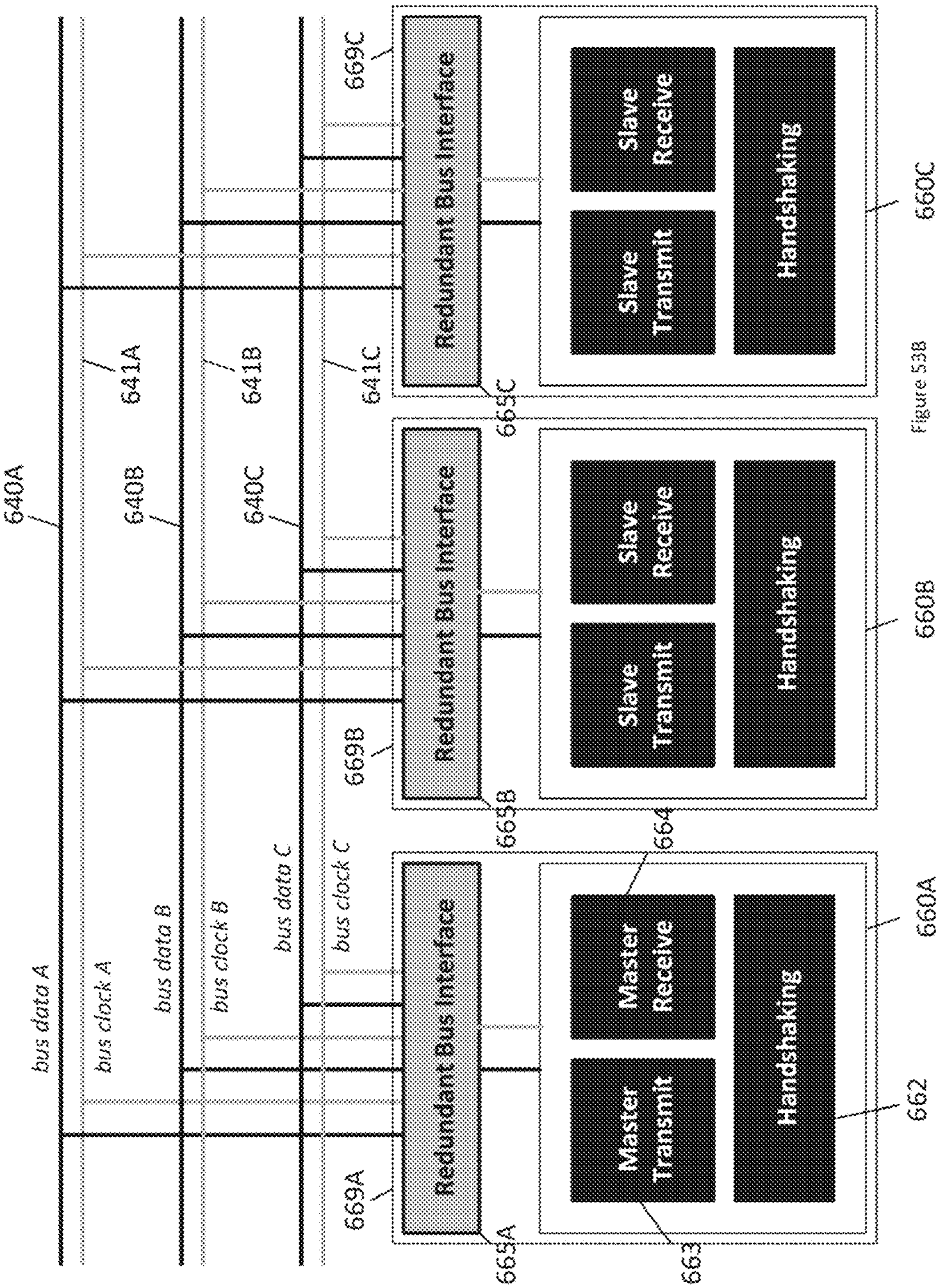

FIG. 53B is a schematic of a redundant master-slave system architecture using serial communication.

Figure 54A:
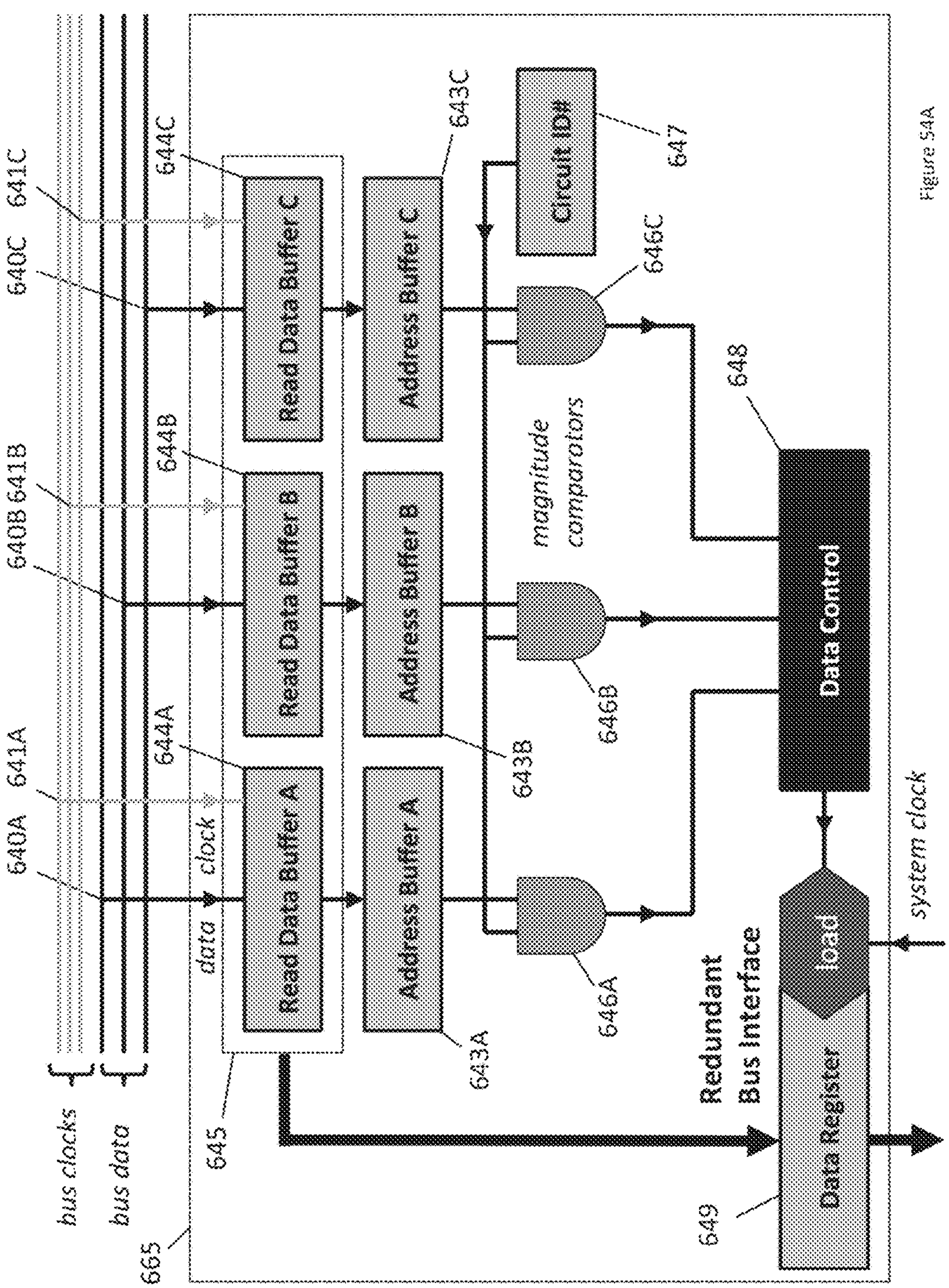

FIG. 54A is a schematic of redundant serial bus interface in read mode.

Figure 54B:
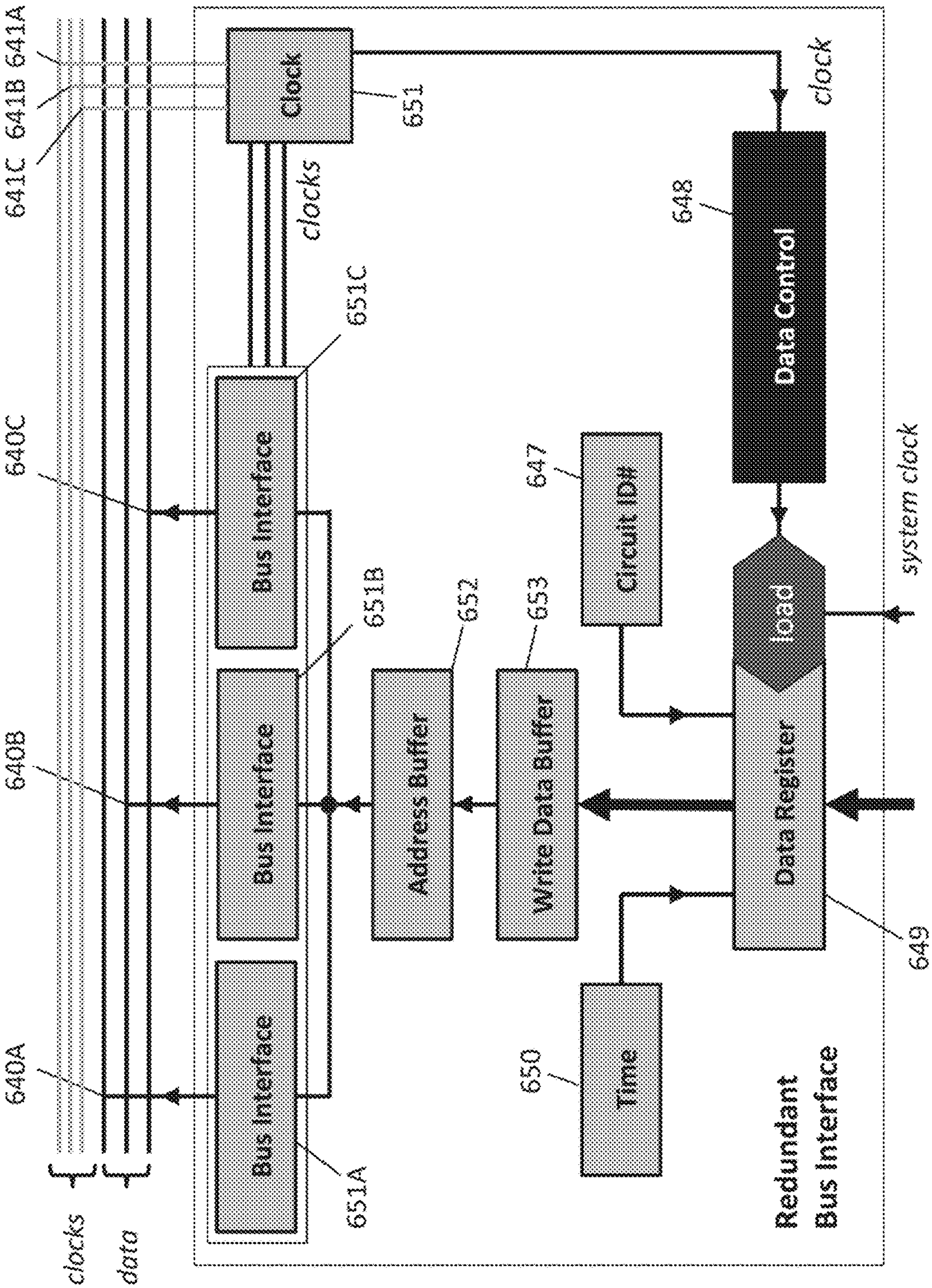

FIG. 54B is a schematic of redundant serial bus interface in write mode.

Figure 54C:
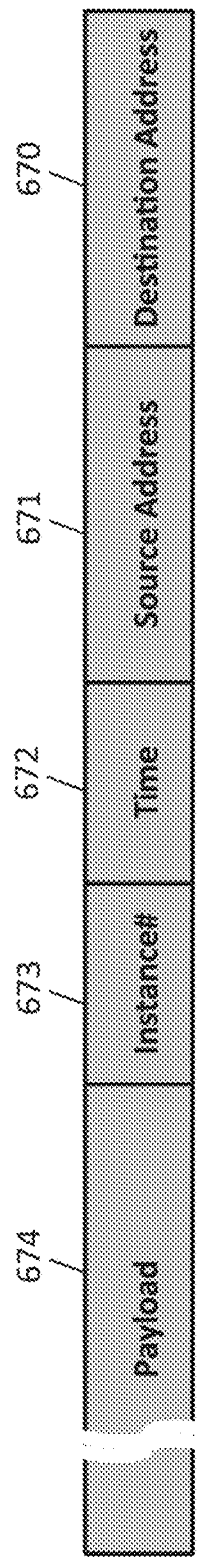

FIG. 54C is a serial data packet used for redundant serial bus communication.

Figure 55A:
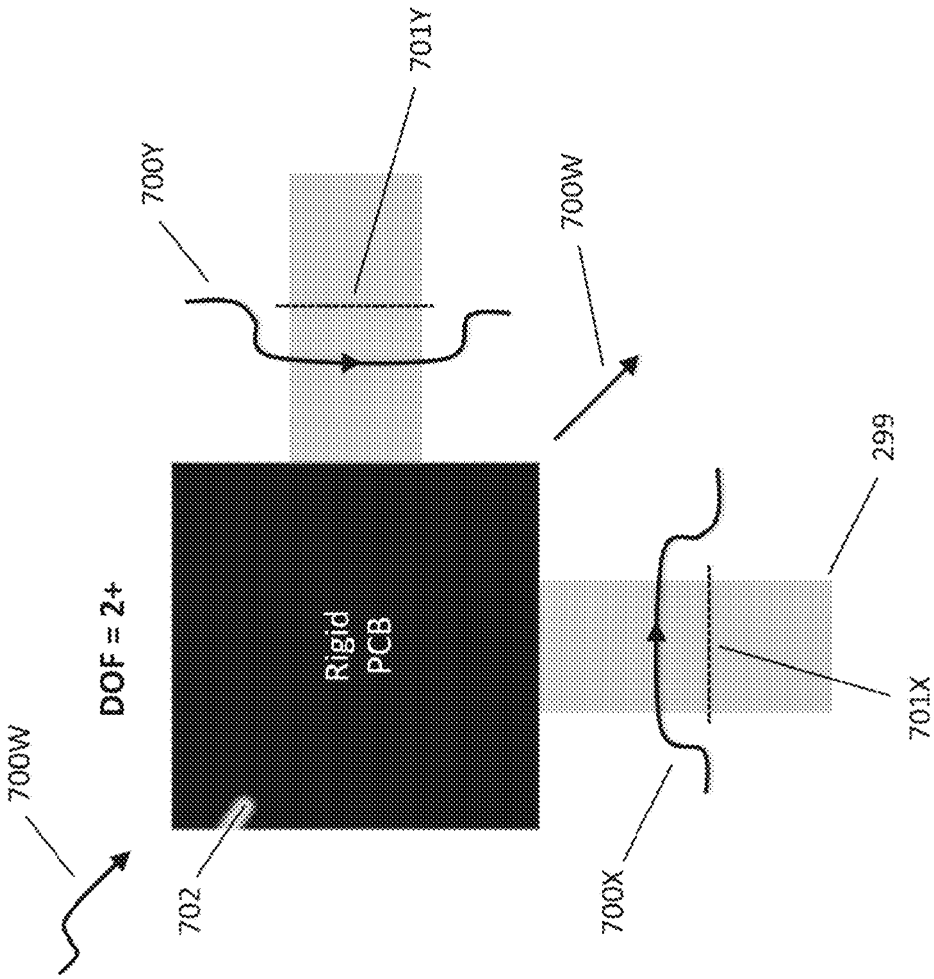

FIG. 55A is a plan view of a rigid-flex PCB with 2+ degrees of freedom.

Figure 55B:
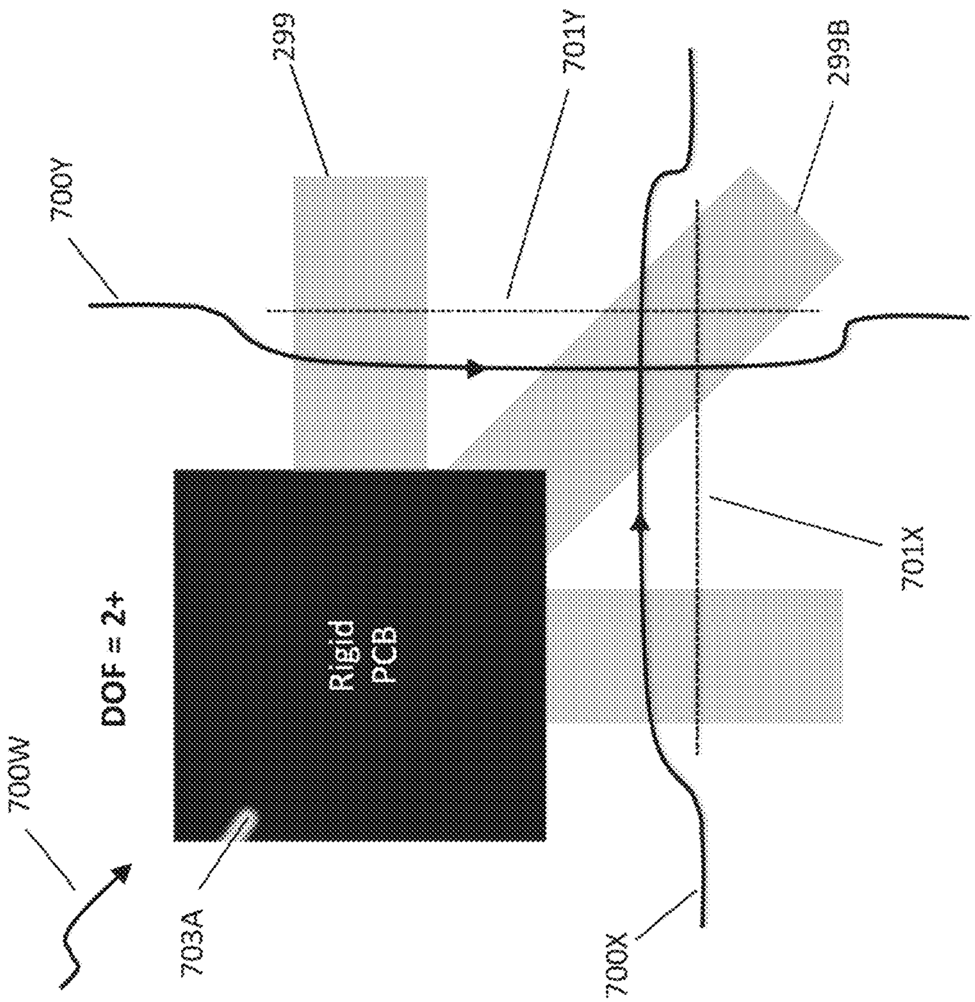

FIG. 55B is a plan view of an improved strength rigid-flex PCB with 2+ degrees of freedom.

Figure 56A:
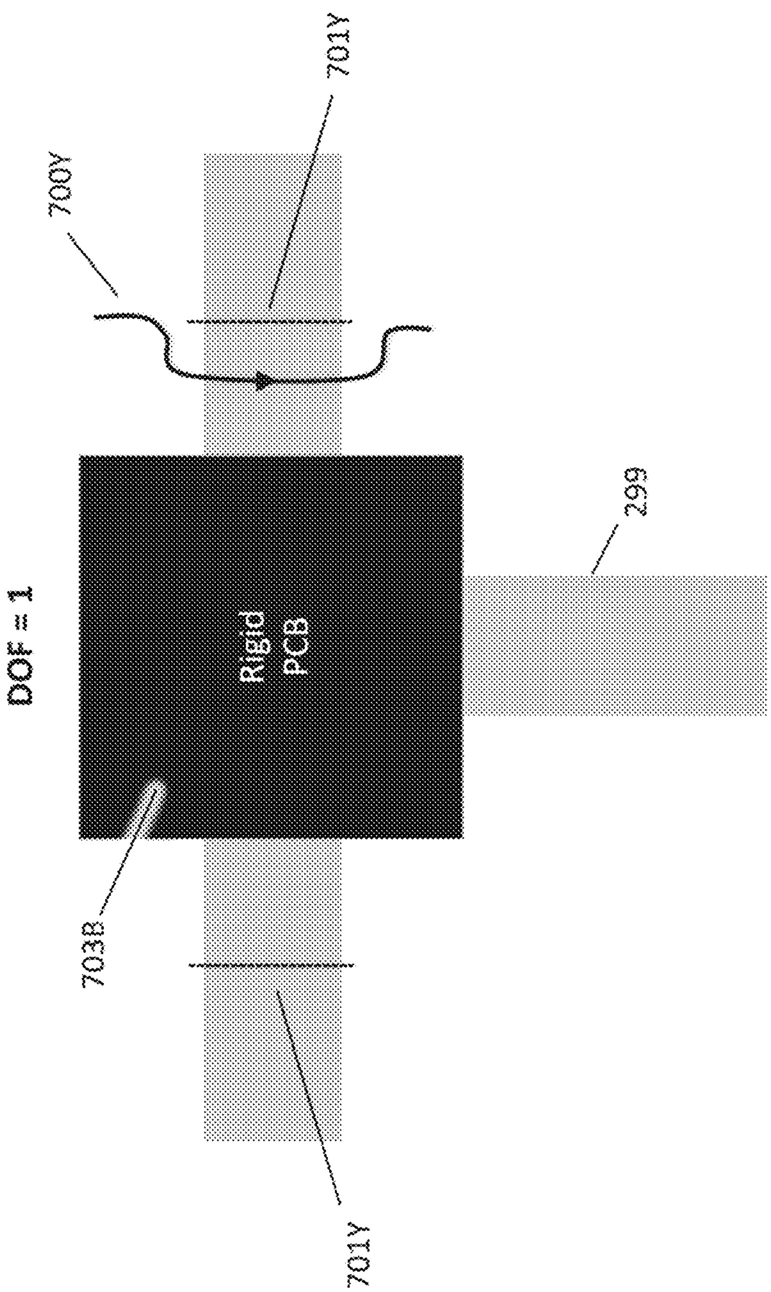

FIG. 56A is a plan view of an rigid-flex PCB with 1 degree of freedom.

Figure 56B:
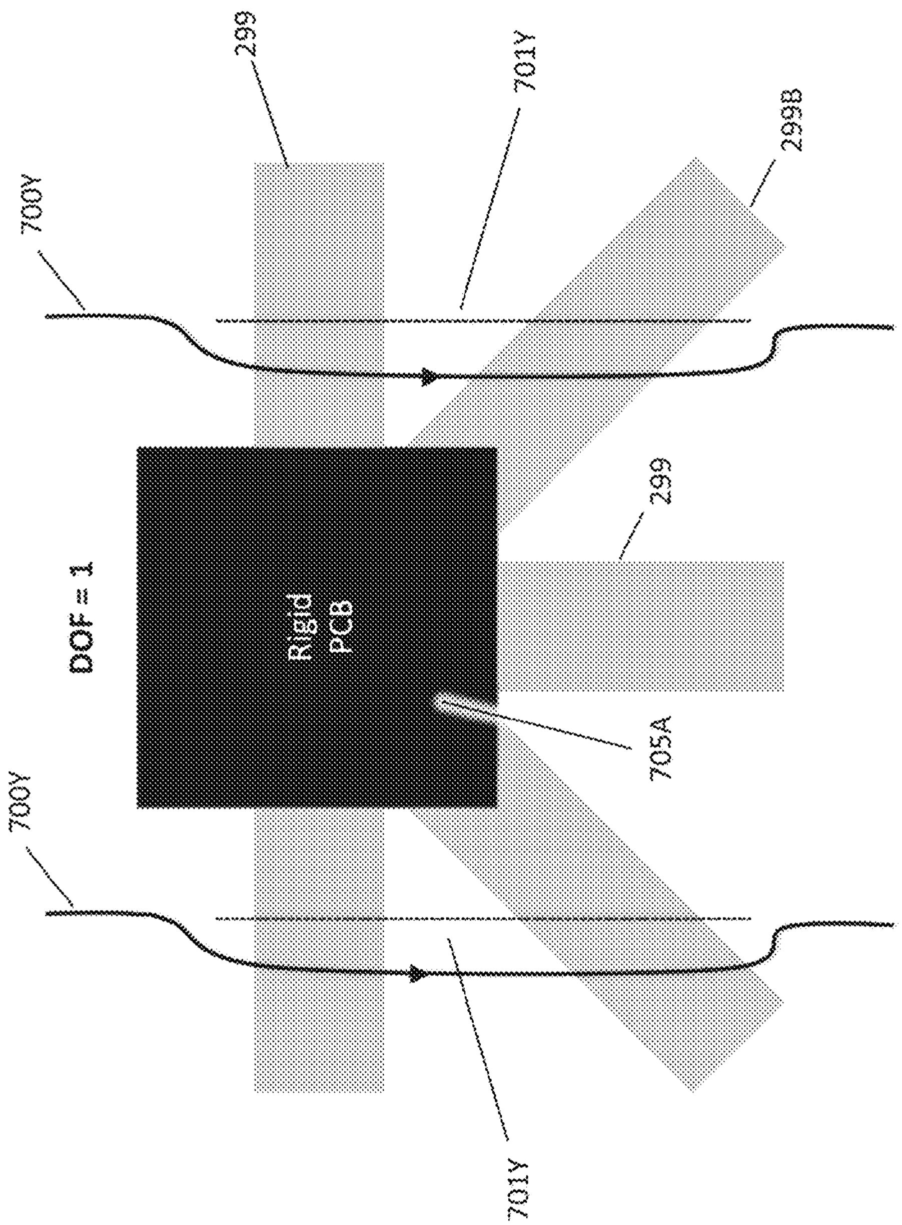

FIG. 56B is a plan view of an improved strength rigid-flex PCB with 1 degree of freedom.

Figure 57:
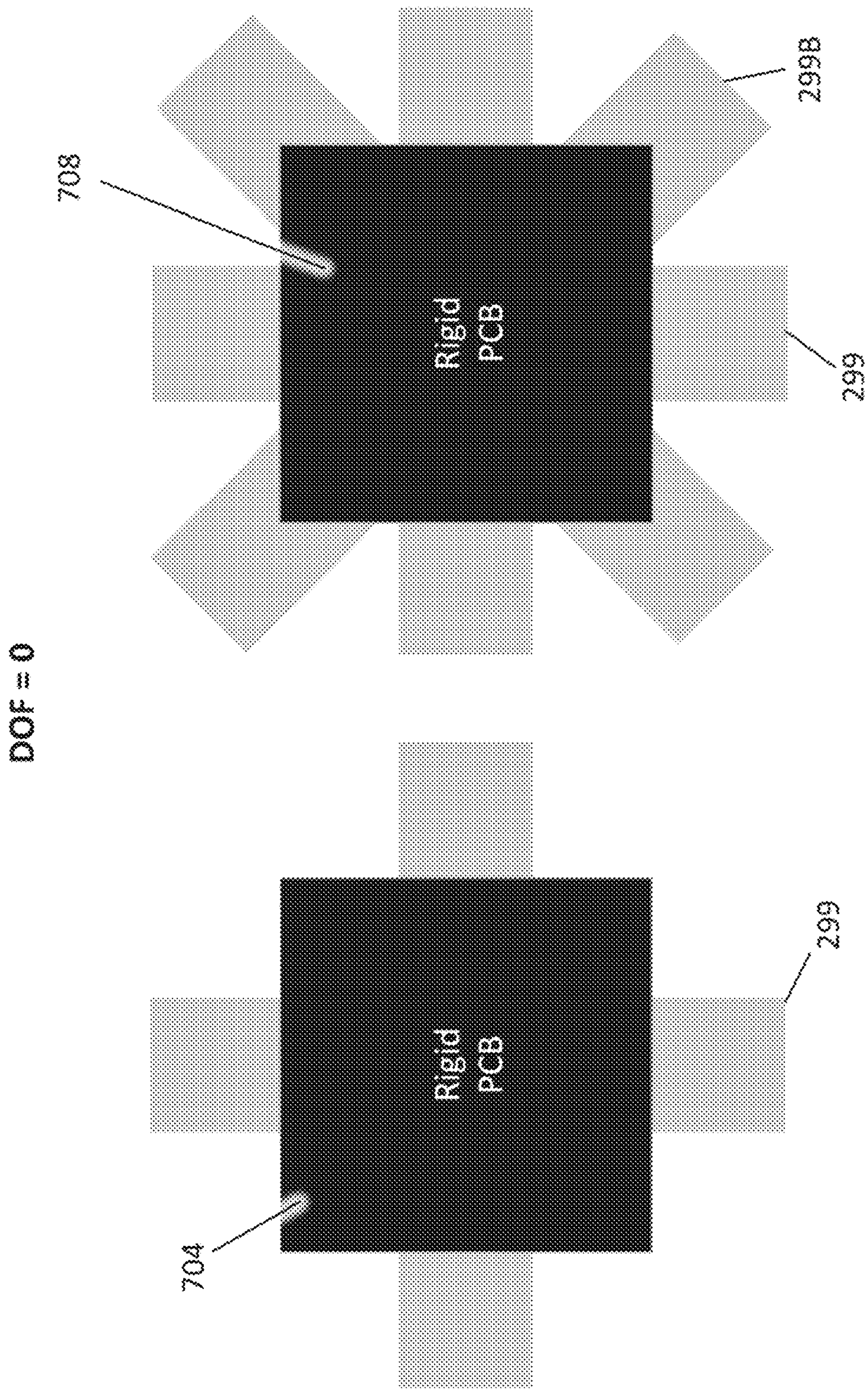

FIG. 57 is a plan view of two rigid-flex PCBs with 0 degrees of freedom.

Figure 58:
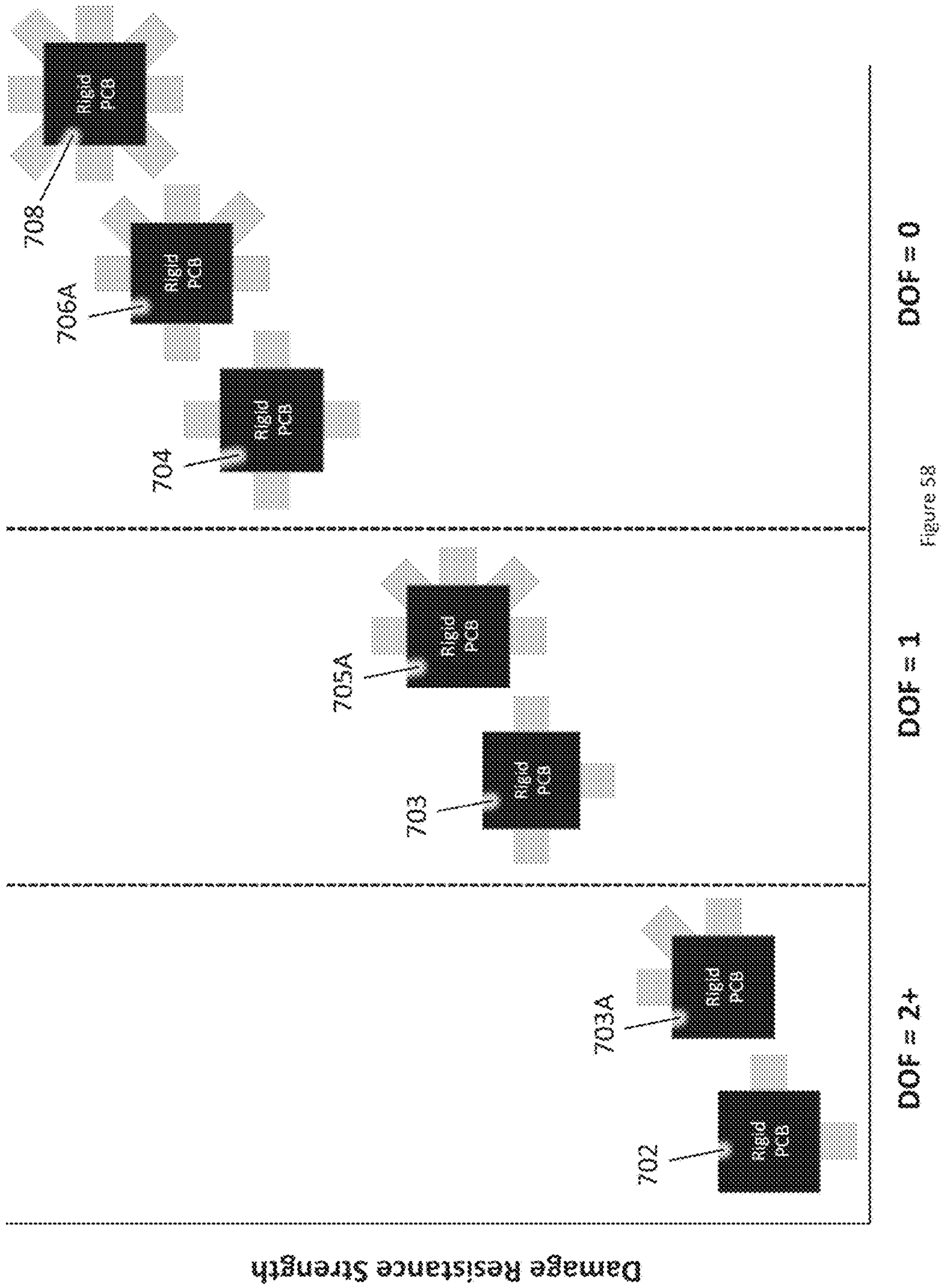

FIG. 58 is a graph of damage resistance strength versus degrees of freedom for various rigid-flex PCB designs.

Figure 59:
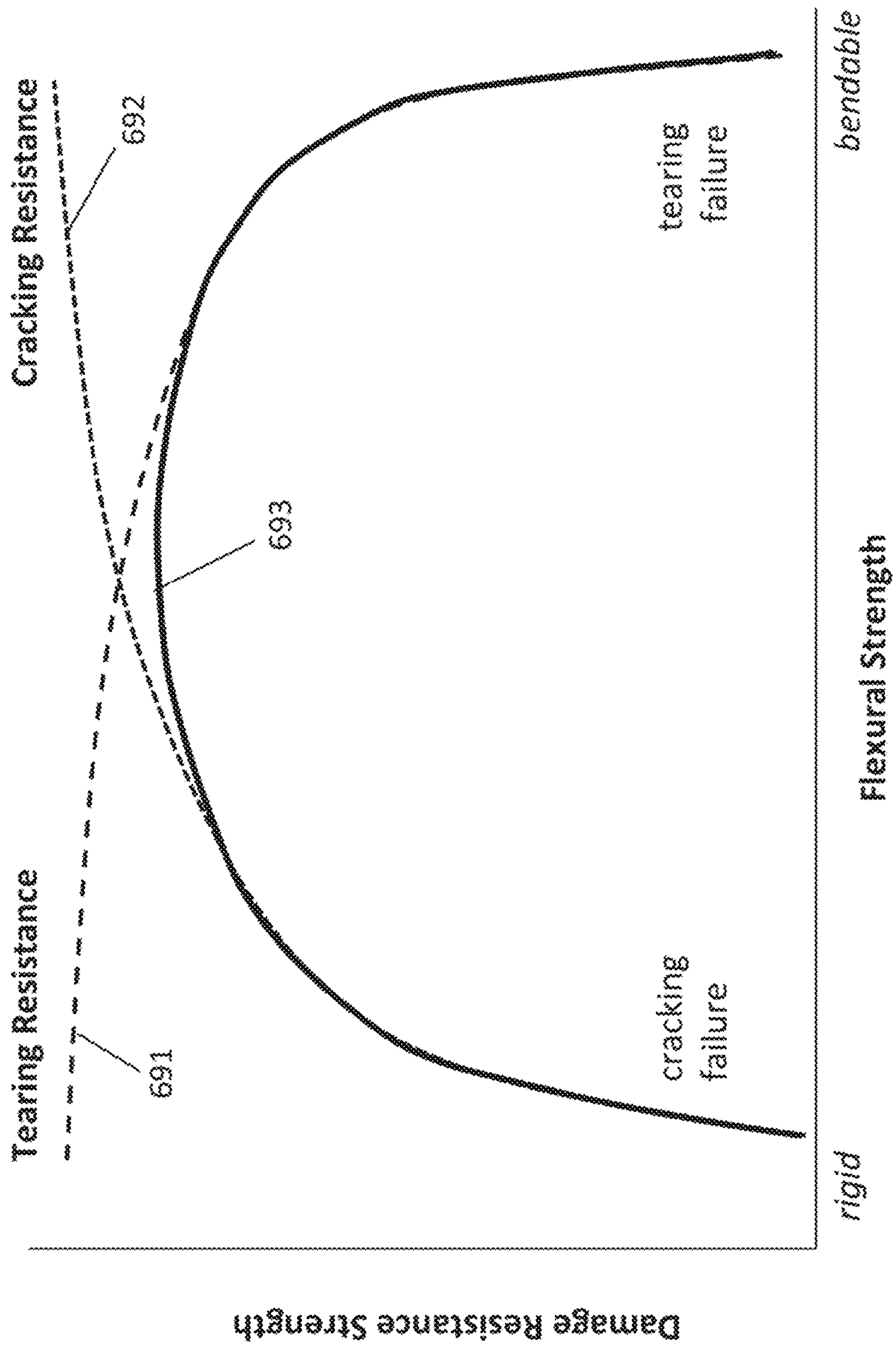

FIG. 59 is a graph of damage-resistance strength versus flexural strength for flex-PCB connections in a rigid-flex PCB.

Figure 60A:
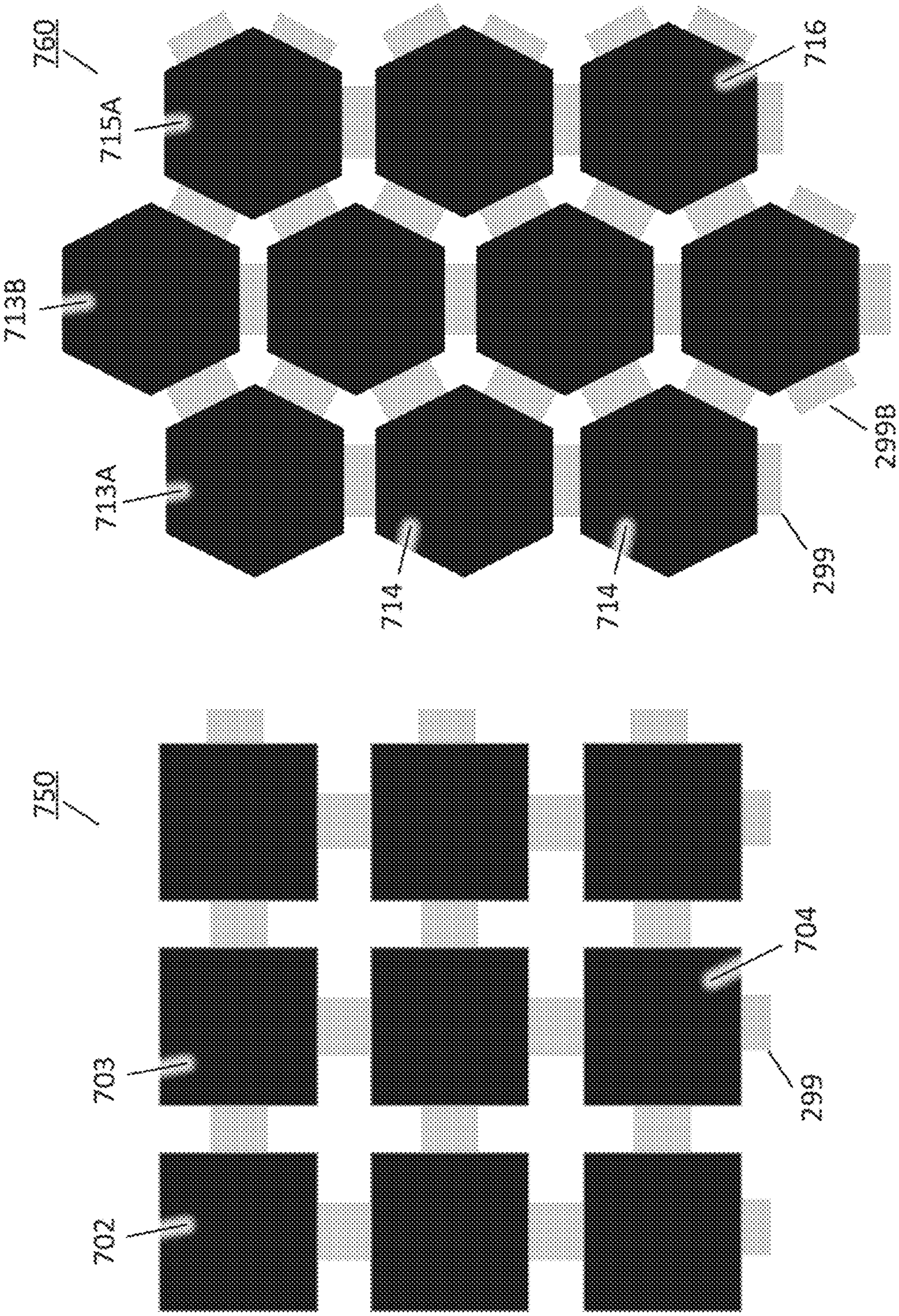

FIG. 60A is a plan view of a square-array and hexagonal cell rigid-flex PCB with interconnects on opposing faces.

Figure 60B:
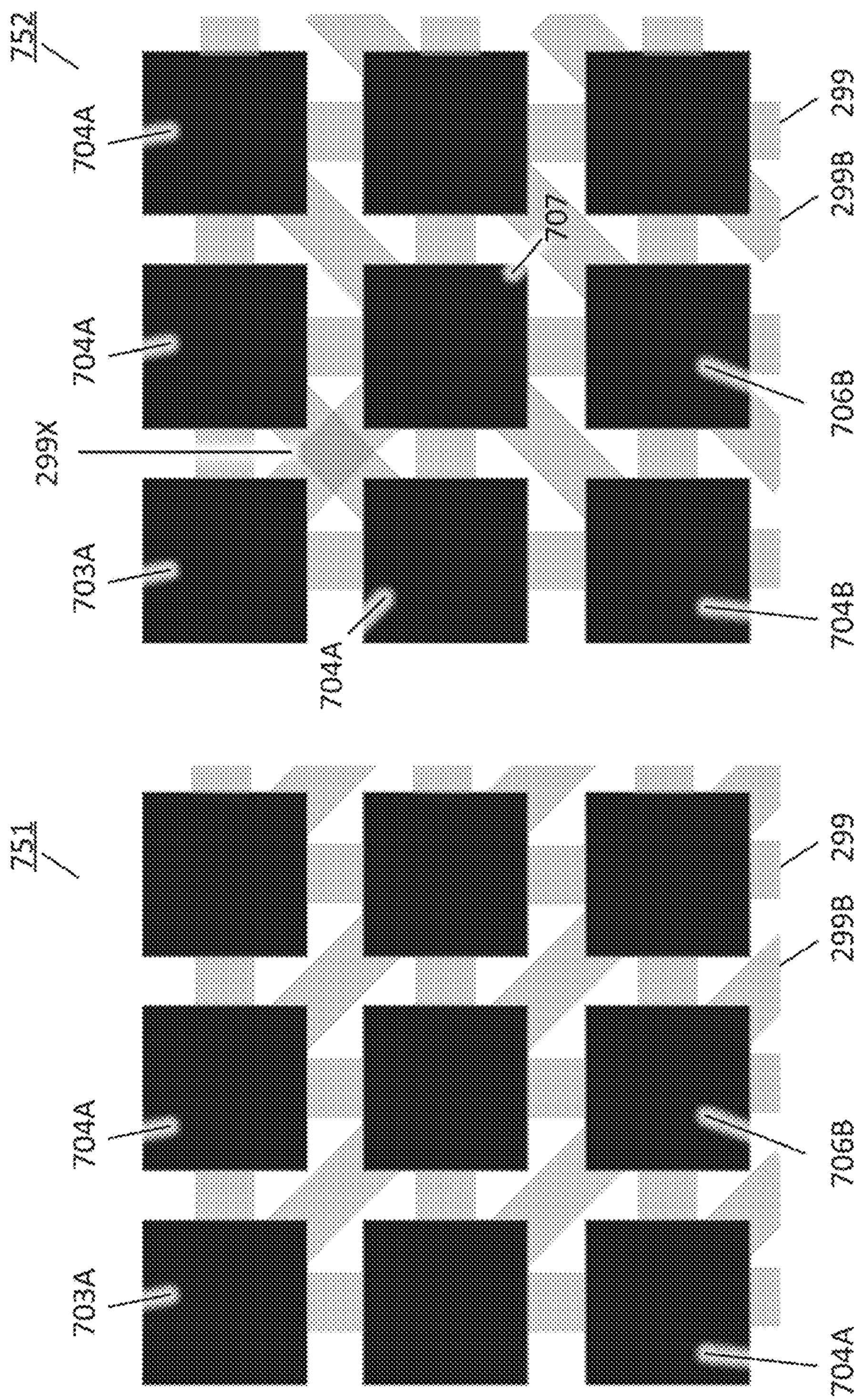

FIG. 60B is a plan view of two alternate square-array rigid-flex PCB with rectilinear and diagonal interconnects.

Figure 60C:
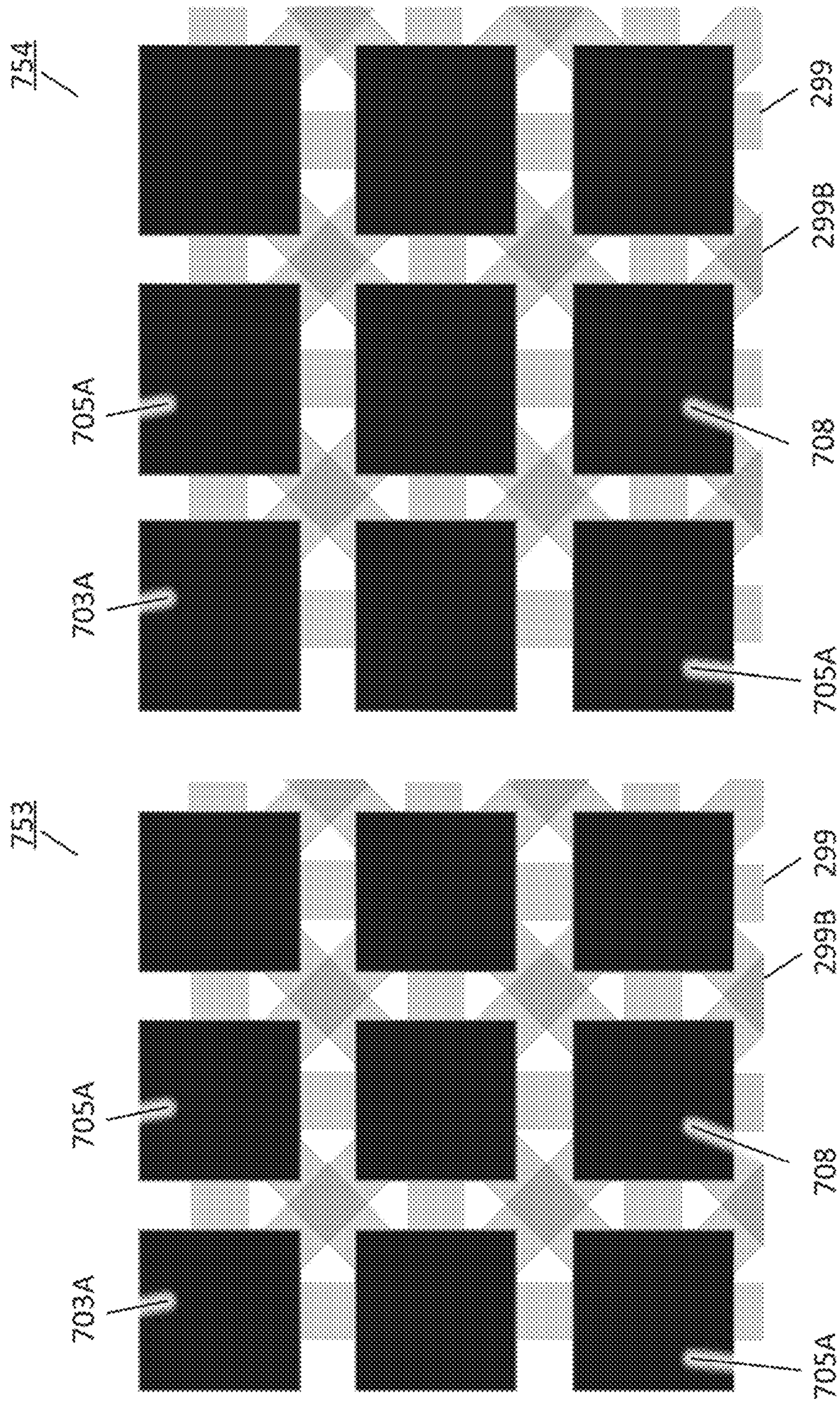

FIG. 60C is a plan view of square-array and rectangular rigid-flex PCB with both rectilinear and x-shaped interconnects.

Figure 60D:
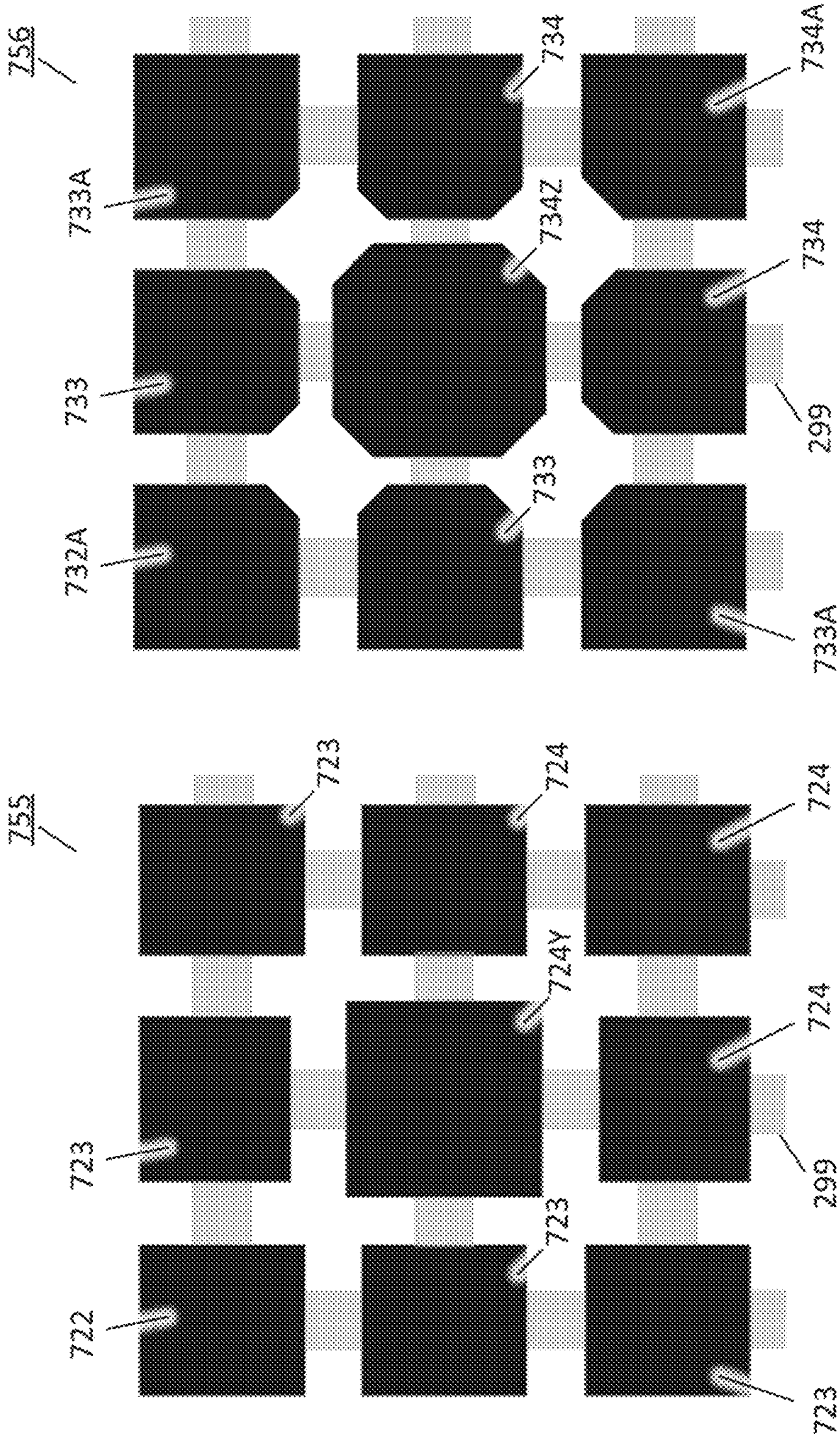

FIG. 60D is a plan view of two square-array rigid-flex PCBs with irregular center rigid PCBs.

Figure 60E:
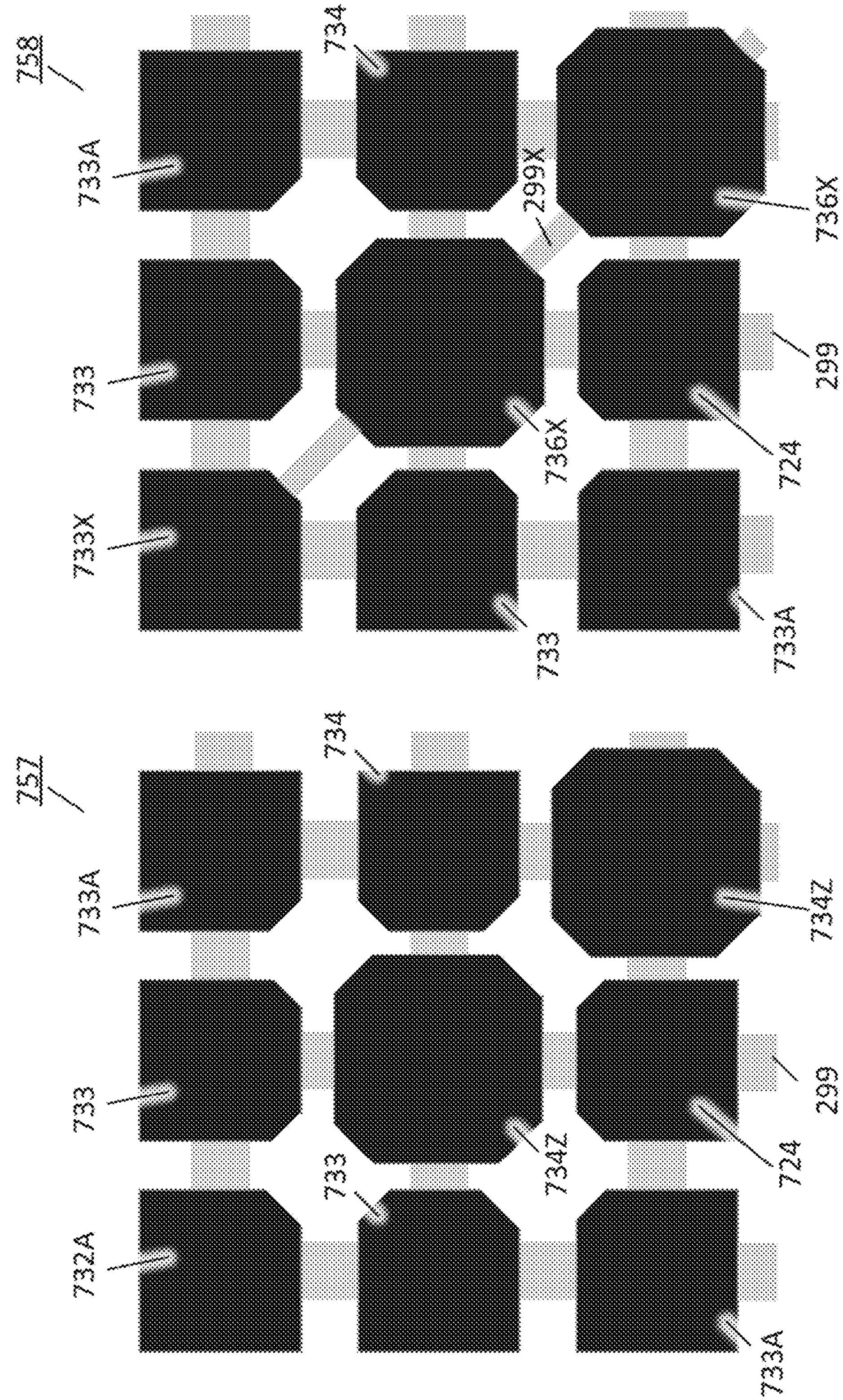

FIG. 60E is a plan view of two square-array rigid-flex PCBs with multiple irregular center rigid PCBs.

Figure 61:
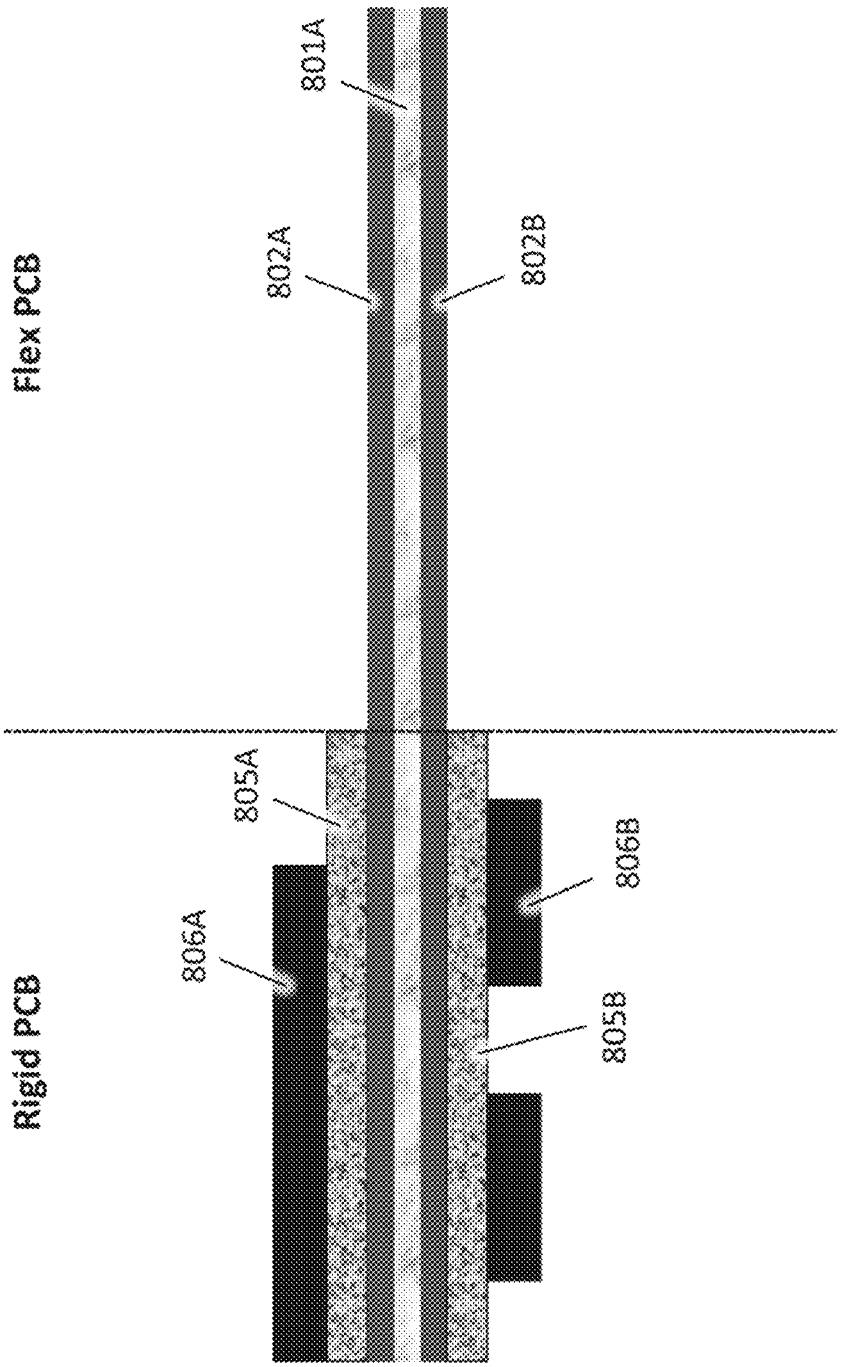

FIG. 61 is a cross sectional view of a rigid-flex PCB with four conductive layers.

Figure 62:
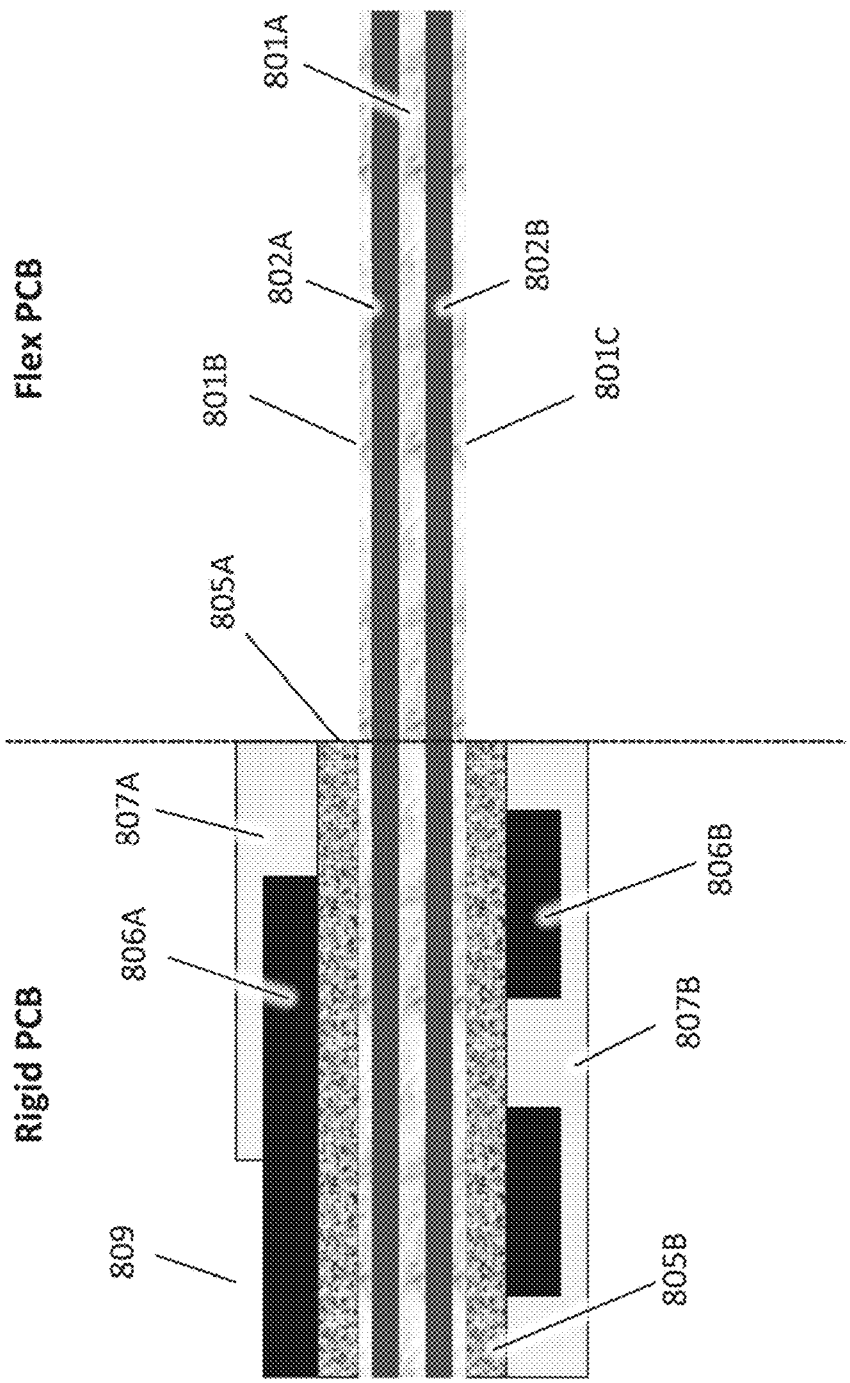

FIG. 62 is a cross sectional view of an alternate rigid-flex PCB with four conductive layers.

Figure 63:
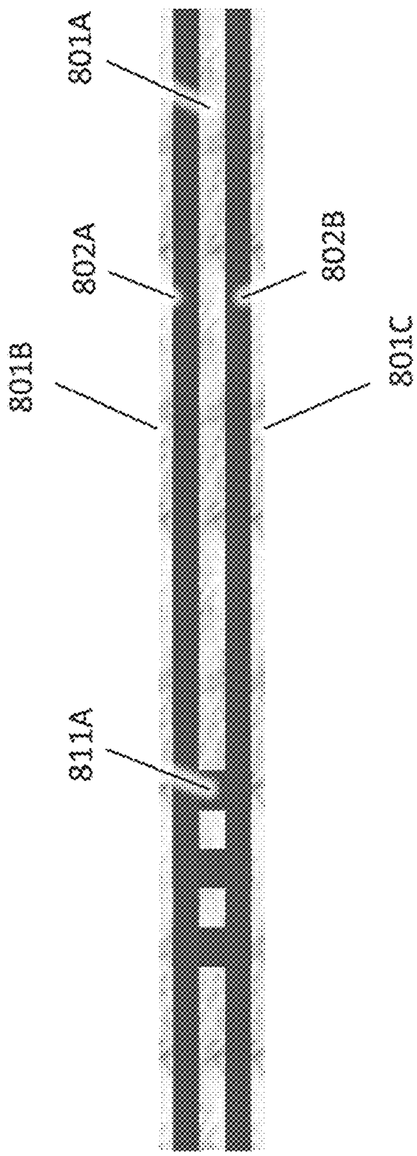
Figure 54:
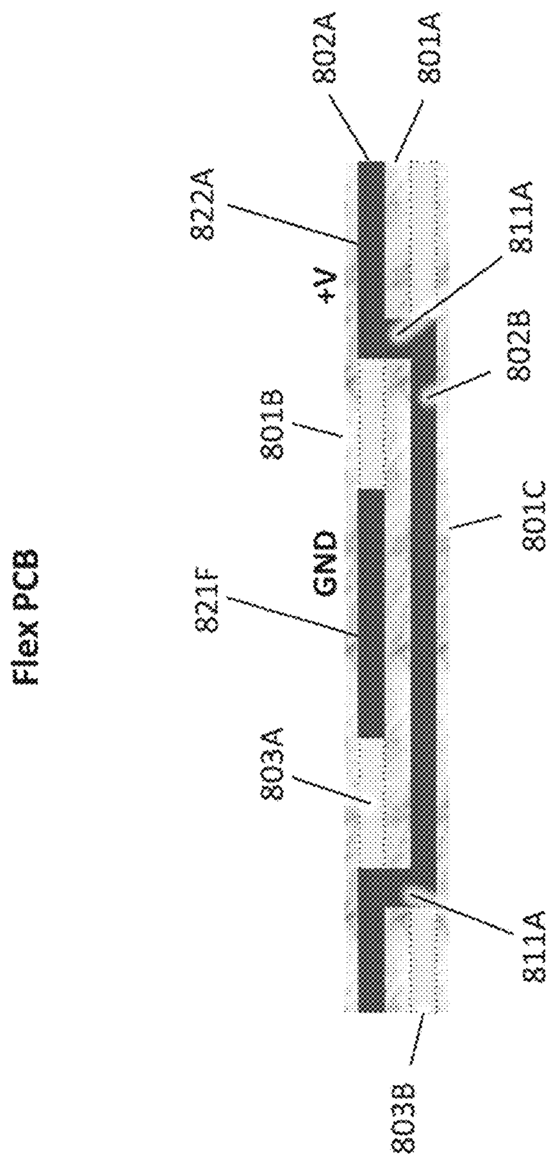

FIG. 63 is a cross sectional view of flex PCB with two conductive layers and a conductive via.

FIG. 64 is a cross sectional view of a flex PCB cross-under.

Figure 65A:
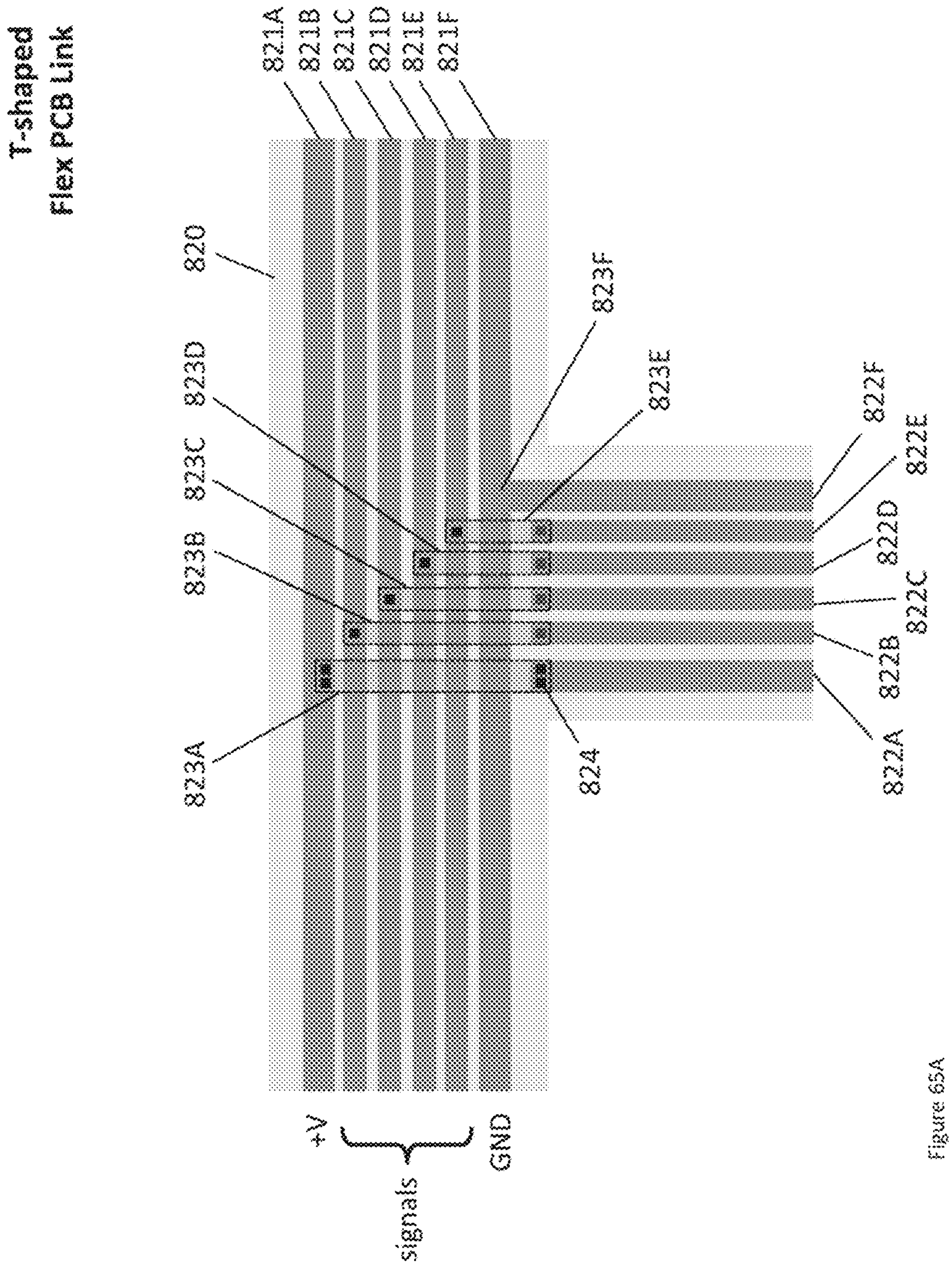

FIG. 65A is a plan view of a T-shaped flex link.

Figure 65B:
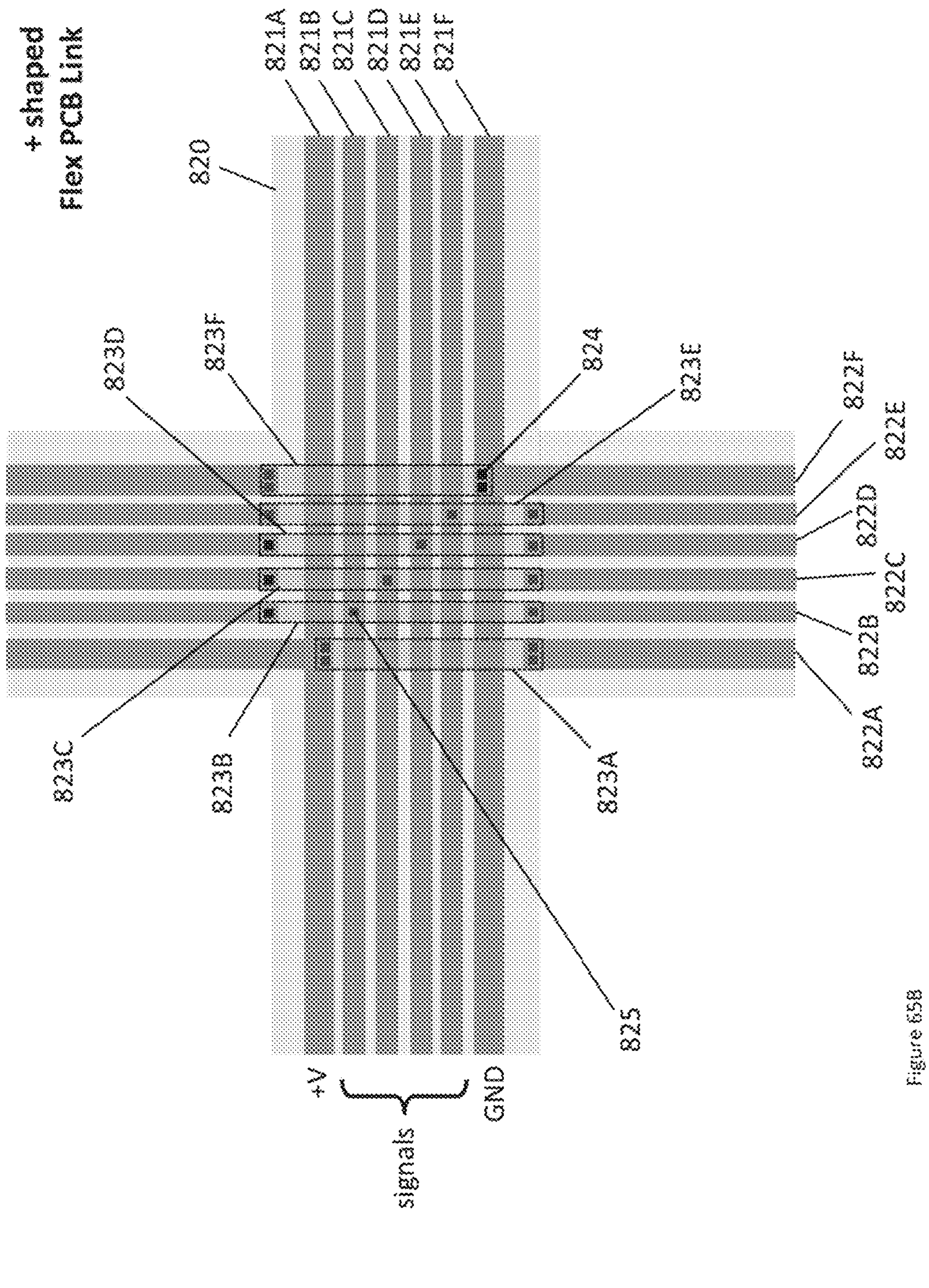

FIG. 65B is a plan view of a + shaped flex link.

Figure 65C:
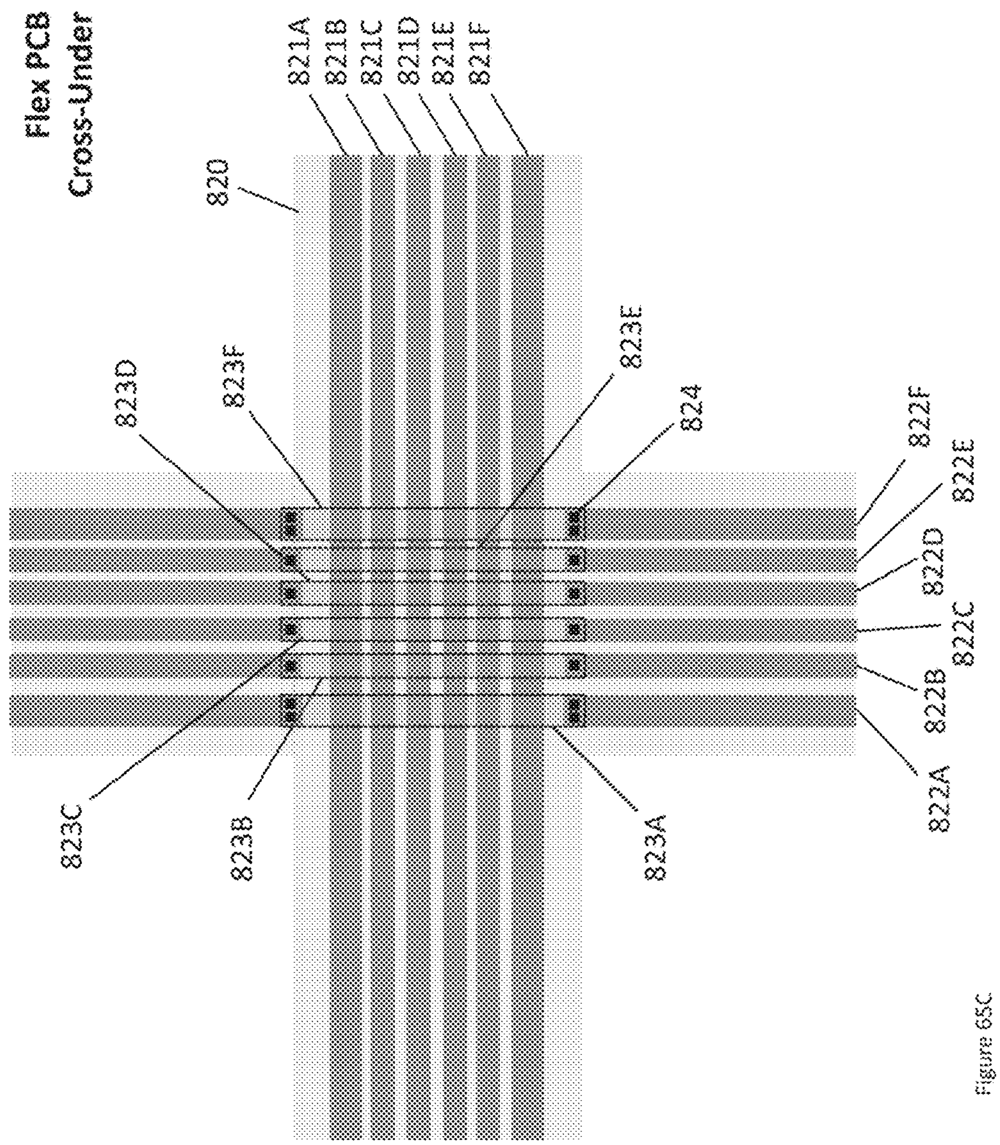

FIG. 65C is a plan view of a flex cross-under.

Figure 66A:
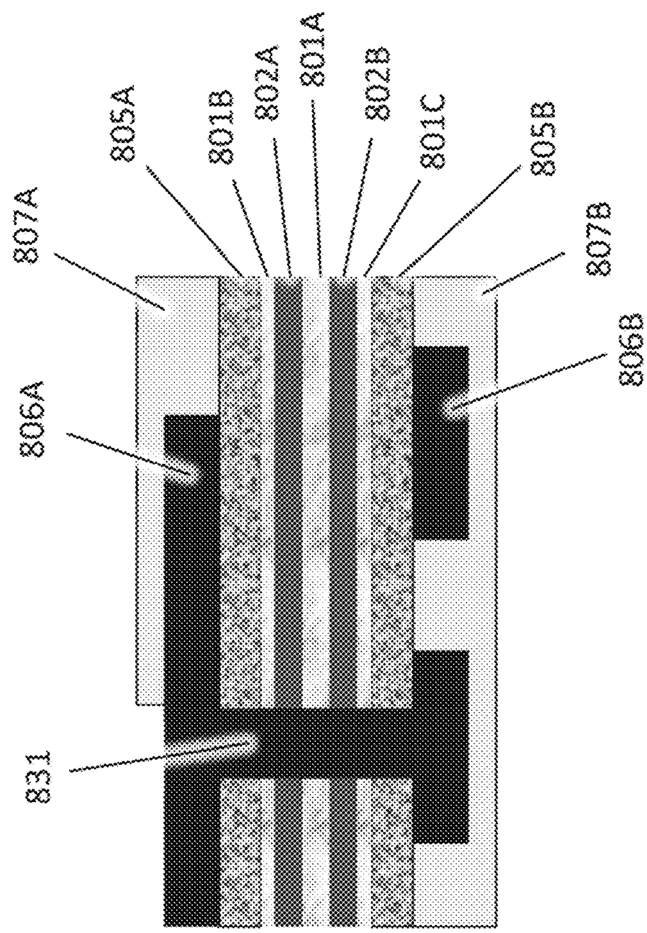

FIG. 66A is a cross sectional view of a rigid-flex PCB with a thru-board via.

Figure 66B:
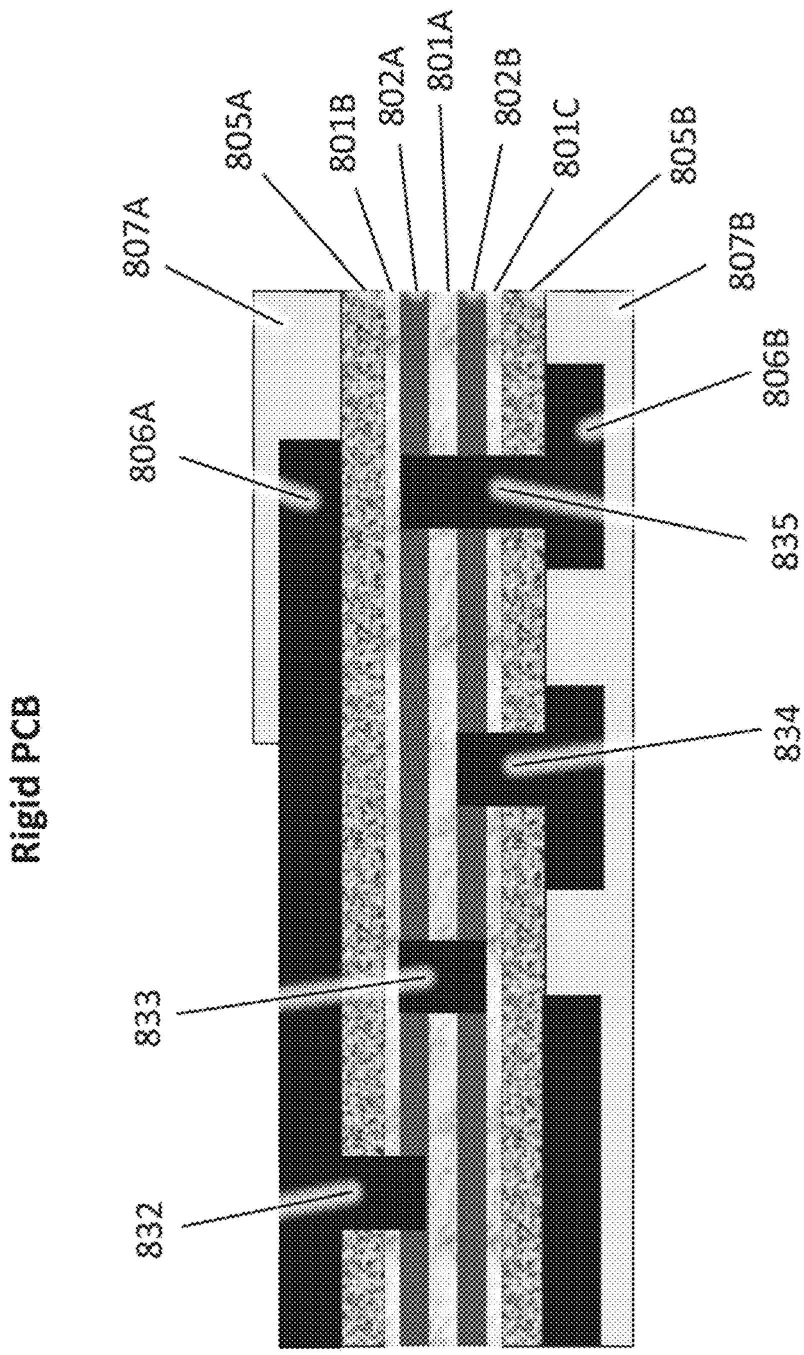

FIG. 66B is a cross sectional view of a rigid-flex PCB with partial vias.

Figure 67:
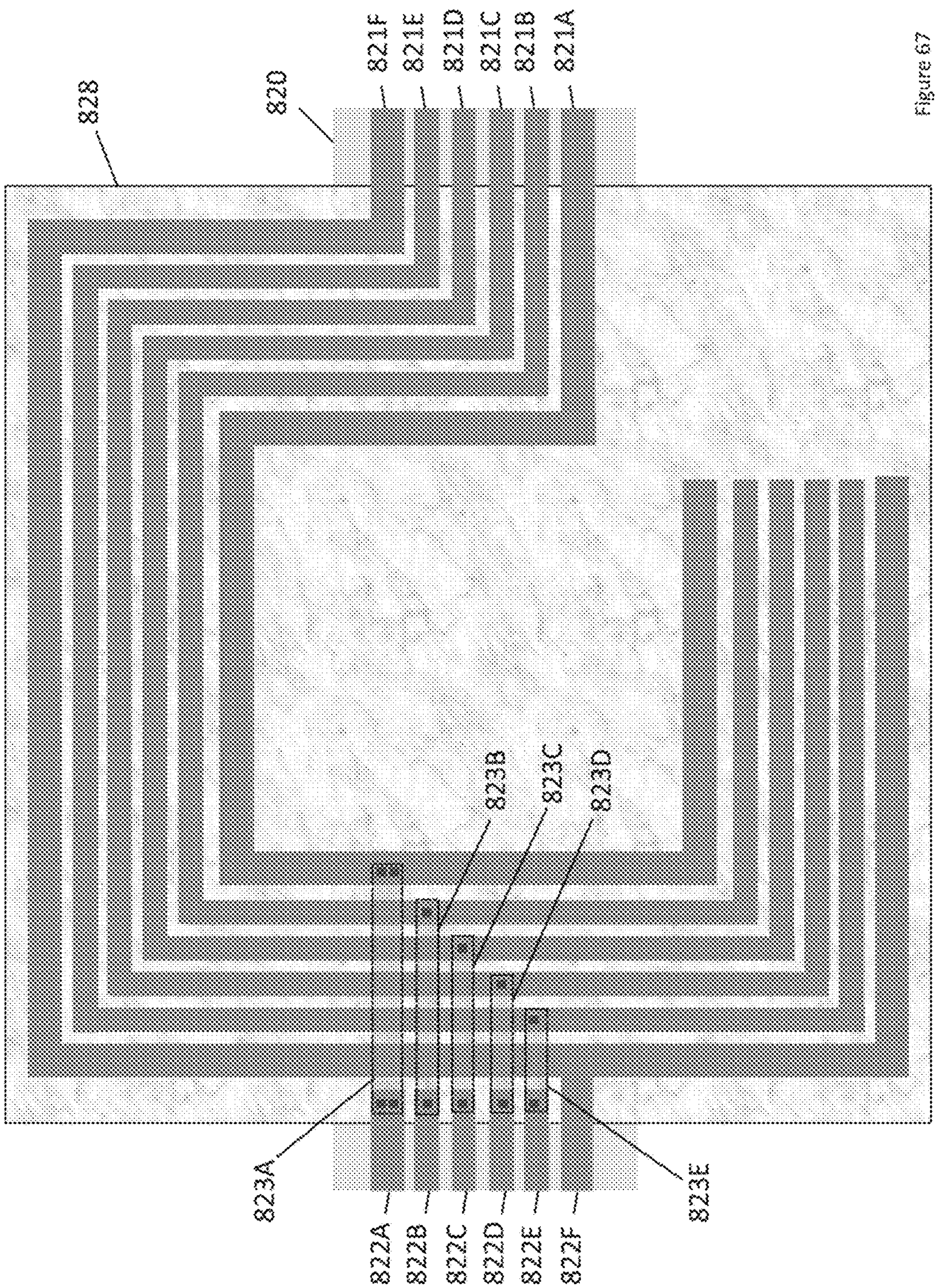

FIG. 67 is a plan view of a rigid PCB power distribution bus.

Figure 68:
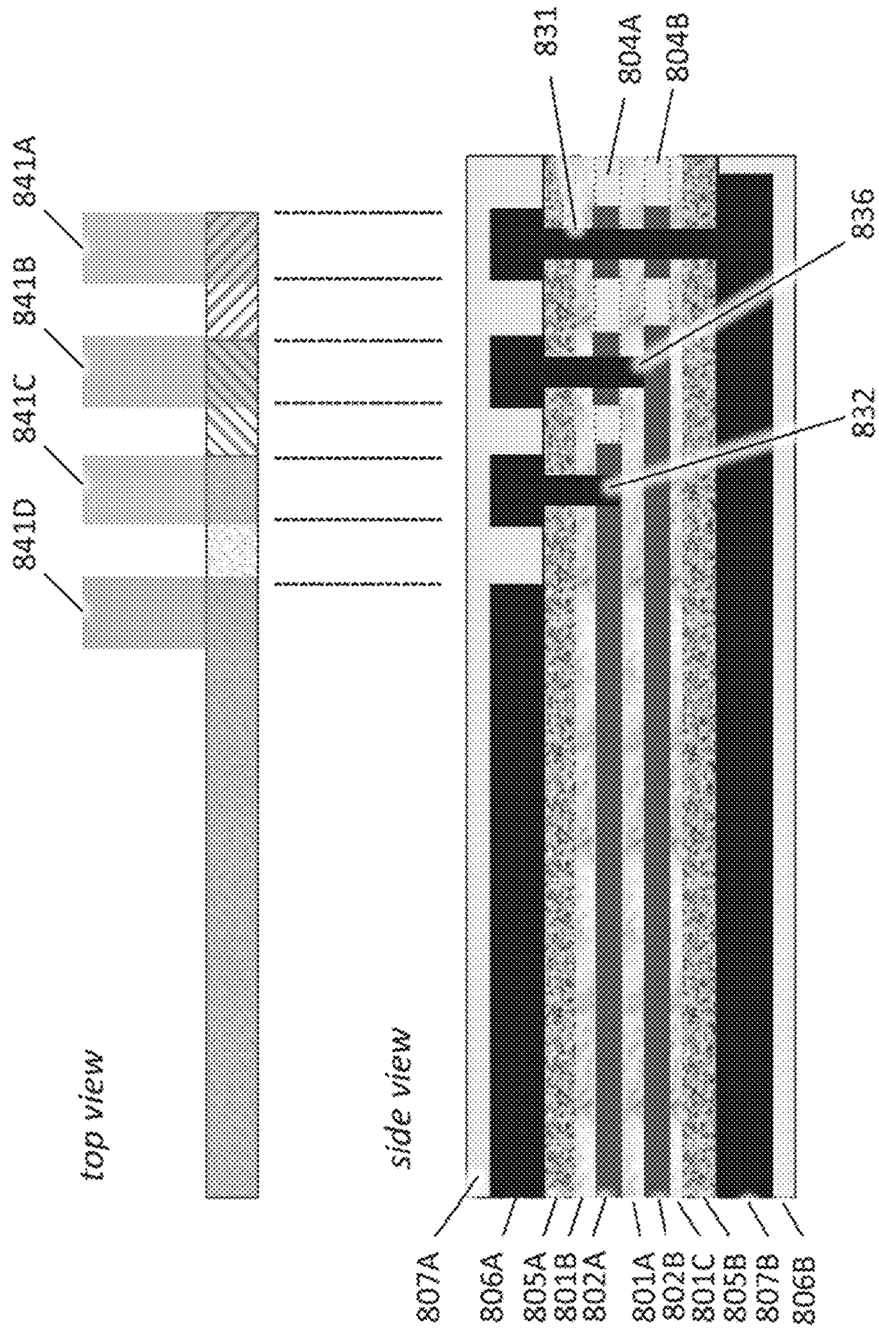

FIG. 68 is a cross sectional view of stacked signal distribution.

Figure 69A:
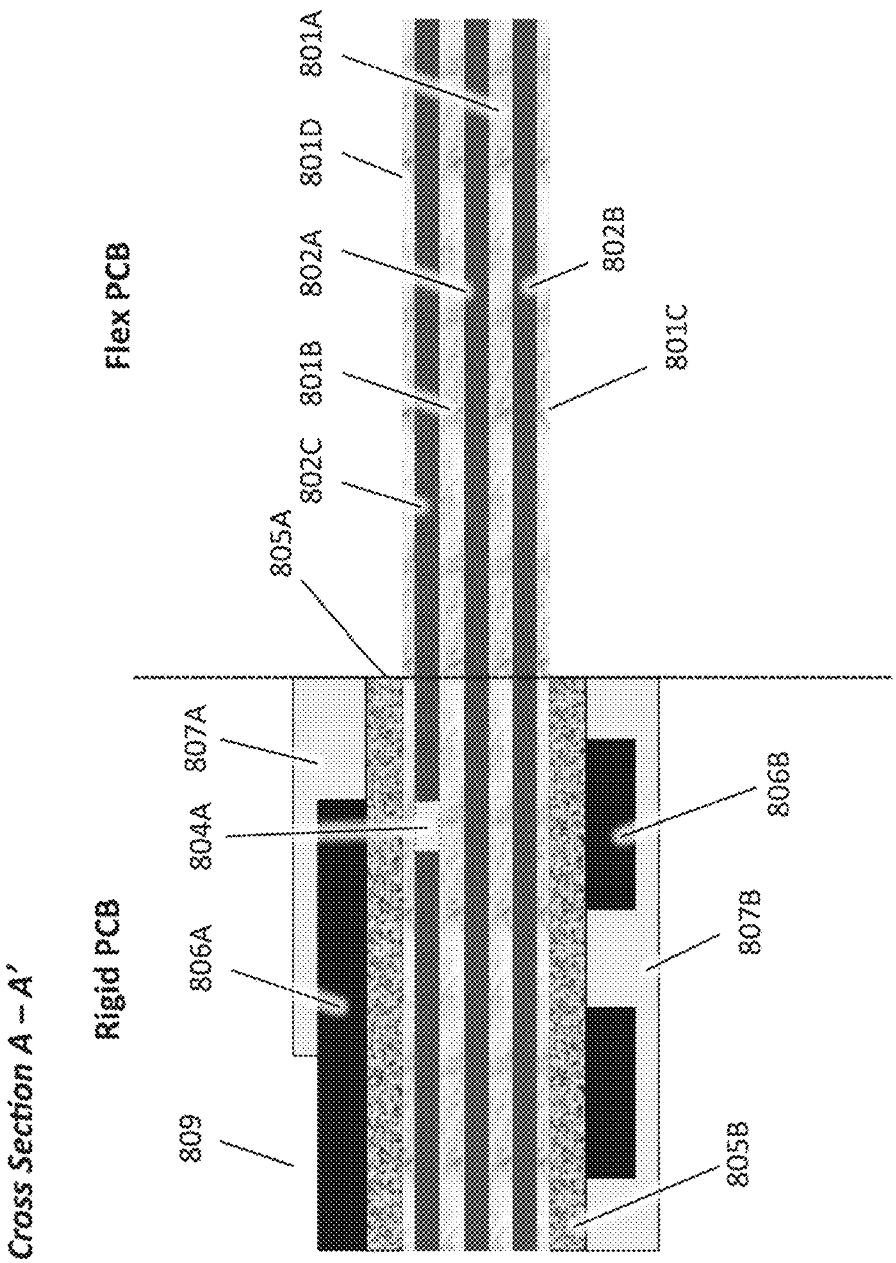
Figure 69B:
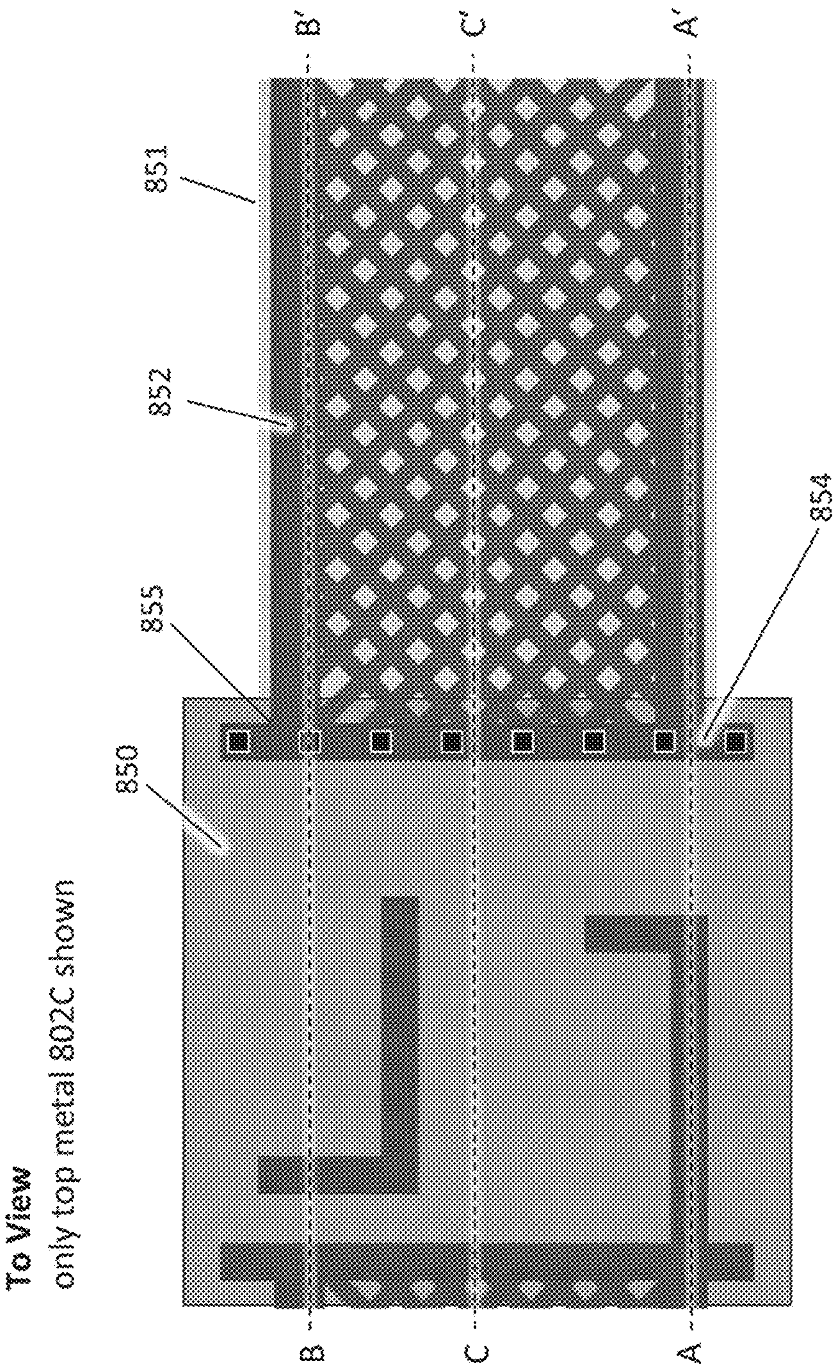

FIG. 69A is a cross sectional view of a rigid-flex PCB with three flex-embedded conductive layers corresponding to cross section A-A' in FIG. 69B.

FIG. 69B is a plan view of a strain relief conductive mesh.

Figure 69C:
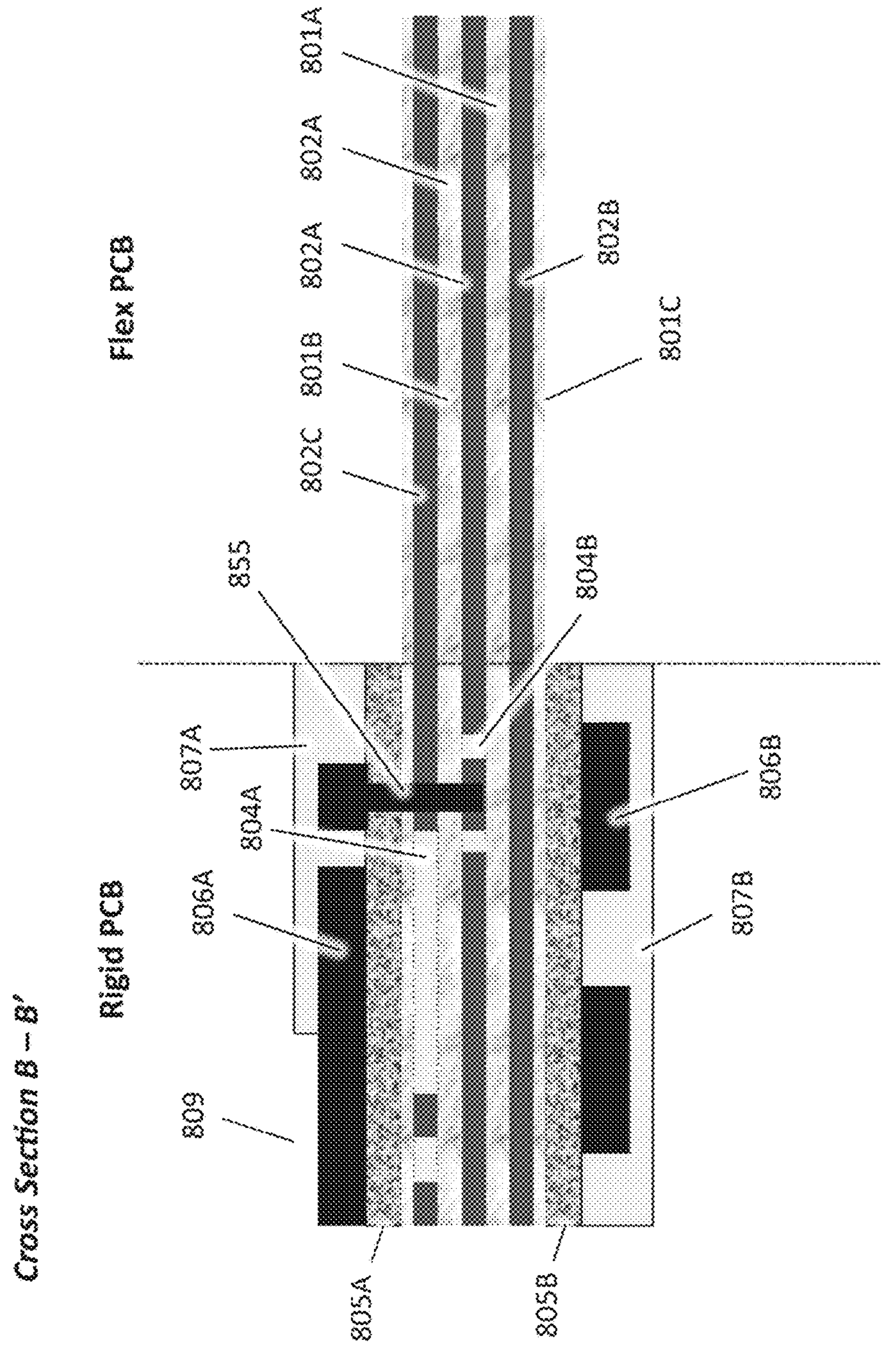

FIG. 69C is a cross section of a via-anchored strain relief conductive mesh corresponding to cross section B-B' in FIG. 69B.

Figure 69D:
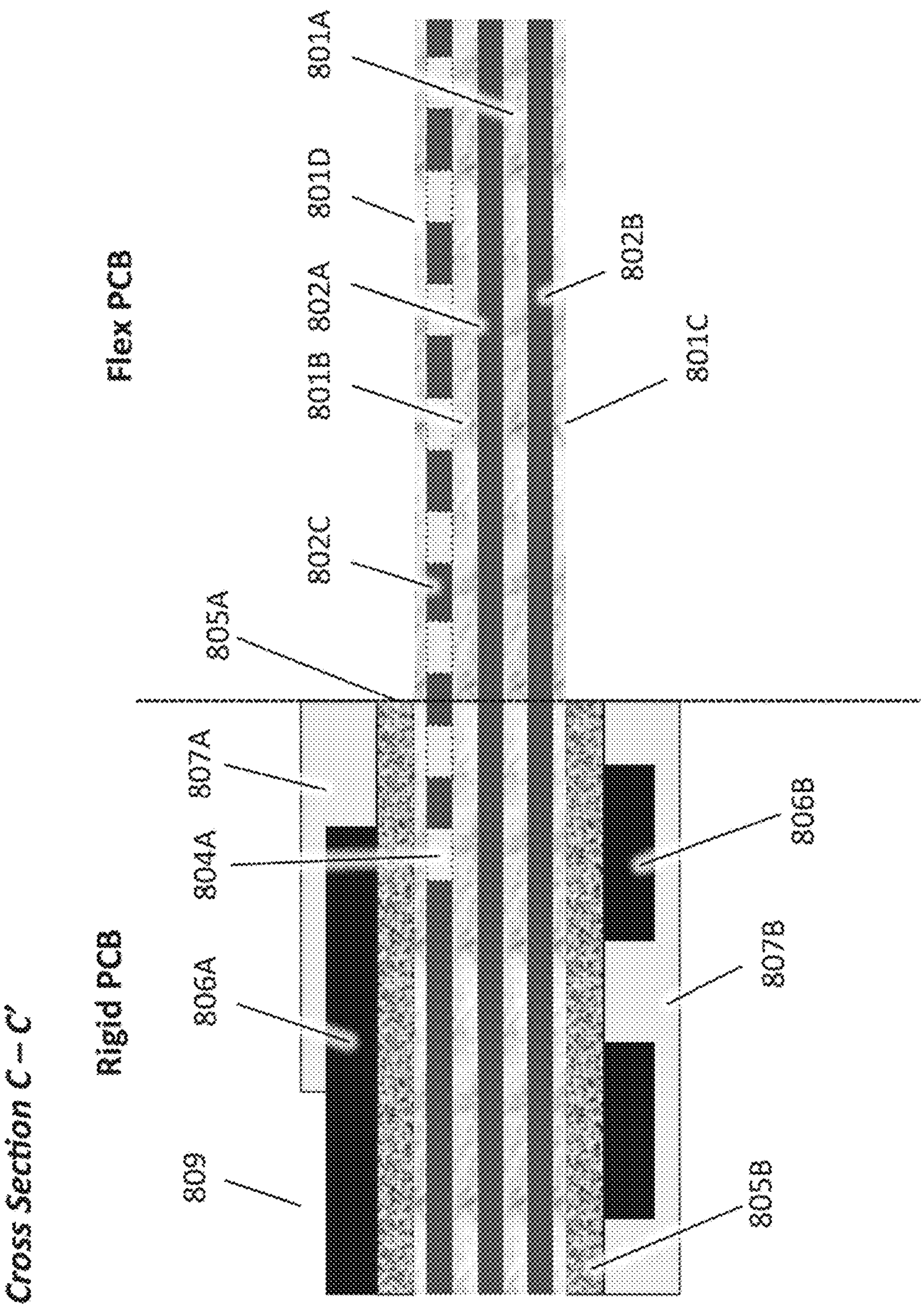

FIG. 69D is a cross sectional view of a rigid-flex PCB with three flex-embedded conductive layers corresponding to cross section C-C' in FIG. 69B.

Figure 69E:
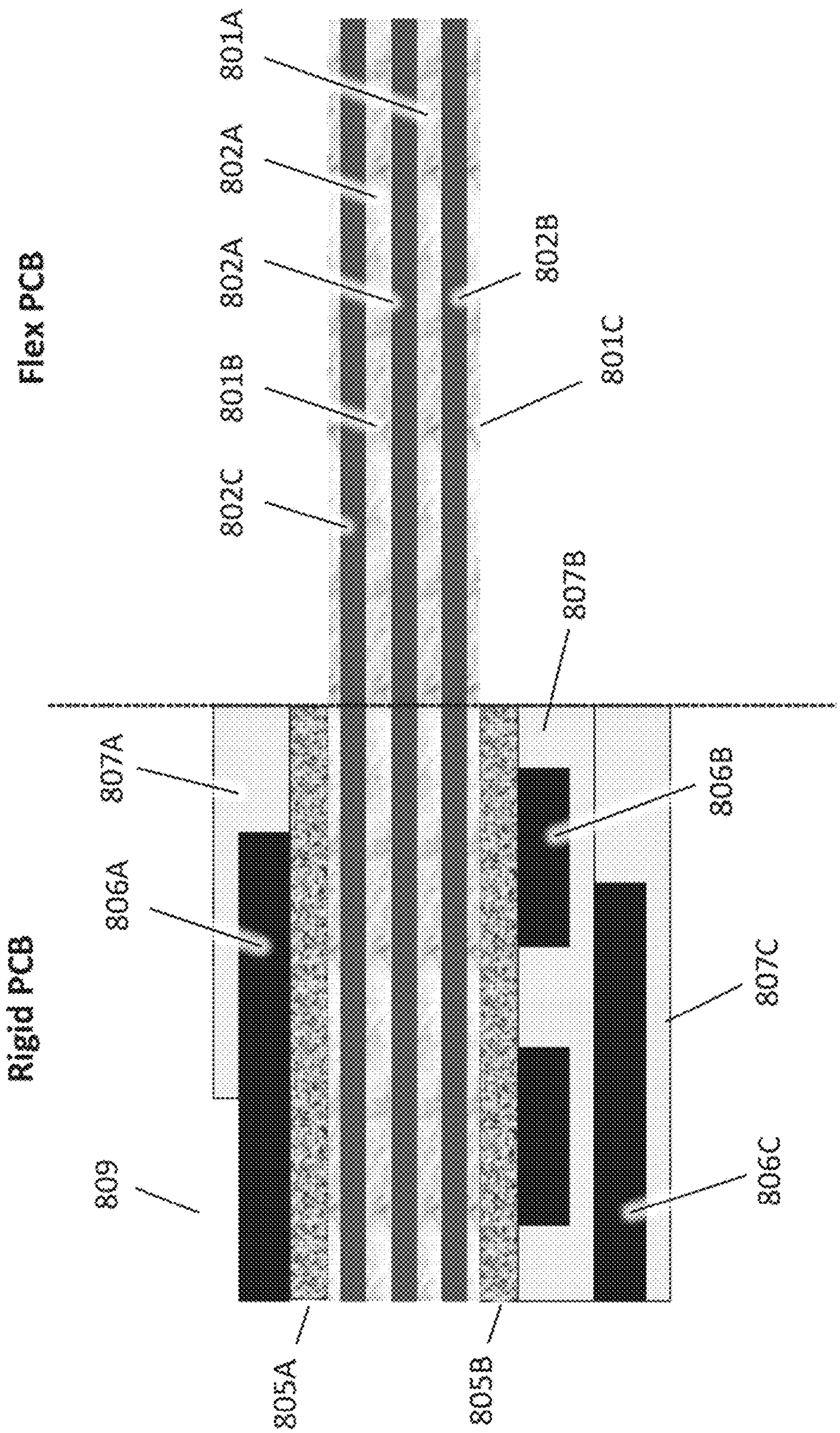

FIG. 69E is a cross section of a rigid-flex PCB with three conductive layer rigid PCB.

Figure 70:
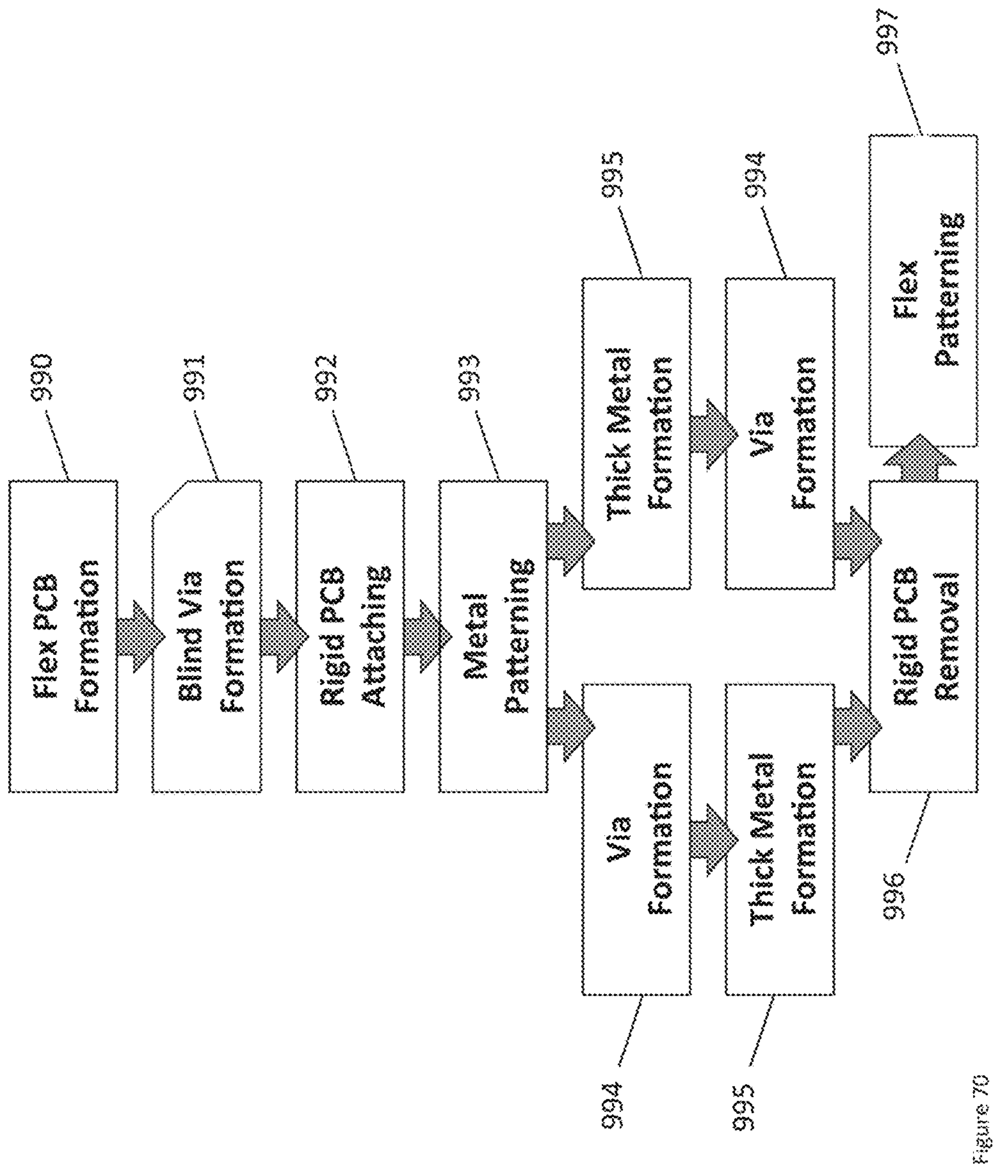

FIG. 70 is a flow chart for fabricating 3D bendable PCBs.

Figure 71:
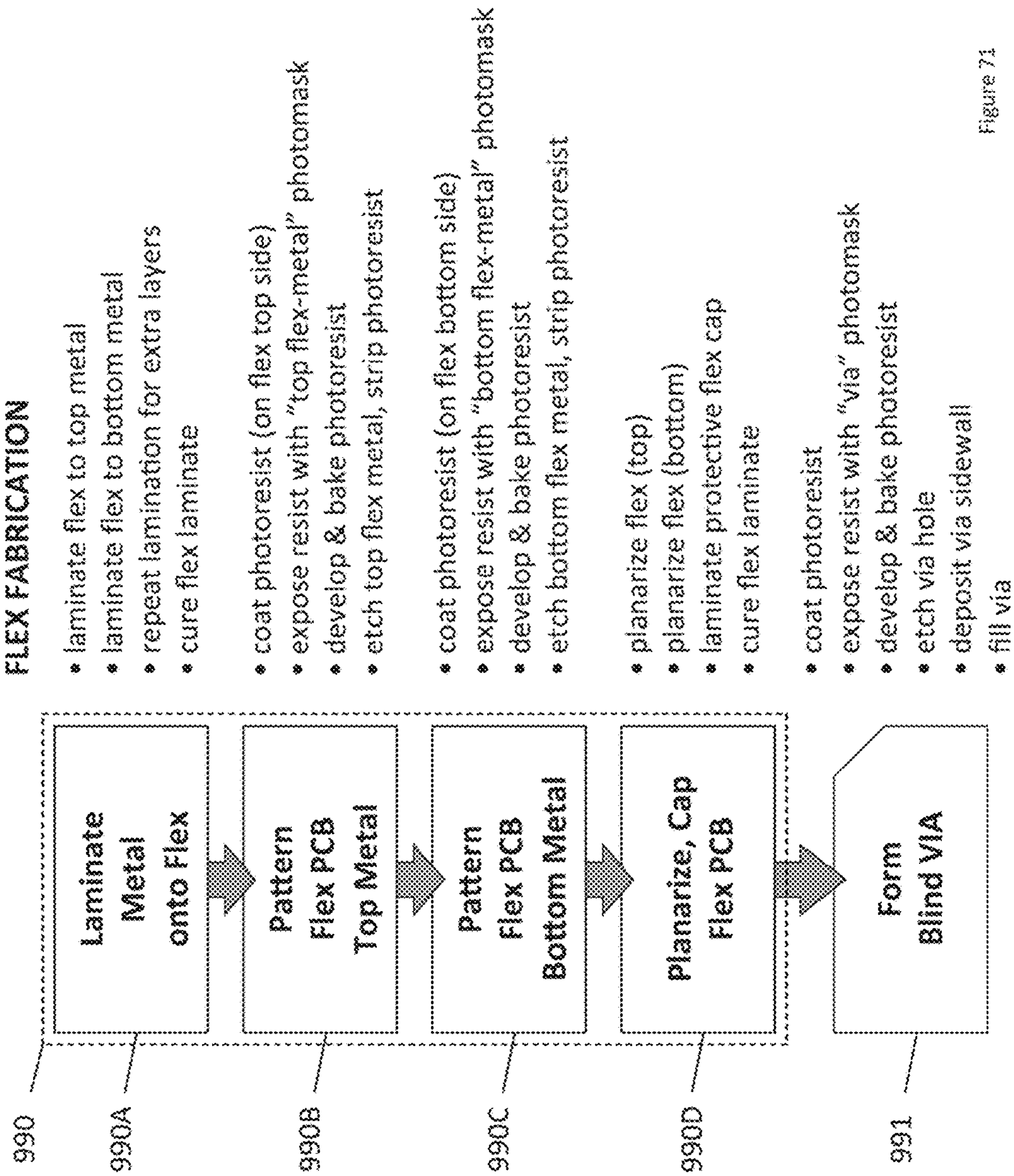

FIG. 71 is a flow chart capable of fabricating the flex portion of 3D bendable PCBs.

Figure 72A:
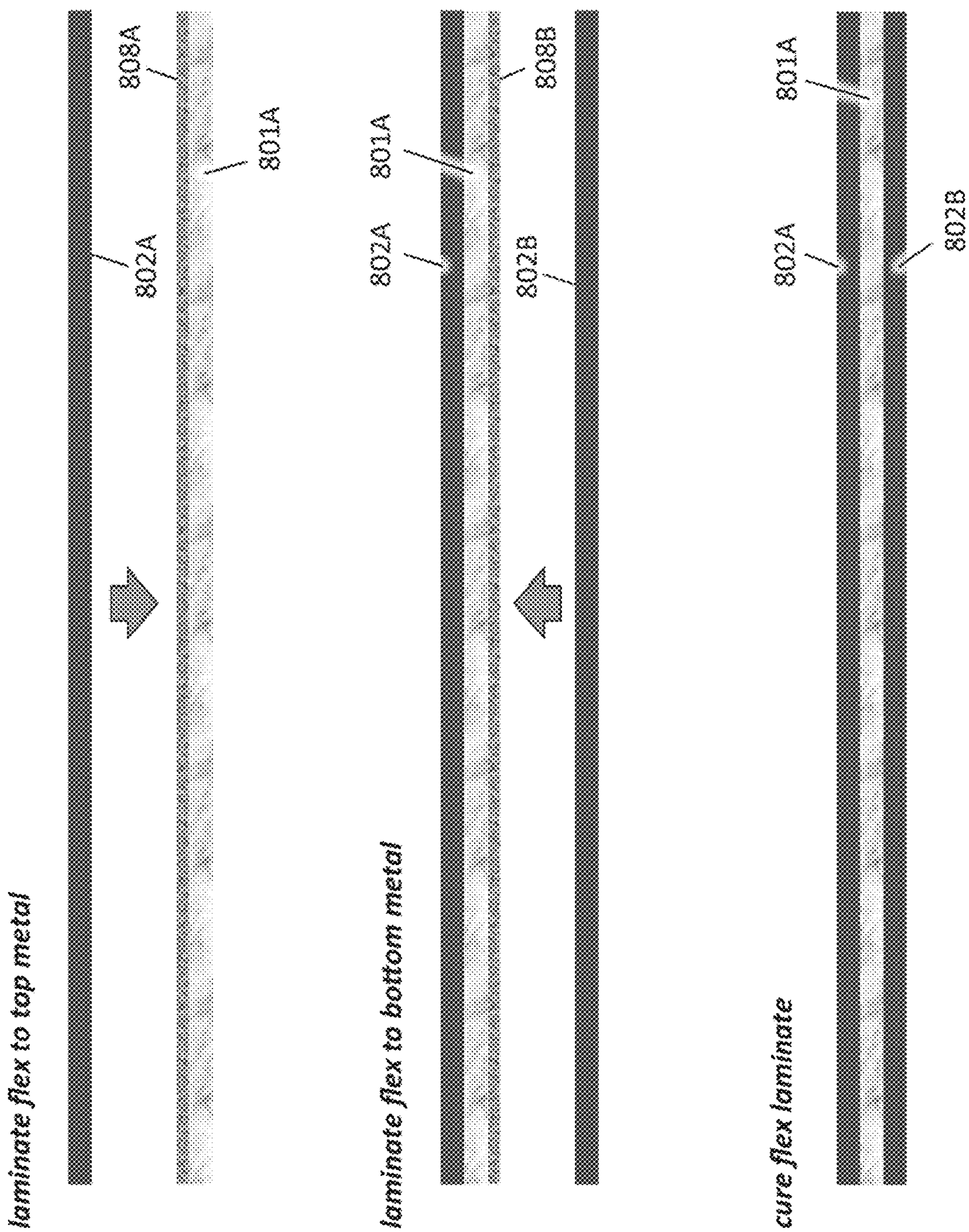

FIG. 72A comprises cross sections of dual-layer-metal flex PCB fabrication steps used in 3D bendable PCBs.

Figure 72B:
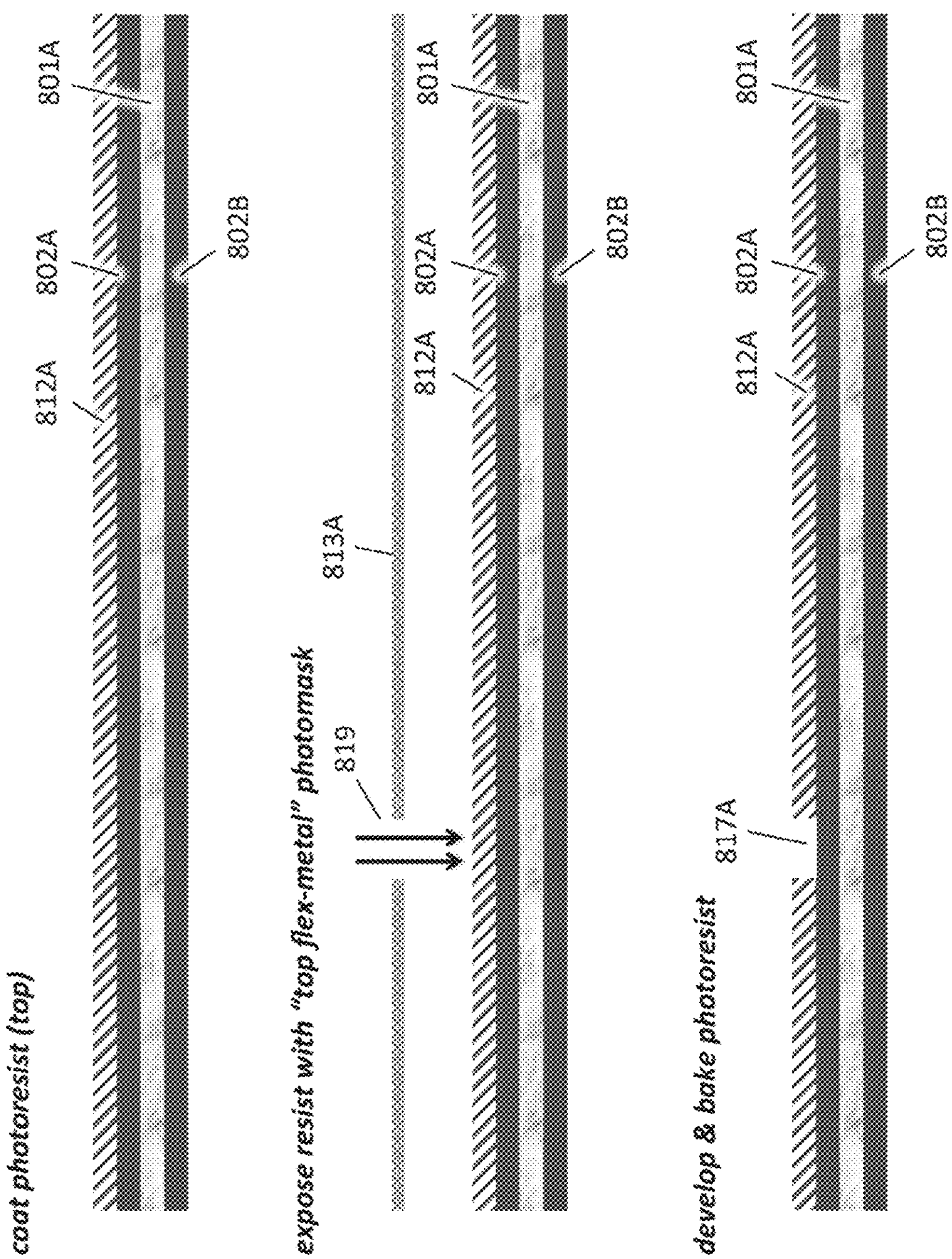

FIG. 72B comprises cross sections of flex metal patterning steps used in 3D bendable PCB fabrication.

Figure 72C:
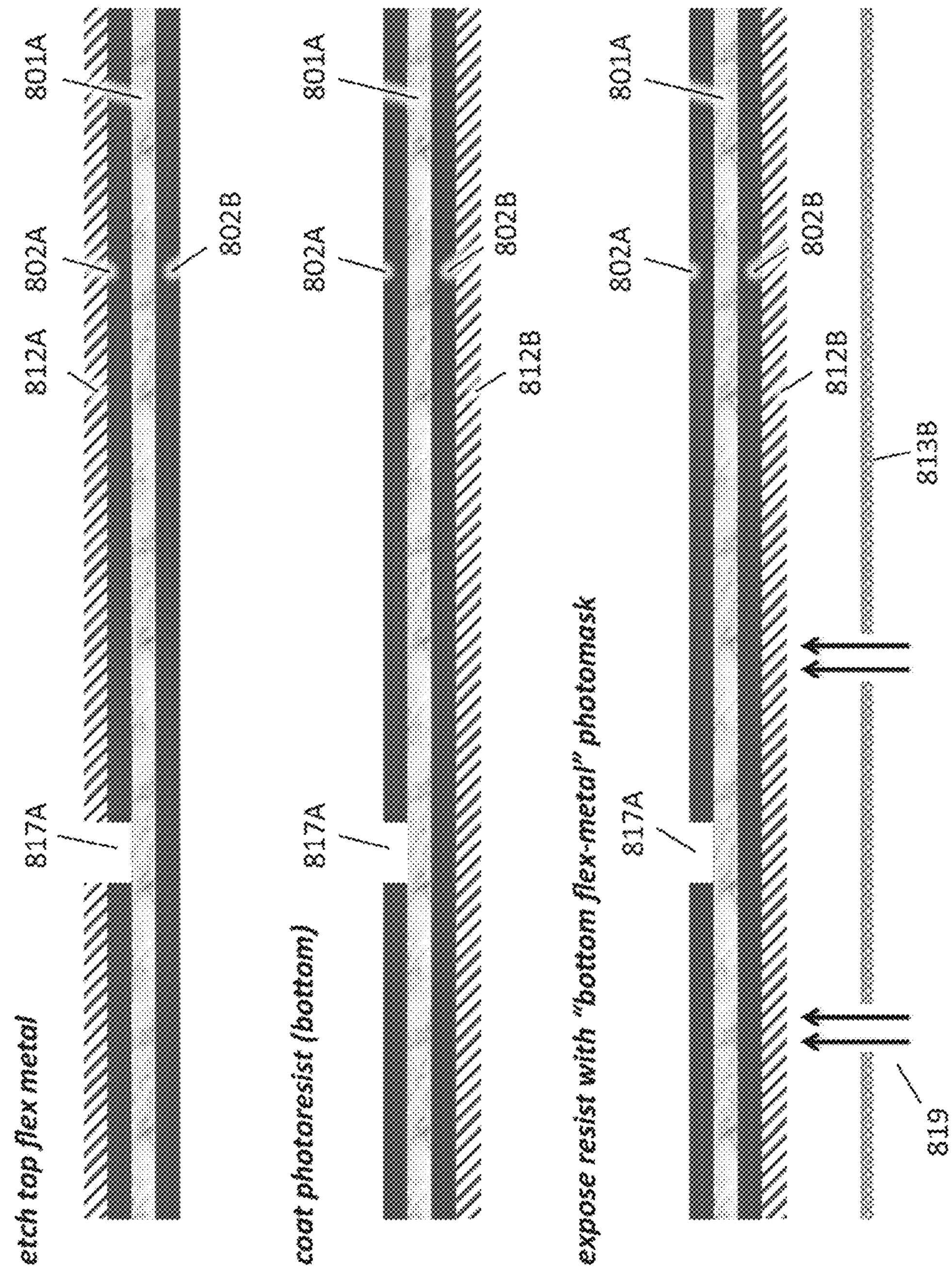

FIG. 72C comprises cross sections of additional flex metal patterning steps used in 3D bendable PCB fabrication.

Figure 72D:
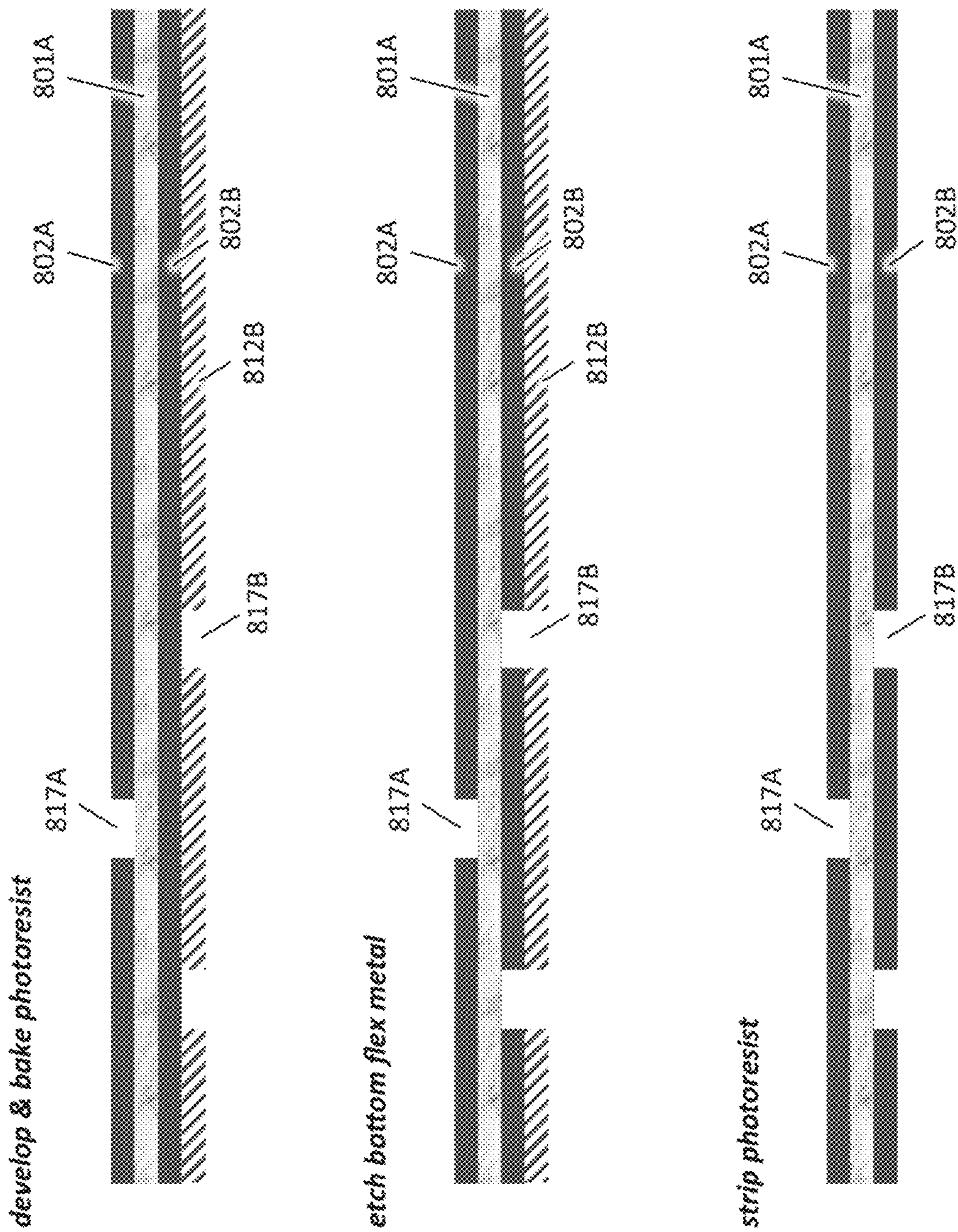

FIG. 72D comprises cross sections of further additional flex metal patterning steps used in 3D bendable PCB fabrication.

Figure 72E:
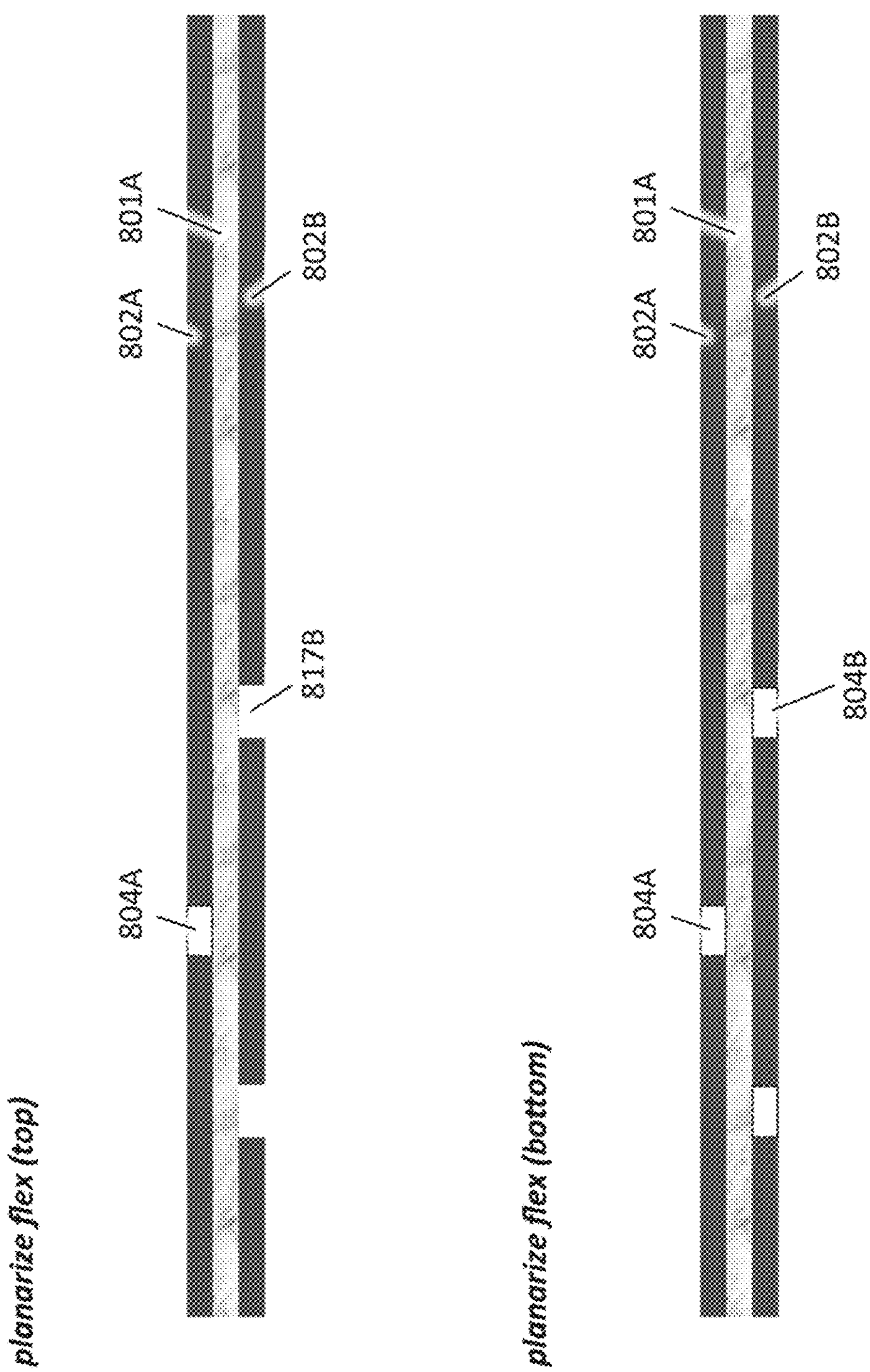

FIG. 72E comprises cross sections of flex planarization steps used in 3D bendable PCB fabrication.

Figure 72F:
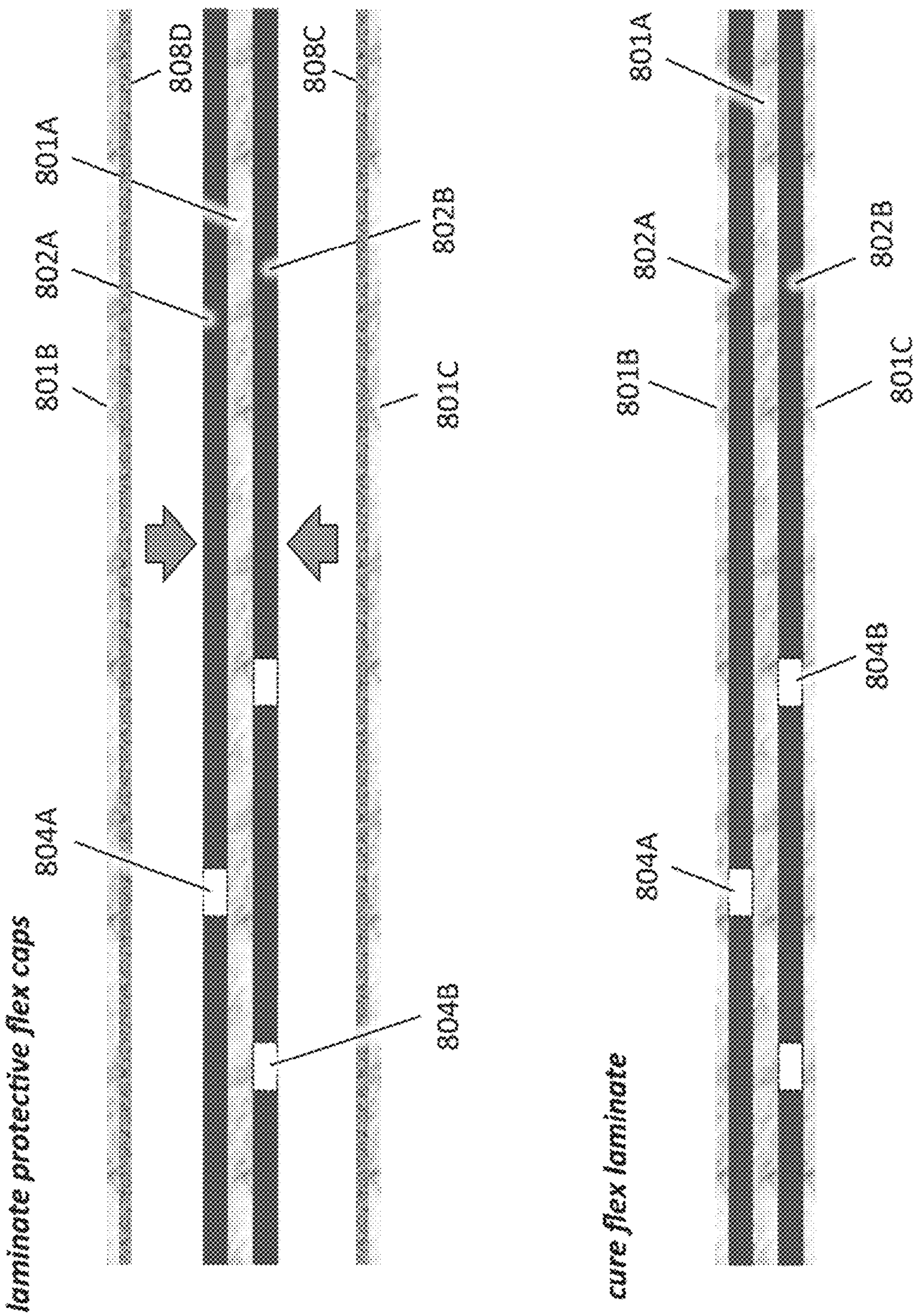

FIG. 72F comprises cross sections of flex cap fabrication steps used in 3D bendable PCB fabrication.

Figure 73A:
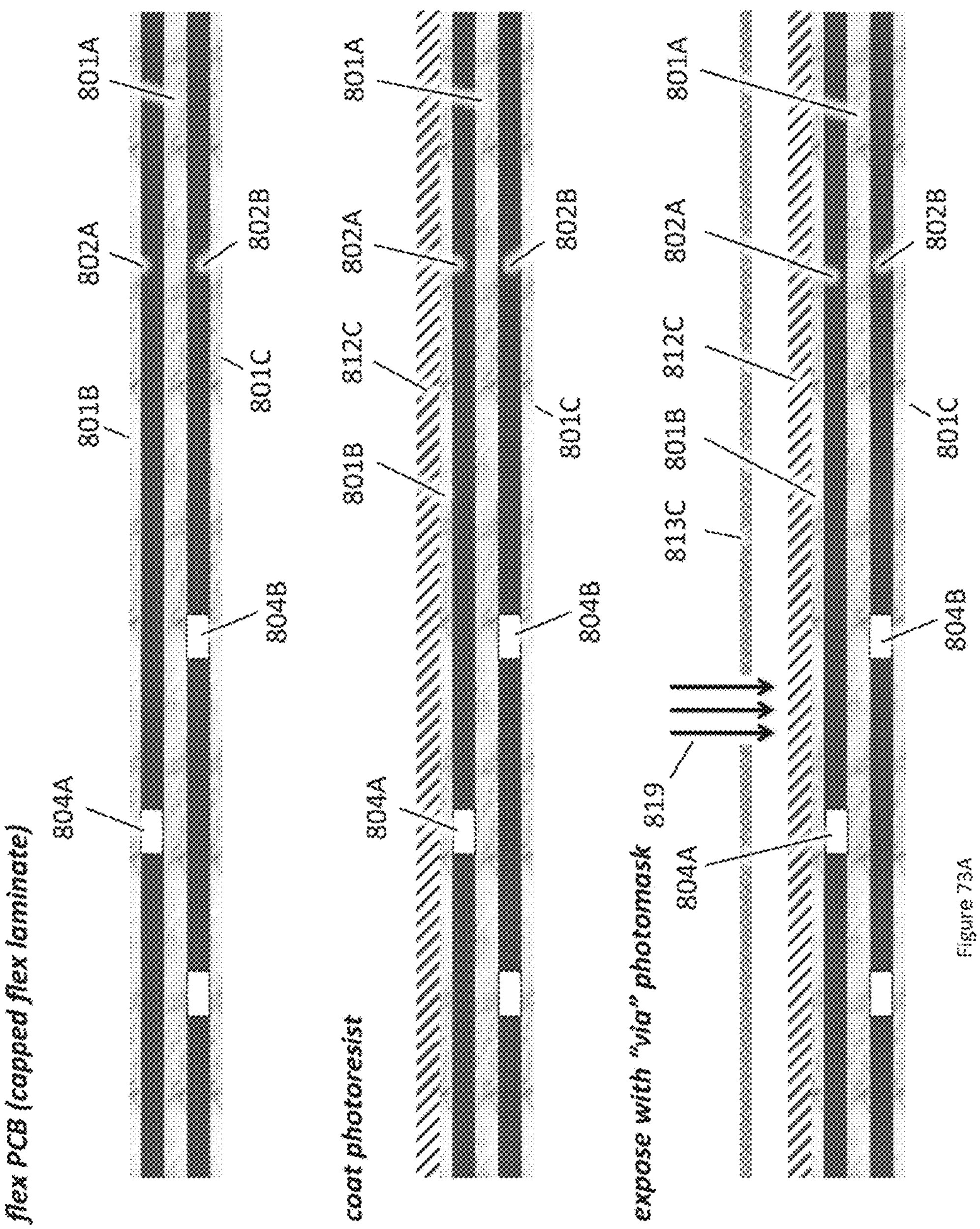

FIG. 73A comprises cross sections of blind via fabrication steps used in 3D bendable PCB fabrication.

Figure 73B:
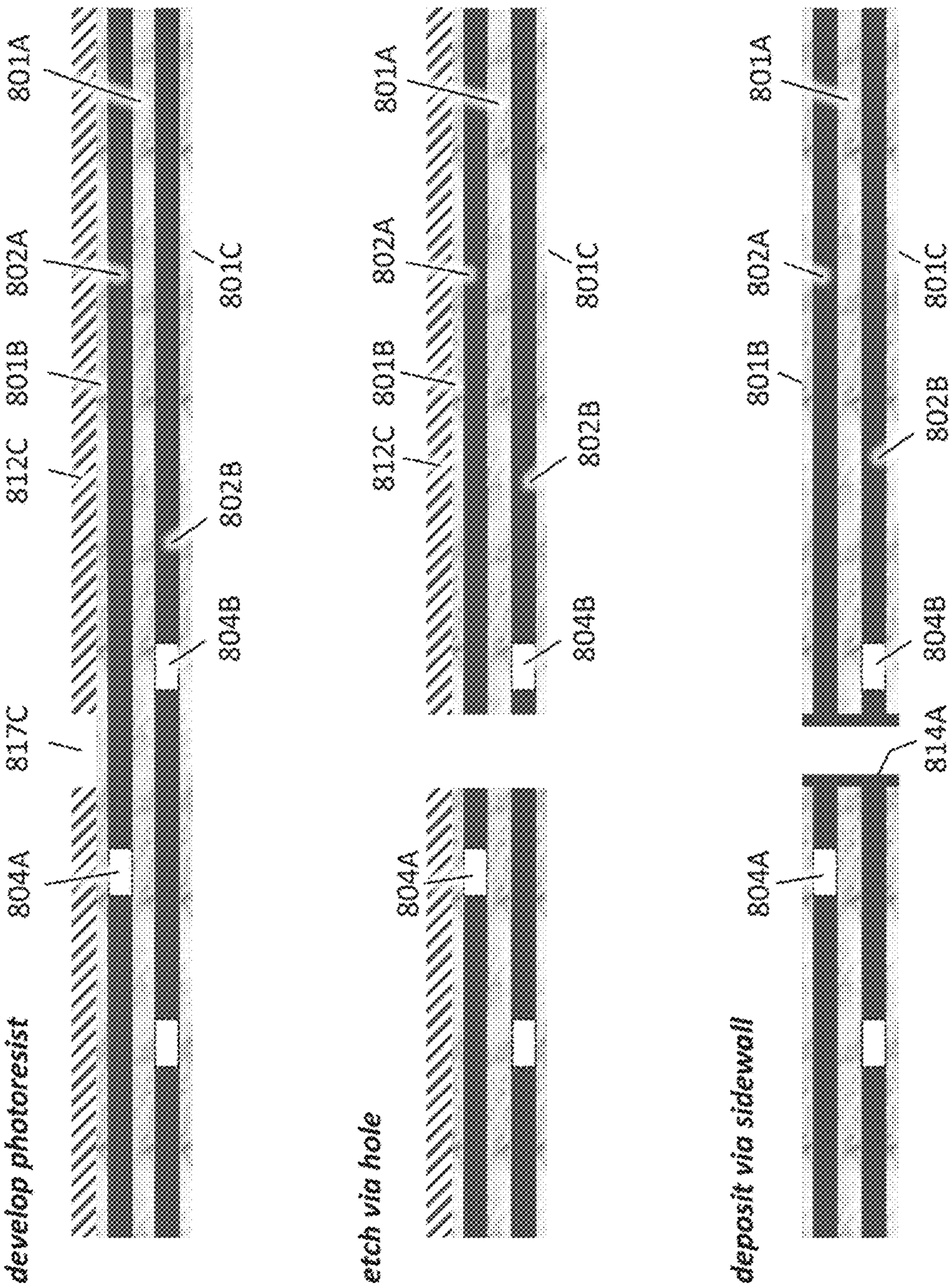

FIG. 73B comprises cross sections of additional blind via fabrication steps used in 3D bendable PCB fabrication.

Figure 73C:
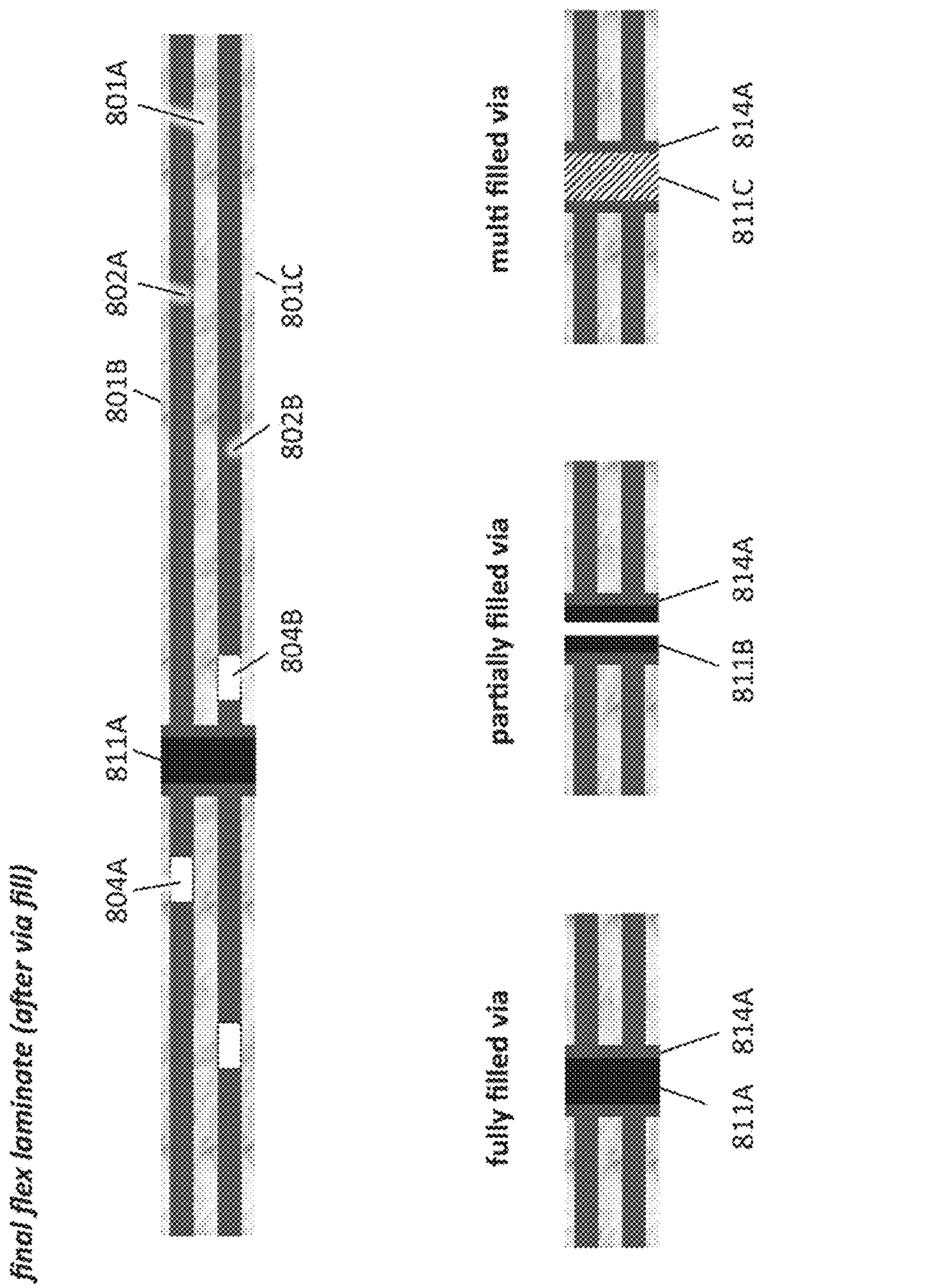

FIG. 73C comprises cross sections of various fabricated blind vias used in 3D bendable PCB fabrication.

Figure 74:
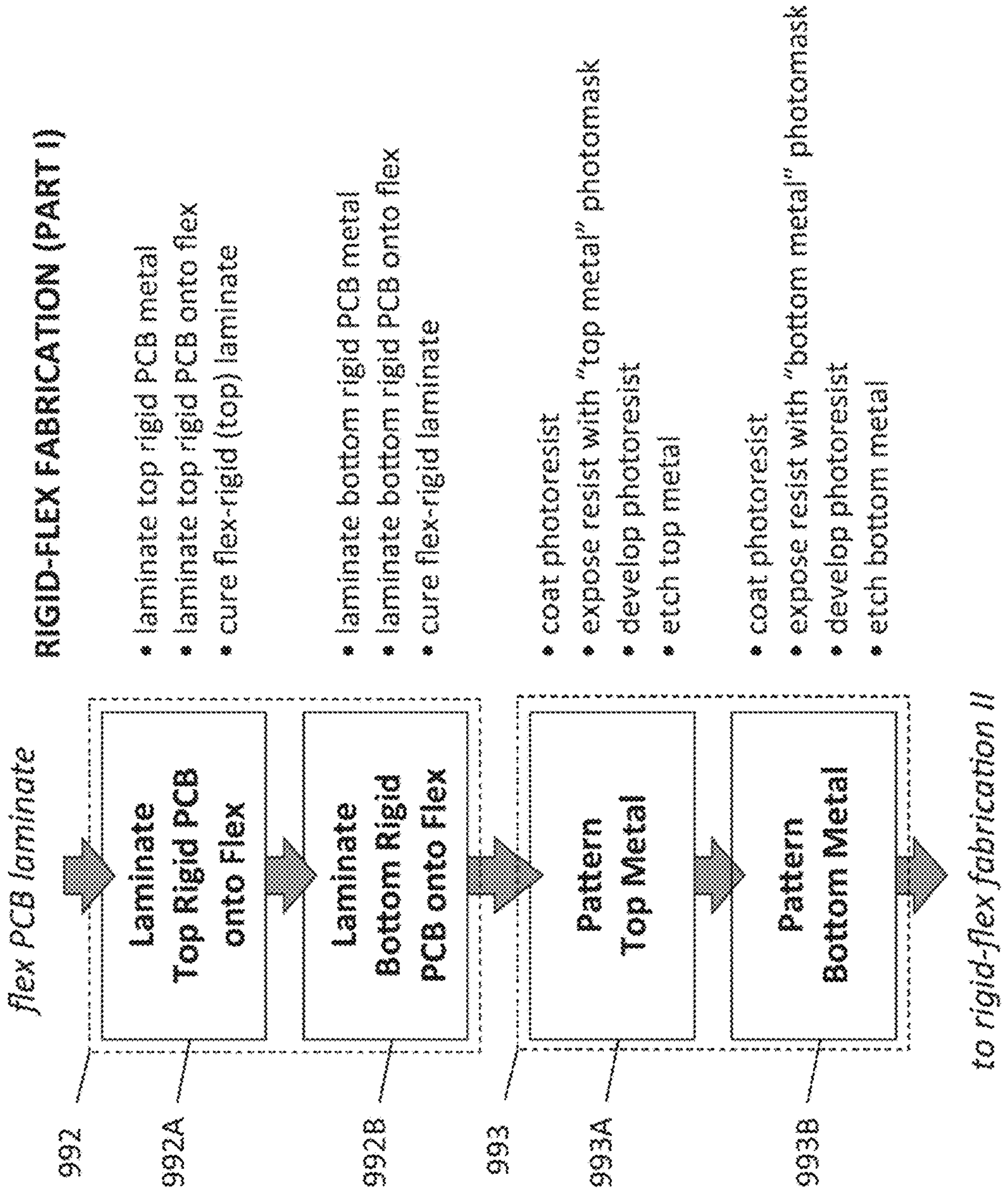

FIG. 74 is a flow chart of a portion of rigid-flex fabrication for 3D bendable PCBs.

Figure 75A:
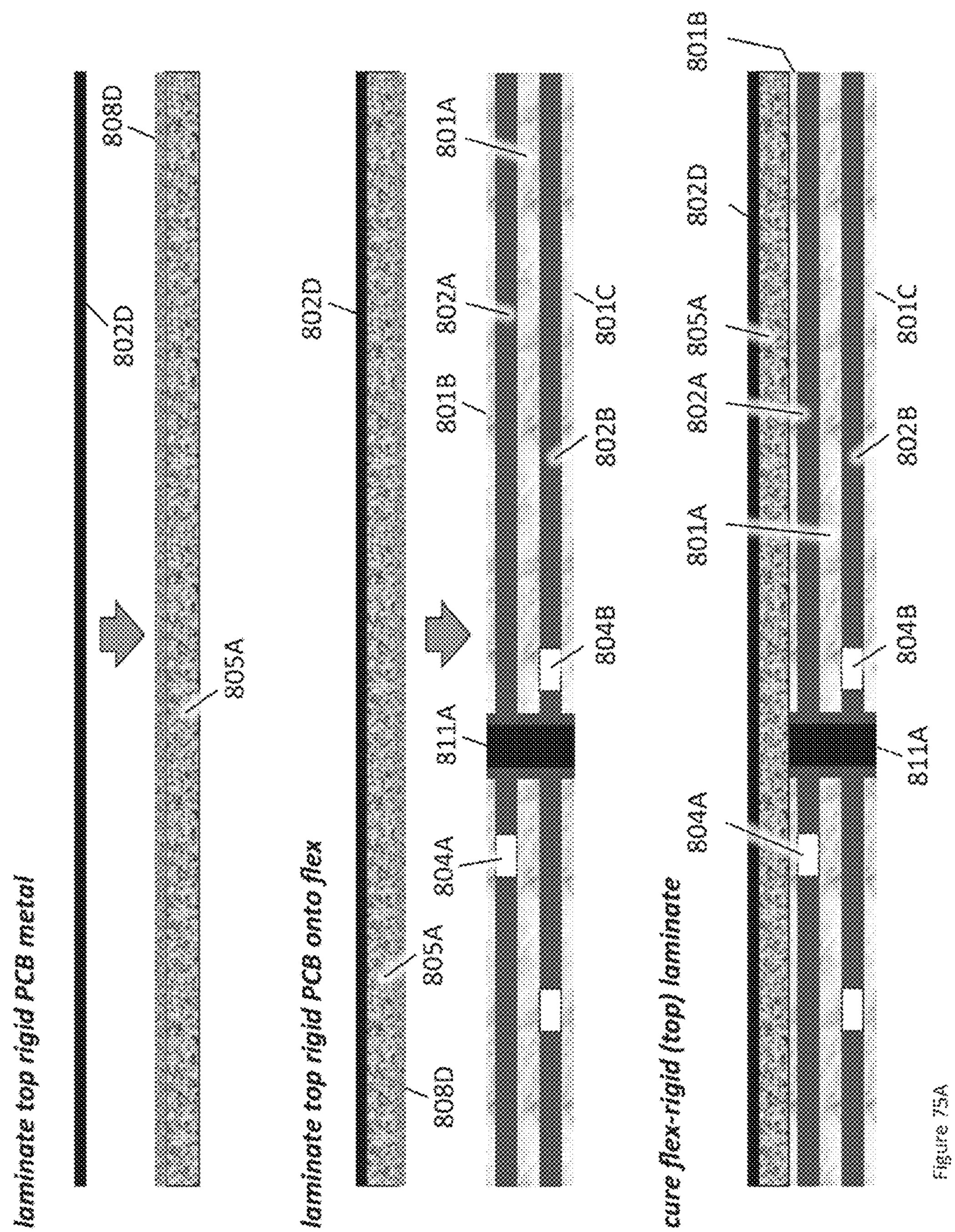

FIG. 75A comprises cross sections of top rigid-to-flex lamination steps for 3D bendable PCBs.

Figure 75B:
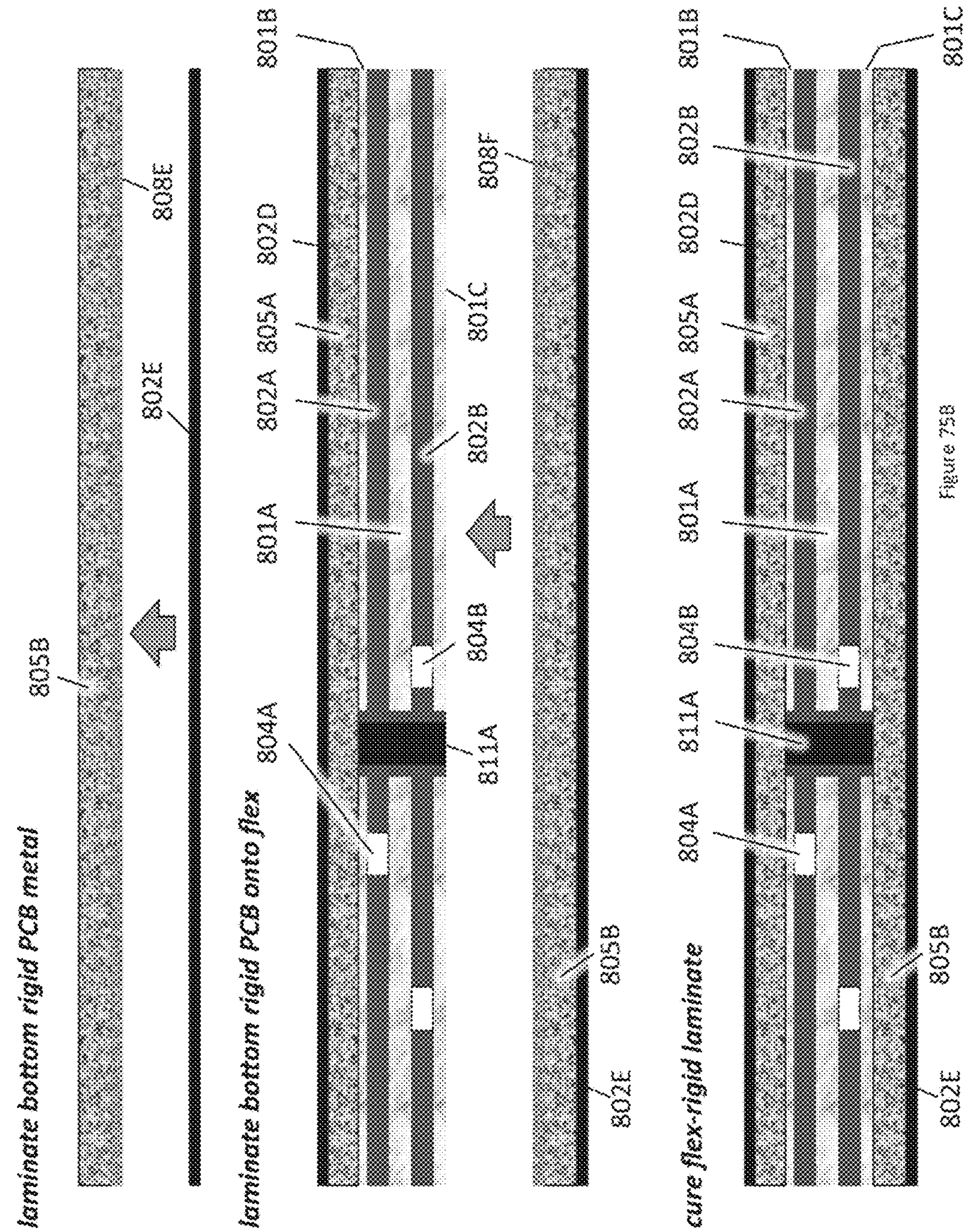
Figure 75A:
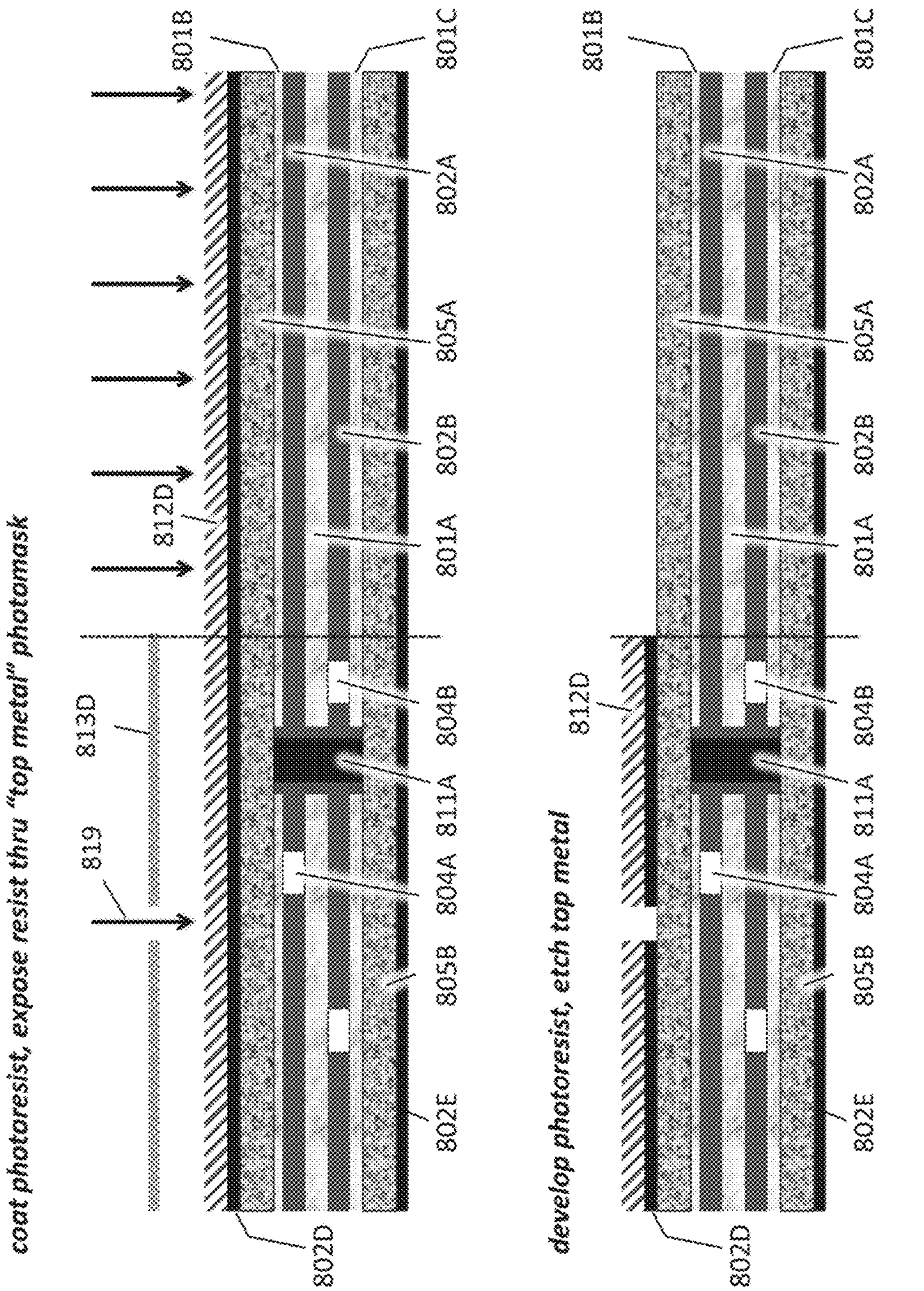

FIG. 75B comprises cross sections of bottom rigid-to-flex lamination steps for 3D bendable PCBs.

FIG. 76A comprises cross sections of top metal patterning steps for 3D bendable PCBs.

Figure 76B:
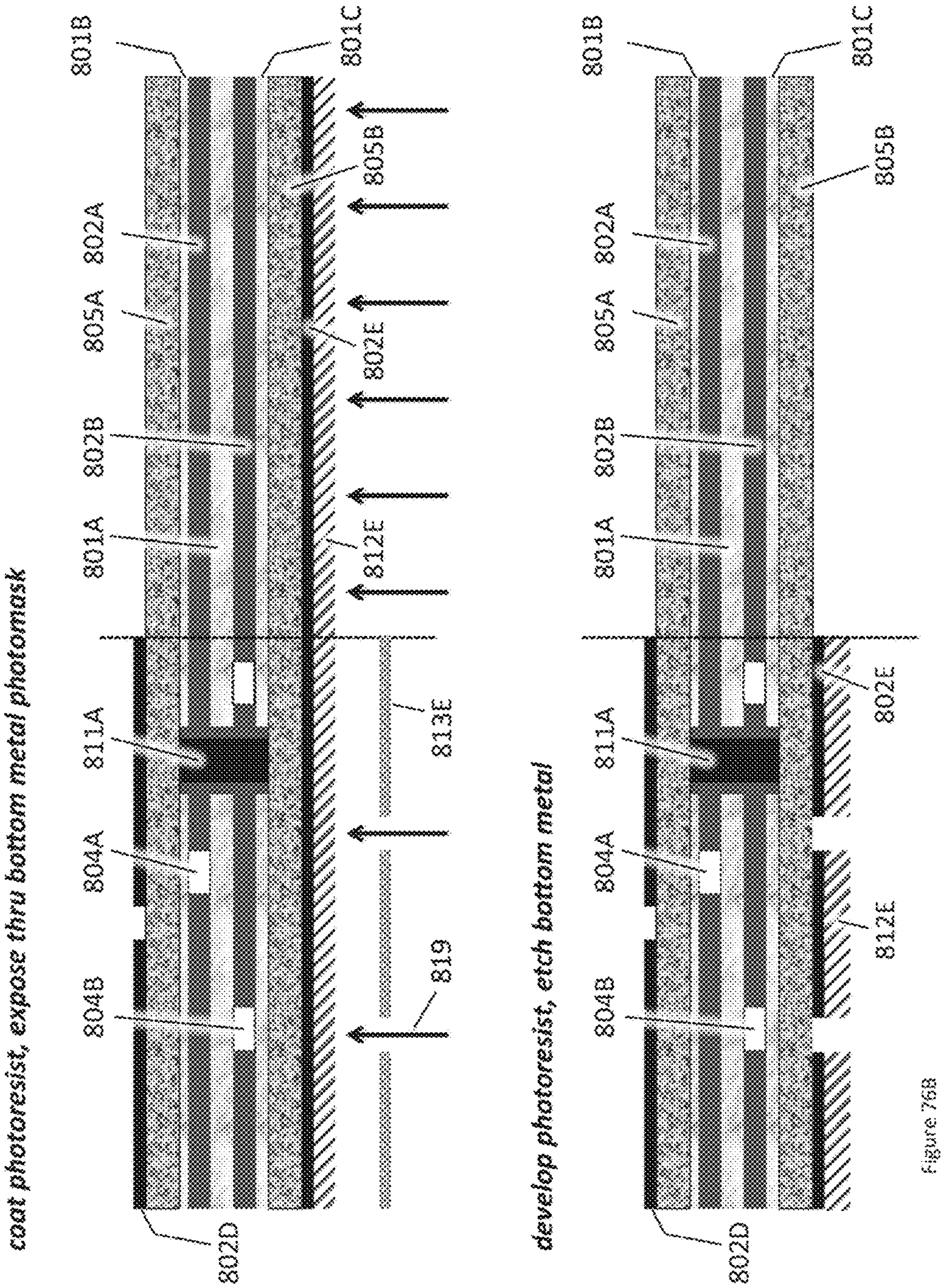

FIG. 76B comprises cross sections of bottom metal patterning steps for 3D bendable PCBs.

Figure 76C:
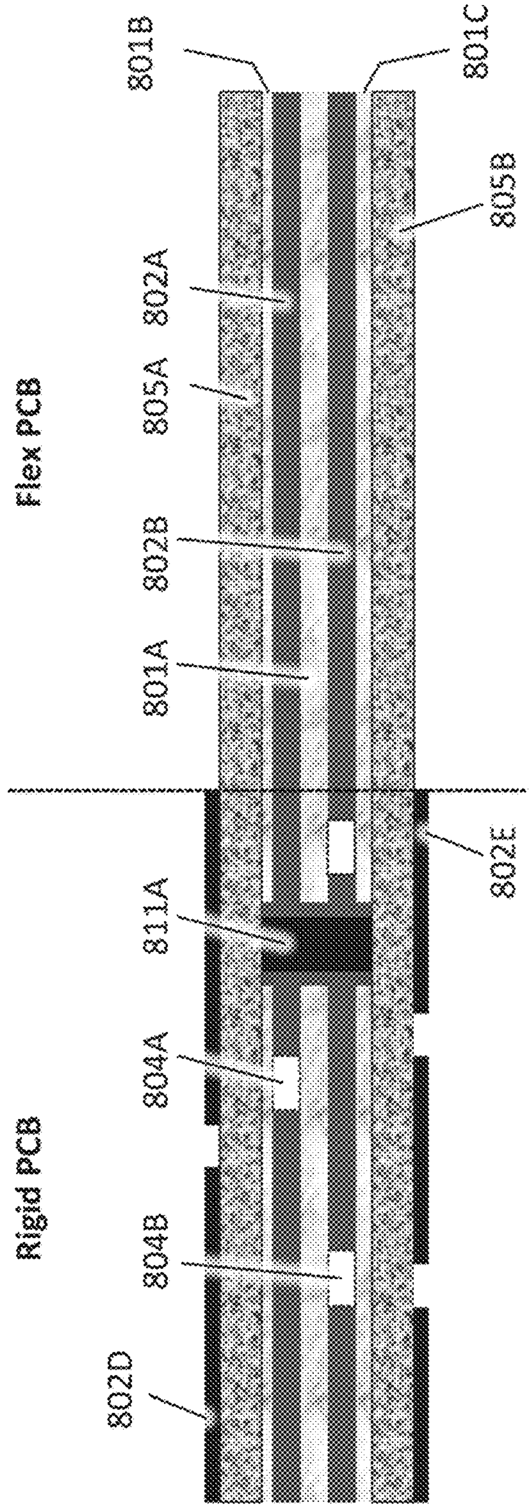

FIG. 76C is a cross section of a rigid-flex PCB with four conductive layers.

Figure 77:
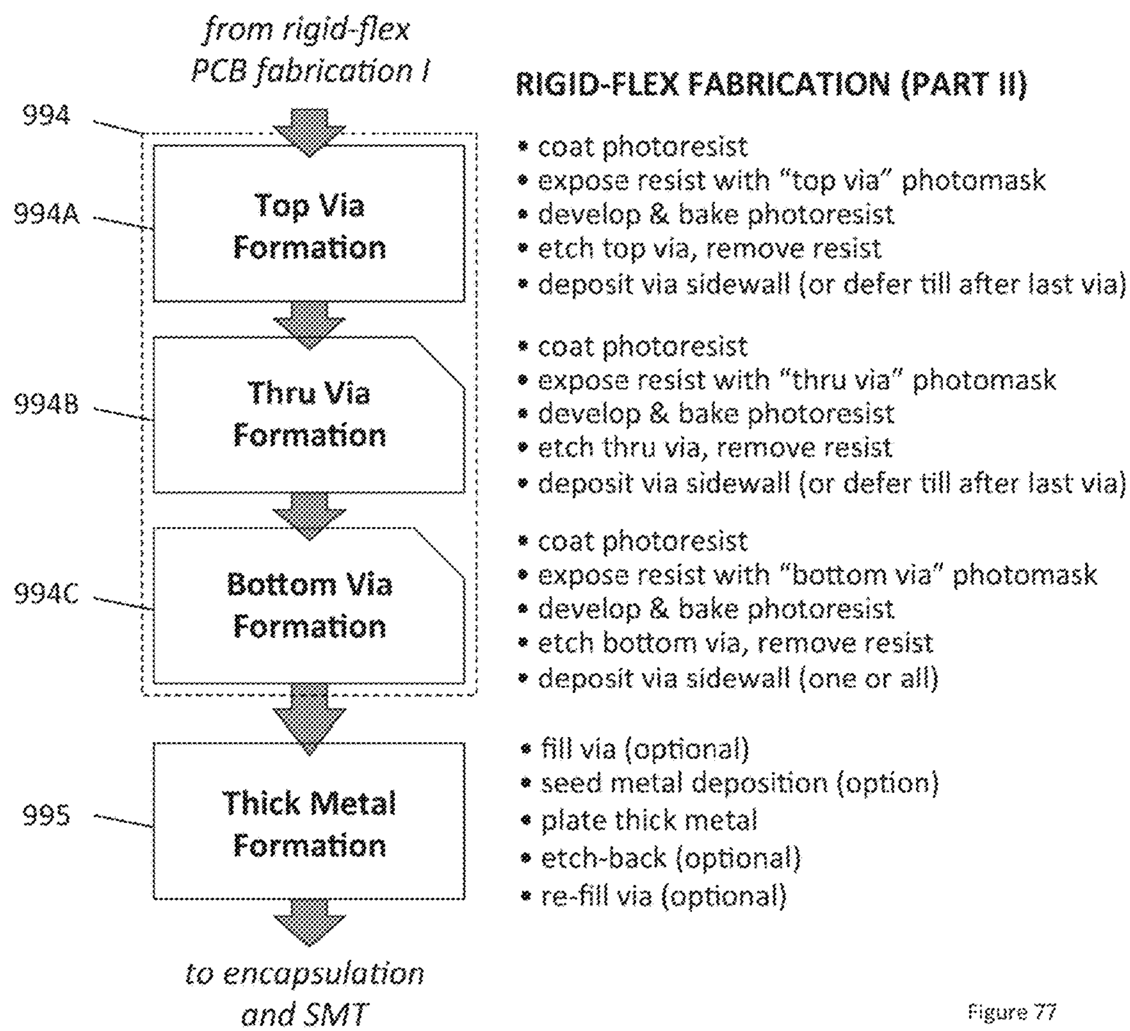

FIG. 77 is a flow chart of another portion of rigid-flex fabrication for 3D bendable PCBs.

Figure 78A:
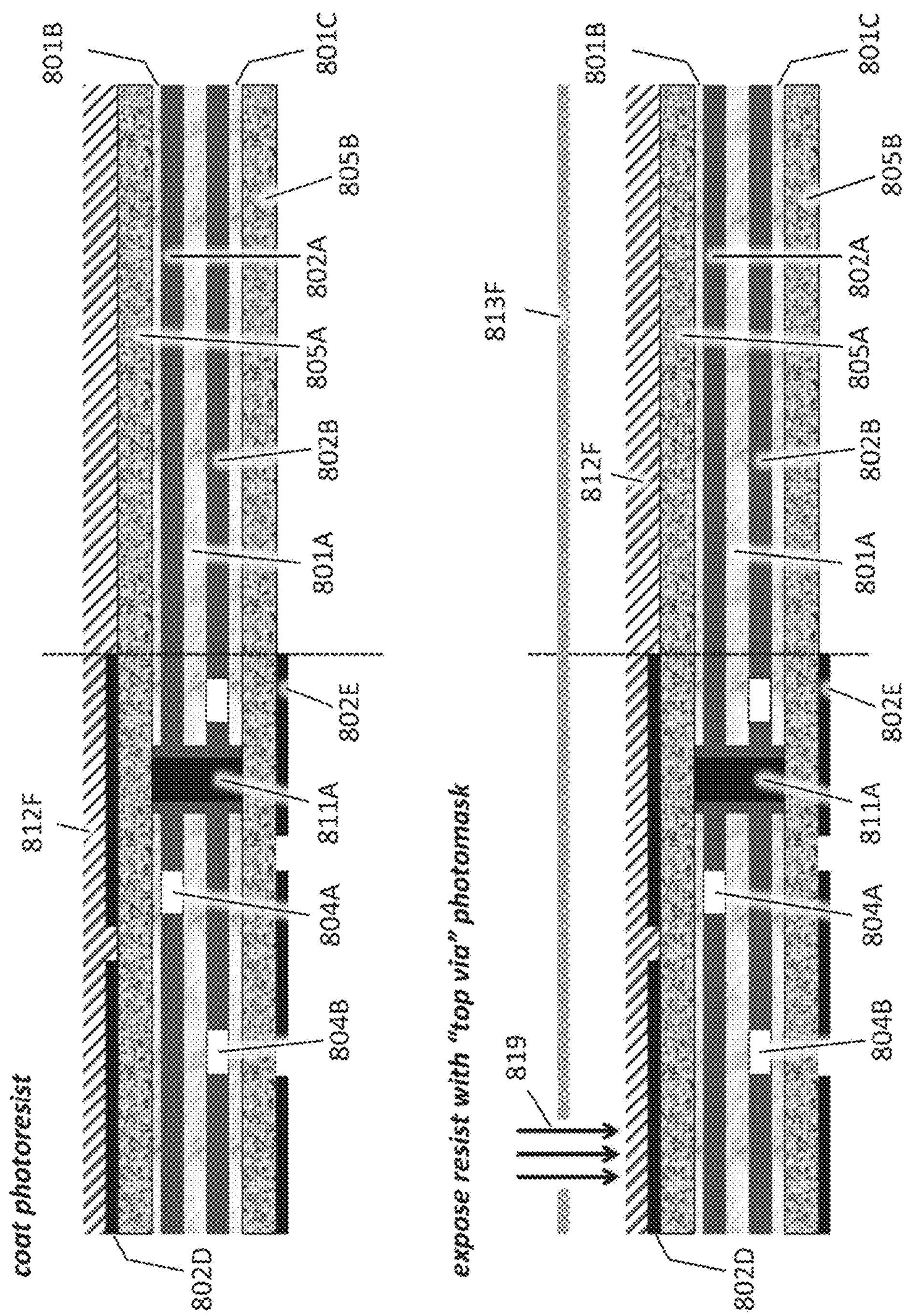

FIG. 78A comprises cross sections of top via fabrication steps for 3D bendable PCBs.

FIG. 78B comprises cross sections of additional top via fabrication steps for 3D bendable PCBs.

Figure 78C:
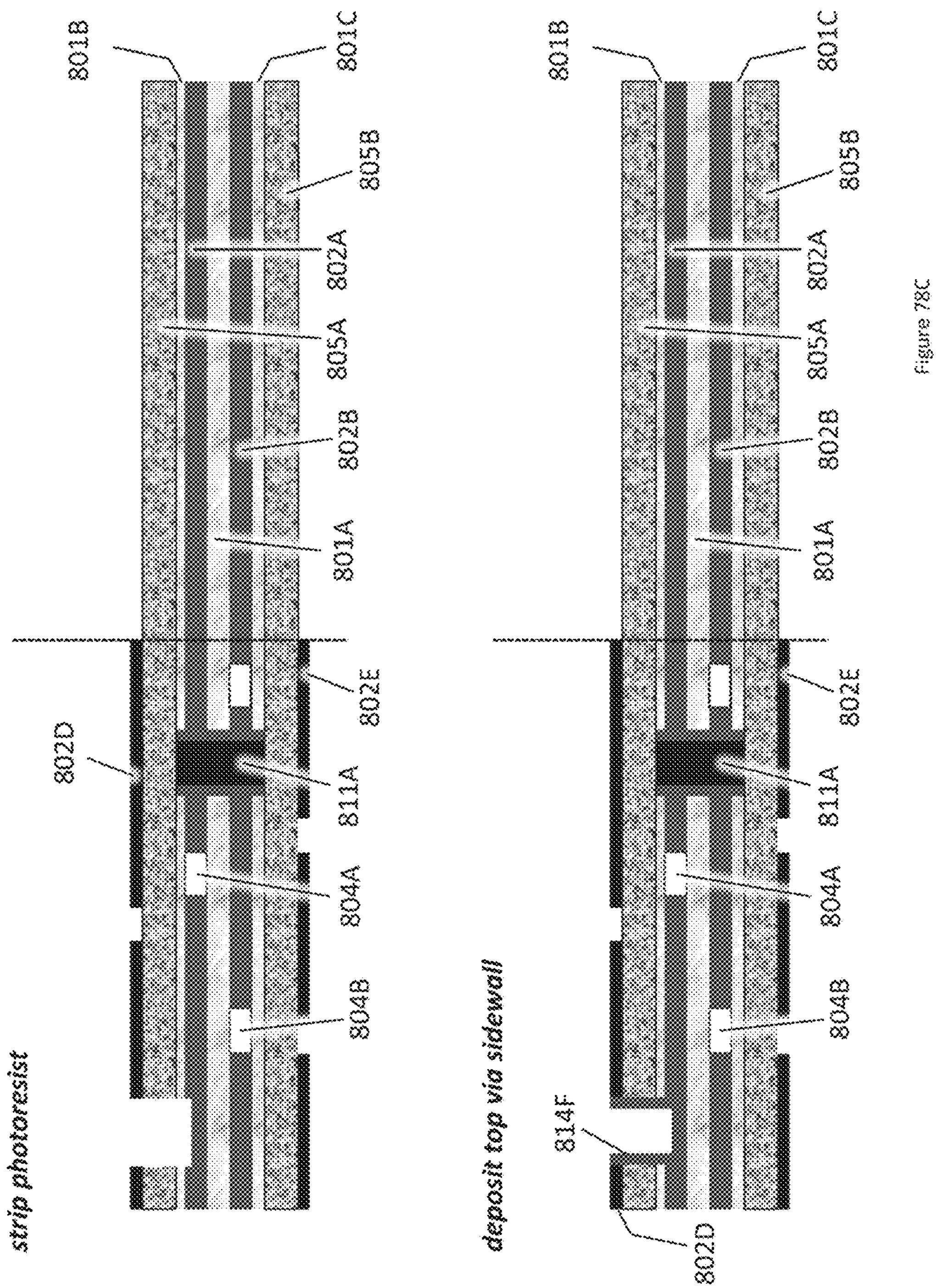

FIG. 78C comprises cross sections of additional top via fabrication steps for 3D bendable PCBs.

Figure 79B:
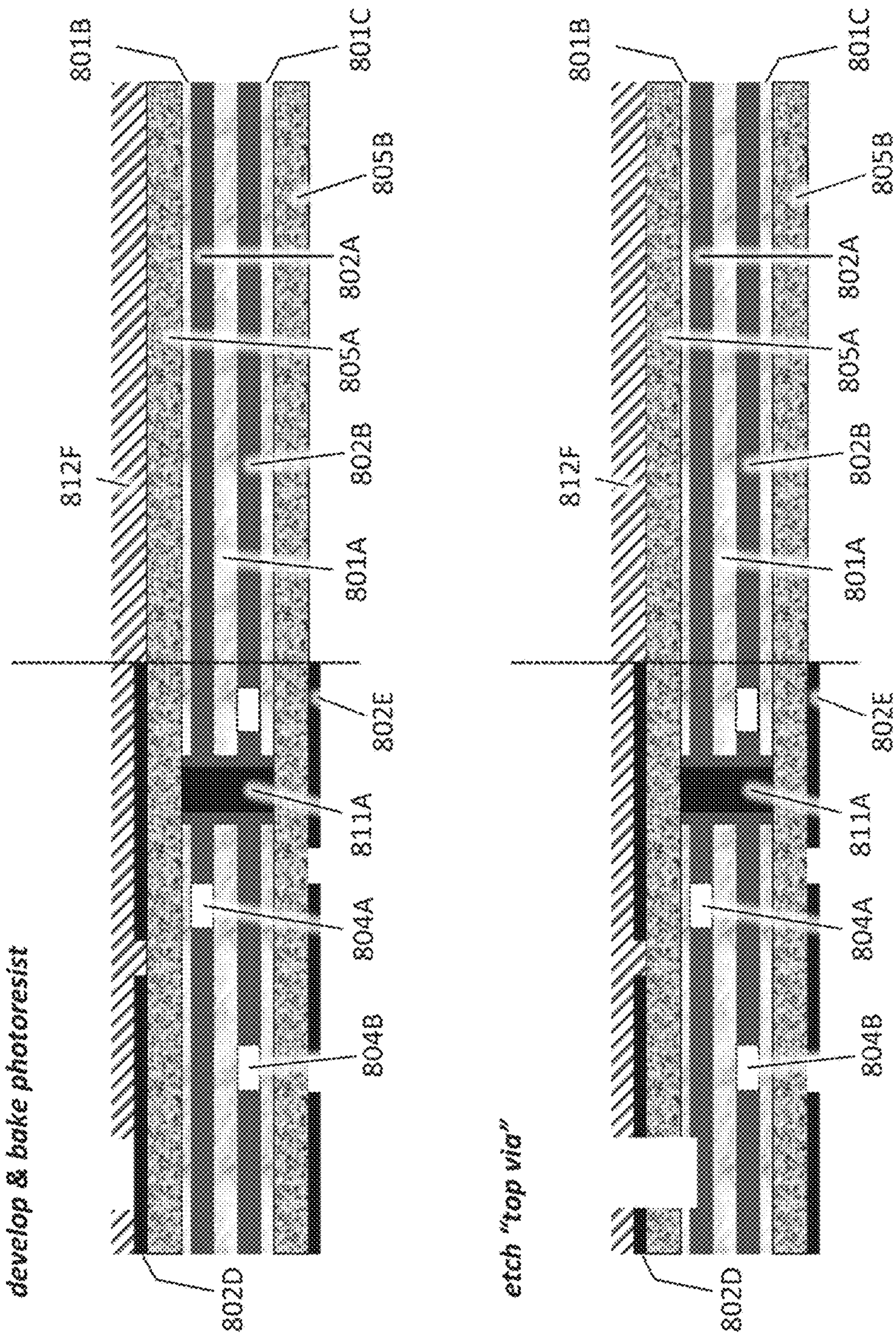
Figure 79A:
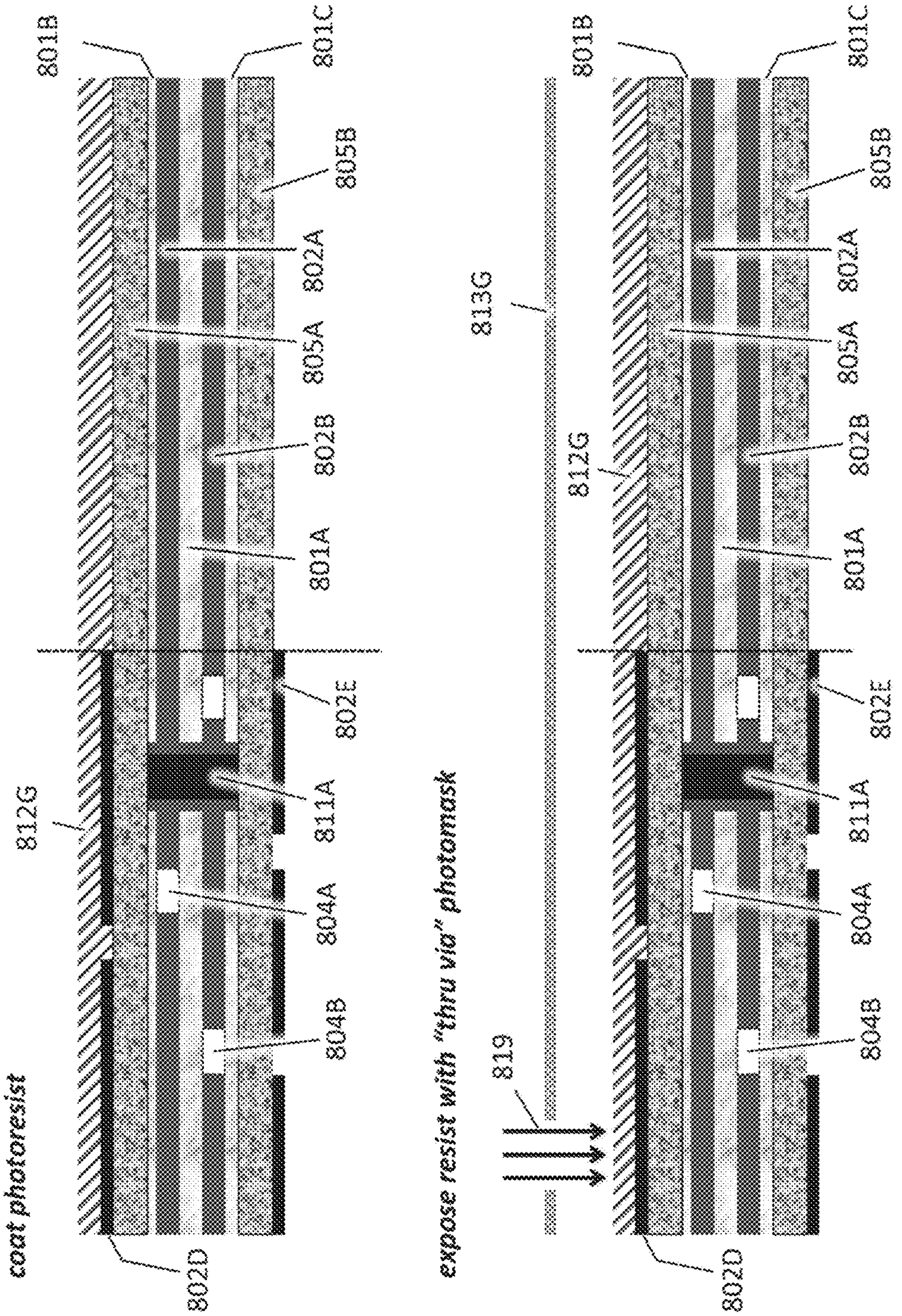
Figure 79B:
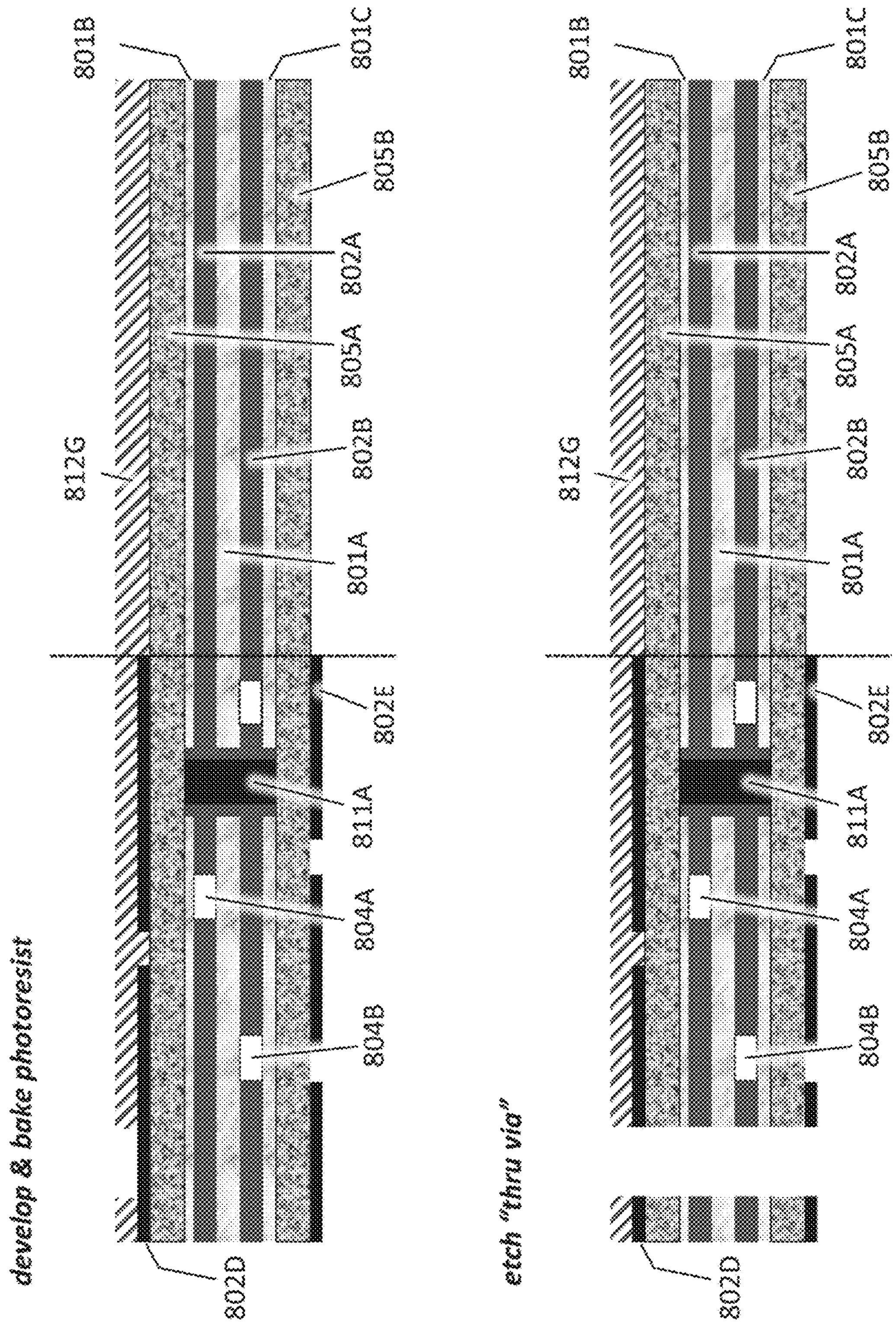

FIG. 79A comprises cross sections of thru via fabrication steps for 3D bendable PCBs.

FIG. 79B comprises cross sections of additional thru via fabrication steps for 3D bendable PCBs.

Figure 79C:
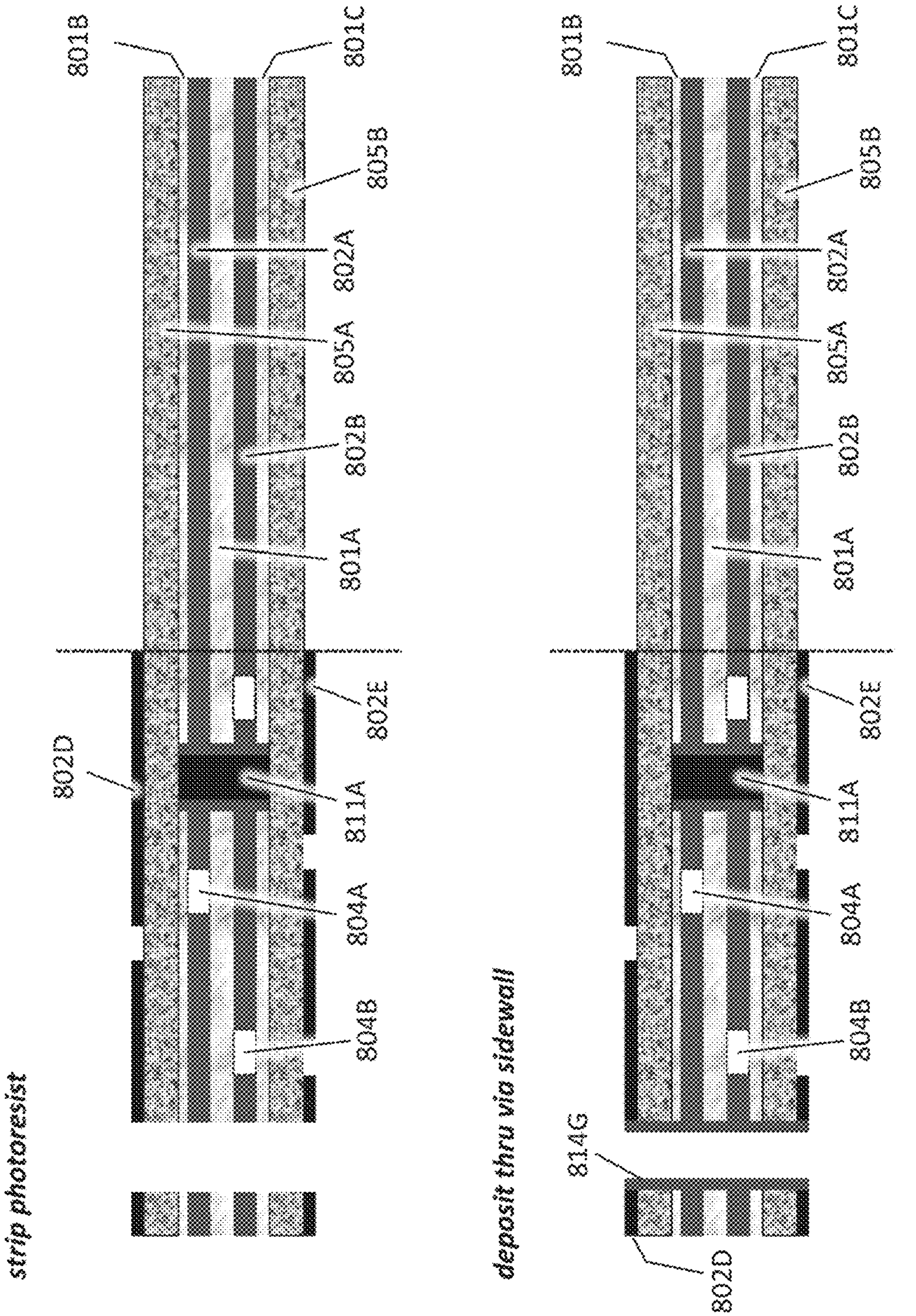

FIG. 79C comprises cross sections of additional thru via fabrication steps for 3D bendable PCBs.

Figure 80A:
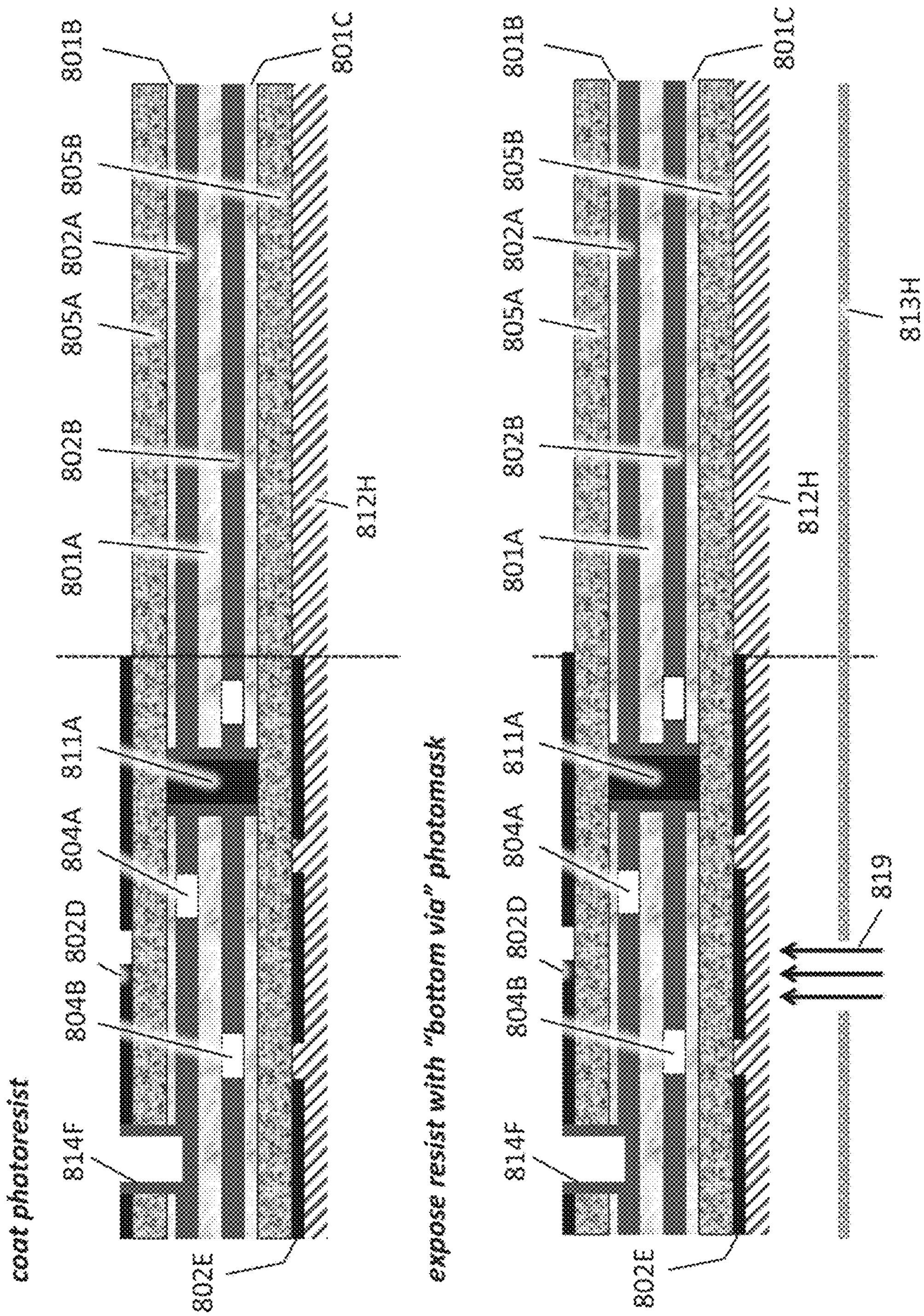

FIG. 80A comprises cross sections of bottom via fabrication steps for 3D bendable PCBs.

Figure 80B:
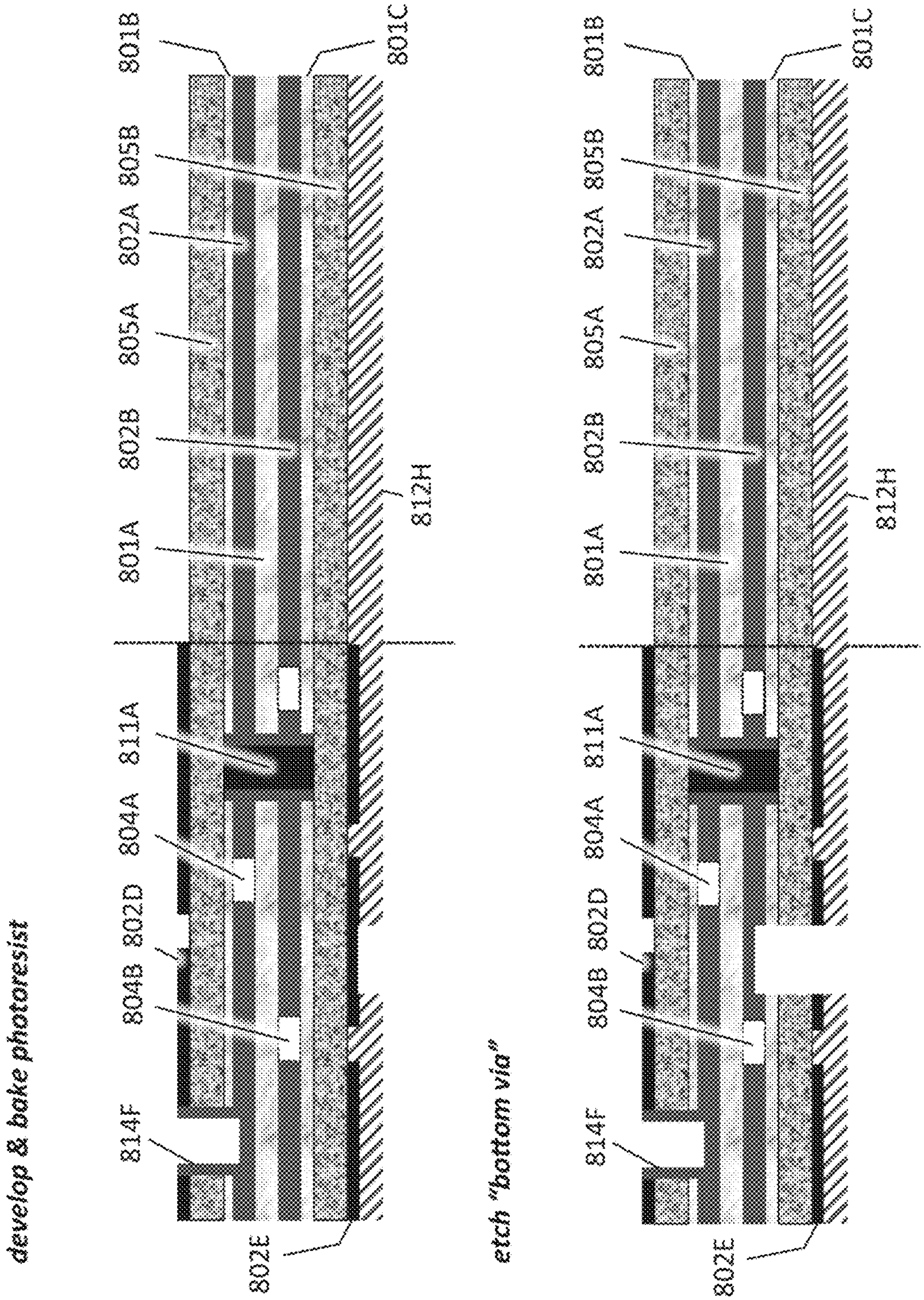

FIG. 80B comprises cross sections of additional bottom via fabrication steps for 3D bendable PCBs.

Figure 80C:
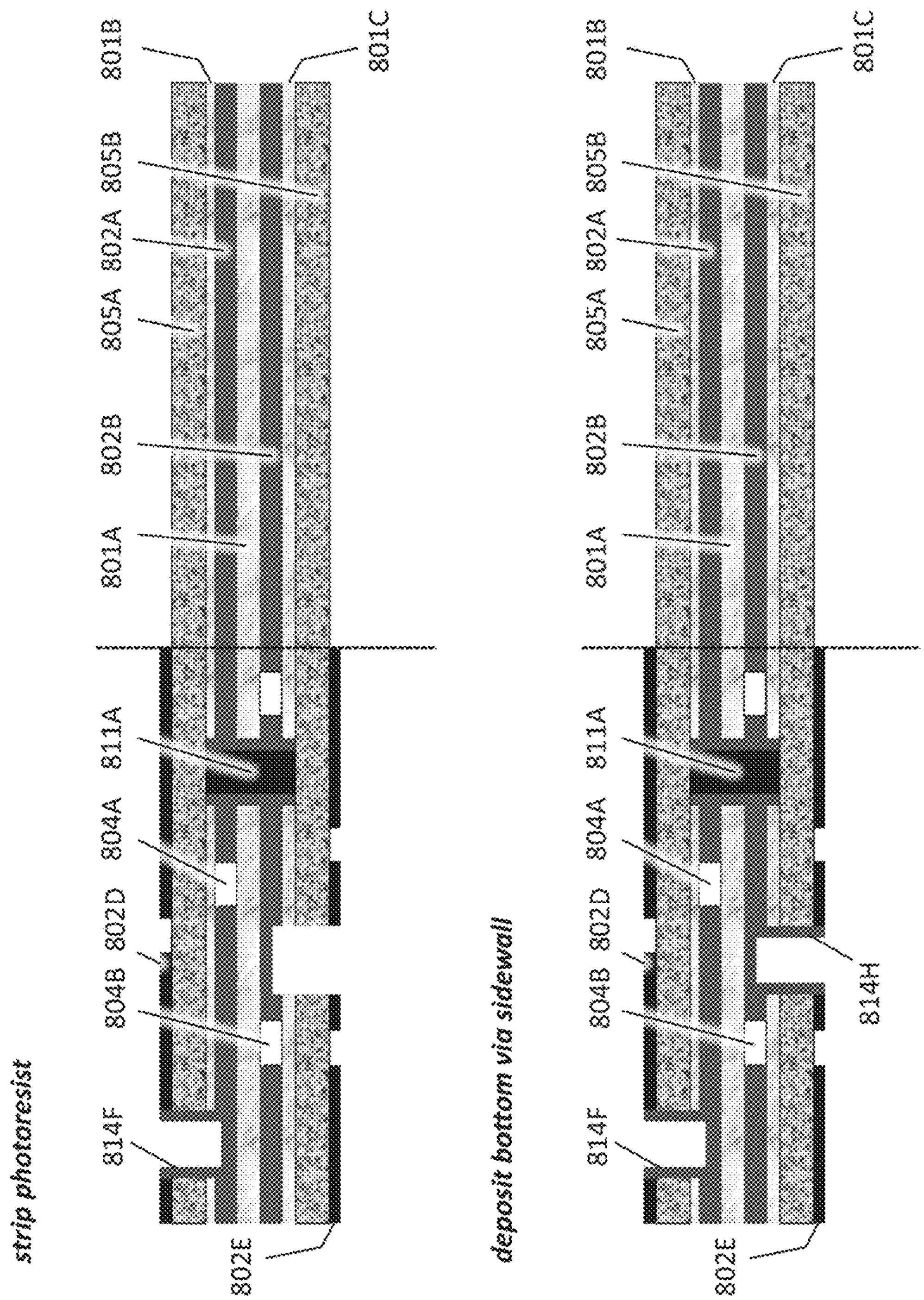

FIG. 80C comprises cross sections of additional thru bottom fabrication steps for 3D bendable PCBs.

Figure 81:
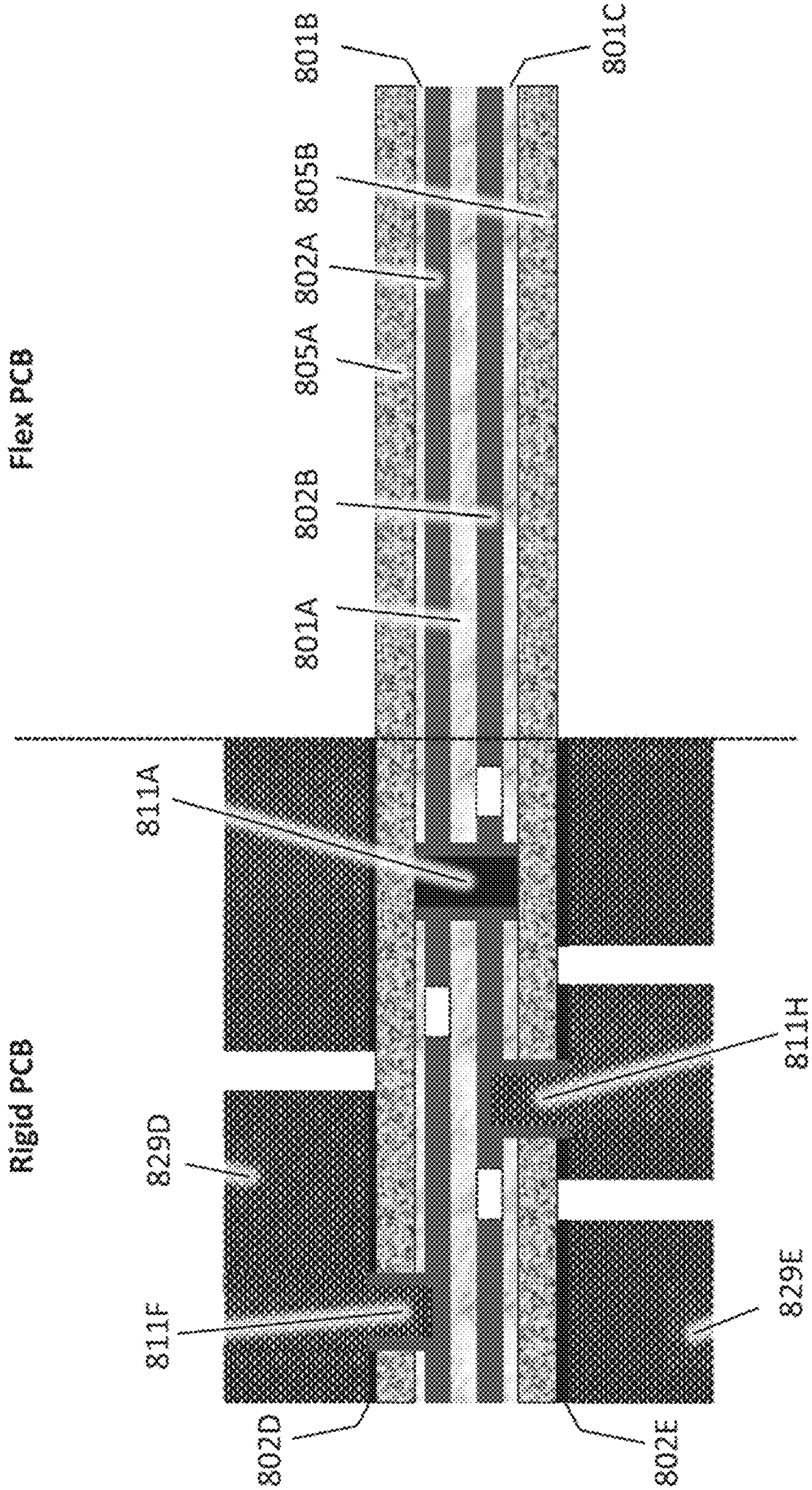

FIG. 81 is a cross section of a rigid-flex PCB after thick plated metal.

Figure 82A:
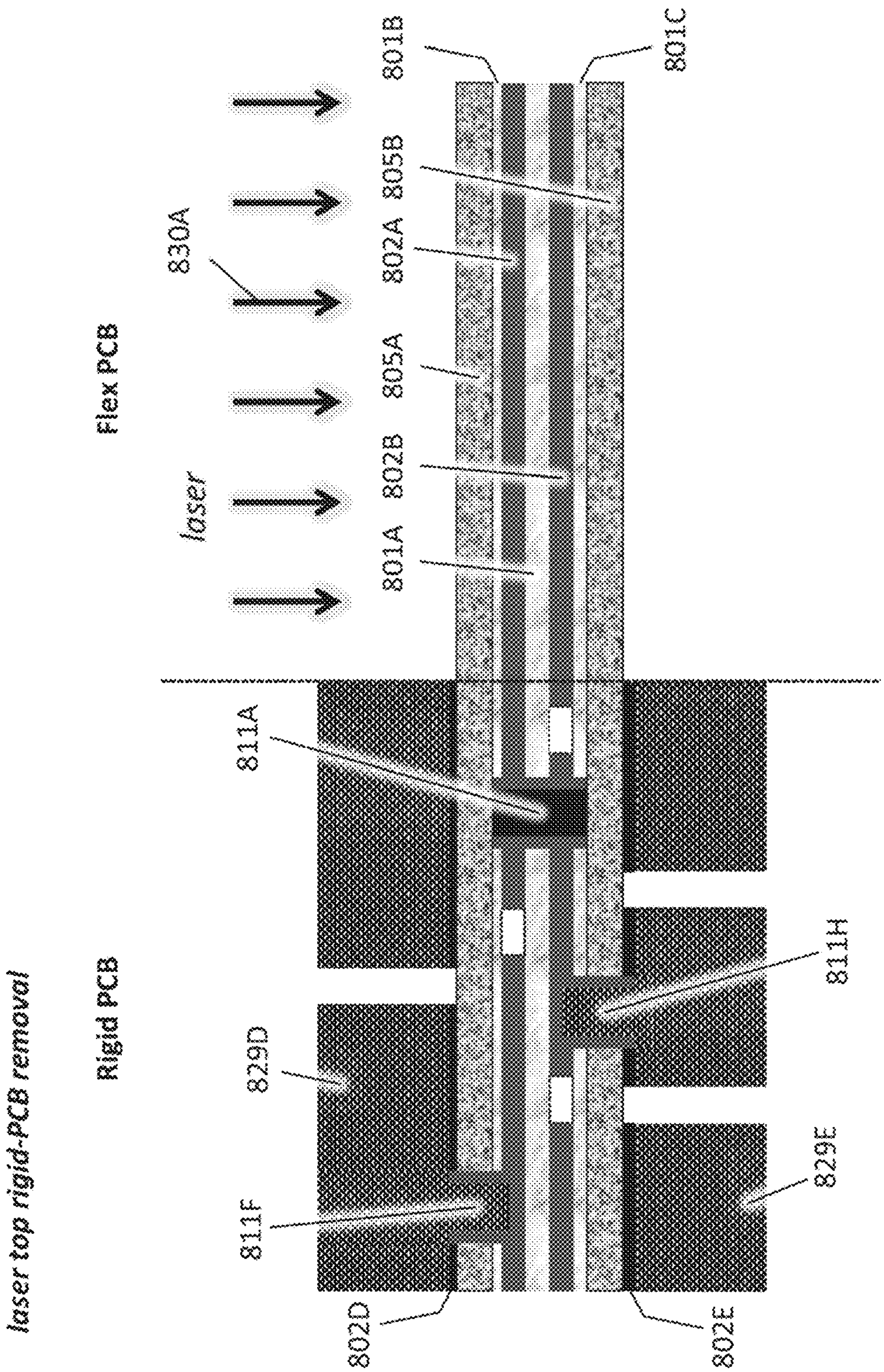

FIG. 82A is a cross section of a rigid-flex PCB showing selective laser removal of top rigid PCB portions.

Figure 82B:
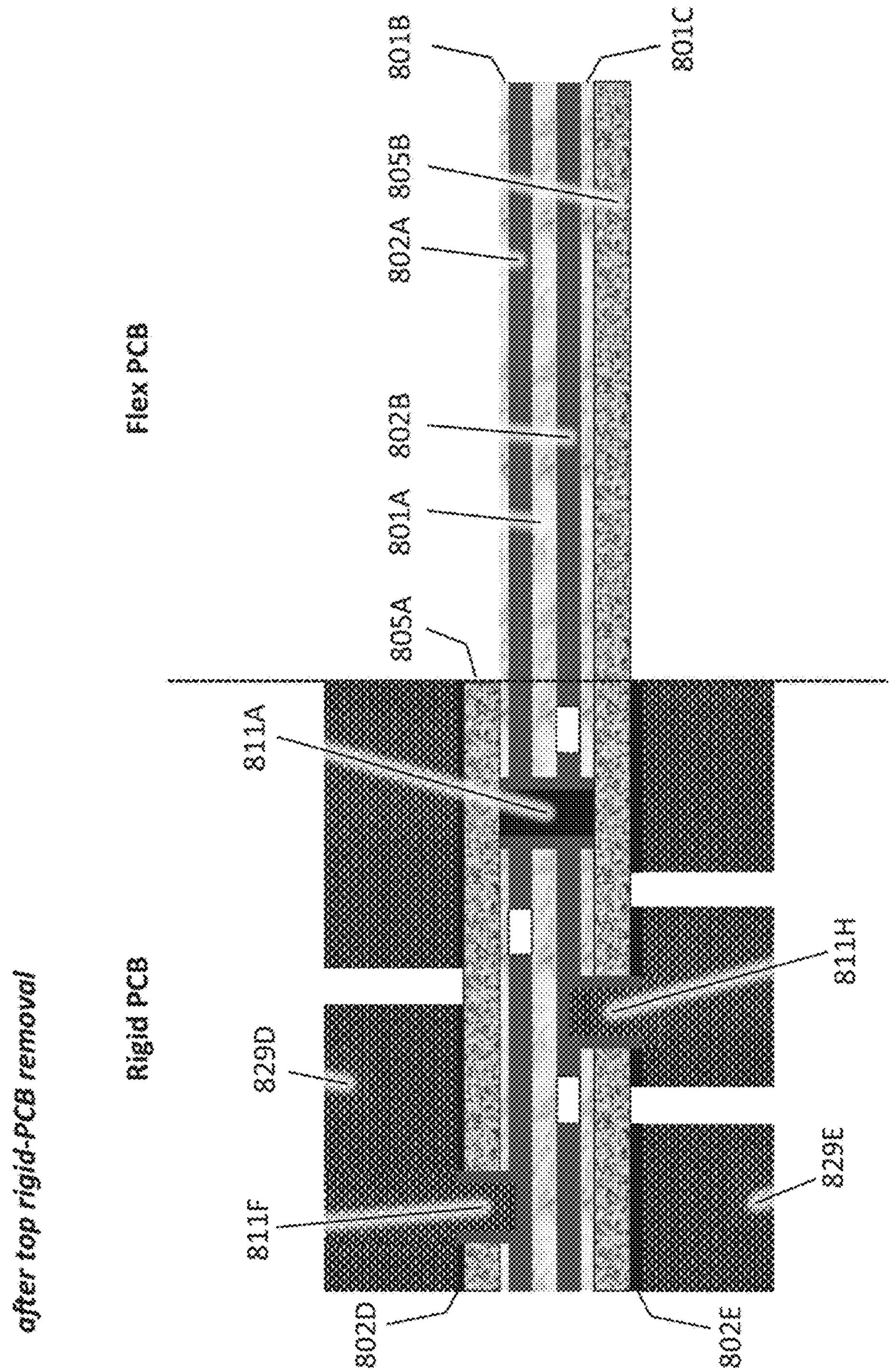

FIG. 82B is a cross section of a rigid-flex PCB showing after selective removal of top rigid PCB portions.

Figure 82C:
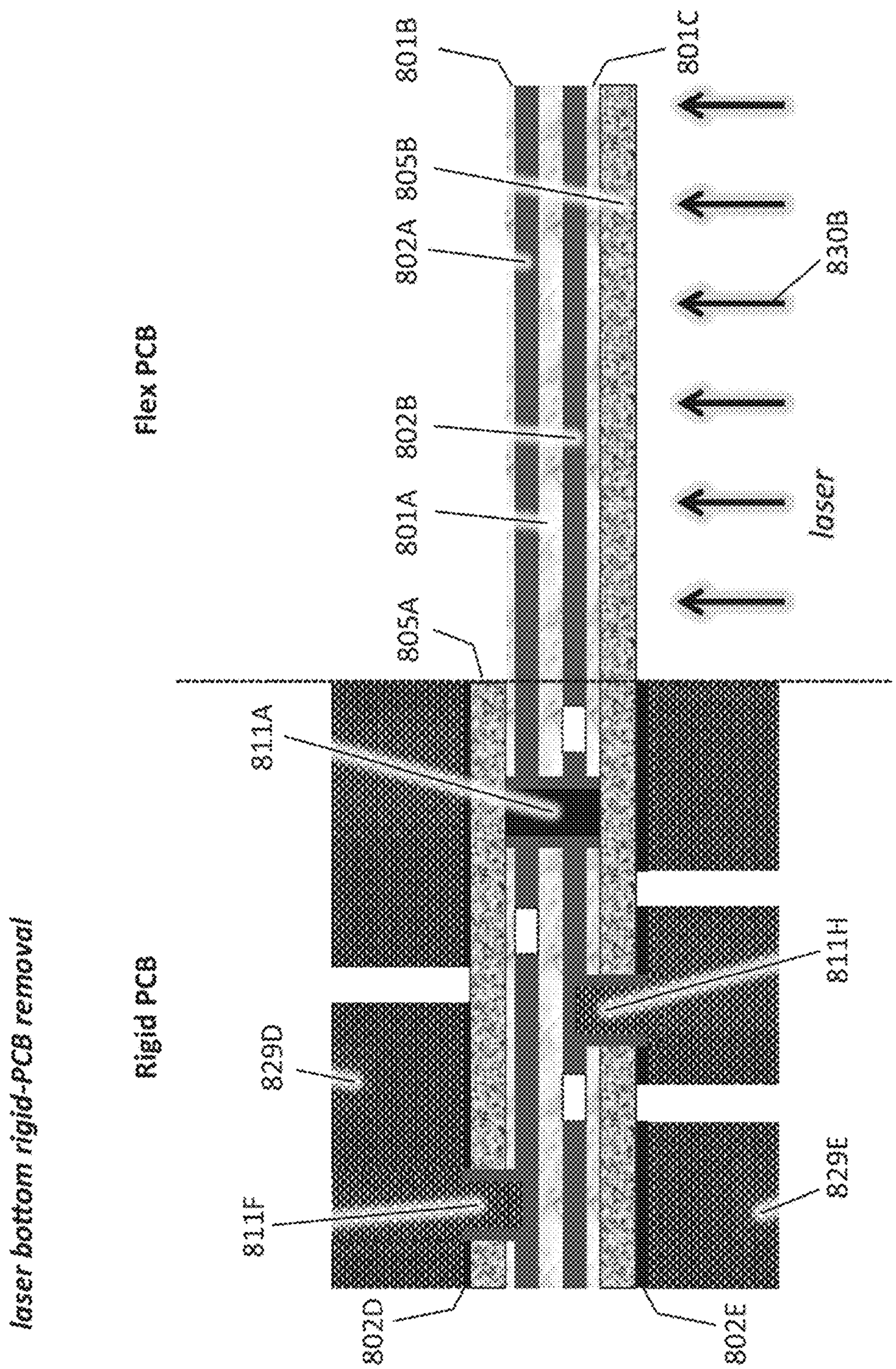

FIG. 82C is a cross section of a rigid-flex PCB showing selective laser removal of bottom rigid PCB portions.

Figure 82D:
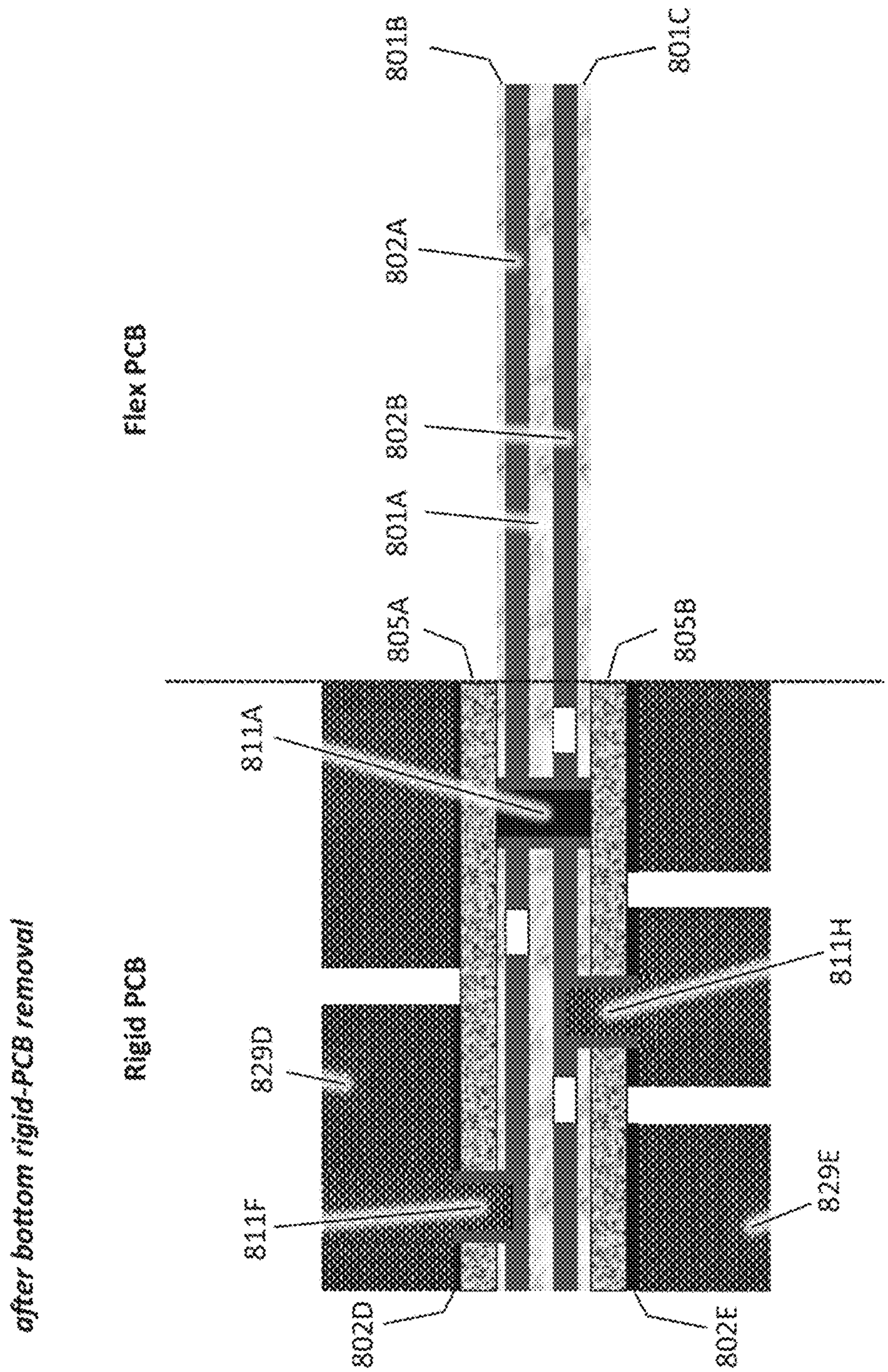

FIG. 82D is a cross section of a rigid-flex PCB showing after selective removal of bottom rigid PCB portions.

Figure 82E:
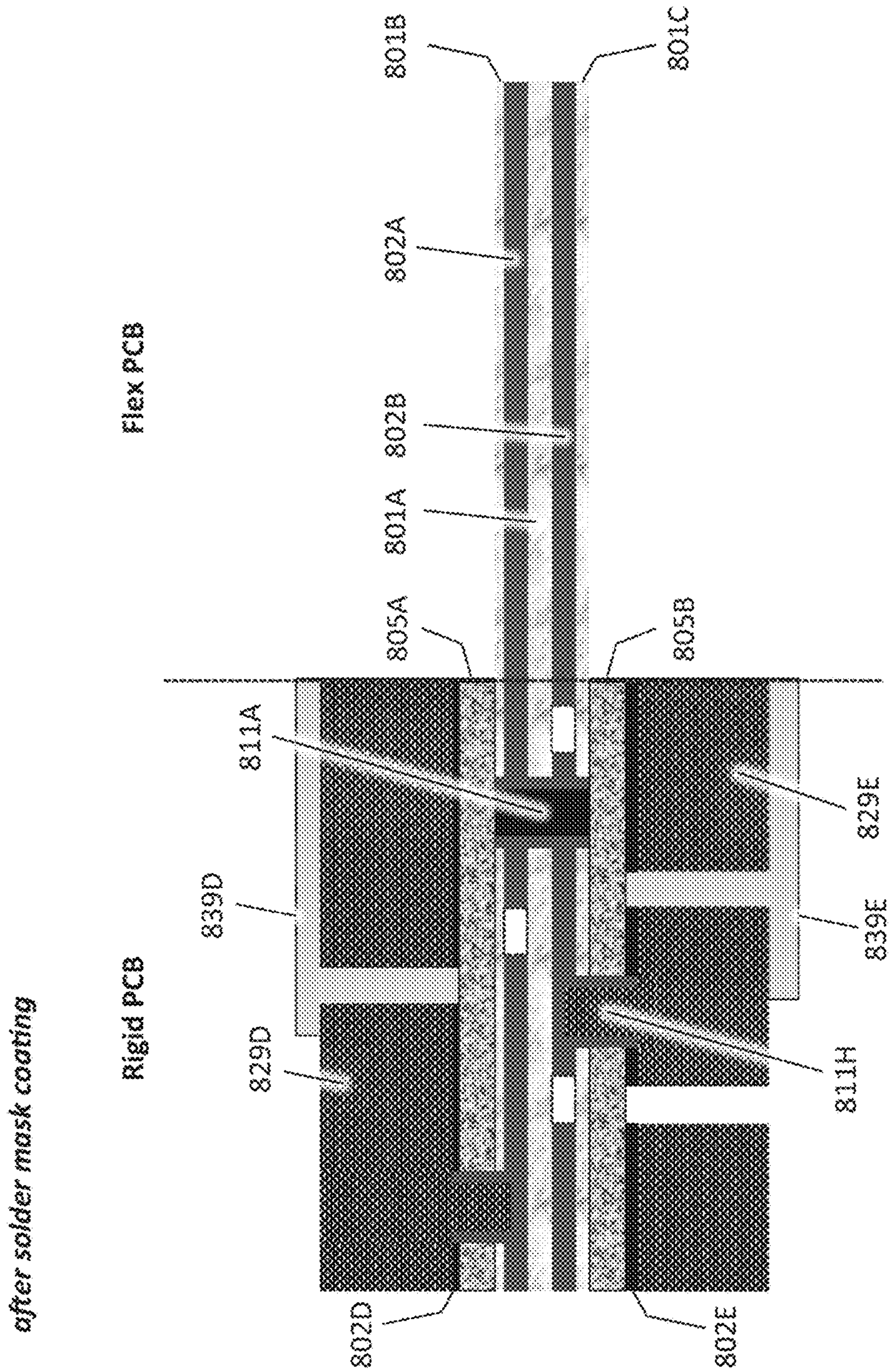

FIG. 82E is a cross section of a rigid-flex PCB showing after top and bottom patterned encapsulation of rigid PCB portions.

Figure 82F:
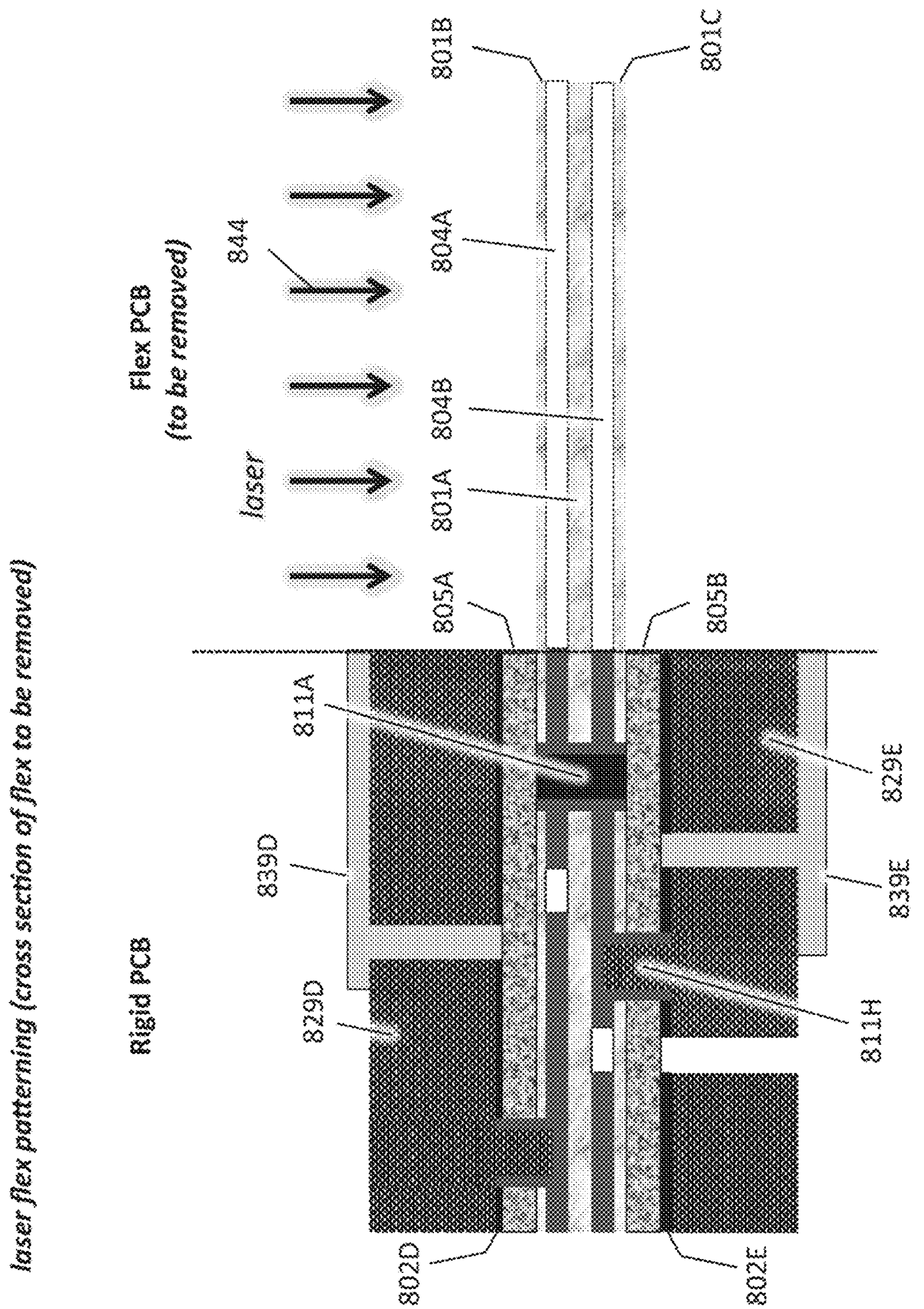

FIG. 82F is a cross section of a rigid-flex PCB showing laser removal of flex material.

Figure 82G:
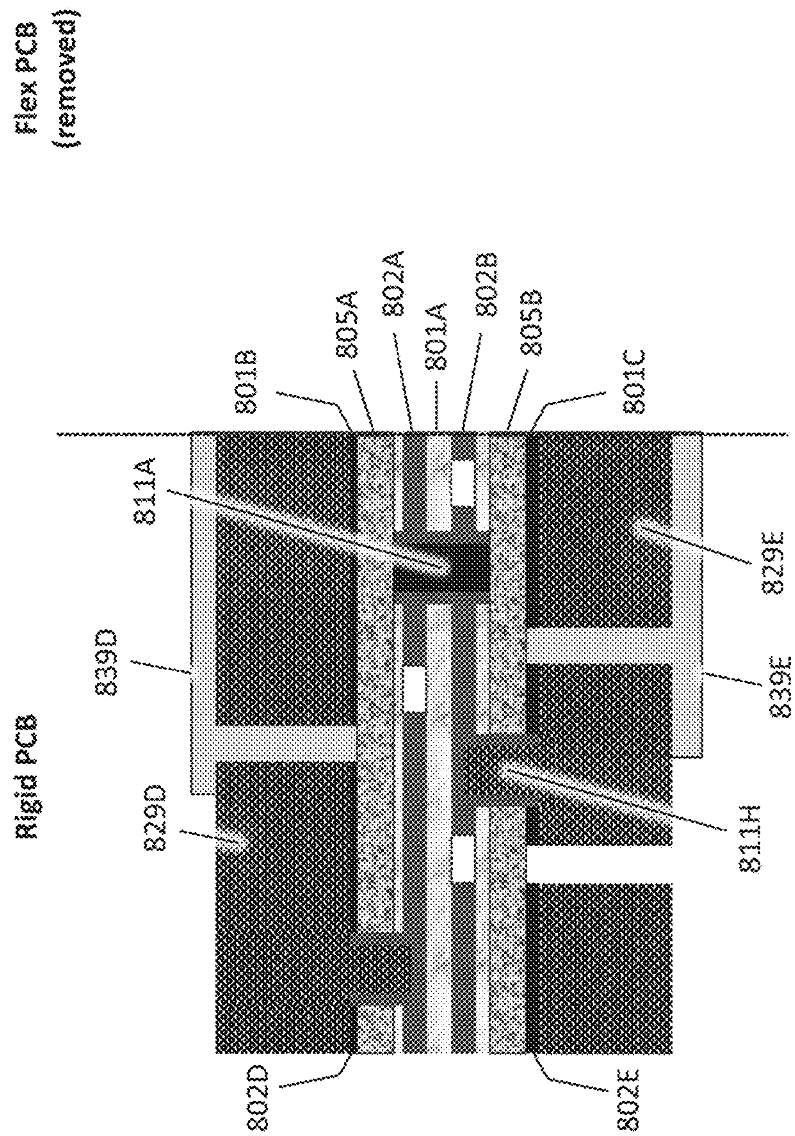

FIG. 82G is a cross section of a rigid-flex PCB after removal of flex material.

FIG. 8211 is a cross section of unaffected portions of a rigid-flex PCB after laser flex removal.

Figure 83H:
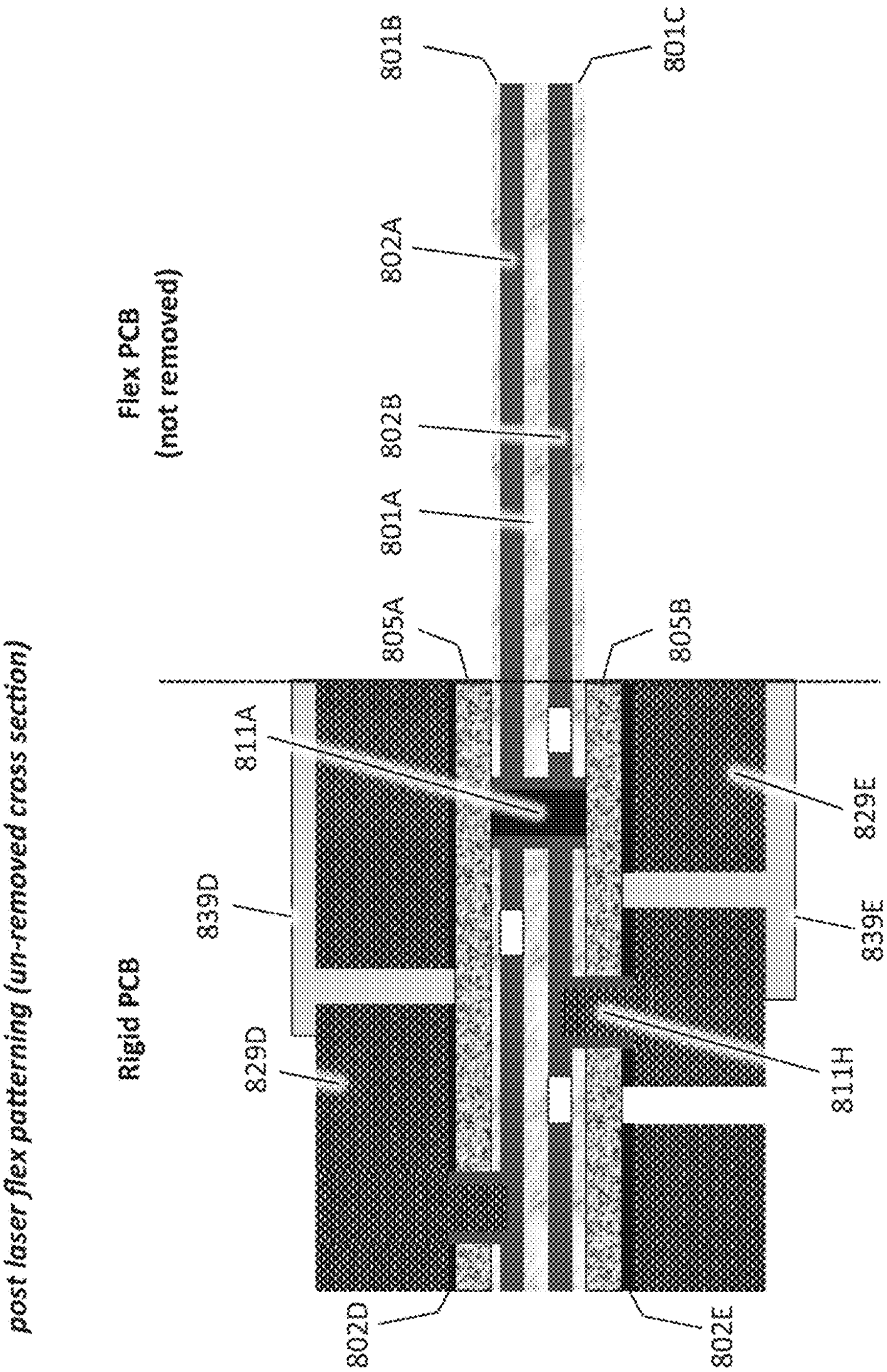
Figure 83A:
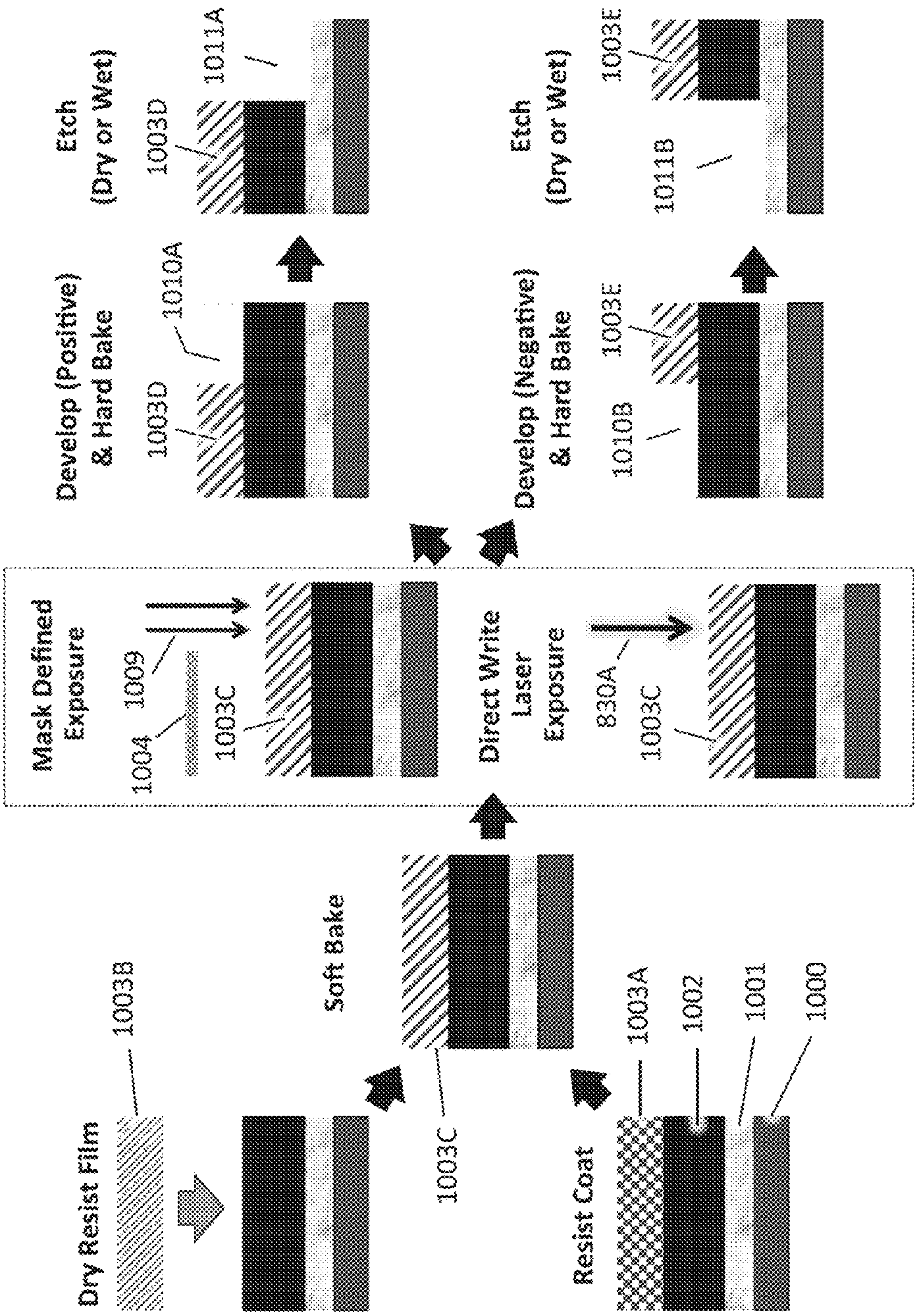

FIG. 83A comprises cross sections of process steps for photolithography defined etching.

Figure 83B:
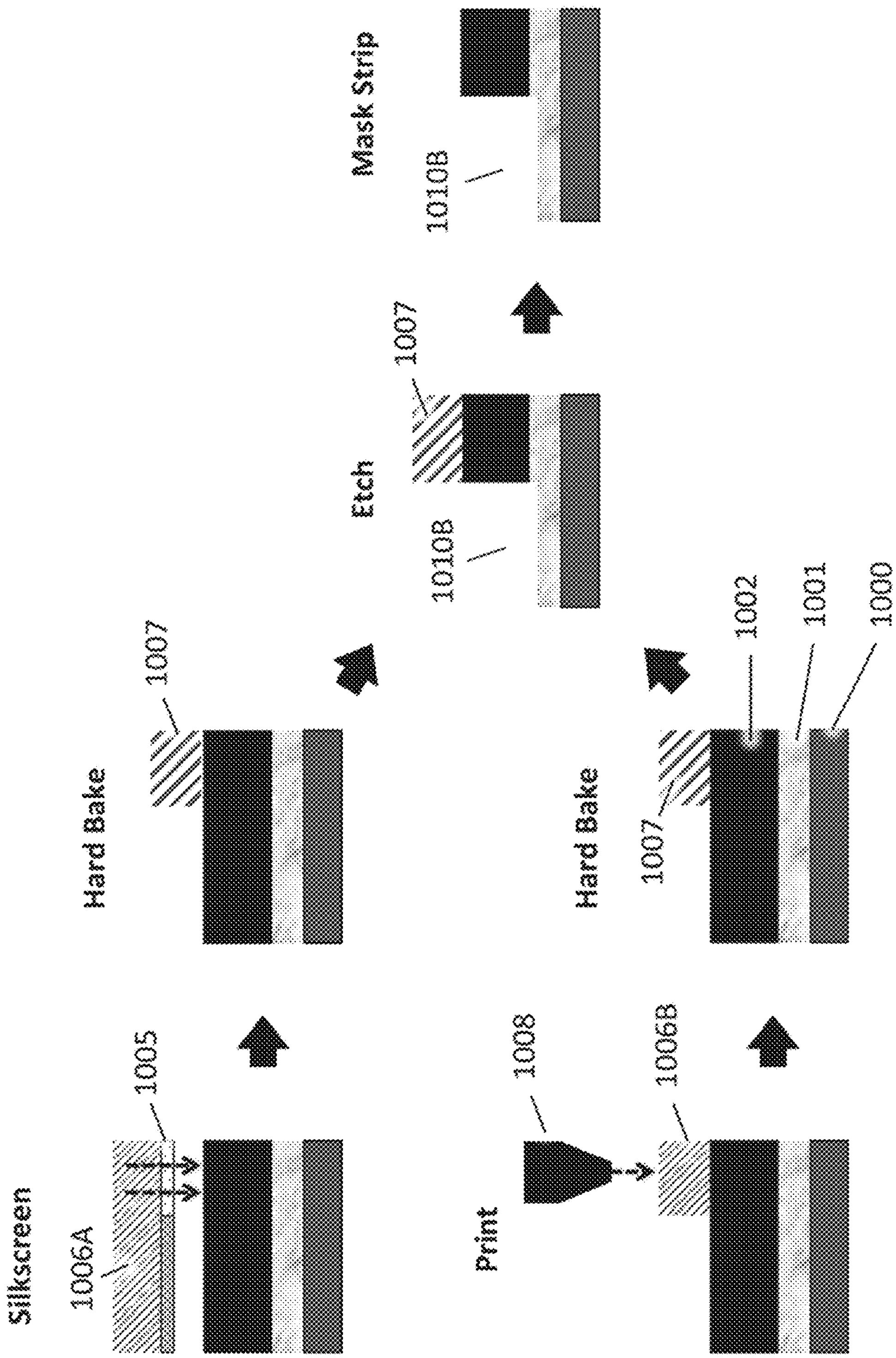

FIG. 83B comprises cross sections of process steps for silkscreen and painting defined etching.

Figure 84:
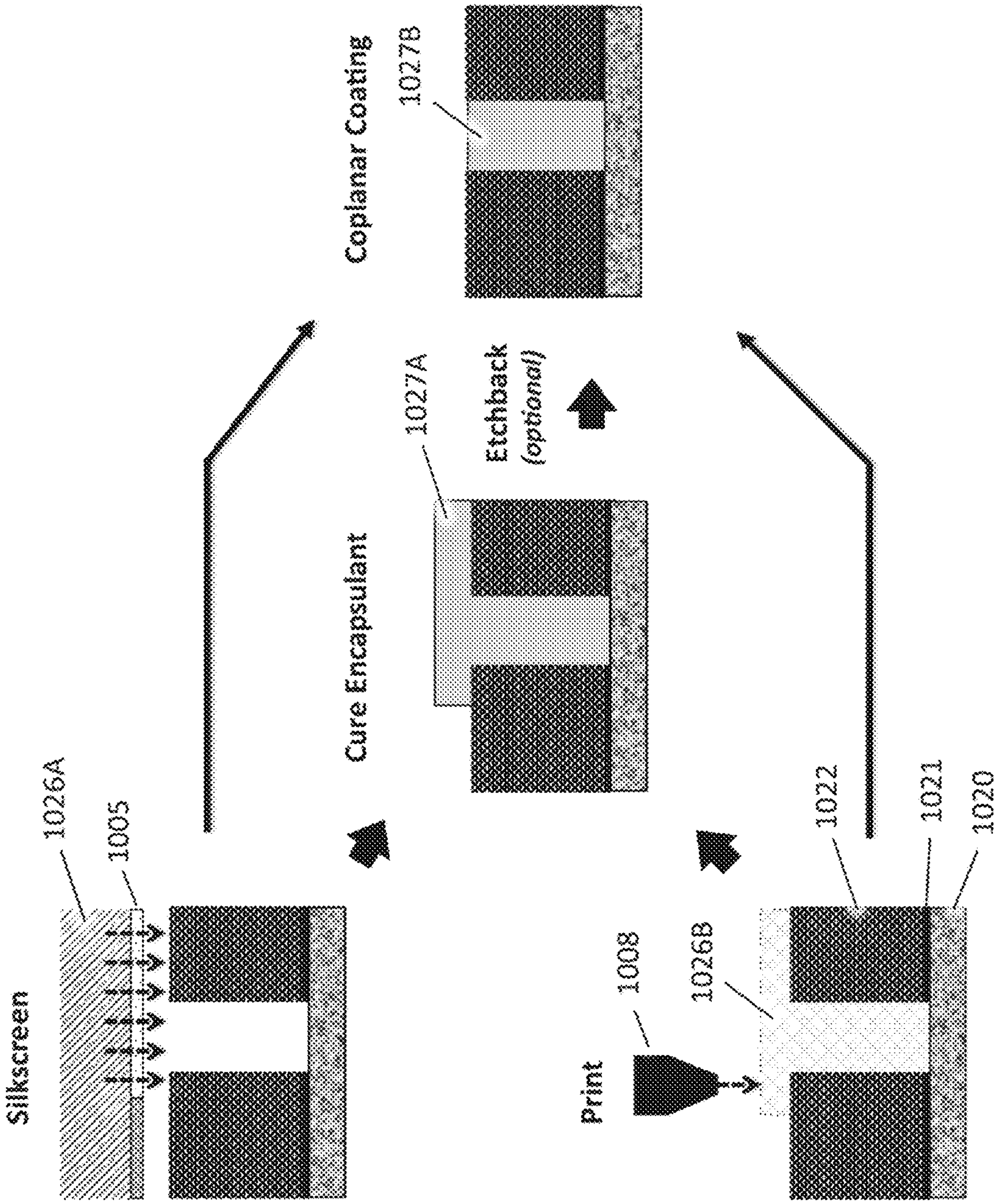

FIG. 84 comprises cross sections of process steps for silkscreen and painting defined coating.

Figure 85A:
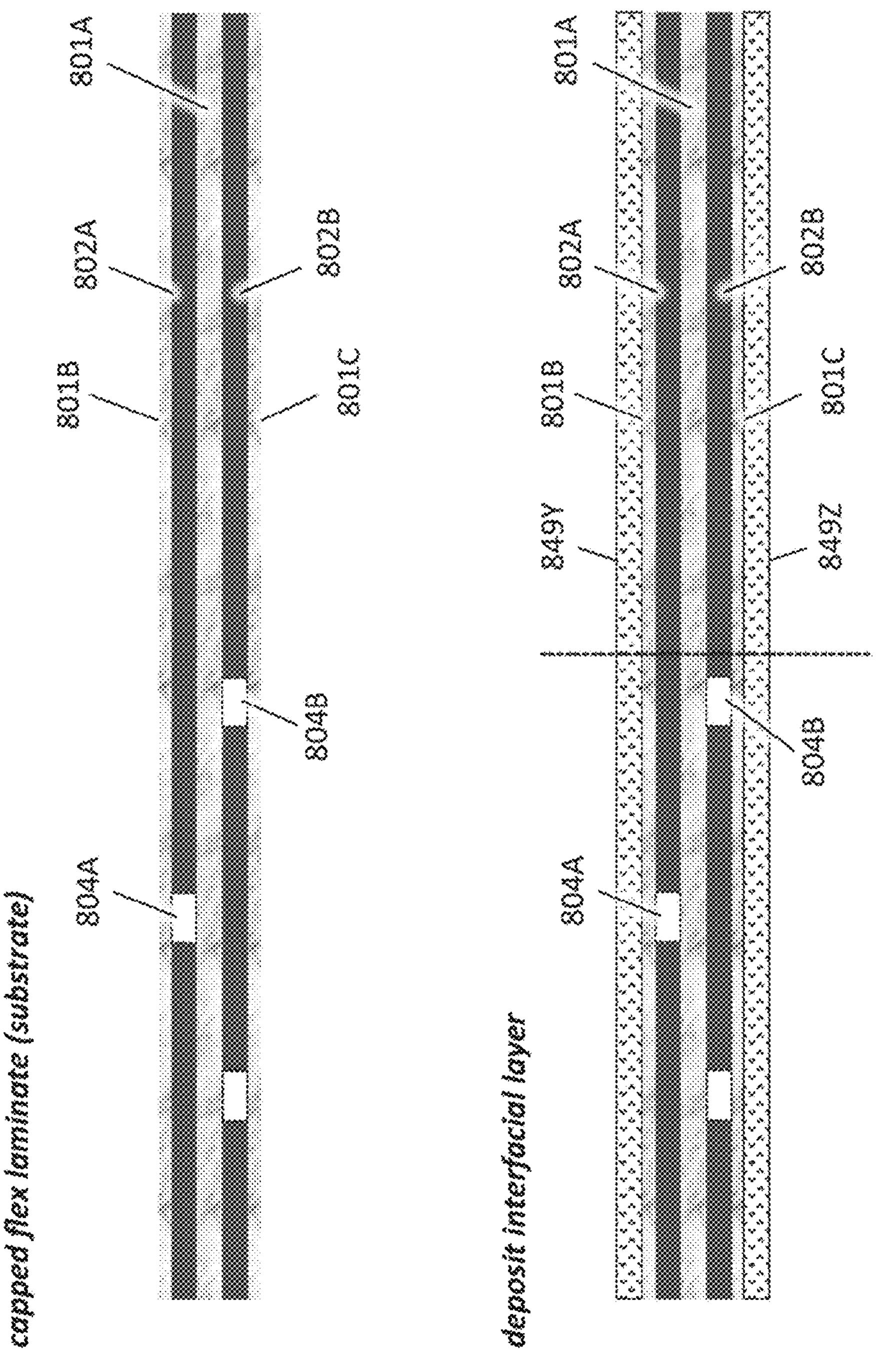

FIG. 85A illustrates cross sections of a rigid-flex PCB in a rigid PCB removal process, shown after interfacial layer deposition.

Figure 85B:
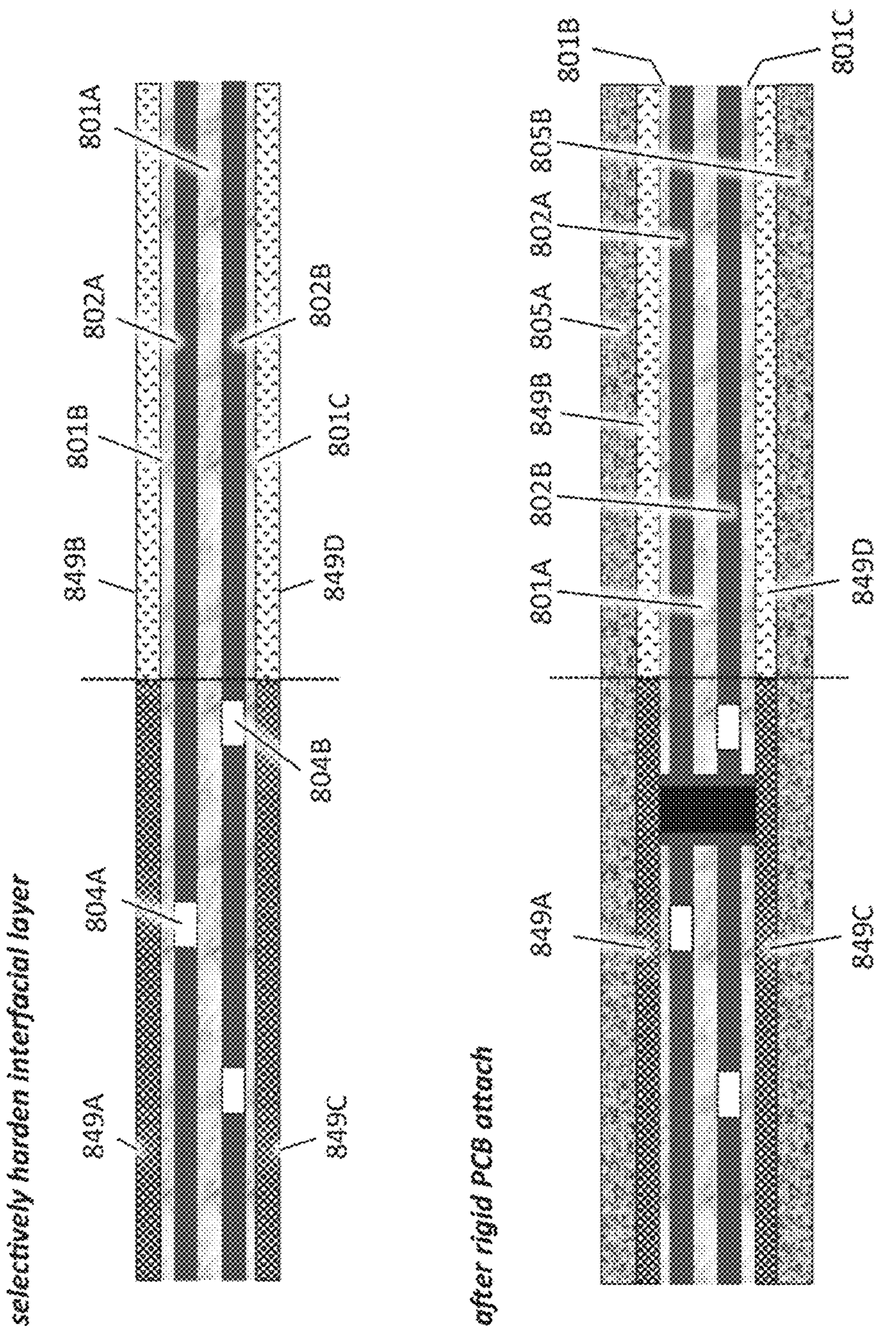

FIG. 85B illustrates additional cross sections of a rigid-flex PCB in a rigid PCB removal process, shown after selectively hardening the interfacial layer.

Figure 85C:
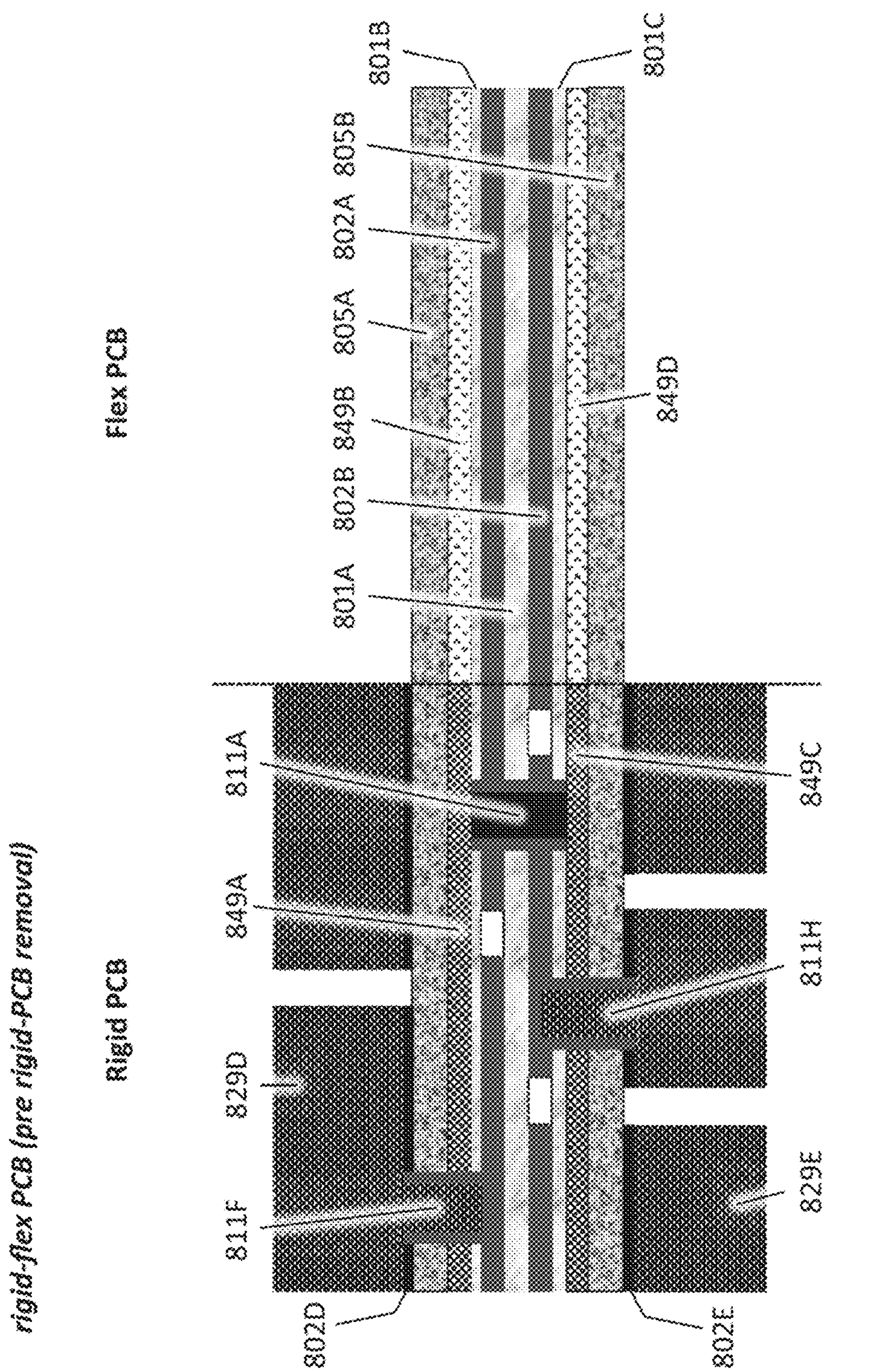

FIG. 85C illustrates a cross section of a rigid-flex PCB in a rigid PCB removal process, shown after thick metal plating.

Figure 85D:
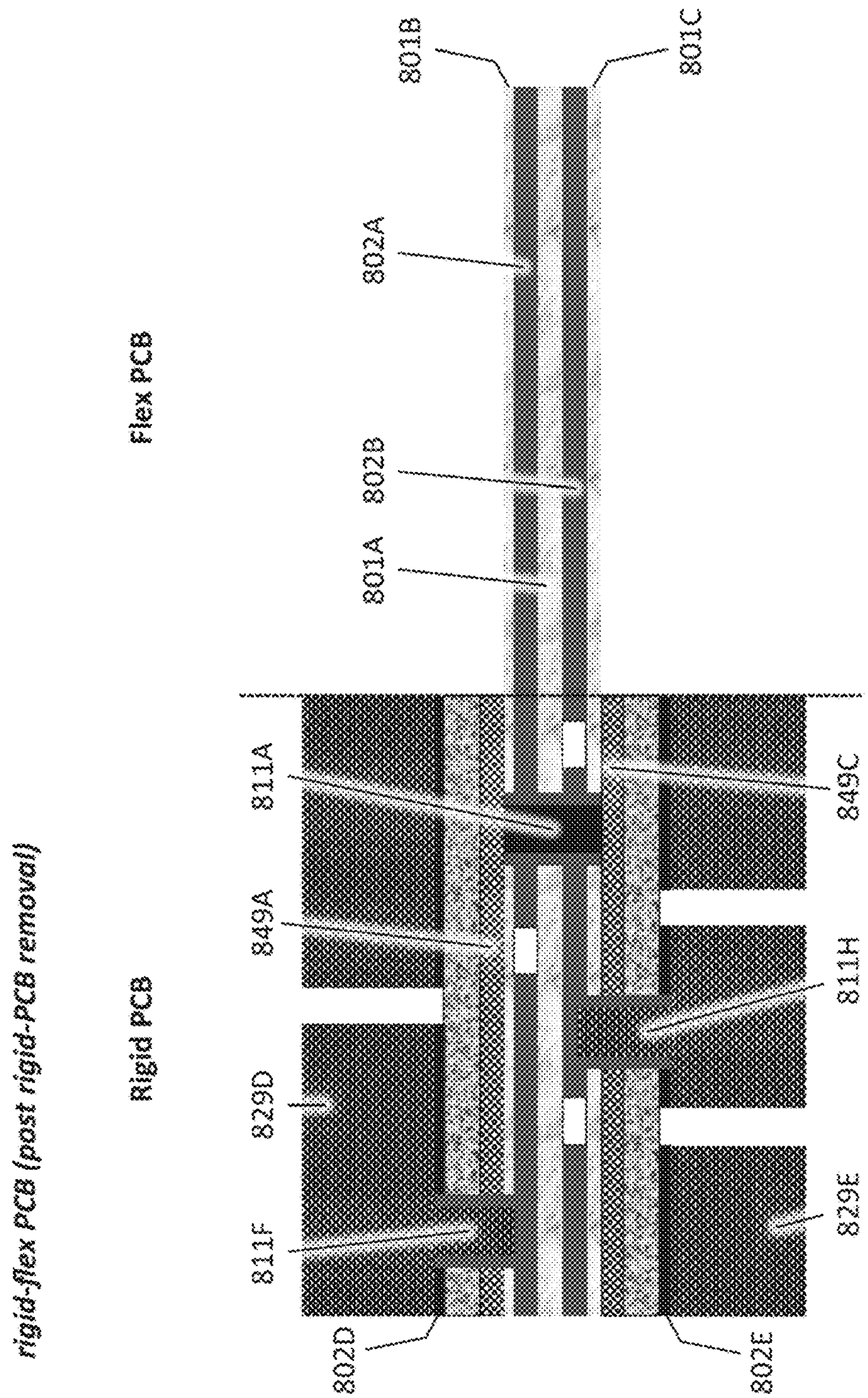
Figure 85A:
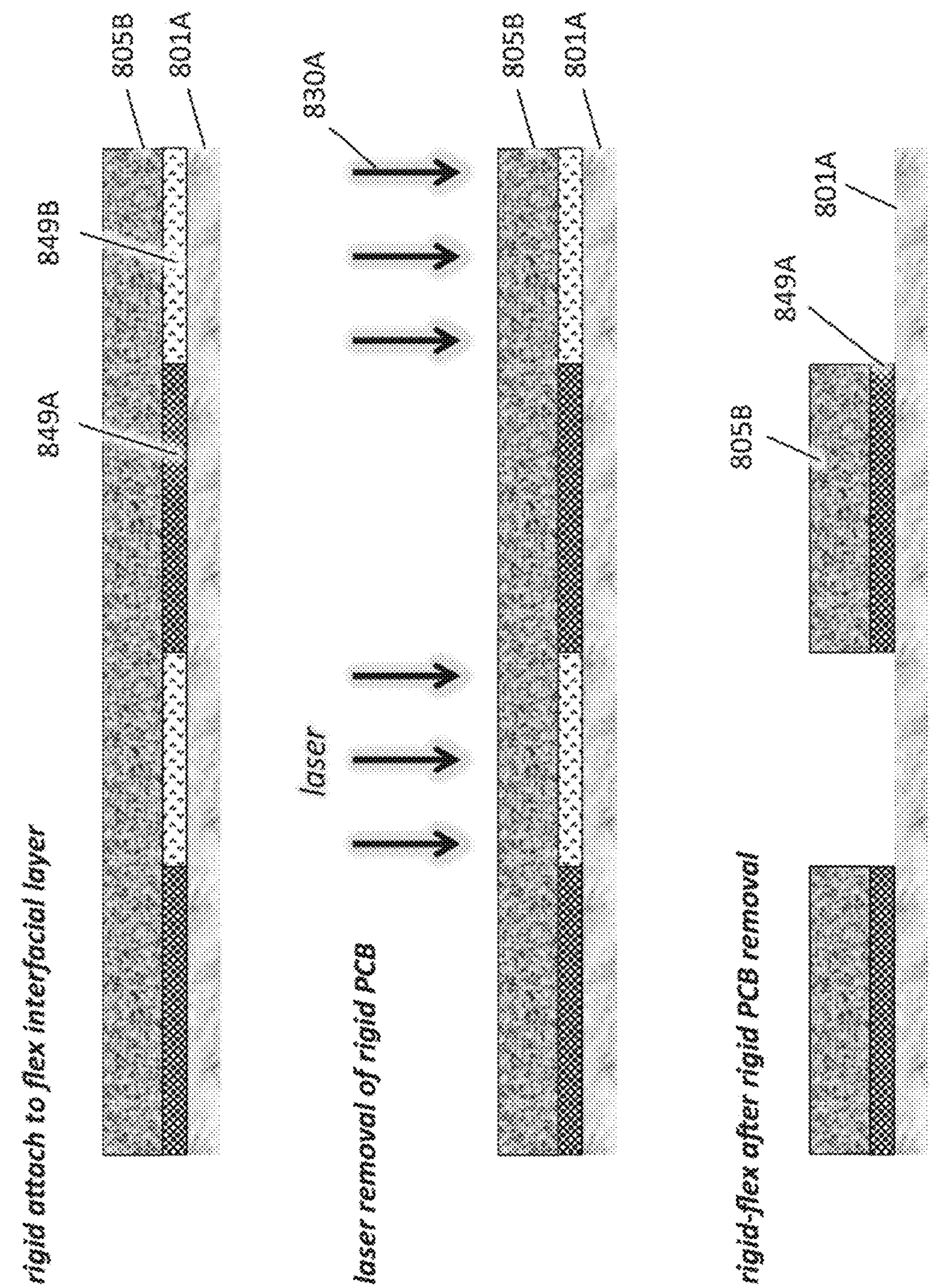

FIG. 85D illustrates a cross section of a rigid-flex PCB in a rigid PCB removal process, shown after rigid material removal.

FIG. 86A illustrates cross sections of a rigid PCB removal process using an unhardened interfacial layer.

Figure 86B:
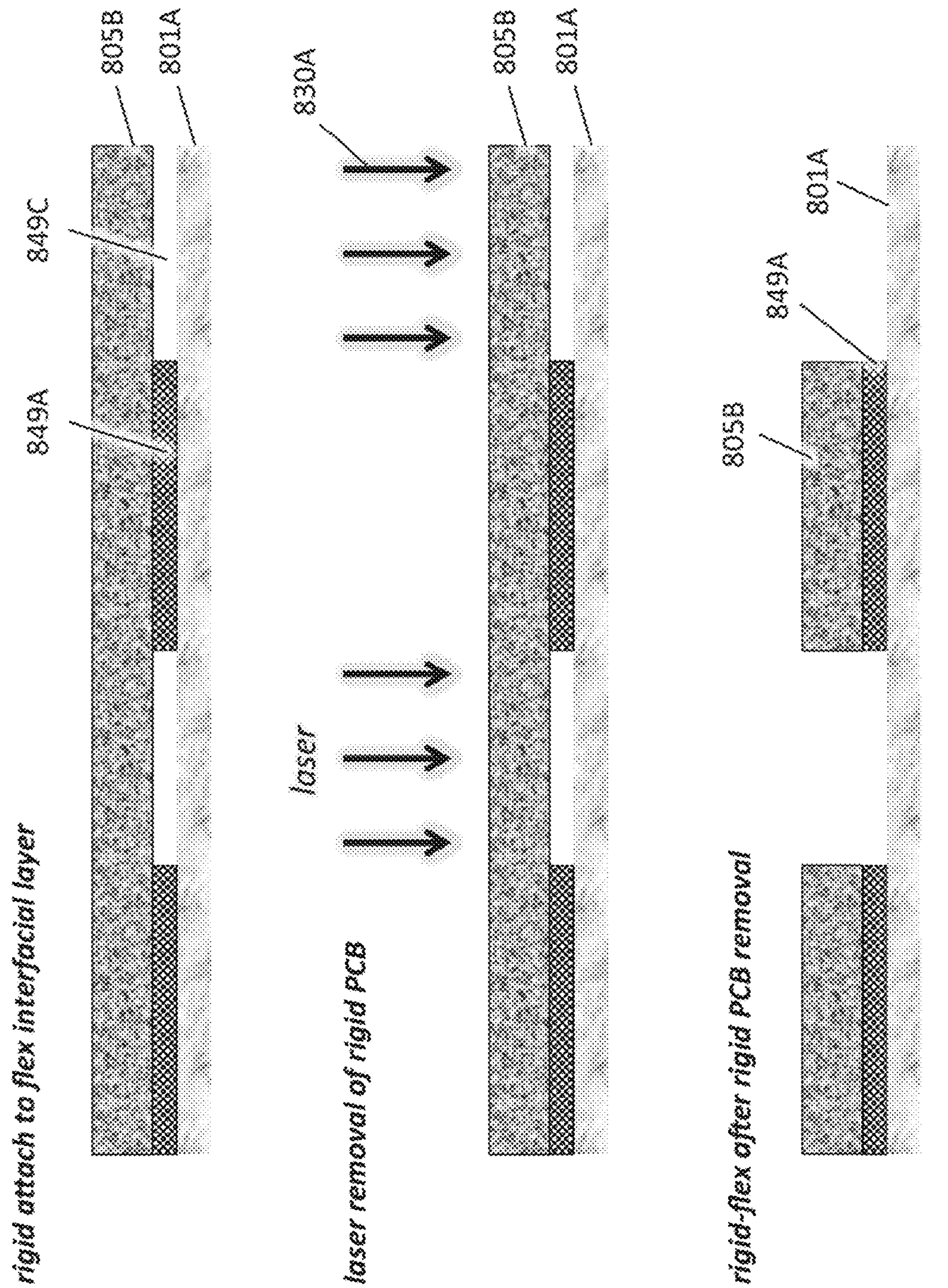

FIG. 86B illustrates cross sections of a rigid PCB removal process using an air gap.

Figure 87A:
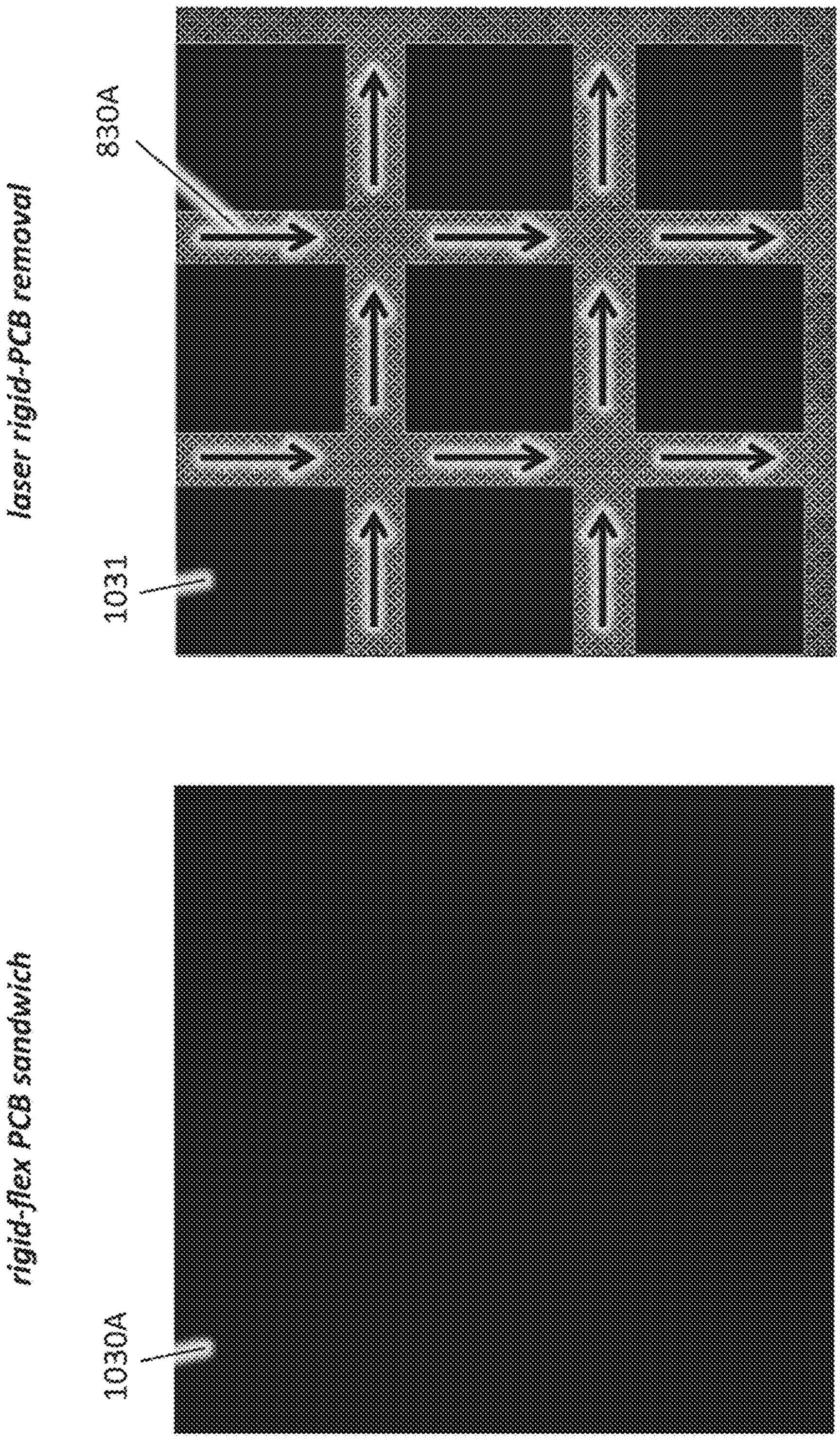

FIG. 87A comprises plan views of a rigid-flex PCB in a rigid PCB removal process, shown prior to and during rigid material removal.

Figure 87B:
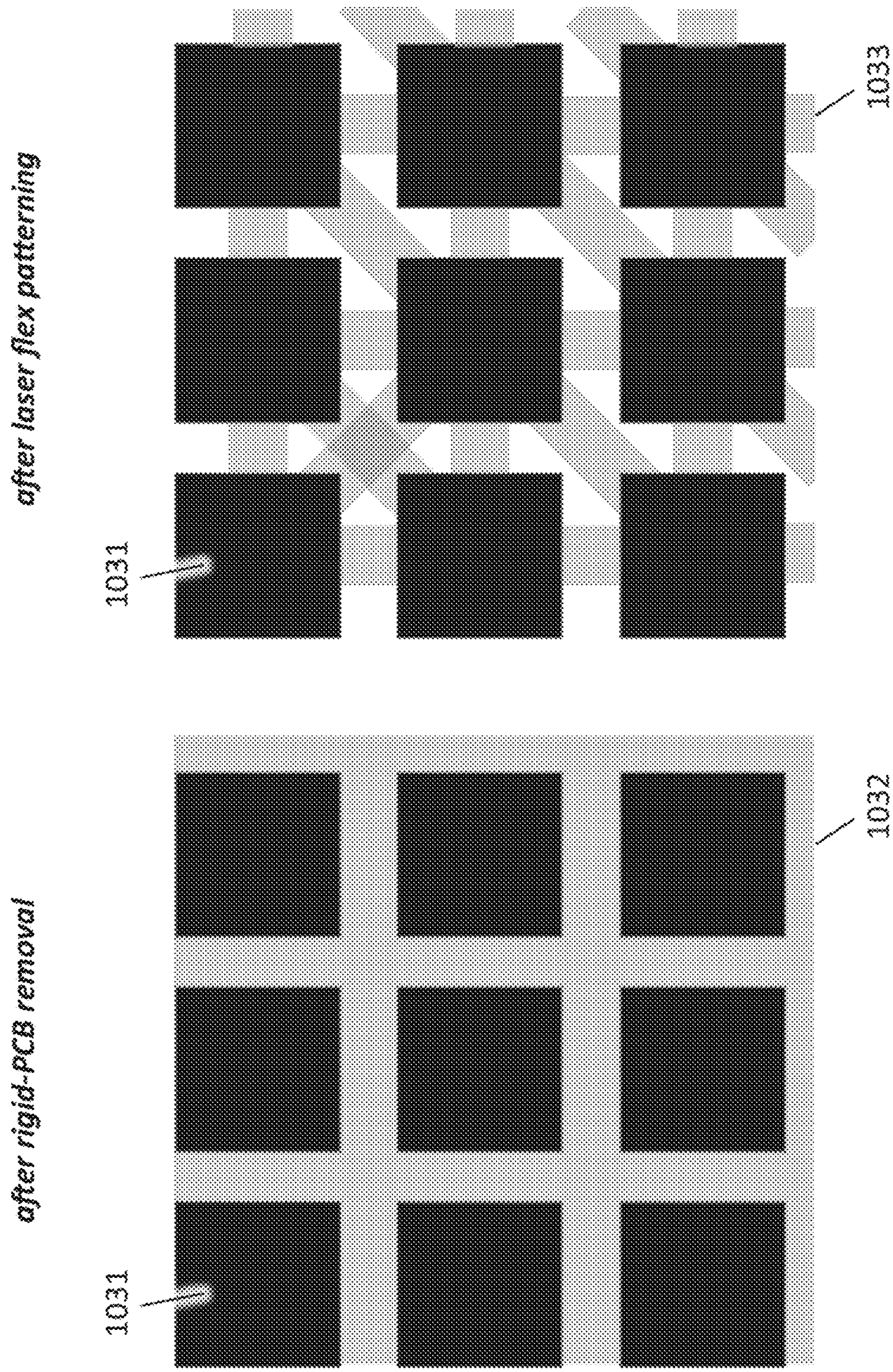

FIG. 87B comprises plan views of a rigid-flex PCB in a rigid PCB removal process, shown after rigid material removal.

Figure 88:
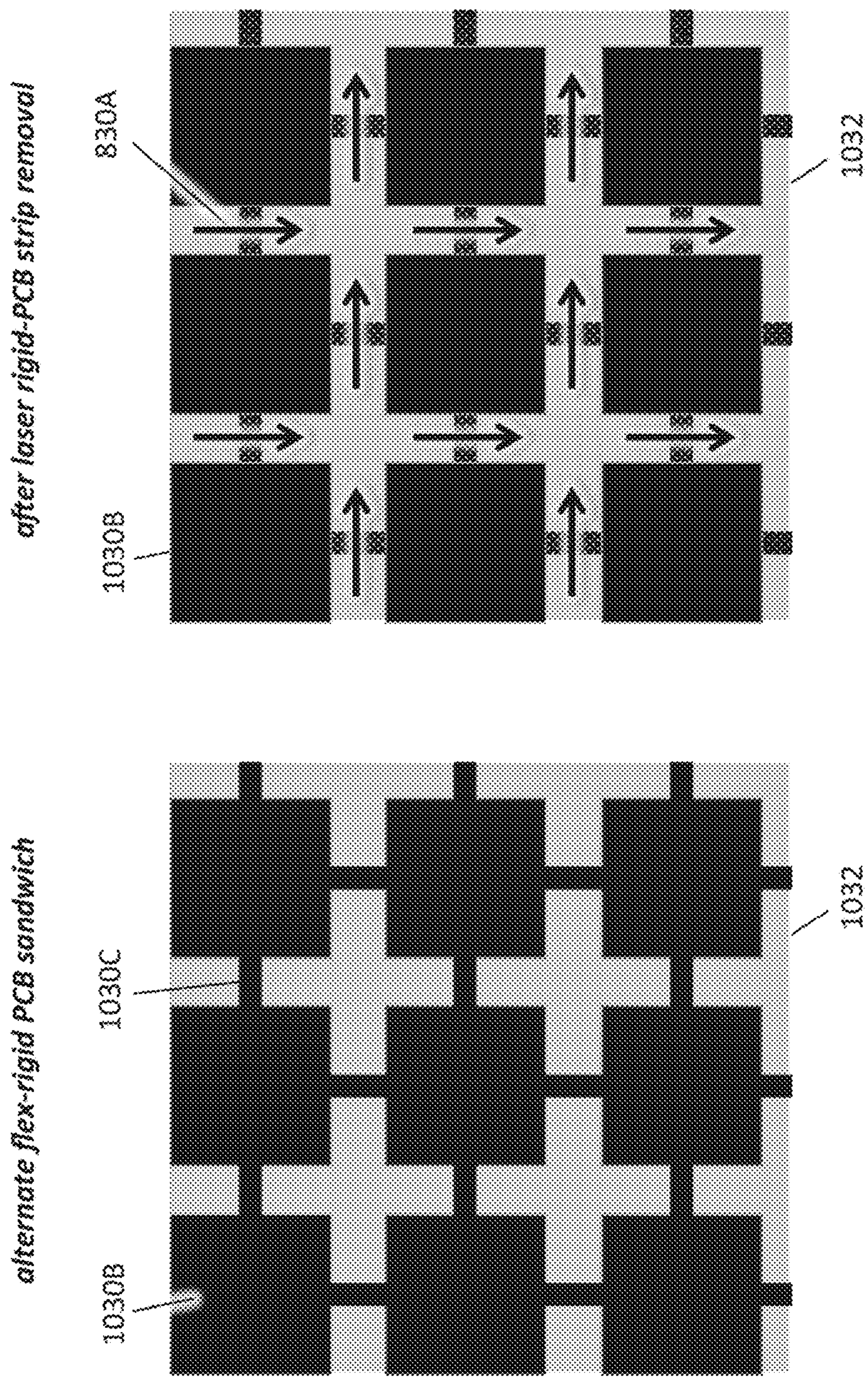

FIG. 88 comprises plan views of an alternately designed rigid-flex PCB in a rigid PCB removal process, shown prior to and during rigid material removal.

Figure 89A:
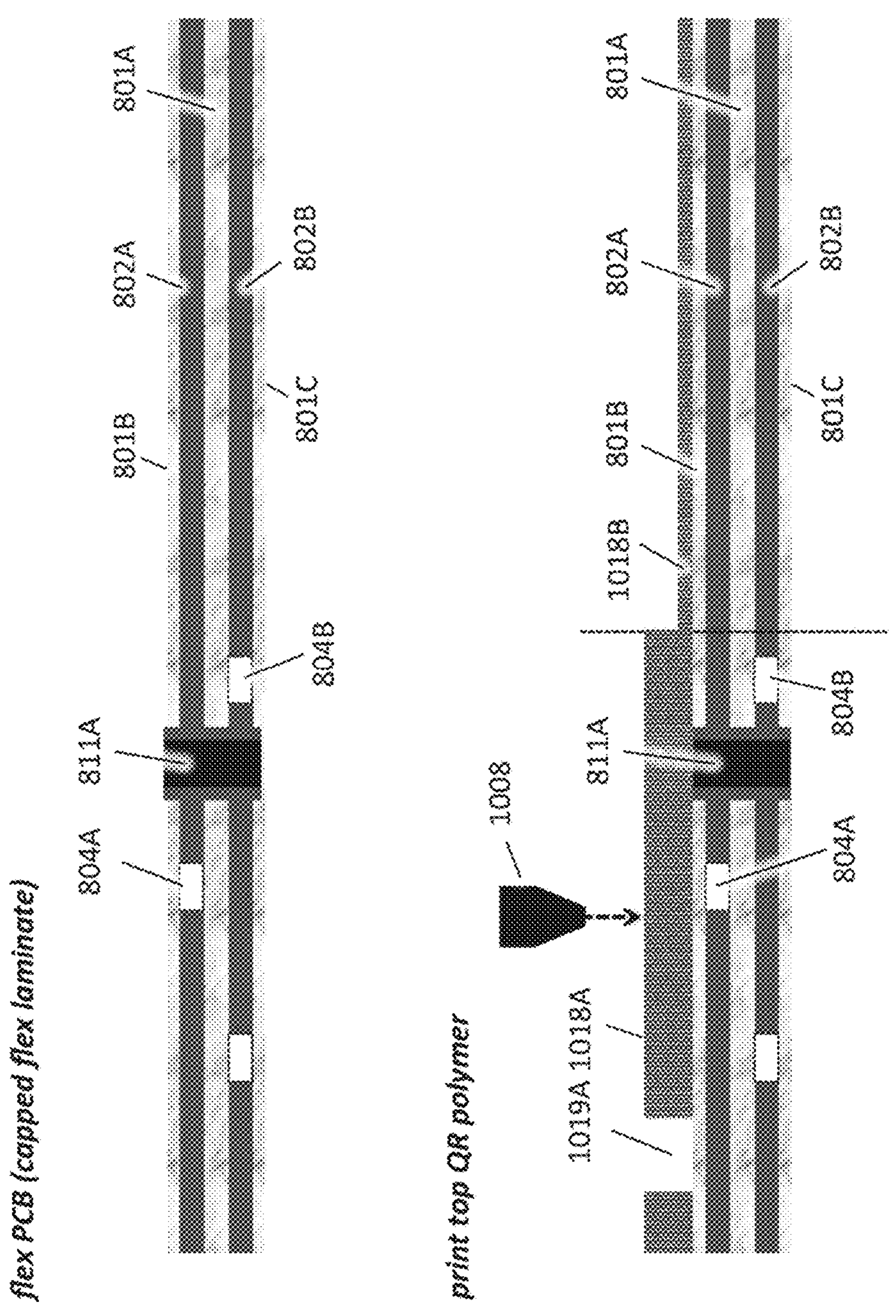

FIG. 89A comprises cross sections of quasi-rigid PCB fabrication including flex substrate and top QR polymer printing.

Figure 89B:
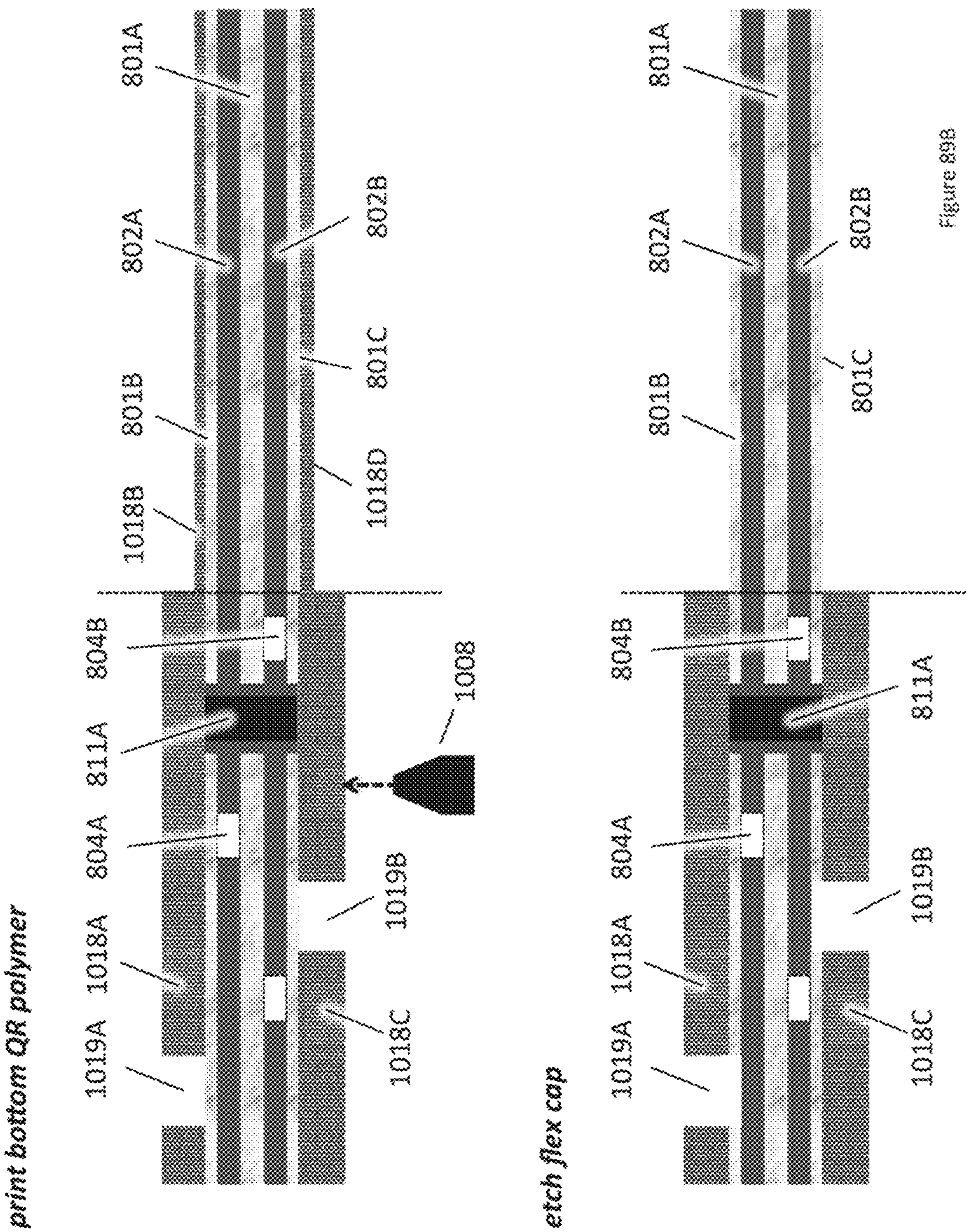

FIG. 89B comprises cross sections of quasi-rigid PCB fabrication including bottom QR polymer printing and flex cap etch.

Figure 89C:
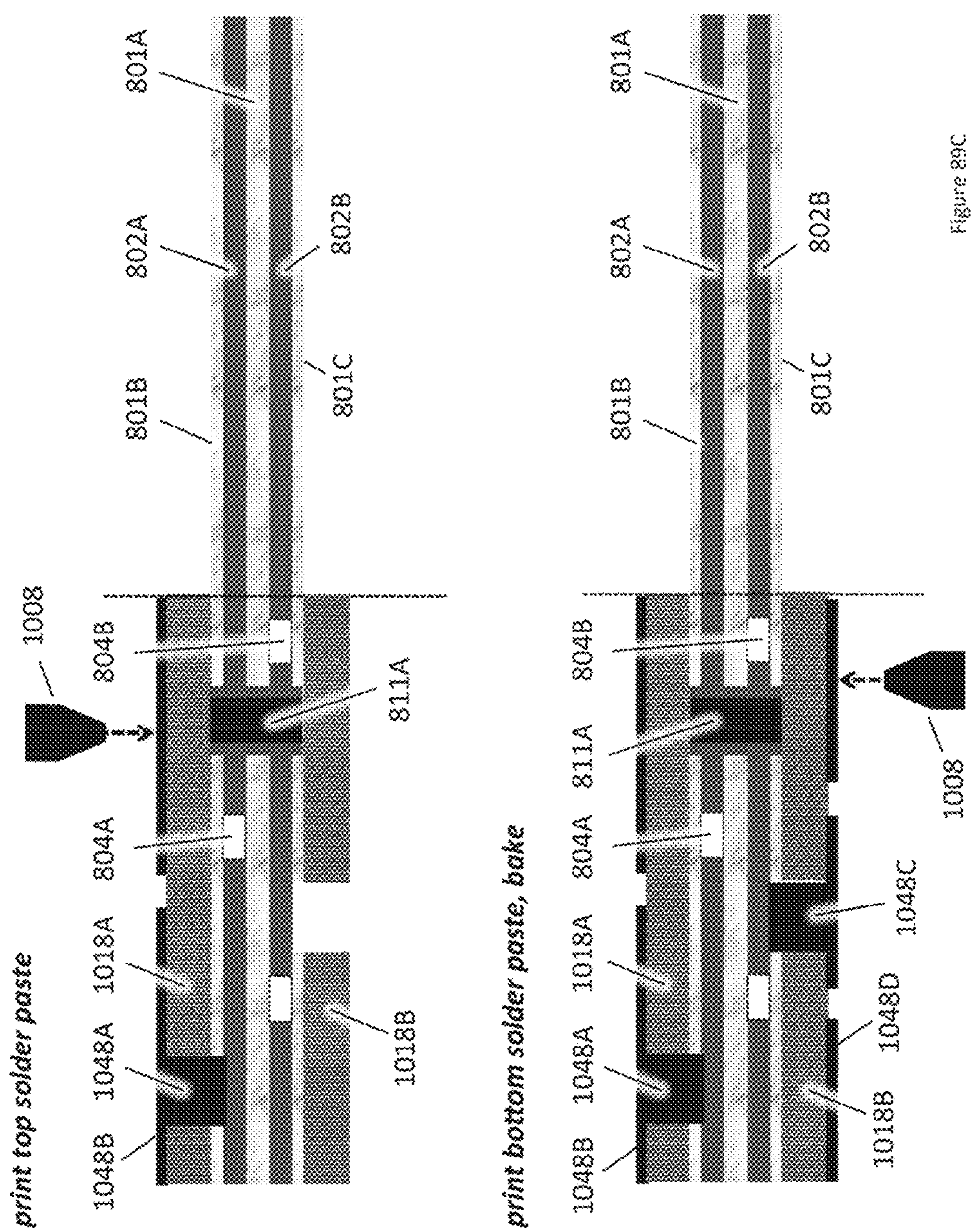

FIG. 89C comprises cross sections of quasi-rigid PCB fabrication including top and bottom solder paste printing.

FIG. 890 is a cross section of a quasi-rigid PCB after thick metal plating.

Figure 89D:
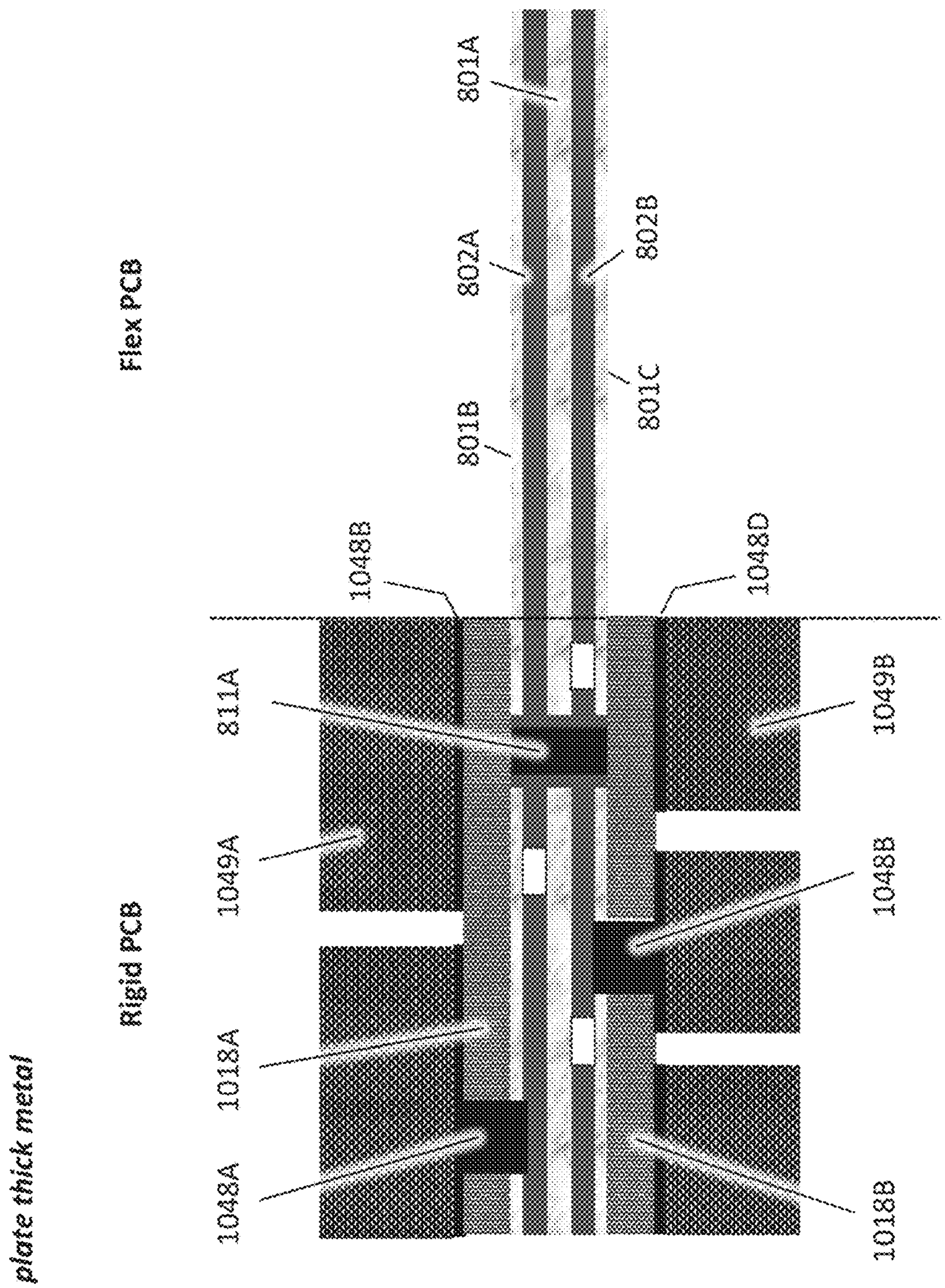
Figure 89E:
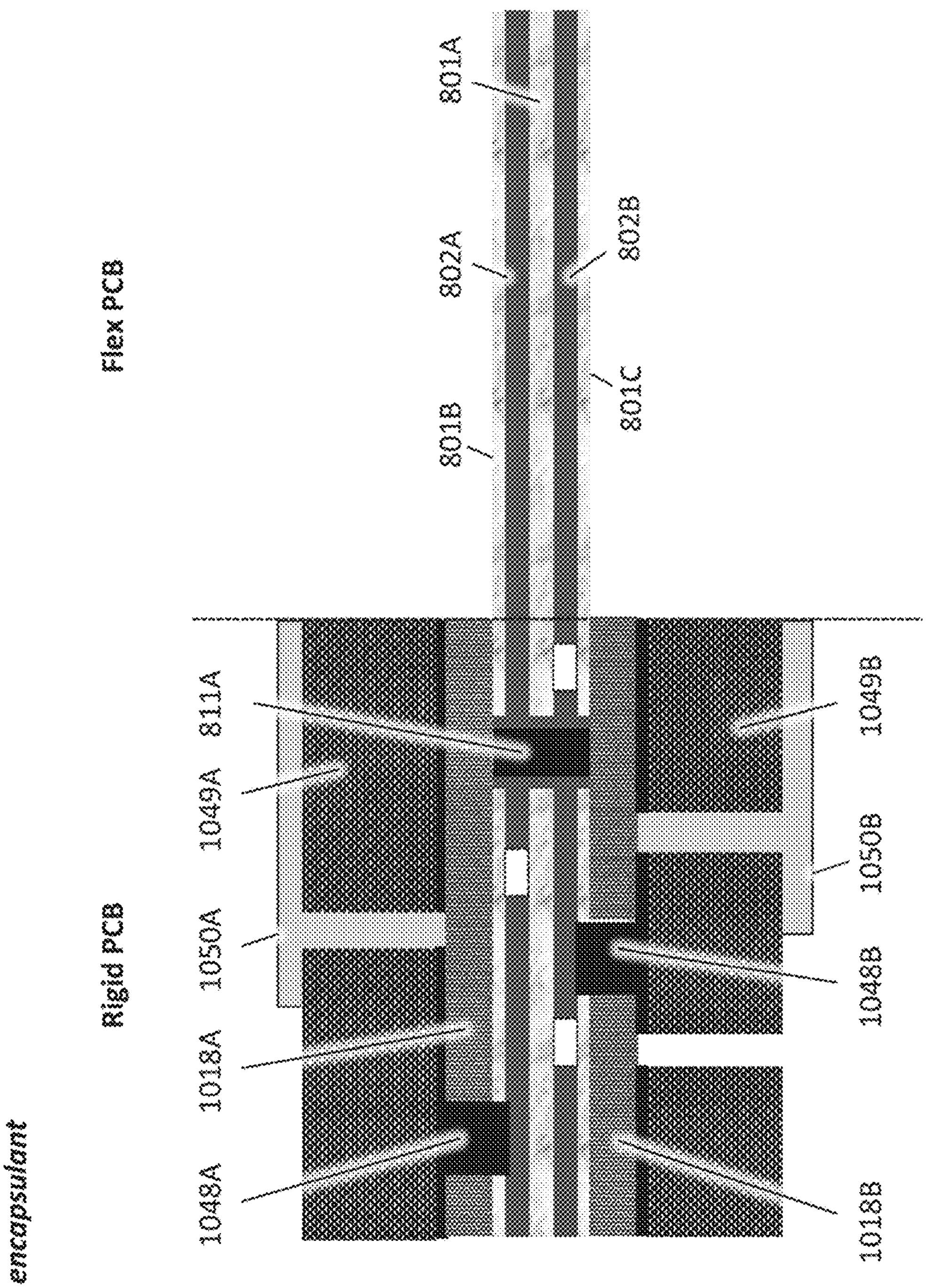

FIG. 89E is a cross section of a quasi-rigid PCB after encapsulation.

Figure 90:
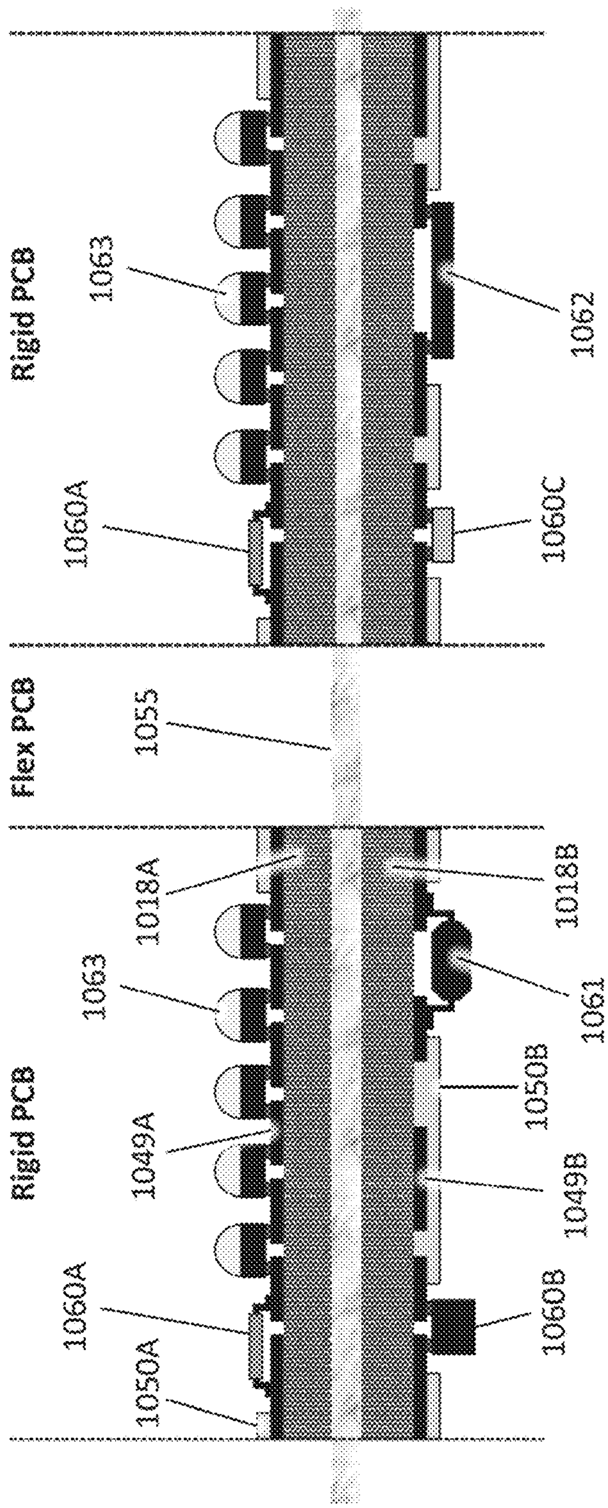

FIG. 90 is a cross section of a quasi-rigid PCB after surface mount assembly.

Figure 91:
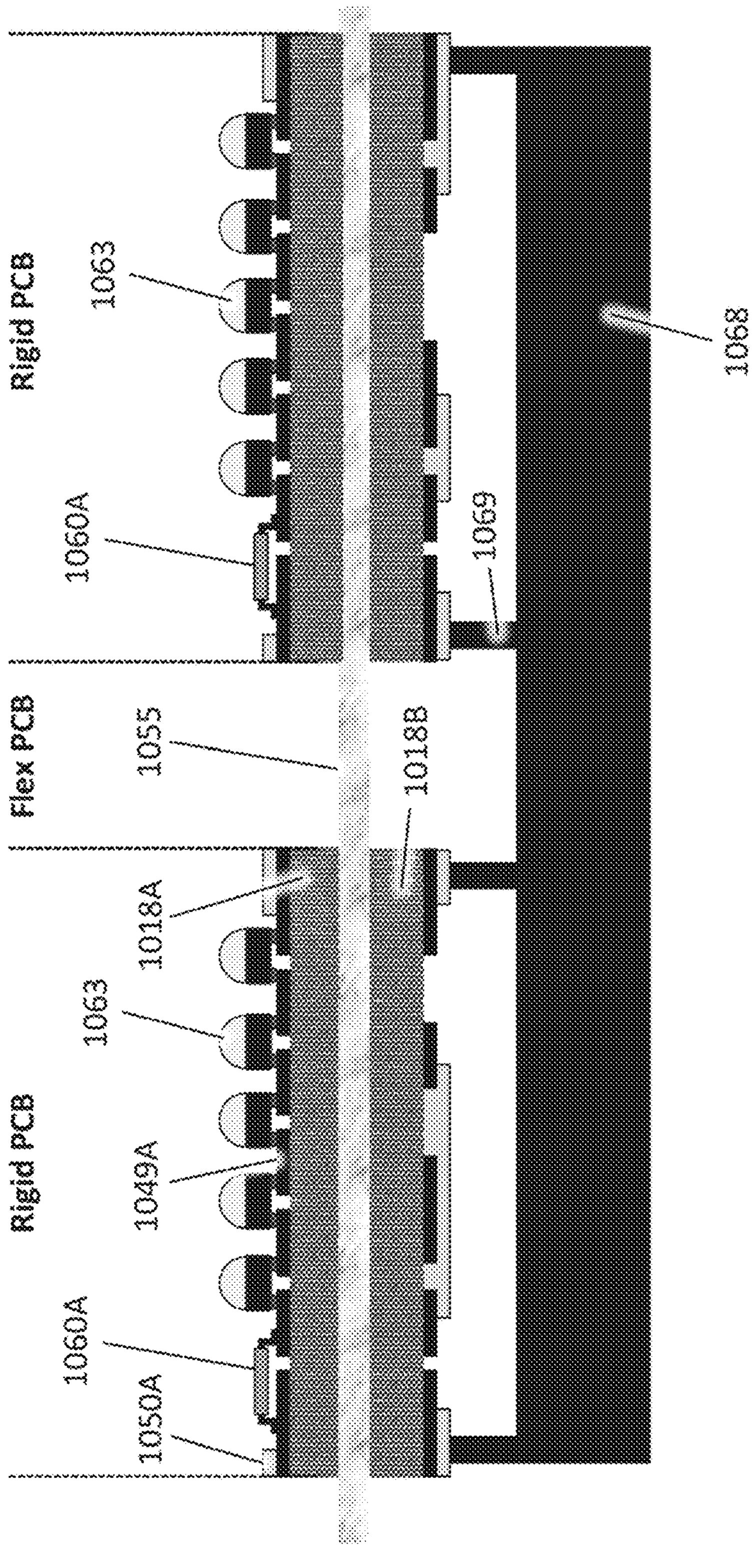

FIG. 91 is a cross section of a quasi-rigid PCB during surface mount assembly.

Figure 92:
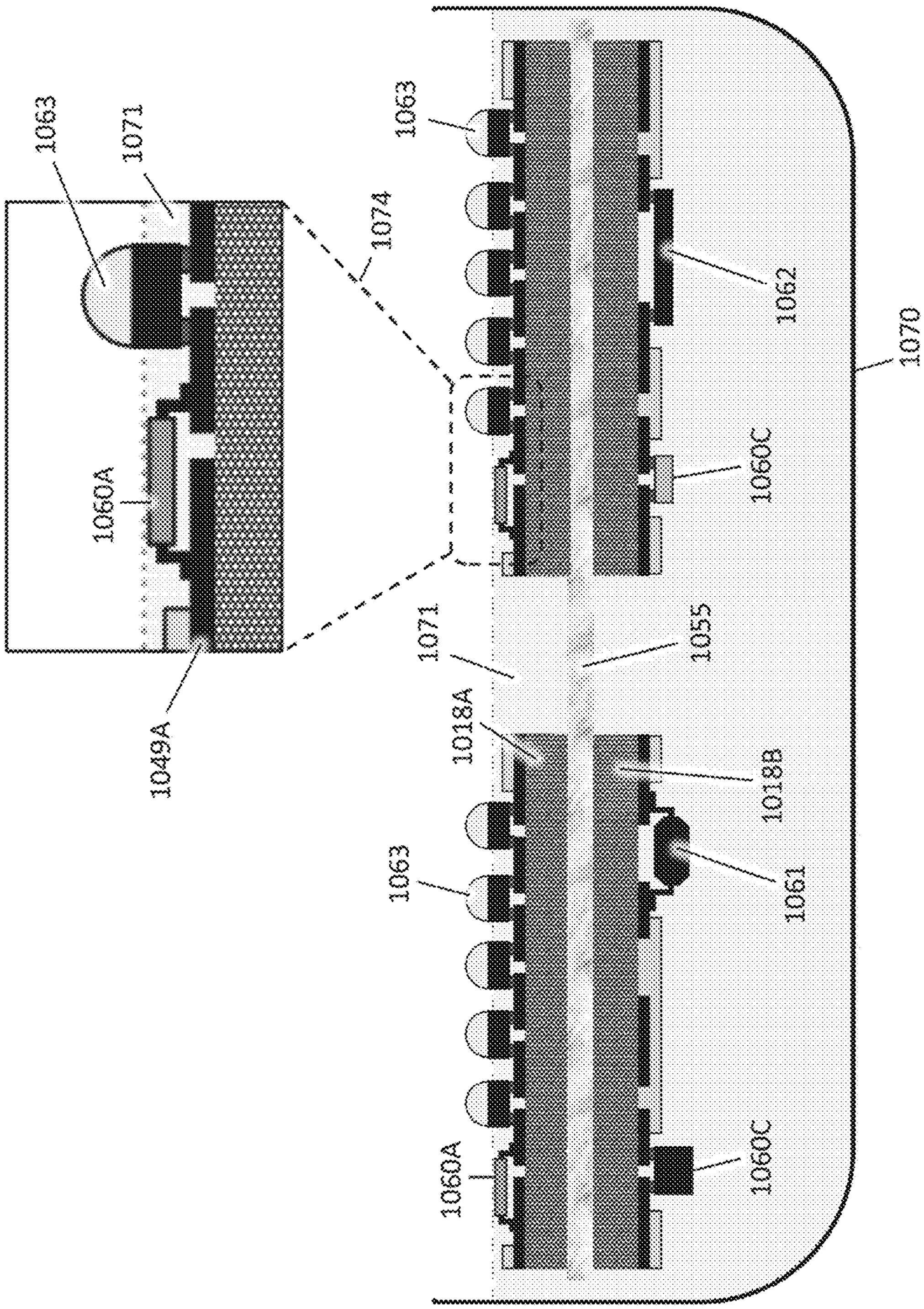

FIG. 92 is a cross section of a quasi-rigid PCB during the application of a moisture resistant coating.

Figure 93:
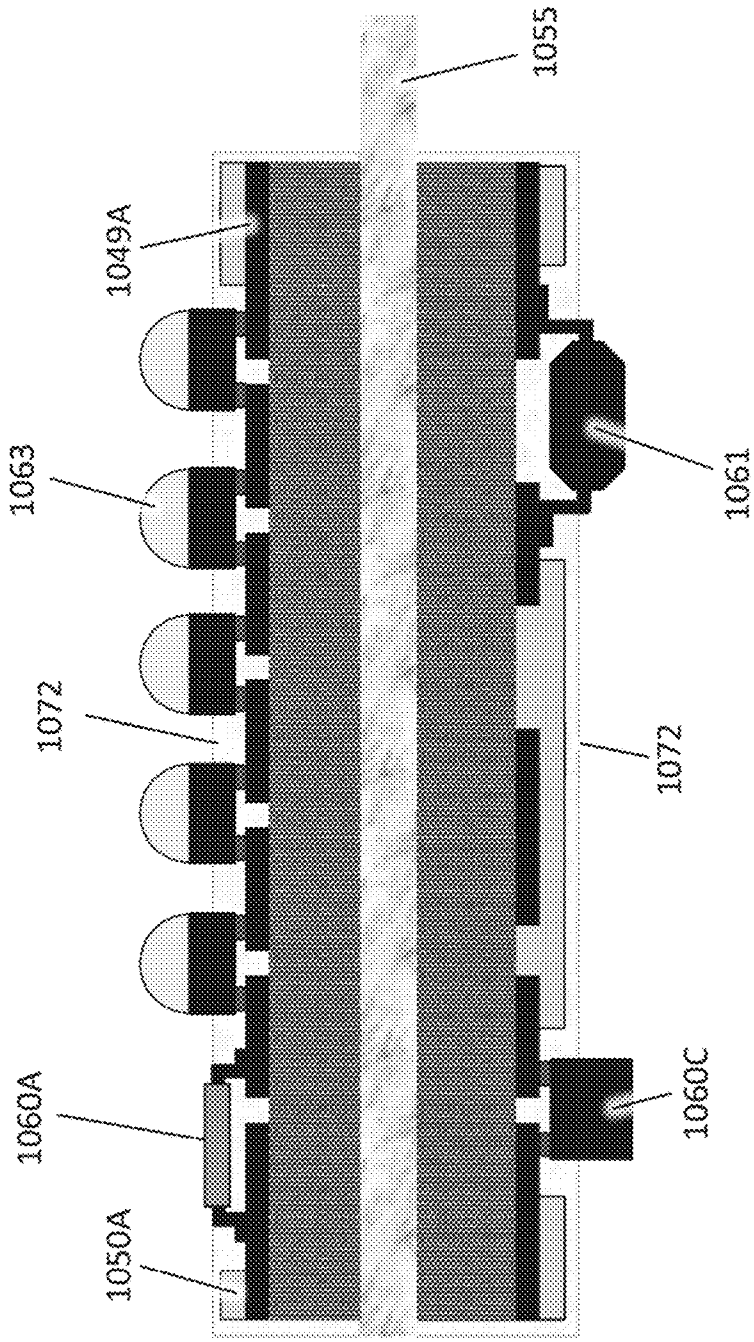

FIG. 93 is a cross section of a quasi-rigid PCB after the application of a moisture resistant coating.

Figure 94:
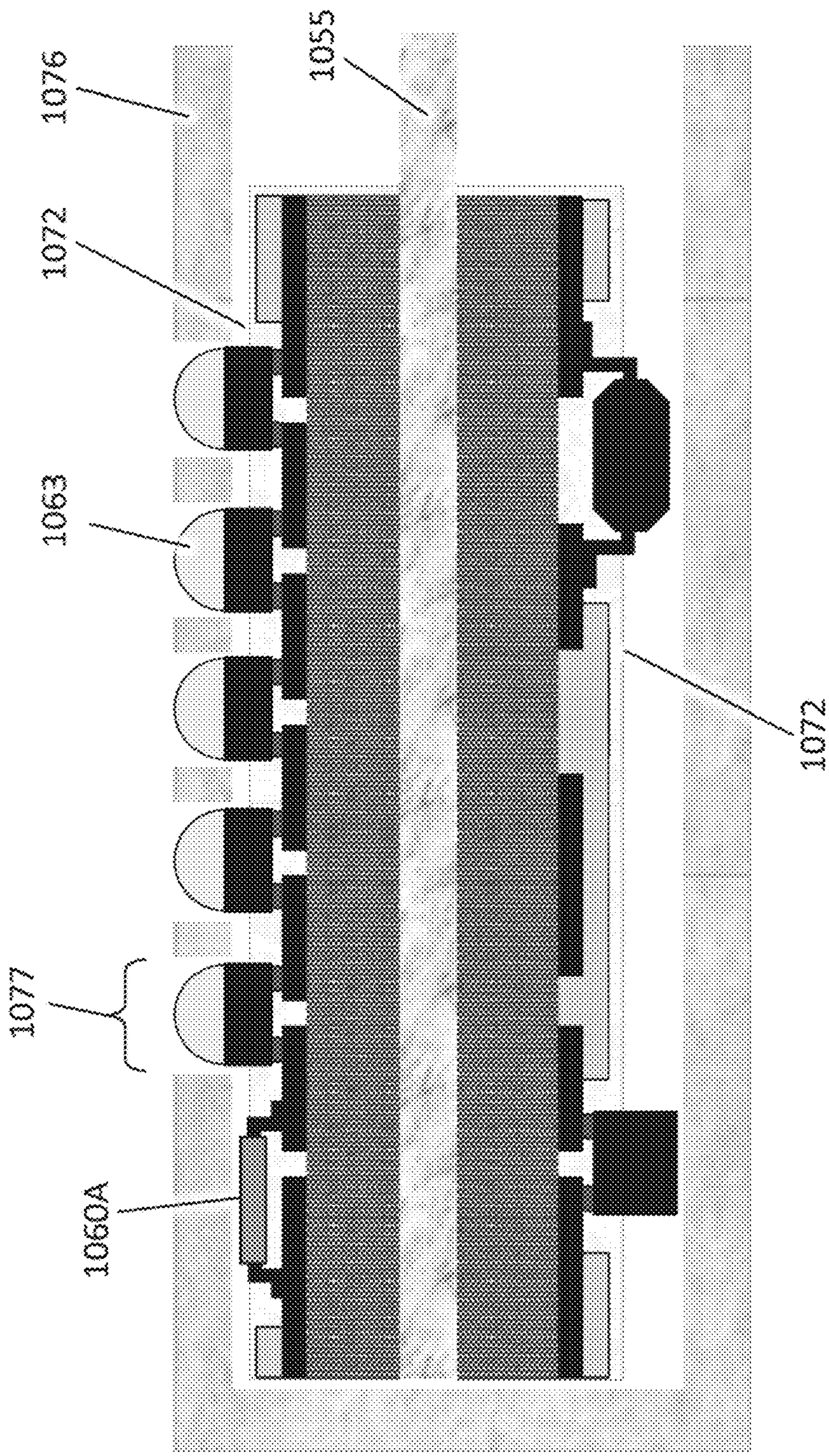

FIG. 94 is a cross section of a quasi-rigid PCB after mounting in a polymeric cover.

Figure 95A:
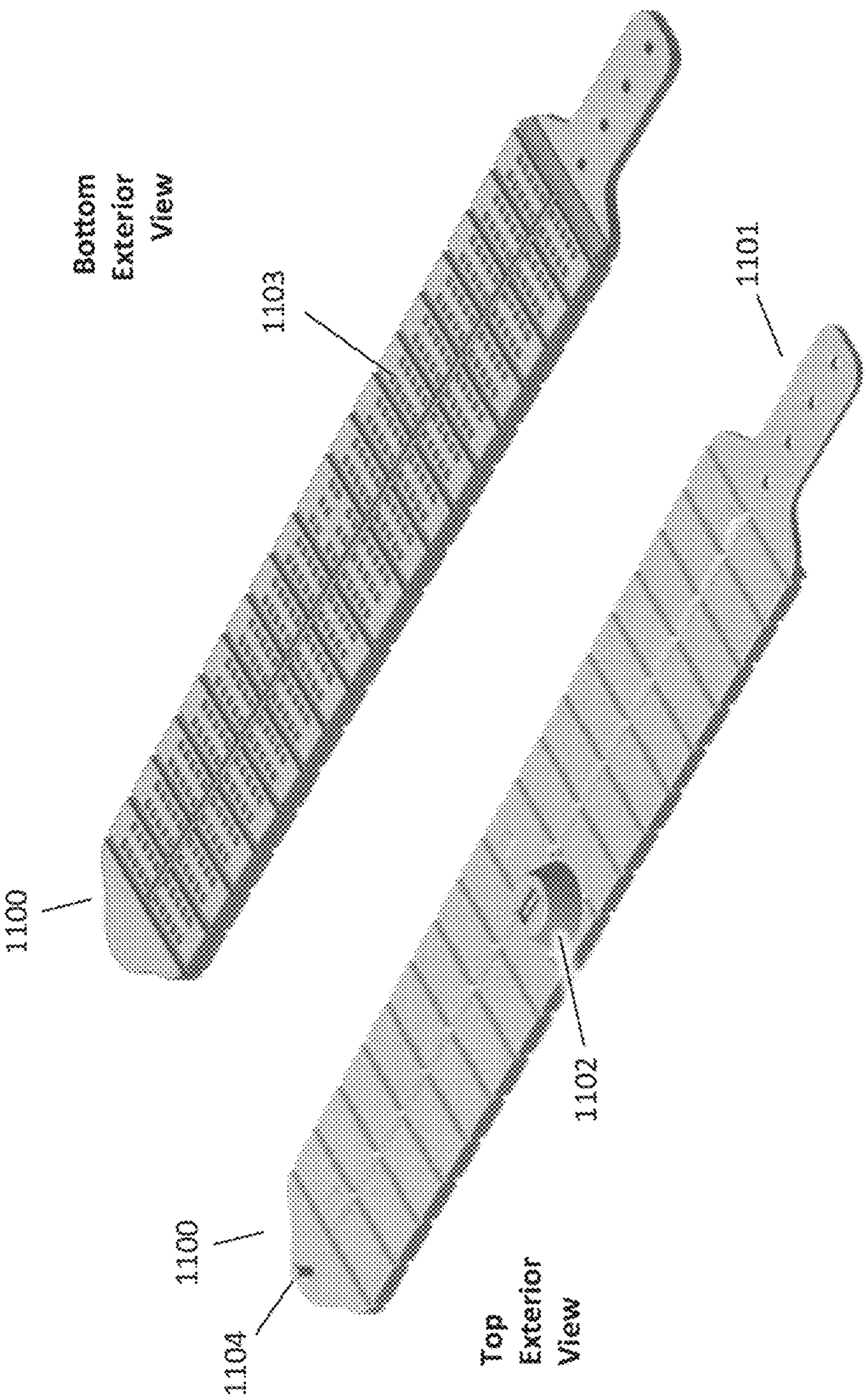

FIG. 95A comprises perspective views of LightPad belt design.

Figure 95B:
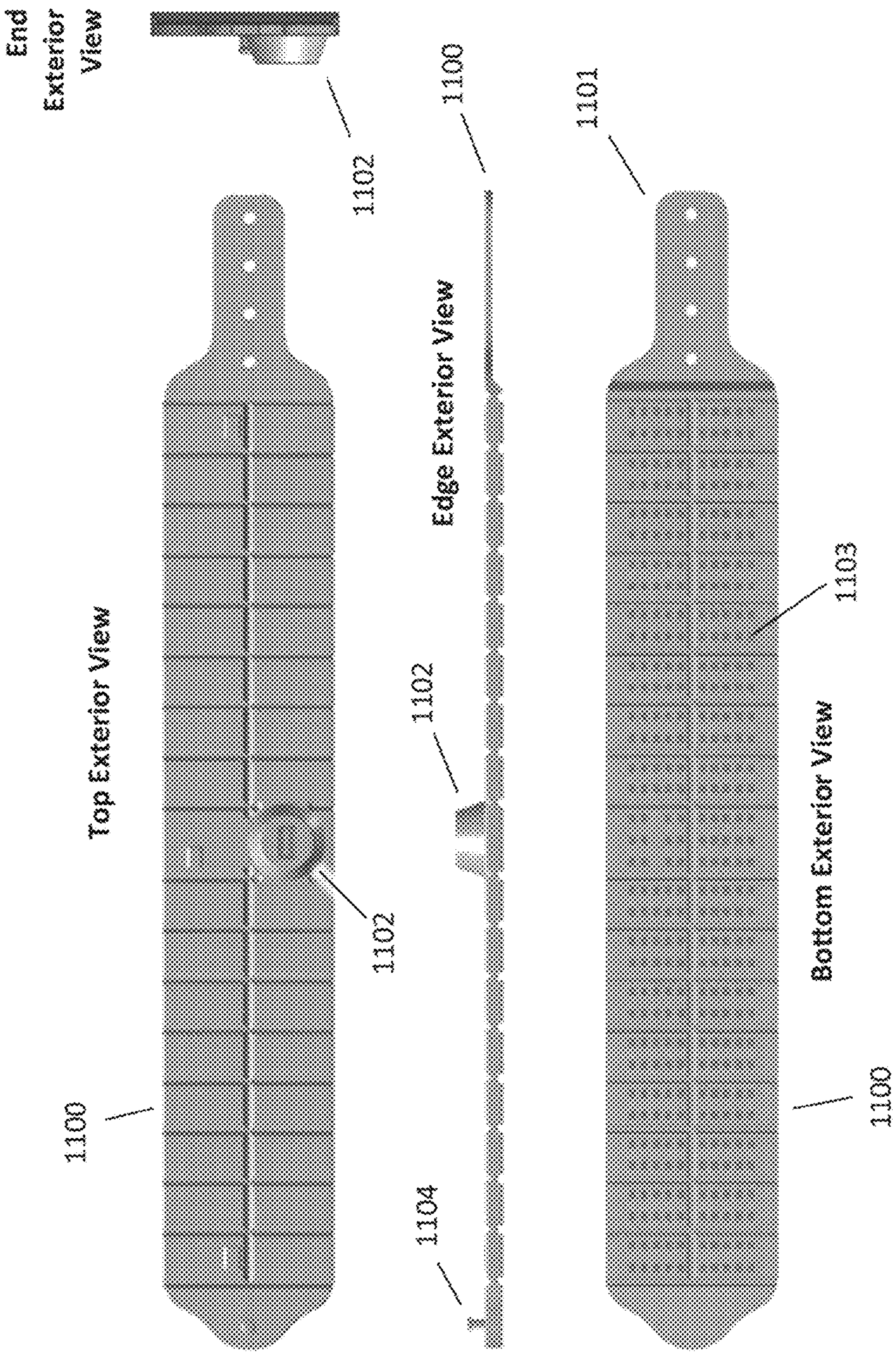

FIG. 95B comprises top, bottom and edge views of LightPad belt design.

Figure 95C:
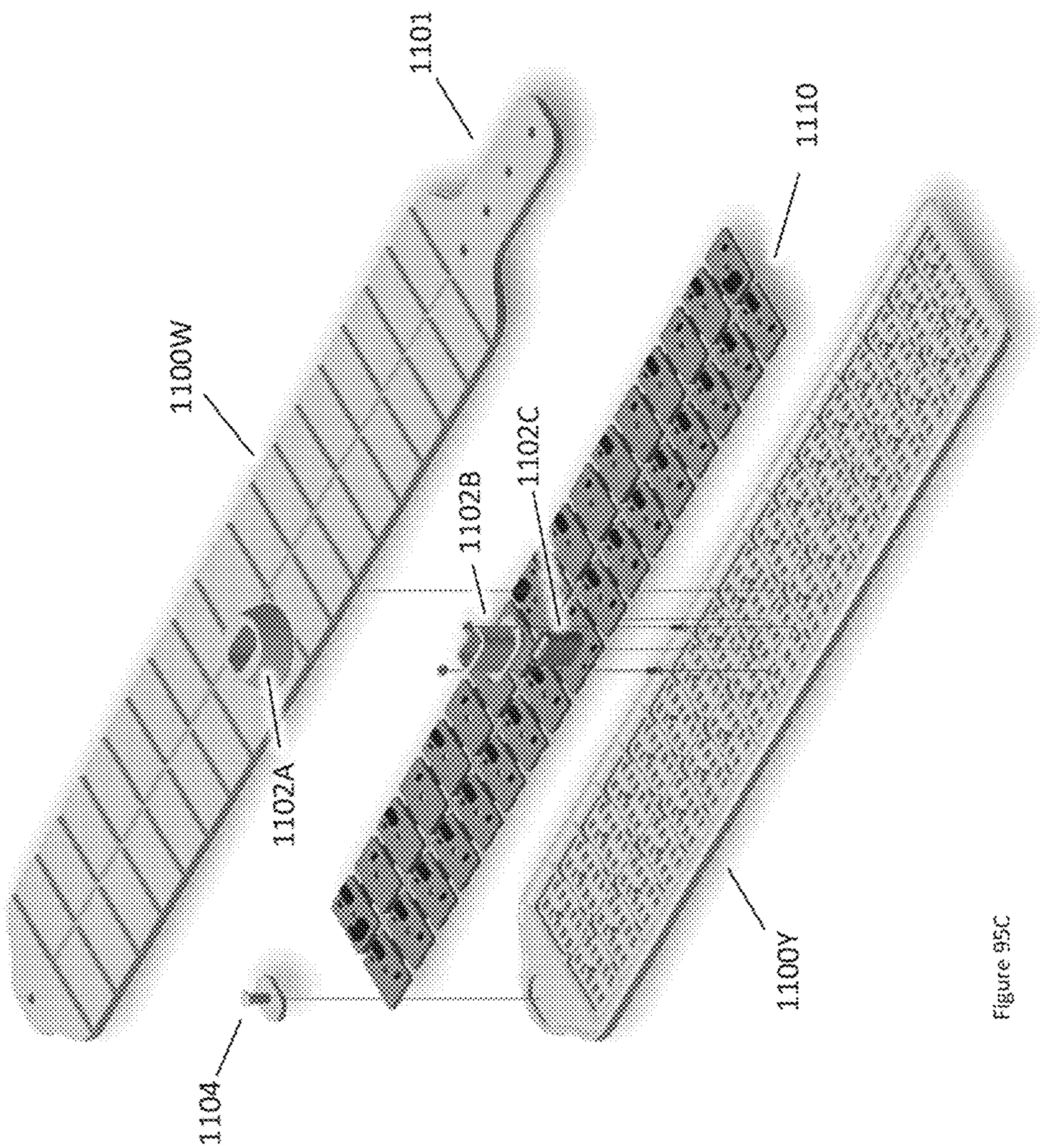

FIG. 95C is a perspective explosion diagram of a LightPad belt design.

Figure 95D:
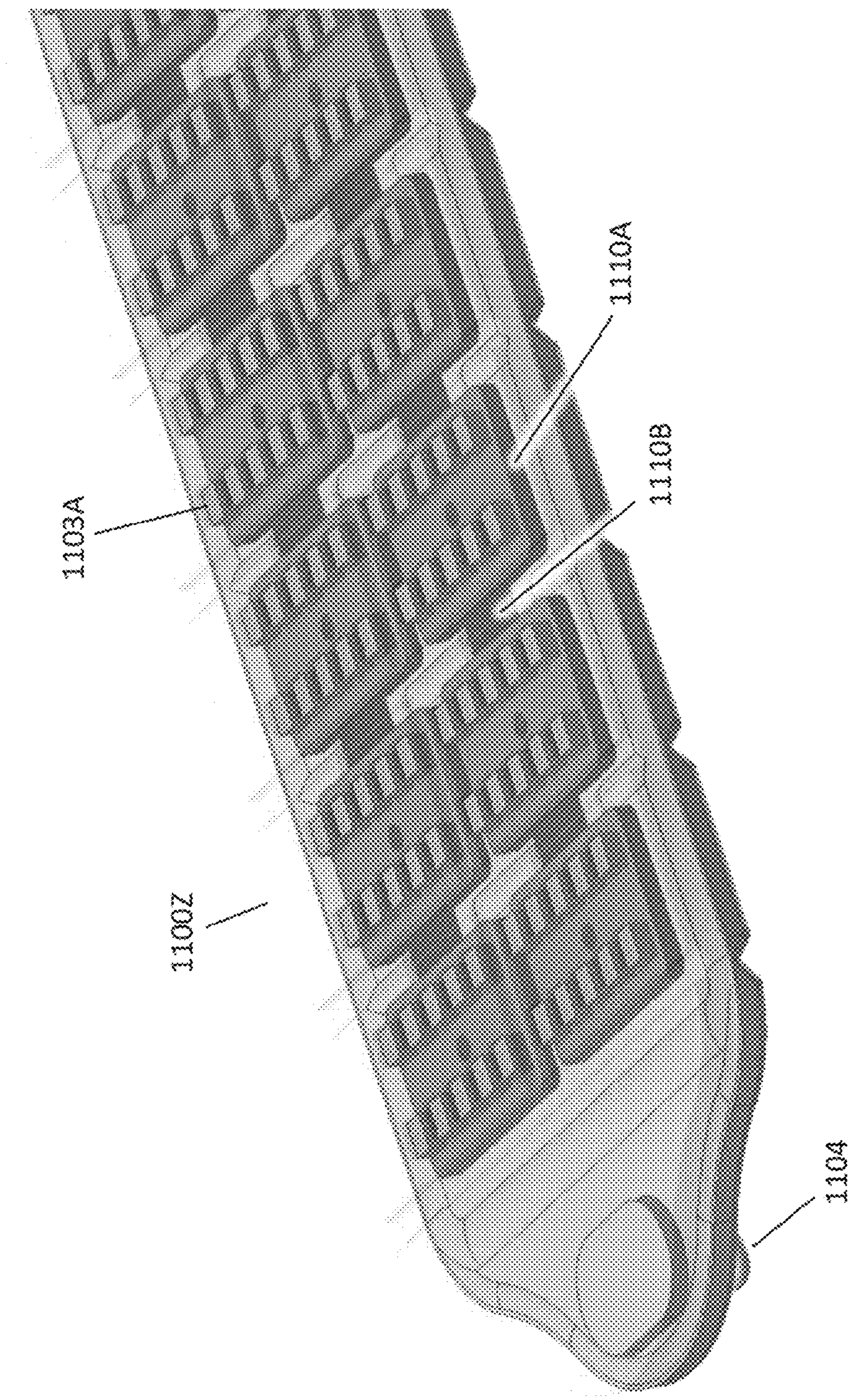

FIG. 95D is an underside perspective view of a LightPad belt design.

Figure 95E:
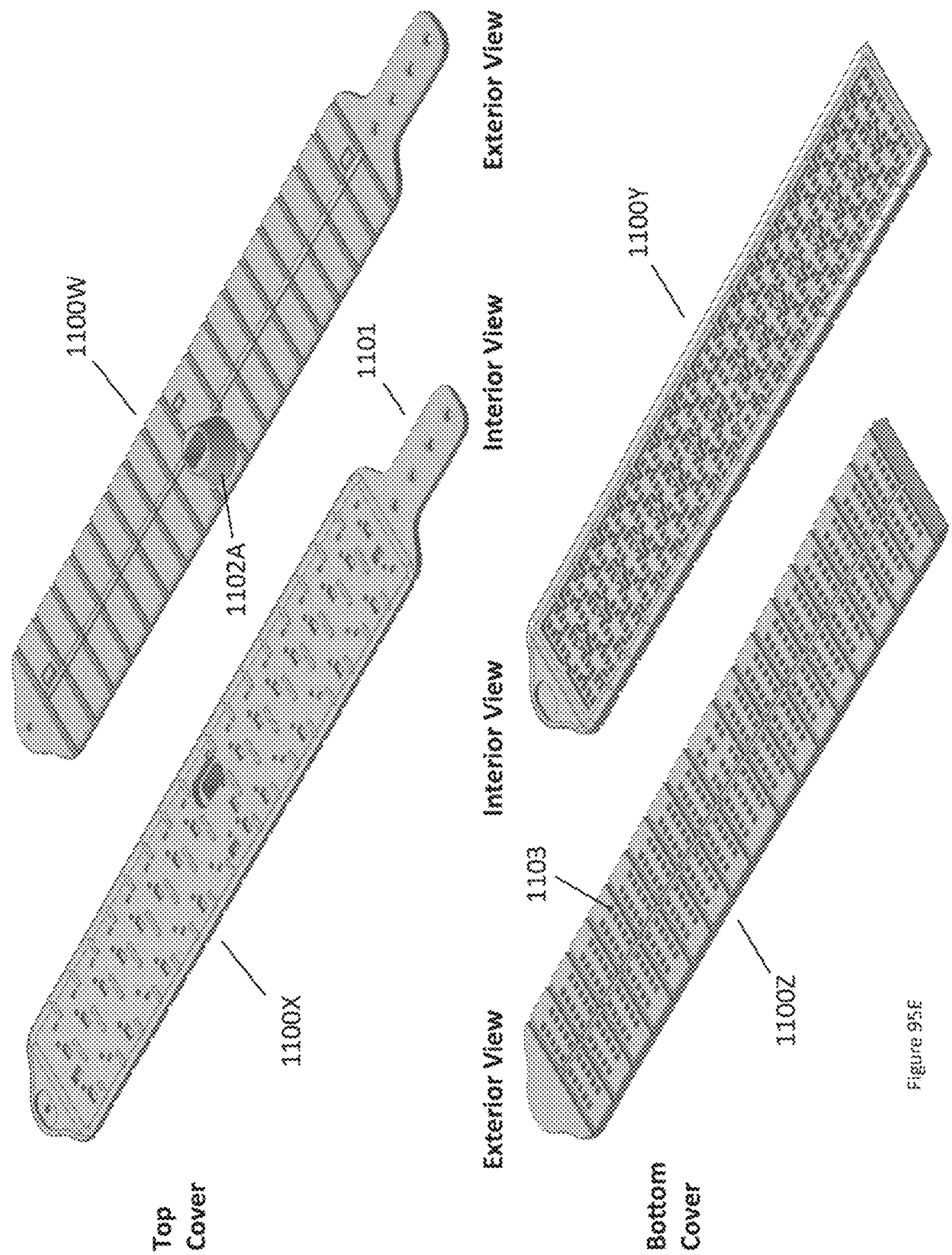

FIG. 95E comprises top and bottom covers in a LightPad belt design.

Figure 95F:
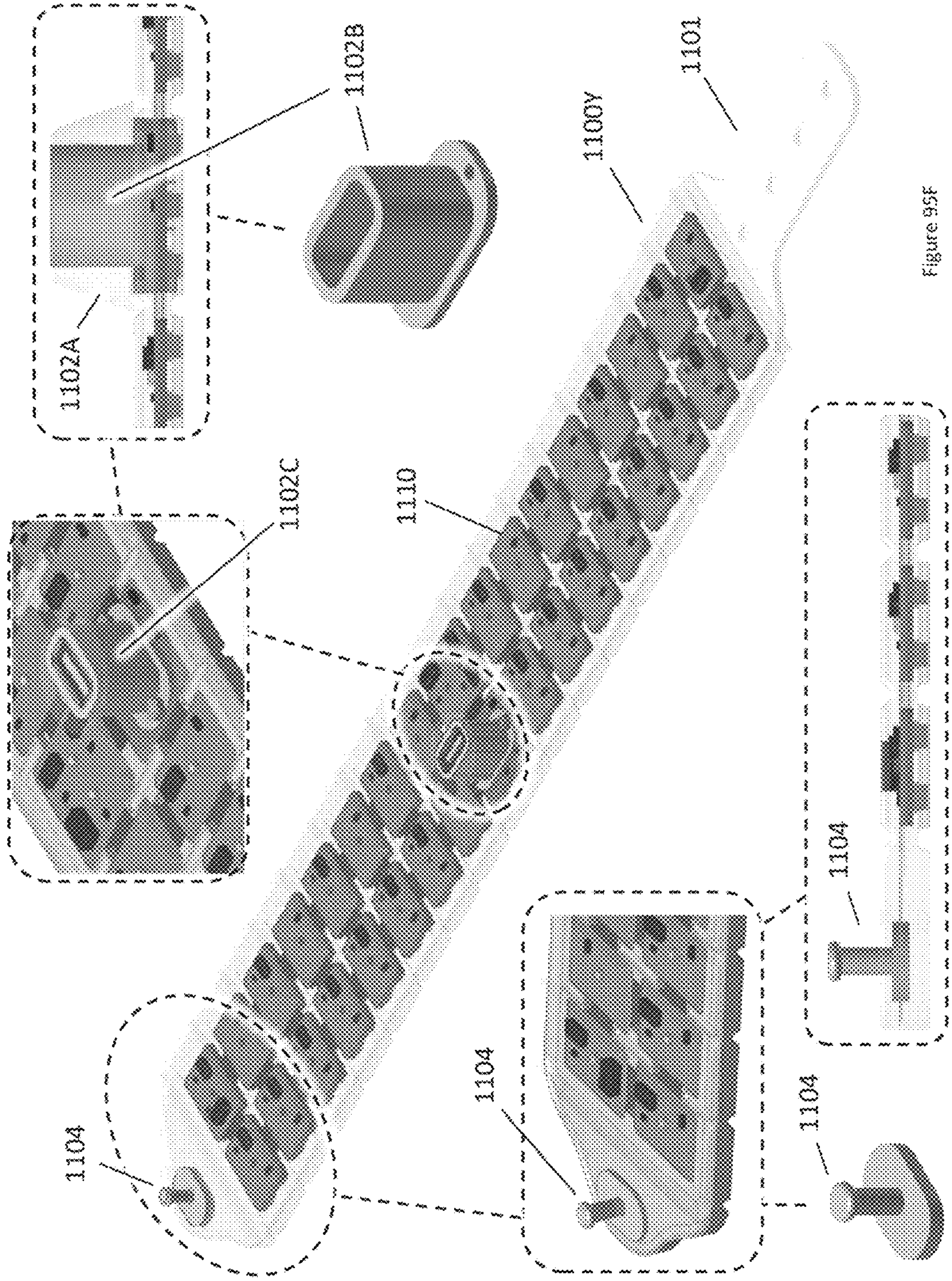

FIG. 95F illustrates various views of distributed rigid-flex PCB in a LightPad belt design.

Figure 96:
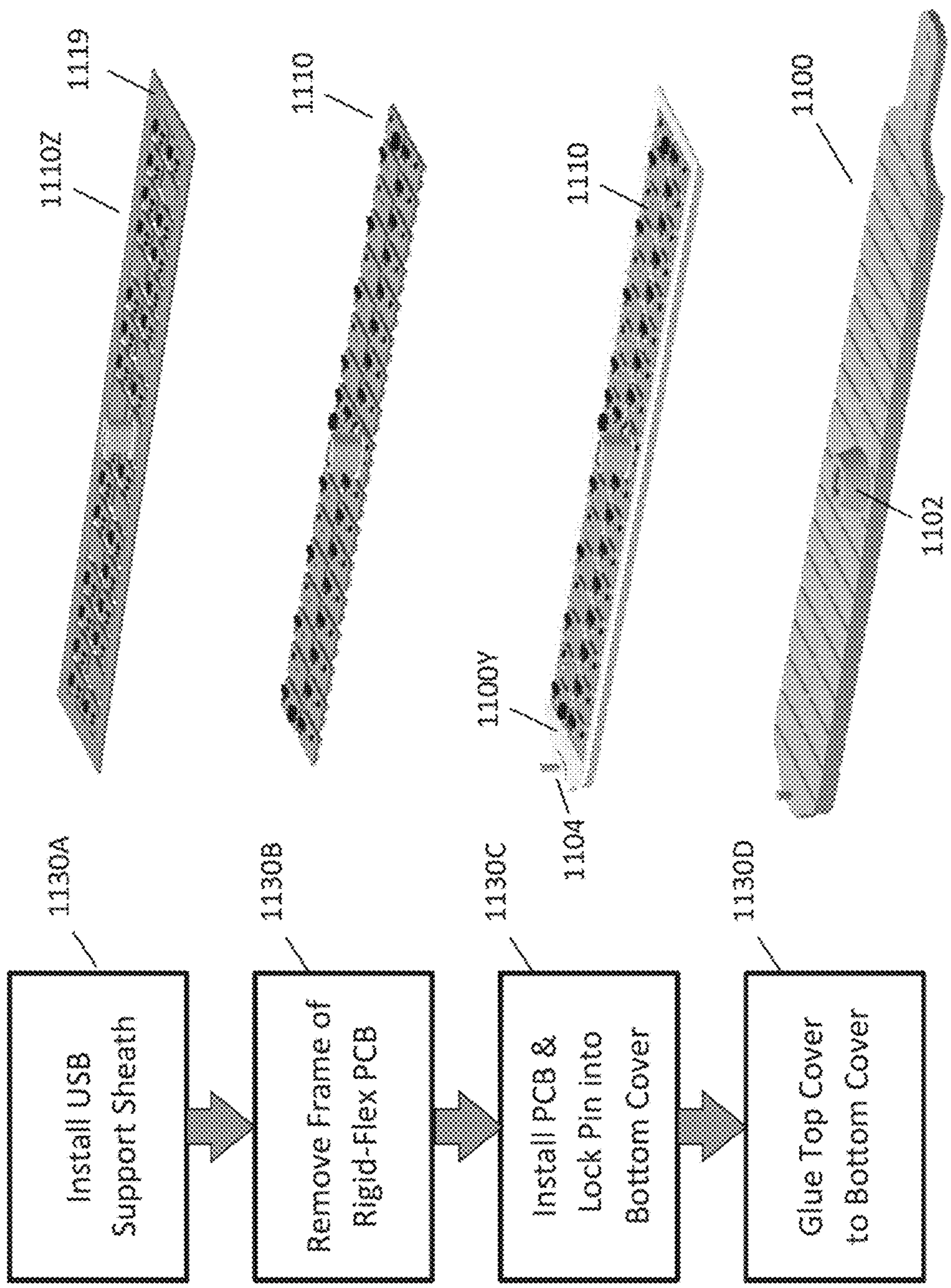

FIG. 96 illustrates the process flow for assembly of a LightPad belt.

Figure 97:
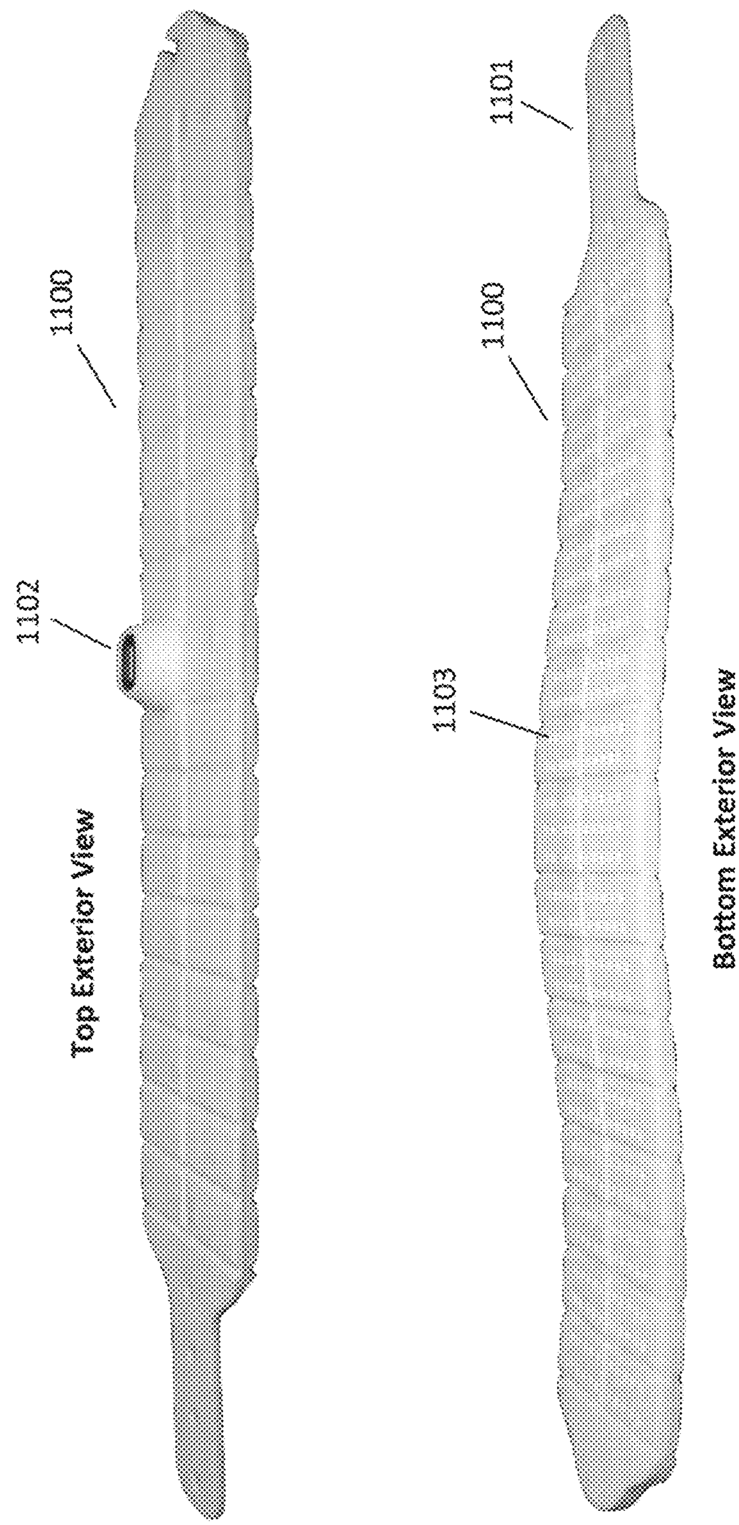

FIG. 97 comprises photographs of a LightPad belt in perspective.

Figure 98:
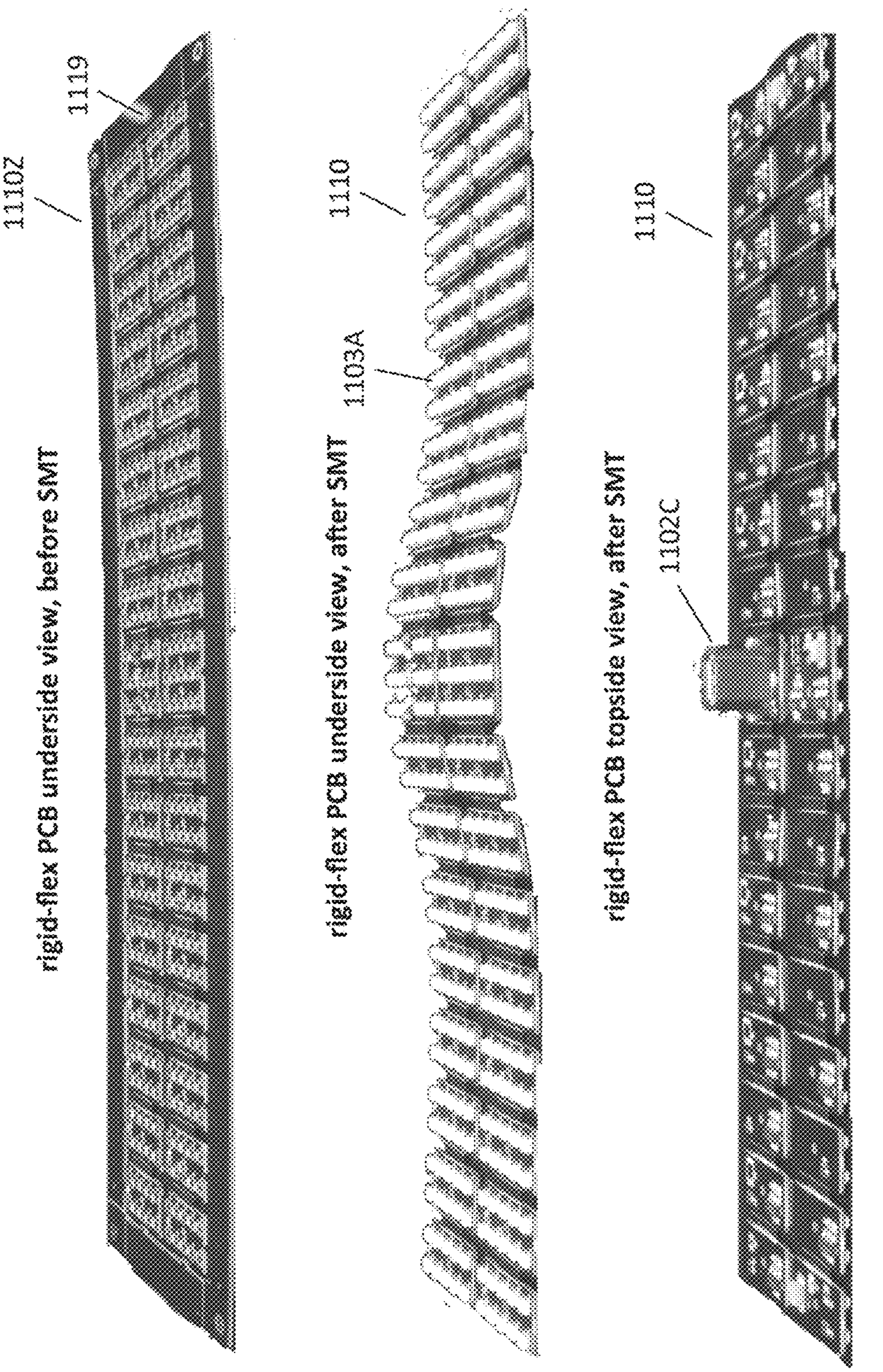

FIG. 98 comprises photographs of distributed rigid-flex PCBs of a LightPad belt.

Figure 99:
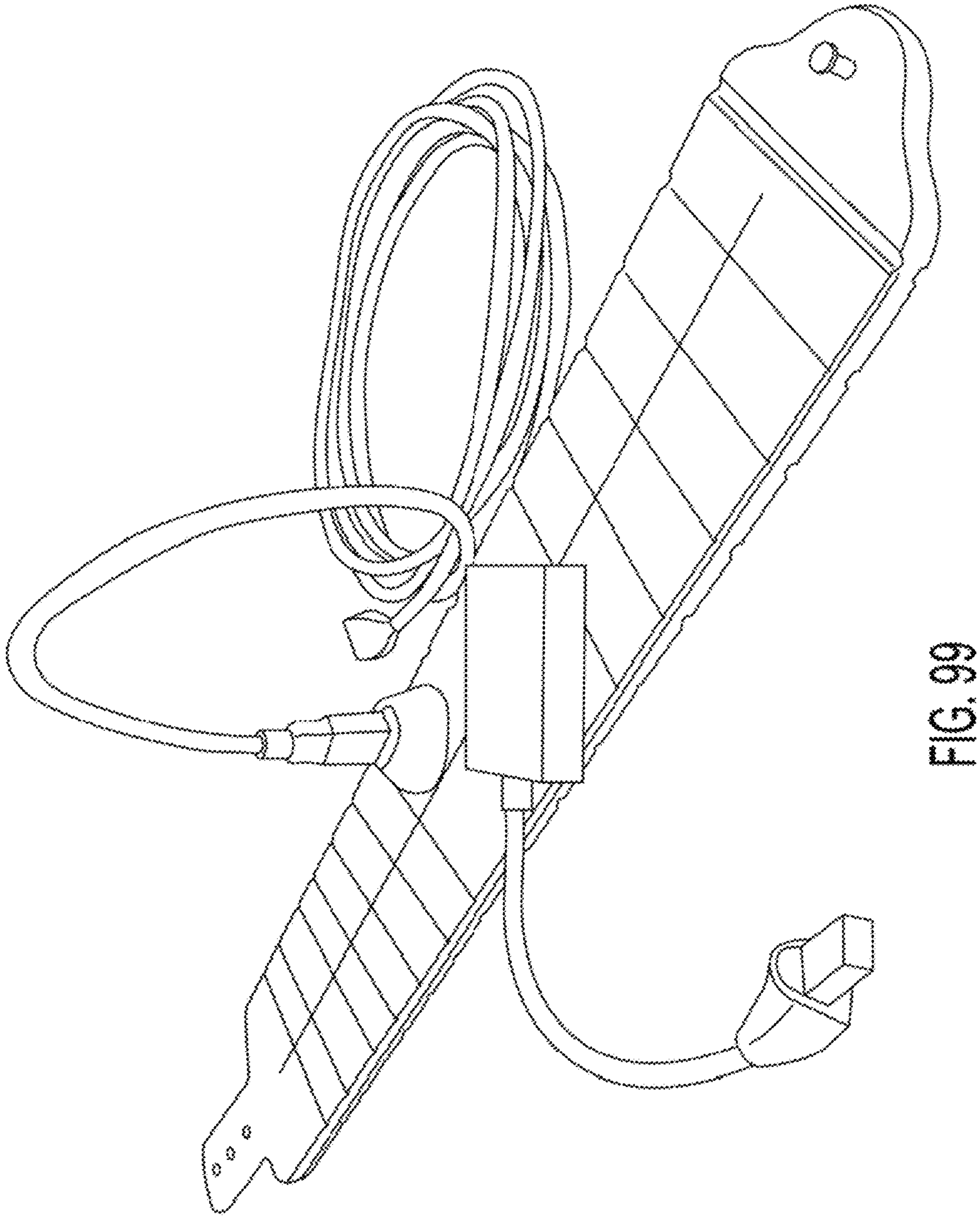

FIG. 99 is a perspective photograph of a LightPad belt and associated cable.

Figure 100:
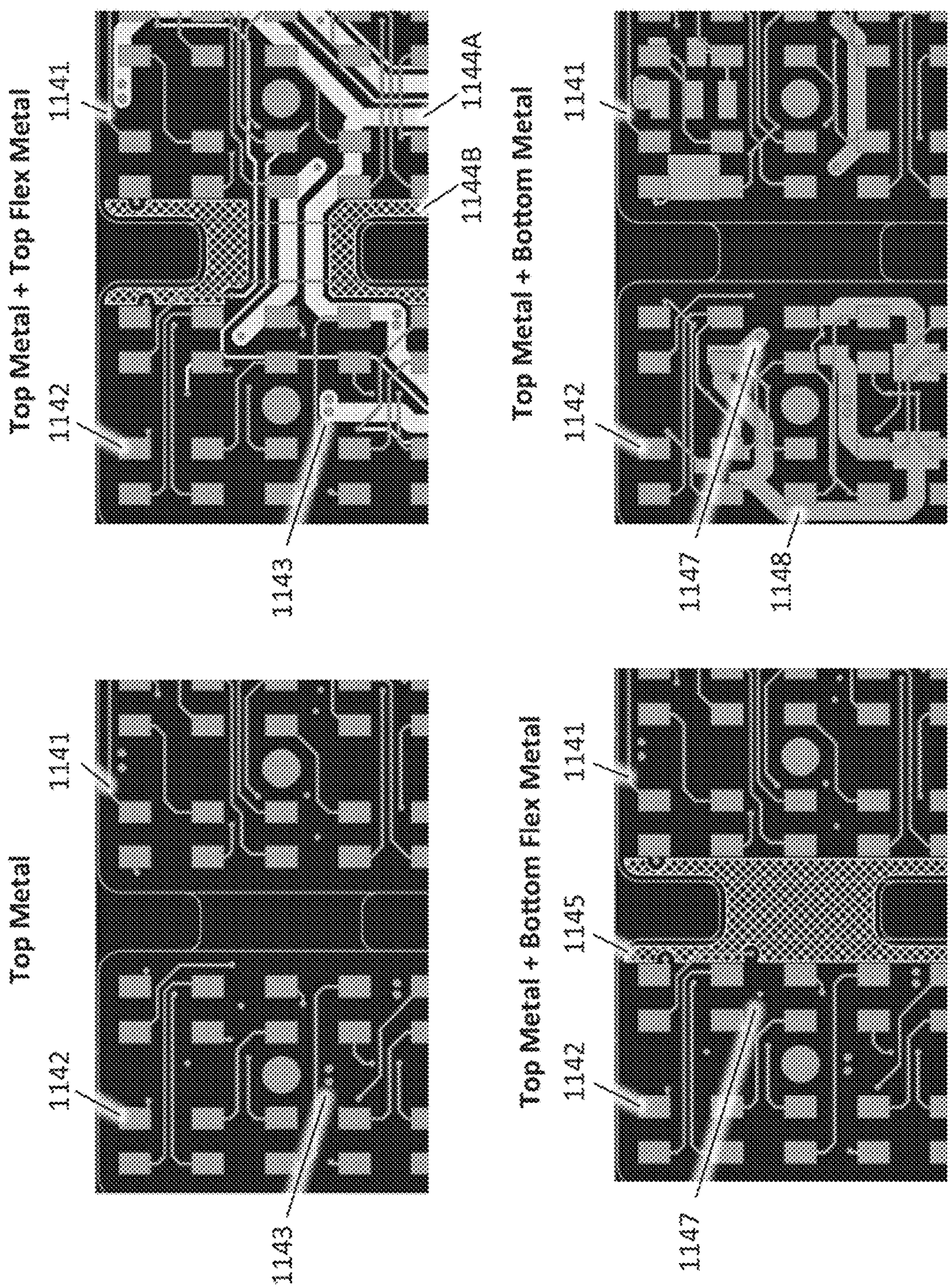

FIG. 100 comprises top views of metal layers in a distributed rigid-flex PCB design.

Figure 101A:
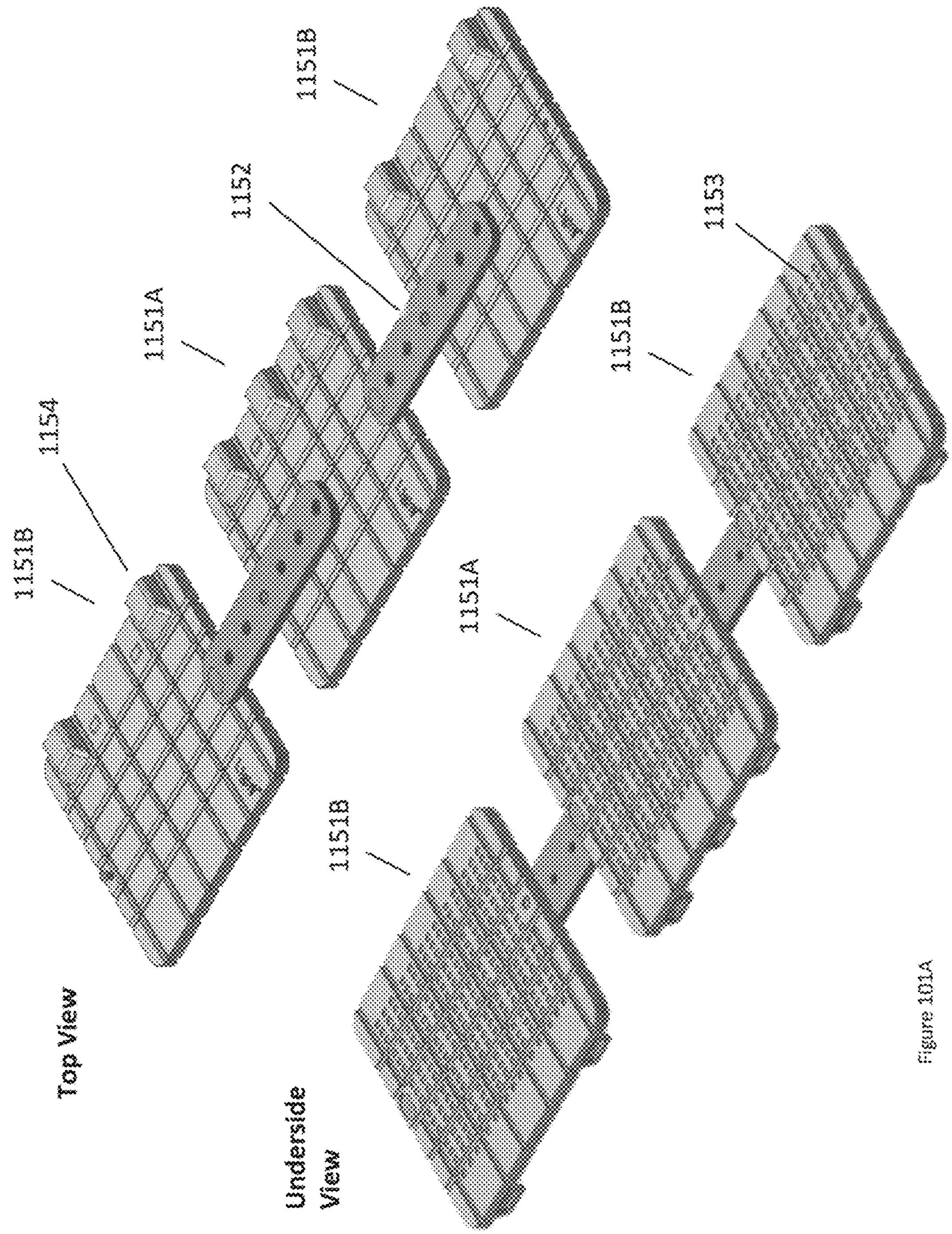

FIG. 101A comprises perspective views of reconfigurable LightPads.

FIG. 101B comprises top, bottom and side views of a reconfigurable LightPad.

Figure 102:
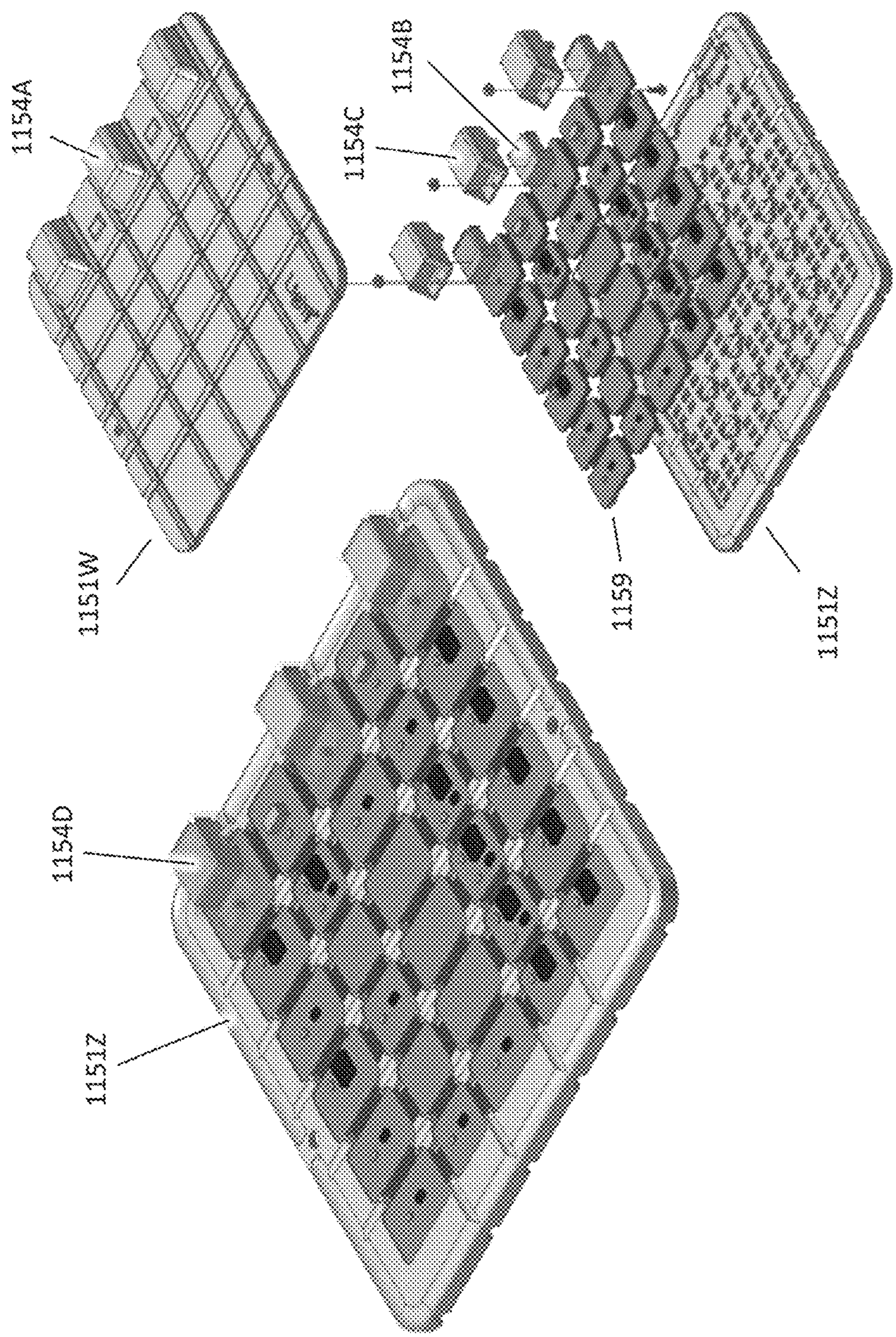

FIG. 102 is a perspective view and explosion diagram of a reconfigurable LightPad design.

Figure 103A:
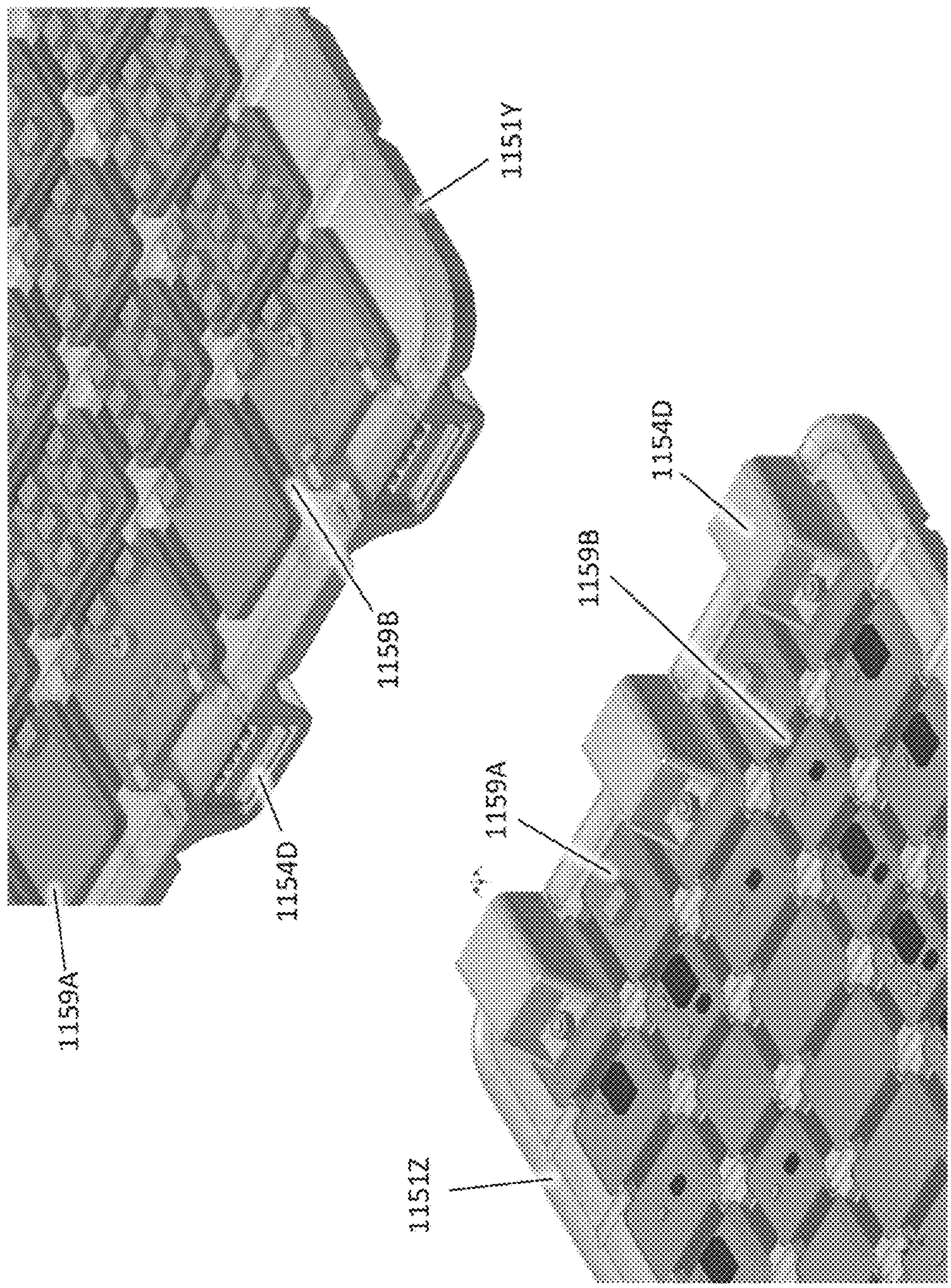

FIG. 103A comprises various perspective views of distributed rigid-flex PCB in a reconfigurable LightPad design.

Figure 103B:
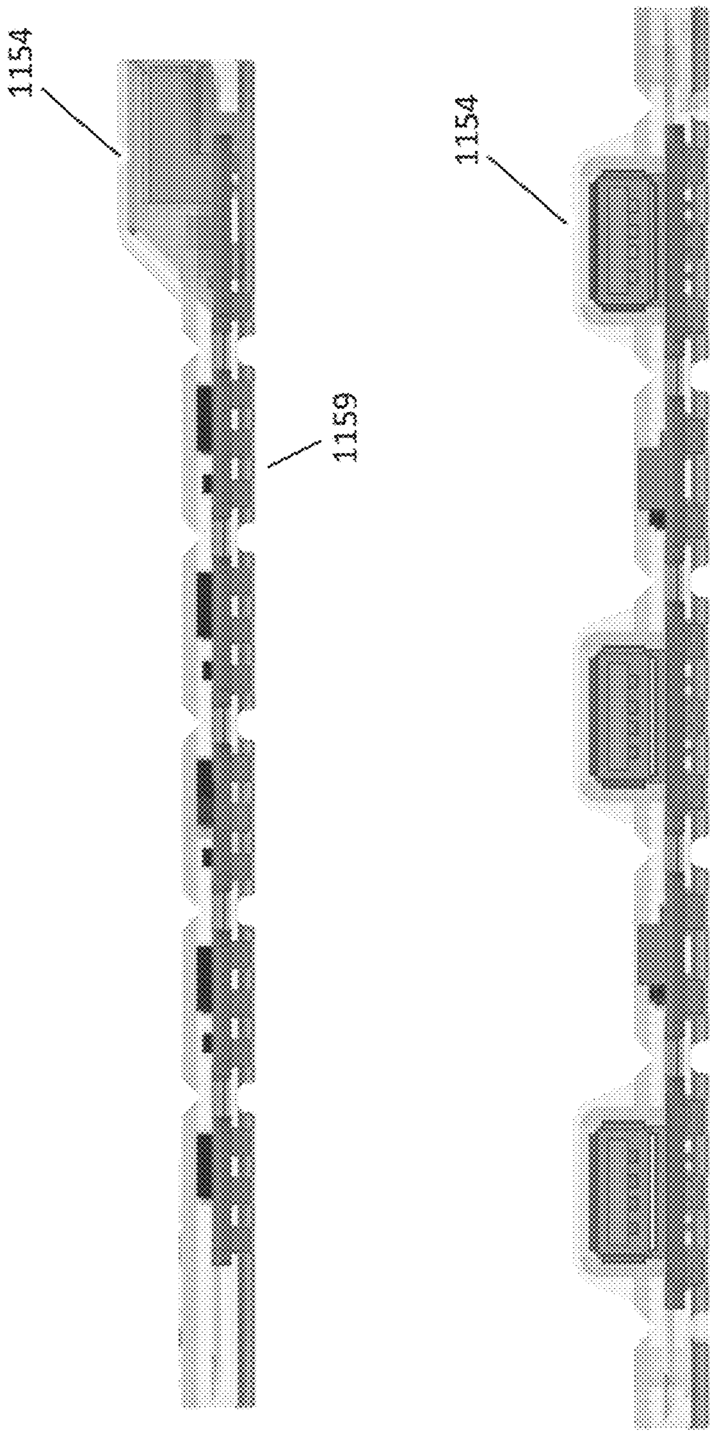

FIG. 103B comprises various edge views of distributed rigid-flex PCB in a reconfigurable LightPad design.

Figure 104:
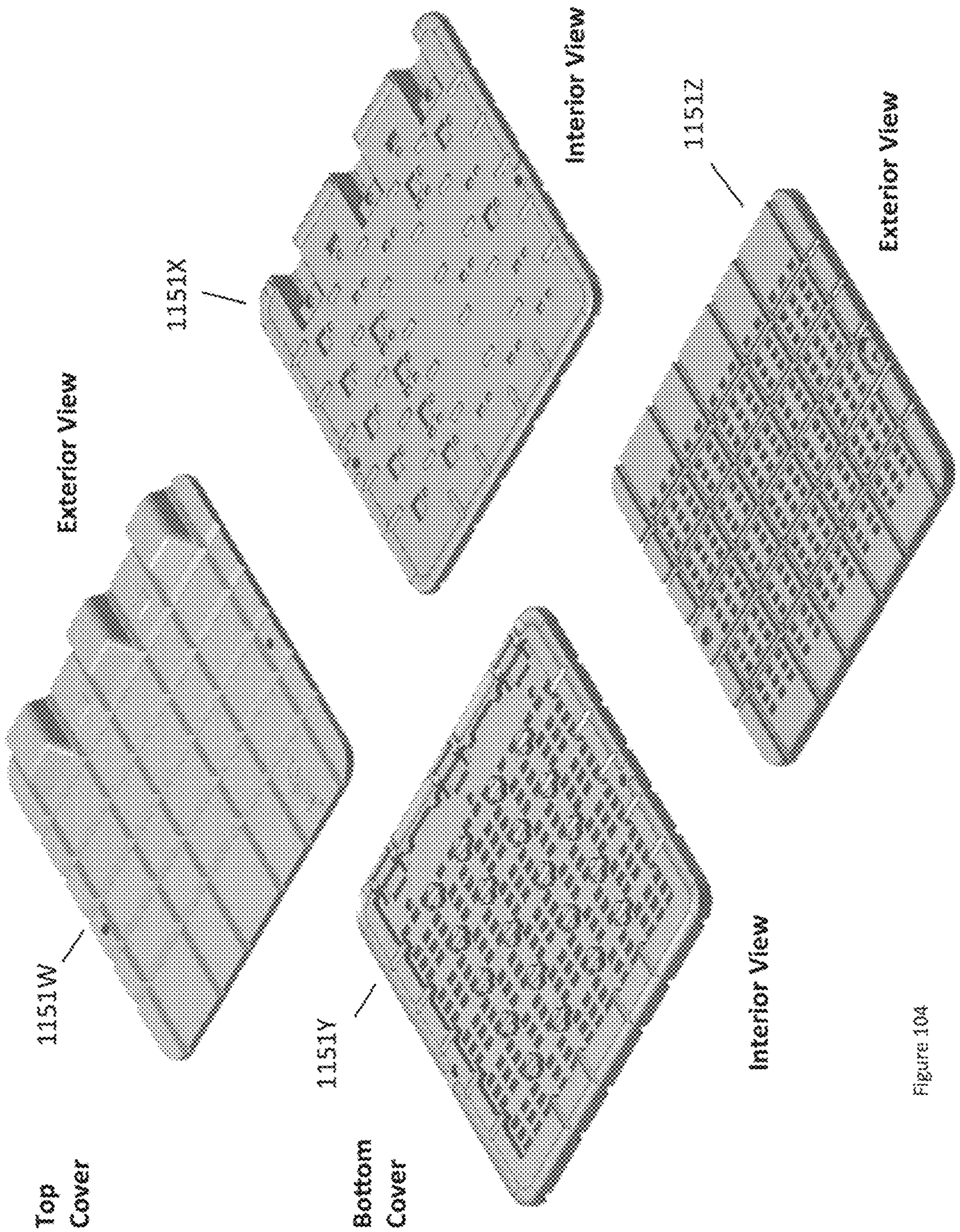

FIG. 104 comprises top and bottom covers in a reconfigurable LightPad design.

Figure 105:
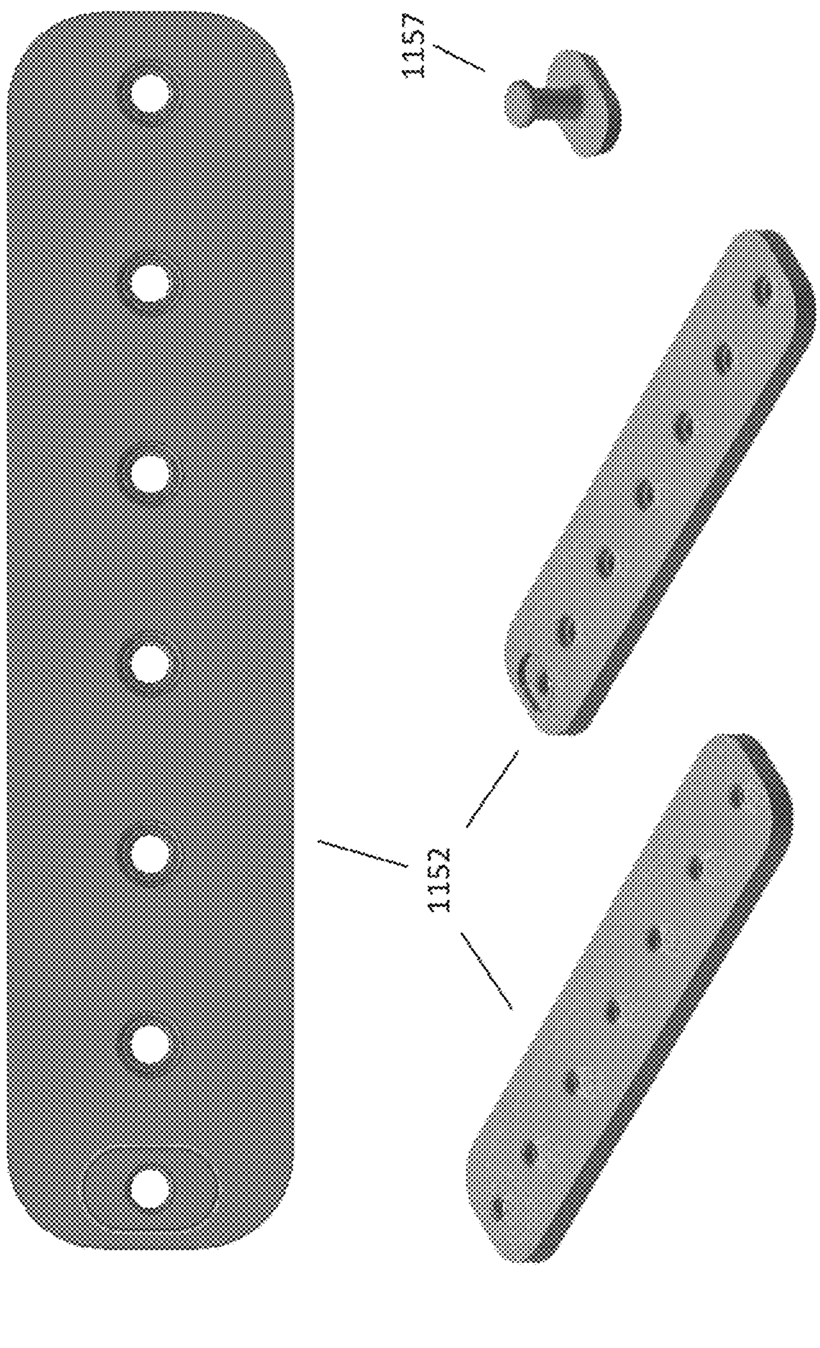

FIG. 105 comprises a polymeric adjustable strap for a reconfigurable LightPad design.

Figure 106A:
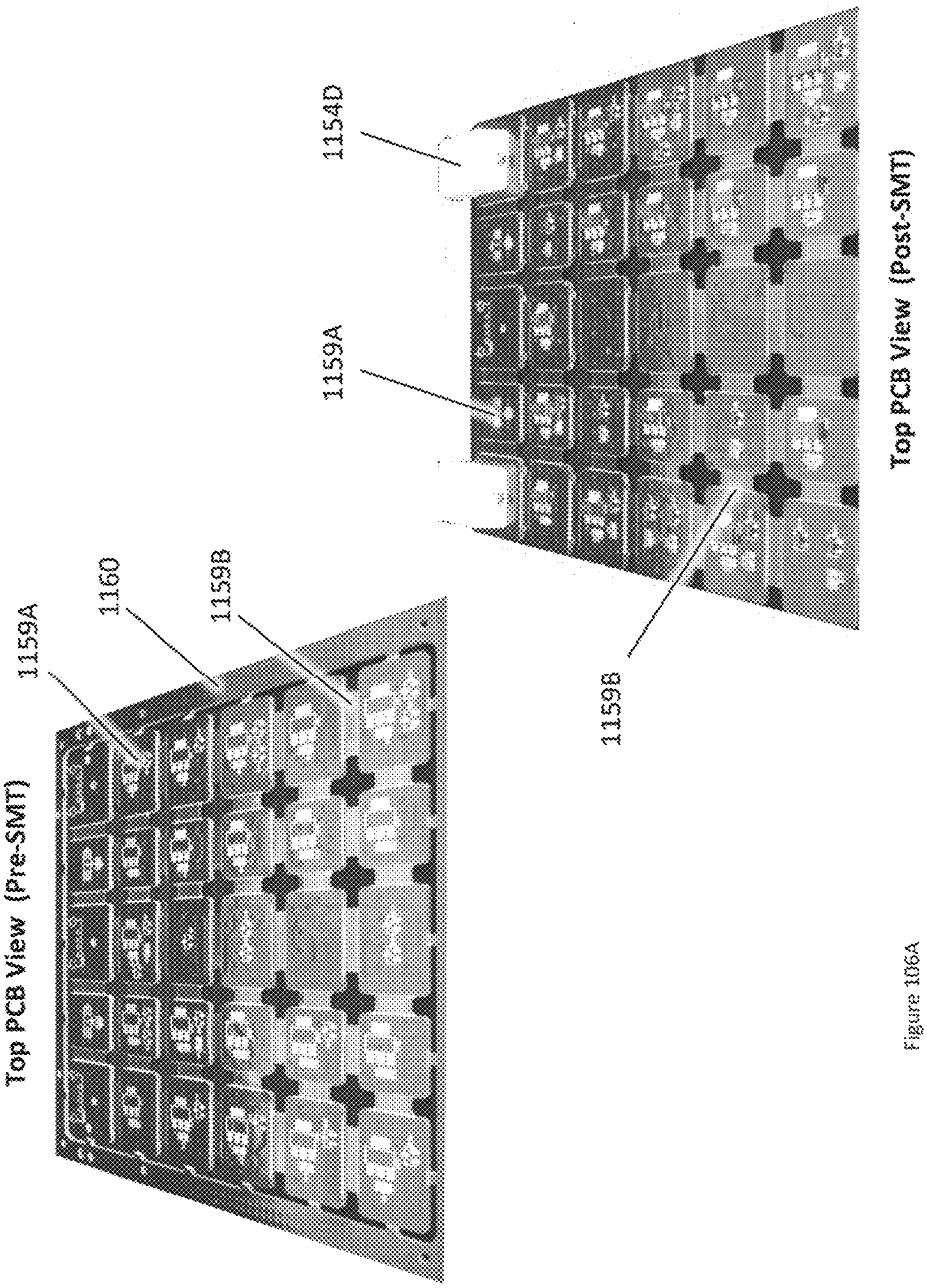

FIG. 106A comprises top view photographs of distributed rigid-flex PCBs of a reconfigurable LightPad design.

Figure 106B:
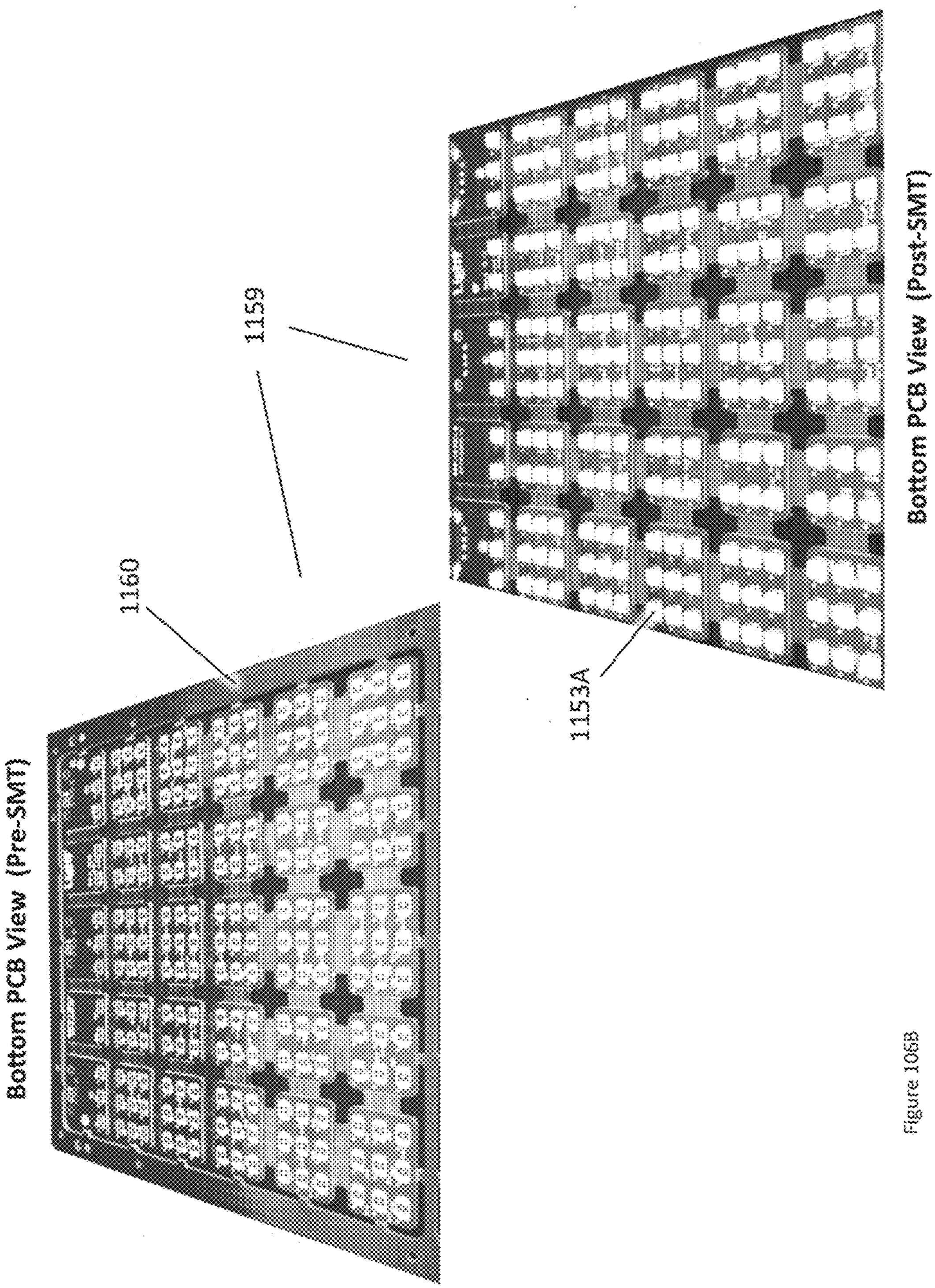

FIG. 106B comprises bottom view photographs of distributed rigid-flex PCBs of a reconfigurable LightPad design.

Figure 107:
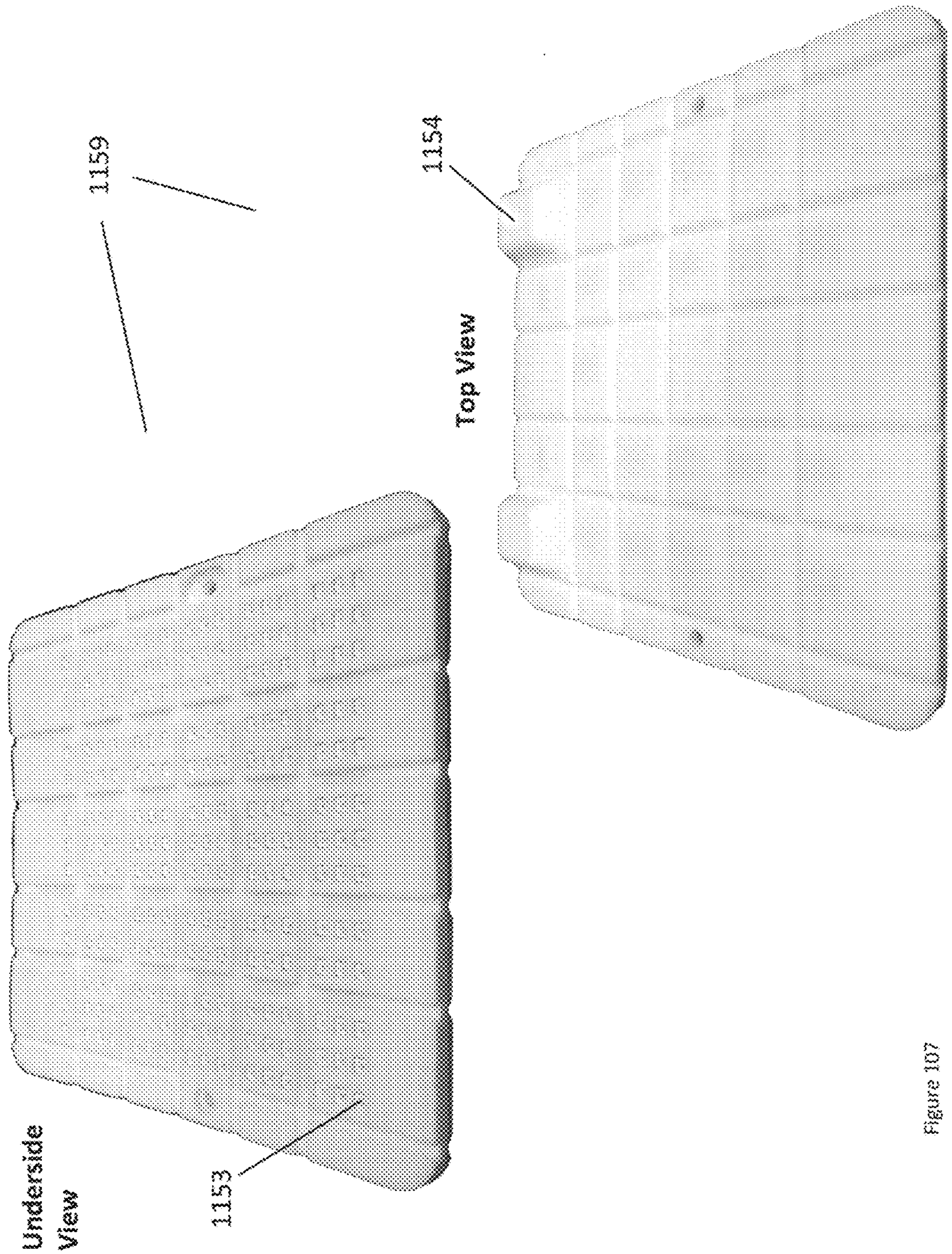

FIG. 107 comprises photographs of a reconfigurable LightPad in perspective.

Figure 108:
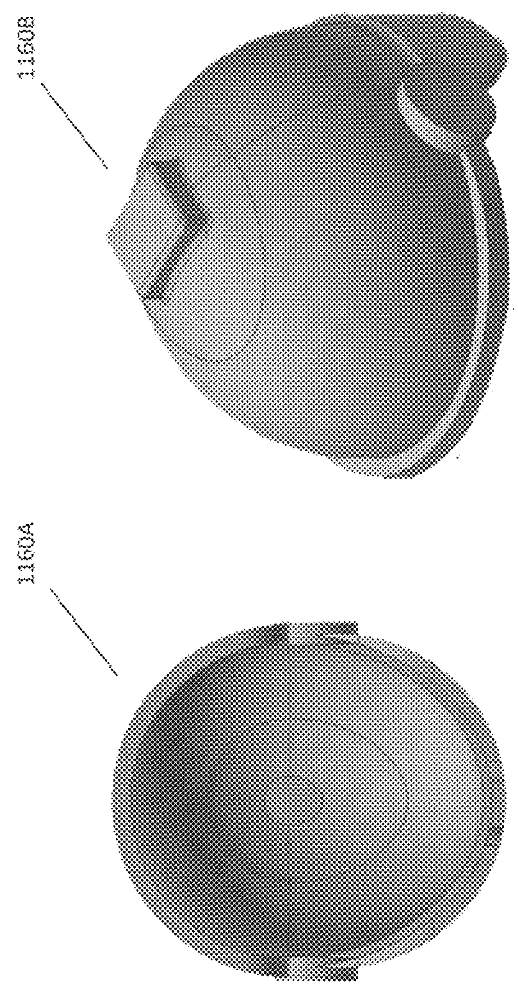
Figure 108:
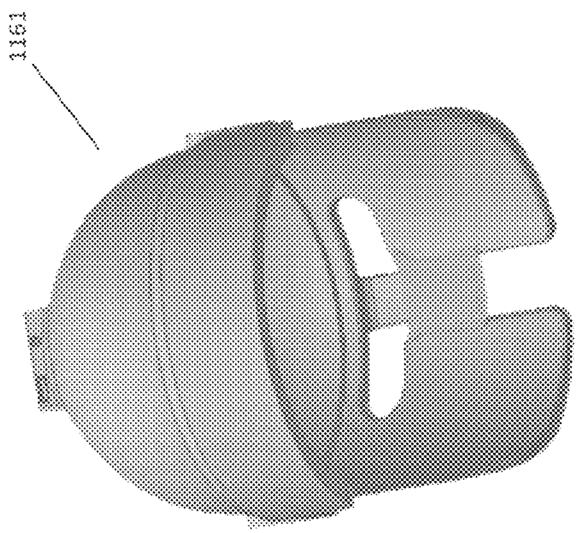

FIG. 108 comprises various perspective views of a cranial cap LightPad cover.

FIG. 109 comprises various perspective views of a face-mask LightPad cover.

Figure 110:
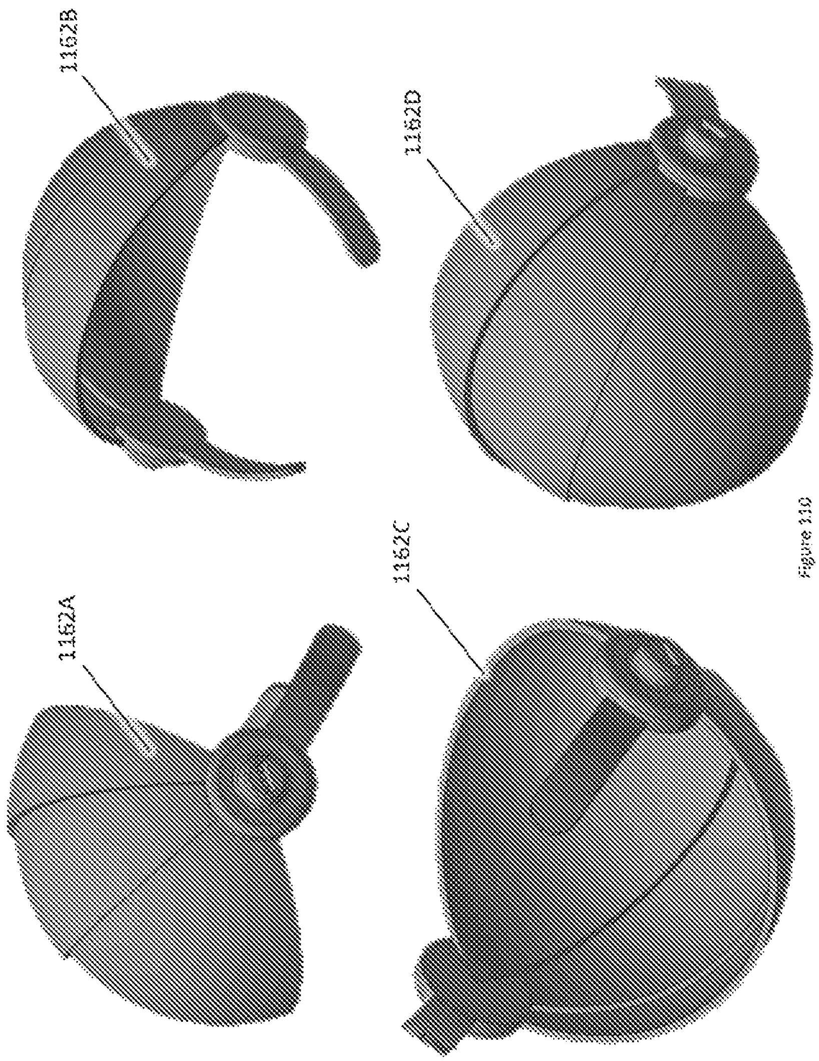

FIG. 110 comprises various perspective views of a knee-pad cup-shaped LightPad cover.

DESCRIPTION OF THE INVENTION

As described previously, realizing electronic circuits and systems generally involves mounting and interconnecting electronic components on printed circuit boards or PCBs. Such PCBs comprise either rigid PCBs that cannot bend or change shape, flex type PCBs that can flex or twist, or combinations thereof. In medical devices such as LED light pads used in phototherapy or in sports applications such wearable electronics or "wearables" all of the aforementioned technologies suffer from numerous disadvantages. Rigid PCBs break or crack if bent, components mounted on flex PCBs fall off from solder cracking after repeated flexing cycles, and hybrid rigid-flex PCBs tear or rip where the flex PCB connects to the rigid PCBs. Other methods to interconnect rigid PCBs using wire or connectors likewise result in partial or total electrical failure of the electronic system after repeated bending of the PCBs and their interconnections. In many cases breakage or moisture induced corrosion of even a single wire, PCB trace, or solder joint can impede or completely disable a circuit's operation.

In this invention, a new and inventive PCB technology tolerant to damage and use is disclosed, including its design and fabrication methods. The new PCB technology and corresponding system design methodology offers numerous benefits not available from today's designs or PCBs including combinations of the following features:

- Realizing three-dimensional bendable electronics able to survive a large number of flexing cycles without degradation or system failure
- Ability for realizing three-dimensional bendable electronics that curves or fits any shape or size, fixed or movable, and applicable for use in sports as wearable electronics and for use in conformal medical devices such as monitoring or phototherapy.
- Realizing an array of rigid PCBs able to contour to any 3D shape and electrically interconnected without the need for wires, cables, or connectors.
- Redundantly interconnecting an array of rigid PCBs whereby one or more electrical interconnections may break, i.e. fail as an open circuit, without causing an electronic circuit malfunction or system failure.
- Realizing bendable electronics resilient to mechanical damage from bending, twisting, or tearing.
- Realizing bendable electronics insensitive to moisture or corrosion damage.

In accordance with the forgoing objectives, a 3D bendable printed circuit board with redundant interconnections is disclosed.

Redundant Distributed Network

Figure 1:
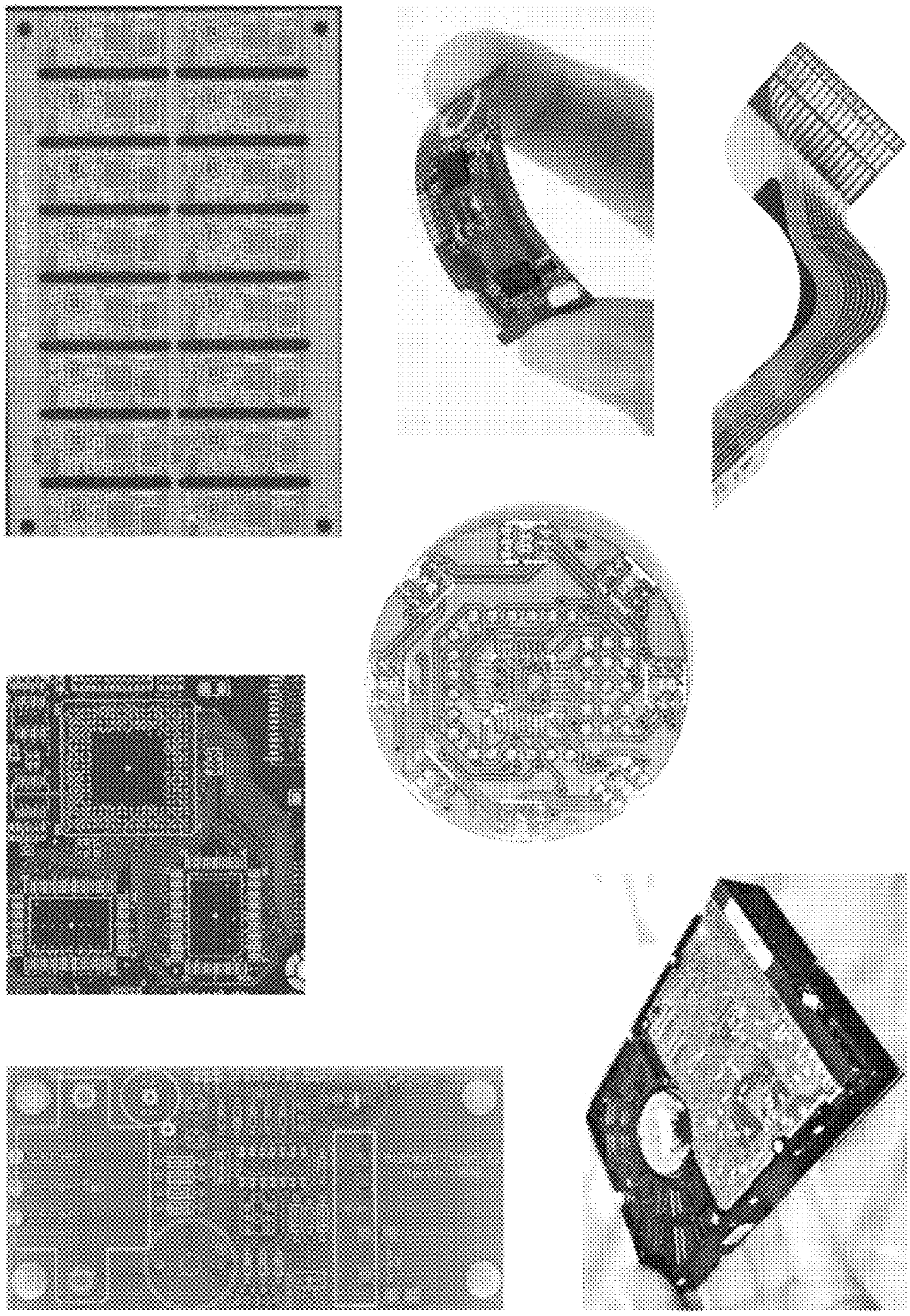
FIG. 1 contains photographs of various examples of PCBs used for circuitry and for interconnections.
Figure 2:
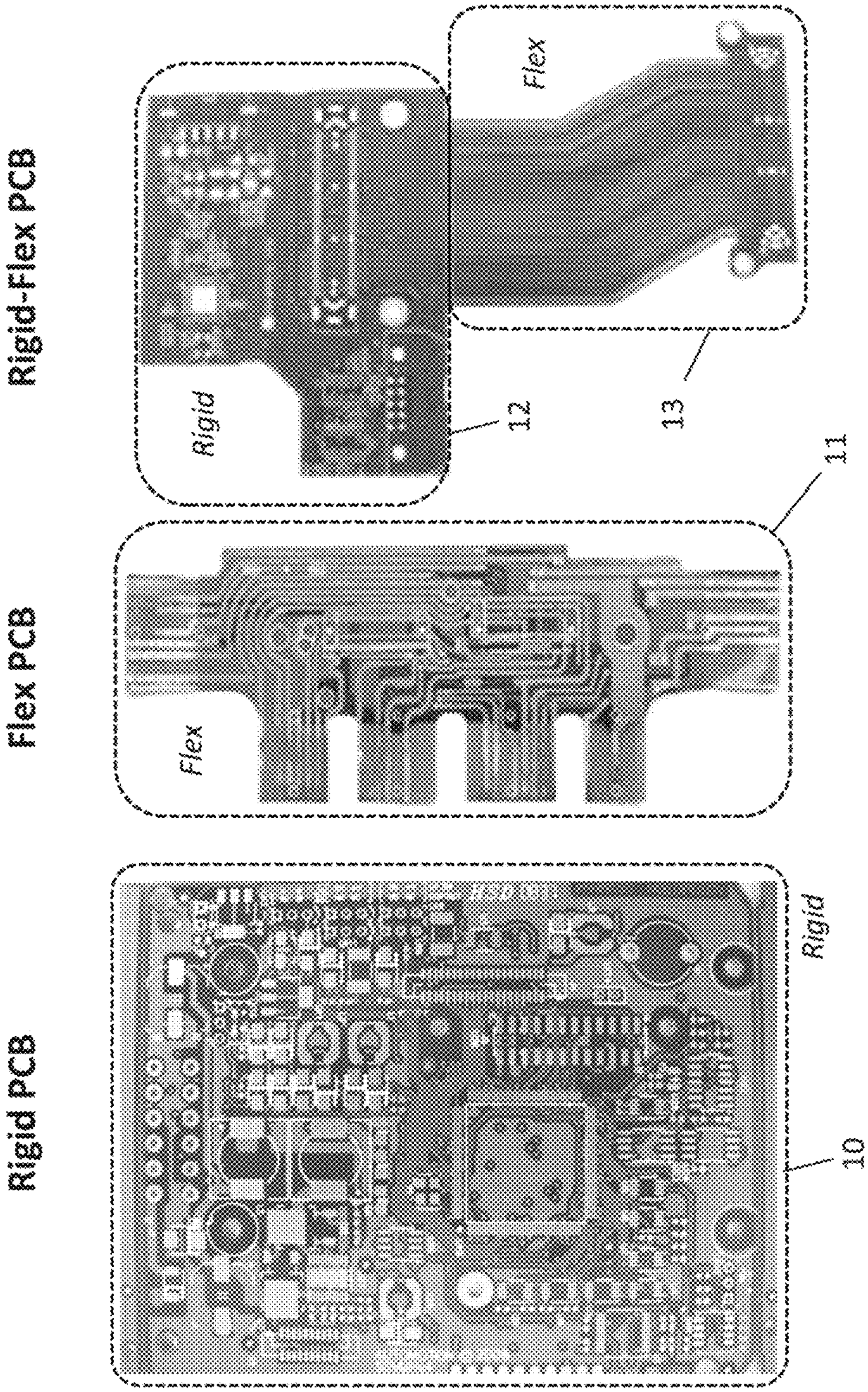
FIG. 2 is a top view illustrating examples of rigid, flex, and rigid-flex PCBs.
Figure 3:
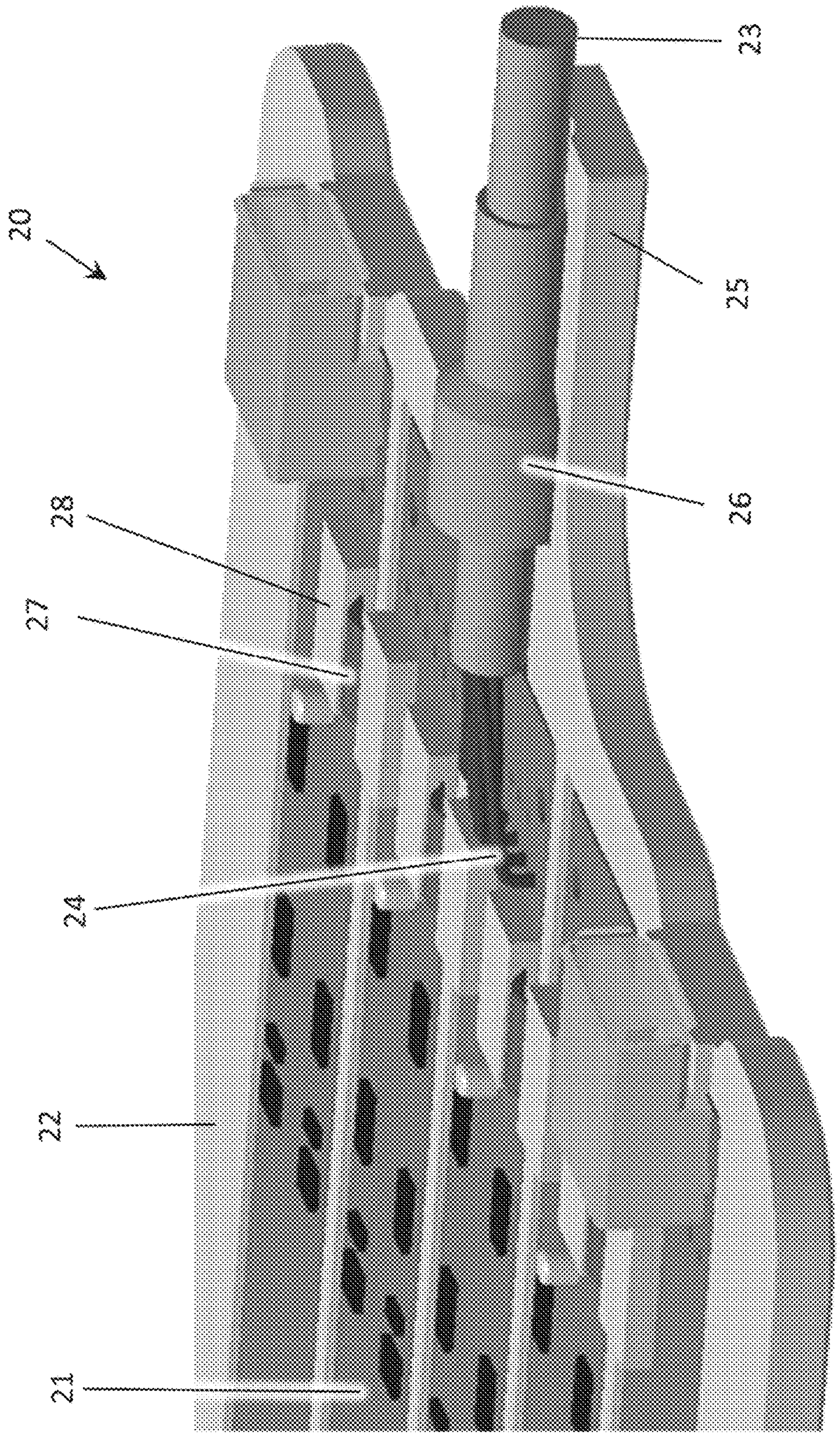
FIG. 3 is a perspective view of a flexible polymeric pad using in medical phototherapy containing rigid PCBs and their electrical interconnections.
Figure 4:
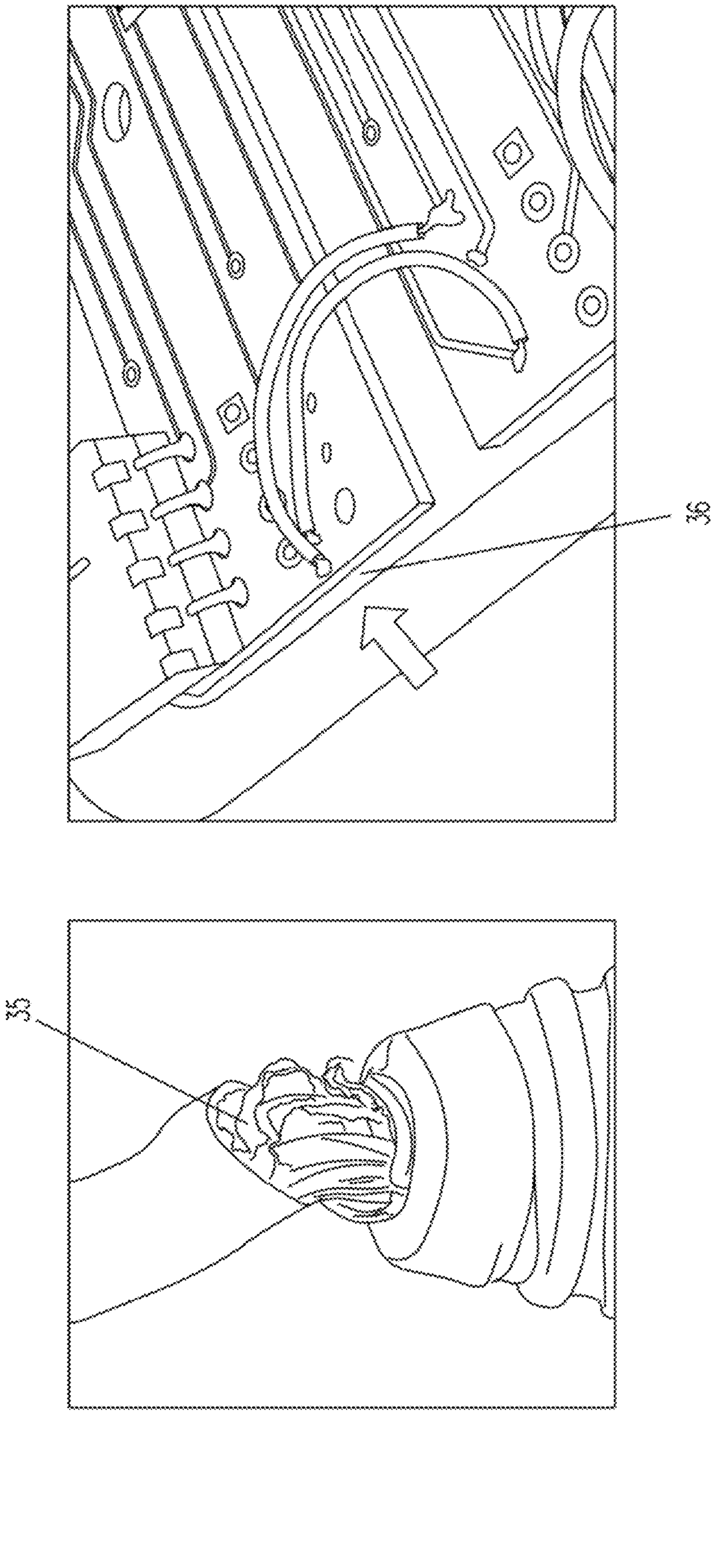
FIG. 4 is a collection of photographs illustrating wire breakage causing electronic circuit failure.
Figure 5:
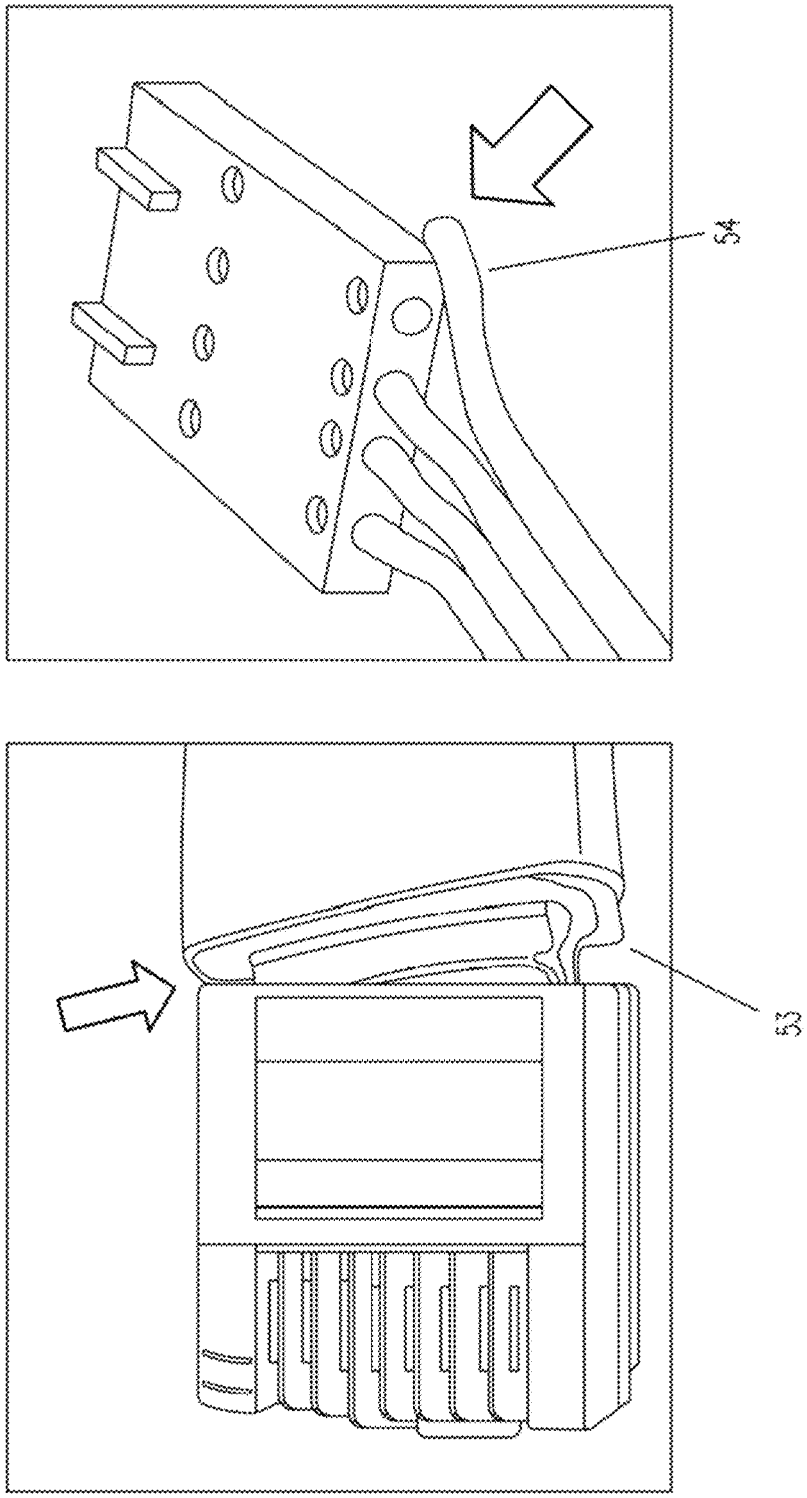
FIG. 5 contains photographs of cable connector plug failures.
Figure 6:
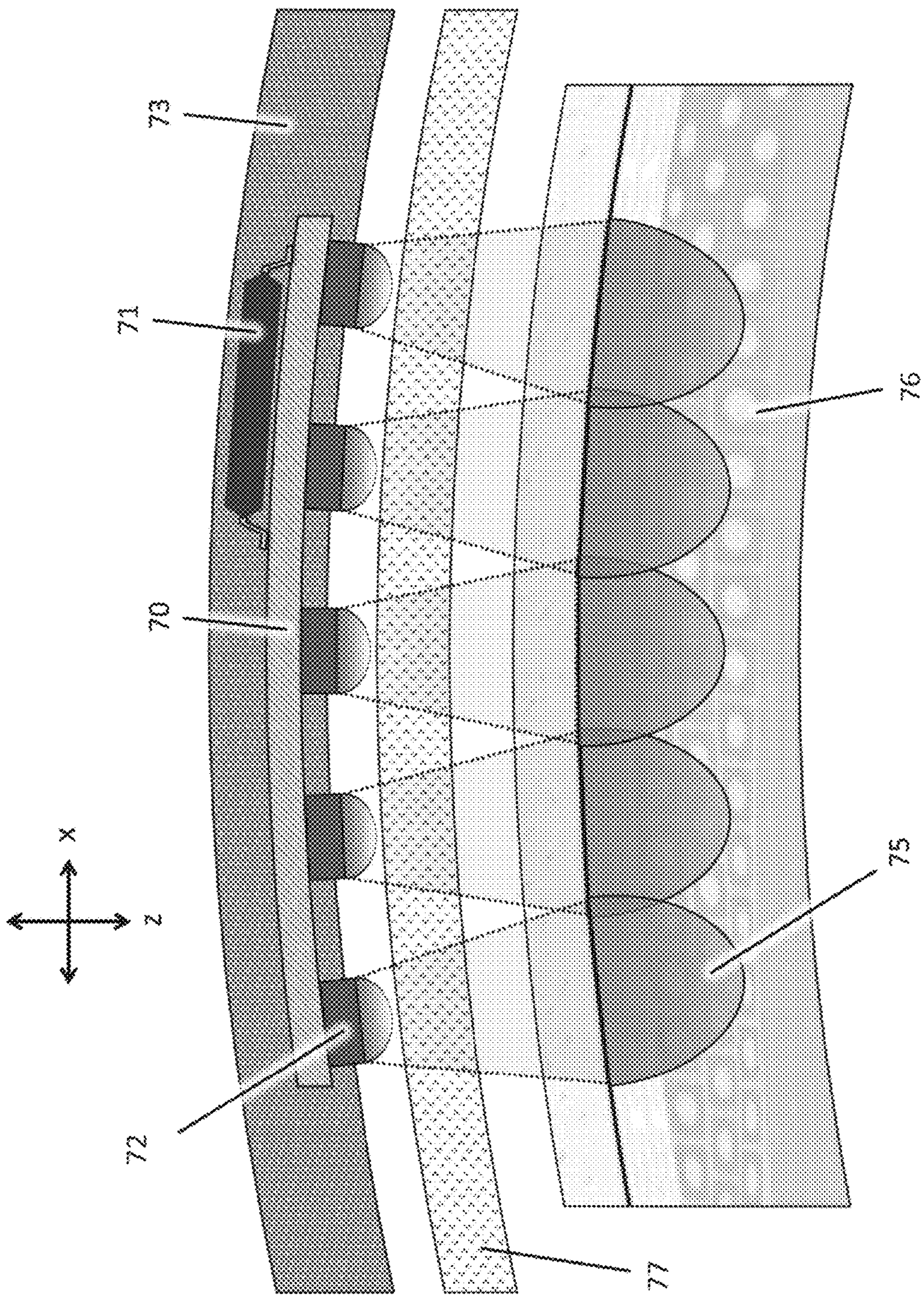
FIG. 6 is a schematic cross section of a bendable LED pad used in medical phototherapy bent to conform to living tissue.
Figure 7A:
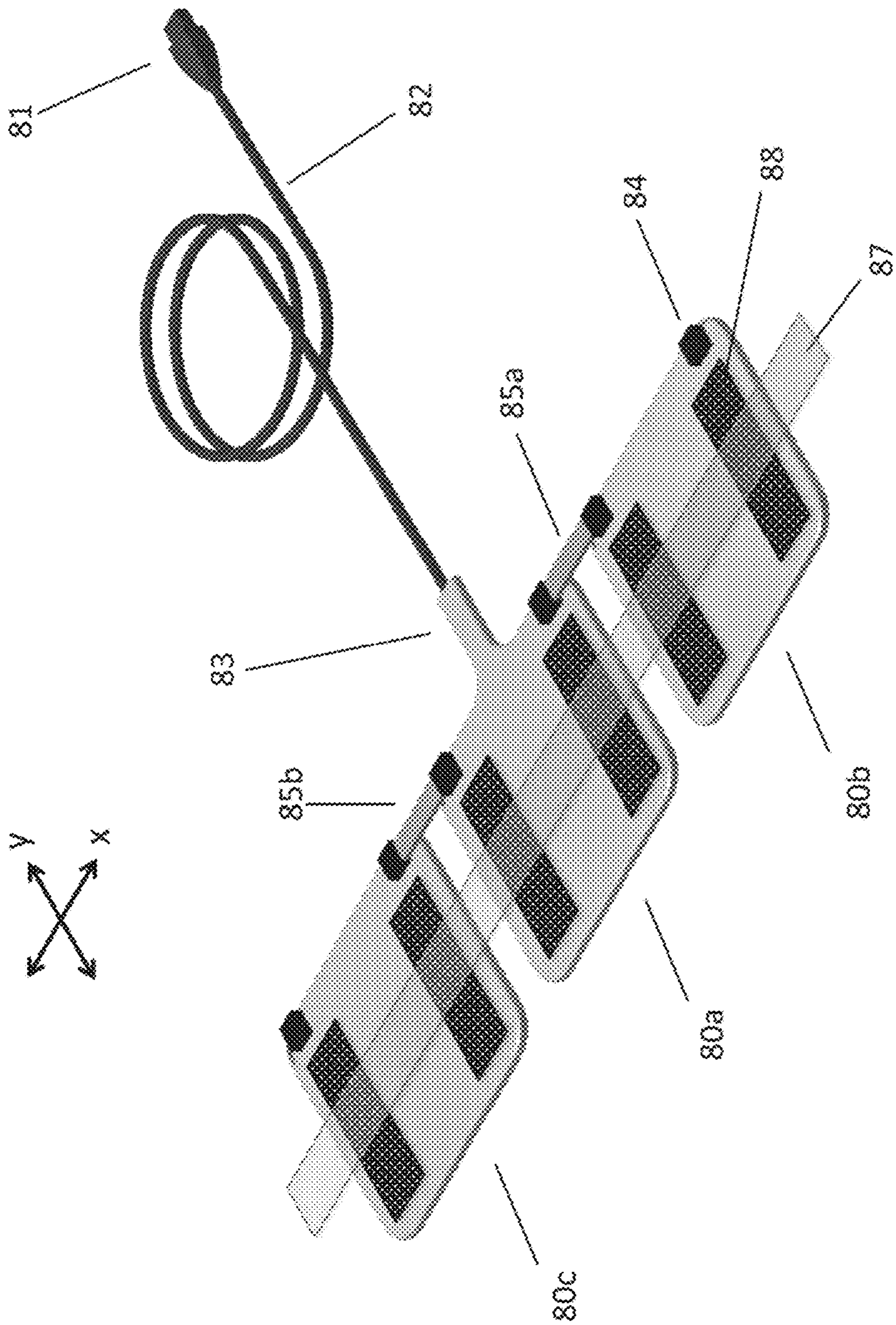
FIG. 7A is a perspective view of a set of three bendable LED pads used in medical phototherapy and their interconnections.
Figure 7B:
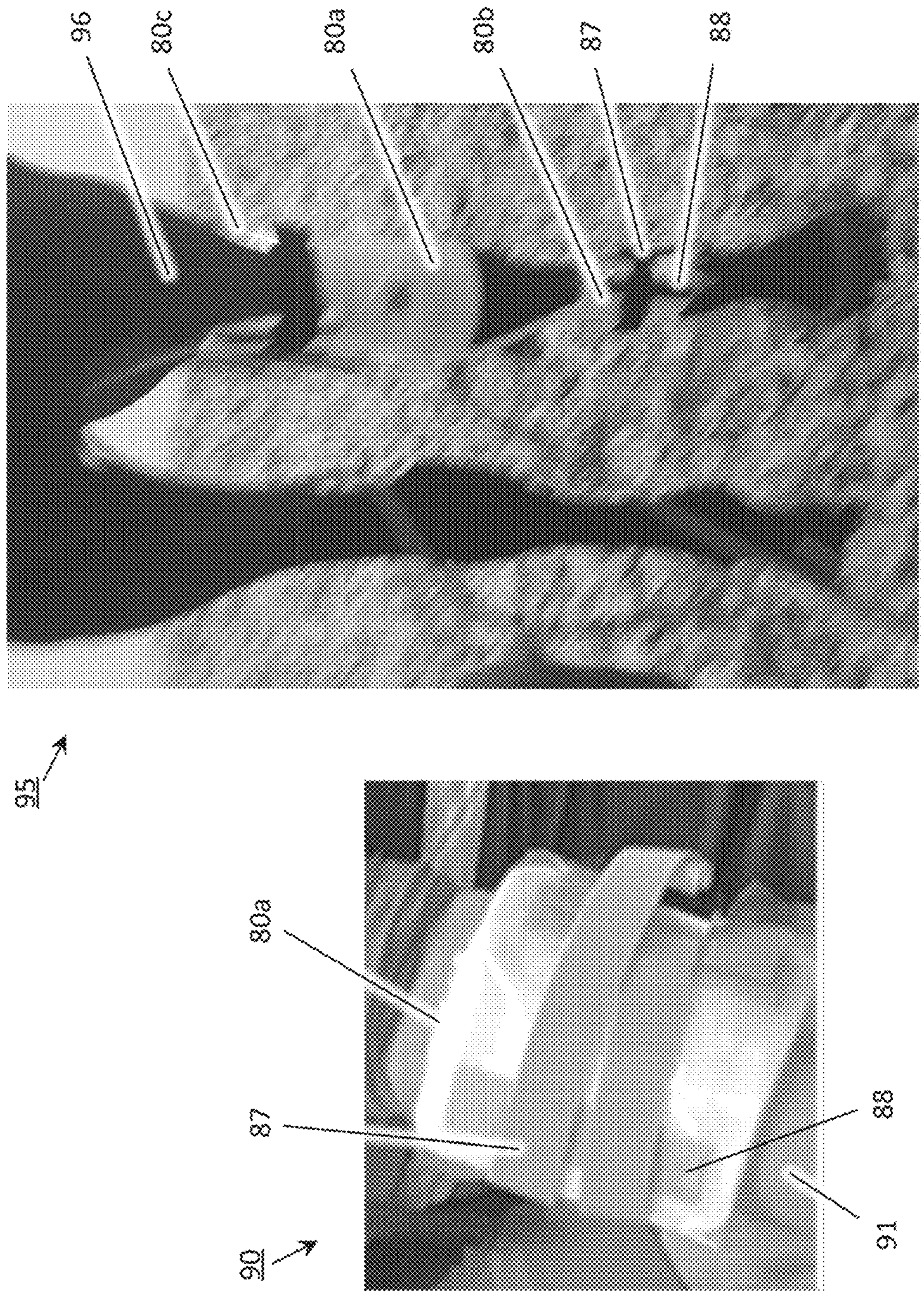
FIG. 7B contains photographs of bendable LED pads for medical phototherapy applied to the legs of humans and horses.
Figure 8A:
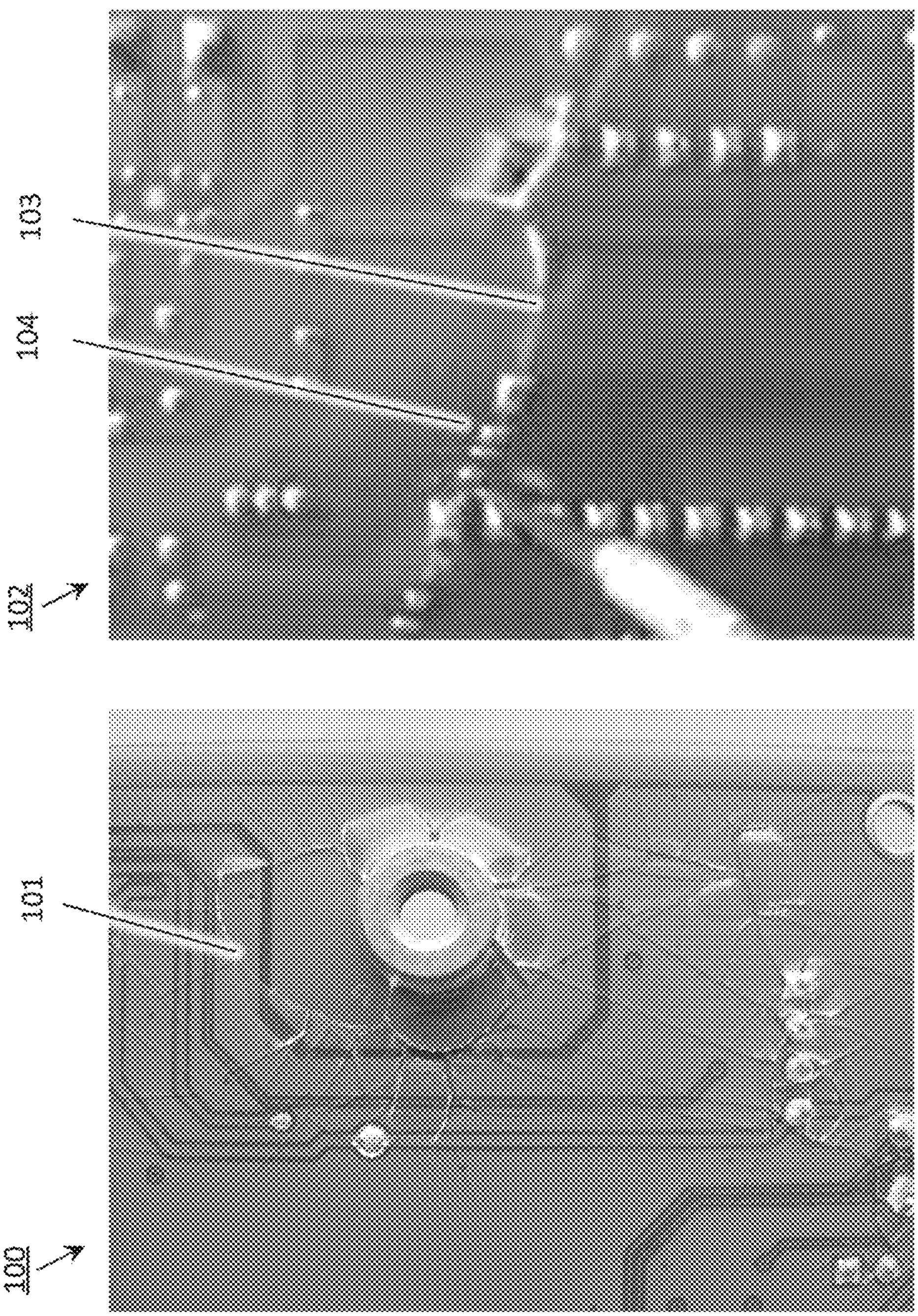
FIG. 8A contains photographs of rigid PCB cracking failures.
Figure 8B:
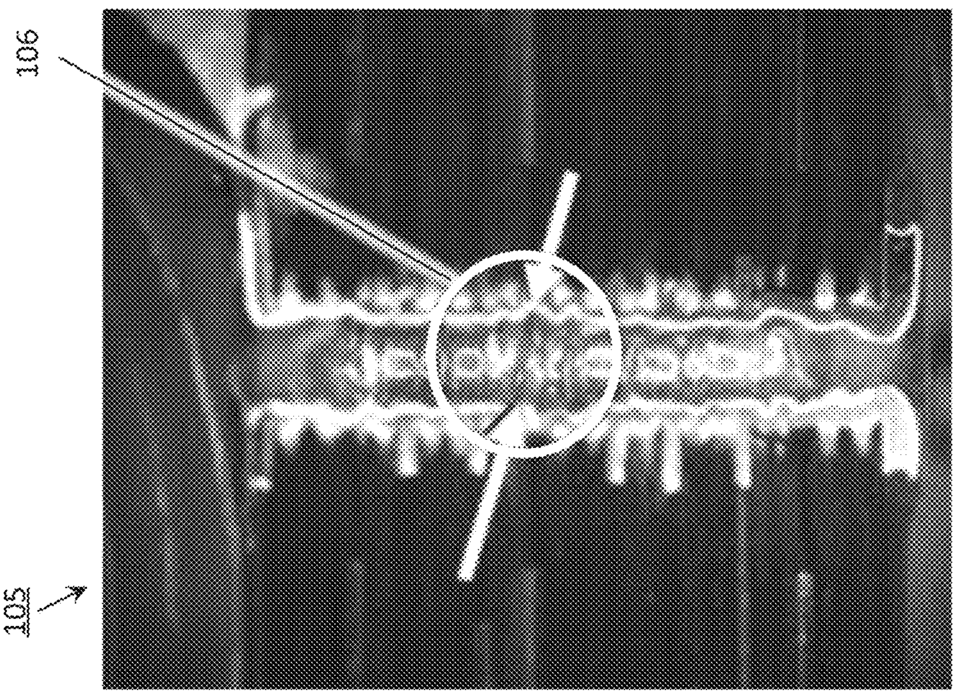
FIG. 8B contains a cross sectional photograph of a rigid PCB with a cracked via.
Figure 9:
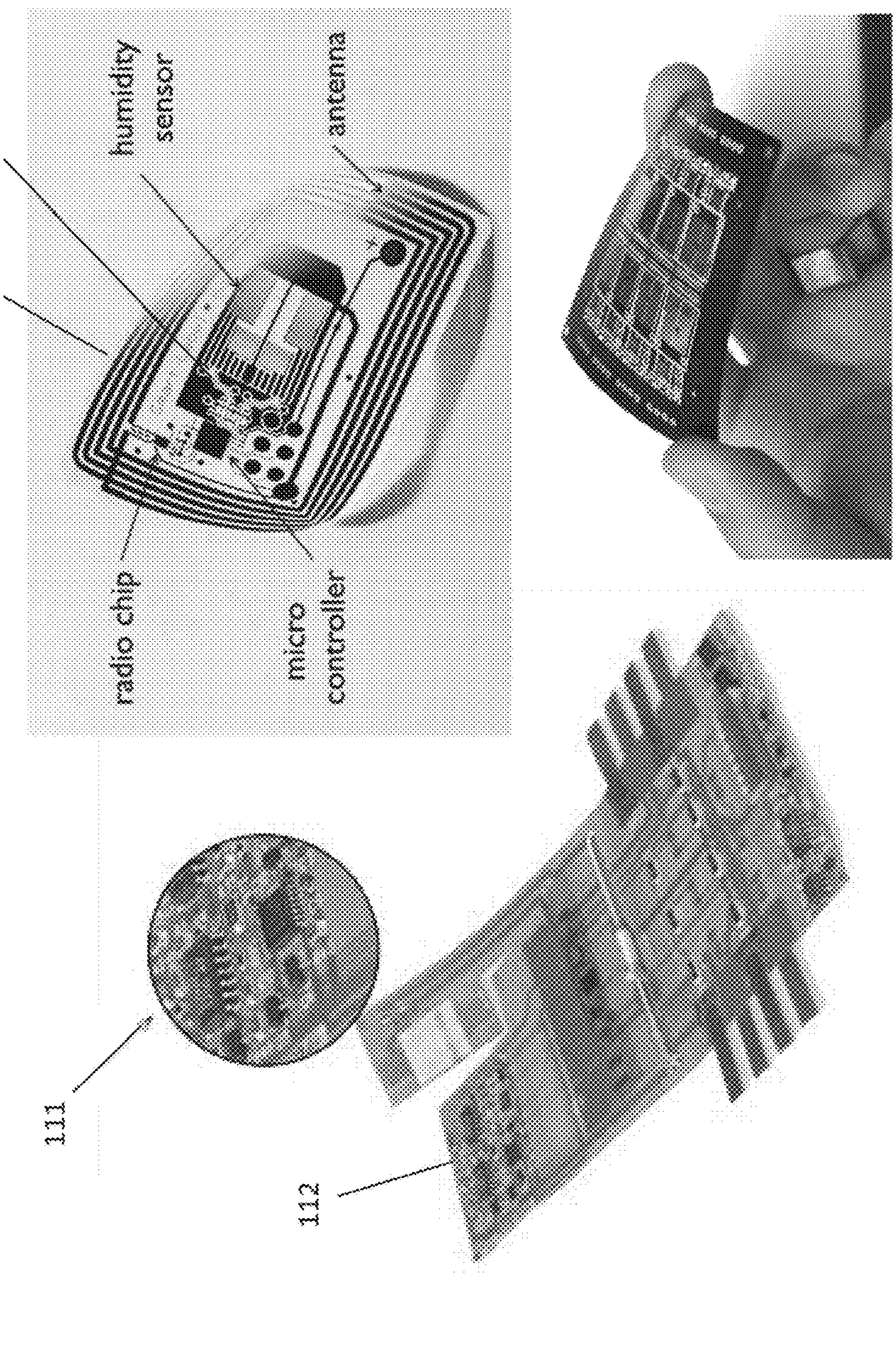
FIG. 9 illustrates photographic examples of flexible PCBs.
Figure 10A:
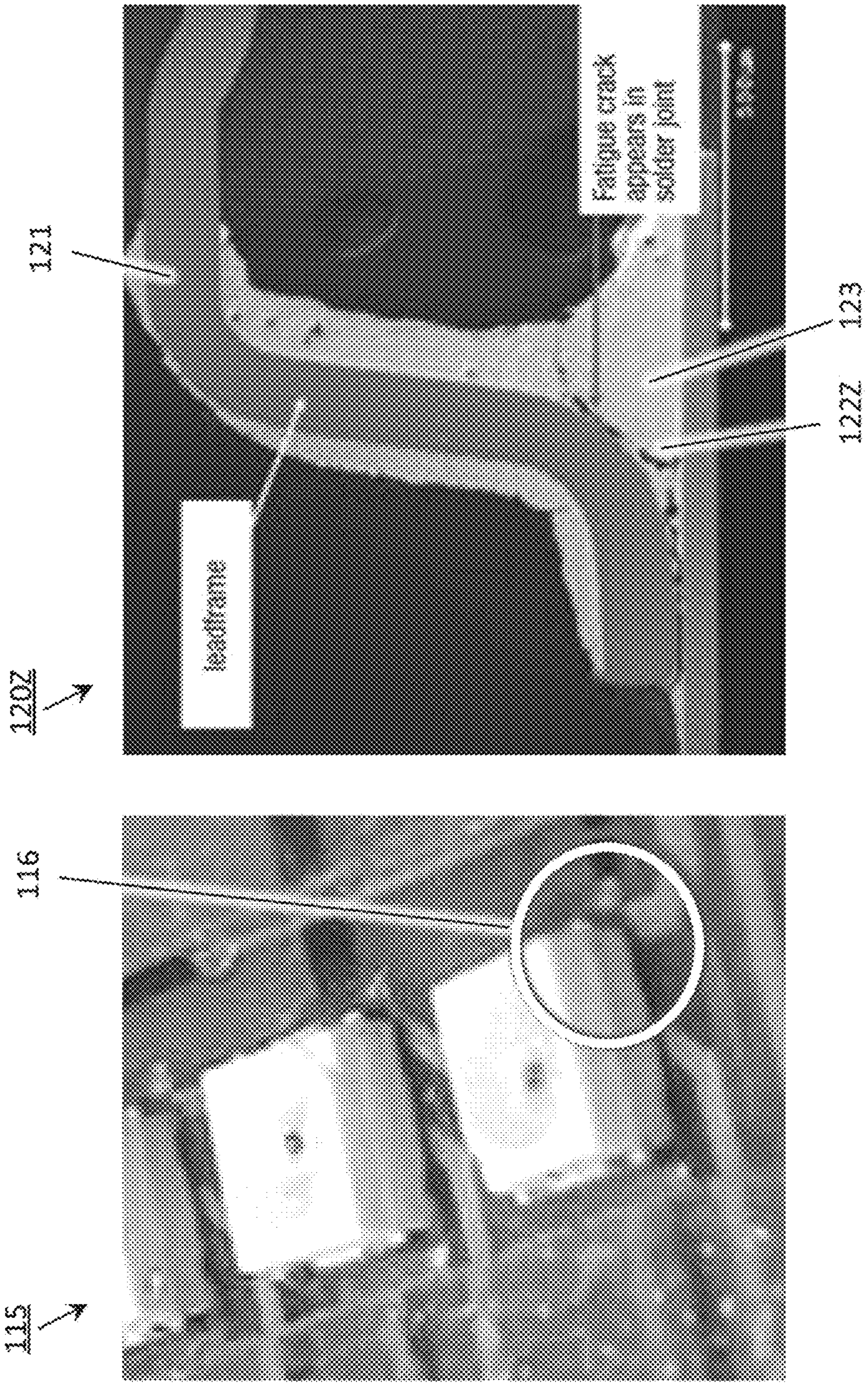
FIG. 10A contains photographs of components and leadframe with solder attach failures.
Figure 10B:
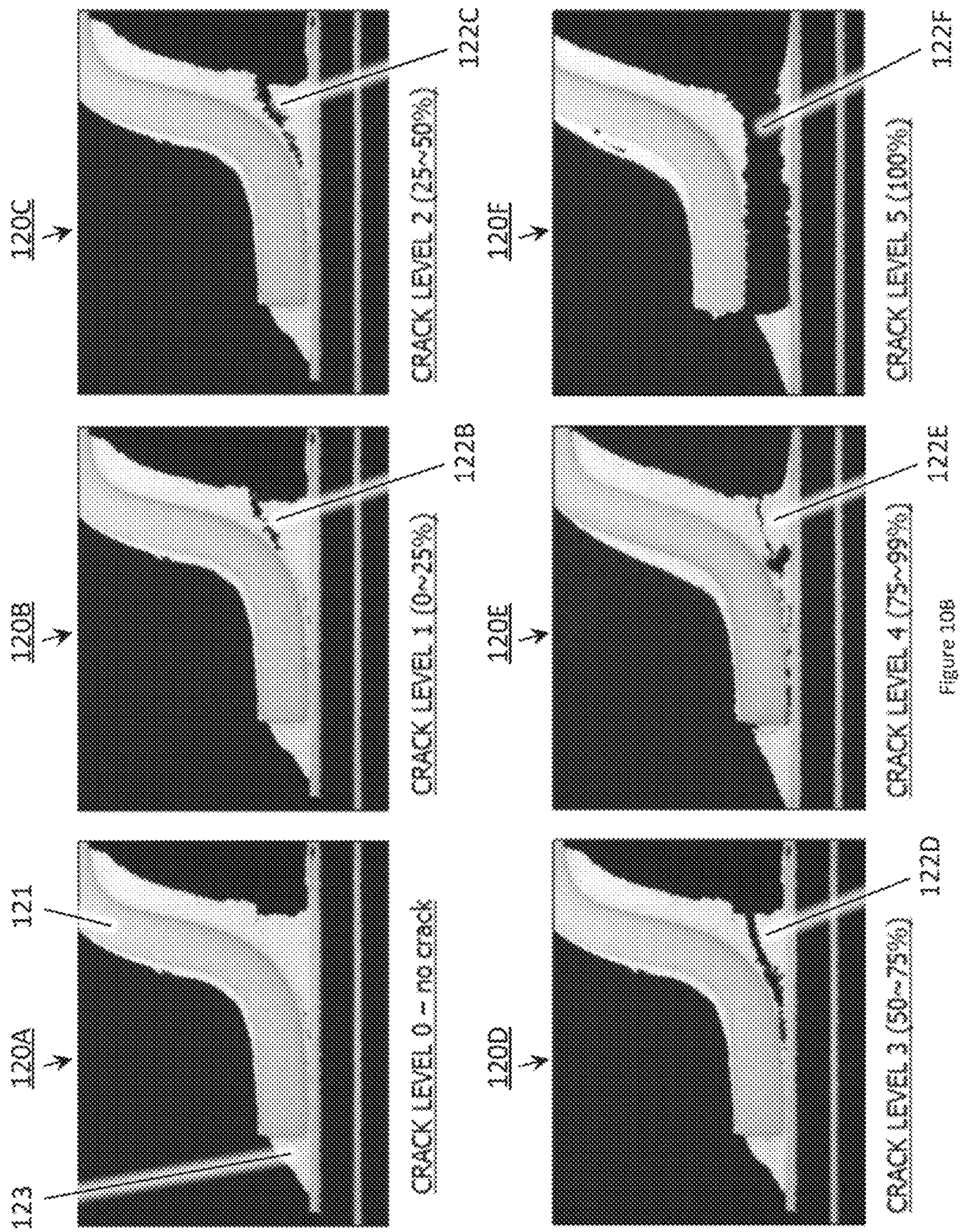
FIG. 10B contains photographs of leadframe to PCB solder connections with various degrees of solder cracking, FIG. 10C contains photographs of component mounting on PCBs showing solder and plastic cracking.
Figure 10C:
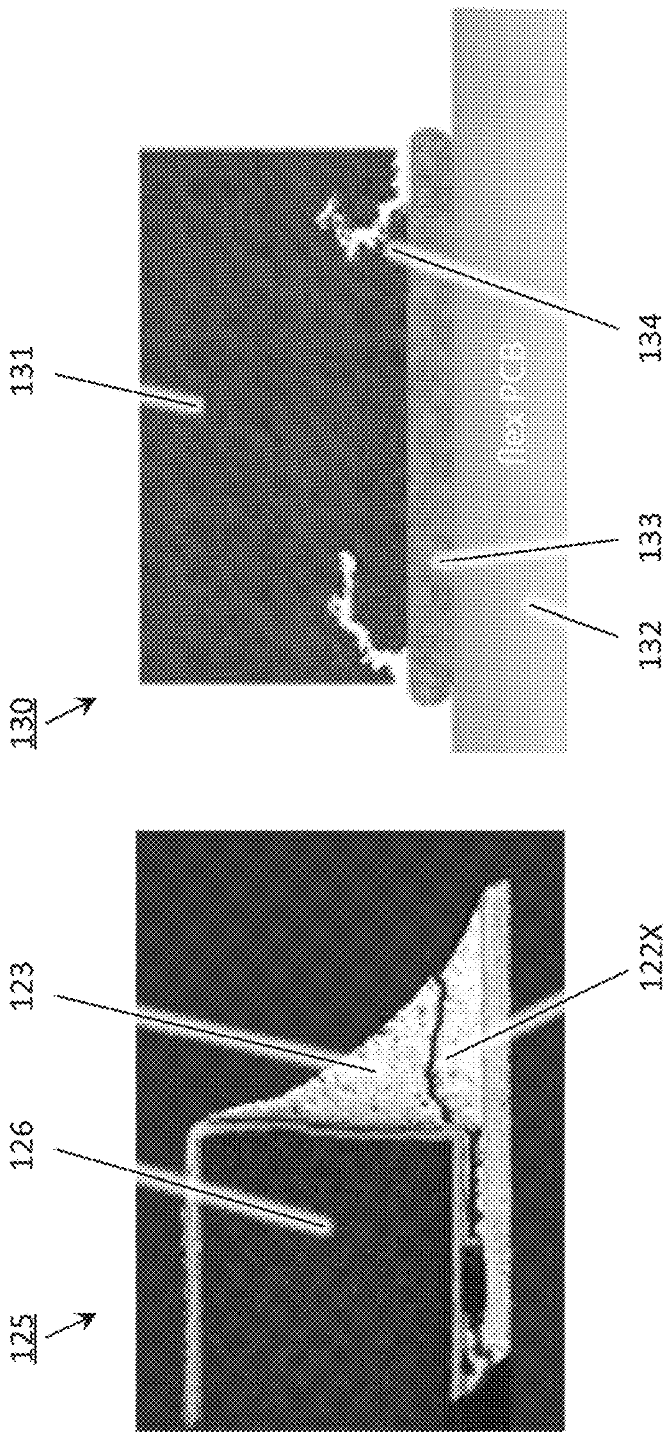
FIG. 10D contains photographs of component mounting on PCBs with lead cracking and solder ball cracking.
FIG. 10E is a schematic cross sectional representation of a component mounted on a PCBs with solder ball cracking.
Figure 10D:
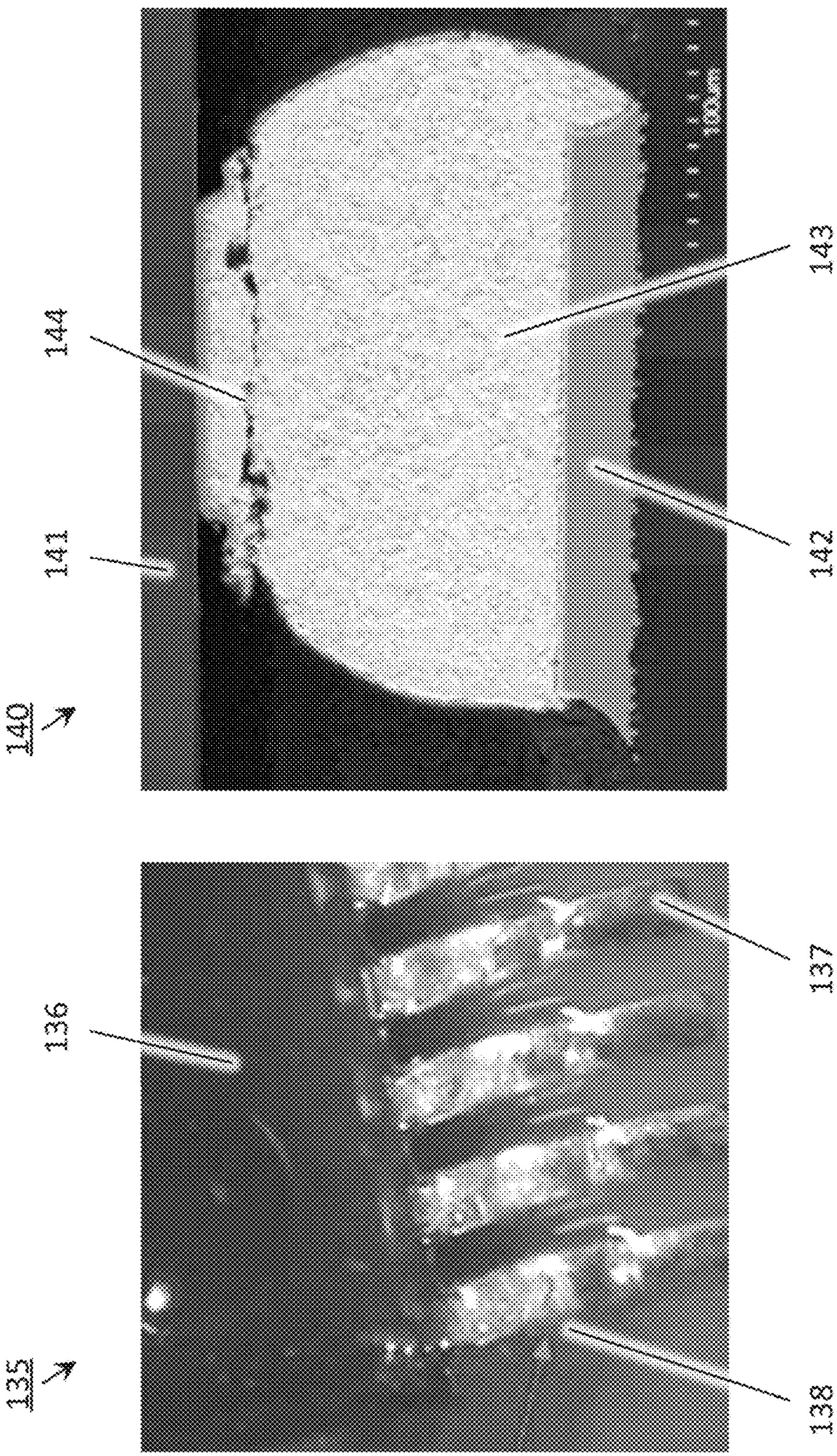
Figure 10E:
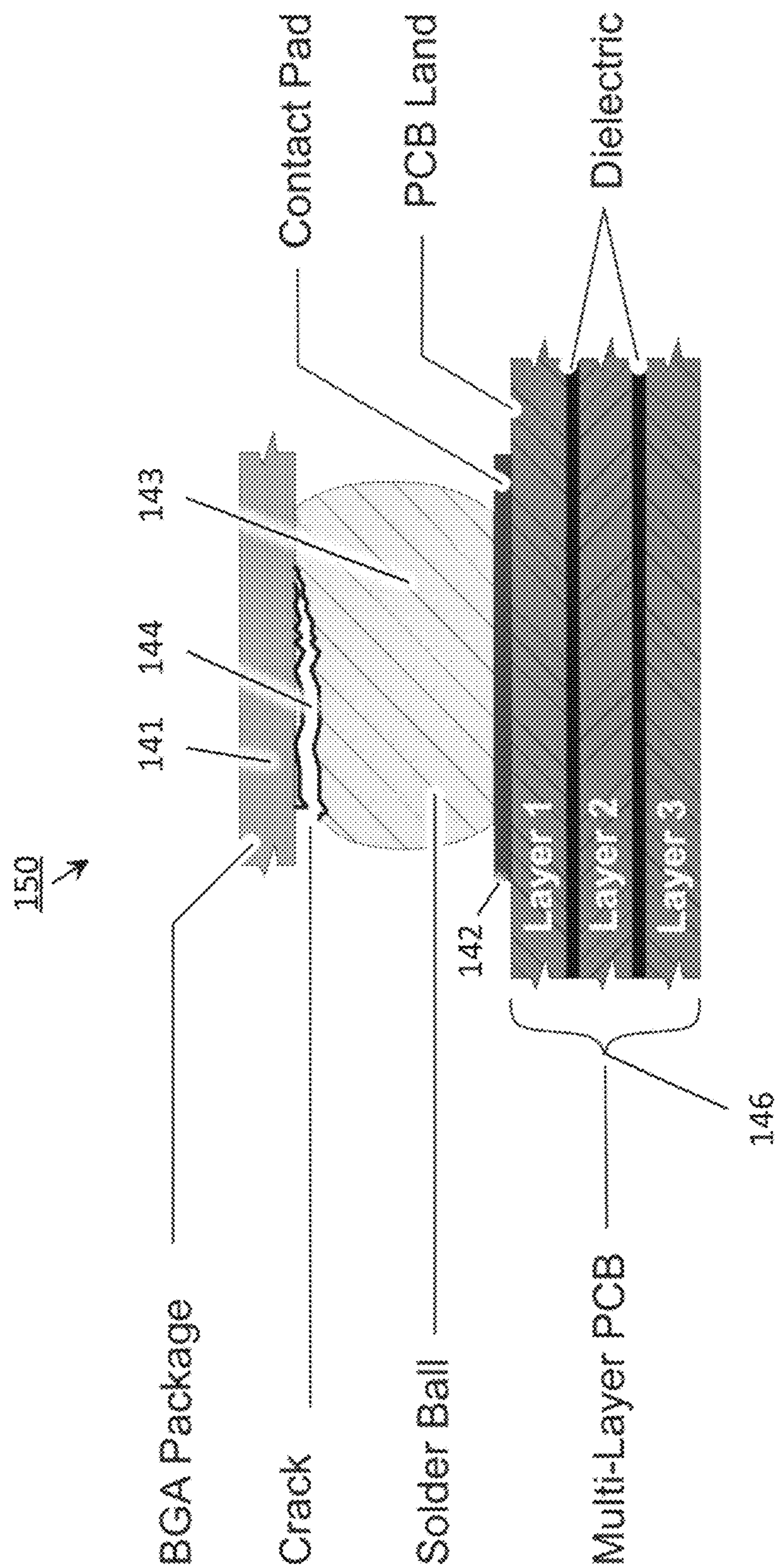
Figure 11A:
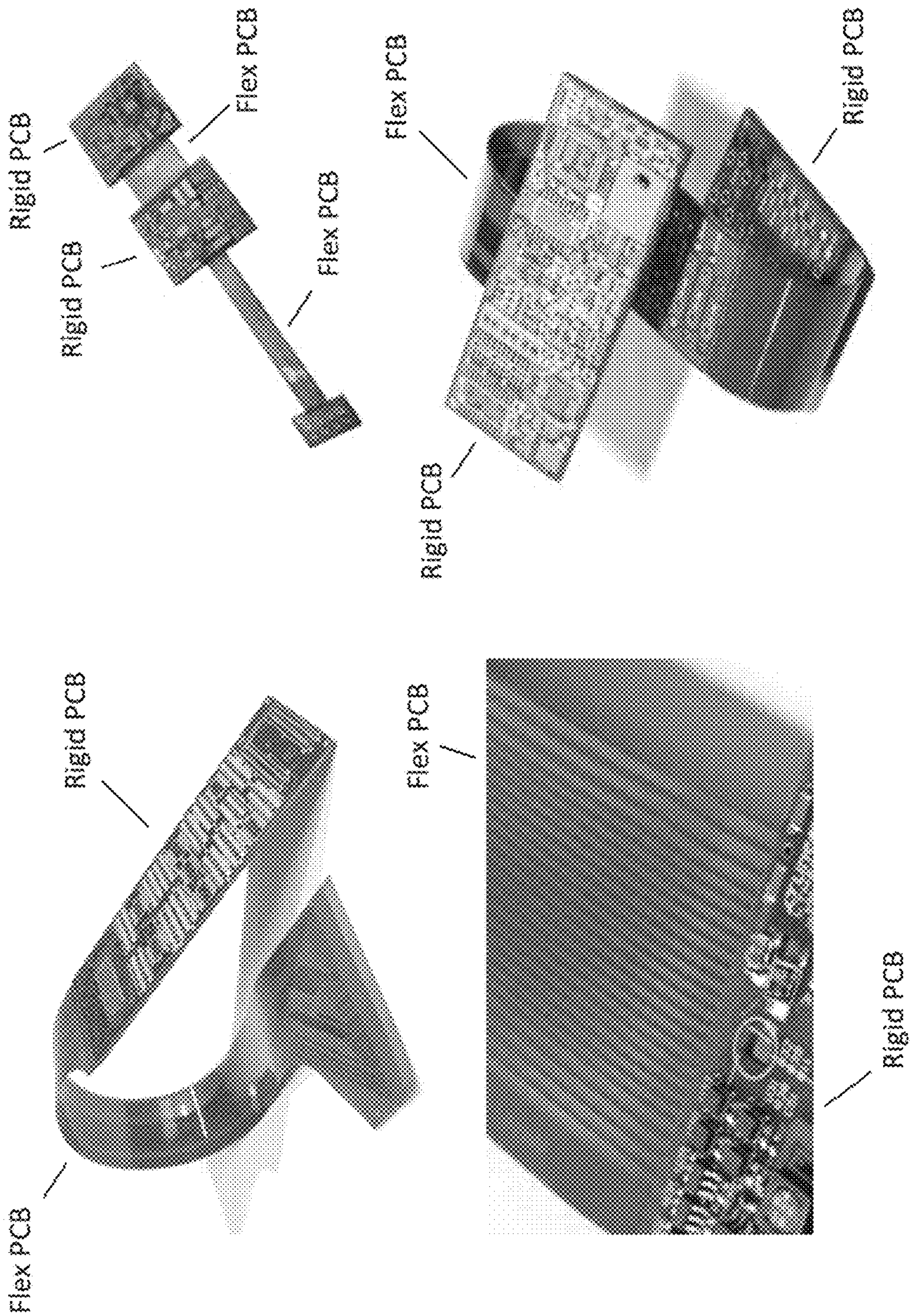
FIG. 11A contains photographic examples of rigid-flex PCBs.
Figure 11B:
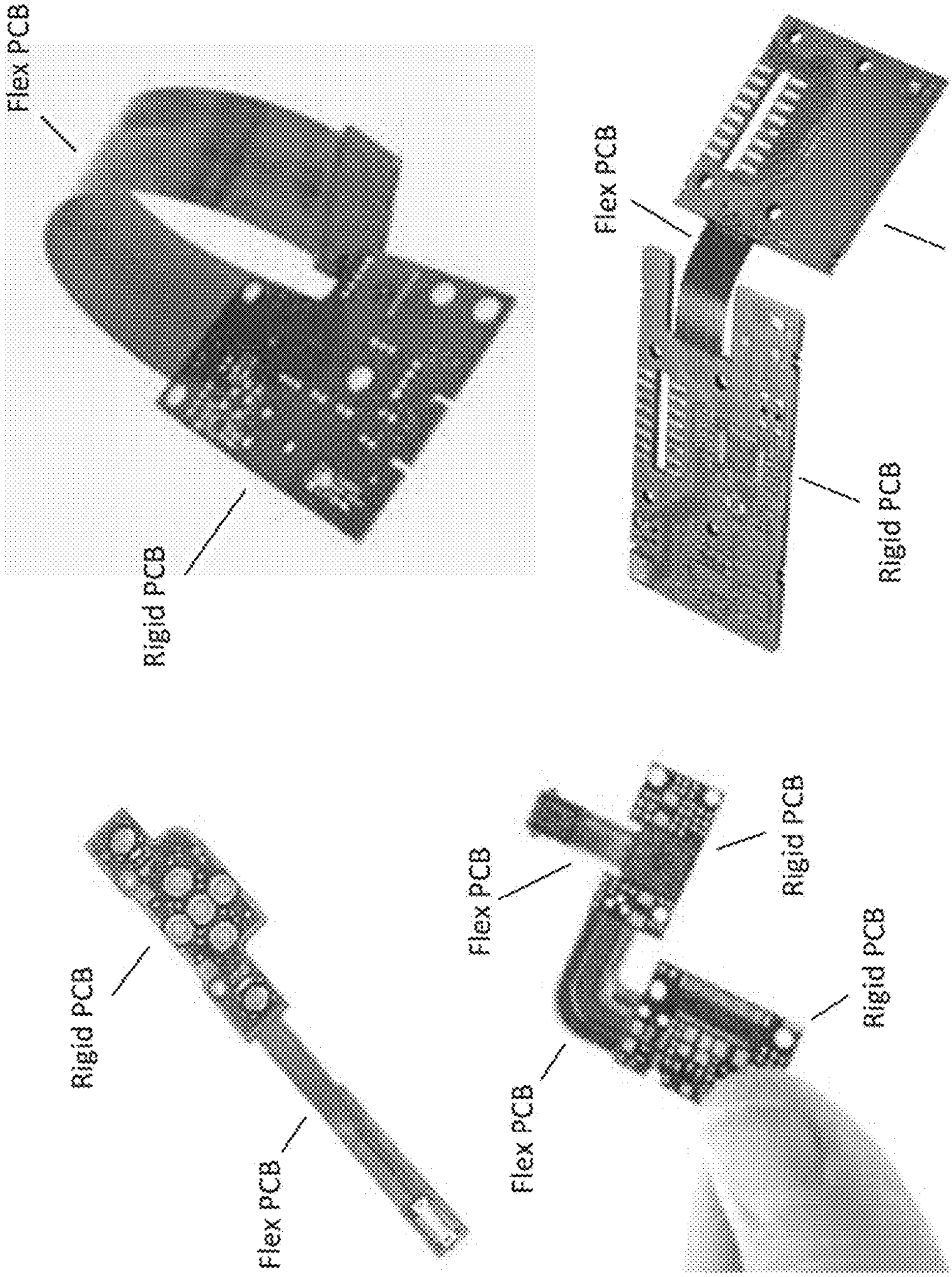
FIG. 11B contains additional photographic examples of rigid-flex PCBs.
Figure 12A:
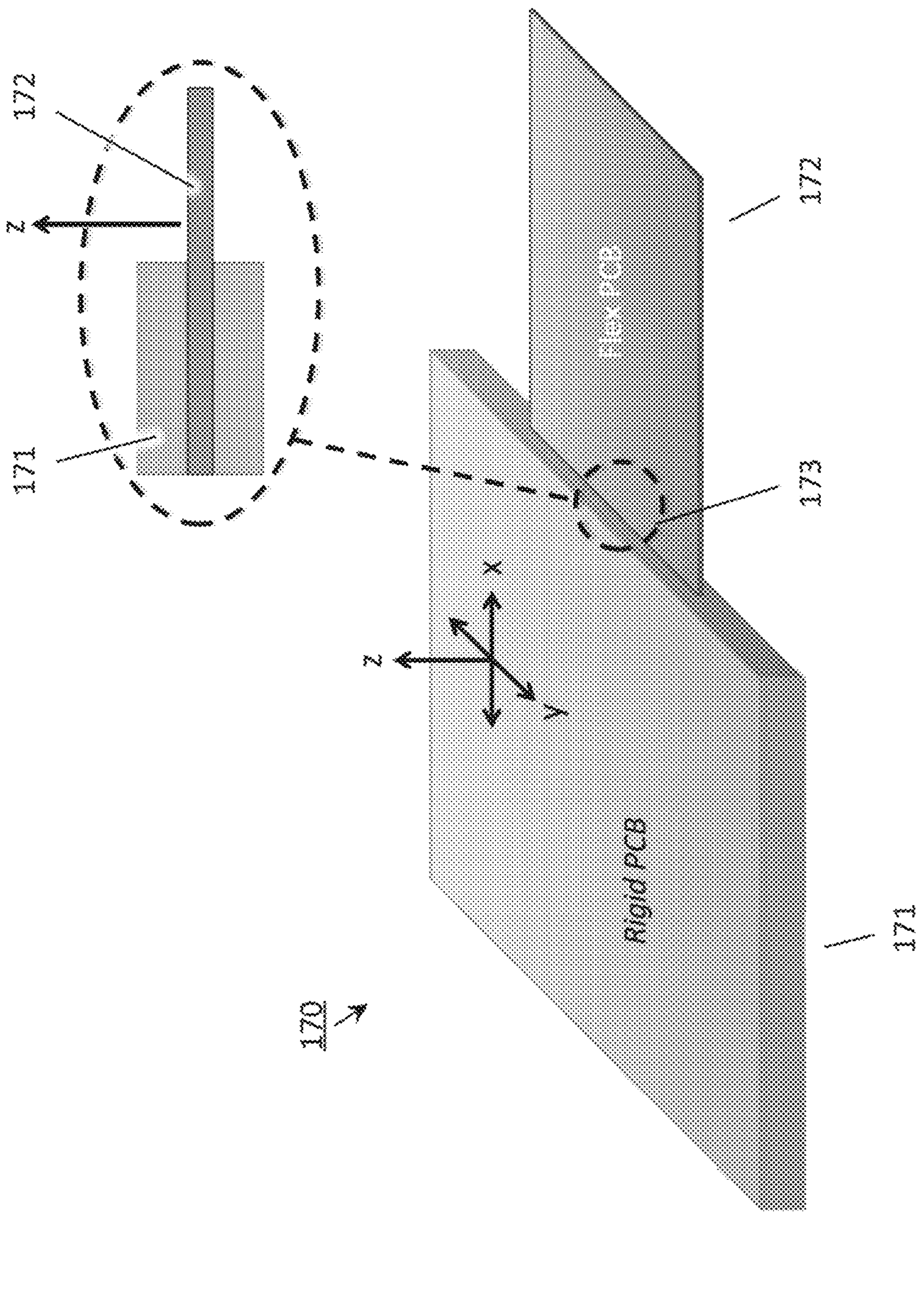
FIG. 12A is a schematic cross sectional representation of rigid-flex PCB.
Figure 12B:
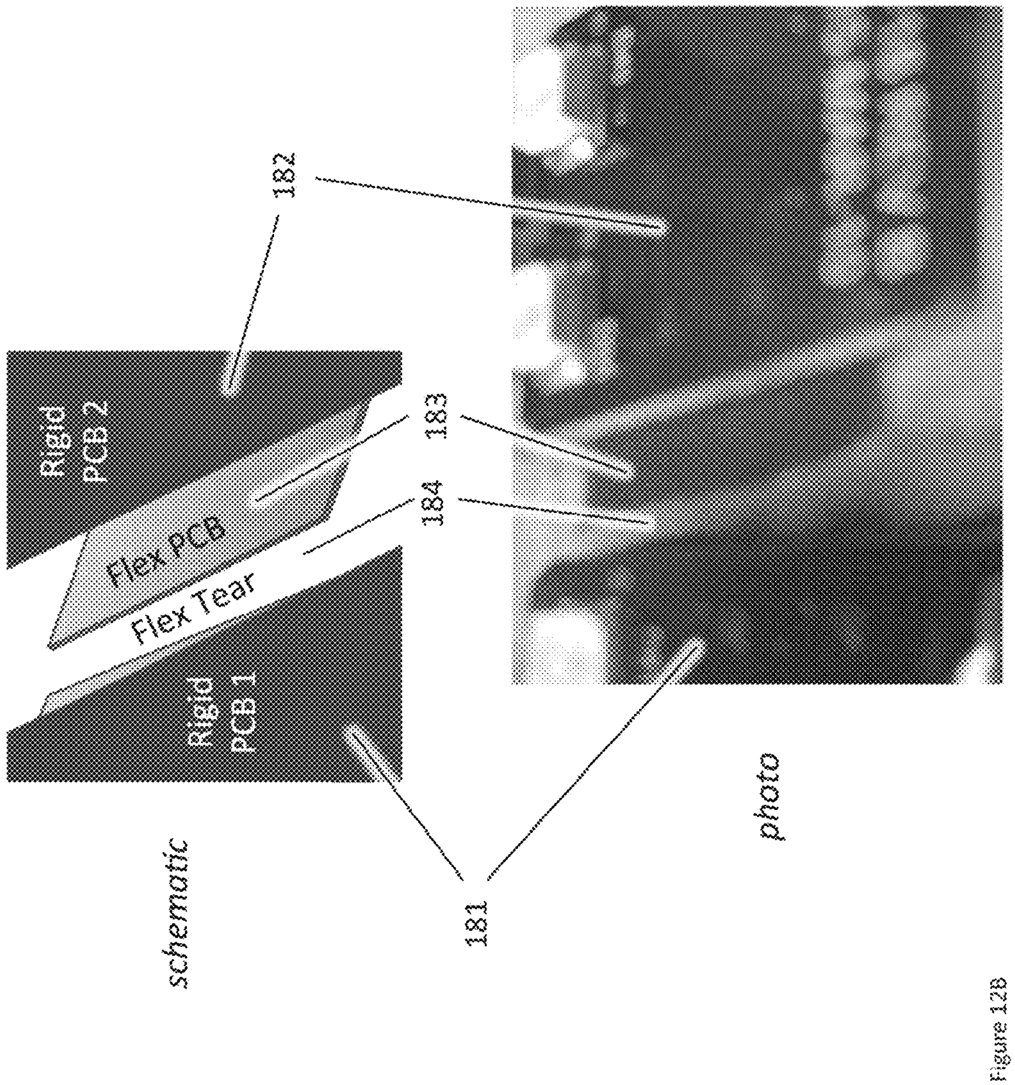
FIG. 12B contains a photographic example of a flex PCB tear in a rigid-flex PCB.

In cases where an electrical network is distributed across multiple PCBs containing dissimilar components, circuits and functions, an interconnect failure between the components risks not only the two interconnected PCBs but also potentially the entire system. In the prior-art rigid-flex PCBs shown in FIG. 11A and FIG. 11B, clearly every flex and rigid PCB is unique. In the design of trusted and high reliability systems, unique circuits are not "good" as they represent the risk of single points of failure.

Figure 13A:
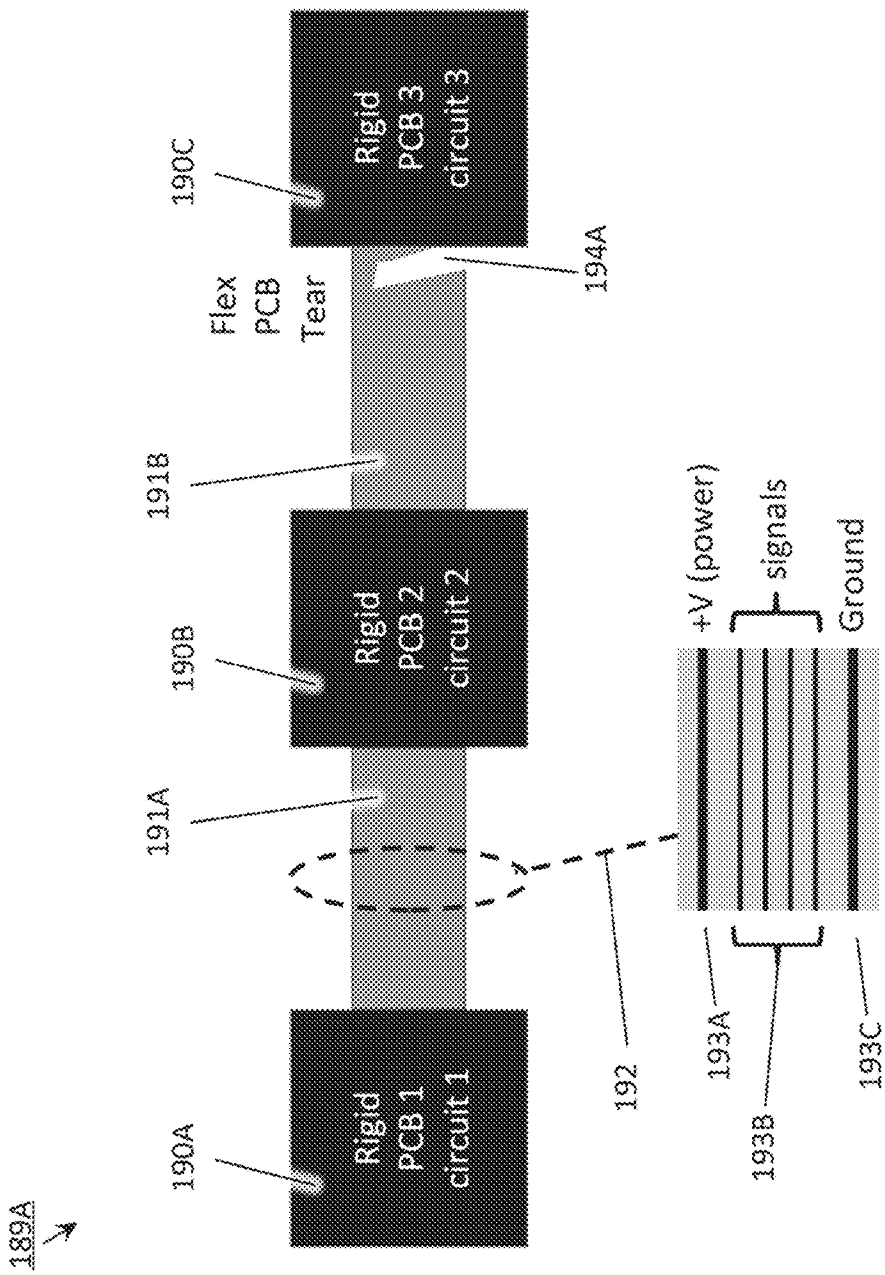
FIG. 13A is a schematic representation of a distributed electrical circuit with a tear in one of its flexible PCB interconnections.
Figure 13B:
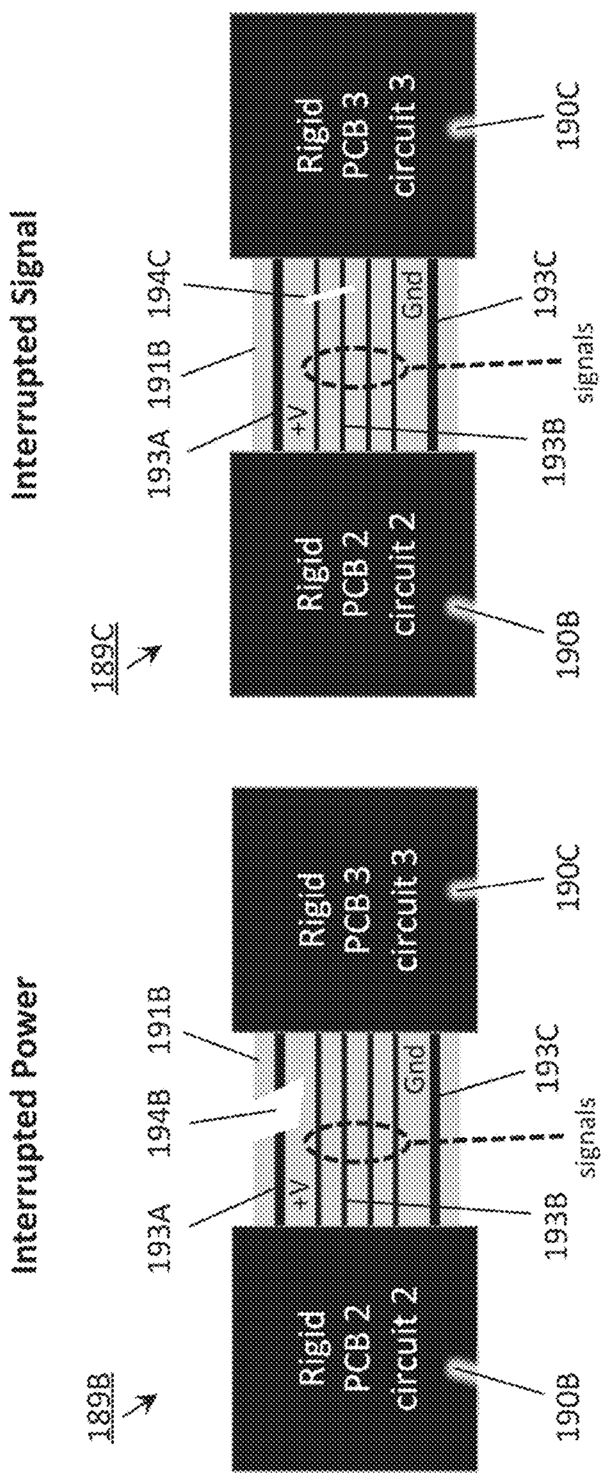
FIG. 13B is a schematic representation of distributed electrical circuits using flex-rigid PCBs with damage resulting in power and signal interruption.
Figure 14A:
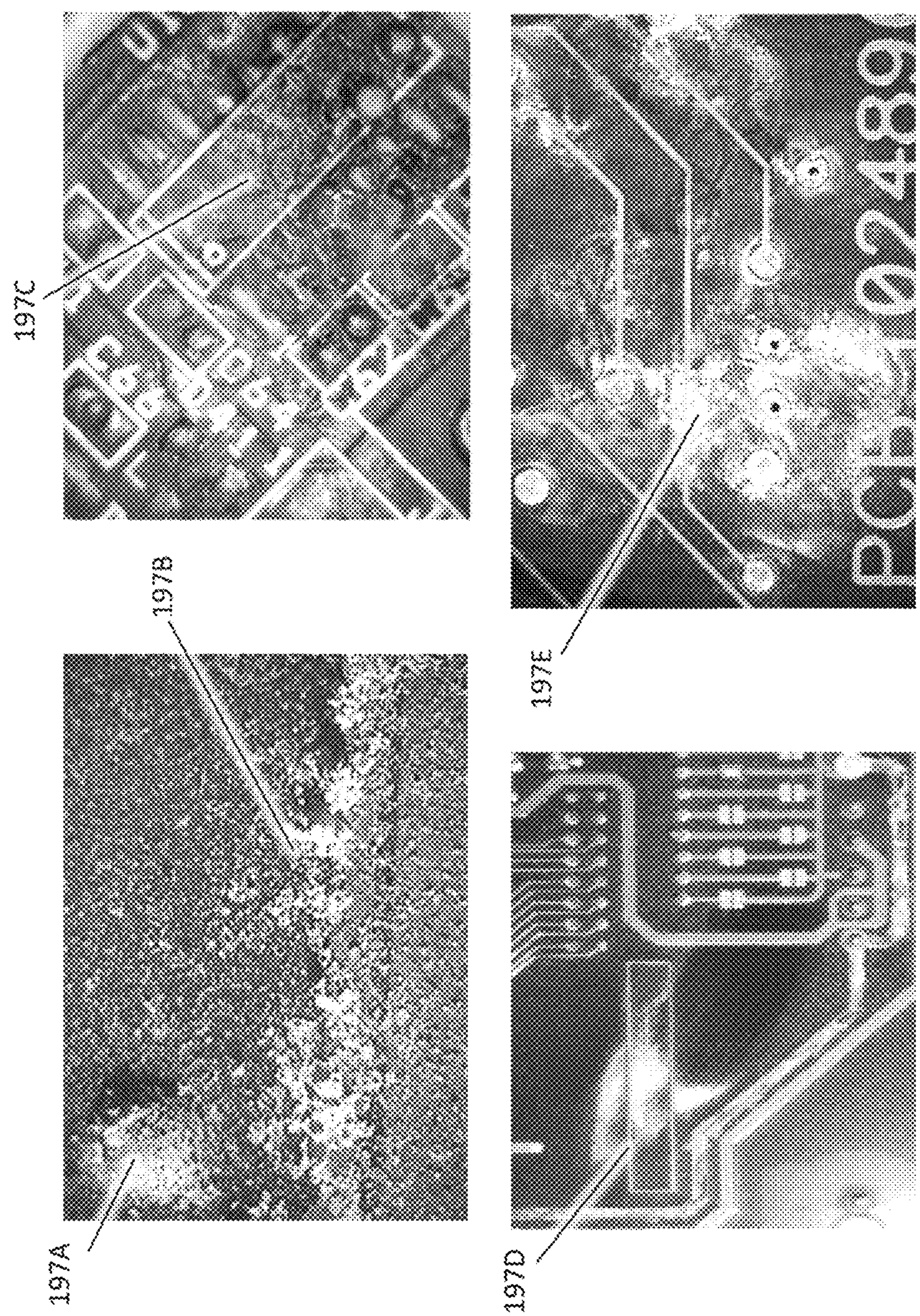
FIG. 14A contains photographic examples of moisture related and moisture-induced corrosion failures in PCBs.
Figure 14B:
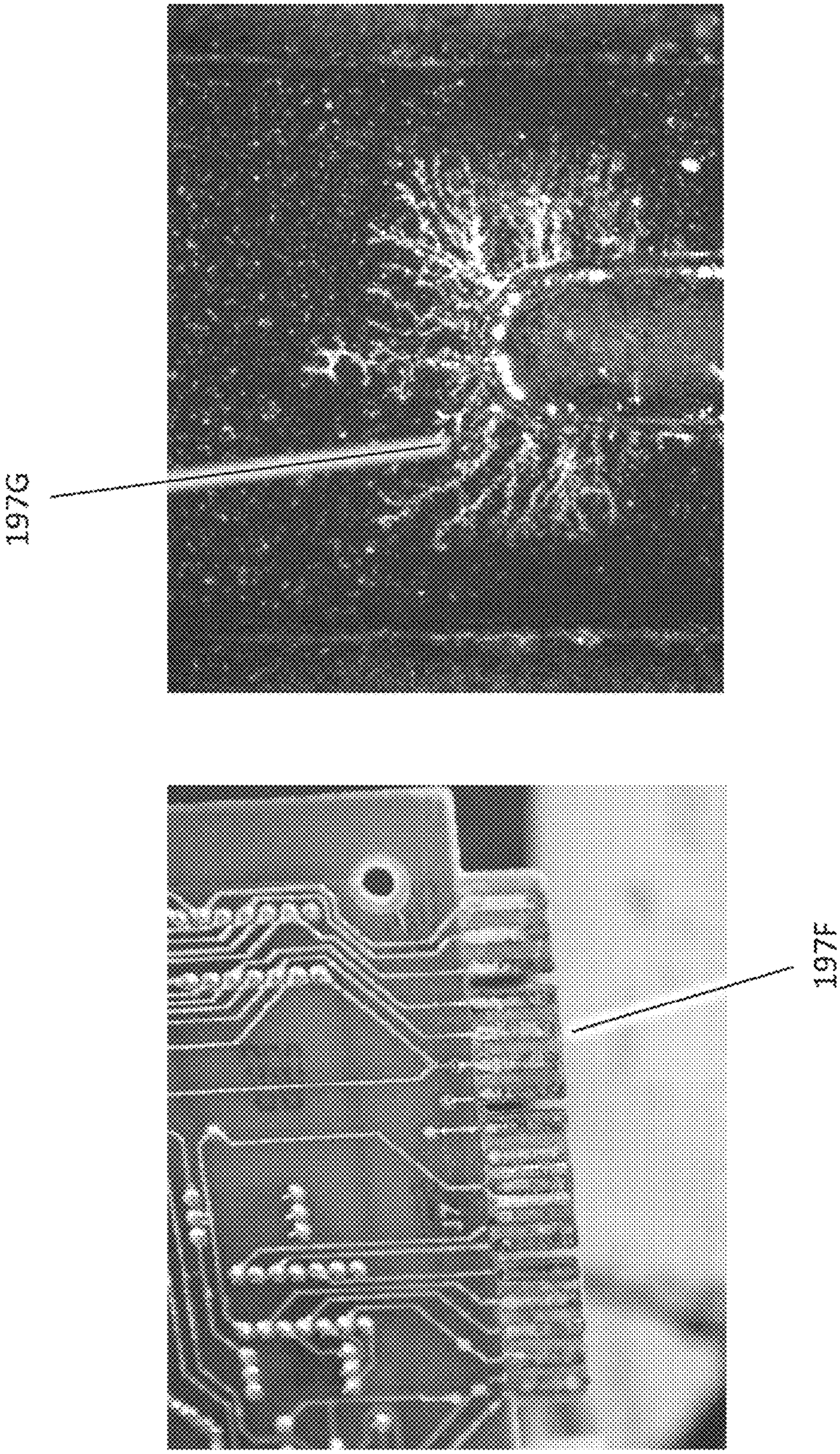
FIG. 14B contains photographic examples of moisture related and moisture-induced corrosion failures in PCBs.

For example, in FIG. 13A rigid PCBs 190A, 190B, and 190C are unique and uniquely incorporate corresponding circuits 1, 2, and 3. As a result, flex PCB 191A exclusively routes power and signals between rigid PCBs 190A and 190B. Similarly, flex PCB 191B exclusively routes power and signals between rigid PCBs 190B and 190C. As an exclusive and unique connection, damage to flex PCB 191B such as flex PCB tear 194A will sever the only connection to circuit 3 resulting in a system failure either through a signal interruption, a power failure, or both.

Figure 15:
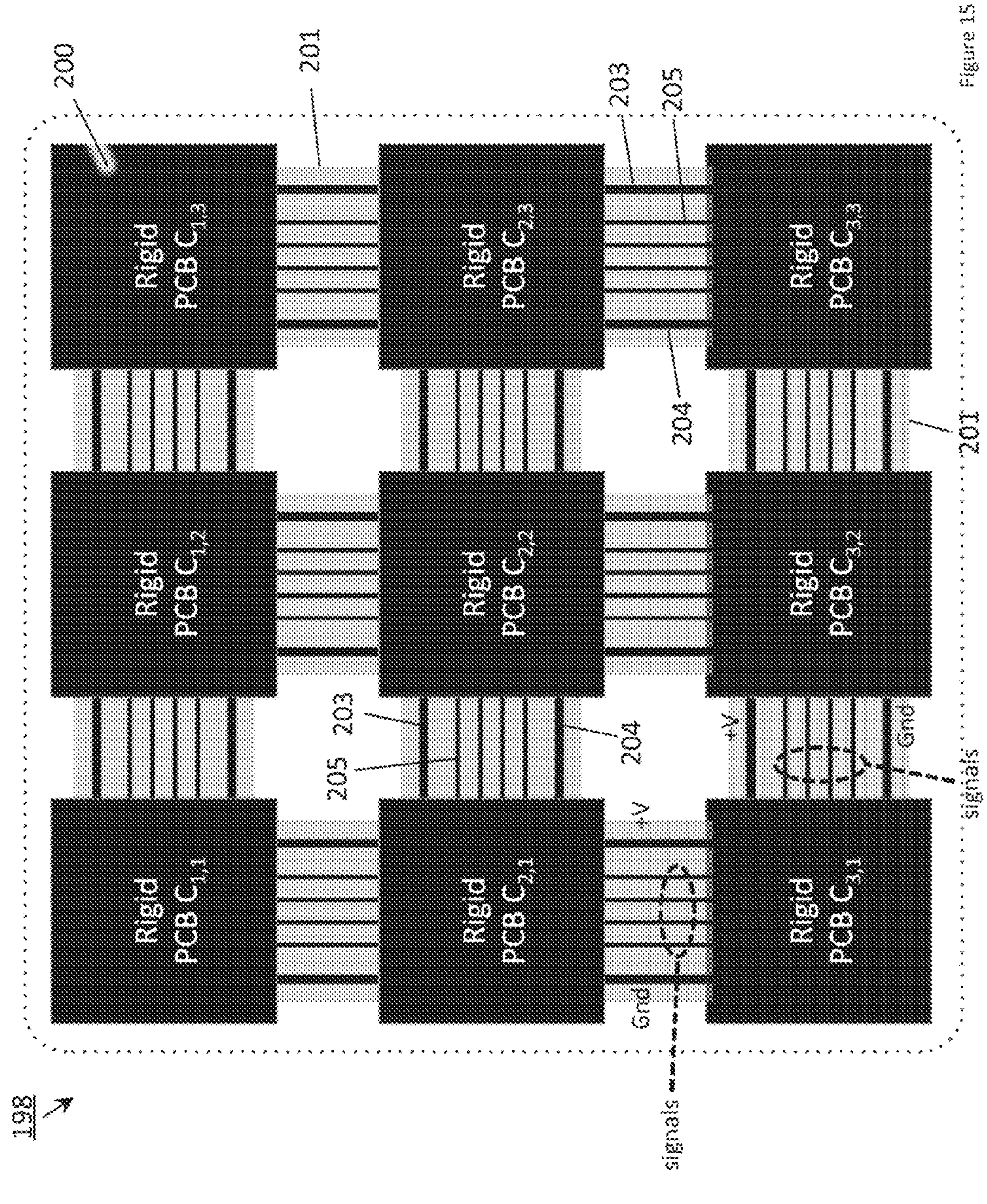
FIG. 15 is a schematic representation of an array of rigid PCBs and interconnecting flex connectors.

To mitigate single point failures, a redundant array of identical signals and circuits can be distributed across a grid of PCBs. One such redundant circuit implementation 198 shown in FIG. 15 comprises a grid of rigid PCBs 200 interconnected by flex connectors 201. Each flex connector includes power bus 203, ground 204 and multiple signal lines 205. Each rigid PCB is identified by its location in the grid. In redundant implementation 198 the first row of circuits comprise circuit block $C_{1,1}$ in column 1, circuit block $C_{1,2}$ in column 2, and circuit block $C_{1,3}$ in column 3. Similarly, the second row of circuits comprise circuit block $C_{2,1}$ in column 1, circuit block $C_{2,2}$ in column 2, and circuit block $C_{2,3}$ in column 3, and the third row of circuits comprise circuit block $C_{3,1}$ in column 1, circuit block $C_{3,2}$ in column 2, and circuit block $C_{3,3}$ in column 3.

In a purely redundant embodiment, all the circuit blocks $C_{1,1}$ through $C_{3,3}$ are identical. In an alternative embodiment, the circuit blocks are mostly identical but some limited number-of-circuits are unique, e.g. power and control. The partitioning of electronic systems into multiple sub-circuits for redundant operation made in accordance with this invention is discussed later in this application.

Figure 16A:
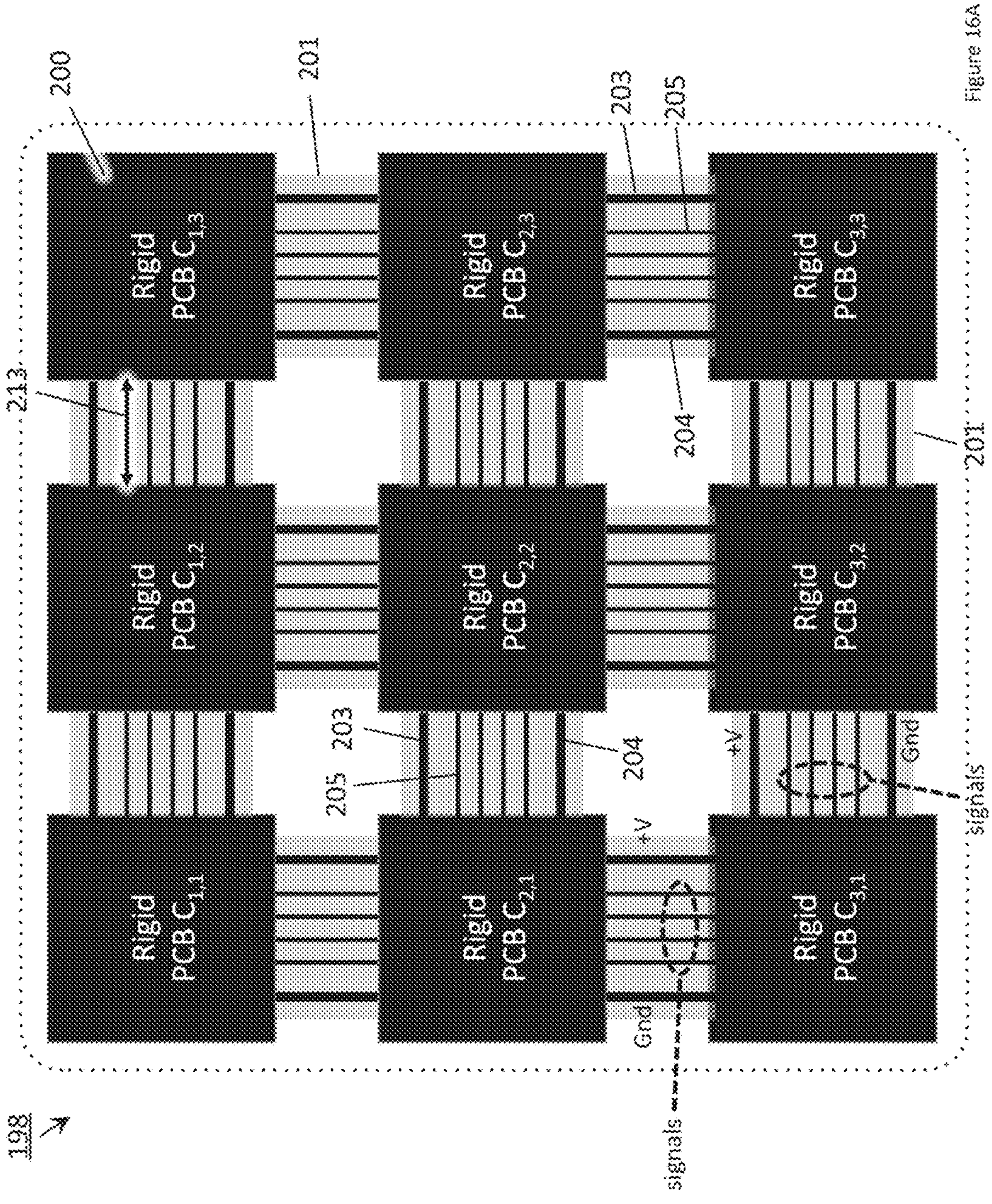
FIG. 16A is a schematic representation of an array of rigid PCBs highlighting the shortest conductive path of a signal interconnection facilitated by a single flex PCB.
Figure 16B:
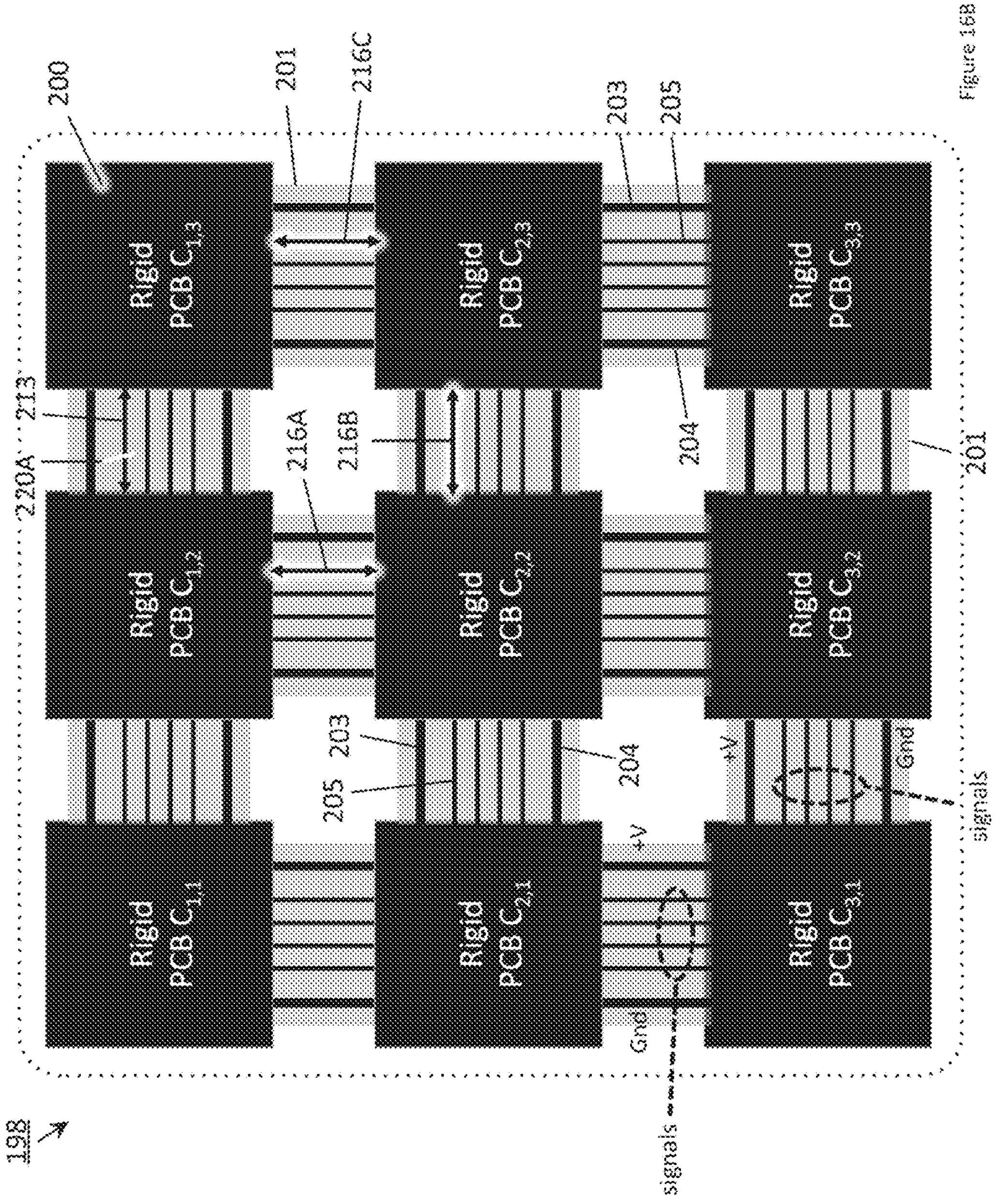
FIG. 16B is a schematic representation of an array of rigid PCBs highlighting a redundant conductive path of a signal interconnection facilitated by two rigid and three flex connectors.
Figure 16C:
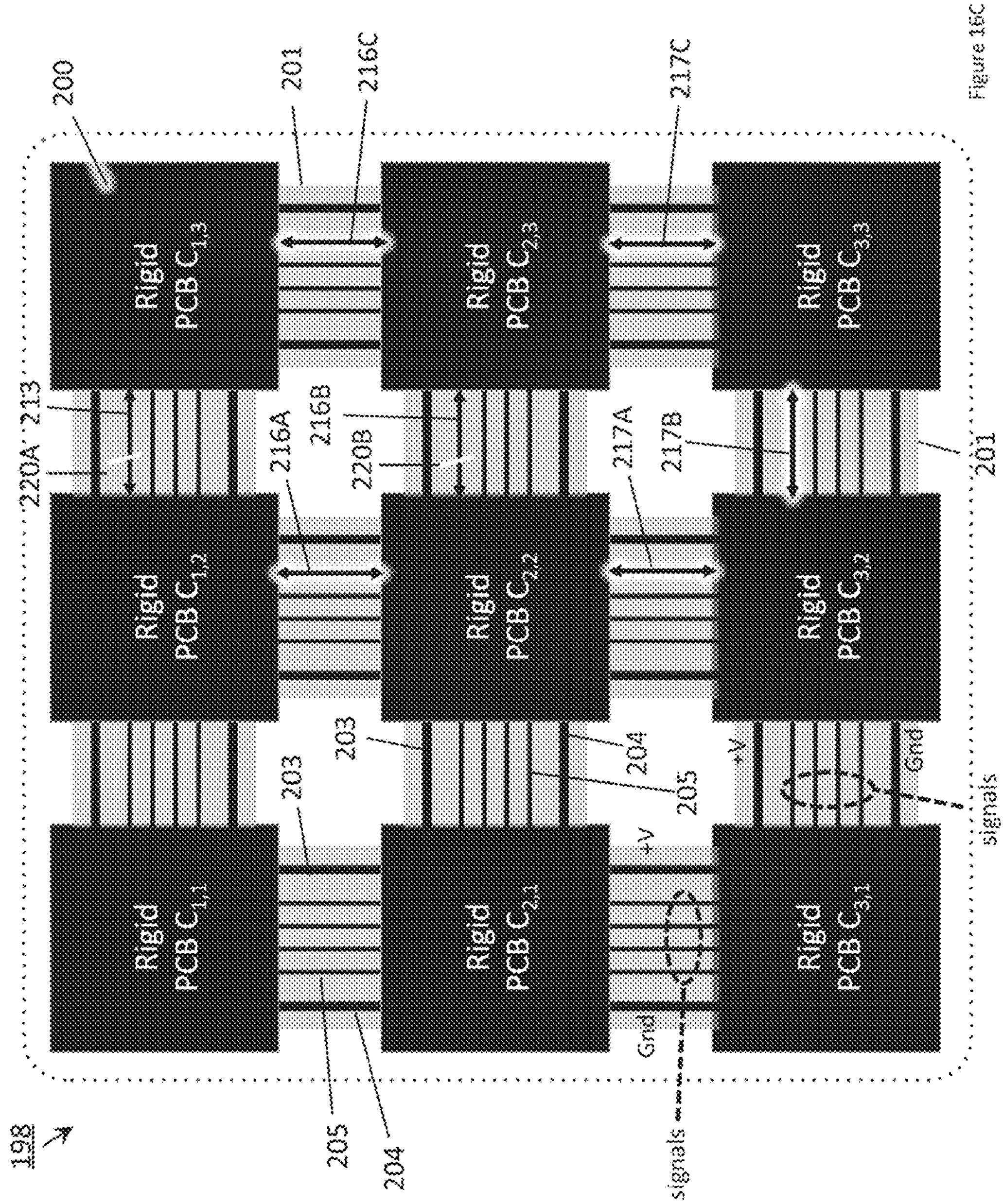
FIG. 16C is a schematic representation of an array of rigid PCBs highlighting another redundant conductive path of a signal interconnection facilitated by four rigid and five flex connectors.

In addition to redundant circuitry, for the fault tolerant design of redundant circuit implementation 198 as disclosed, power and signals are likewise distributed in a redundant manner. For example, as FIG. 16A illustrates, signals pass between circuits $C_{1,2}$ and $C_{1,3}$ across electrical connection 213. As shown in FIG. 16B, in the event of a break 220A in electrical connection 213, the same signal propagates around the break through electrical connections 216A, 216B and 216C traversing circuits $C_{2,2}$ and $C_{2,3}$. As shown in FIG. 16C, in the event of a second break 220B in electrical connection 216B, the same signal propagates around both breaks 220A and 220B through electrical connections 216A, 217A, 217B, 217C, and 216C traversing circuits $C_{2,2}$, $C_{3,2}$, $C_{3,3}$, and $C_{2,3}$.

Figure 16D:
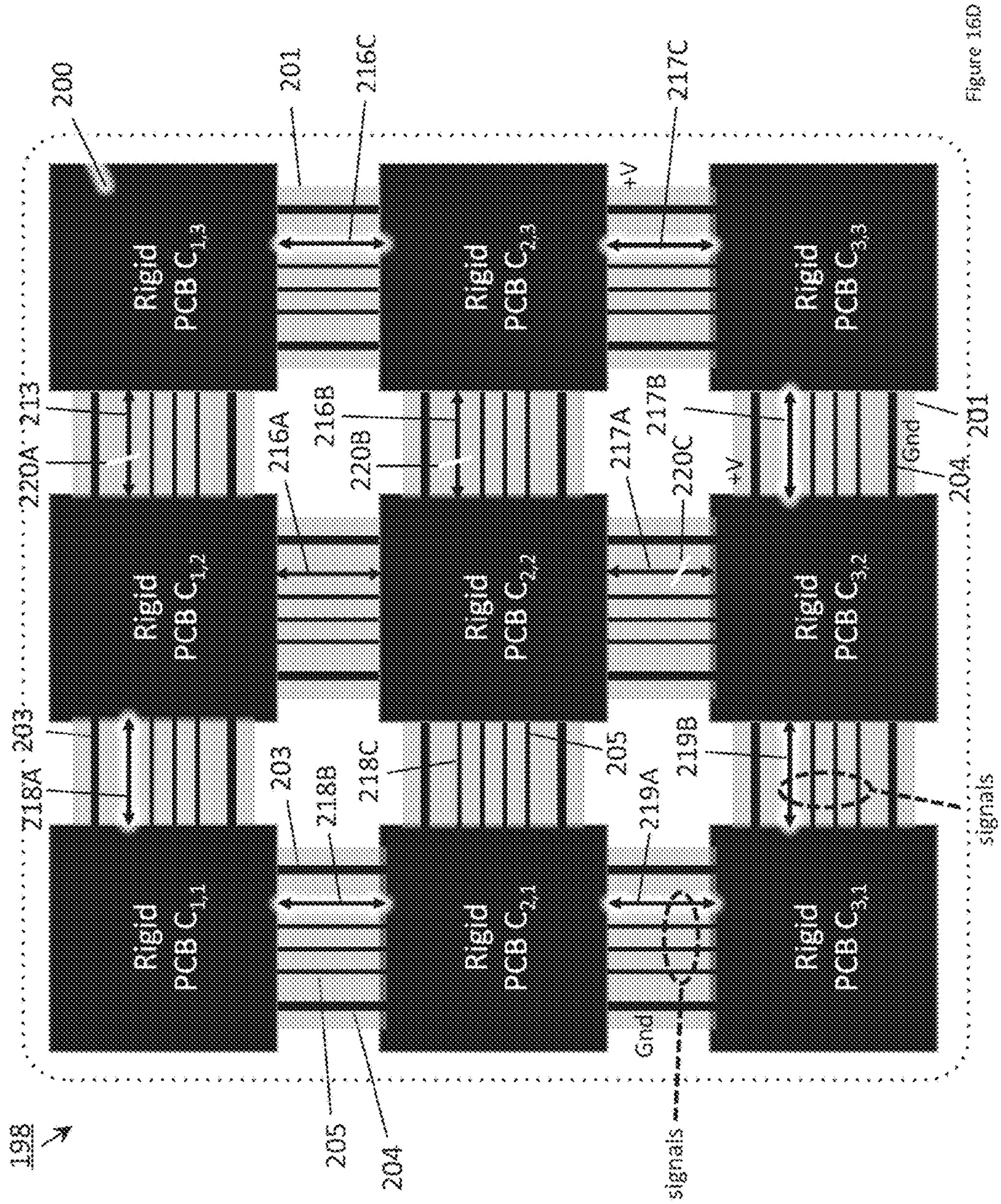
FIG. 16D is a schematic representation of an array of rigid PCBs highlighting yet another redundant conductive path of a signal interconnection facilitated by six rigid and seven flex connectors.

Because redundant circuit implementation 198 comprises a grid with many redundant circuits and interconnection paths, the system still is able to operate even in the event of a third break 220C occurring in electrical connection 217A as shown in FIG. 16D. In this case signal propagation between circuits $C_{1,2}$ and $C_{1,3}$ occurs through electrical connections 218A, 218B, 219A, 219B, 217B, 217C and 216C traversing circuits $C_{1,1}$, $C_{2,1}$, $C_{3,1}$, $C_{3,2}$, $C_{3,3}$, and $C_{2,3}$.

Figure 16E:
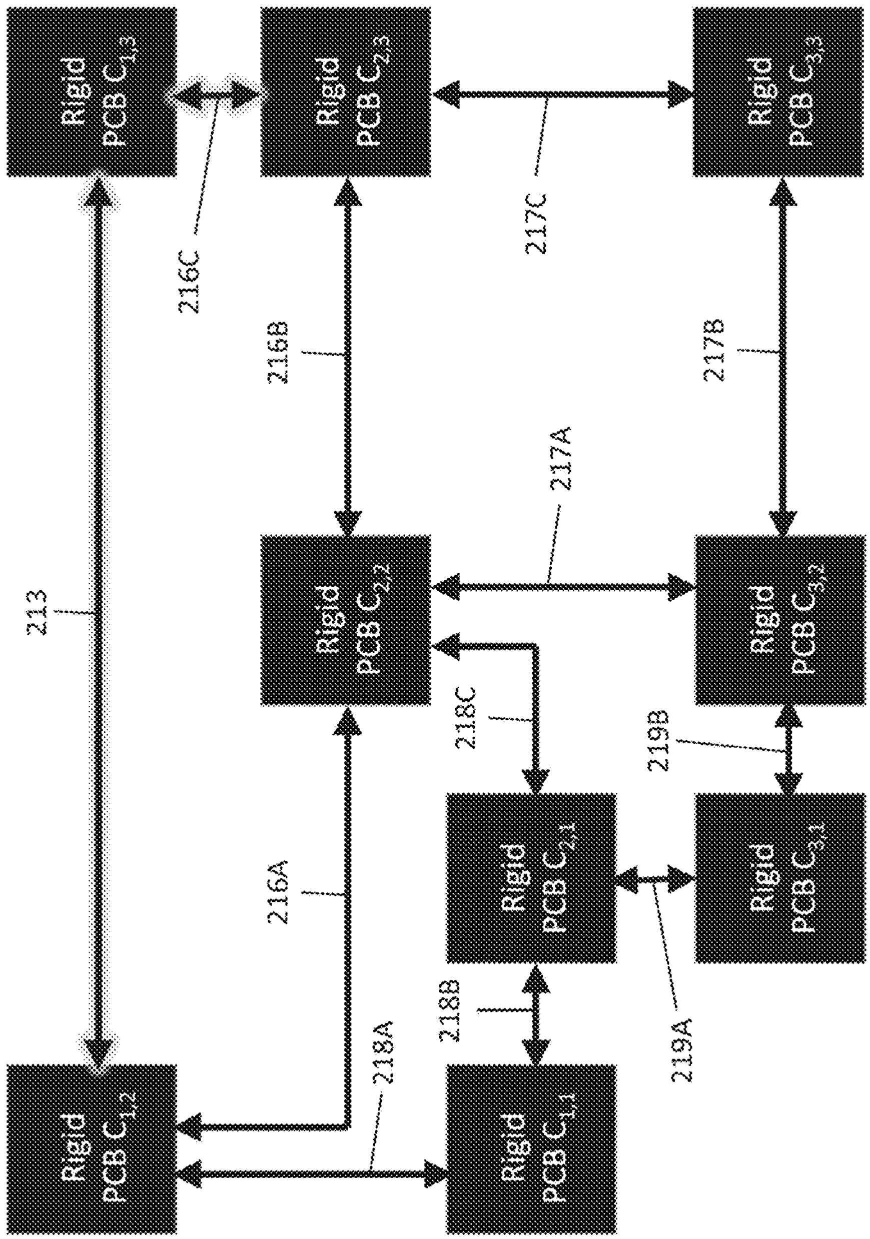
FIG. 16E is an alternate schematic representation of an array of rigid PCBs showing multiple redundant signal interconnections.
Figure 15F:
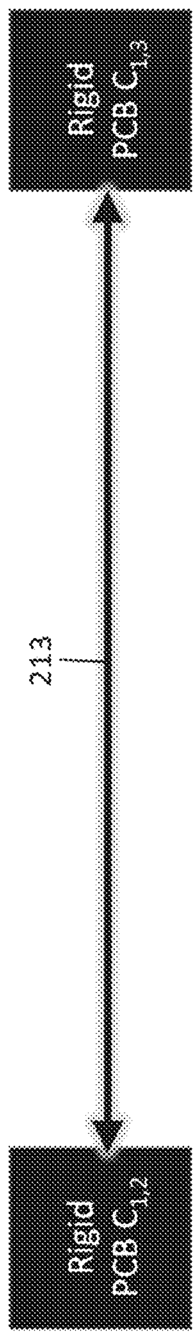
Figure 16G:
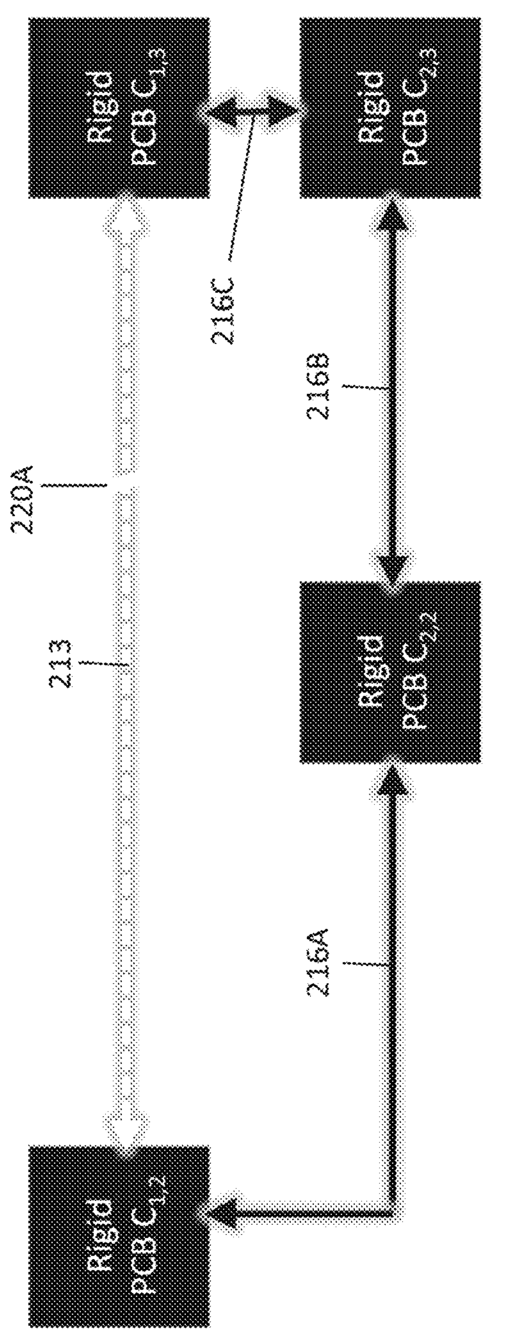
FIG. 16G is a schematic representation showing a redundant signal path bypassing a break in the shortest signal path via two rigid PCBs.

FIG. 16E illustrates an alternative representation of redundant circuit implementation 198 identifying the various signal pathways between circuits $C_{1,2}$ and $C_{1,3}$. As shown, highlighted electrical connections 213 and 216C are the only two signal pathways into circuit $C_{1,3}$. Although multiple redundant connections are facilitated throughout the array, all signals pass into circuit $C_{1,3}$ through these two conductive paths, and as such they represent the weakest link between the two circuits. To elaborate, FIG. 16F illustrates electrical connection 213, the most direct signal path. In the event of break 220A, FIG. 16G illustrates an alternate path comprising electrical connection 216A to circuit $C_{2,2}$, electrical connection 216B to circuit $C_{2,3}$ and finally electrical connection 216C to circuit $C_{3,3}$.

Figure 16H:
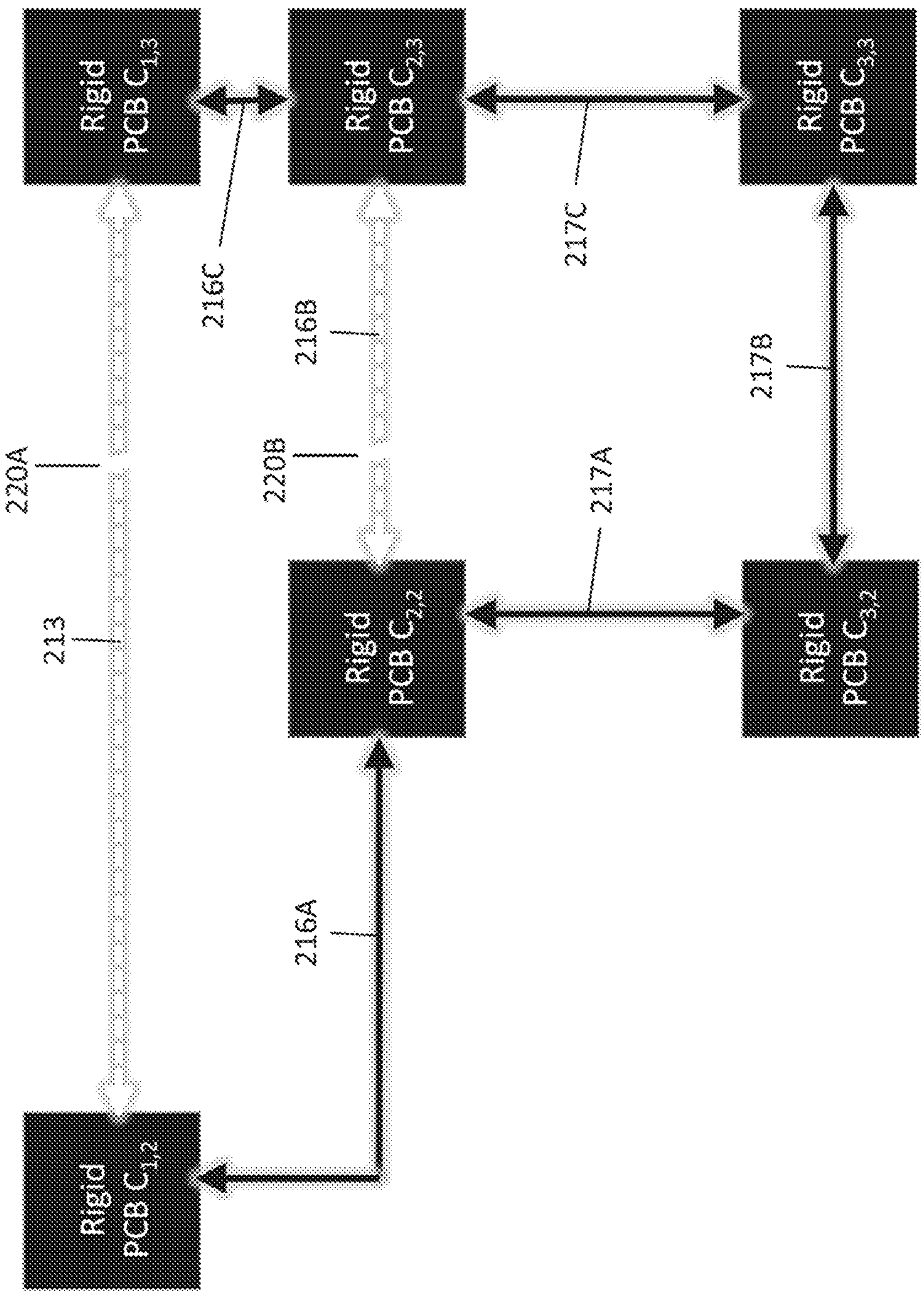
FIG. 16H is a schematic representation showing a redundant signal path bypassing two signal-path breaks via four rigid PCBs.
Figure 16I:
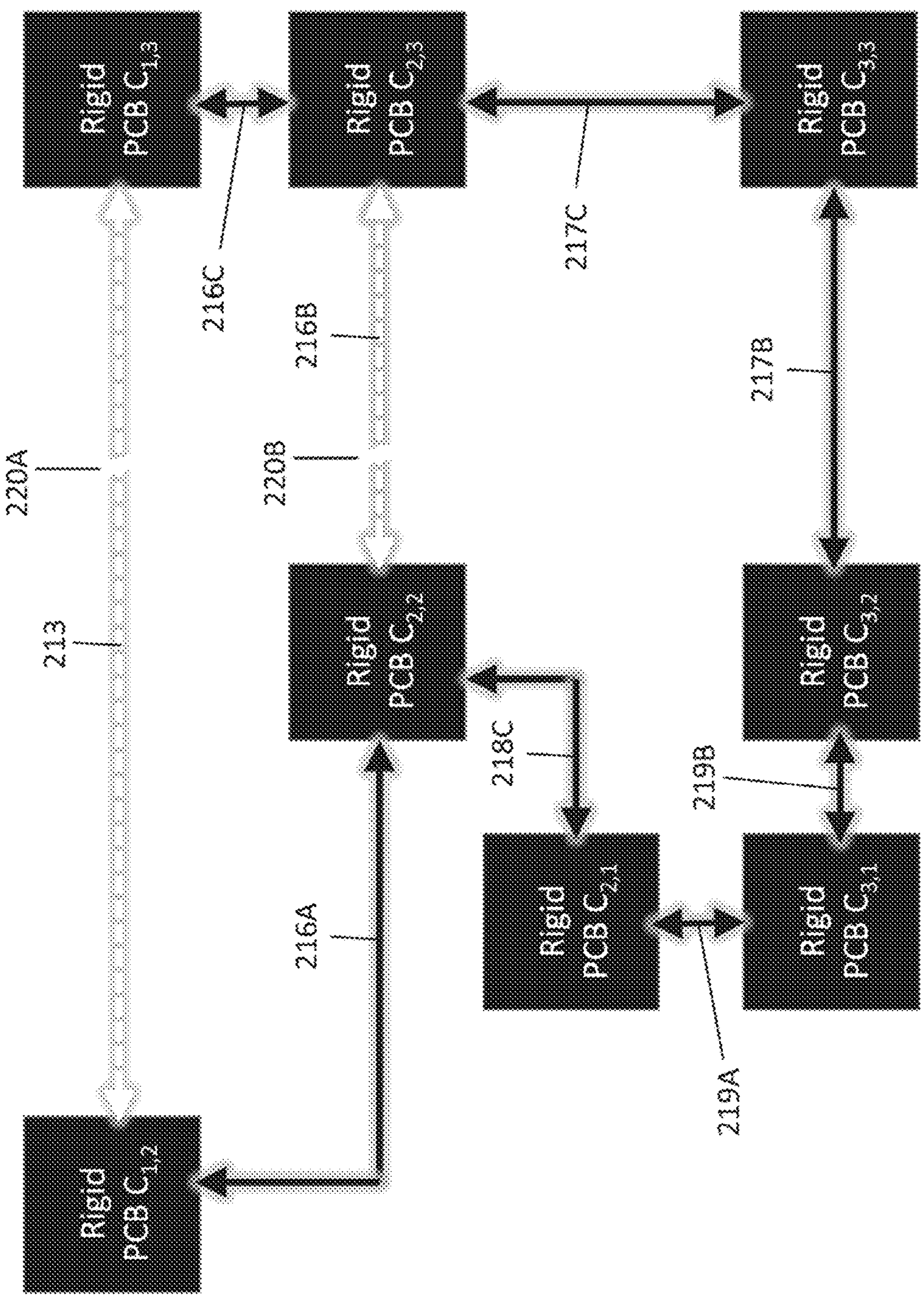
FIG. 16I is a schematic representation showing an alternate redundant signal path bypassing two signal-path breaks via six rigid PCBs.
Figure 16J:
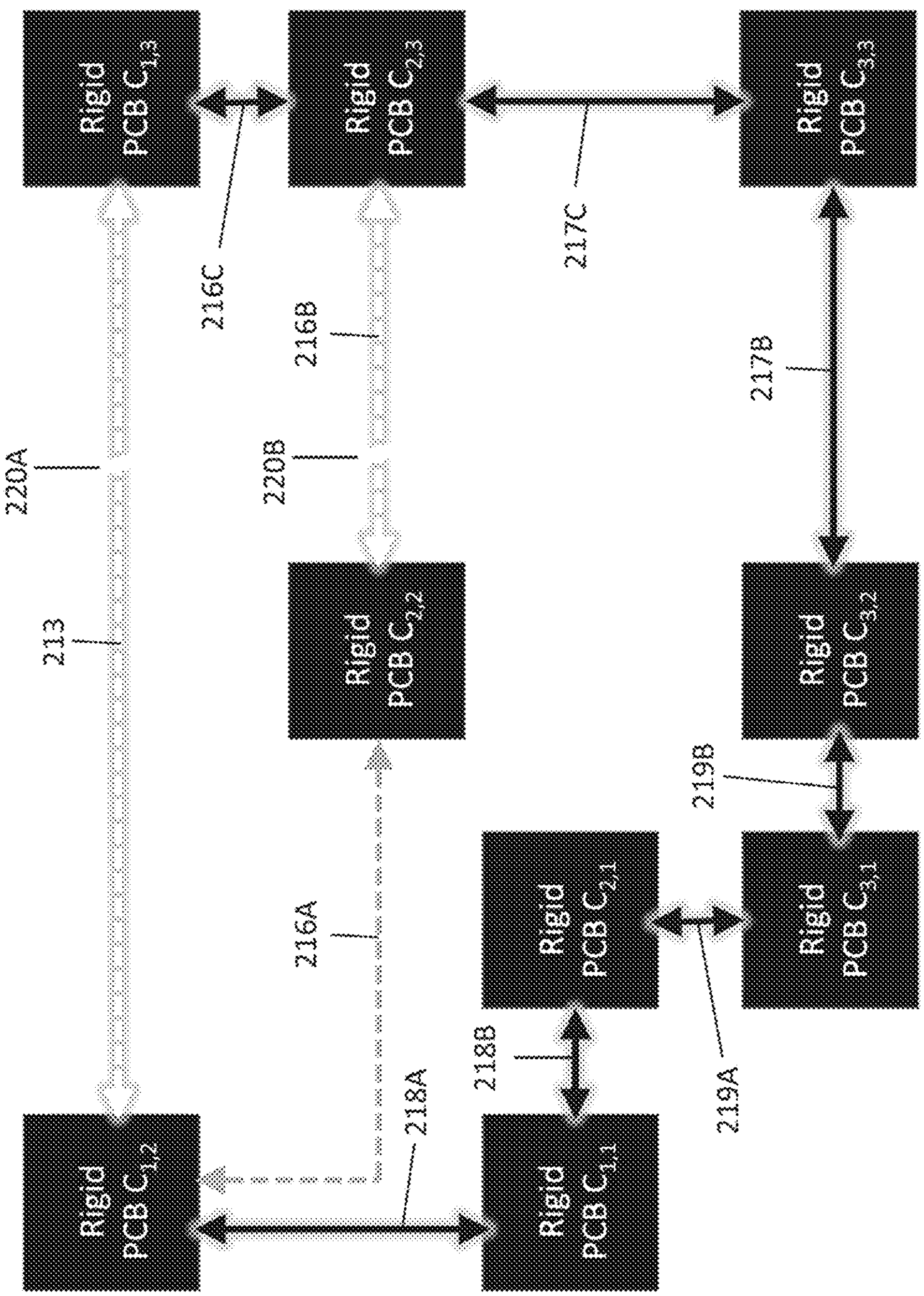
FIG. 16J is a schematic representation showing another alternate redundant signal path bypassing two signal-path breaks via six rigid PCBs.
Figure 15K:
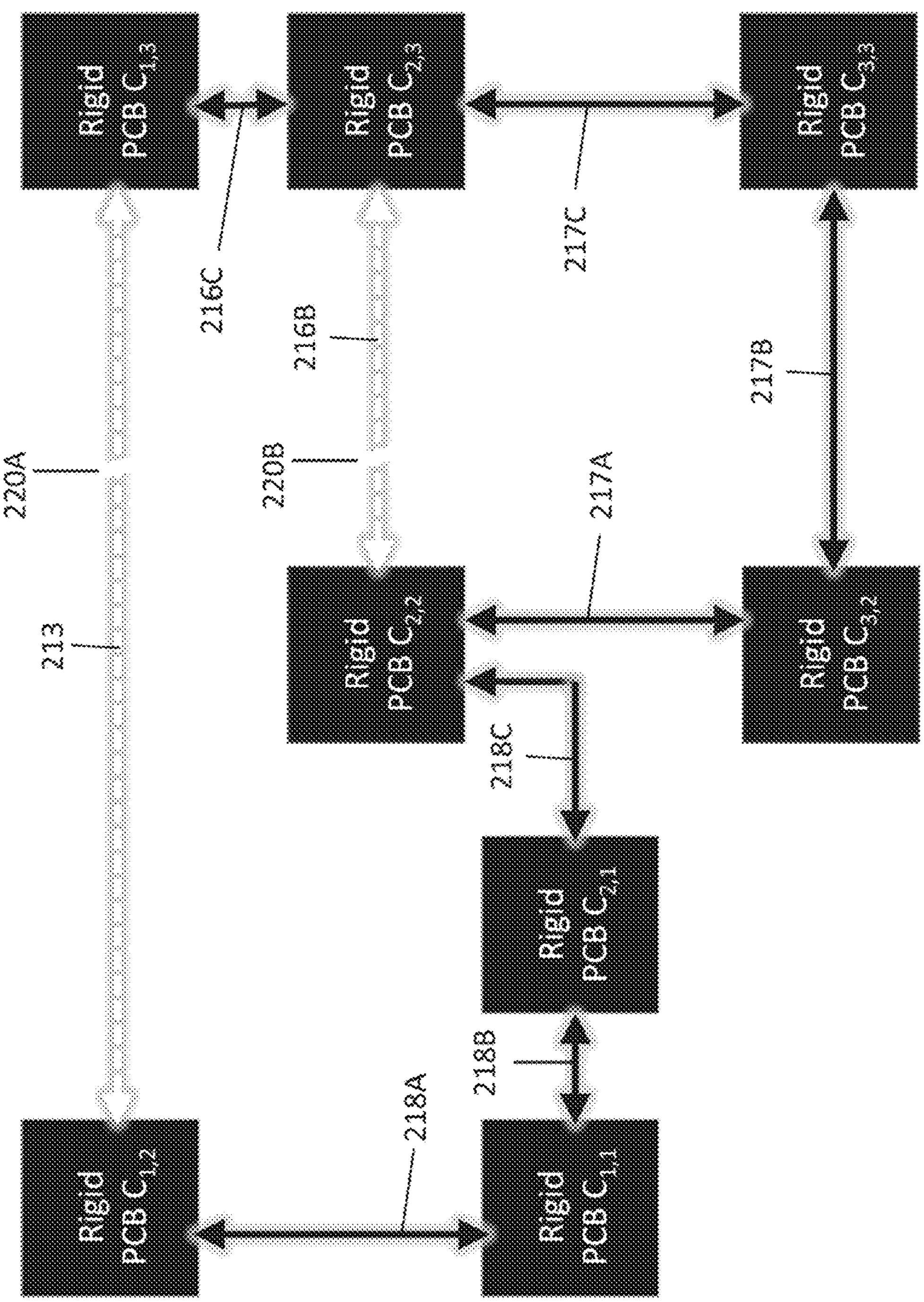
Figure 16I:
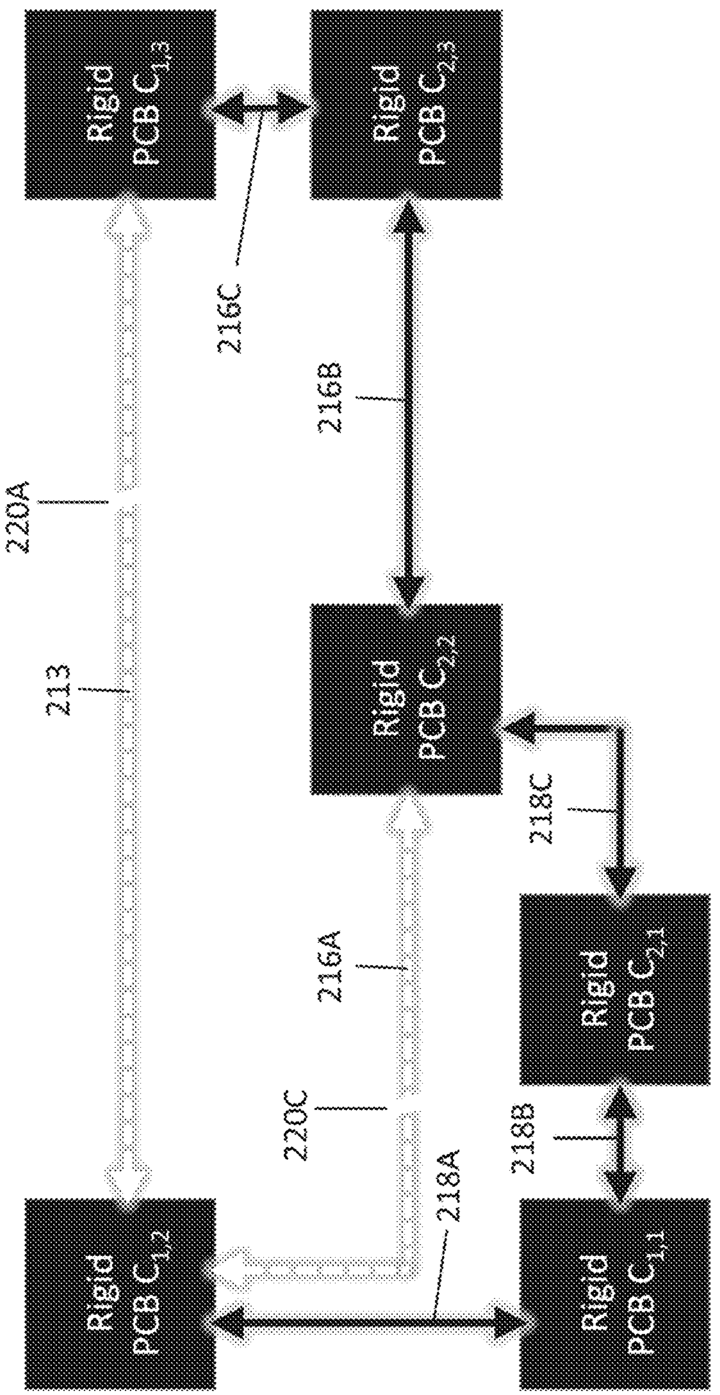

In the event of two breaks 220A and 220B shown in FIG. 16H, signals propagate through electrical connection 216A to circuit $C_{2,2}$, electrical connection 217A to circuit $C_{3,2}$, electrical connection 217B to circuit $C_{3,3}$ electrical connection 217C to circuit $C_{2,3}$, and through electrical connection 216C to circuit $C_{1,3}$. Alternatively, FIG. 16I illustrates a path comprising electrical connections 216A, 218C, 219A, 219B, 217B, 217C and finally 216C connected through rigid PCBs comprising circuits $C_{2,2}$, $C_{2,1}$, $C_{3,1}$, $C_{3,2}$, $C_{3,3}$, $C_{2,3}$, and finally $C_{1,3}$. Another redundant signal path shown in FIG. 16J comprises electrical connections 218A, 218B, 219A, 219B, 217B, 217C and finally 216C connected through rigid PCBs comprising circuits $C_{1,1}$, $C_{2,1}$, $C_{3,1}$, $C_{3,2}$, $C_{3,3}$, $C_{2,3}$, and finally $C_{1,3}$. Still another redundant signal path shown in FIG. 16K comprises electrical connections 218A, 218B, 218C, 217A, 217B, 217C and finally 216C connected through rigid PCBs comprising circuits $C_{1,1}$, $C_{2,1}$, $C_{2,2}$, $C_{3,2}$, $C_{3,3}$, $C_{2,3}$, and finally $C_{1,3}$.

Figure 16M:
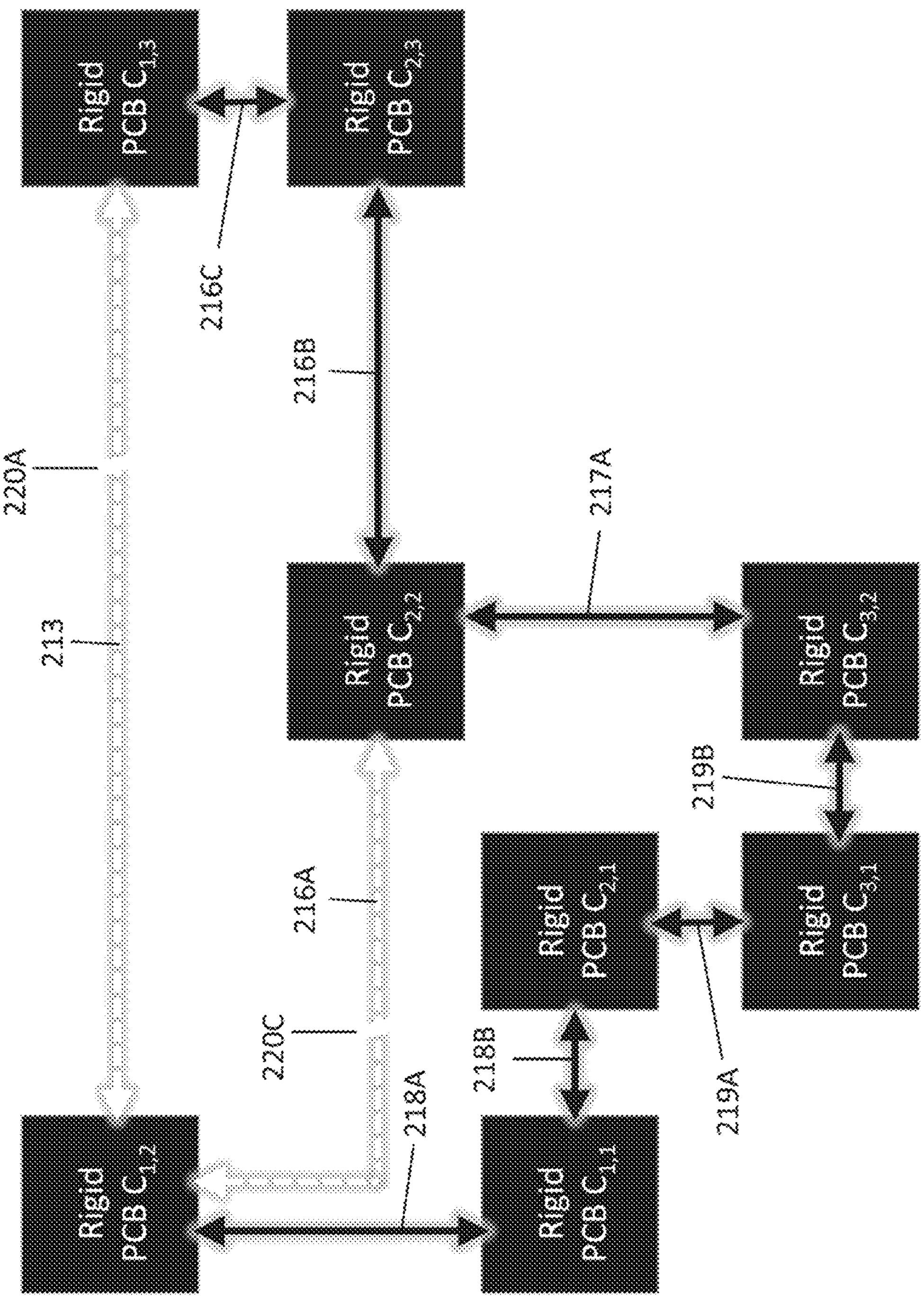
FIG. 16M is a schematic representation showing a redundant signal path bypassing two signal-path breaks via six rigid PCBs.
Figure 16N:
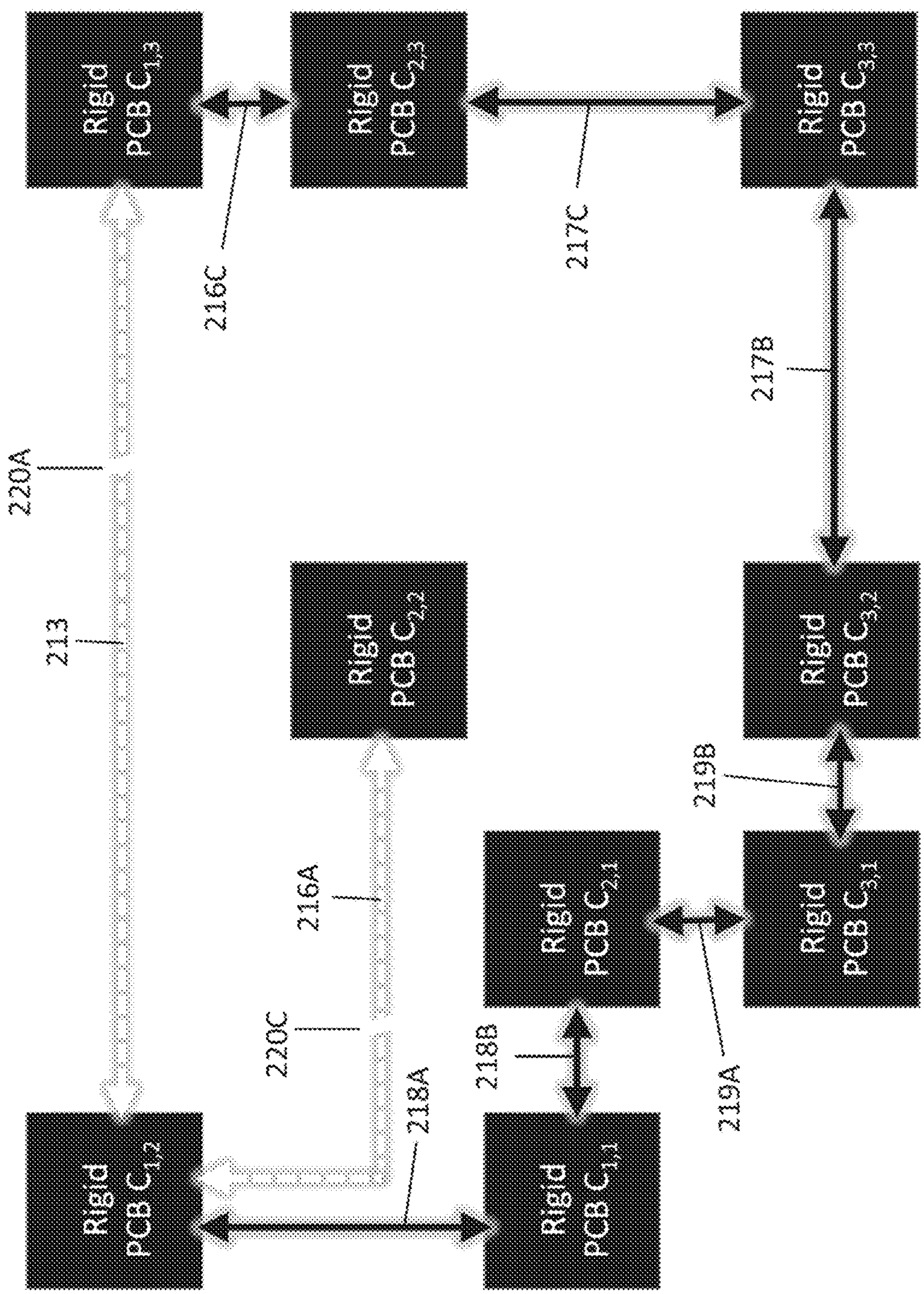
FIG. 16N is a schematic representation showing an alternate redundant signal path bypassing two signal-path breaks via six rigid PCBs.
Figure 16O:
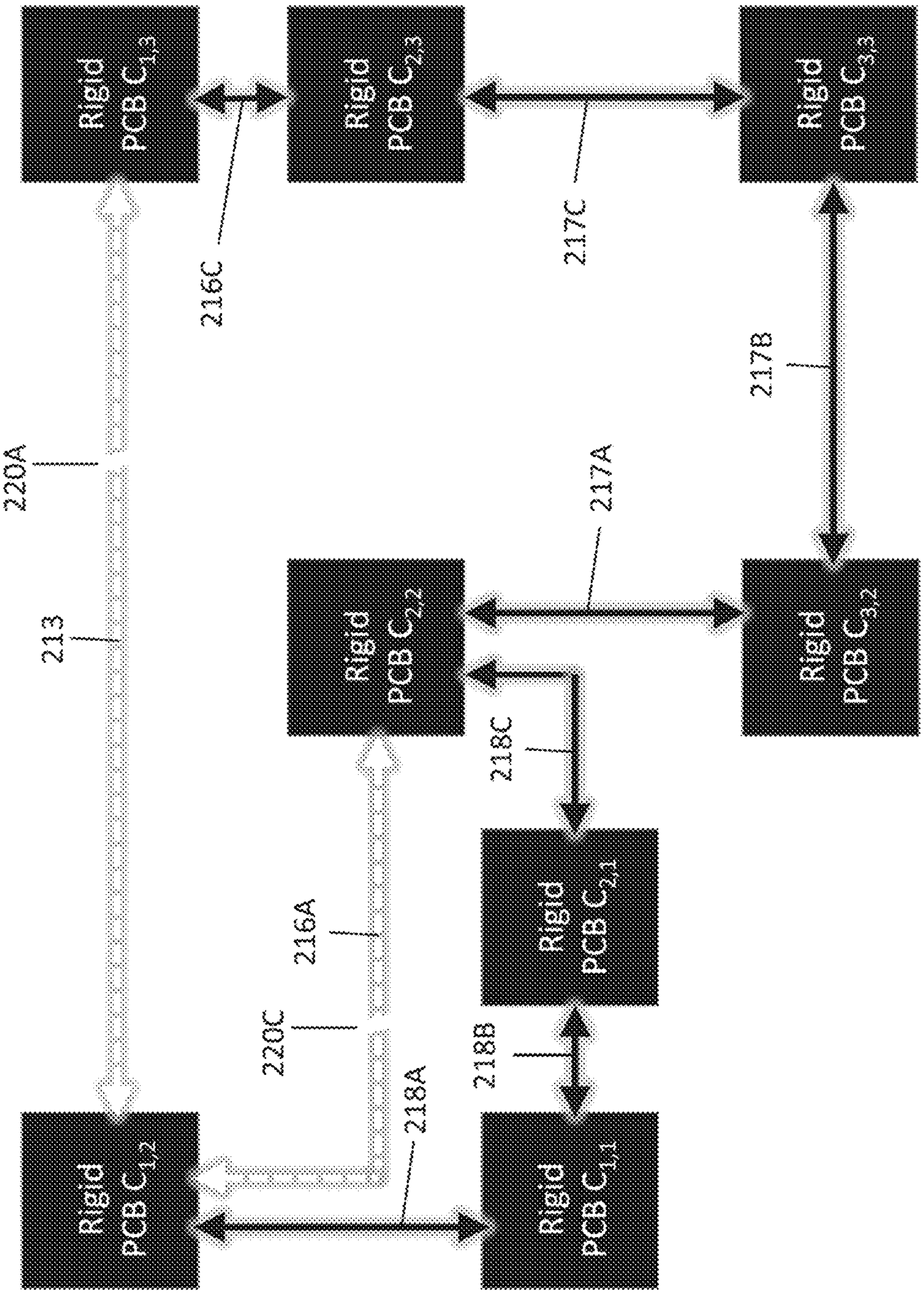
FIG. 16O is a schematic representation showing yet another alternate redundant signal path bypassing two signal-path breaks via six rigid PCBs.

The redundant connections also are able to maintain signal connections in the event of breaks 220A and 220C shown in FIG. 16L where the signal is routed through electrical connections 218A, 218B, 218C, 216B and 216C passing through circuits $C_{1,1}$, $C_{2,1}$, $C_{2,2}$, $C_{2,3}$, and finally into $C_{1,3}$. An alternative signal path around the same breaks shown in FIG. 16M involves electrical connections 218A, 218B, 219A, 219B, 217A, 2168, and 216C passing through circuits $C_{1,1}$, $C_{2,1}$, $C_{2,2}$, $C_{3,2}$, $C_{2,2}$, $C_{2,3}$, and $C_{1,3}$. Another redundant path shown in FIG. 16N comprises electrical connections 218A, 218B, 219A, 219B, 217B, 217C, and 216C passing through circuits $C_{1,1}$, $C_{2,1}$, $C_{3,1}$, $C_{3,2}$, $C_{2,2}$, $C_{2,3}$, and $C_{1,3}$. FIG. 16O illustrates the redundant path 218A, 218B, 218C, 217A, 217B, 217C, and 216C traversing circuits $C_{1,1}$, $C_{2,1}$, $C_{2,2}$, $C_{3,2}$, $C_{3,3}$, $C_{2,3}$, and $C_{1,3}$.

Figure 16P:
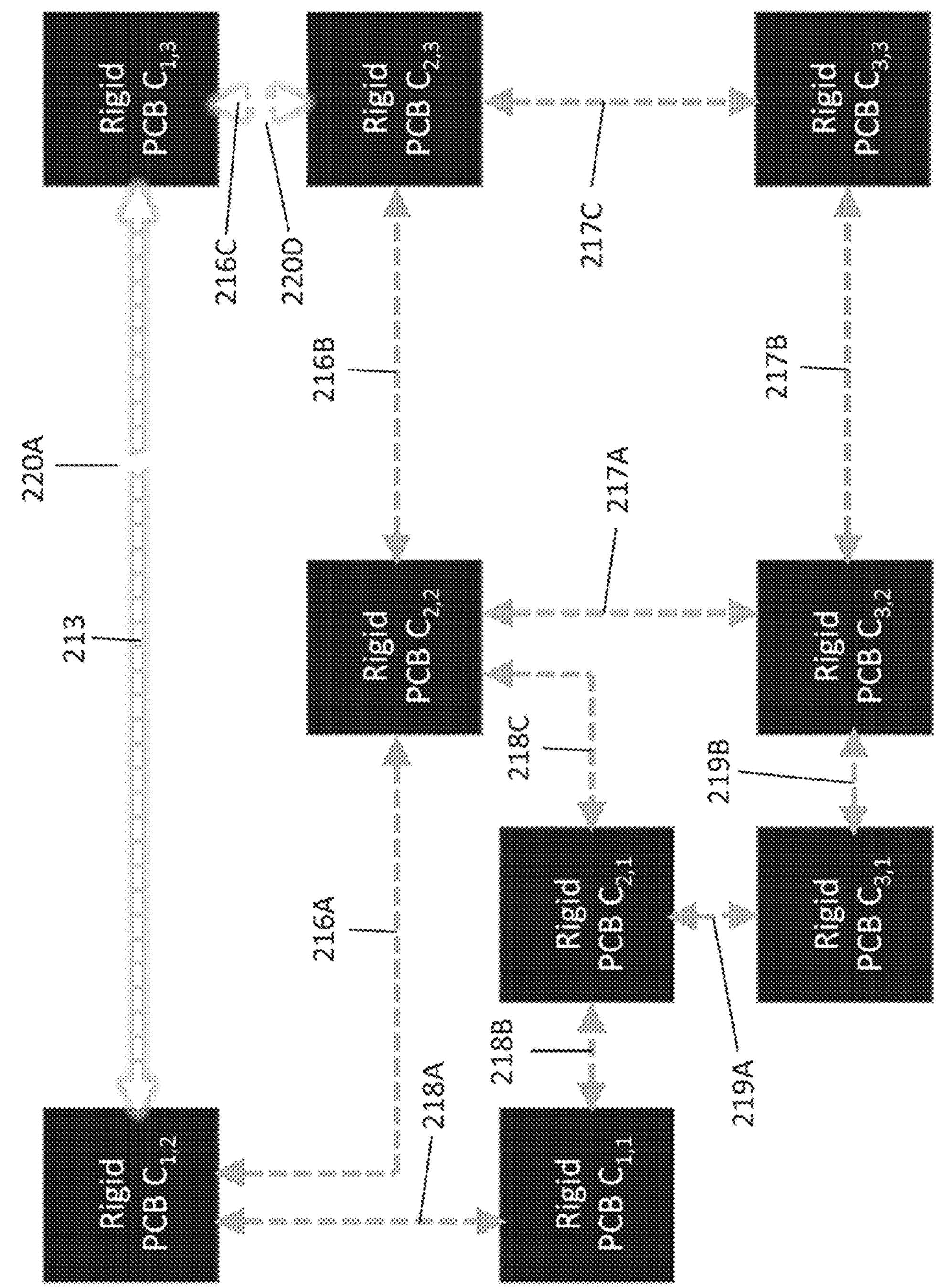
FIG. 16P is a schematic representation showing two signal-path breaks in a rigid PCB array resulting in a system-fatal interconnect failure.

FIG. 16P illustrates the same network where breaks 220A and 220D severs the corresponding signal connections 213 and 216C. Despite all the redundant paths available in the redundant network, the concurrent breaking of both signal connections 213 and 216C cuts off circuit $C_{1,3}$ from the rest of the circuit or system altogether. So despite redundancy, a distributed circuit or system is only as resilient to damage as that of its weakest link.

In the case of redundant signal distribution described above, signals may flow in either direction, i.e. bidirectionally, through the conductive interconnections between and among the numerous rigid PCB circuits. For this reason all the communication interconnects shown in the previous illustrations are represented schematically by lines with arrows pointing in both directions, i.e. bidirectionally. These signals can be distributed homogeneously throughout the grid of circuits. If the circuit elements are also homogeneous then their use of incoming signals is identical. If not, circuits that do not utilize a particular signal can ignore it. Importantly, whether a given circuit uses an incoming signal or not, in redundant signal distribution, every circuit and rigid PCB must pass its incoming signals to all of its neighbors—otherwise the network's redundancy is reduced. This implementation of signal replication in a redundant circuit will be discussed later in this disclosure.

Redundant power distribution is different than redundant signal distribution. While redundant signal distribution is generally homogeneous and bidirectional, without a predefined direction of signal flow between the circuit elements, power distribution is generally directional, flowing from a power source to the electrical loads and not in the reverse direction. The power source of the system is the circuit or rigid PCB containing the source of power, which may by example comprise

- A connector connected to an external power source
- A power supply or voltage regulator circuit
- A battery
- A capacitor or super capacitor
- A charger circuit connected to a power source by a cable or connector, e.g. USB
- A wireless charger circuit In cases where the power source is portable, some means must be made for charging the battery, capacitor, or local energy storage element either through a connector or wirelessly through radio or magnetic coupling. Regardless of the source of power, throughout the grid of circuits power flows in only one direction—from the power source, i.e. the rigid PCB containing the power circuit, to the other circuits. So unlike signals that may flow bidirectionally, power flows "unidirectionally" from a source of power to electrical loads, in this case, the circuits being powered.

Figure 17A:
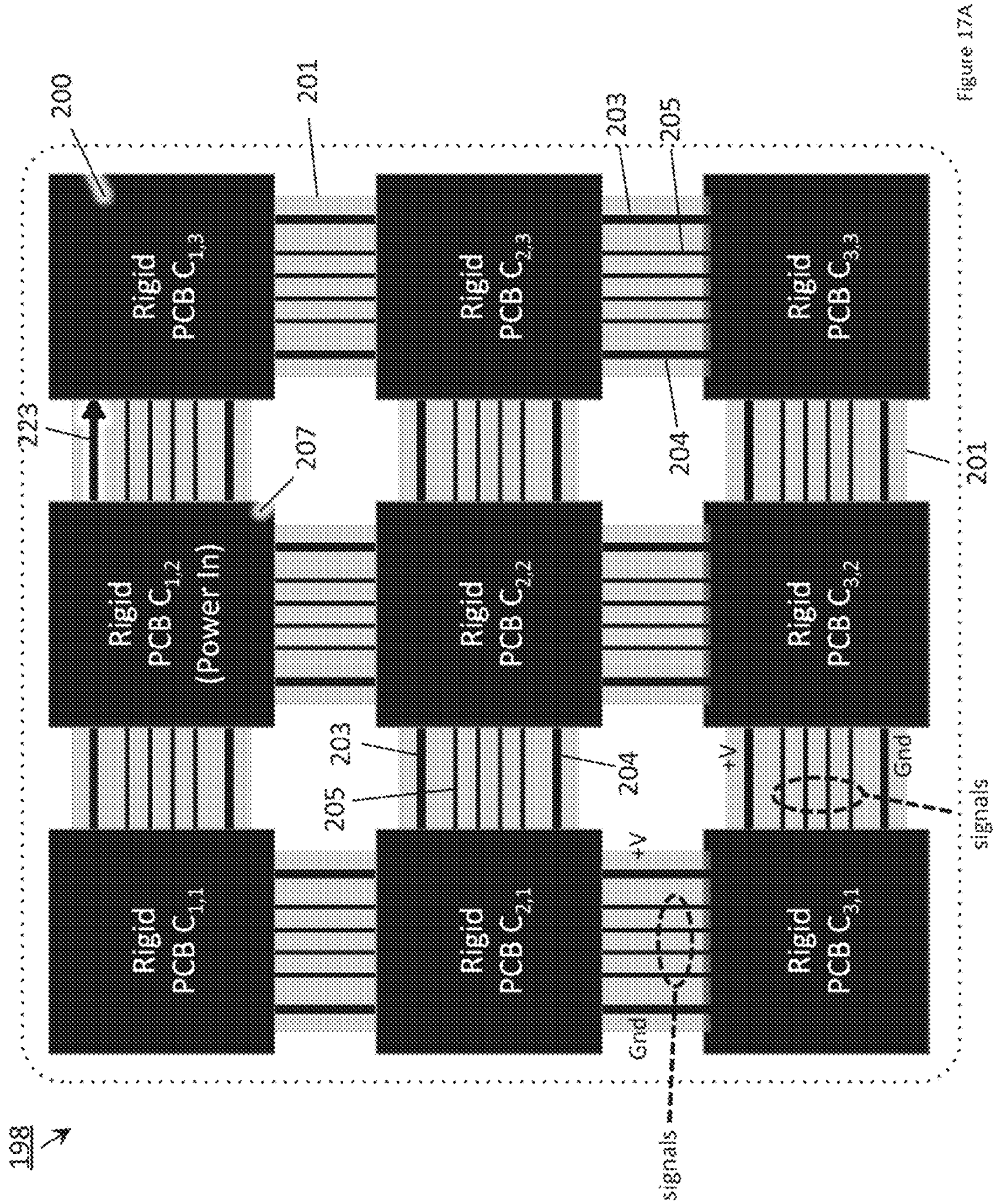
FIG. 17A is a schematic representation of an array of rigid PCBs highlighting the shortest conductive path of a power-bus interconnection facilitated by a single flex PCB.
Figure 178:
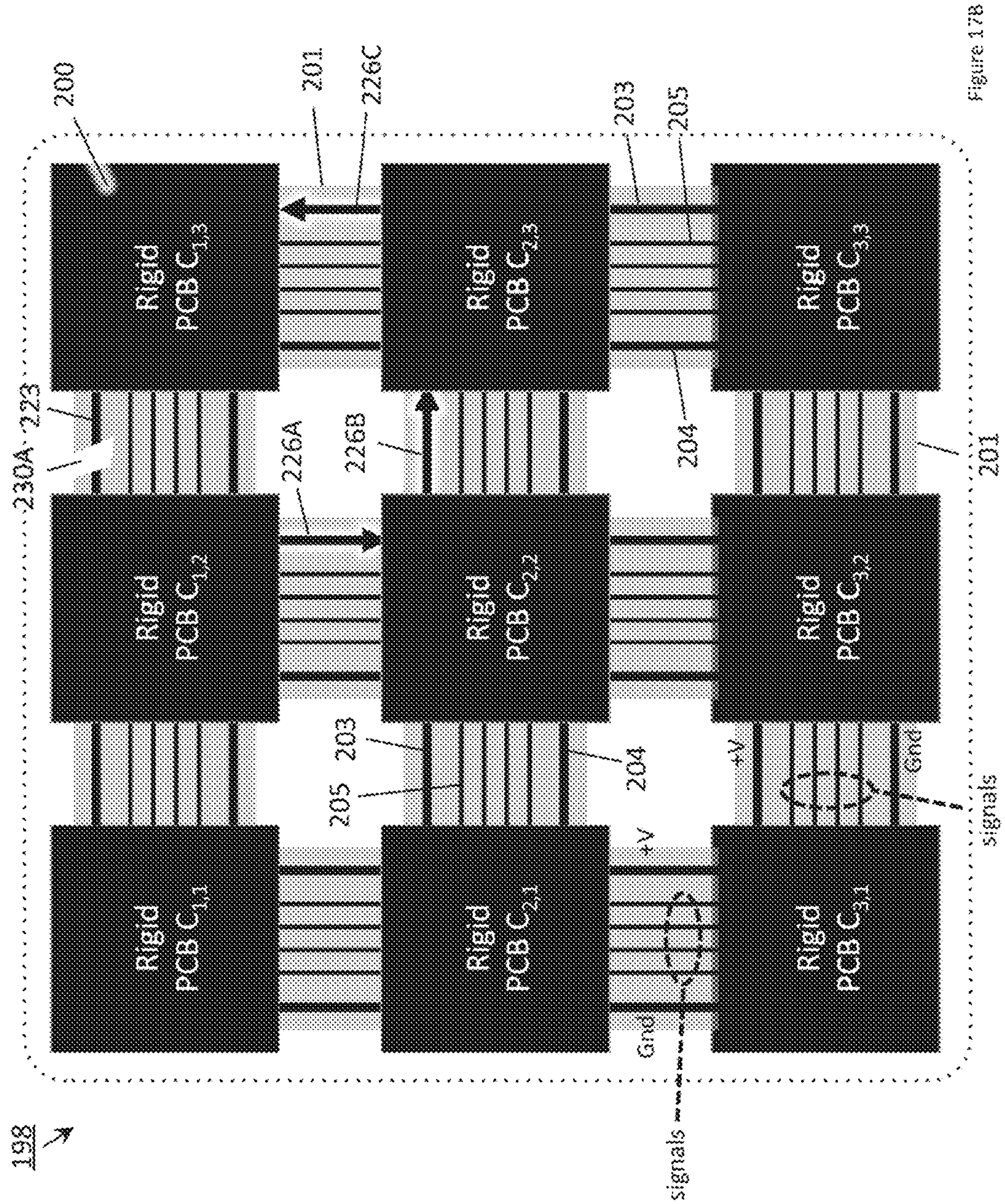

As such, the redundant circuit implementation 198 shown in FIG. 17A comprising rigid PCBs 200 containing circuits $C_{1,1}$ to $C_{3,3}$ interconnected by flex connectors 203 includes power 203 and ground 204 that together carry energy throughout the array of circuits. Assuming as an example that circuit $C_{1,2}$ in rigid PCB 207 contains the source of power for the entire system, then to power circuit $C_{1,3}$ power will flow through power bus 223 from circuit $C_{2,2}$ to circuit $C_{1,3}$. If as shown in FIG. 17B, power bus 223 is interrupted by break 230A then power can still flow through other routes including for example a path comprising power buses 226A, 226B, and 226C.

Figure 17C:
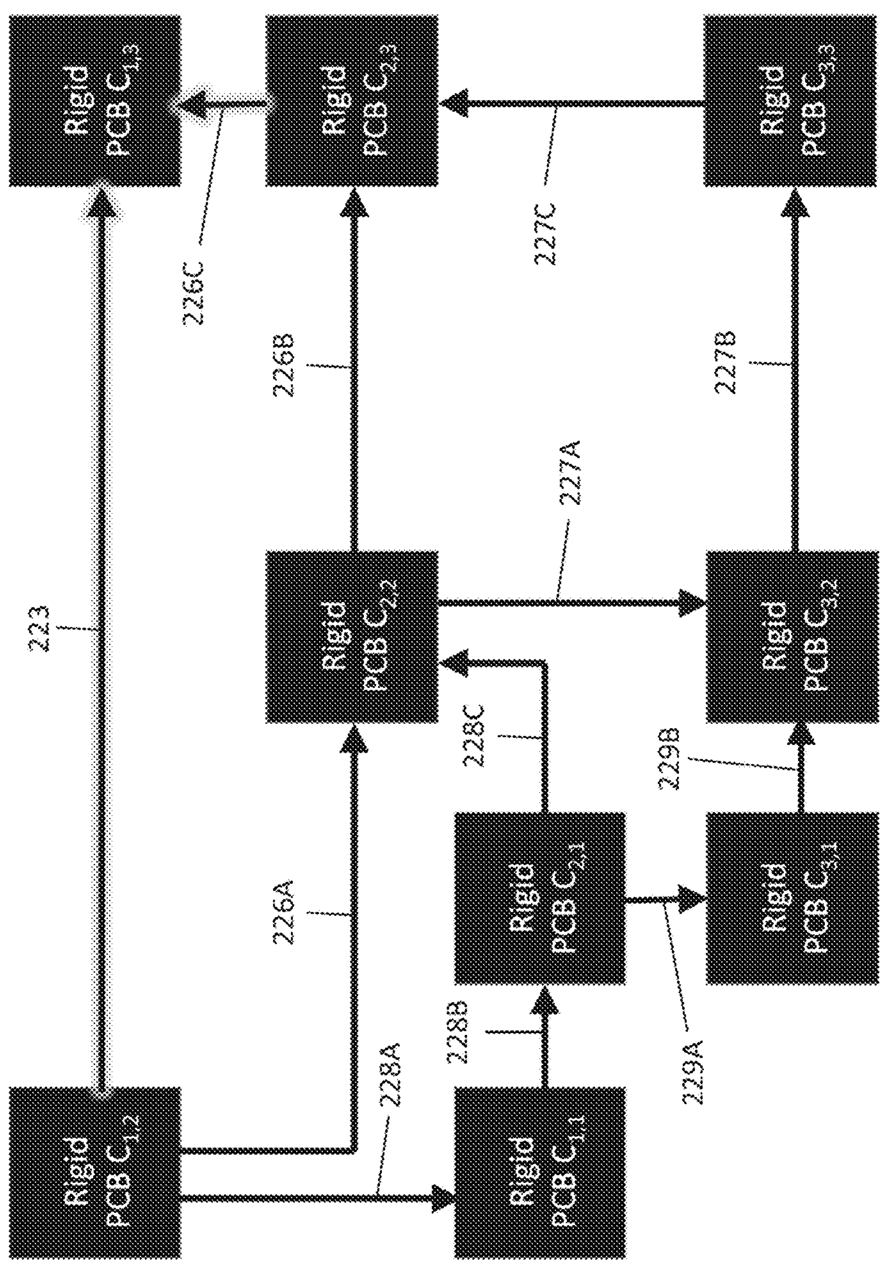
FIG. 17C is an alternate schematic representation of an array of rigid PCBs showing multiple redundant power-bus interconnections.
Figure 17D:
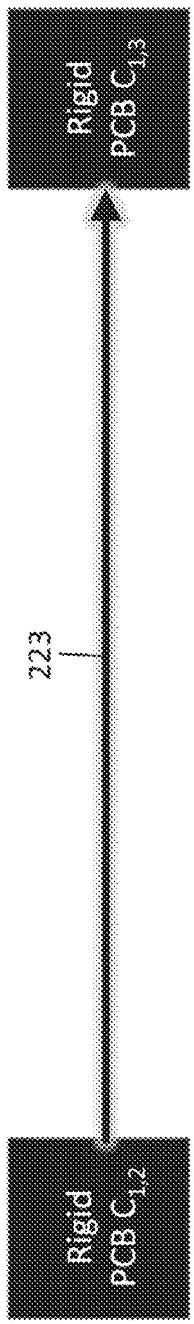
FIG. 17D is a schematic representation showing the shortest power-bus between rigid PCBs.
Figure 17E:
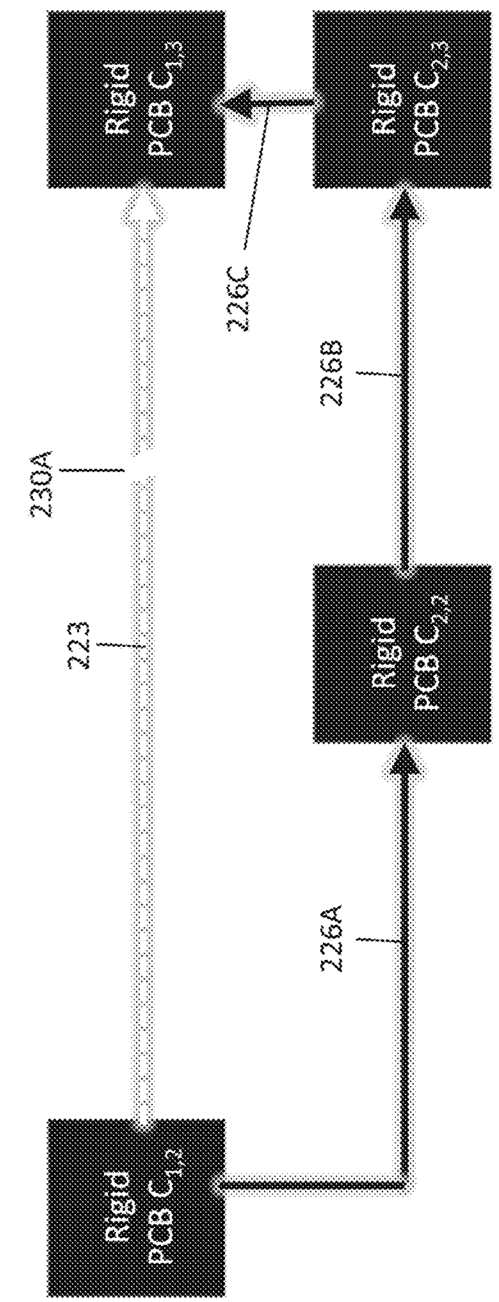
FIG. 17E is a schematic representation showing a redundant power bus bypassing a single power-bus break via two rigid PCBs.
Figure 17F:
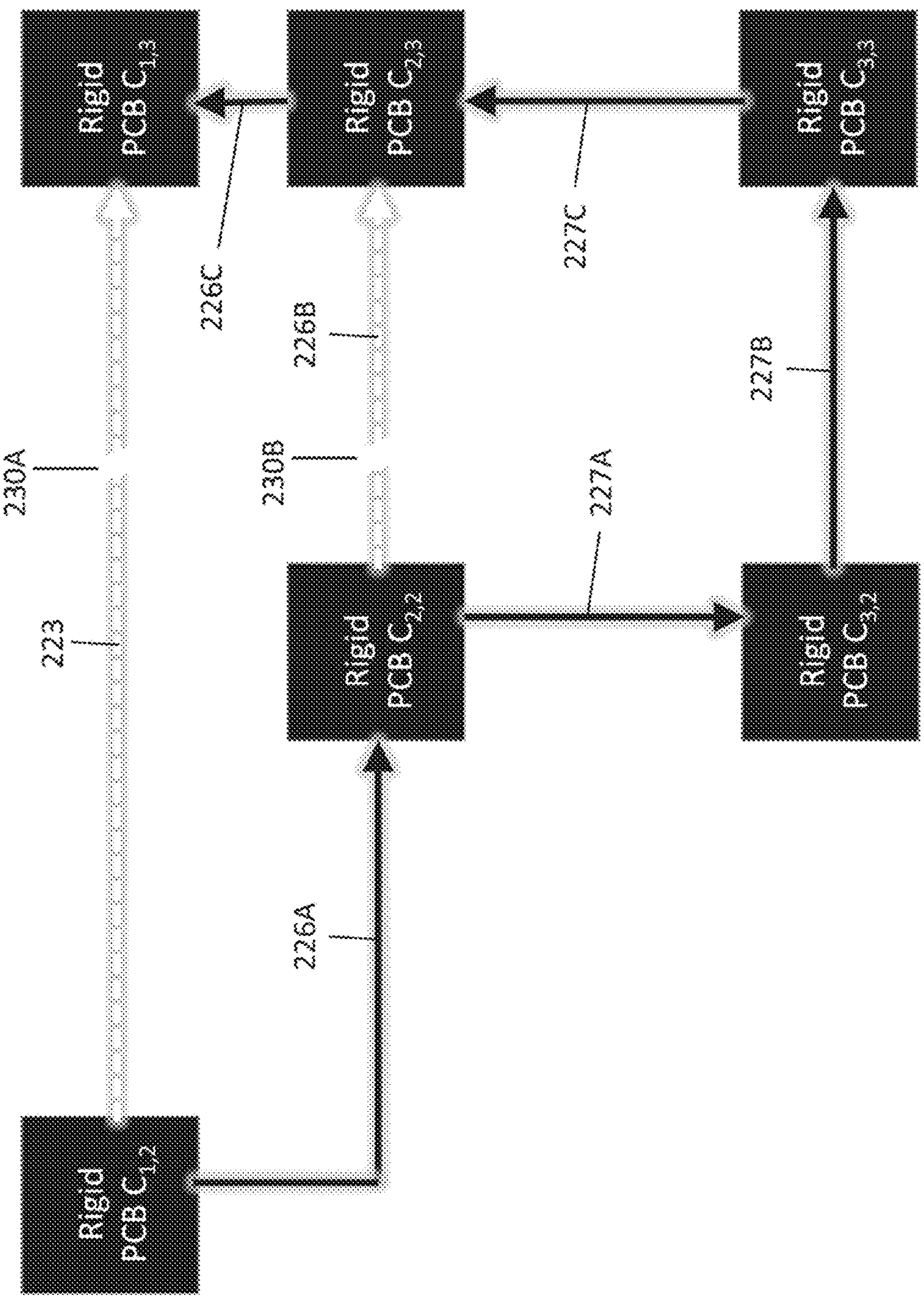
FIG. 17F is a schematic representation showing a redundant power bus bypassing two power-bus breaks via four rigid PCBs.
Figure 17G:
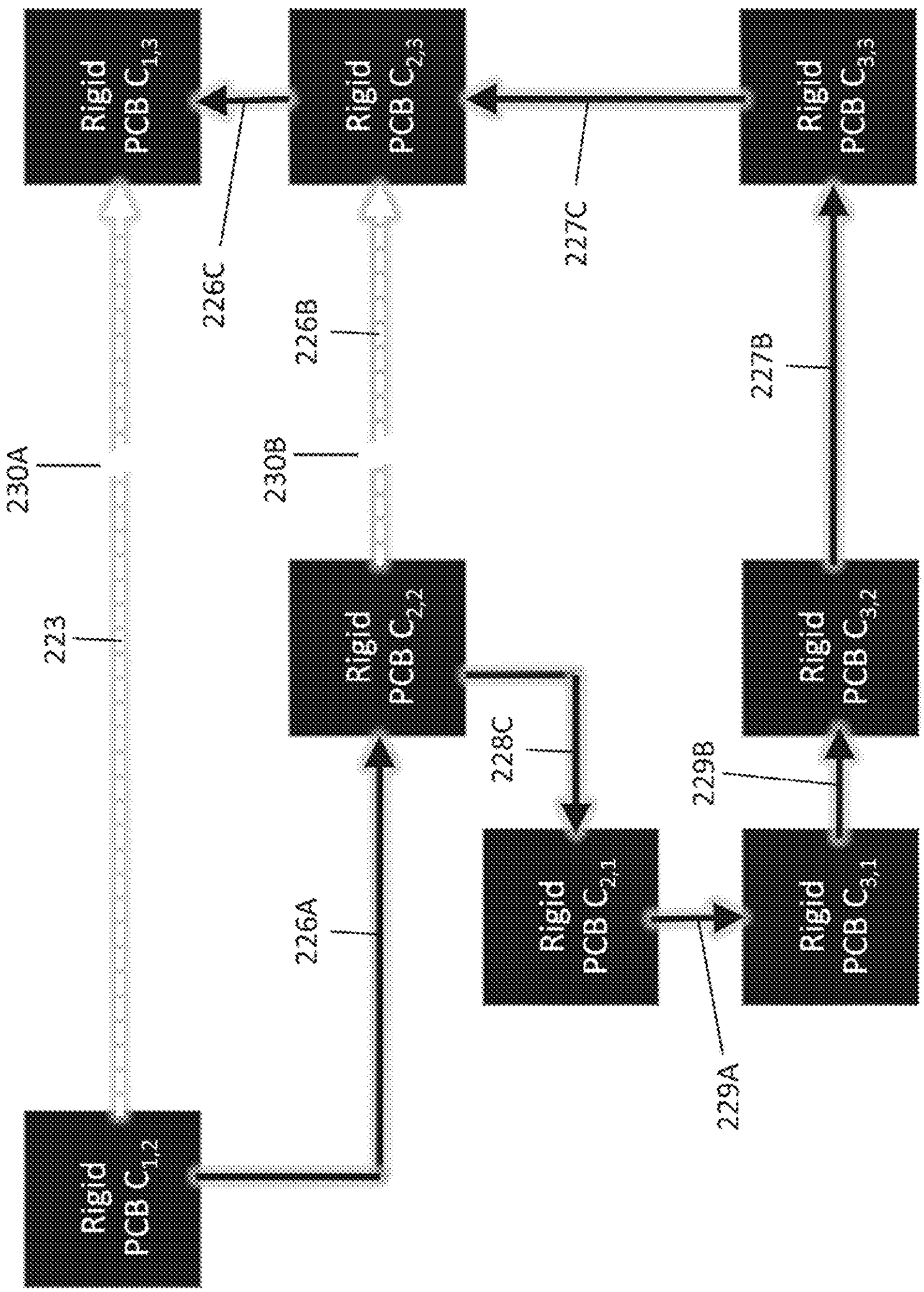
FIG. 17G is a schematic representation showing an alternate redundant power bus bypassing two power-bus breaks via six rigid PCBs.
Figure 17H:
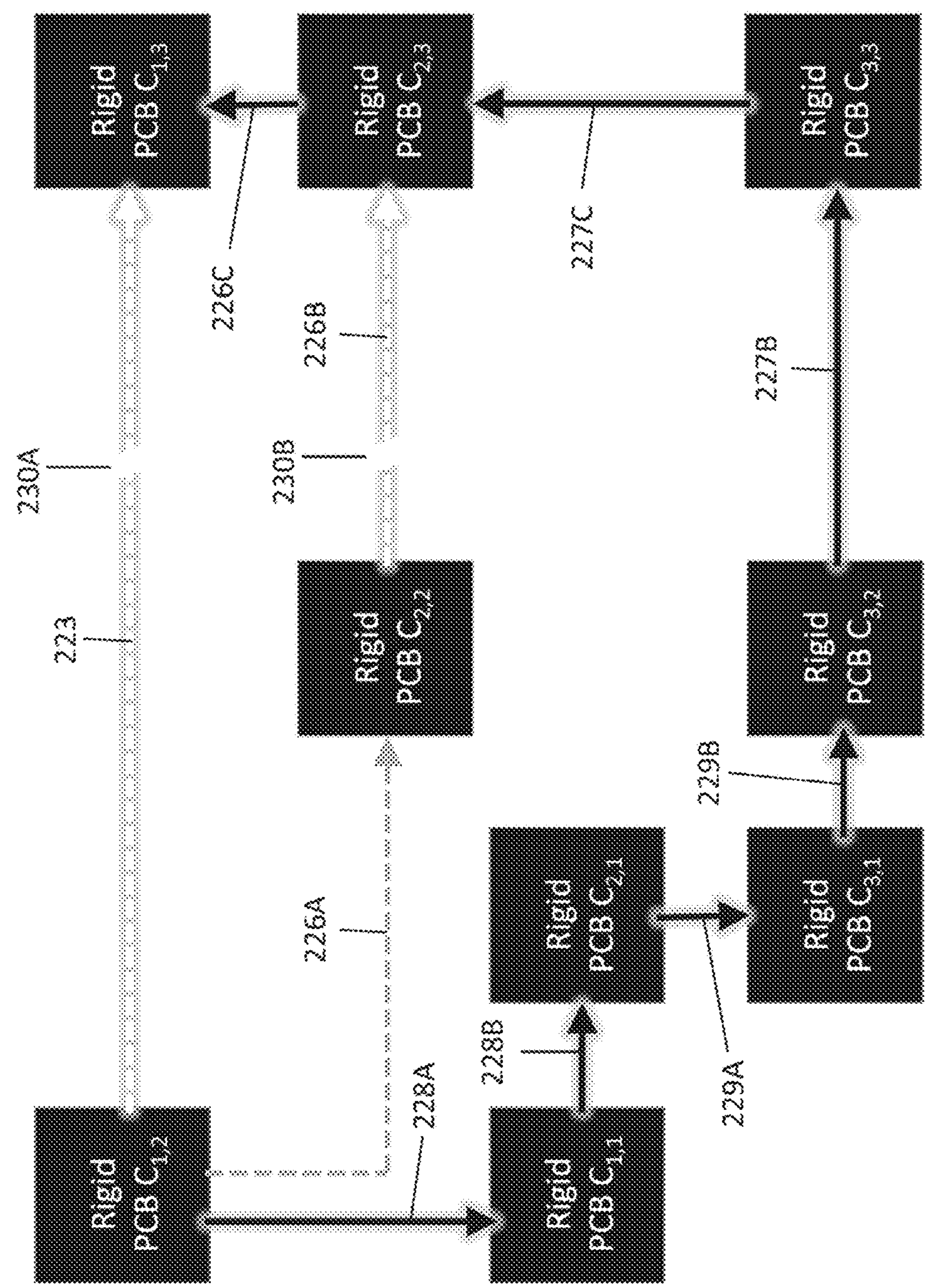
FIG. 17H is a schematic representation showing another alternate redundant power bus bypassing two power-bus breaks via six rigid PCBs.
Figure 17I:
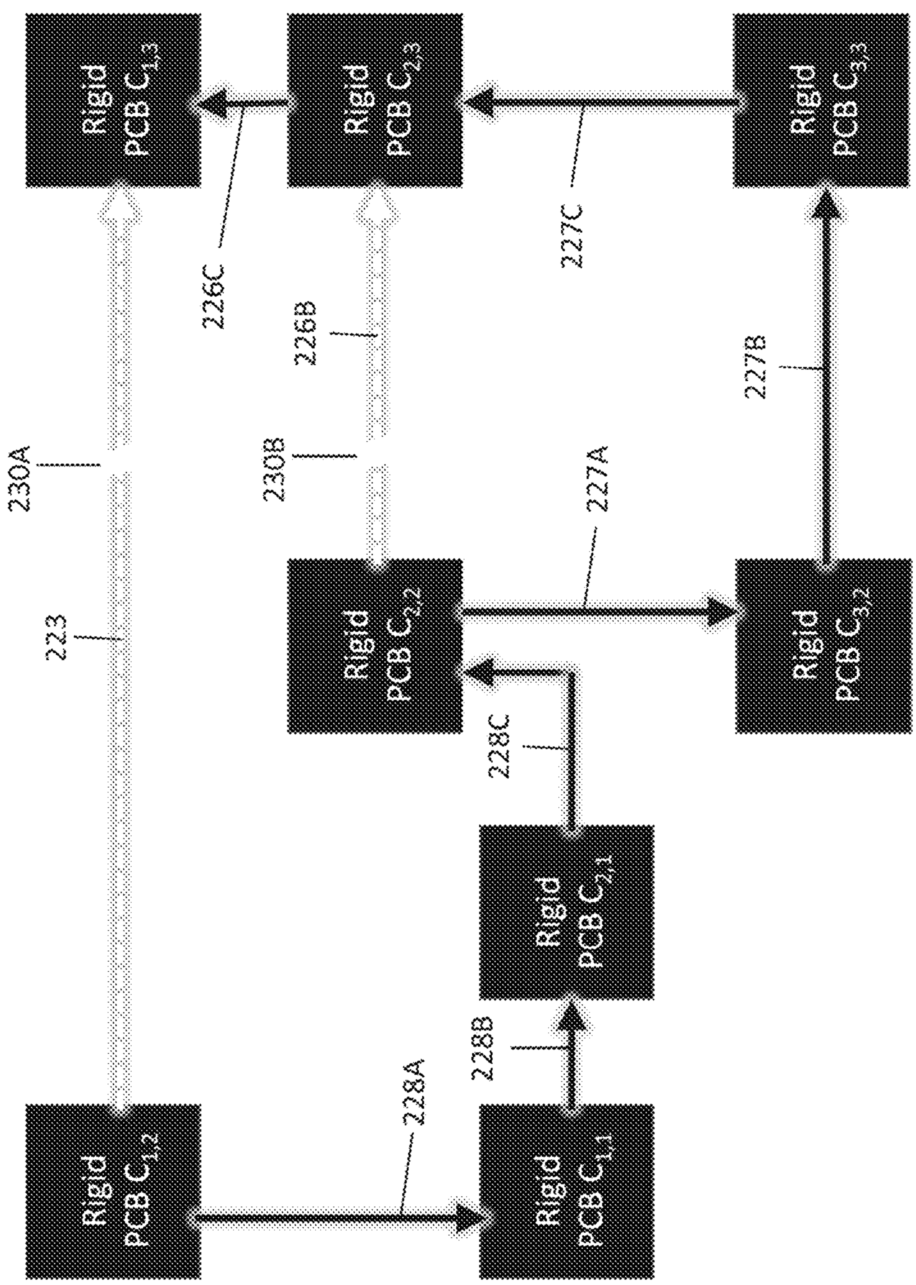
FIG. 17I is a schematic representation showing yet another alternate redundant power bus bypassing two power-bus breaks via six rigid PCBs.

An alternative schematic representation of redundant circuit implementation 198 shown in FIG. 17C better topologically illustrates the various power paths including the shortest path comprising power bus 223 shown in FIG. 17D. As aforementioned, if power bus 223 is interrupted by break 230A as illustrated in FIG. 17E, then power can reroute itself through power buses 226A, 226B, and 226C including intervening circuits $C_{2,2}$ and $C_{2,3}$. If however, power buses 223 and 226B are both interrupted by corresponding breaks 230A and 230B, power can be delivered through any number of redundant power paths including the following:

- Power buses 226A, 227A, 227B, 227C, and 226C (and intervening circuits $C_{2,2}$, $C_{3,2}$, $C_{3,3}$, and $C_{2,3}$ as depicted in FIG. 17F.
- Power buses 226A, 228C, 229A, 229B, 227B, 227C, and 226C' including intervening circuits $C_{2,2}$, $C_{2,1}$, $C_{3,1}$, $C_{3,2}$, $C_{3,3}$, and $C_{2,3}$, as depicted in FIG. 17G.
- Power buses 228A, 228B, 229A, 229B, 227B, 227C, and 226C including intervening circuits $C_{1,1}$, $C_{2,1}$, $C_{3,1}$, $C_{3,2}$, $C_{3,3}$, and $C_{2,3}$ as depicted in FIG. 17H.
- Power buses 228A, 228B, 228C, 227A, 227B, 227C, and 226C including intervening circuits $C_{1,1}$, $C_{2,1}$, $C_{2,2}$, $C_{3,2}$, $C_{3,3}$, and $C_{2,3}$ as depicted in FIG. 17I.

Figure 17J:
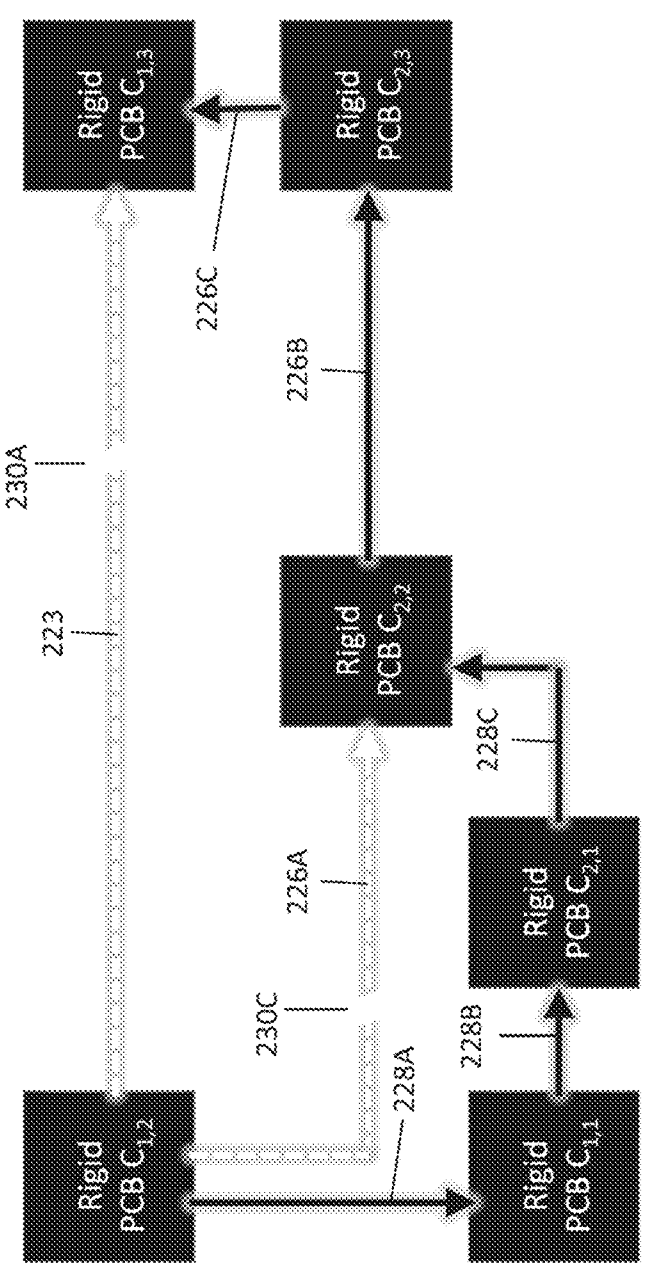
FIG. 17J is a schematic representation showing a redundant power bus bypassing two power bus breaks via four rigid PCBs.
Figure 17K:
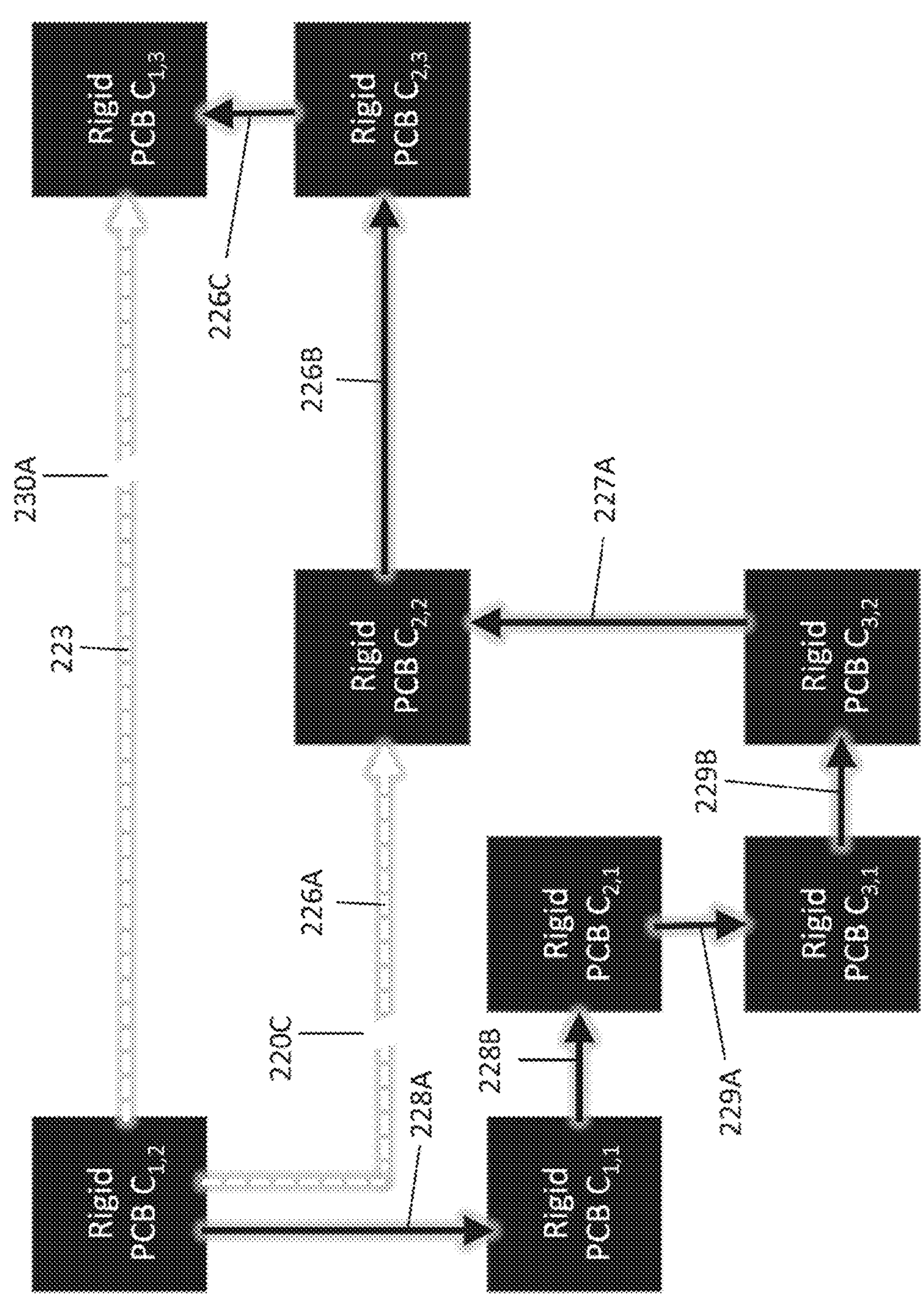
FIG. 17K is a schematic representation showing a redundant power bus bypassing two power-bus breaks via six rigid PCBs.
Figure 17L:
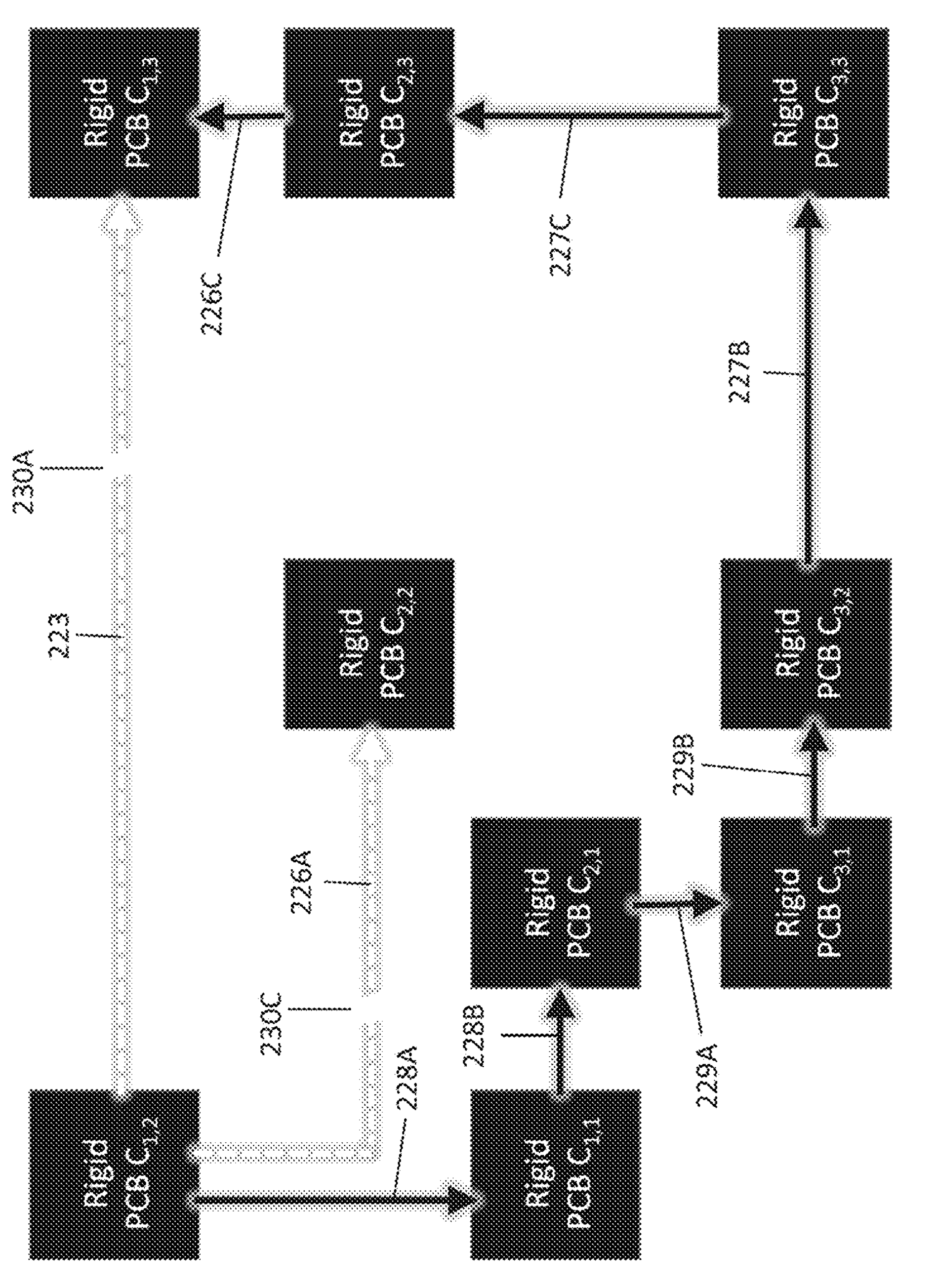
FIG. 17L is a schematic representation showing an alternate redundant power bus bypassing two power-bus breaks via six rigid PCBs.
Figure 17M:
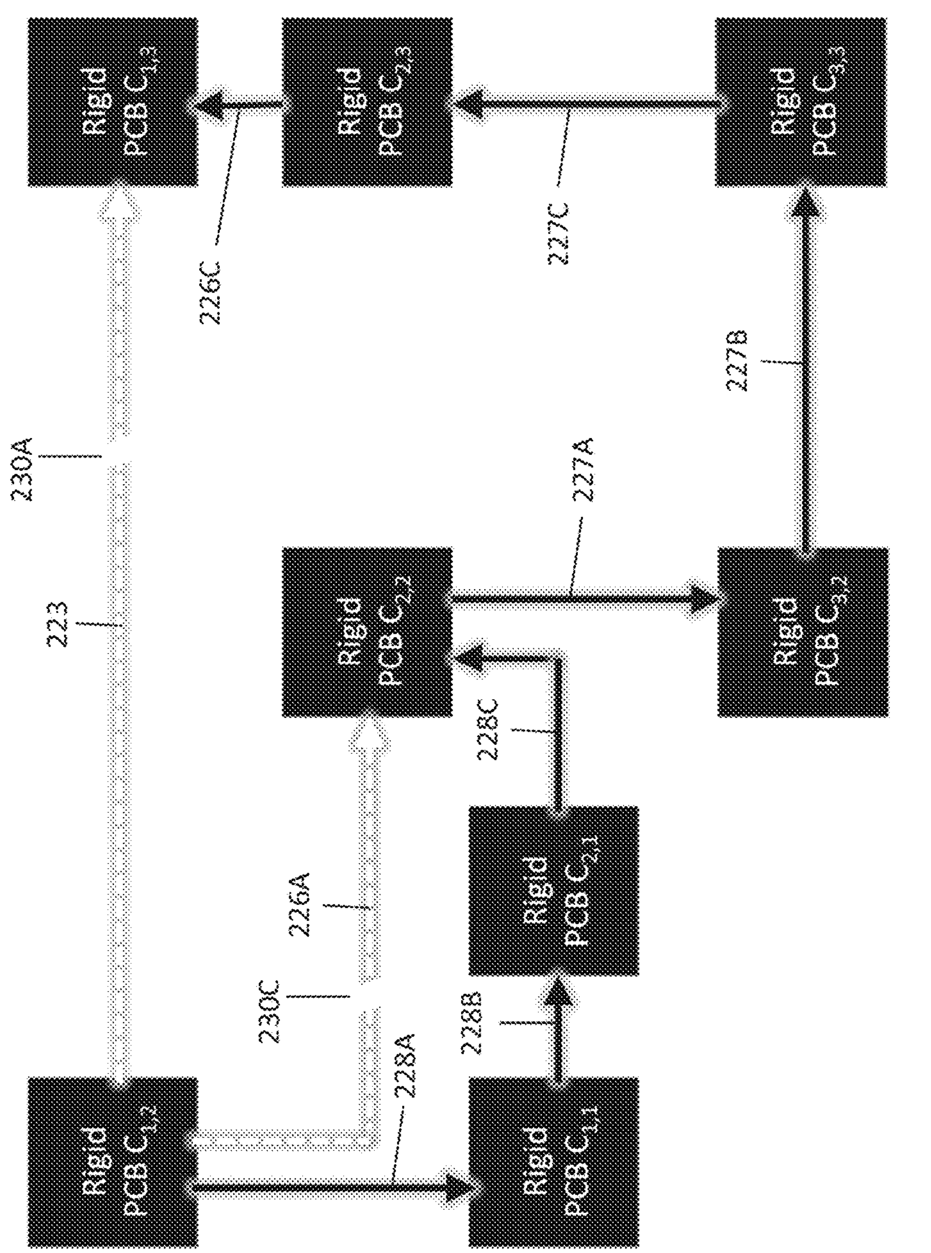
FIG. 17M is a schematic representation showing yet another alternate redundant power bus bypassing two power-bus-breaks via six rigid PCBs.
Figure 17N:
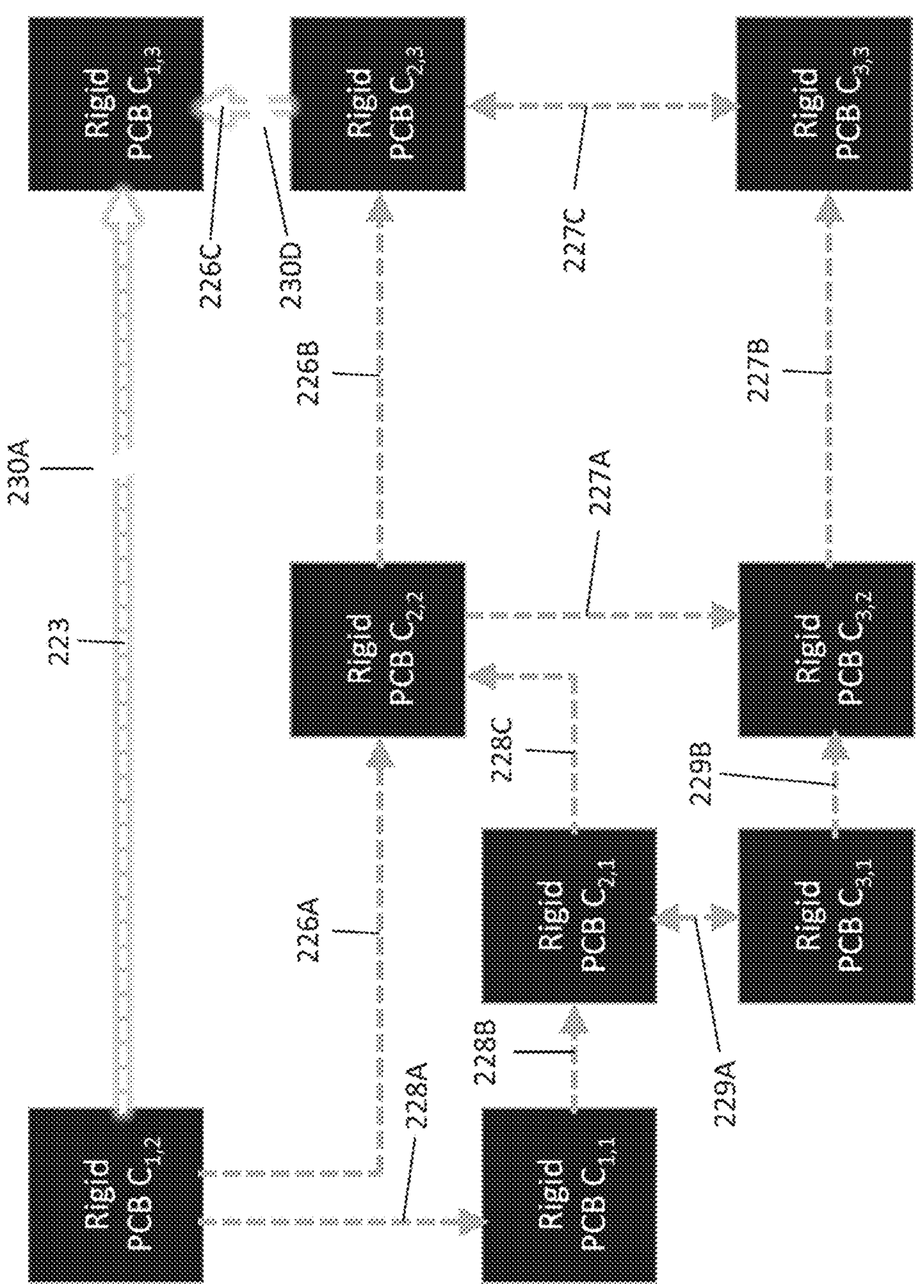
FIG. 17N is a schematic representation showing two critical power-bus breaks in a rigid PCB array resulting in a system-fatal power bus failure.

If alternatively power buses 223 and 226A are both interrupted by corresponding breaks 230A and 230C shown in FIG. 17J, power can similarly be delivered through any number of redundant power paths including the following:

- Power buses 228A, 228B, 228C, 226B, and 226C and intervening circuits $C_{1,1}$, $C_{2,1}$, $C_{3,3}$, $C_{2,2}$, and $C_{2,3}$ as depicted in FIG. 17J.
- Power buses 228A, 228B, 229A, 229B, 227A, 226B, and 226C and intervening circuits $C_{1,1}$, $C_{2,1}$. $C_{3,1}$, $C_{3,2}$, $C_{2,2}$, and $C_{2,3}$ as depicted in FIG. 17K.
- Power buses 228A, 228B, 229A, 229B, 227B, 227C, and 226C and intervening circuits $C_{1,1}$, $C_{2,1}$, $C_{3,1}$, $C_{3,2}$, $C_{3,3}$, and $C_{2,3}$ as depicted in FIG. 17L.
- Power buses 228A, 228B, 228C, 227A, 227B, 227C, and 226C and intervening circuits $C_{1,1}$, $C_{2,1}$, $C_{2,2}$, $C_{3,2}$, $C_{3,3}$, and $C_{2,3}$ as depicted in FIG. 17M.

In the event break 230A interrupts power bus 223 and break 230D interrupts power bus 226C, then circuit $C_{1,3}$ is completely disconnected from all power sources and a system failure results. As such the weakest link, the circuit with the fewest redundant connections, sets the reliability of the system.

Figure 18A:
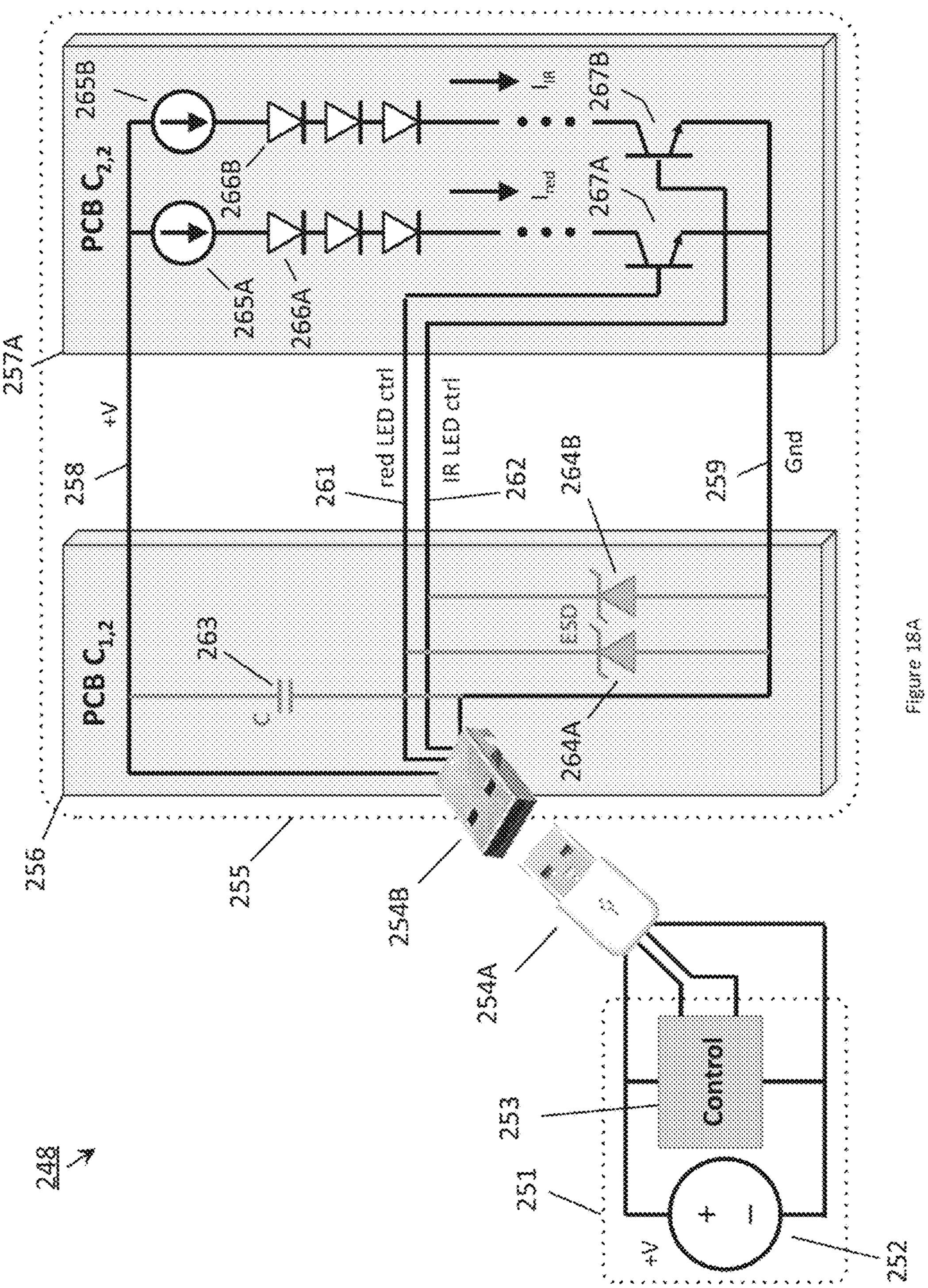
FIG. 18A is a schematic representation of a phototherapy system lacking redundant power or signal distribution.

The methods of redundant signal routing and power busing in a distributed system disclosed herein apply to a wide range of applications. One such example is in their use in medical applications for phototherapy. In a non-redundant phototherapy apparatus 248 shown in FIG. 18A, the system comprises a power supply and control circuit, i.e. controller 251 connected by a USB cable and connectors 254A and 254B to one or more polymeric pads containing hundreds of red and infrared LEDs and drive circuitry, i.e. LightPad 255. Through the USB cable and connectors, controller 251 containing regulated DC power supply 252 and control circuitry 253 supplies LightPad 255 with power to drive multiple strings of red LEDs 266A and infrared LEDs 266B, and the gate control signals, specifically red LED control signal 261 and IR LED control signal 262 needed to pulse the LEDs at different excitation frequencies.

As shown, USB connector 254B mounted on rigid PCB 256 comprising circuit $C_{1,2}$ receives four electrical connections from controller 251, namely power supply V+ 258, red LED control 261, IR LED control 262 and ground 259. ESD diodes 264A and 264B protect the signal lines red LED control 261 and IR LED control 262 from electrostatic discharge induced damage. Capacitor 263 provides filtering from noise on power supply line V+ 258. These four lines are then distributed electrically to other PCBs within LightPad 255 such as rigid PCB 257A in present day systems using soldered wires or ribbon cable and their associated connector sockets and plugs.

Circuit $C_{2,2}$ implemented in rigid PCB 257A comprises strings of red LEDs 266A and IR LEDs 267B pulsed on and off by bipolar transistors 267A and 267B in accordance with gate signals of red LED control 261 and IR LED control 262. During conduction, the current in the red and IR LED strings is set by preprogrammed current sources 265A and 265B. Because a single connector or ribbon cable contains the power and signals for interconnections 258, 259, 261 and 262 between circuit $C_{1,2}$ and $C_{2,2}$ any break in that cable or its connectors will results in a system failure.

Figure 18B:
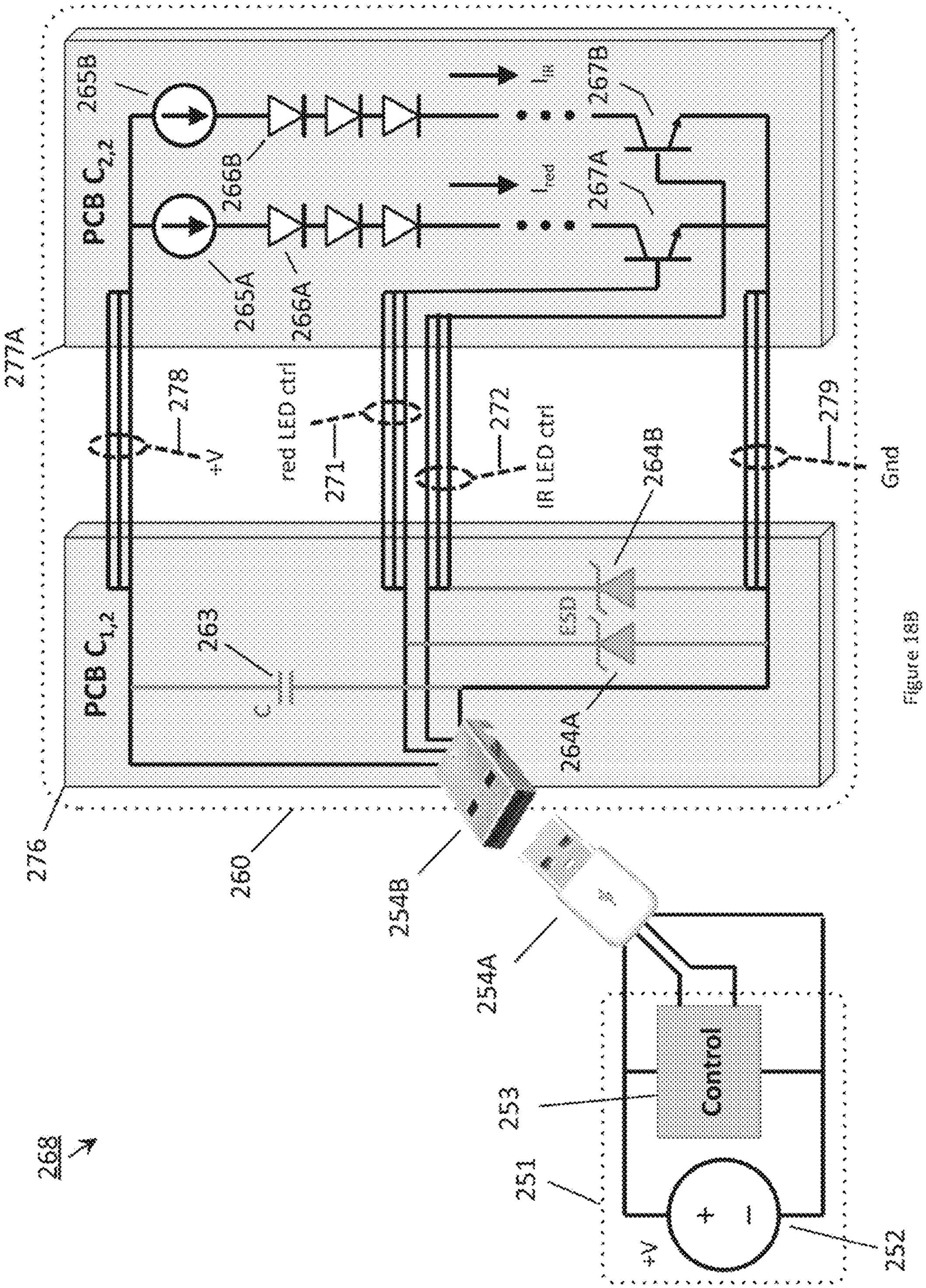
FIG. 18B is a schematic representation of a phototherapy system comprising both redundant power busses and redundant signal distribution.

By contrast, a redundant phototherapy apparatus 268 is illustrated in FIG. 18B. Circuit operation is identical to non-redundant phototherapy apparatus 248 except that the interconnection between circuit $C_{1,2}$ and $C_{2,2}$ occurs through three different redundant conductive paths, not one. As such, three parallel lines are used to schematically represent redundant conductive paths for power V+ 278, red LED control 271, IR LED control 272, and ground 279. A break in any one or two of these lines will not adversely impact circuit operation. To adversely affect operation, all three lines of the same power or signal must break.

In another embodiment of this invention, interconnections between rigid PCB 276 and rigid PCB 277A are realized using a merged rigid-flex PCB technology whereby the flex PCB grid interconnecting the various islands of rigid PCBs are fabricated together as a single PCB comprising a grid pattern of flex PCB with islands of rigid PCBs. Fabrication of the rigid-flex PCB to facilitate redundant interconnections is discussed later in this application.

Figure 18C:
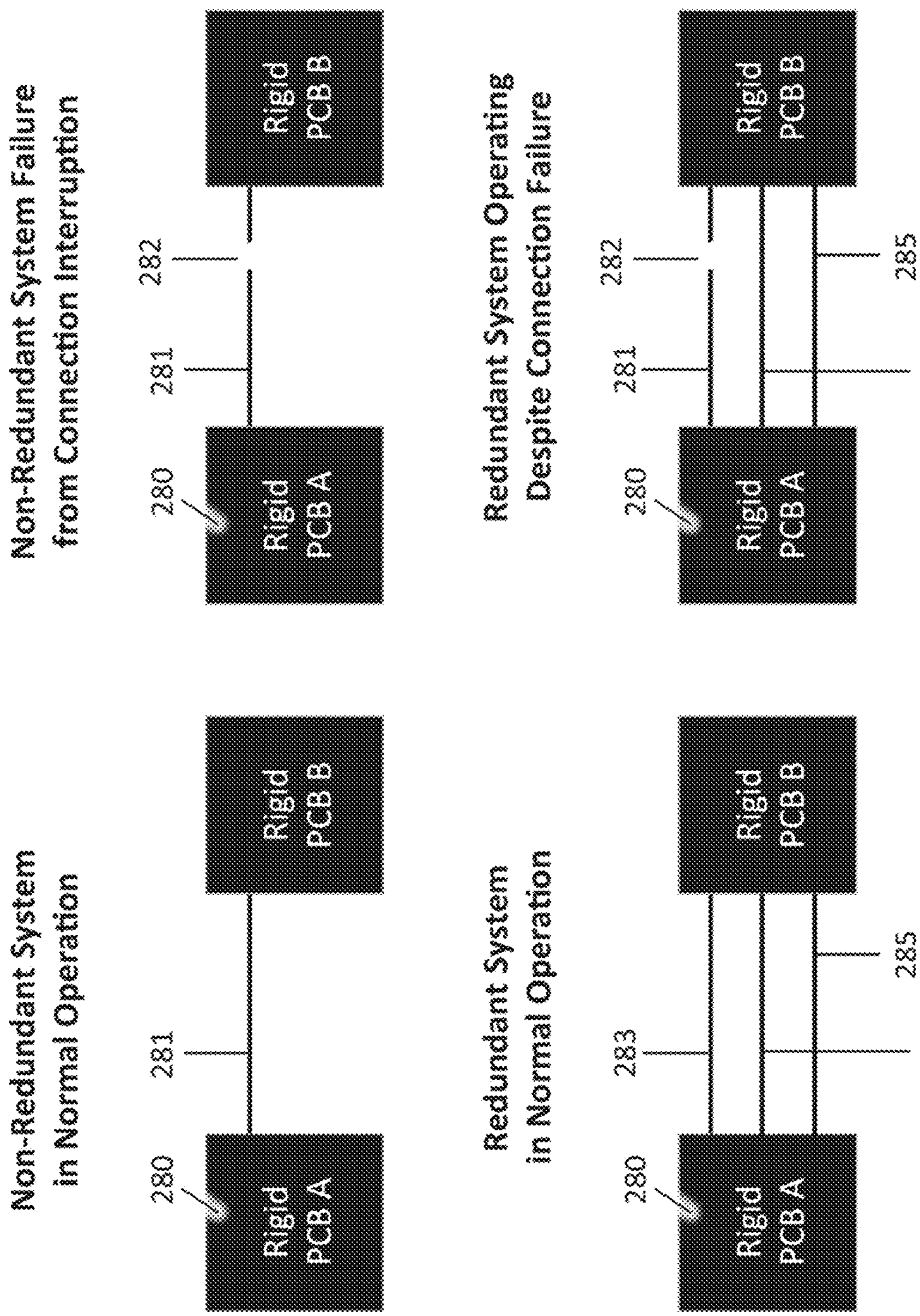
FIG. 18C is a schematic of non-redundant and redundant electrical systems in normal operation and during a connection failure.

FIG. 18C compares non-redundant and redundant systems under normal operating conditions and after damage. The interconnection of rigid PCBs by a single conductive path 281 fails when an open circuit 282 occurs as a result of damage. In contrast, the interconnection of rigid PCBs by a multiple conductive paths 283, 284 and 285 does not fail when damage induces open circuit 282 in path 281 because power, signals, or information can still flow through conductors 284 and 285 unimpeded. As a result system operation remains unimpaired despite damage. Since three connections contact rigid PCB B, it takes three breaks to disrupt operation. This means after the main connection is severed, two more redundant links survive to continue operation.

Figure 18D:
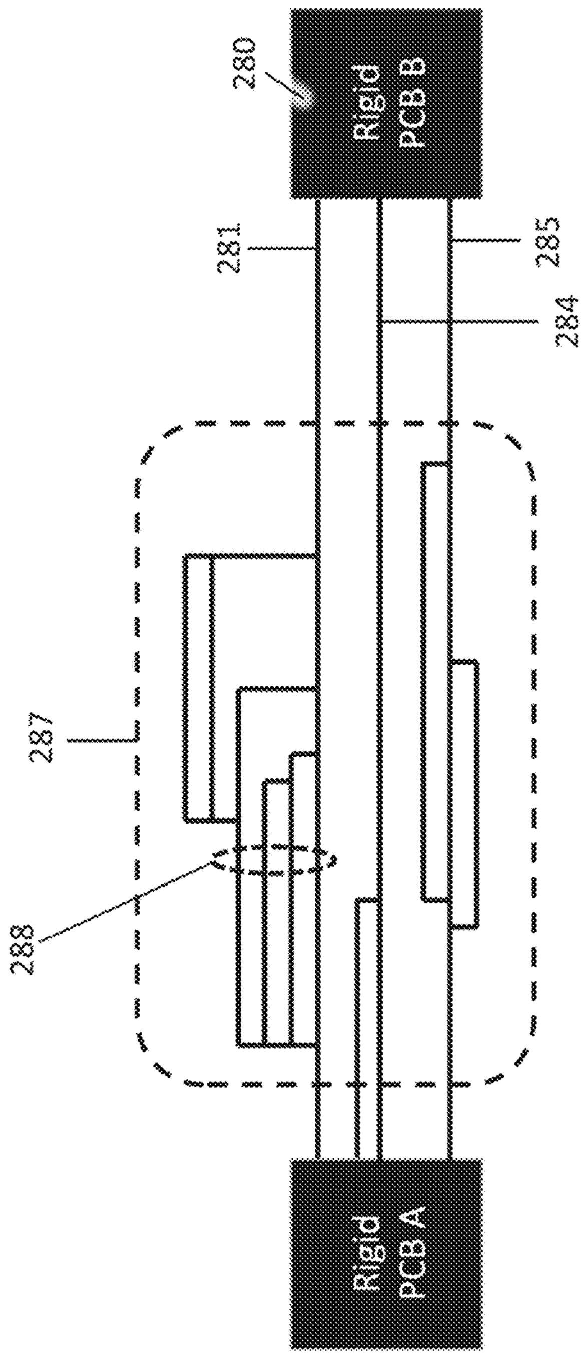
FIG. 18D is a schematic of multiple redundant electrical connections resulting in RF=2 interconnect redundancy.

So while numerous other paths may exist to support conduction, to guarantee operation of rigid PCB B, only the number of connections connecting directly to it matter. FIG. 18D illustrates the point that while multiple parallel conductive paths 287 may improve the statistical chance for the overall circuit to survive damage, the extra paths do not improve the survival rate of connectivity to a particular PCB, in this case PCB B. For example, connection 281 widens into three parallel conductive paths 288 but still enters into rigid PCB 280, specifically PCB B, by a single connection. Connections 284 and 285 also comprise parallel paths in some portions of the interconnection network but still comprise one conductor when they connect into rigid PCB 280, specifically PCB B. In essence, only the number of connections into a particular circuit is important in determining a particular circuit's resilience to damage, and only with the proviso that these connections also link to other redundant connections in the system. The resilience of a system or circuit to survive damage is considered further here below.

Redundant Circuit Topologies

Figure 19:
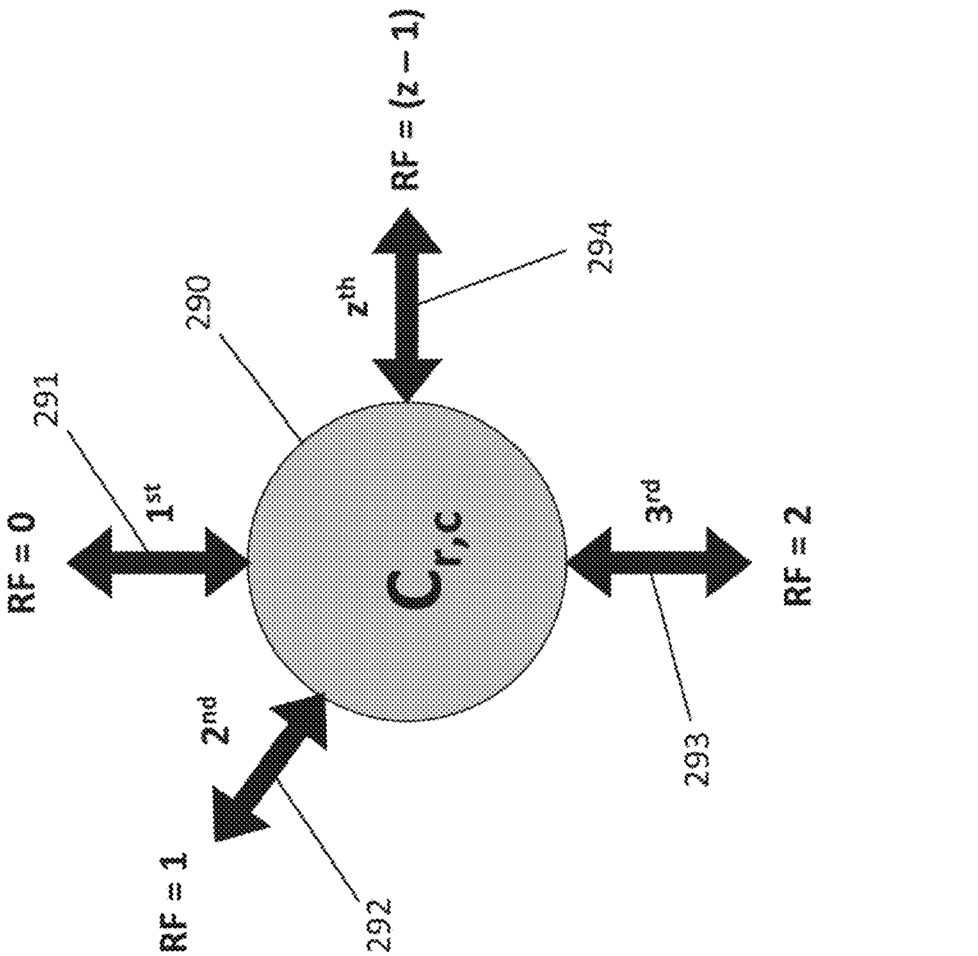
FIG. 19 is a schematic representation defining redundancy factor (RF) by the number of redundant interconnections on a circuit or rigid PCB.

The redundancy of each component circuit in a redundant system depends on its connectivity to other component circuits in the network. FIG. 19 illustrates that for any given circuit element 290 denoted as element $C_{r,c}$ in an array comprising "r" rows of circuits and "c" number of columns, the interconnect redundancy of the specific circuit element $C_{r,c}$ depends on the number of electrical interconnections attached to it. In this context the term electrical interconnection means only interconnections that are connected to other circuits in the same circuit or system.

If, for example, circuit component 290 is connected to only one other circuit via interconnection 291, then the $1^{st}$ and only connection is has no redundancy because if it fails the circuit component 290 fails. For the purposes of this application, we define herein the term "redundancy factor" or RF to mean the total number of electrical connections "z" minus one, or mathematically as $$RF=(z-1)$$

In accordance with the above equation with only one connection, i.e. where z=1, then the redundancy factor RF=0 meaning there is no connection redundancy and a single point of failure will certainly cause a system failure or electrical malfunction. In the event that both electrical interconnections 292 and 291 are included then z=2 and the redundancy factor RF=1 meaning one connection will survive upon a single point of failure. As such the risk of a system failure is greatly reduced. By adding a $3^{rd}$ electrical connection 293, then z=3 and RF=2 further diminishing the probability of a system failure. In the case of more electrical connections 294, i.e. the $z^{th}$ connection then the redundancy factor RF=z−1. For example if a circuit has 4 electrical connections, then RF=3, meaning more than 3 connections must be damaged to produce in a system failure.

As described, each circuit in a distrusted system has its own unique redundancy factor. Higher redundancy circuits are less prone to interconnect failure and therefore more reliable than circuits with lower RF ratings. The lowest redundancy factor circuit, however, sets the redundancy factor of the system. The impact on the overall system of a circuit failure depends on how critical the circuit is. If the circuit is non-critical, the failure will result in a degradation in the systems overall performance, e.g. performance may be reduced or some areas of a distributed system may cease to operate but the overall system continues to function. For example, a non-critical failure in a medical device may comprise a portion of a biosensor failing to report biometric information in a particular area being monitored, or a string of LEDs of a phototherapy LightPad failing to illuminate.

Failure of a critical system, by contrast, may involve a central microcontroller, signal processing IC, or power supply being disconnected from the system resulting in a complete system failure. A distributed system made in accordance with this invention therefore comprises a redundant electrical topology where critical circuits are located only on PCBs having high redundancy factors. Conversely, in accordance with the disclosed design methodology, PCBs with low RF ratings are to be used only for non-critical functions of limited importance or for implementing functions localized to only small regions being monitored or treated.

To determine the dependence of a circuit's redundancy factor to its connections and location in a distributed network, various designs must be considered.

Figure 20:
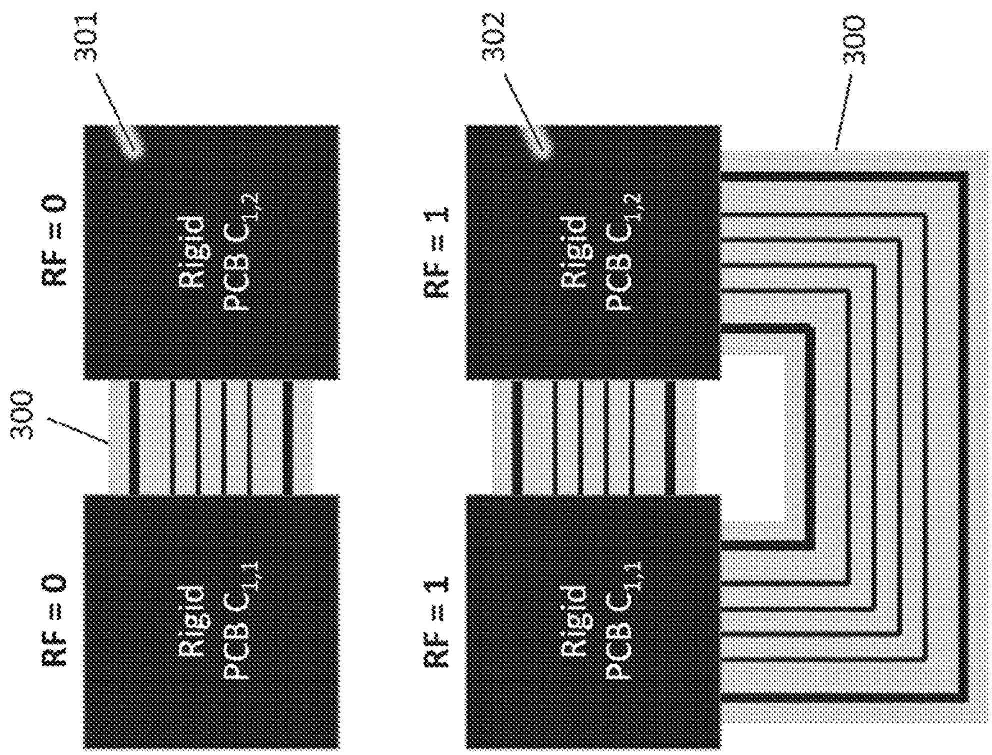
FIG. 20 comprises block diagrams representing the electrical topology and exemplary physical layout of 2-rigid PCB systems with RF=0 and RF=1.

FIG. 20 contrasts two examples of systems comprising only two rigid PCBs. In the top drawing rigid PCB 301 comprising circuit $C_{1,2}$ connects to circuit $C_{1,1}$ through a single flex connection 300. Because only a single connection exists connecting the circuits, a failure in the connection will directly impact the operation of the entire system. As such, the system exhibits no redundancy and both rigid PCBs have a RF=0. In contrast, the lower illustration represents a case where two flex connectors 300 connect the rigid PCBs 302. The resulting redundancy factor achieved in this method is RF=1 for both circuits $C_{1,1}$ and $C_{1,2}$.

Figure 29A:
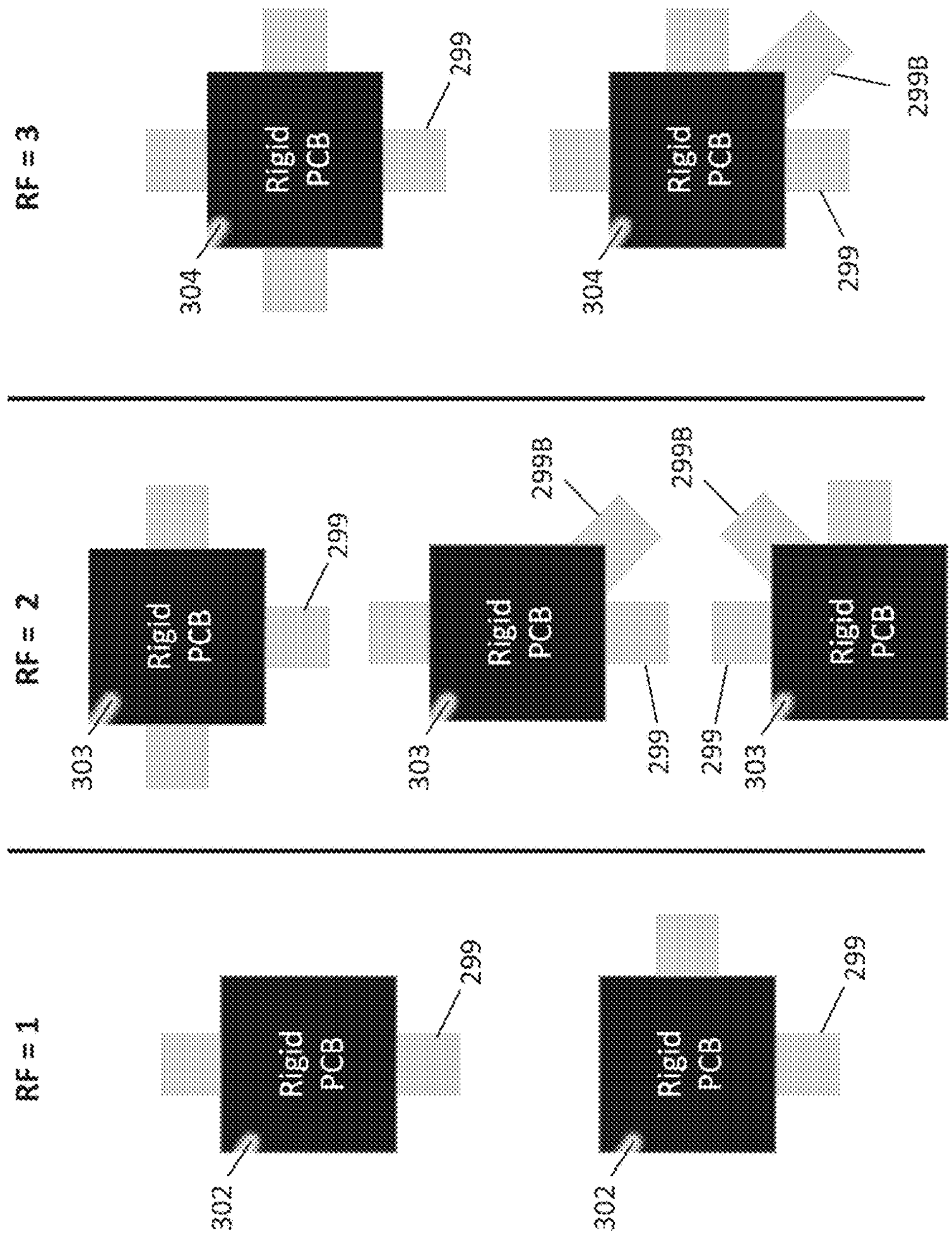
FIG. 29A comprises redundantly interconnected PCB block elements for RF≤1, RF≤2, and RD≤3.

For the sake of naming consistency, FIG. 29A illustrates rigid PCBs wherein two flex interconnections 299 are labeled as PCB 302, and those with three flex interconnections 299 are labeled as PCB 303. Similarly rigid PCB 304 connects to four flex connections 299. Continuing in FIG. 29B, PCB 305 connects to five flex connections, PCB 306 connects to six flex connections, PCB 307 connects to seven flex connections, and PCB 308 connects to eight flex connections. While a rigid PCB may be connected to any number of flex connections, practical layout considerations limit most rigid PCBs connect to no more than four flex connections. Aside from standardized nomenclature, the foregoing illustrations may be considered both broadly as generalized electrical topologies, i.e. topologically unique electrical networks and without limitation, also as exemplary physical layouts of PCBs.

Figure 21A:
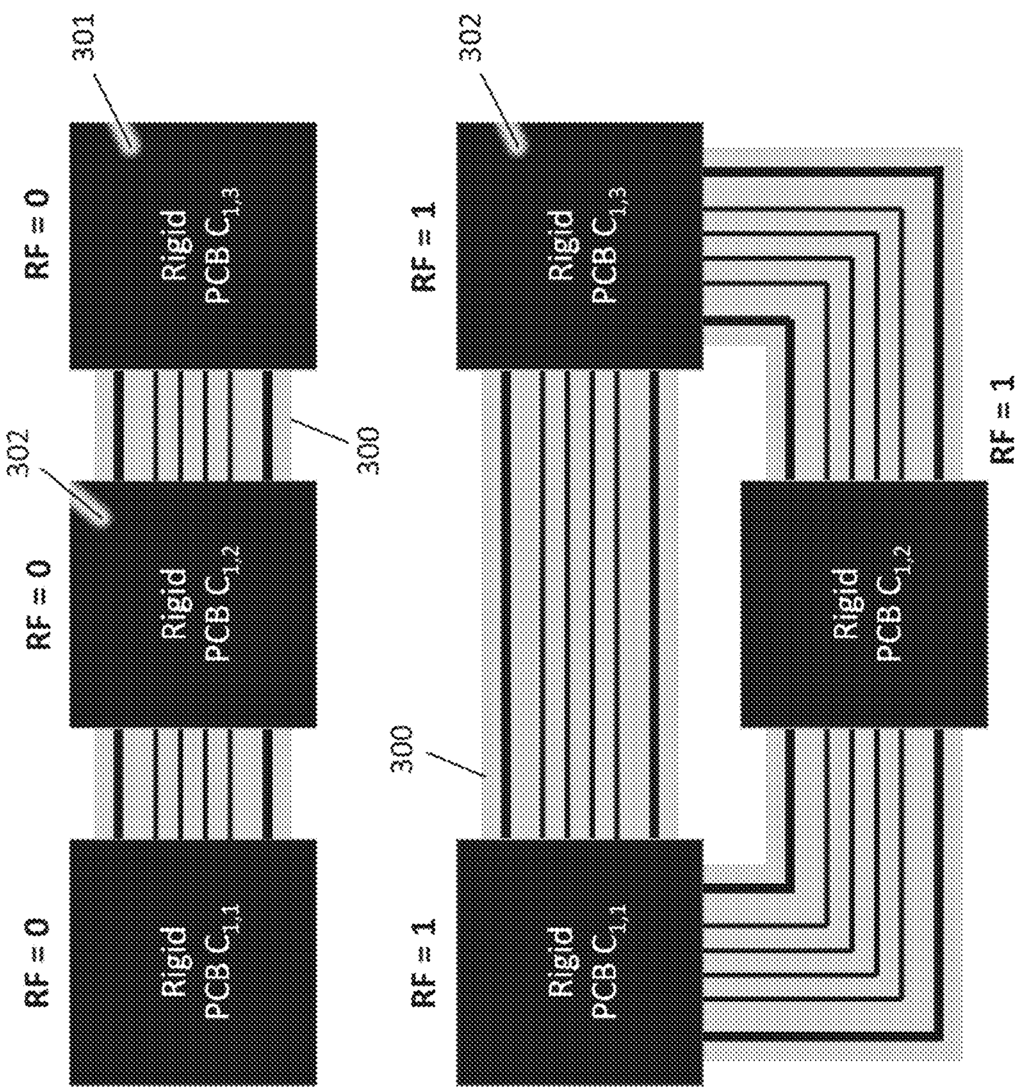
FIG. 21A comprises a block diagrams representing the electrical topology and exemplary physical layout of 3-rigid PCB systems with RF=0 and RF=1.

Following the aforementioned naming convention, FIG. 21A contrasts two examples of systems comprising three rigid PCBs. In the top drawing, center rigid PCB 302 containing circuit $C_{1,2}$ is electrically interconnected by flex 300 to two rigid PCBs 301 containing circuits $C_{1,1}$ and $C_{1,3}$. But because circuits $C_{1,1}$ and $C_{1,3}$ are not interconnected to one another, only a single connection exists connecting the various circuits. The connectivity of the system is therefore not redundant, i.e. all three circuits have RF=0, and any single point connection failure will adversely impact the operation of the entire system. In contrast, the lower illustration represents a case where not one but two flex connectors 300 connect each of all three rigid PCBs 302. The resulting redundancy factor achieved in this method is RF=1 for circuits $C_{1,1}$, $C_{1,2}$, and $C_{1,3}$. FIGS. 20-28D illustrate the electrical topology of a variety of electronic systems. The electrical topology, while it may appear similar to a specific PCB layout, is in fact a generic representation of two elements—electrical circuits 301 to 308, e.g. implemented using rigid PCBs or as later disclosed, "quasi-rigid" PCBs, and flexible electrical interconnections, e.g. implemented using flex interconnects shown by flex 300. In this topological description, the choice of the technology used to realize the electrical circuits or the flex connections is not specifically limited to one process, fabrication method, technology, process, or material, nor to imply a specific shape, geometry, or physical layout but is instead used to clarify topological combinations of interconnected circuits, where each circuit and its interconnects may be considered examples of the generic abstract circuit representation shown in FIG. 19. Accordingly, the use of the labels "rigid PCB" and references to flex connectors 300 should be more broadly interpreted as "flexible" or "bendable" interconnections connecting to "less flexible" or "less bendable" circuits or circuit boards. For example while one possible implementation of the redundant topology of FIG. 23C may comprise polyimide, flex, and FR4 rigid PCBs, in another realization of the same electronic topology can be realized by thick and thin layers of silk coated with metal traces of various thickness whereby the thick portions, where components are mounted, act as the "rigid" circuit elements, and the thin portions act as the flex interconnects. The shape and physical dimensions of the PCBs and flex also need not match their topological depictions—they might illustrate one possible layout, but not necessarily.

In a similar manner, the topological representations illustrating electrical connections to a circuit may comprise a variety of power, ground, and signal lines depicted herein as lines of varying thickness. Since rather than depicting specific PCB layouts, the illustrations are topological, it should be understood that every connection shown entering a circuit connects to every other corresponding voltage or signal line connected to the same circuit. For example in circuit $C_{2,2}$ shown in FIG. 23C, the four flex connectors each contain four narrow and two thick conductors. Within the circuit, the connectors are interconnected to their "like-type" signals or voltages, i.e. where every ground line is connected to all the other ground lines, where every +V power line is connected to all the other +V lines, where every signal A line is connected to its respective signal A lines, signal B lines connected to the other signal B lines, and so on. Since the topological layout is not a specific physical layout, the fact that ground may be illustrated as a connection entering on the left side of circuit $C_{2,2}$ when connected to circuit $C_{2,1}$ and on the right side when entering circuit $C_{2,3}$ does not mean that that ground is connected to something else other than ground. Within each circuit, ground is only connected to ground irrespective of its depiction in the electrical topological diagram. Specific physical PCB board layouts such as shown later in FIGS. 60A-60E and methods of facilitating these interconnections within a circuit such as shown in FIGS. 65A-65C and 67 illustrate a wide range of physical implementations may be utilized to realize a specific electrical topology.

Furthermore, because every signal, ground, or power line is connected to its respective same lines throughout the topological network, the multiple paths available for a given line or signal can ostensibly be considered as "parallel" electrical connections, and because these connections coexist, i.e. they concurrently carry and share electrical current, the parallel connections may be considered as "redundant" connections.

Because these connections are electrically parallel, in normal operation the current between the two circuits is concurrently carried by some combination of all possible parallel connections existing between the circuits. Theoretically in ideal parallel connections, the connections' electrical conductivities are perfectly identical, and current flow is divided in even proportions, i.e. balanced, across the various paths. Should, however, slight differences exist in the resistance of one path compared to another, the current will automatically reapportion itself among the paths (in a manner analogous to river water finding its way to the ocean by flowing through many and varied streams). Therefore, in real physical systems, changes in the patterns of electrical current distributed among the conductors is inconsequential and does not affect the system operation or performance. In essence, when carrying current among and across multiple connections in a distributed network, the exact distribution of current among the flex interconnections doesn't matter and for all ostensible purposes, the circuits may be considered the same as idealized parallel connections, even if they are not perfectly matched.

Because the various conductive paths are in use simultaneously, the connections represent "electrically redundant" connectivity. Should one or more than one of the interconnections fail, i.e. become an open circuit, the current will naturally redistribute to the available circuit paths without any noticeable effect on the system's operation. Even should every connection but one fail, i.e. the redundant connections become damaged, so long that a minimum of one connection persists, the connection between the circuits is preserved and system operation remains unimpaired.

As a subtle point of distinction, the meaning of redundant in system reliability describes multiple components, elements, or connections that are in use concurrently. This definition is in contrast to the meaning of a backup or spare, where another component, element, or connection is available but is not in use at the time. When a failure in the main element occurs, some steps must be taken to activate the spare, often introducing a delay in the process. For example, when a car has a flat tire, the car becomes disabled until the spare can be retrieved from the trunk, the damaged tire removed, and the spare tire installed. In a large truck or semi-tractor-trailer, each axle has four tires operating at all time. Should one tire have a flat the truck can continue to operate unimpeded.

In electronics, redundant systems or connections are instantly available with no down town, while in contrast spare systems may cause temporary system failure and possible permanent memory loss during the time before the spare is activated. For example, an emergency backup power generator takes time to ramp up and stabilize. If a power failure occurs, until the generator comes online, the power to the load is interrupted. For example, in a hospital if this electrical failure occurs during a critical medical procedure, severe risk to a patient may result even from a short power glitch.

The redundant distributed system as disclosed is therefore advantageous over solutions involving spares or replaceable elements. Consider for example the criticality of wearable flexible electronics used in a cardio pacemaker application, or for regulating neural pathways in the brain of a patient subject to epileptic seizures. Should a power failure occur at the wrong time even briefly, e.g. when driving a car, a momentary interruption in operation could have dire consequences. In such extreme reliability applications, redundant connectivity is crucial. Even in less critical applications, since there is no detrimental impact or penalty in performance or cost of using redundant methodologies disclosed herein, there is no reason NOT to employ the redundant design methods and apparatus in distributed electronic systems.

Figure 21B:
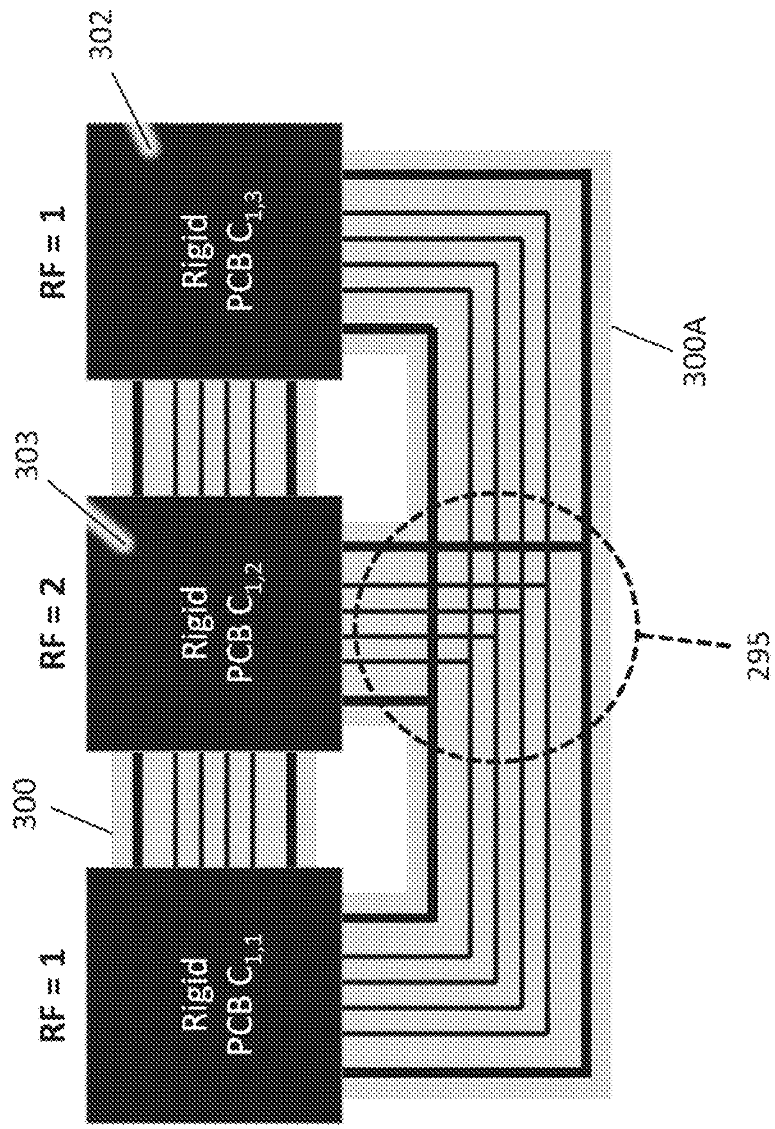
FIG. 21B is a block diagram representing the electrical topology and exemplary physical layout of a 3-rigid PCB system where RF≥1.

An alternative three PCB topology is shown in FIG. 21B, where a central PCB 303 comprising circuit $C_{1,2}$ with three flex 300 connections is interconnected to two ancillary or peripheral PCBs 302, each with two flex connections containing circuits $C_{1,1}$, and $C_{1,3}$. Flex connector 300A provides a direct connection between circuits $C_{1,1}$, and $C_{1,3}$ and through junction link 295 also facilitates a third connection to circuit $C_{1,2}$. The resulting topology comprises circuit $C_{1,2}$ with RF=2 and circuits $C_{1,1}$, and $C_{1,3}$ with RF=1. As determined by its lowest RF component, the overall system's "lowest redundancy factor LDF" is LRF=1 and the system's "average redundancy factor ARF" is ARF=(1+2+1)/3=1.33. Because of its higher RF rating, critical circuitry should be implemented as circuit $C_{1,2}$ on the topologically centralized PCB. Practical realizations of 3-way junction link 295 are fabrication specific and are described later in this disclosure.

Figure 22A:
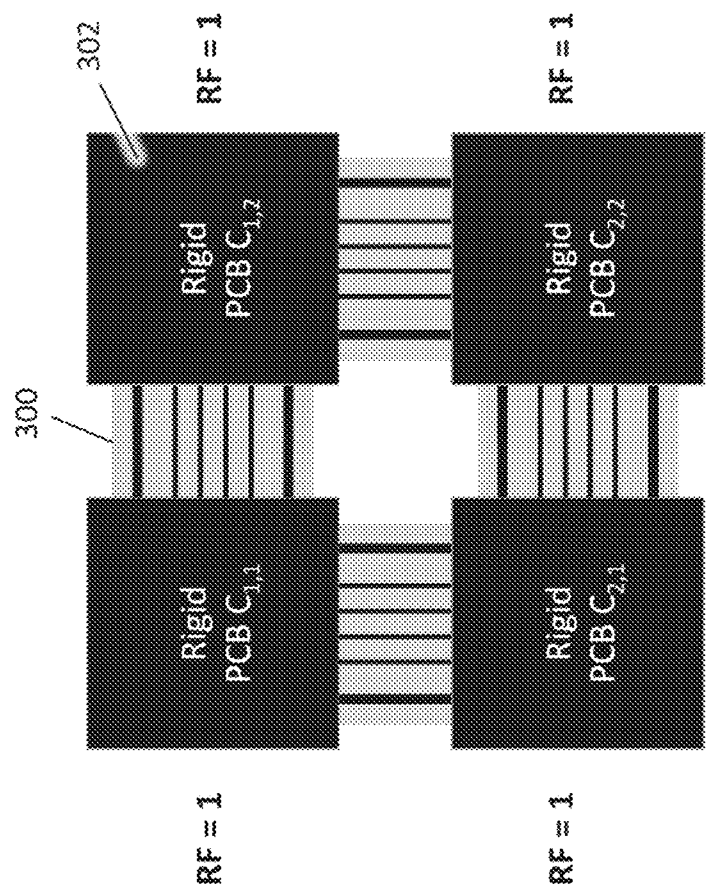
FIG. 22A is a block diagram representing the electrical topology and exemplary physical layout of a 4-rigid PCB system where RF=1.
Figure 22B:
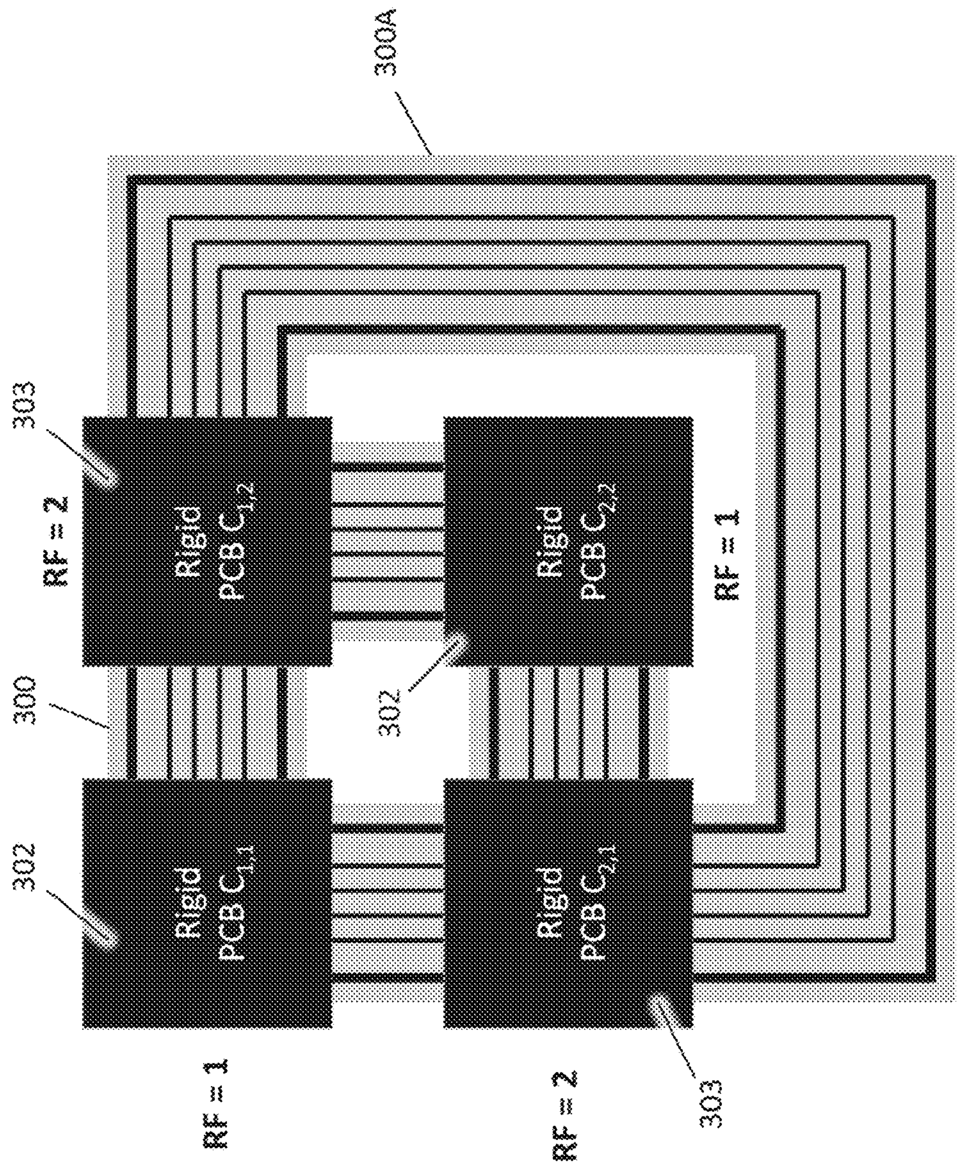
FIG. 22B is a block diagram representing the electrical topology and exemplary physical layout of an alternate 4-rigid PCB system where RF≥1.

FIG. 22A illustrates a topological example of a system comprising four rigid PCBs. Each rigid PCB 302 is connected to two other rigid PCBs by two flex connections 300. The resulting topology results in four circuits $C_{1,1}$, $C_{1,2}$, $C_{2,1}$, and $C_{2,2}$ all identically redundant with RF=1. FIG. 22B illustrates a topological variant of a four PCB system where an additional flex connection 300A interconnects circuits $C_{1,2}$ to $C_{2,1}$. The resulting topology comprises circuits $C_{1,1}$ and $C_{2,2}$ fabricated on PCBs 302 with RF=1 and circuits $C_{1,2}$ and $C_{2,1}$ fabricated on PCBs 303 with RF=2. The overall system redundancy is LRF=1 and ARF=1.5. Because of their higher RF rating, critical circuitry should be implemented as circuits $C_{1,1}$ and $C_{2,3}$.

Figure 22C:
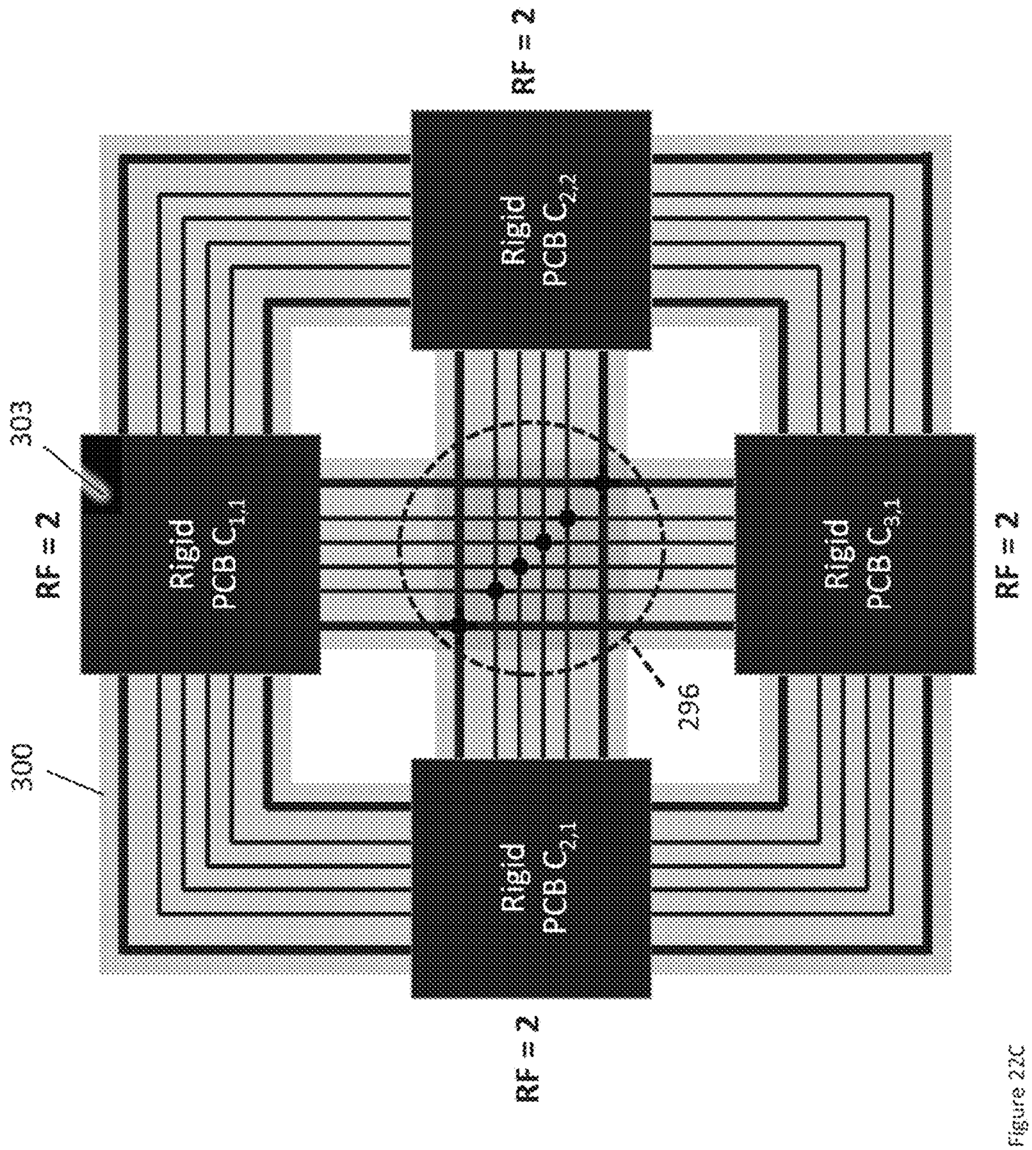
FIG. 22C is a block diagram representing the electrical topology and exemplary physical layout of a 4-rigid PCB system where RF=2.

Another topology illustrated in FIG. 22C comprises four rigid PCBs 303 each with three connections. As shown circuit $C_{2,1}$ connects directly to its topological neighbors $C_{1,1}$ and $C_{3,1}$ and through junction link 296 to every circuit; circuit $C_{1,1}$ connects directly to its topological neighbors $C_{2,1}$ and $C_{2,2}$ and through junction link 296 to every circuit; circuit $C_{2,2}$ connects directly to its topological neighbors $C_{1,1}$ and $C_{3,1}$ and through junction link 296 to every circuit; and circuit $C_{3,1}$ connects directly to its topological neighbors $C_{2,1}$ and $C_{2,2}$ and through junction link 296 to every circuit. The resulting system comprises four circuits each with identical redundancy of RF=2 and an overall system LRF=ARF=2. The implementation achieves its high RF factor by the use of junction link 296 which when realized in physical form confers a high area efficiency to the system. Practical realizations of 4-way junction link 296 are fabrication specific and are described later in this disclosure.

Figure 22D:
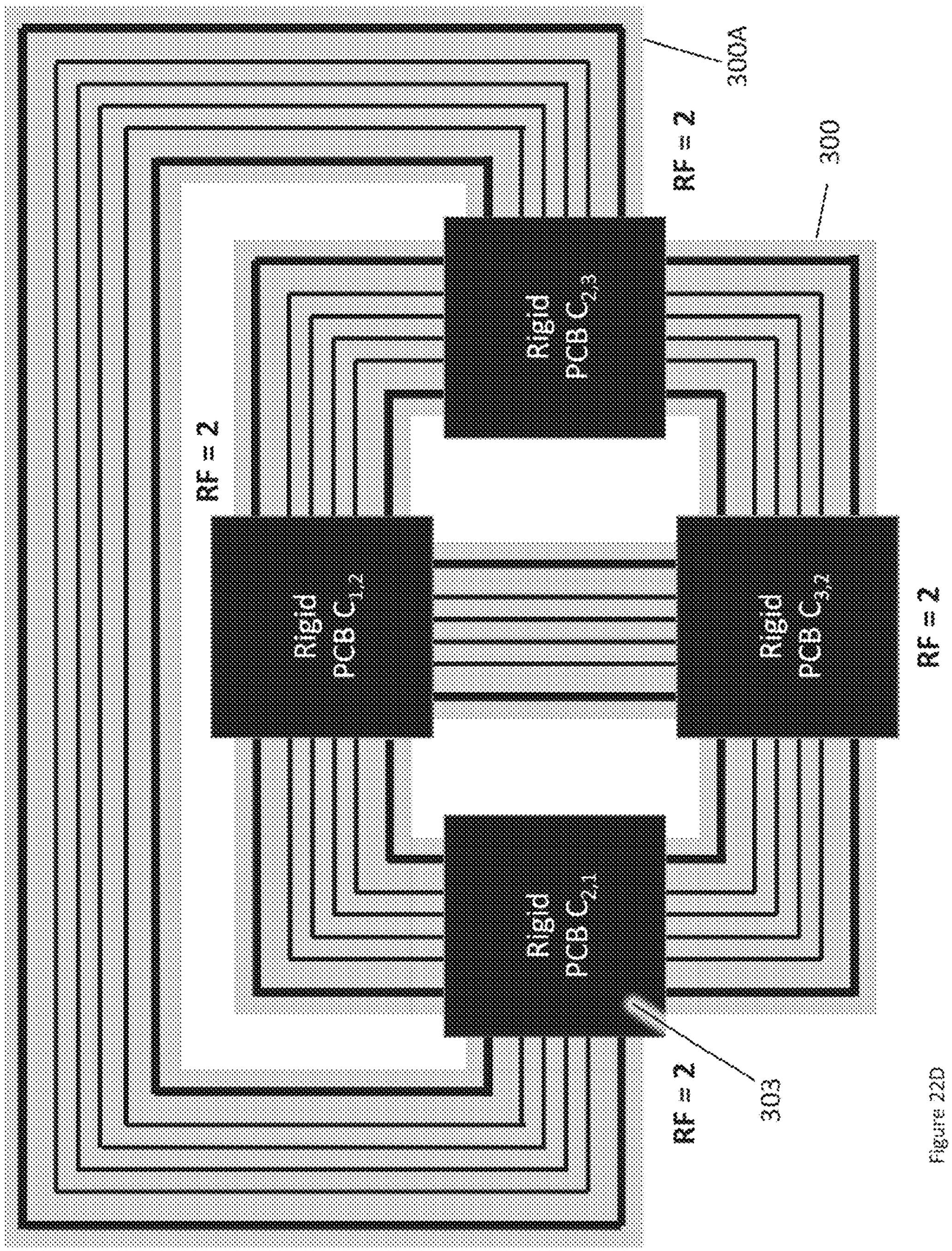
FIG. 22D is a block diagram representing the electrical topology and exemplary physical layout of an alternate 4-rigid PCB system where RF=2.

An alternative interconnect topology, electronically identical to the previous example is illustrated in FIG. 22D. In this approach flex 300 connects circuit $C_{2,1}$ to its topological neighbors $C_{1,2}$ and $C_{3,2}$ while flex 300A circumnavigates the array connecting circuit $C_{2,1}$ directly to circuit $C_{2,3}$. Through flex 300, circuit $C_{2,3}$ also connects to its topological neighbors $C_{1,2}$ and $C_{3,2}$. Circuits $C_{1,2}$ and $C_{3,2}$, in addition to connecting to their shared topological neighbors circuits $C_{2,1}$ and $C_{2,3}$ connect directly to one another. The result is system with four circuits each with RF=2 and with an overall system redundancy of LRF=ARF=2. While this topological design eliminates the need for junction link 296 used in the previously described implementation of FIG. 22C, in physical realizations it offers a lower area efficiency.

Figure 23A:
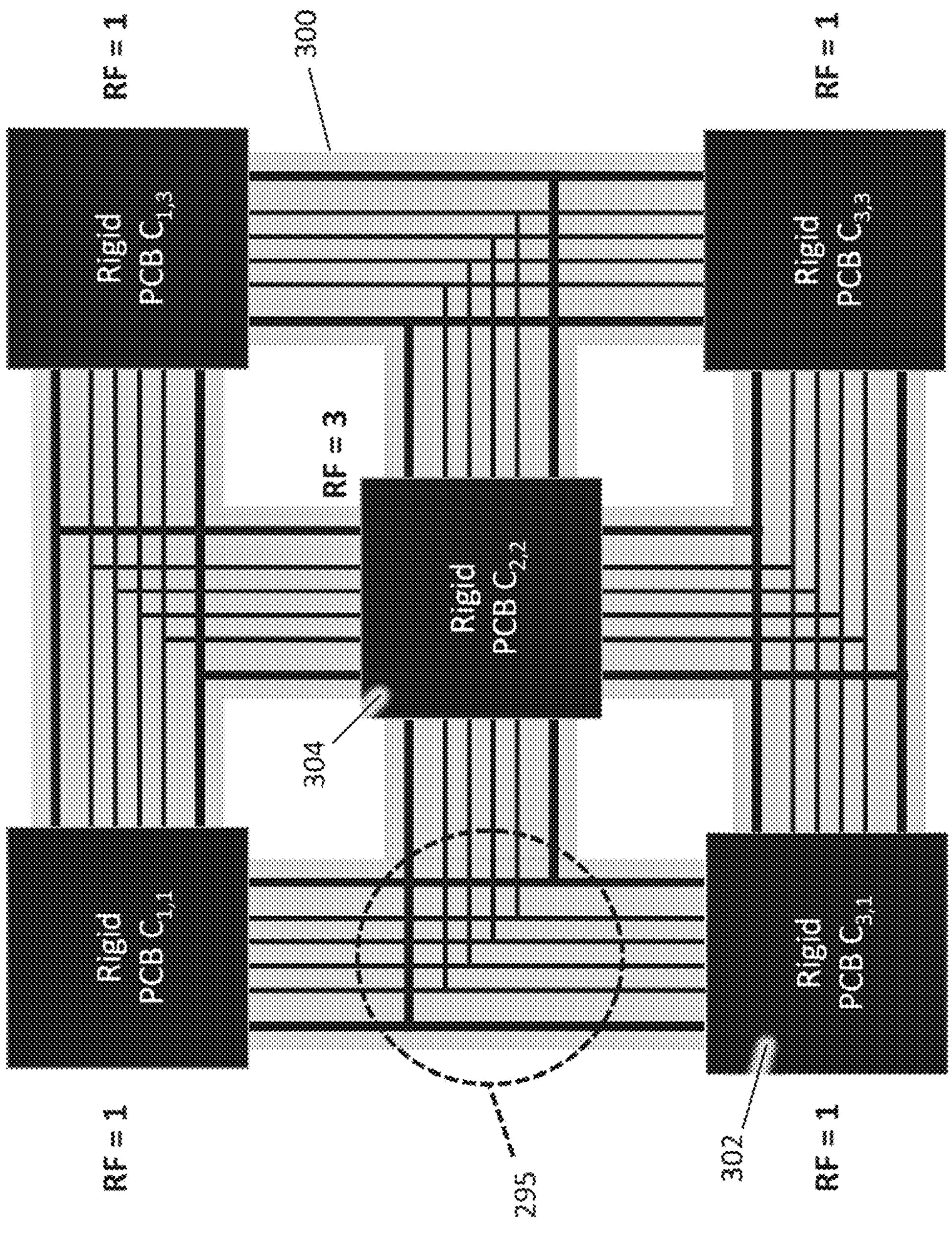
FIG. 23A is a block diagram representing the electrical topology and exemplary physical layout of a 5-rigid PCB system where RF≥1.

FIG. 23A illustrates a topological example of a system comprising five rigid PCBs. With exception of the center circuit $C_{2,2}$, each rigid PCB 302 is connected to two other rigid PCBs by two flex connections 300 and as such circuits $C_{1,1}$, $C_{1,3}$, $C_{3,1}$, and $C_{3,3}$ all exhibit a redundancy factor of RF=1. Center circuit $C_{2,2}$ however, comprises four interconnections to the other flex connections 300 via four junction links 295. With a corresponding redundancy factor of RF=3, circuit $C_{2,2}$ is preferable for integrating critical functions and circuitry. Despite its one robustly connected central rigid PCB, the overall resilience of this system is still limited to LRF=1 but with AVF=1.4. The meaning of any system where AVF exceeds LVF is that select circuits in the topology have higher redundancy and should be used to implement critical circuitry. In physical layouts, the area consumed by this topology is the same as any 3×3 matrix.

Figure 23B:
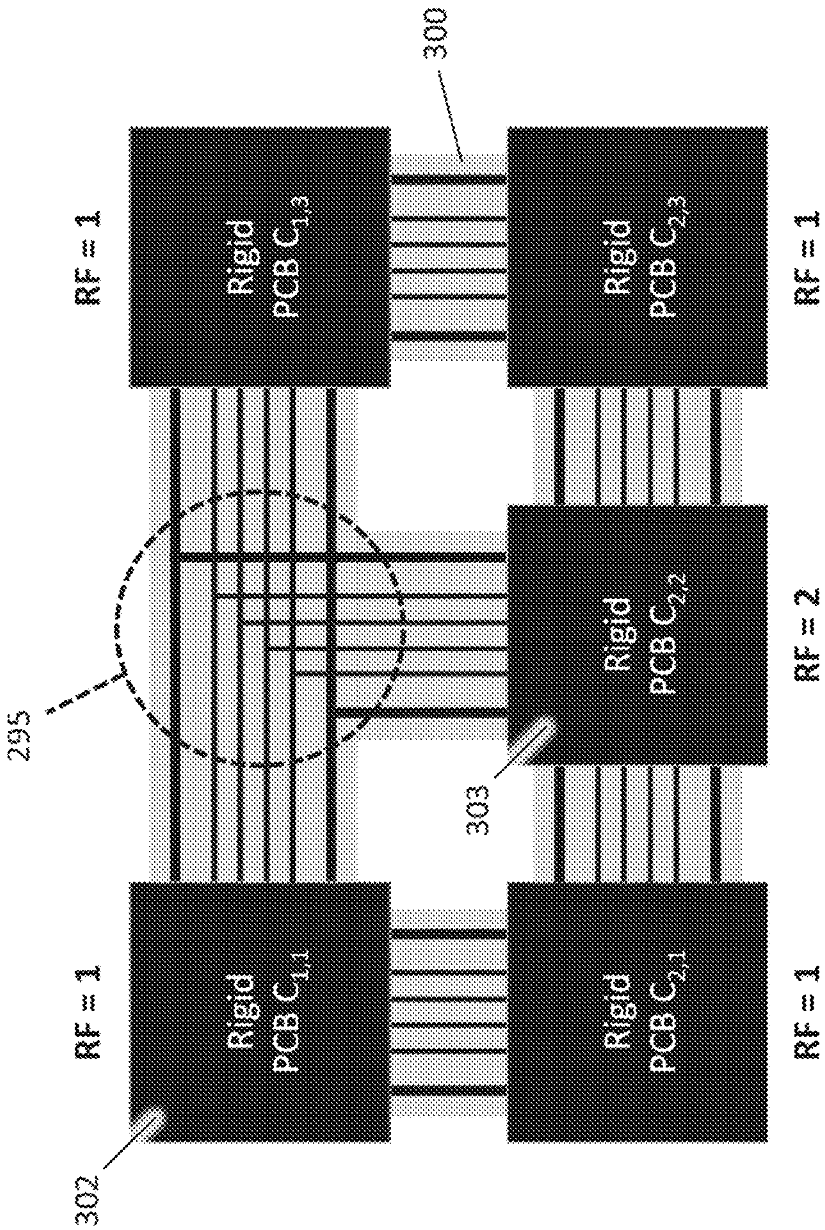
FIG. 23B is a block diagram representing the electrical topology and exemplary physical layout of an alternate 5-rigid PCB system where RF≥1.

An improvement in area efficiency can be achieved employing the topology shown in FIG. 23B. Based on a 2×3 matrix, the first row contains two circuits $C_{1,1}$ and $C_{1,3}$ while the $2^{nd}$ row contains three, namely circuits $C_{2,1}$, $C_{2,2}$, and $C_{2,3}$. Circuit $C_{2,2}$ connects to the first row PCBs using junction link 295. Each of the corner located circuits $C_{1,1}$, $C_{1,3}$, $C_{2,1}$, and $C_{2,3}$ utilizing rigid PCBs 302 exhibit RF=1 while only PCB 303 comprising circuit $C_{2,2}$ exhibits a higher degree of redundancy, i.e. RF=2. With a corresponding redundancy factor of RF=2, circuit $C_{2,2}$ is preferable for integrating critical functions and circuitry. The overall resilience of this system topology is limited to LRF=1 with ARF=1.2.

Figure 23C:
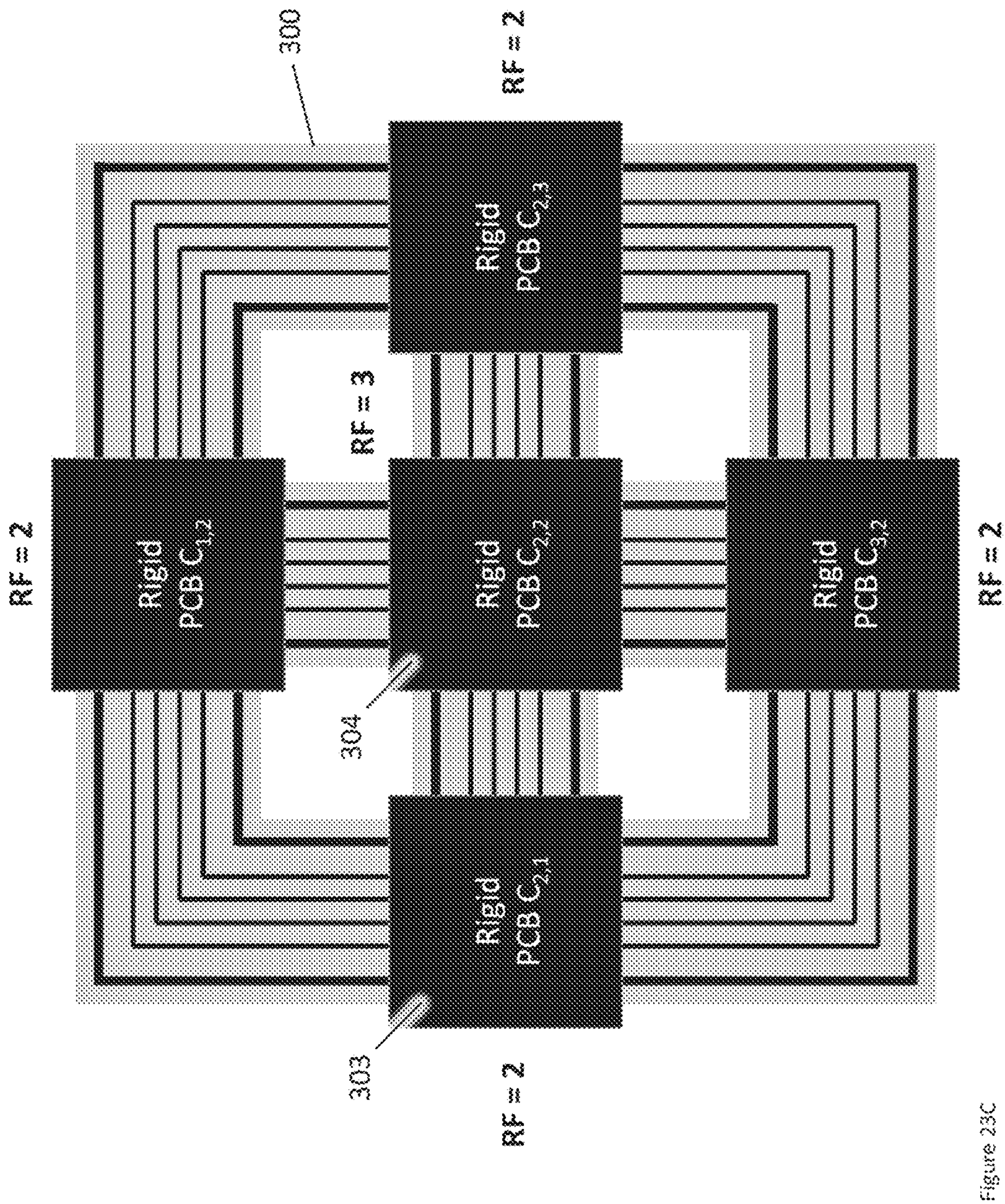
FIG. 23C is a block diagram representing the electrical topology and exemplary physical layout of an alternate 5-rigid PCB system where RF≥2.

Another five PCB topology based on a 3×3 matrix is illustrated in FIG. 23C where PCBs 303 having three flex 300 connections surround a fifth PCB 304 having four flex connections. Arranged in vertical columns, circuit $C_{2,1}$ and similarly circuit $C_{2,3}$ connect to every circuit in column 2 of the matrix, namely $C_{1,2}$, $C_{2,2}$, and $C_{3,2}$. Arranged in horizontal columns, circuit $C_{1,2}$ and similarly circuit $C_{3,2}$ connect to every circuit in row 2 of the matrix, namely $C_{2,1}$, $C_{2,2}$, and $C_{2,3}$. The resulting topology results in circuit $C_{2,1}$ with RF=3 and circuits $C_{1,2}$, $C_{2,1}$, $C_{2,3}$, and $C_{3,2}$ with RF=2 and an overall system redundancy of LRF=2 with ARF=2.2.

Figure 24A:
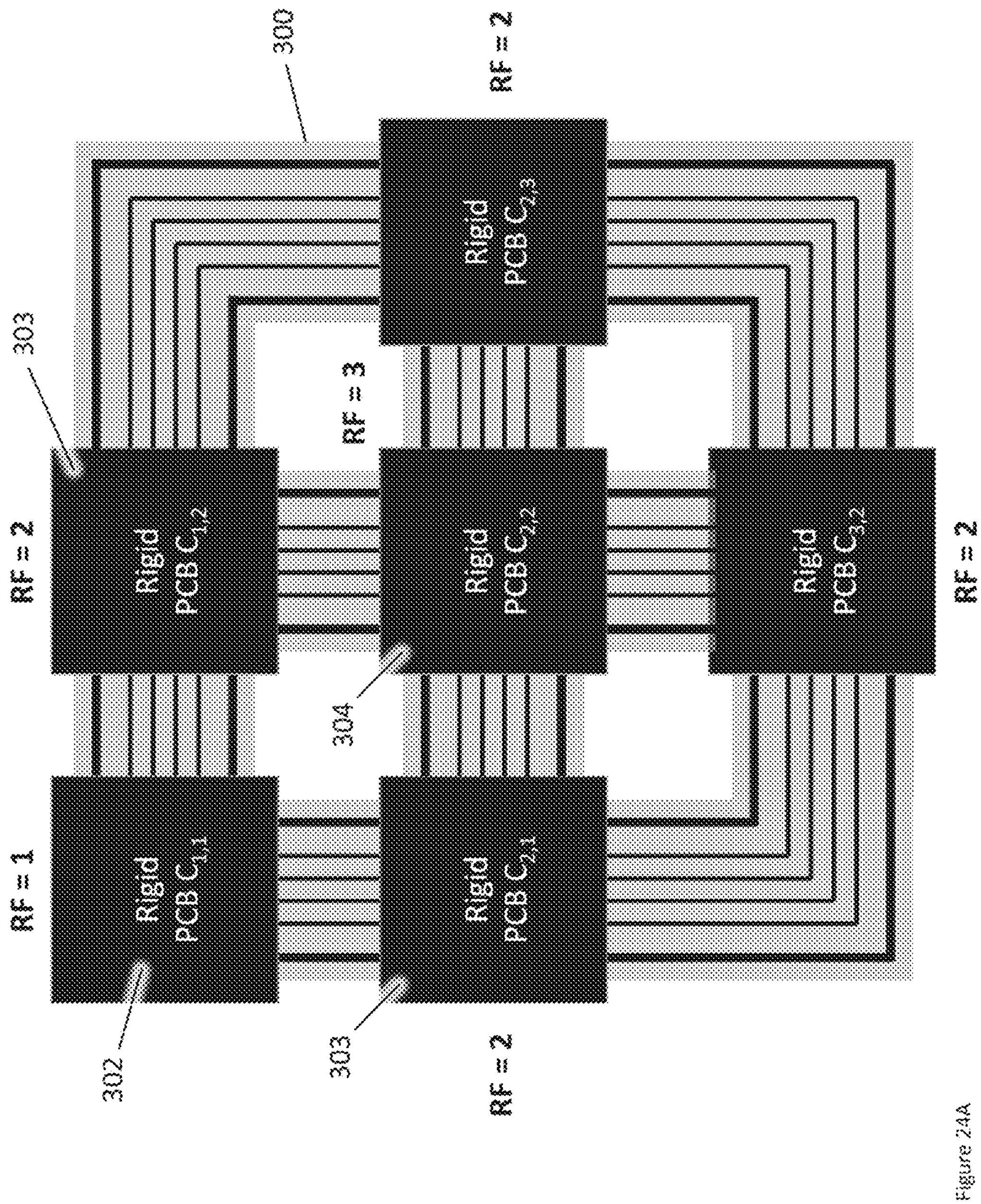
FIG. 24A is a block diagram representing the electrical topology and exemplary physical layout of a 6-rigid PCB system where RF≥1.
Figure 24B:
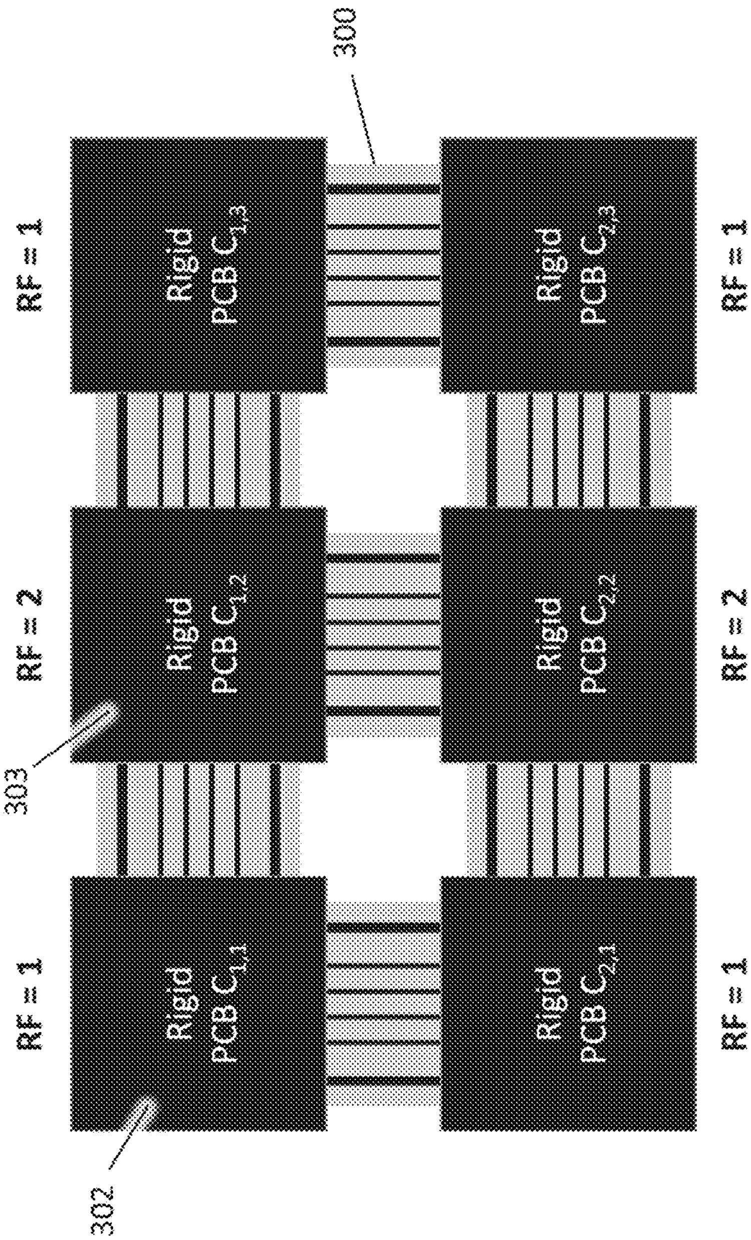
FIG. 24B is a block diagram representing the electrical topology and exemplary physical layout of an alternate 6-rigid PCB system where RF≥1.
Figure 24C:
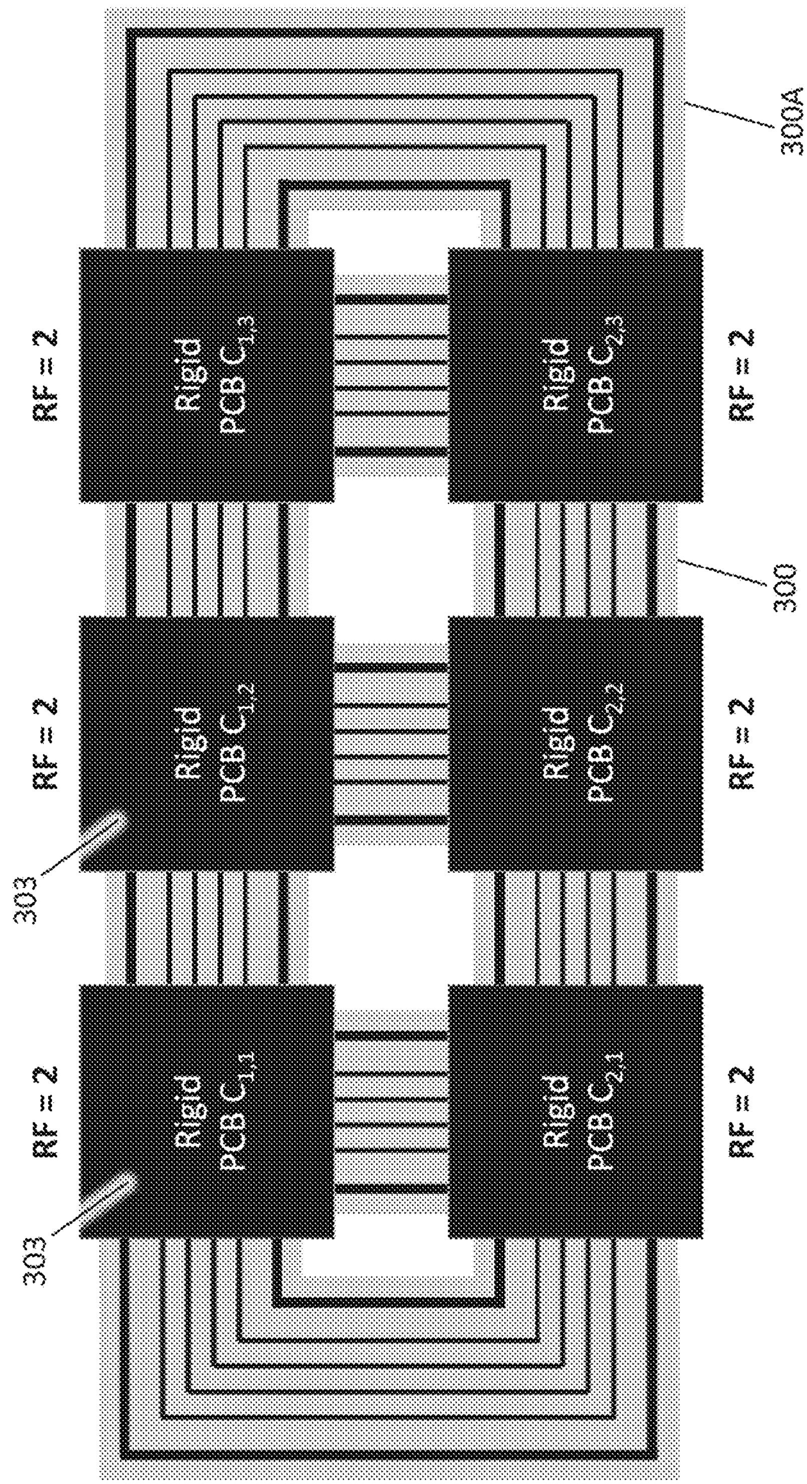
FIG. 24C is a block diagram representing the electrical topology and exemplary physical layout of a 6-rigid PCB system where RF=2.

The aforementioned topological matrix can be modified to accommodate six PCBs shown in FIG. 24A by inserting PCB 302 into a corner location comprising circuit $C_{1,3}$. By an introducing a RF=1 element into the sparse 3×3 matrix, despite having an ARF=2, the lowest system redundancy is degraded from LRF=2 to LRF=1. In physical realizations, the described topology comprising six PCBs distributed across a 3×3 matrix intrinsically suffers poor area efficiency. Another topology, also with RF=1, offering improved area efficiency is shown in FIG. 24B. Based on a 2×3 grid, the corner-PCBs 302 connect to only two flex 300 connections while the center PCBs 303 connect to three. Accordingly, circuits $C_{1,1}$, $C_{1,3}$, $C_{2,3}$, and $C_{2,3}$ exhibit redundancy RF=1 while circuits $C_{1,2}$ and $C_{2,2}$ exhibit redundancy RF=2. The resulting system redundancy is therefore limited to LRF=1 with an ARF=1.33. The addition of end pieces 300A shown in FIG. 24C converts the corner PCBs into three-connector type PCBs 303 and improves the corner PCB and overall system redundancy of LRF=ARF=2.

Figure 25A:
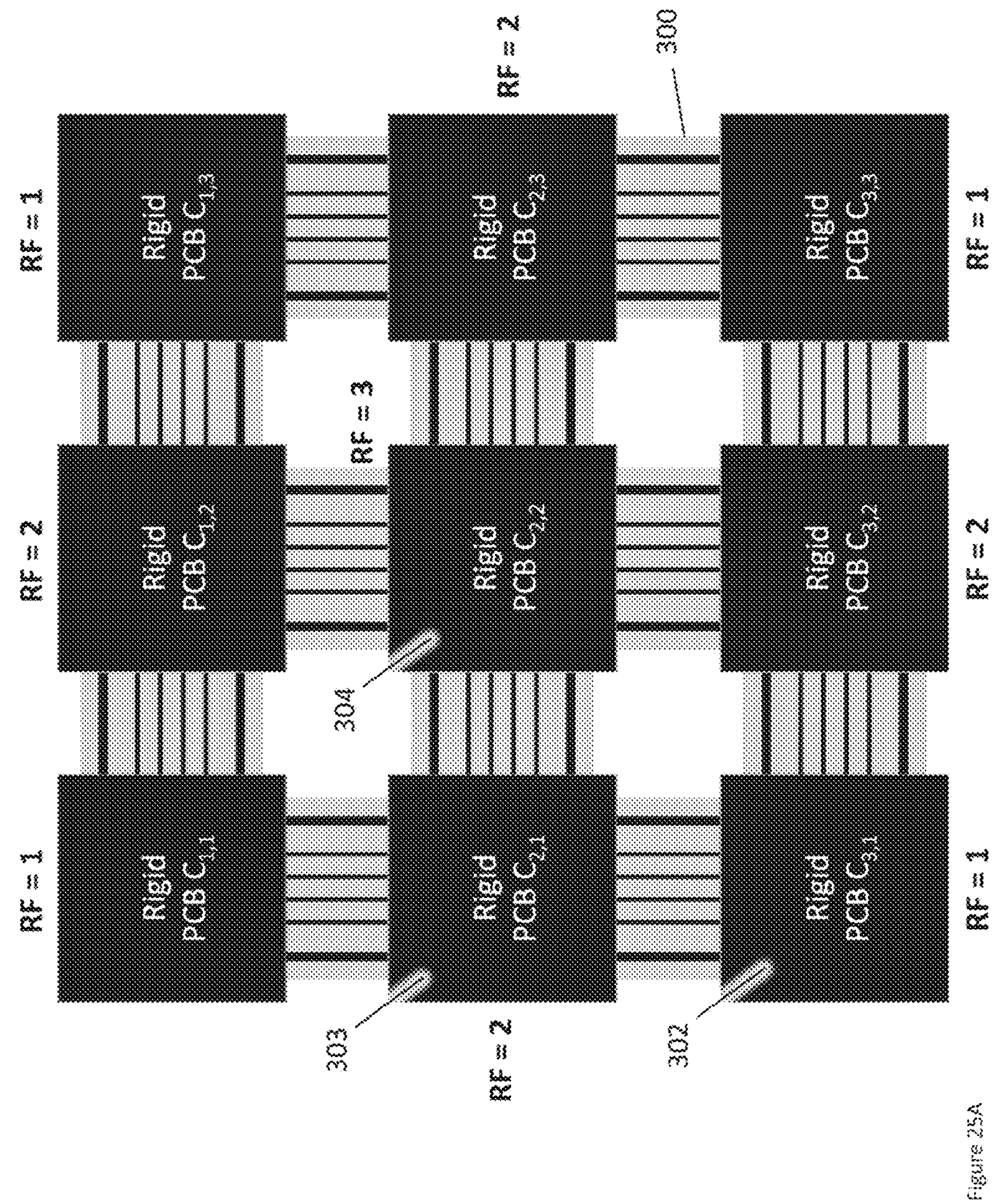
FIG. 25A is a block diagram representing the electrical topology and exemplary physical layout of a 9-rigid PCB system where RF≥1.

FIG. 25A illustrates a topological example of a system comprising nine rigid PCBs arranged in a 3×3 grid. As shown, the grid comprises three types of PCBs:

- The center PCB 304 surrounded by four flex 300 connections resulting in circuit $C_{2,2}$ with redundancy RF=3.
- The center-edge PCBs 303 contacting three flex 300 connections resulting in circuits $C_{1,2}$, $C_{2,1}$, $C_{2,3}$, and $C_{3,2}$, each with redundancy RF=2.
- The corner PCBs 302 contacting two flex 300 connections resulting in circuits $C_{1,1}$, $C_{1,3}$, $C_{3,1}$, and $C_{3,3}$, each with redundancy RF=1.
- An overall system redundancy of LRF=1 as limited by the corner PCBs but with a higher average redundancy of ARF=1.67 because of higher center and center edge circuit redundancy.
- With a corresponding redundancy factor of RF=3, circuit $C_{2,2}$ is preferable for integrating critical functions and circuitry.

Figure 25B:
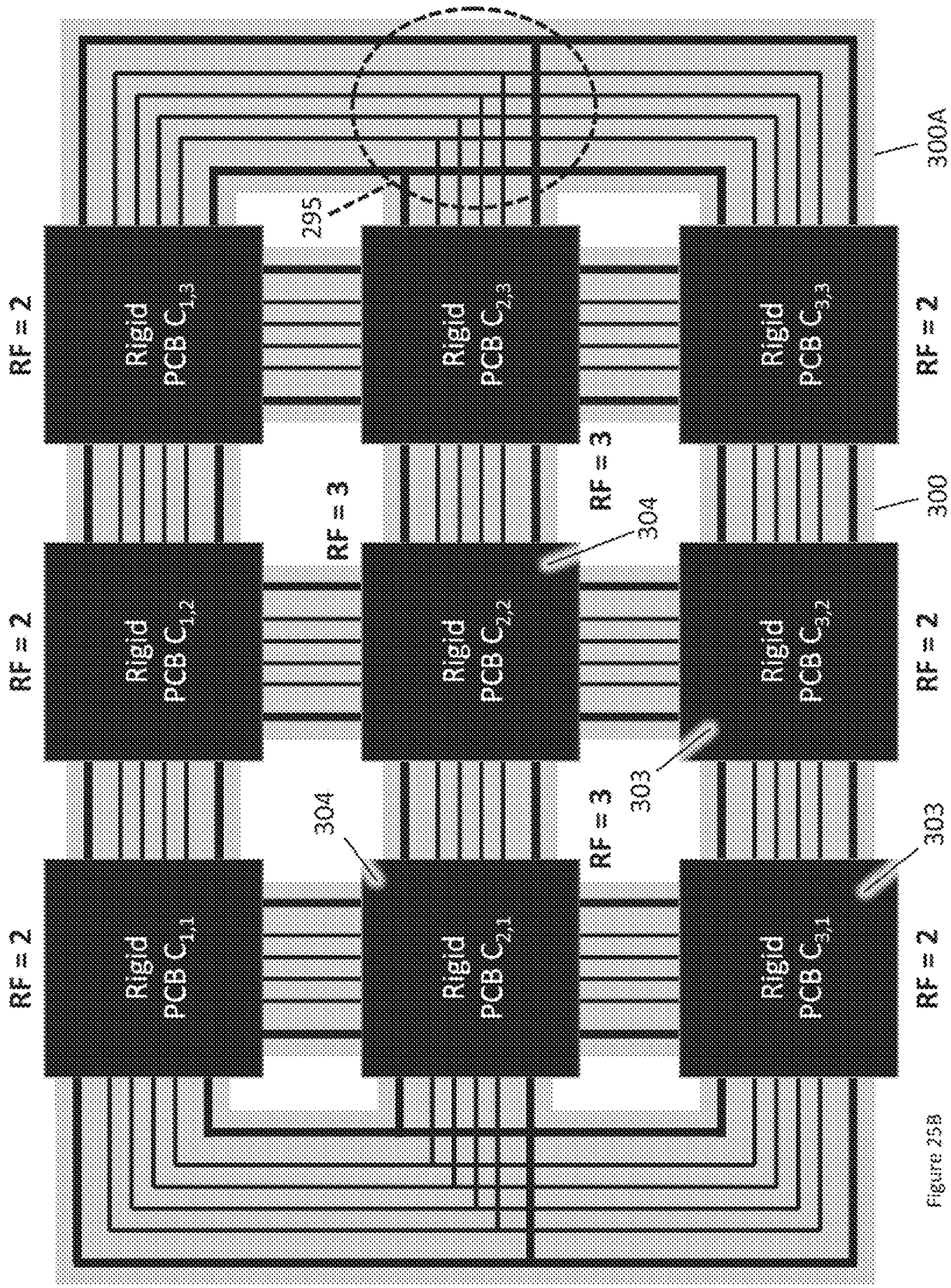
FIG. 25B is a block diagram representing the electrical topology and exemplary physical layout of a 9-rigid PCB system where RF≥2.

By adding flex 300A and junction links 295 as end caps shown in FIG. 25B, the corner elements change to three-connector PCBs 303 and the center-edge elements change to four-connector PCBs 304. As such the changes described improve redundancy of circuits $C_{1,1}$, $C_{1,3}$, $C_{3,1}$ and $C_{3,3}$ to RF=2, and of circuits $C_{1,2}$, $C_{2,1}$, $C_{2,3}$, and $C_{3,2}$ to RF=3. Overall system redundancy improves to LRF 2 with an average redundancy ARF=2.33.

Figure 26A:
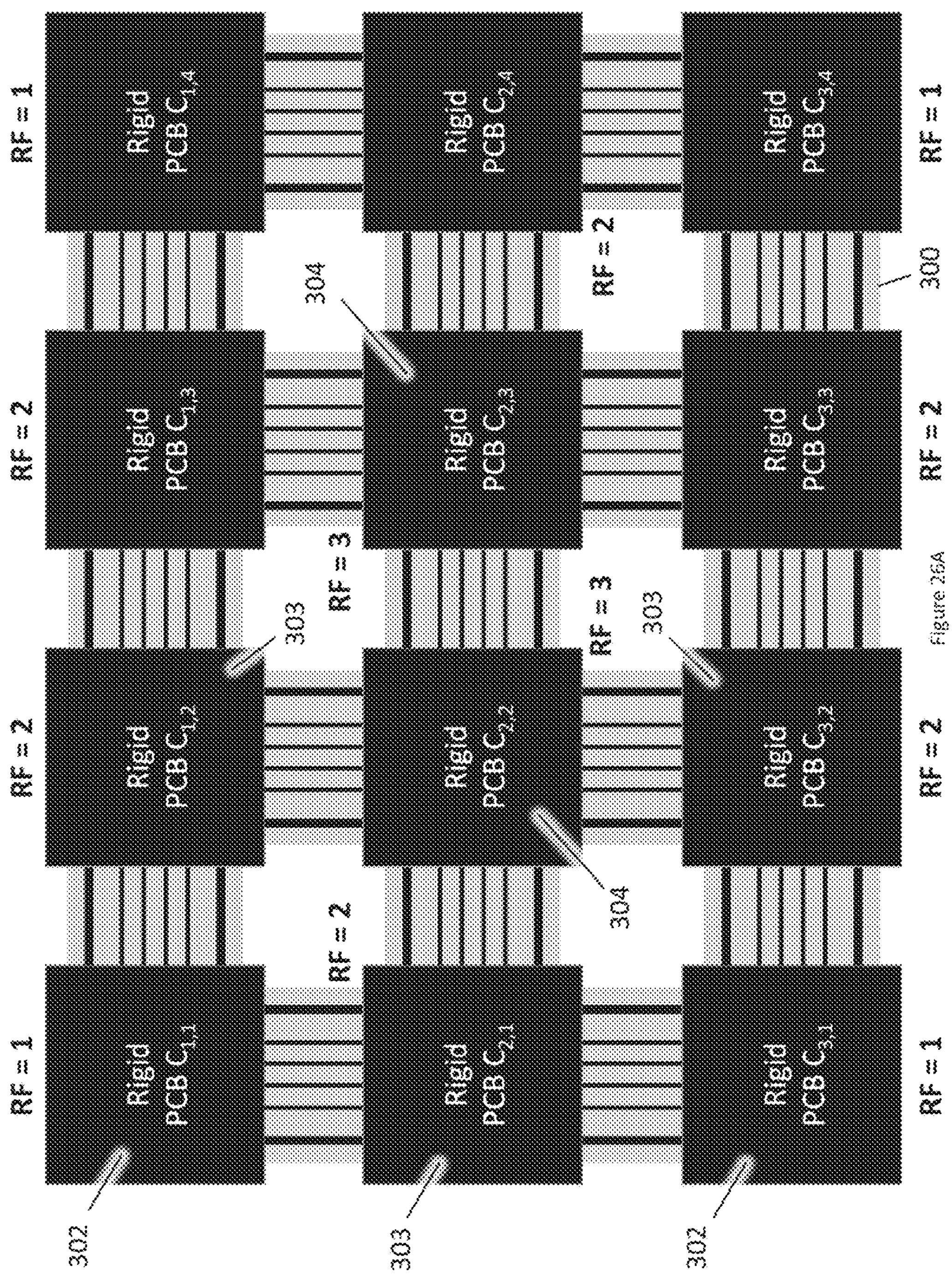
FIG. 26A is a block diagram representing the electrical topology and exemplary physical layout of a 12-rigid PCB system where RF≥1.

FIG. 26A illustrates a topological example of a system comprising twelve rigid PCBs arranged in a 3×4 grid. As shown, the grid comprises three types of PCBs:

- The center PCBs 304 surrounded by four flex 300 connections resulting in circuit $C_{2,2}$ and $C_{2,3}$ with redundancy RF=3.
- The center-edge PCBs 303 contacting three flex 300 connections resulting in circuits $C_{1,2}$, $C_{1,3}$, $C_{2,1}$, $C_{2,4}$, $C_{3,2}$, and $C_{3,3}$, each with redundancy RF=2.
- The corner PCBs 302 contacting two flex 300 connections resulting in circuits $C_{1,1}$, $C_{1,4}$, $C_{3,3}$ and $C_{3,4}$, each with redundancy RF=1.
- An overall system redundancy of LRF=1 as limited by the corner PCBs and an average redundancy of 1.83.
- With a corresponding redundancy factor of RF=3, circuits $C_{2,2}$ and $C_{2,3}$ are preferable for integrating critical functions and circuitry.

Figure 26B:
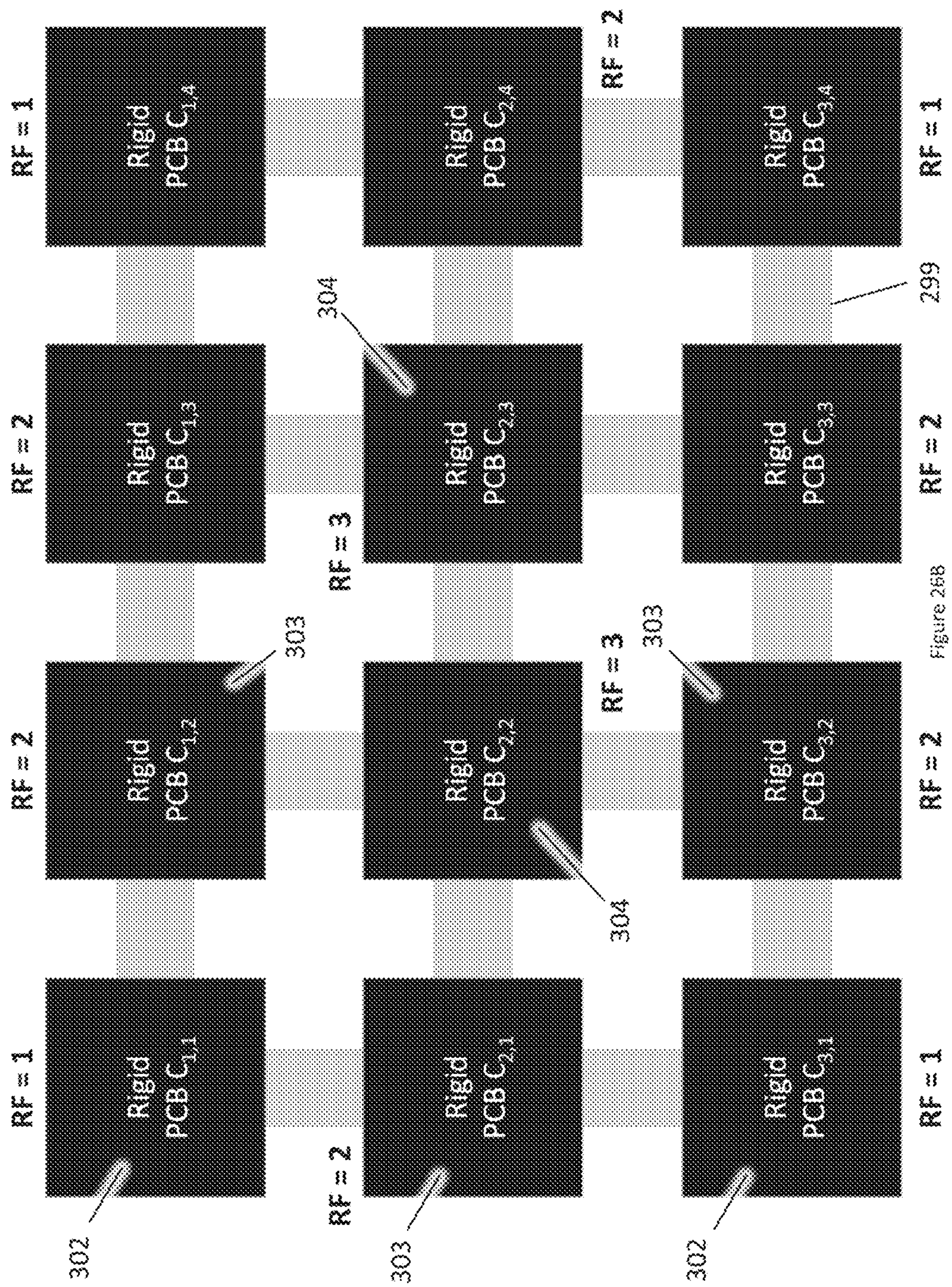
FIG. 26B is a simplified block diagram representing the electrical topology of a 12-rigid PCB system where RF≥1.

In order to simply the schematic representation of more complex topological networks, the details of flex 300 connectors is replaced by flex 299 connectors as shown by the illustration of FIG. 26B. The lack of detail in flex 299 does not imply the connections in flex 300 are not present, but are simply excluded from the graphics for the sake of clarity. In this regard, the networks of FIG. 26A and FIG. 26B are electrically and topologically identical.

Figure 26C:
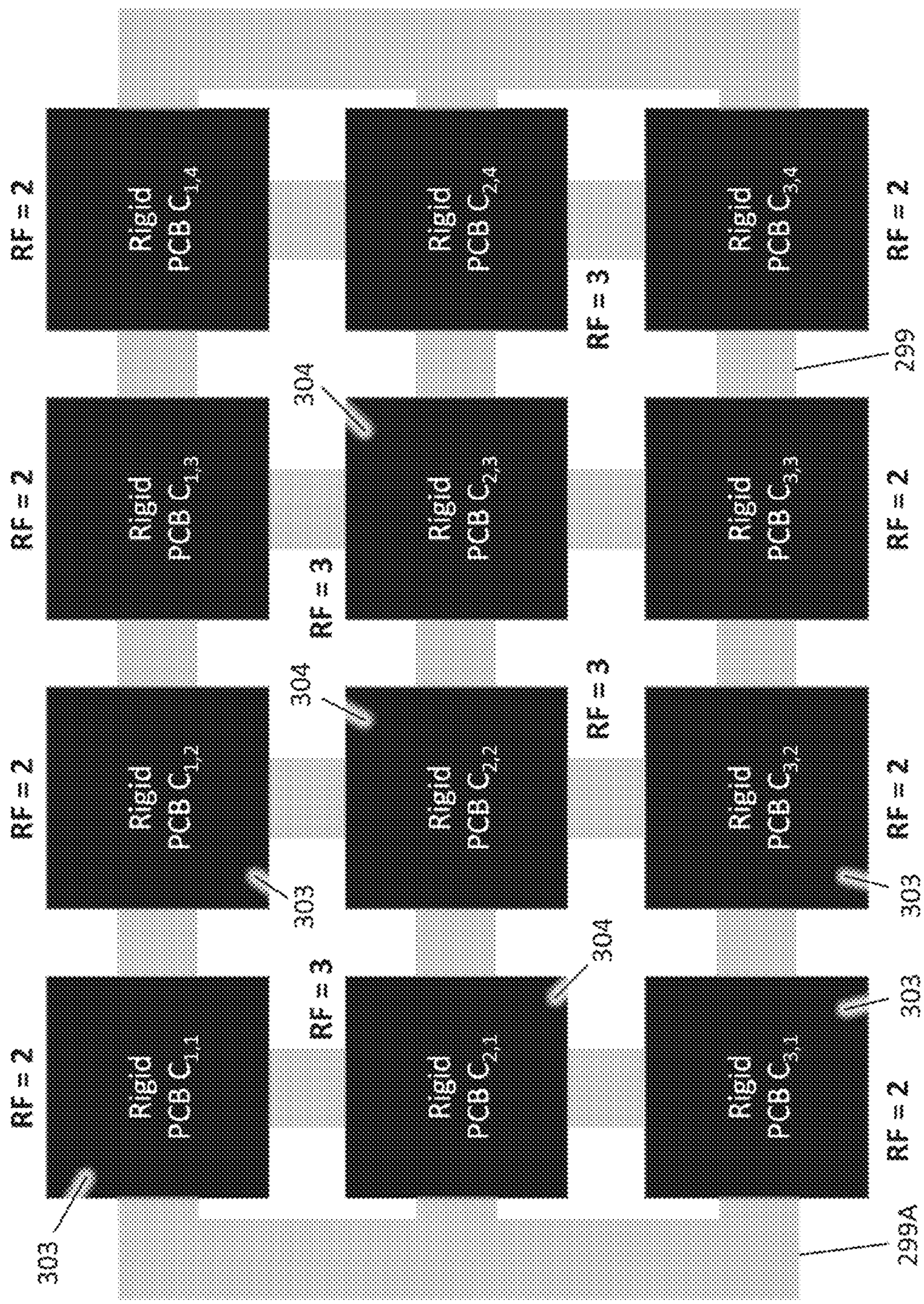
FIG. 26C is a simplified block diagram representing the electrical topology of a 12-rigid PCB system where RF≥2.

By adding flex 299A and junction links (not shown) as end caps shown in FIG. 26C, the corner elements change to three-connector PCBs 303 improving redundancy of circuits $C_{1,1}$, $C_{1,4}$, $C_{3,1}$, and $C_{3,4}$ to RF=2. There is no change to the redundancy of the center and center-edge circuits. Overall system redundancy improves to LRF=2 with an ARF=2.33.

Figure 26D:
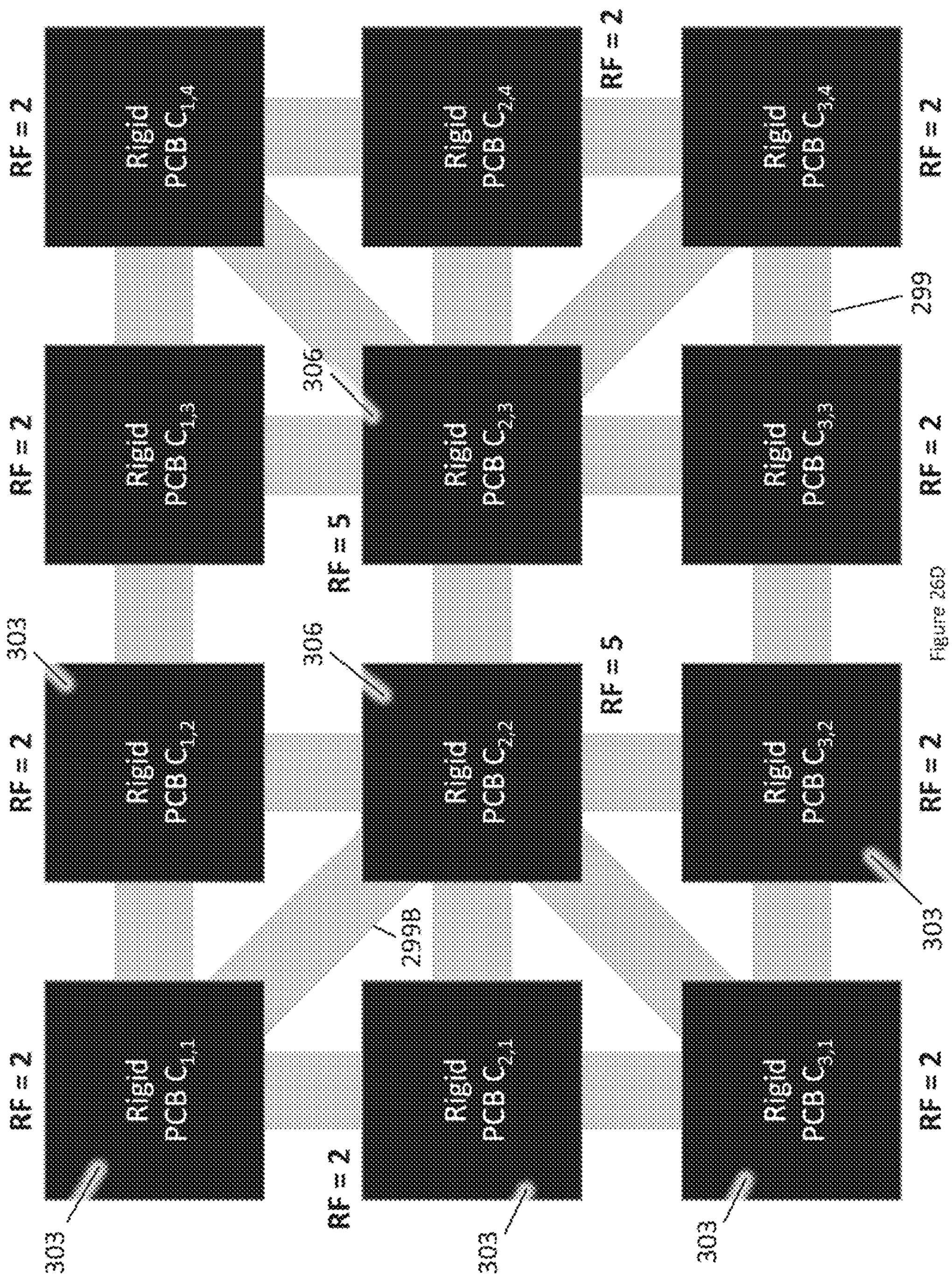
FIG. 26D is a simplified block diagram representing the electrical topology of an alternate 12-rigid PCB system including diagonal interconnections where RF≥2.

An alternative embodiment for the same 3×4 network is achieved by the inclusion of diagonal connectors of flex 299B as shown in FIG. 26D and included between circuits $C_{1,1}$ and $C_{2,2}$, $C_{3,1}$ and $C_{2,2}$, $C_{1,4}$ and $C_{2,3}$, $C_{3,4}$ and $C_{2,3}$. Accordingly, all edge and corner circuits improve to a redundancy of RF=2, specifically circuits $C_{1,1}$, $C_{1,2}$, $C_{1,3}$, and $C_{1,4}$ in row 1, circuits $C_{2,1}$, and $C_{2,4}$ in row 2, and circuits $C_{3,1}$, $C_{3,2}$, $C_{3,3}$, and $C_{3,4}$ in row 3 improving the system redundancy to LRF=2 and ARF=2.5. Because of the added diagonal connections the redundancy of center circuits $C_{2,2}$ and $C_{2,3}$ increase to RF=5, making them ideal for implementing critical circuit components.

Figure 27A:
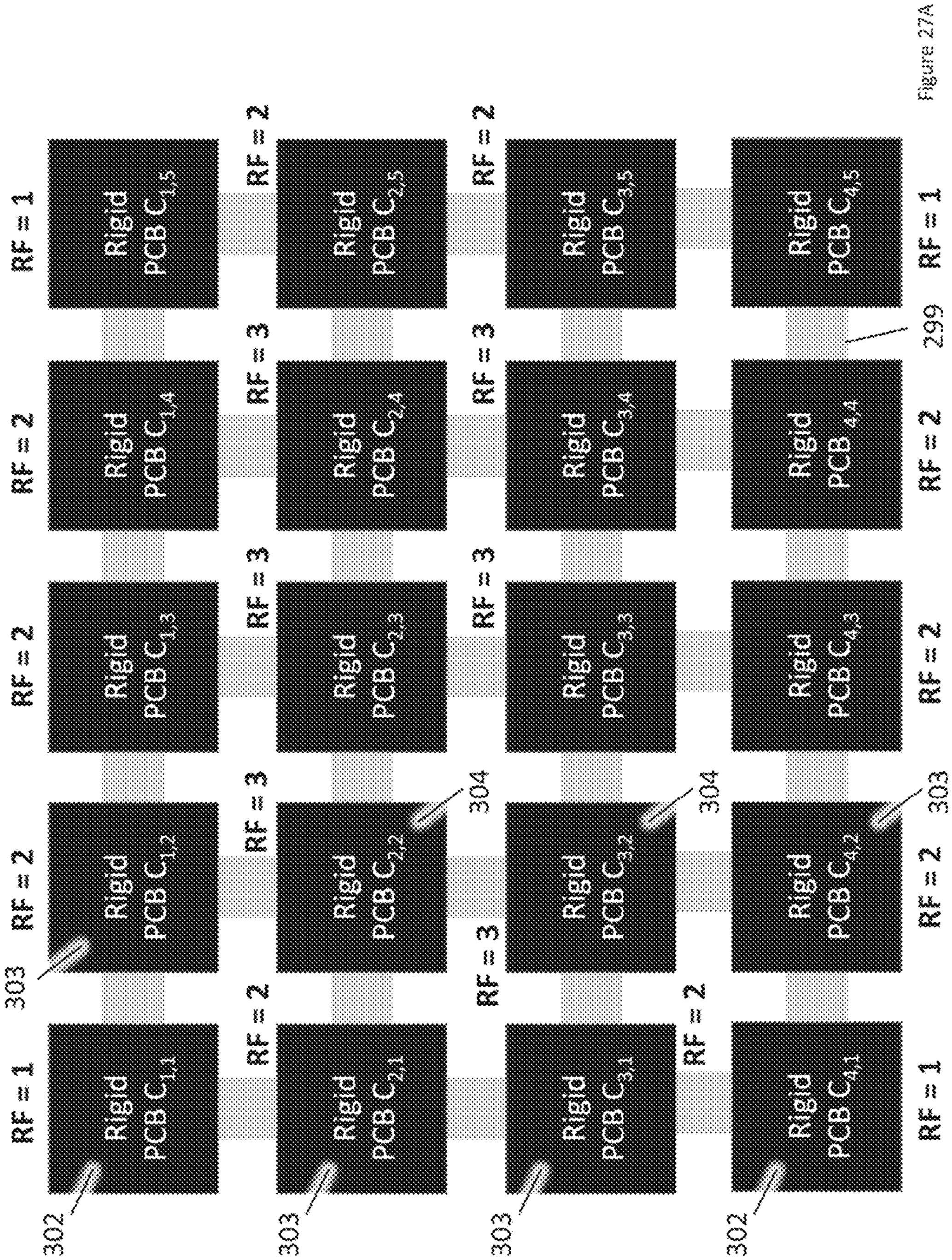
FIG. 27A is a simplified block diagram representing the electrical topology of a 20-rigid PCB system where RF≥1.

FIG. 27A illustrates a topological example of a system comprising twenty rigid PCBs arranged in a 4×5 grid. As shown, the grid comprises three types of PCBs:

The center PCBs 304 surrounded by four flex 299 connections resulting in circuits $C_{2,2}$, $C_{2,3}$, and $C_{2,4}$ in row 2 and circuits $C_{3,2}$, $C_{3,3}$, and $C_{3,4}$ in row 3 all with redundancy RF=3.

The center-edge PCBs 303 contacting three flex 299 connections resulting in circuits $C_{1,2}$, $C_{1,3}$, $C_{1,4}$, $C_{2,1}$, $C_{2,2}$, $C_{2,3}$, $C_{3,1}$, $C_{4,2}$, $C_{4,3}$, and $C_{4,4}$, each with redundancy RF=2.

The corner PCBs 302 contacting two flex 299 connections resulting in circuits $C_{1,1}$, $C_{1,5}$, $C_{4,1}$, and $C_{4,5}$, each with redundancy RF=1.

An overall system redundancy of LRF=1 as limited by the corner PCBs and an average ARF=2.1.

With a corresponding redundancy factor of RF=3, any center circuits are preferable for integrating critical functions and circuitry.

Figure 27B:
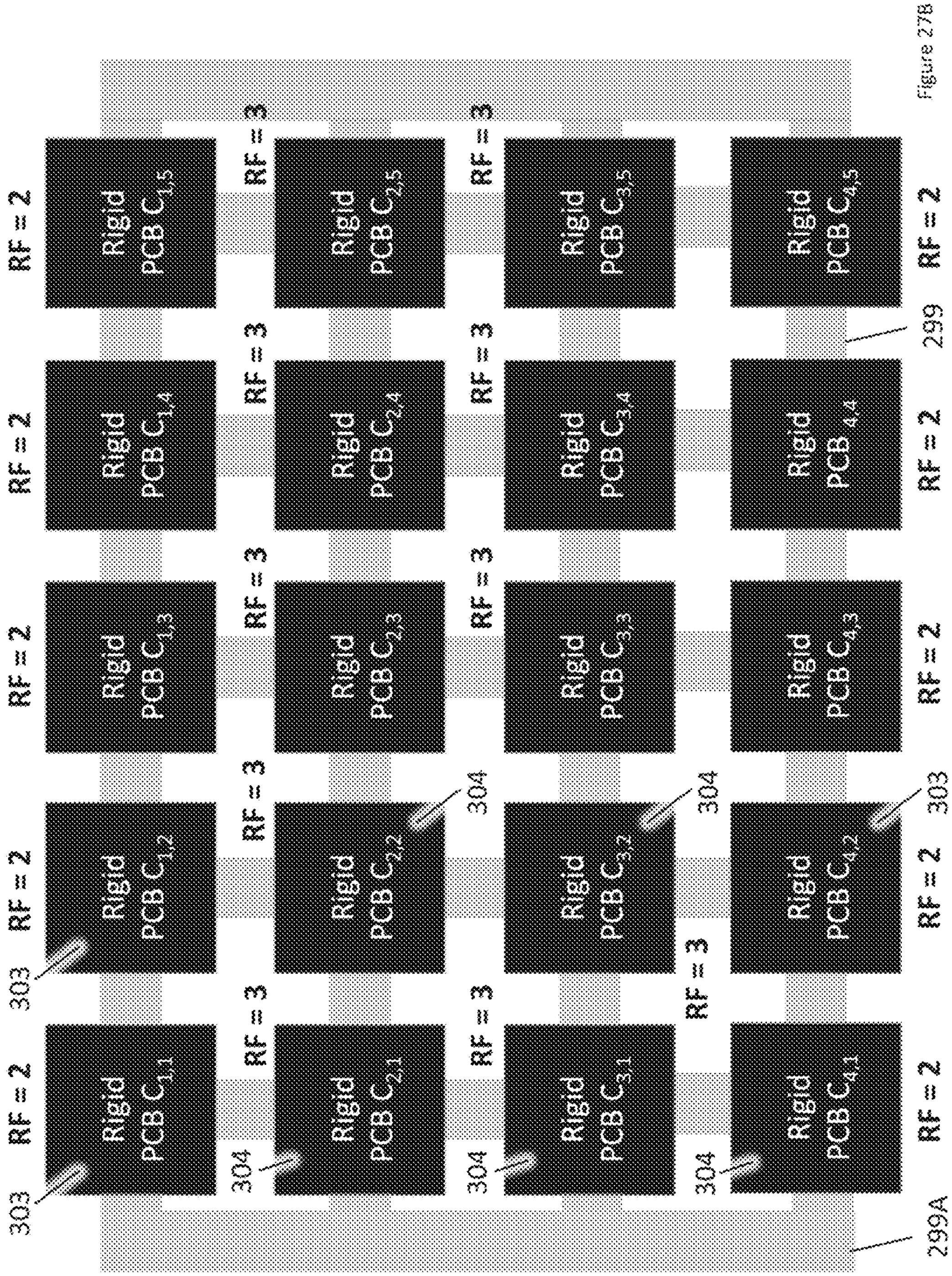
FIG. 27B is a simplified block diagram representing the electrical topology of a 20-rigid PCB system where RF≥2.

By adding flex 299A and junction links (not shown) as end caps shown in FIG. 27B, the corner elements change to three-connector PCBs 303 improving redundancy of circuits $C_{1,1}$, $C_{1,5}$, $C_{4,1}$, and $C_{4,5}$ to RF=2 as well as increasing the redundancy of the center-edge circuits $C_{2,1}$, $C_{3,1}$, $C_{2,5}$, and $C_{3,5}$ to RF=3. Overall system redundancy improves to RF=2 as determined by the corner circuits and average ARF=2.5.

Figure 27C:
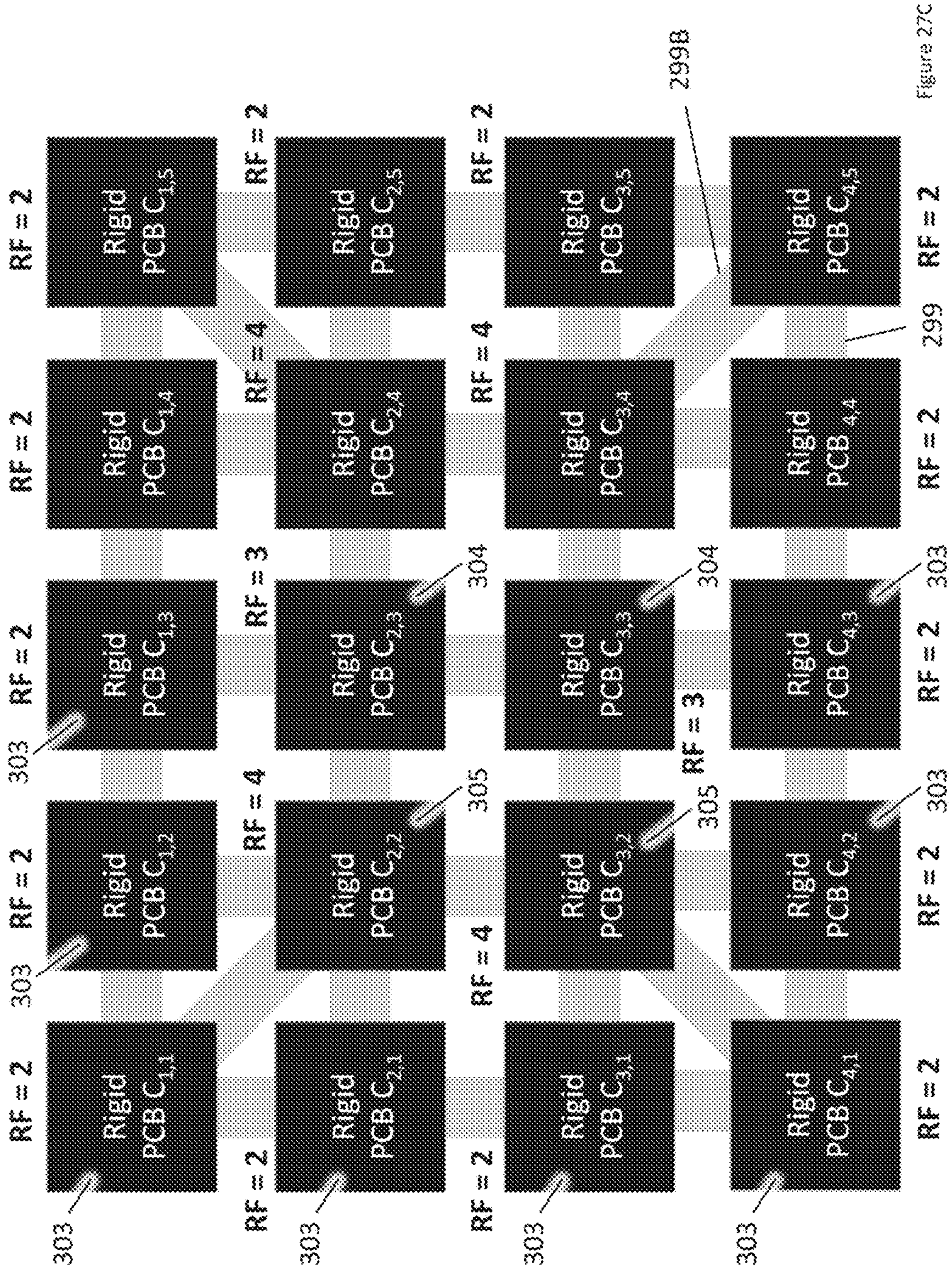
FIG. 27C is a simplified block diagram representing the electrical topology of a 20-rigid PCB system including diagonal interconnections where RF≥2.

An alternative embodiment for the same 4×5 network is achieved by the inclusion of diagonal connectors of flex 299B as shown in FIG. 27C between circuits $C_{1,1}$ and $C_{2,2}$, $C_{4,1}$, and $C_{3,2}$, $C_{1,5}$ and $C_{2,4}$, as well as $C_{3,4}$ and $C_{4,5}$. Accordingly, all edge and corner circuits improve to a redundancy of RF=2, specifically circuits $C_{1,1}$ through $C_{1,5}$ in row 1, circuits $C_{4,1}$ through $C_{4,5}$ in row 4, circuits $C_{1,1}$ through $C_{5,1}$ in column 1, and circuits $C_{1,5}$ through $C_{4,5}$ in column 5, similarly achieving system redundancy to LRF=2 and ARF=2.5. In physical realizations, eliminating the need for extra, dedicated interconnections improves the area efficiency of the system. Because of the added diagonal connections, the redundancy of internal circuits $C_{2,2}$, $C_{2,4}$, $C_{3,2}$, and $C_{5,4}$ increase to RF=4, making them ideal for implementing critical circuit components. Center circuits $C_{2,3}$ and $C_{3,3}$ remain unchanged at RF=3 but the need for the end caps 299A external to the topological grid is eliminated.

Figure 27D:
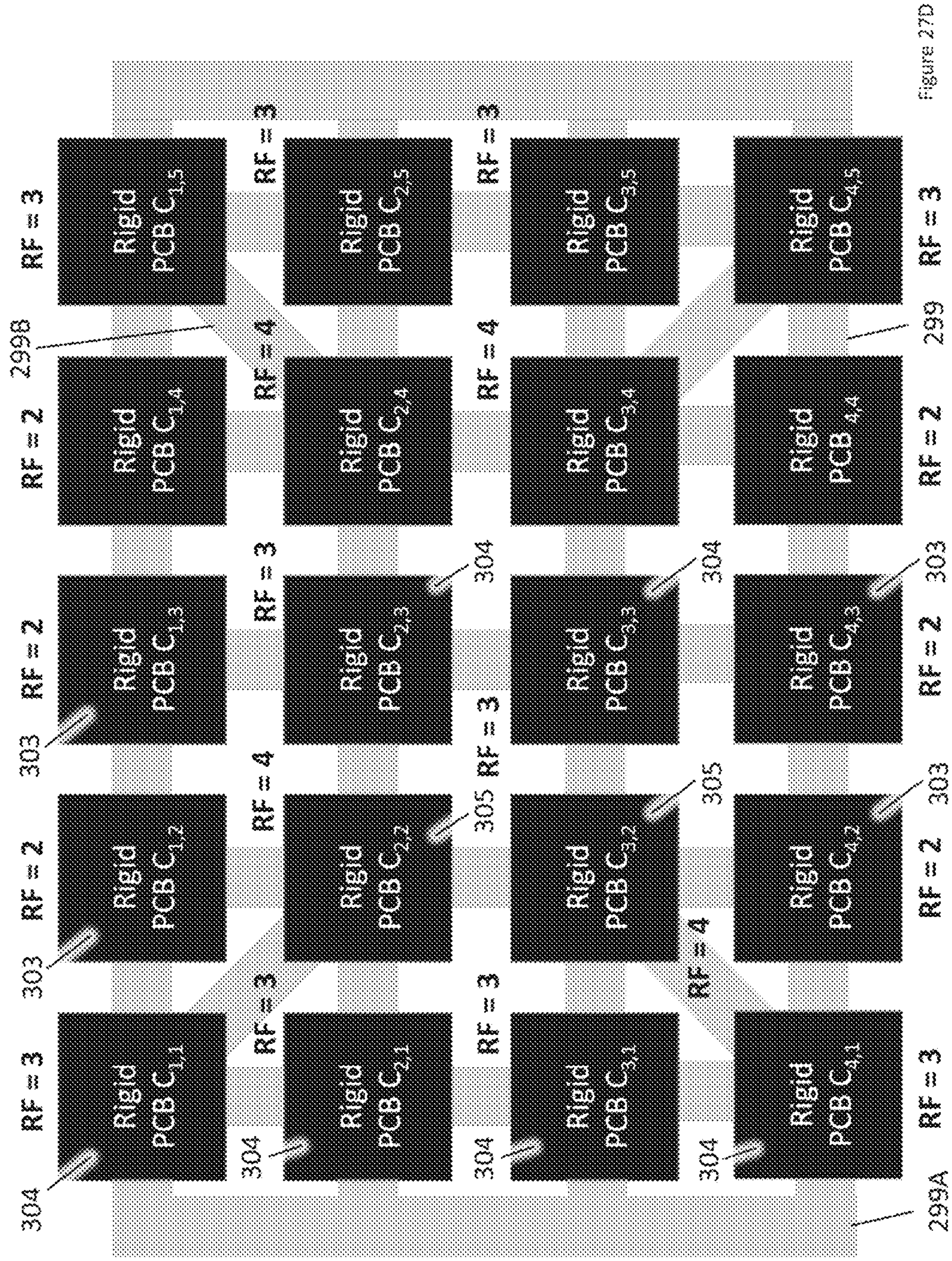
FIG. 27D is a simplified block diagram representing the electrical topology of an alternate 20-rigid PCB system including diagonal interconnections where RF≥2.
Figure 27E:
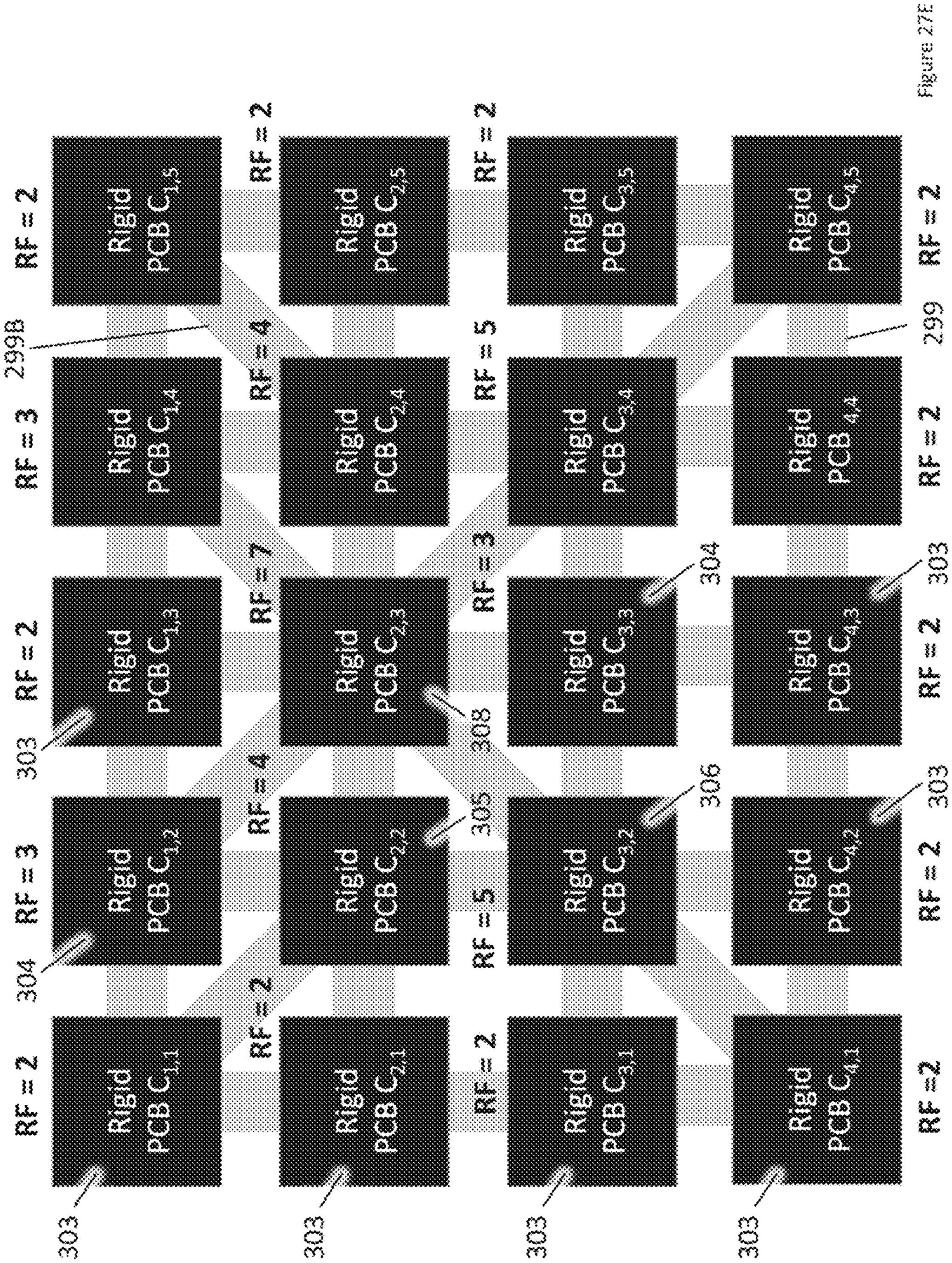
FIG. 27E is a simplified block diagram representing the electrical topology of another 20-rigid PCB system with diagonal interconnections where RF≥2.

As shown in FIG. 27D, combining the use of diagonal connections 299B with end caps 299A improves the overall average redundancy of the network but may not improve the system's lowest redundancy factor. As shown, the addition of end caps 299A increases the redundancy factor of column 1 and column 5 circuits to RF=3 and increases the average redundancy to ARF=2.9 but because of circuits $C_{1,2}$ through $C_{1,4}$ and $C_{4,2}$ through $C_{4,4}$, the redundancy of the overall system remains at LRF=2. Whenever the ARF differs greatly from the LRF it means the system's is not uniform, i.e. some circuits have disproportionately high redundancy compared to the system's least redundant circuit components.

In some instances, e.g. where a critical component or like a connector or a microcontroller is integrated into a distributed circuit, it is particularly valuable to provide extraordinary redundancy to the PCBs containing the critical circuitry. Such is the case shown in FIG. 27E where by the addition of diagonal interconnection surrounding circuit $C_{2,3}$, the total number of connections to PCB 308 increases to eight, and the corresponding redundancy factor of circuit $C_{2,3}$ increases to RF=7. Example application of this method is to improve the reliability of key circuits such as power and control. Despite the high degree of redundancy on select circuits achieved using this method, the overall system redundancy is not improved because the corner and most of the edge circuits still have a redundancy of LRF=2. At ARF=2.8, average redundancy is high because of row 3 and especially row two containing the high RF circuit $C_{2,3}$.

Figure 27F:
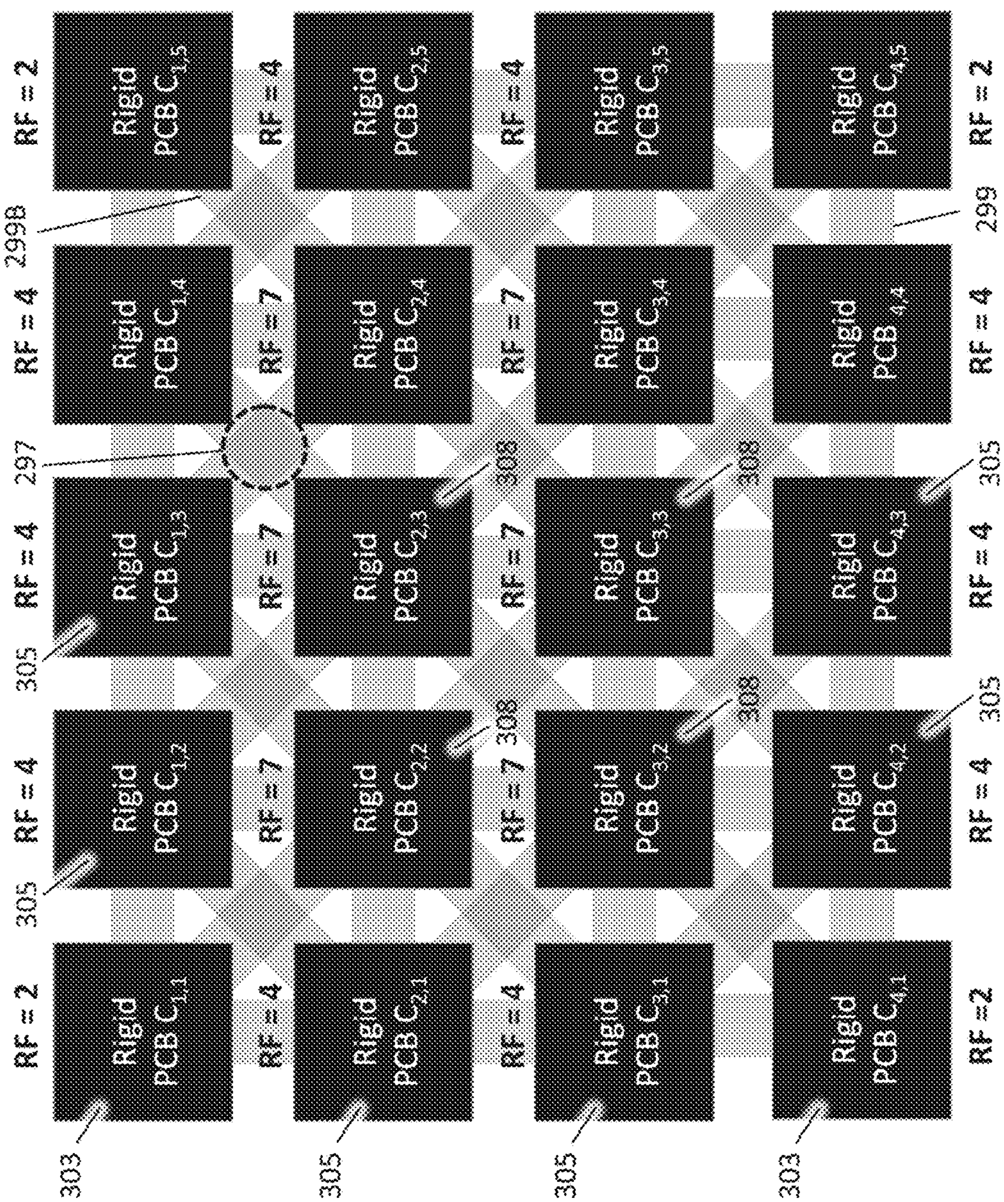
FIG. 27F is a simplified block diagram representing the electrical topology of yet another 20-rigid PCB system with diagonal interconnections where RF≥2.

To uniformly improve the reliability of more circuits in the matrix, the use of a "x-shaped" diagonal junction link 297 may be employed as shown in FIG. 27F. In a manner similar to "T-shaped" junction link 295 and the "+ shaped" junction link 296, the "x-shaped" junction link 297 connects like type electrical connections from four different flex connections. Using this topology all internal circuits increase to eight connection PCB 308, with a corresponding redundancy of RF=7, and all edge circuits except the corners increase to five connections comprising PCB 305 with RF=4. The corner circuits comprising three connection PCBs 303 still remain the weakest element with LRF=2, but the system's average redundancy increases significantly to ARF=4.5.

So despite the high component circuit reliability throughout, the weakest least reliable element in the system remains the corner pieces. To enhance the total electrical system reliability by minimizing the impact of these corner circuits in accordance with this invention involves either, Adding a edge strap connection to the corner circuits as shown in FIG. 27G, Implementing only non-critical functions in the corner circuits $C_{1,1}$, $C_{1,5}$, $C_{4,1}$, and $C_{4,5}$, or Completely eliminating any circuit functionality from the corner PCBs, i.e. converting them into purely passive circuits or interconnects as shown in FIG. 27H.

Figure 27G:
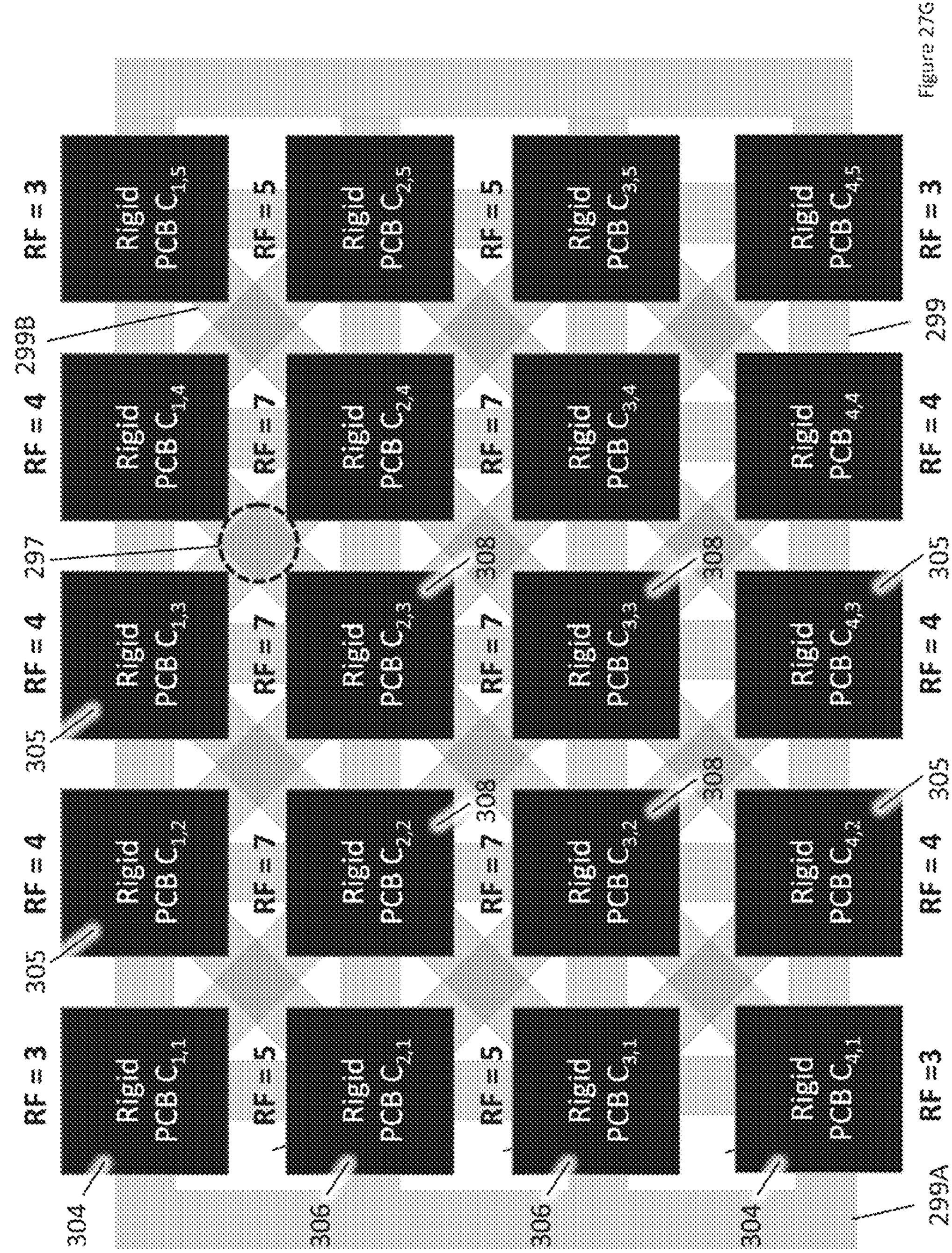
FIG. 27G is a simplified block diagram representing the electrical topology of a 20-rigid PCB system with diagonal interconnections and vertical end caps where RF≥3.
Figure 27H:
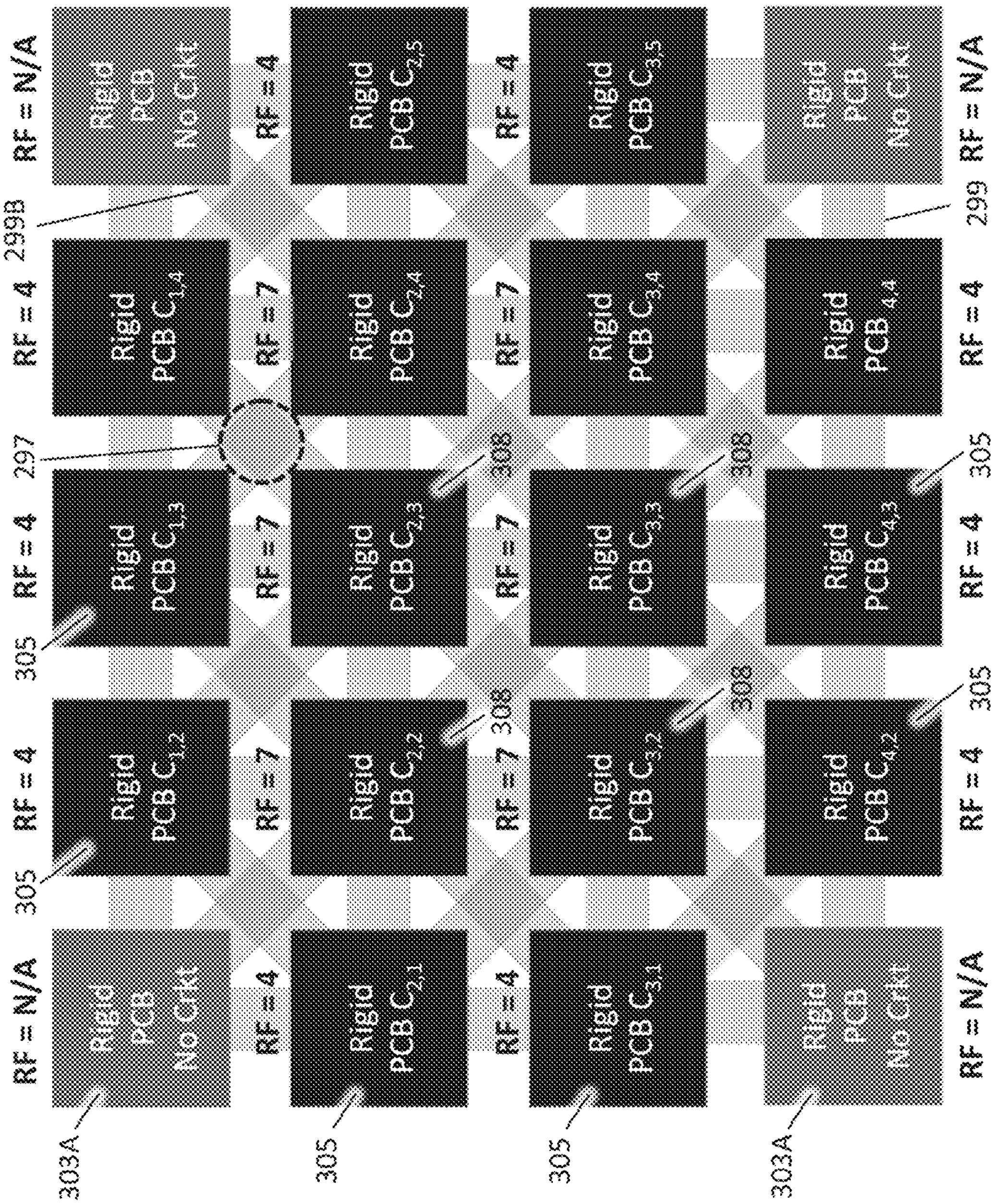
FIG. 27H is a simplified block diagram representing the electrical topology of a 20-rigid PCB system with diagonal interconnections with inactive corner PCBs where RF≥4.

As shown FIG. 27G employs diagonal interconnects 299B in addition to rectangular gridded interconnections 299 and end caps 299A. The resulting redundancy varies depending on the circuit's location in the grid, with Corner PCBs 304 used circuits $C_{1,1}$, $C_{1,5}$, $C_{4,1}$, and $C_{4,5}$, with redundancy RF=3.

Center top and bottom edge PCBs 305 on $1^{st}$ and $4^{th}$ rows comprising circuits $C_{1,2}$, $C_{1,3}$, $C_{1,4}$, and $C_{4,2}$, $C_{4,3}$, $C_{4,4}$, all with redundancy RF=4.

Center side edge PCBs 306 on $1^{st}$ and $5^{th}$ columns comprising circuits $C_{2,1}$, $C_{3,1}$, and $C_{2,5}$, $C_{3,5}$, all with redundancy RF=5.

Internal PCBs 308 comprising circuits $C_{2,2}$, $C_{2,3}$, $C_{2,4}$, and $C_{3,2}$, $C_{3,3}$, $C_{3,4}$, all with redundancy RF=7.

With all internal circuits having a RF=7, such a topology is especially robust for use in systems requiring numerous critical circuits. At LRF=3, the lowest redundancy circuits still comprise the corner circuits but the average redundancy ARF=4.9 is the highest described for any topology disclosed.

Alternatively, as shown in FIG. 27H, the four corner circuits comprising PCBs 303A can exclude any circuitry, performing only interconnection. In such cases the redundancy factor RF=N/A, i.e. not applicable and are not included as components in calculating the system's overall redundancy. With corner circuits removed from consideration, the lowest redundancy circuit components comprise the edge circuits with LRF=4. In calculating the average redundancy factor, the total number of circuits is reduced from 20 to 16 to account for the inactive corner PCBs. The resulting ARF=5.1, even better than topologies employing both "x-shaped" junction links and vertically oriented end cap such as the topology shown in FIG. 27G.

Figure 27I:
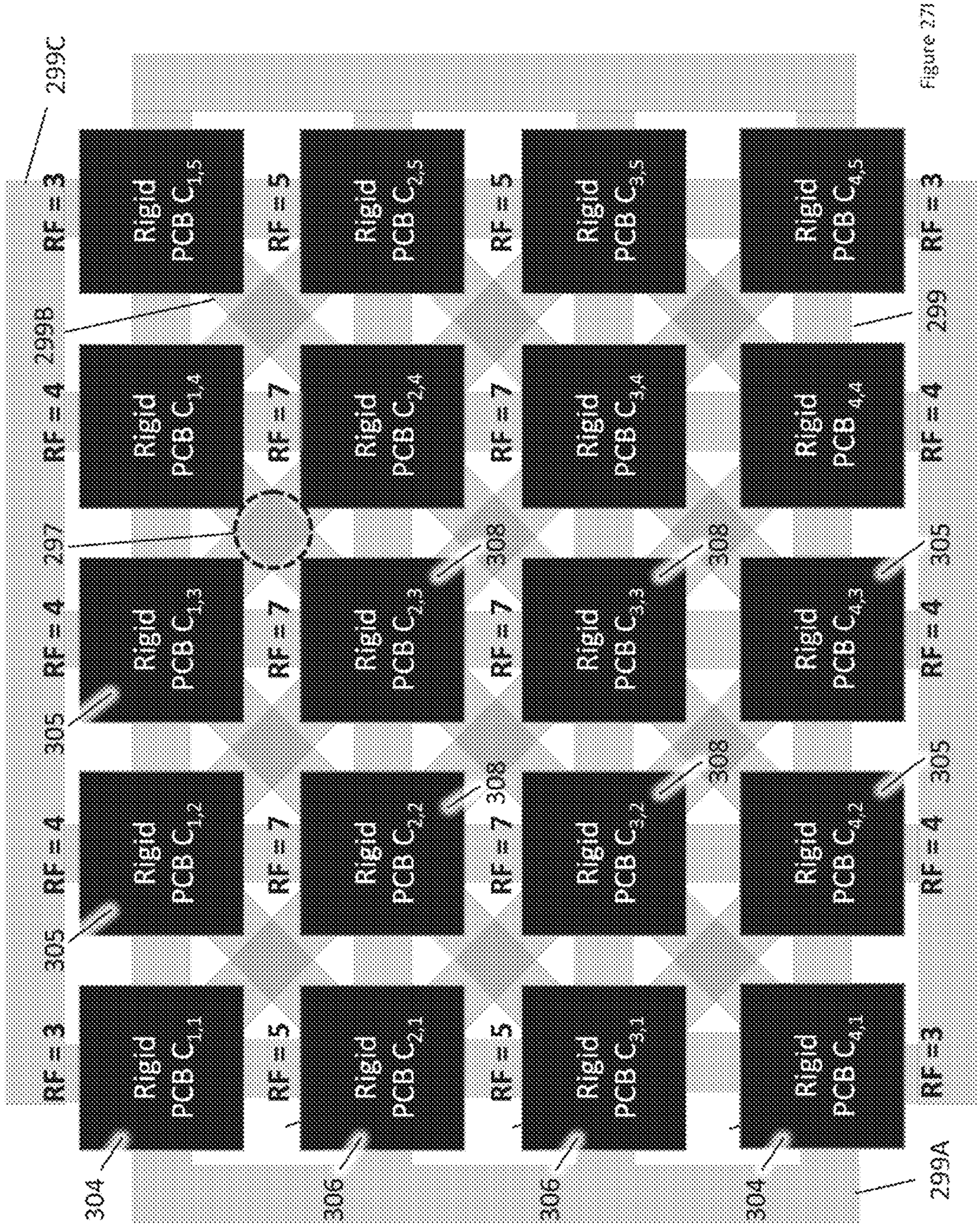
FIG. 27I is a simplified block diagram representing the electrical topology of a 20-rigid PCB system with diagonal interconnections and both vertical and horizontal end caps where RF≥4.

Aside from eliminating the corners, the other method to increase the system's redundancy shown in FIG. 27I is to utilize both horizontal and vertical end caps 299A and 299C along with diagonal connections 299B comprising "x-shaped" junction links 297. In this case the redundancy factor for each circuit in the top and bottom row are increased by 1 from the prior case shown in FIG. 27G. The resulting average redundancy is ARF=5.4, higher than any previously described topology. The lowest redundancy still occurs in the corner circuits, but at LRF=4, this degree of redundancy is superior to all the previously disclosed topologies.

Figure 28A:
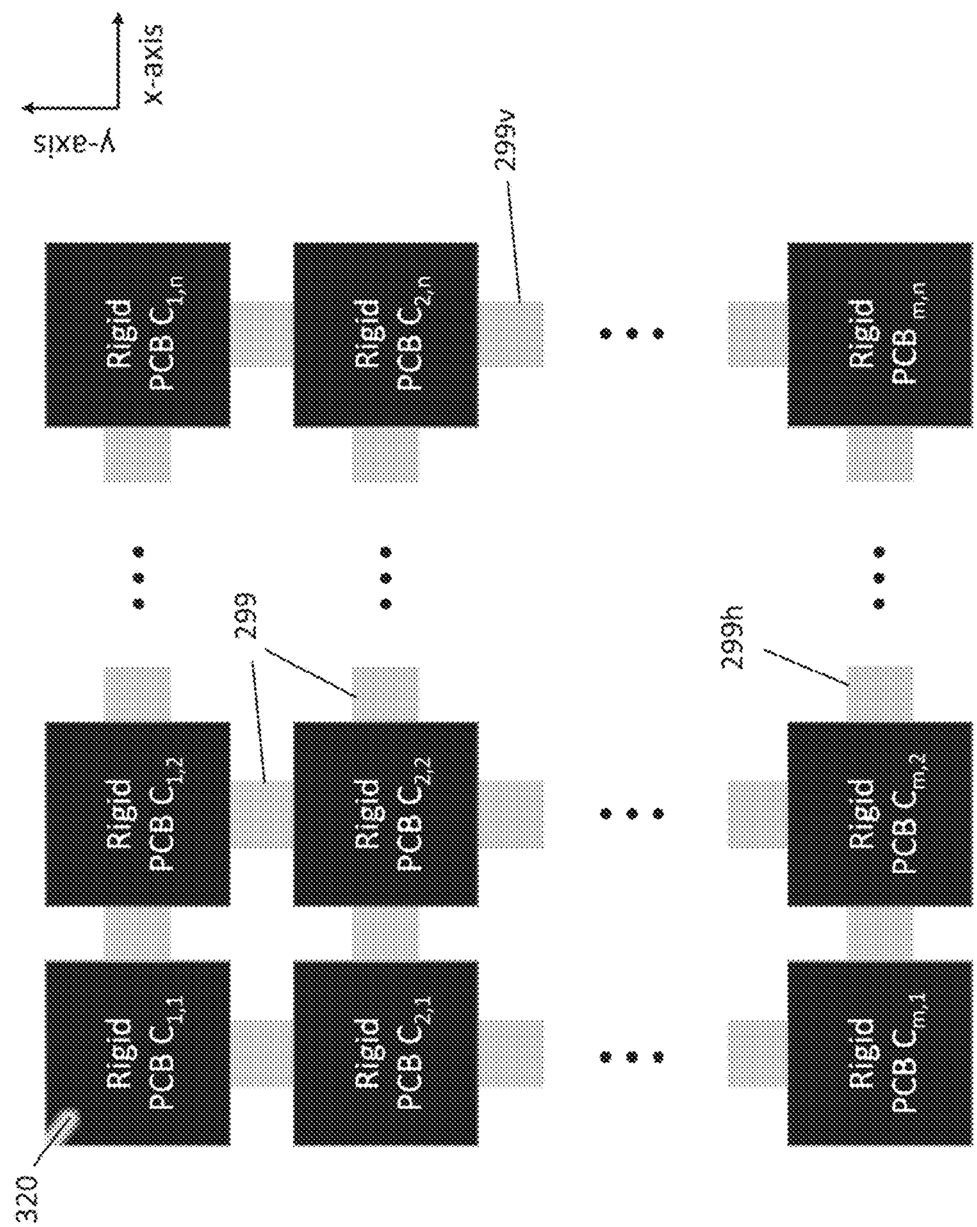
FIG. 28A is a simplified block diagram representing a generalized rectangular electrical network topology.
Figure 288:
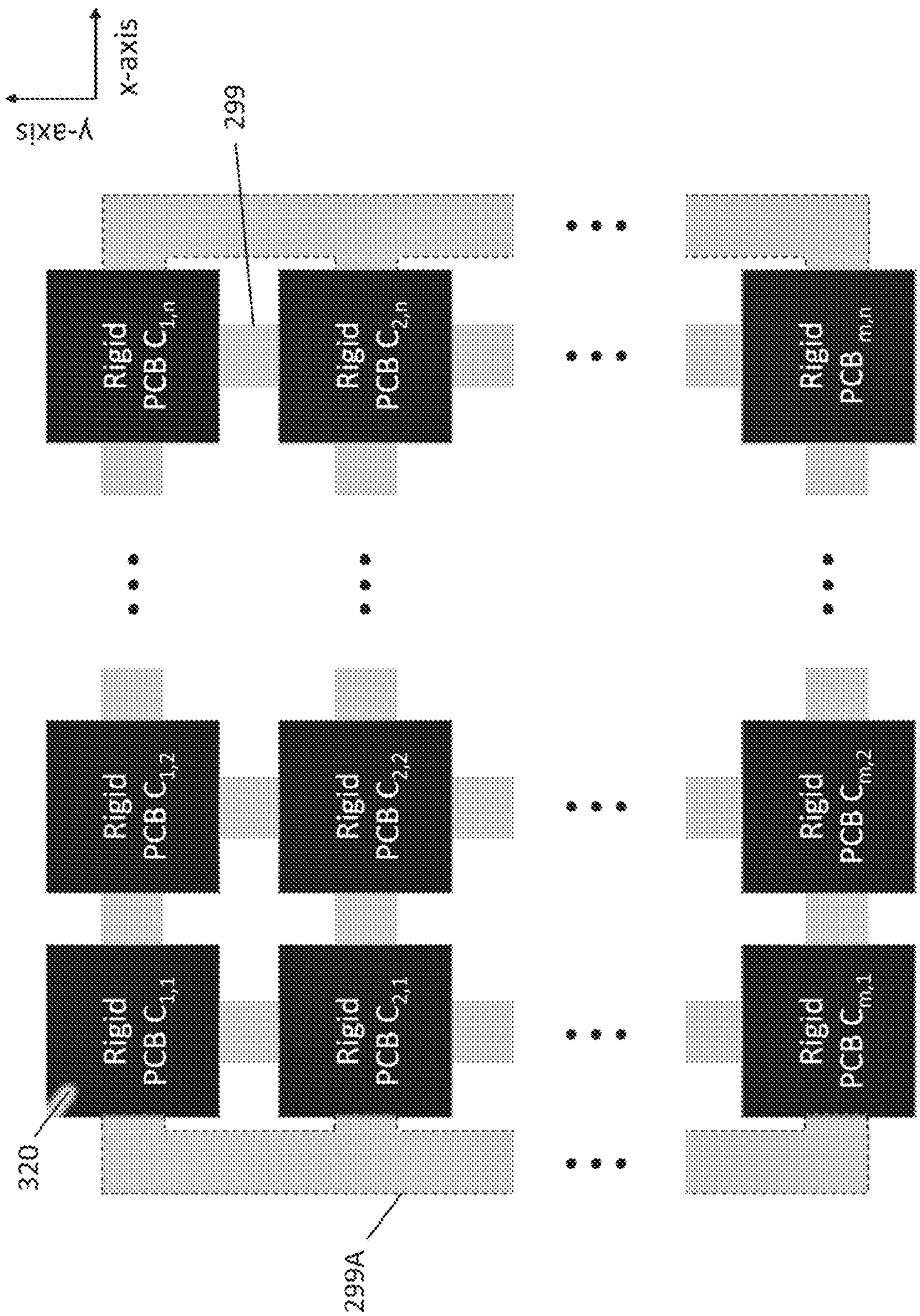

To generalize the previous cases, the disclosed redundant interconnection of circuits can be represented as a rectangular grid of circuits with flex 299 connections shown in FIG. 28A comprising m rows and n columns with circuits $C_{2,1}$ through $C_{m,n}$. Flex 299 connection may be subdivided into vertical flex 299*v* connections and horizontal flex 299*h* connections. Since the network is topological rather than physical, the terms horizontal and vertical are made in reference to the orthogonal x-axis and y-axis in the drawing for explanatory purposes. The orientation shown is arbitrary, for example an electrically equivalent topological network can be constructed by rotating the entire structure 90° clockwise or counter clockwise without impacting the relative topological relationships of the network's constituent connections. The number of connections in a single-plane grid topology comprising "m" rows and "n" columns of circuits can be determined by calculating the number of horizontal flex connections 299*h* and the number of vertical columns of flex connections 299*v*. Specifically, in "n" vertical columns, each column contains (m−1) interconnects 299*v*. The total number of vertical flex interconnects 299*v* is then the multiplicative product of the number of columns and the number of flex connectors in each column, i.e. $n \cdot (m-1)$. Specifically, in "m" horizontal rows, each row contains (n−1) interconnects 299*h*. The total number of horizontal flex interconnects 299*h* is then the multiplicative product of the number of rows and the number of flex connectors in each row, i.e. $m \cdot (n-1)$. The total number of interconnects 299 in the system is the sum of the vertical flex 299*v* and horizontal flex 299*h* connections, or $[n \cdot (m-1)+m \cdot (n-1)]$. For example, in the system comprising 20 circuits in a 4×5 grid shown in FIG. 27A, m=4, n=5 and the total number of flex 299 connections equals $[5 \cdot (4-1)+4 \cdot (5-1)]=[15+16]=31$, matching the illustration.

Without end cap connections, corner circuits $C_{1,1}$, $C_{1,n}$, $C_{m,1}$ and $C_{m,n}$ exhibit redundancy RF=1 and all center edge circuits exhibit RF=2 including side center circuits in columns 1 and "n" from row 2 to row (m−1), and circuits in columns 1 through (n−1) in row 1 and in row "m". With no diagonal connections all internal circuits exhibit redundancy RF=3.

Adding vertical end caps 299A shown FIG. 28B increases the number of flex connected to the circuits by 2m, i.e. the total number of connections becomes $[(n \cdot (m-1))+2m+(m \cdot (n-1))]$, and improves the redundancy factor of the corners to RF=2, and increases the redundancy of the non-corner circuits of column 1 and column "n" to a redundancy factor RF=3.

Figure 28C:
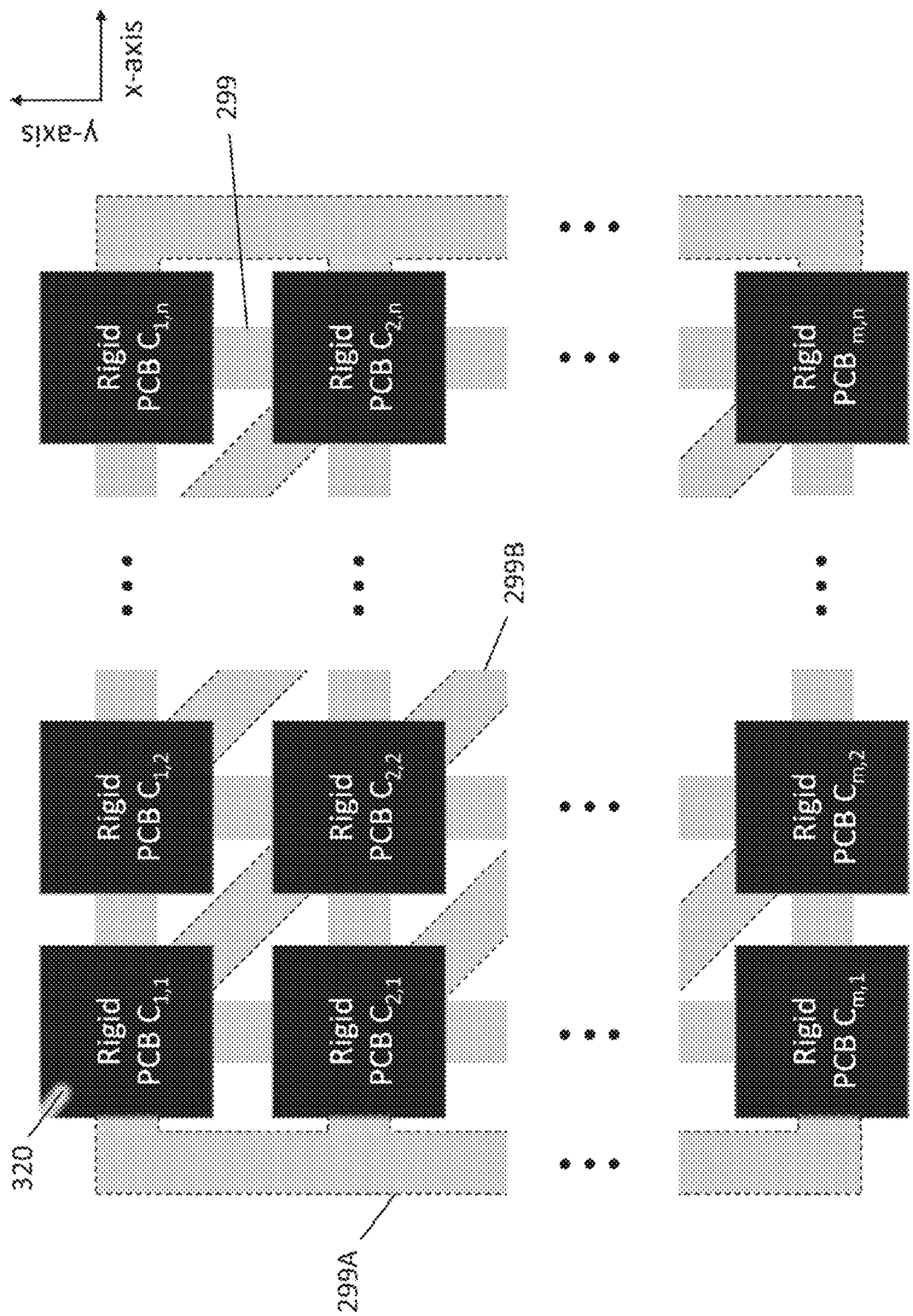
FIG. 28C is a simplified block diagram representing a generalized rectangular electrical network topology including diagonal interconnections and vertical end caps.

The generalized enhanced interconnection topology shown in FIG. 28C combines elements of a rectangular grid of circuits comprising flex 299 interconnections along with end cap comprising flex 299A and diagonal interconnects comprising flex 299B. In this combination, the reliability of corner circuits $C_{1,1}$ and $C_{m,n}$ improves to RF=3, the non-corner edge circuits increase to RF=4, and the internal circuits improve to RF=5. Unfortunately, since the diagonal interconnects are directional, descending from left to right, then corners $C_{m,1}$ and $C_{1,n}$ do not benefit from diagonal connections and remain limited to RF=2. Other irregular topological patterns such as that of FIG. 27E solve the problem in the corners but exhibit low redundancy in other edge circuits.

Figure 28D:
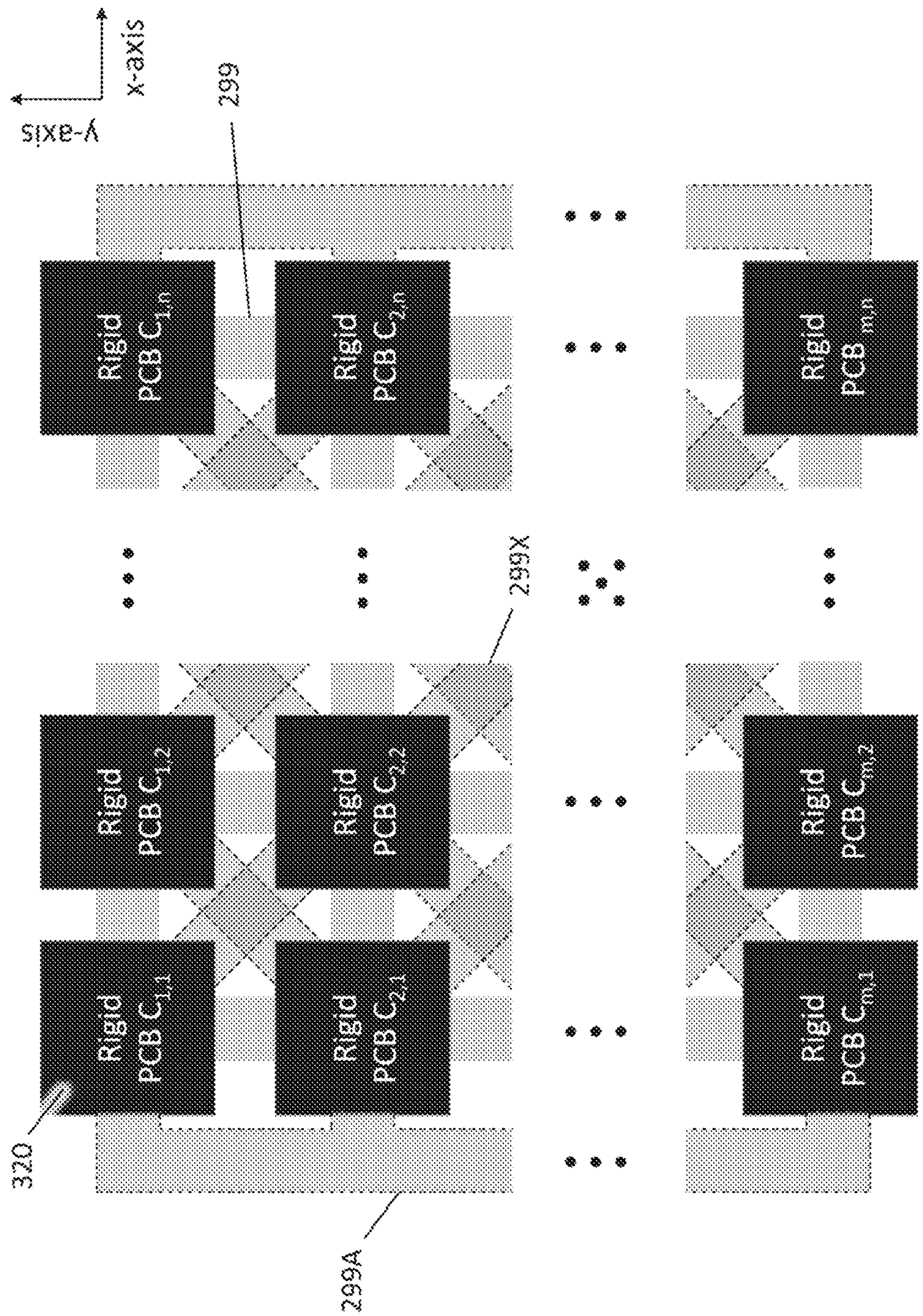
FIG. 28D is a simplified block diagram representing a generalized rectangular electrical network topology including "x-shaped" diagonal interconnections and junction links with vertical end caps.
Figure 28E:
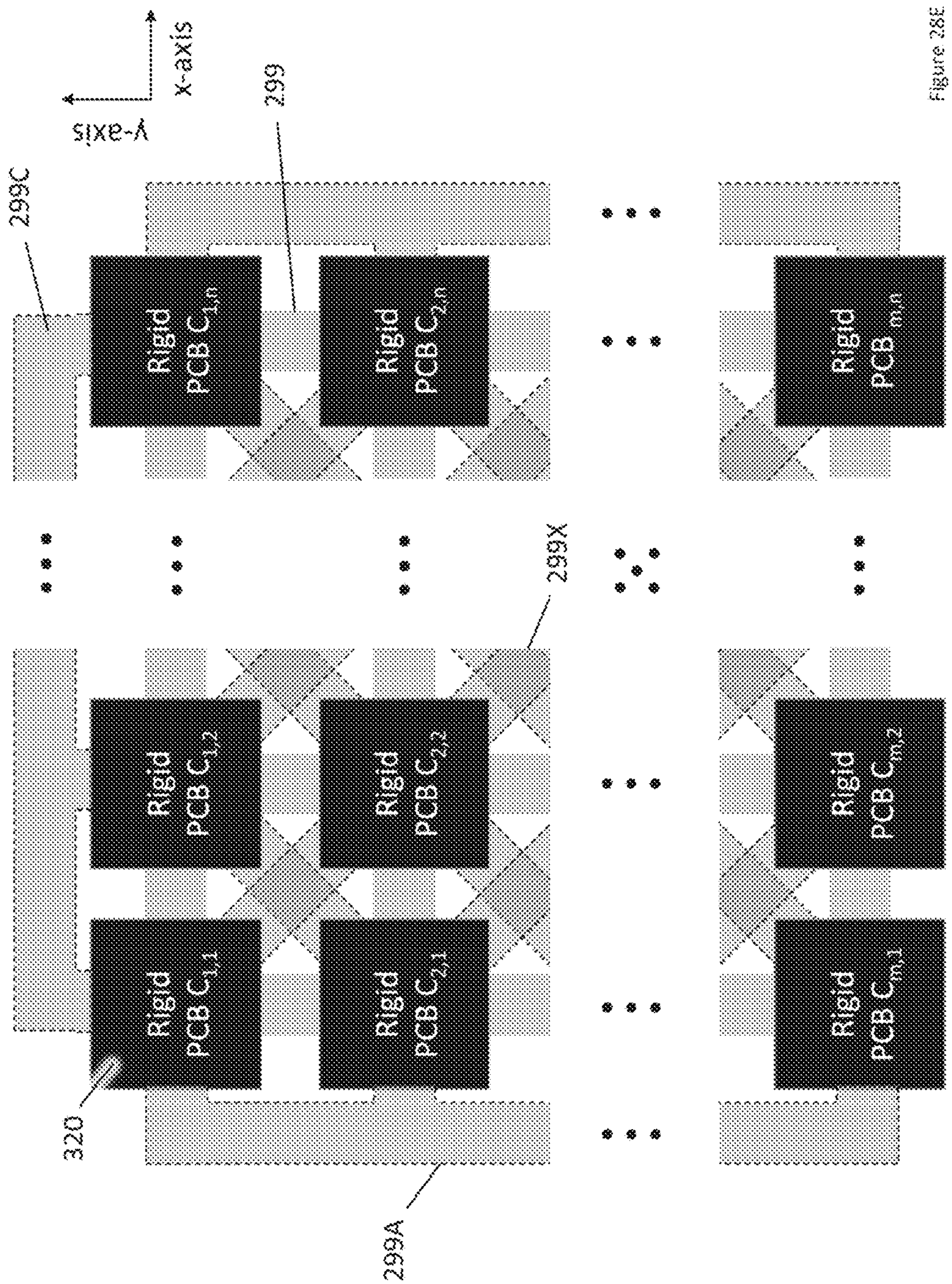
FIG. 28E is a simplified block diagram representing a generalized rectangular electrical network topology including "x-shaped" diagonal interconnections and junction links with vertical end caps and horizontal end caps.

The RF uniformity issue in a distributed circuit is best resolved by the use of the aforementioned x shaped junction link 299X described previously, especially when combined with a vertical end cap 299A such as shown in FIG. 28D. In this combination, the reliability of every corner circuit improves to RF=3, the non-corner edge circuits increase to RF=5, and the internal circuits all improve to RF=7. The redundancy is increased further by the addition of horizontal end caps 299C shown in FIG. 28E, improving the corner redundancy to RF=4 and all non-corner edge circuits to RF=5.

Figure 29B:
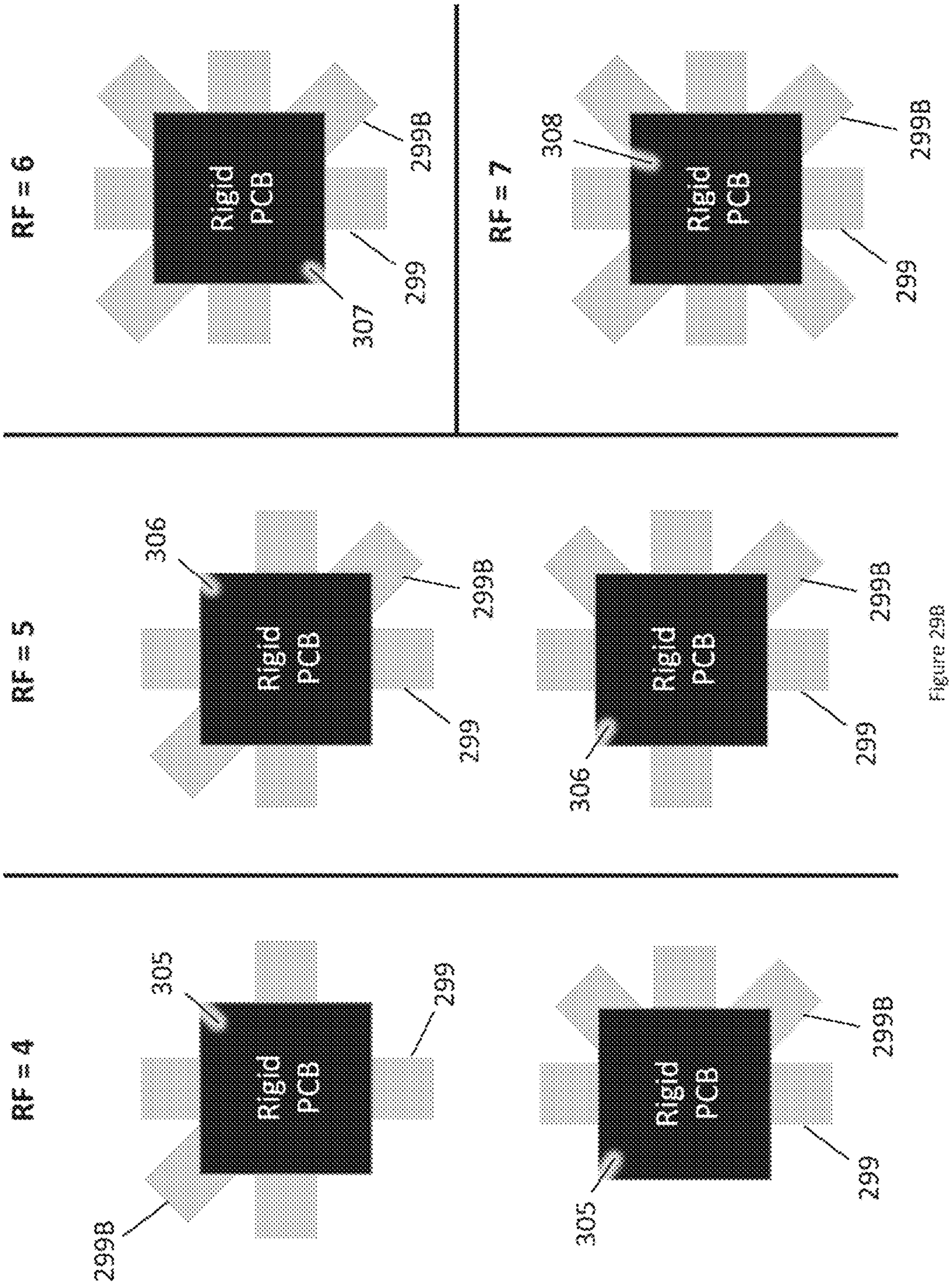
FIG. 29B comprises redundantly interconnected PCB block elements for RF≤4, RF≤5, RF≤6, and RD≤7.

As described previously, the redundancy of each circuit element can be counting the number of flex connectors connected to the rigid PCBs. These various combinations are summarized in FIG. 29A and FIG. 29B. As shown, FIG. 29A illustrates rigid PCB 302 in various geometries, i.e. one straight and one L-shaped, where each rigid PCB 302 has two flex connector 299 connections resulting in a redundancy RF=1. For redundancy RF=2, rigid PCBs 303 have three flex connectors 299 connecting in a T shape (top), two flex connectors 299 and one diagonal connector 299B connecting in a Y shape (center), and two flex connectors 299 and one diagonal connector 299B connecting in a E shape (bottom). RF=3 geometries comprising PCB 304 utilize four flex connectors 299 connecting in a + shape (top) and a modified T shape (bottom) with three flex connectors 299 and diagonal flex connector 299B. Similarly, FIG. 29B illustrates RF=4 geometries, including a modified "+ shaped" geometry PCB 305 with four flex connectors 299 and one diagonal flex connector 299B (top), and three flex connectors 299 with two diagonal flex connectors 299B connecting in a modified T shape (bottom). RF=5 geometries include four flex connectors 299 connecting with two diagonal flex connectors 299B connecting, with the flex connectors diametrically oriented (top) or perpendicular to one another (bottom). The illustrated RF=6 geometry comprises a "+ shaped" geometry with four flex connectors 299 and three diagonal flex connectors 299B. The superior redundant element, RF=7, comprises a "+ shaped" combination of four flex connectors 299 connecting with intervening four diagonal flex connectors 299B.

System Reliability

As described, redundancy improves system reliability and facilitates immunity from damage or wear out resulting from repeated flexing cycles of a distributed bendable PCB as disclosed in accordance with this invention. In the following discussion on system reliability, or conversely on the likelihood of component and system failure, the variable "p" is used to denote statistical probability, the notation pr is used to denote probability of failure and the subscripts "i", "r" and "s" are used to identify flex interconnects, rigid PCBs, and a total system respectively. For example, the using this notation, the term pr means the probability of failure of an interconnect failure, while the term $p_{fs}$ denotes the probability of a system failure. The probability that a system does not fail, the converse of its failure probability, is given by the relation $(100\%-p_{fs})$.

In the case of RF=0, a system has no electrical redundancy. If the system has a failure in either the rigid PCB circuitry (or components thereof), or in the interconnections between the rigid PCBs, then the system will fail. In practice, the probability of a flex PCB interconnect failure "$p_{fi}$" is much higher than the probability of a rigid PCB failure $p_{fr}$, i.e. $p_{fi} >> p_{fr}$, then the probability of a system failure $p_{fs}$ is equal to the probability of an interconnect failure as given by $p_{fs} = p_{fi}$.

In a redundant system as disclosed herein having a RF=1, two failures must occur to result in a system failure. Considering normal use, i.e. ignoring the possibility of catastrophic mechanical damage (such as horse stepping on a LightPad), then in a RF=1 system with only two circuits and two interconnects shown in the topology of FIG. 20, and assuming independent failure events unrelated to one another, the probability of system failure is the multiplicative probability of the two failures, i.e.

$$p_{fs} = p_{fi} \cdot p_{fi} = (p_{fi})^2$$

The same result occurs for a system comprising three PCB as shown in the RF=1 redundant topology of FIG. 21A. As shown any two flex 300 failures will isolate one of the three circuits from the others and the system will fail. For example, if the flex located between $C_{1,1}$ and $C_{1,2}$ fails, and independently the flex between $C_{1,2}$ and $C_{1,3}$ fails, then circuit $C_{1,2}$ will be cut off from the network.

In systems with greater numbers of circuits all of varying redundancies, the failure rate of the system is lower because there is a greater probability that two successive failures will occur in different parts of the circuit and not result in a system failure. For example in the system comprising multiple circuits with RF=1 shown in FIG. 23A, two failures may not produce a system failure even though the system redundancy is RF=1. For example, if the flex located between $C_{1,1}$ and $C_{1,3}$ fails, and independently the flex between $C_{3,1}$ and $C_{3,3}$ fails, then the interconnect redundancy survives and no circuit will be cut off from the network. If however the flex located between $C_{1,1}$ and $C_{1,3}$ and $C_{1,1}$ and $C_{3,1}$ both fail adjacent to circuit $C_{1,1}$ and before junction link 295, then circuit $C_{1,1}$ will be cut off from the network. This result can be explained statistically.

As shown, the network comprises 1 four-connection PCB 304 and 4 two-connection PCBs 302. Together the topology comprises a system with total of 12 interconnections. Although the probability of any one of the flex interconnects failing is $p_{fi}$, the probability of a specific flex connection failing is less, i.e. with a probability of ($p_{fi}$/11) because there is only one chance in eleven that the failure will occur in a specific location. The probability is one-of-eleven, not one-in-twelve because the first failure already removed one flex connection from the circuit. In summary, the first flex failure can occur anywhere in the matrix so its failure probability is $p_{fi}$. To disable the system, the second failure must sever the connection to the same PCB, meaning not just any flex, but a specific flex must fail to cause a system failure. The combined probability of failure is the multiplication of the two independent probabilities, namely $$p_{fs} = p_{fi} \cdot p_{fi}/11 = [(p_{fi})^2/11]$$

The same concept can be scaled to an example with a large number of circuits but with the lowest reliability connections still exhibiting a RF=1. For example, in the topology shown in FIG. 26B has 17 connections. The failure rate for the RF=1 components is given by $$p_{fs} = p_{fi} \cdot p_{fi}/16 = [(p_{fi})^2/16]$$

For circuits with RF=2 in the same topology one general failure and two specific failure must occur to result in a system failure on an RF=2 circuit. The failure rate for an RF=2 component is the multiplicative combination of the first failure probability pr, the second failure probability $p_{fi}/(17-1)$, and the third failure probability $p_{fi}/(17-2)$. Notice damaging a specific location for the third failure is more probable than the second failure because there are only (17−2)=15 flex circuits remaining after the second failure. The combined probability of failure is given by $$p_{fs} = p_{fi} \cdot p_{fi}/16 \cdot (p_{fi}/15) = [(p_{fi})^3/240]$$

Extending the concept to overcome an RF=3 requiring four related failures results in a probability of failure of $$p_{fs} = p_{fi} \cdot (p_{fi}/16) \cdot (p_{fi}/15) \cdot (p_{fi}/14) = [(p_{fi})^2/3{,}360]$$

Figure 30A:
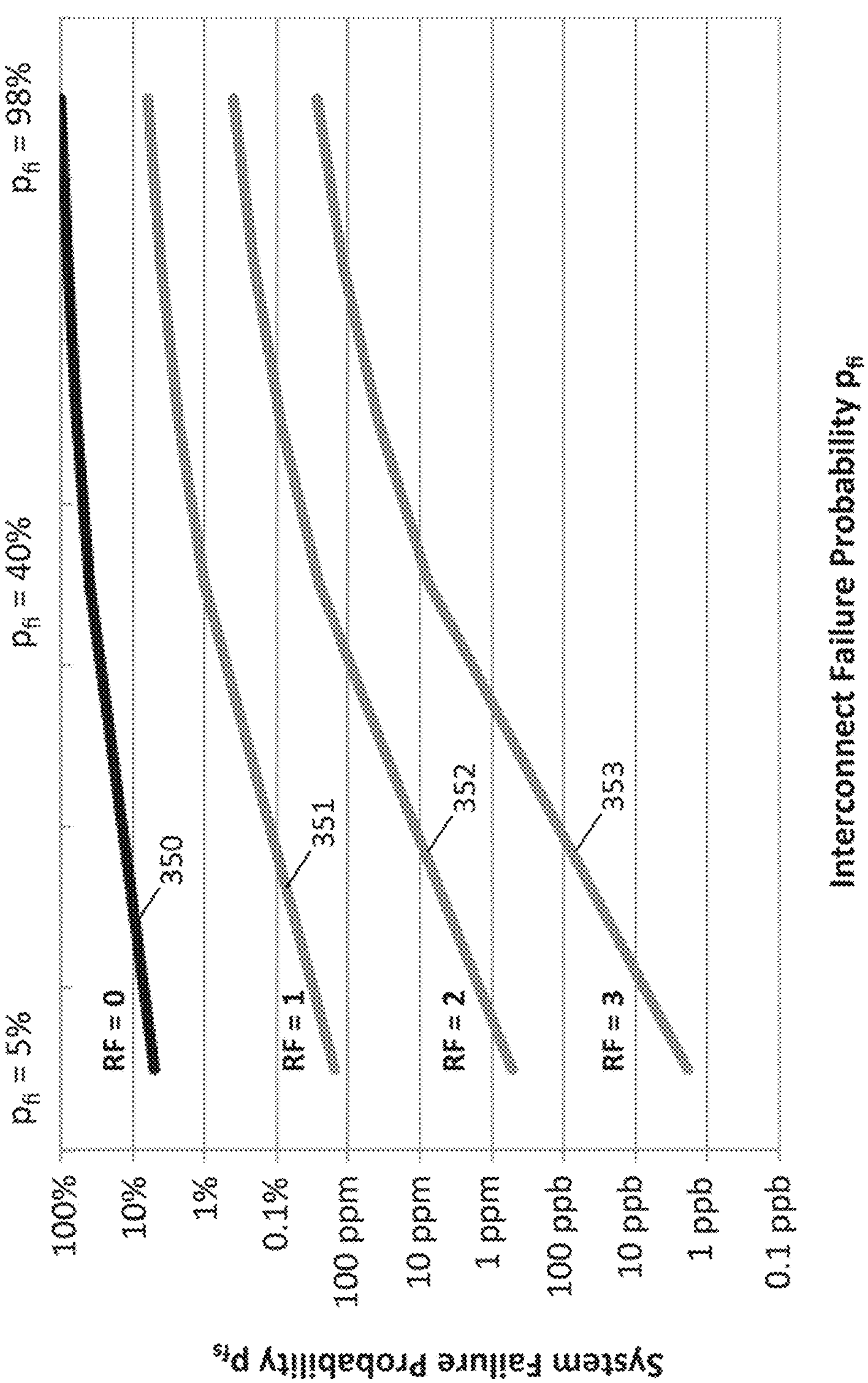
FIG. 30A is a graph illustrating system failure probability as a function of interconnect failure probability and redundancy factor for a redundant system of 12 circuits and 17 flex connections.

For the described system with a topology comprising 12-circuits and 17-flex connections, the probability of system failure as a function of various flex failure rates $p_{fi}$ is described in the following table. The term ppm refers to parts-per-million and ppb refers to parts-per billion. The probability of an electrical system failure $p_{fs}$, as a function of the mechanical failure rate $p_{fi}$ for the described network is illustrated in FIG. 30A for redundancy factors RF=0, RF=1, RF=2 and RF=3 by the curves 350, 251, 352, and 353 respectively. Note that while there are no circuits with RF=0, the failure rate for RF=0 is the same as would result if the circuits were interconnected serially, e.g. in a serpentine interconnection pattern. In a serpentine pattern, even though the circuits are still arranged in a grid pattern, every circuit only has only two connections so any failed interconnect breaks the entire system.

| | # of circuits | | | |
|---|---|---|---|---|
| $p_{fi}$ | 0<br>RF = 0 | 4<br>RF = 1 | 6<br>RF = 2 | 2<br>RF = 3 |
| 5% | 5% | 0.02% | 0.52 ppm | 1.9 ppb |
| 10% | 10% | 0.06% | 4.2 ppm | 30 ppb |
| 20% | 20% | 0.25% | 33 ppm | 480 ppb |
| 40% | 40% | 1.00% | 270 ppm | 7.6 ppm |
| 60% | 60% | 2.25% | 900 ppm | 39 ppm |
| 80% | 80% | 4.00% | 0.21% | 120 ppm |
| 98% | 98% | 6.00% | 0.39% | 270 ppm |

To compare the electrical failure rate of the redundant system to the mechanical failure rate of the flex, the ratio of the mechanical failure rate to the electrical failure rate may be employed as described in the table below.

| Mechanical | RF = 0 | RF = 1 | RF = 2 | RF = 3 |
|---|---|---|---|---|
| 5% | 1X | 320X | 96,000X | 26,880,000X |
| 10% | 1X | 160X | 24,000X | 3,360,000X |
| 20% | 1X | 80X | 6,000X | 420,000X |
| 40% | 1X | 40X | 1,500X | 52,500X |
| 60% | 1X | 27X | 667X | 15,556X |
| 80% | 1X | 20X | 375X | 6,563X |
| 98% | 1X | 16X | 250X | 3,570X |

The above table indicates that even with a mechanical failure rate of 60% of the flex circuits the statistical chance of a RF=1 redundant topology failing is $1/27^{th}$ that of the 60% failure rate without redundancy. The electrical failure rate is 1/667 that of the mechanical failure rate with RF=2 and $1/115{,}556^{th}$ of normal for systems with a redundancy of RF=3.

While the benefits of redundancy are general, the exact statistics vary depending on the number of circuit elements and interconnections. For example, in the topology shown in FIG. 27A has 20 circuits and 31 flex connections. The failure rate for the RF=1 circuit components is given by $$p_{fs} = p_{fi} \cdot p_{fi}/30 = [(p_{fi})^2/30]$$

In a RF=2 topology, one general failure and two specific failure must occur to result in a system failure on an RF=2 circuit. The failure rate for an RF=2 component is the multiplicative combination of the first failure probability pi, the second failure probability $p_{fi}/(31-1)$, and the third failure probability $p_{fi}/(31-2)$. Notice a specifically damaging location for the third failure is slightly more probable than the second failure because there are only (31−2)=29 flex circuits remaining after the second failure. The combined probability of failure is given by $$p_{fs}=p_{fi}\cdot(p_{fi}/30)\cdot(p_{fi}/29)=[(p_{fi})^3/870]$$

Extending the concept to overcome an RF=3 requiring four related failures results in a probability of failure of $$p_{fs}=p_{fi}\cdot(p_{fi}/30)\cdot(p_{fi}/29)\cdot(p_{fi}/28)=[(p_{fi})^4/24,360].$$

For the described system with a topology comprising 20-circuits and 31-flex connections, with 4 circuits of RF=1, 10 circuits with RF=2, and 6 circuits with RF=6, the probability of system failure as a function of various flex failure rates pt is as follows:

| | # of circuits | | | |
|---|---|---|---|---|
| | 0 | 4 | 10 | 6 |
| $P_{fi}$ | RF = 0 | RF = 1 | RF = 2 | RF = 3 |
| 5% | 5% | 0.01% | 0.14 ppm | 0.26 ppb |
| 10% | 10% | 0.03% | 1.1 ppm | 4.1 ppb |
| 20% | 20% | 0.13% | 9.2 ppm | 66 ppb |
| 40% | 40% | 0.53% | 74 ppm | 1.1 ppm |
| 60% | 60% | 1.20% | 250 ppm | 5.3 ppm |
| 80% | 80% | 2.13% | 590 ppm | 17 ppm |
| 98% | 98% | 3.20% | 0.108% | 380 ppm |

Figure 30B:
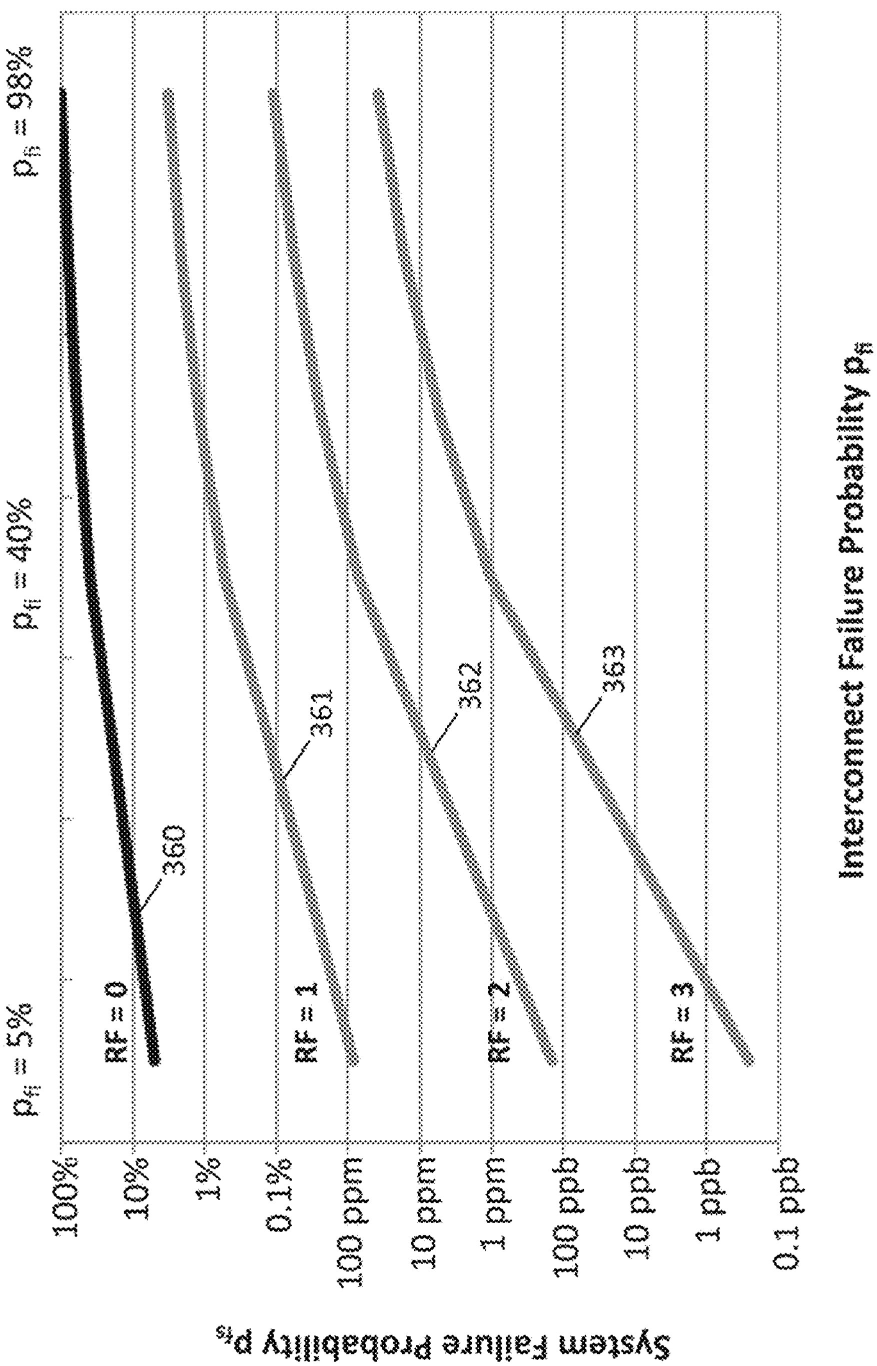
FIG. 30B is a graph illustrating system failure probability as a function of interconnect failure probability and redundancy factor for a redundant system of 20 circuits and 31 flex connections.

The probability of an electrical system failure $p_{fs}$ as a function of the mechanical failure rate $p_{fi}$ for the described network is illustrated in FIG. 30B for redundancy factors RF=0, RF=1, RF=2 and RF=3 by the curves 350, 251, 352, and 353 respectively. Note that while there are no circuits with RF=0, the failure rate for RF=0 is the same as would result if the circuits were interconnected serially, e.g. in a serpentine interconnection pattern. To compare the electrical failure rate of the redundant system to the mechanical failure rate of the flex, the ratio of the mechanical failure rate to the electrical failure rate may be employed as described in the table below.

| Mechanical | RF = 0 | RF = 1 | RF = 2 | RF = 3 |
|---|---|---|---|---|
| 5% | 1X | 600X | 348,000X | 194,880,000X |
| 10% | 1X | 300X | 87,000X | 24,360,000X |
| 20% | 1X | 150X | 21,750X | 3,045,000X |
| 40% | 1X | 75X | 5,438X | 380,625X |
| 60% | 1X | 50X | 2,417X | 112,778X |
| 80% | 1X | 38X | 1,359X | 47,578X |
| 98% | 1X | 31X | 906X | 25,882X |

The above table indicates that even with a mechanical failure rate of 60% of the flex circuits, the statistical chance of a RF=1 redundant topology failing is $1/50^{th}$ that of the 60% failure rate without redundancy. The electrical failure rate is 1/2,417 that of the mechanical failure rate with RF=2 and 1/112,778th of normal for systems with a redundancy of RF=3. This failure rate is even lower than the prior example. In general, using redundancy, the larger the number of redundant circuits and interconnects—the higher the system redundancy and the lower the system's electrical failure rate.

Figure 31:
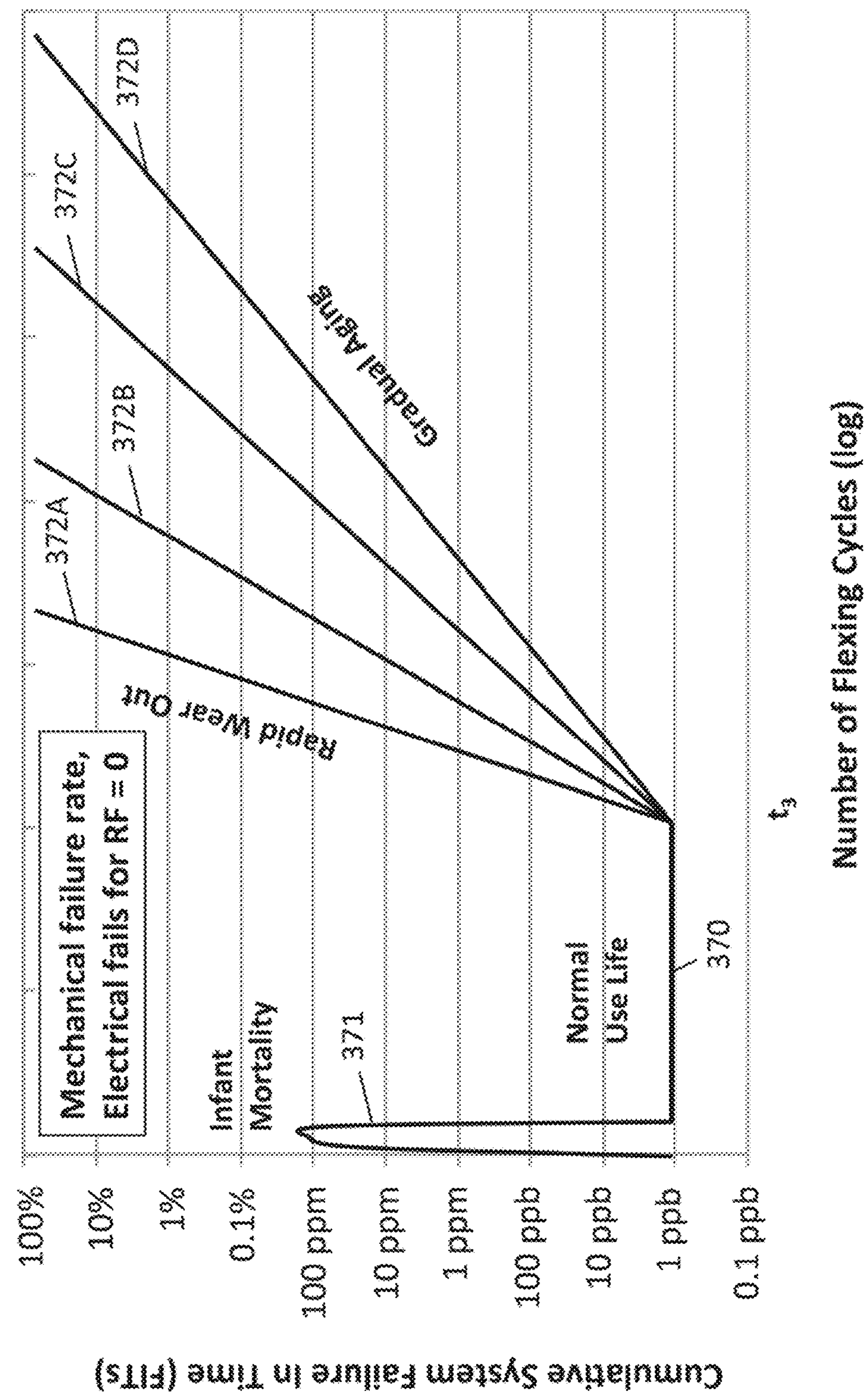
FIG. 31 is a graph comparing cumulative failures in time (FITs) versus mechanical flexing cycles for non-redundant electrical systems with differing old-age failure profiles.

Understanding how the statistical failure rate of the system affect the use life depends on the shape of the cumulative-failure wear-out curve. As shown in FIG. 31, an electrical system with no electrical redundancy, i.e. RF=0, exhibits mechanically induced wear-out failures as a function of time. Measured by the cumulative FITs, or "failures-in-time", the normal life cycle of a system with mechanical movement, e.g. twisting, bending, rotating, generally comprises three regions (i) infant mortality phase 371, (ii) normal use life (iii) wear-out (old age) phase. In the infant mortality phase 371, a fraction of the population will fail early because of manufacturing related defects. These birth defects can be culled from the manufactured population using electrical tests, rapid mechanical tests, and burn-in tests to accelerate the failures, identify the defective systems and remove them from the products to be sold.

In the normal use life phase 370 up until a certain number of flexing cycles corresponding to time $t_3$, failures occur at a very low but non-zero rate of one cumulative failure per billion interconnects. This latent failure rate is due to unavoidable defects in manufacturing affecting the entire product. Failure rates in the part-per-billion or even parts-per-million are generally acceptable for such normal use failures, especially for products not involved in life support or safety systems.

After the wear out failures commence, the rate of the failures depends on the manufacturing of the product. Cumulative failures generally occur exponentially, resulting on a straight line on log or semilog paper. In failure curve 372A, the failures occur rapidly once they start, representing a "rapid wear out" mechanism such as plastic becoming brittle. Slower failure rates represented by lines 372B, 372C and 372D of diminishing slope describe failures that occur more gradually, e.g. gradual corrosion of conductors, delamination of conductors, solder lifting etc.

Figure 32:
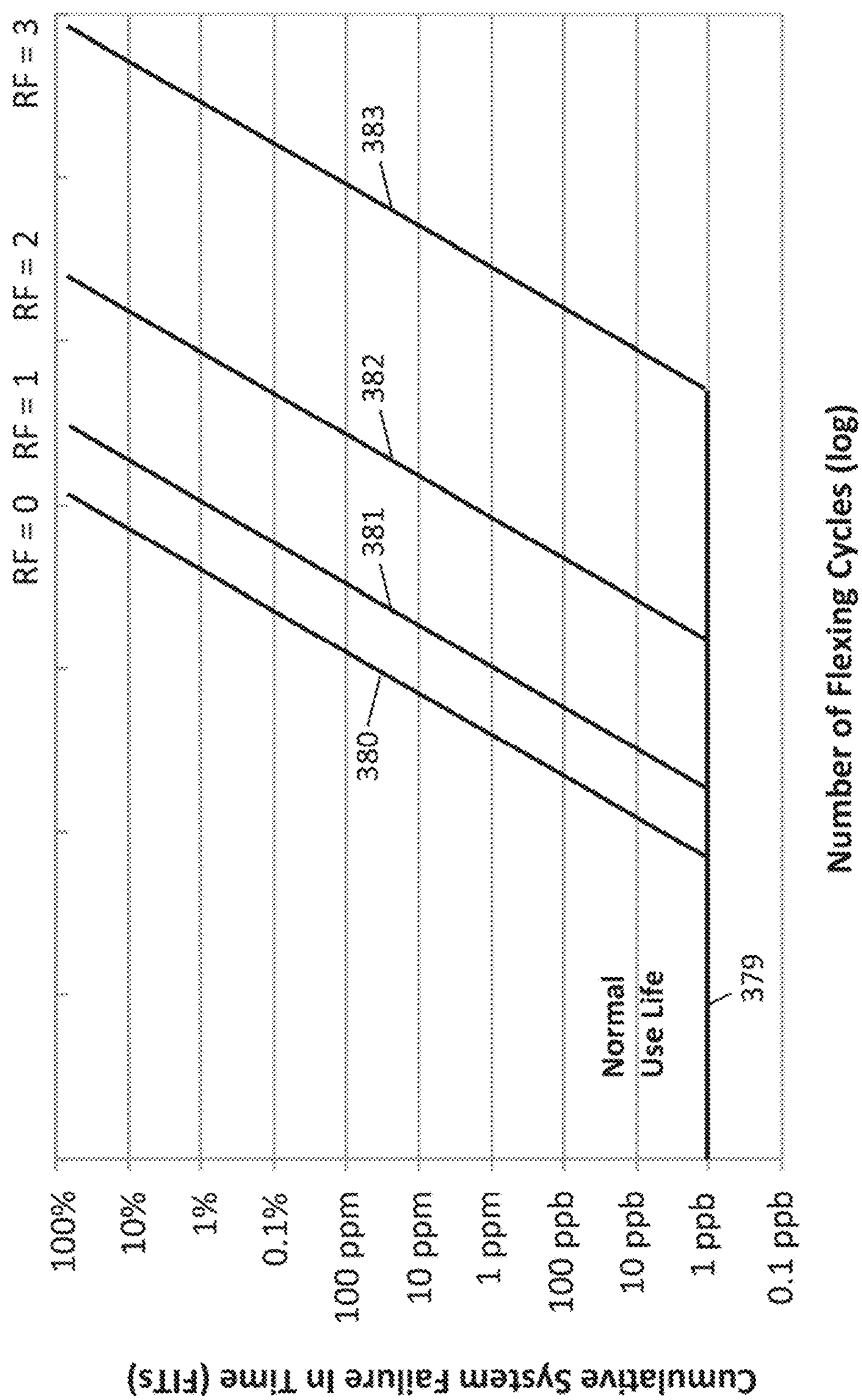
FIG. 32 is a graph comparing cumulative failures in time (FITs) versus mechanical flexing cycles for circuits having differing redundancy factor (RF) ratings.

The benefit of redundancy on operating life is illustrated in the logarithmic graph of FIG. 32 where after a number of flexing cycles associated with normal use life 379 the cumulative system failures without electrical redundancy, i.e. where RF=0, is shown in curve 380, appearing as a straight line because the graph is logarithmic. Curve 381 illustrates the improvement in operating life resulting from a new design with redundancy RF=1. Even greater improvement is manifest by greater redundancy. As shown, curve 382 illustrates the improvement in operating life resulting in an RF=2 design, and curve 383 showing a dramatic increase for RF=3. This supports the previous point made in the comparison tables that with each additional level of redundancy factor "RF" the failure rate drops disproportionately, e.g. increasing from the IX (mechanical rate) at RF=0 to 50× with RF=1, then improving to 2,417× with RF=2 and finally to 112,778× with RF=3. The failure rates not only drops with increasing degrees of redundancy, but drops faster with each increment in RF, i.e. the rate of the failure rate also improves.

For example, life testing of non-redundant PCBs show the onset of failures after a few thousand cycles, but using the disclosed redundant PCB design methodology with RF=1 failures have been confirmed only after 30,000 or 50,000 cycles, depending on the particular design.

Hierarchical Redundancy

The partitioning of an electronic system into component circuits determines the overall reliability of a system. In accordance with this invention, the required redundancy needed for dividing a system into pieces, i.e. "partitioning" the system, and then implementing each specific function on a particular rigid PCB in a PCB matrix depends on how important the function is and what it does. Accordingly a system can be divided into multiple hierarchical levels of importance ranging from critical to ancillary circuit functions. In practical terms, a system's circuit functions can be broken into a finite manageable number of levels of importance, e.g. four levels as shown in FIG. 33. The definitions of these levels may be considered by the magnitude of system impairment that results should the particular function fail, exemplified by the following levels of importance (in the column denoted symbolically by "!!!"):

Critical Level: a "critical" level circuit function is one whose failure will adversely affect most or every circuit's operation in a system, may completely disable a system, or potentially results in a safety hazard. Loss of power is an example of a critical level circuit function.

Important Level: an "important" level circuit function is one whose failure will adversely impact key global functional features of a system, e.g. its ability to communicate with other systems, detect important pieces of information, or to perform important tasks or operations.

Basic Level: a "basic" level circuit function is one whose failure will adversely affect a portion or portions of the system but leave other portions of a system operating unimpaired, e.g. causing some the sensors or LEDs in some limited portions of the circuit to malfunction but not disabling the entire system.

Ancillary Level: a "ancillary" level circuit function is one whose failure will make operation of the system less convenient, e.g. malfunction of an indicator light, or render the system more difficult to recall historical or tracking data, but where the actual operation of the system's functions is not impaired either globally or locally.

Examples of critical level circuit functions include primary external connectors used to connect outside power or control to the distributed electronic system including protection against electrostatic discharge (ESD), overvoltage, overcurrent, over-temperature or performing other safety functions. Other critical level functions include any primary power source such as battery and its associated battery charger, as well as linear and switching voltage regulators. Other critical functions include logic, digital signal processors (DSPs), analog signal processors (ASPs), clock circuitry, data converters including D/A and A/D converters, microcontrollers and their associated firmware or operating systems such as BIOS (basic input/output system) stored on non-volatile memory (NVM) such as flash or EEPROM. Other critical circuitry includes analog circuits such as oscillators, amplifiers, filters, comparators; digital circuitry such as logic gates, flip-flops, counters, digital phase-locked-loops (PLLs); RF communication circuits such as radio, WiFi, Bluetooth, 3G, 4G; and interface circuitry such as USB.

Examples of important level circuit functions include unique or single instance circuitry such as sensors, driver, LEDs, emitters, read-write data and scratch pad memory, secondary external connectors, and antenna for RF links. Examples of basic level circuit functions including sensor arrays, driver arrays, LED arrays, point-of-load (POL) voltage regulators, local functions, storage capacitors, and interconnect links. Examples of ancillary level circuit functions include supplemental sensors, monitors, use-tracking functions, indicator lamps, convenience features, and tertiary connectors used only for convenience of connections.

The design methodology for adapting an electronic application into a distributed system with hierarchical redundancy depends on the product's application. For consumer applications like a wearable biometric health monitor, a minimal degree of redundancy can be employed, primarily to reduce the costs of product returns. By avoiding field failures through hierarchical redundant design, a manufacturer is able to avoid warranty expense and maintain a better reputation as a quality consumer device manufacturer. Such designs therefore can employ minimal redundancy as shown by the column labeled "minimal" in the table of FIG. 33. In such a design, critical circuit functions employ redundancy RF≥2 while important circuit functions utilize redundancy of RF≥1. Basic and ancillary circuit functions have no redundancy, i.e. RF=0.

In medical or military "high rel" applications, reliability is crucial and potentially life critical, so superior reliability is warranted. The recommended design methodology for "superior" reliability systems as shown utilize the highest reliability for critical circuit functions, ideally RF≥7 and in the least RF=5, while important functions employ RF 4, basic functions use RF≥3, and ancillary circuit functions utilize RF≥2.

In between consumer and high rel applications, good reliability design methodologies employ a philosophy of compromise with design redundancy RF≥3 for critical circuit functions, RF≥2 for important circuit functions, RF≥1 for important circuit functions, and RF=1 for ancillary circuit functions. Such good design methodologies are applicable to professional or professional-consumer, i.e. "prosumer" device like LED LightPads used in spas for humans, veterinarian clinics for small animals, portable devices for treating horses and camels in stables, and other portable applications, e.g. for accident scene treatments or monitoring performed by paramedics.

Examples of a variety of circuit functions and their corresponding hierarchical redundancy are illustrated in the following schematics representing each category of circuit function comprising critical, important, basic, and ancillary circuit functions.

Critical Circuit Functions

Figure 34A:
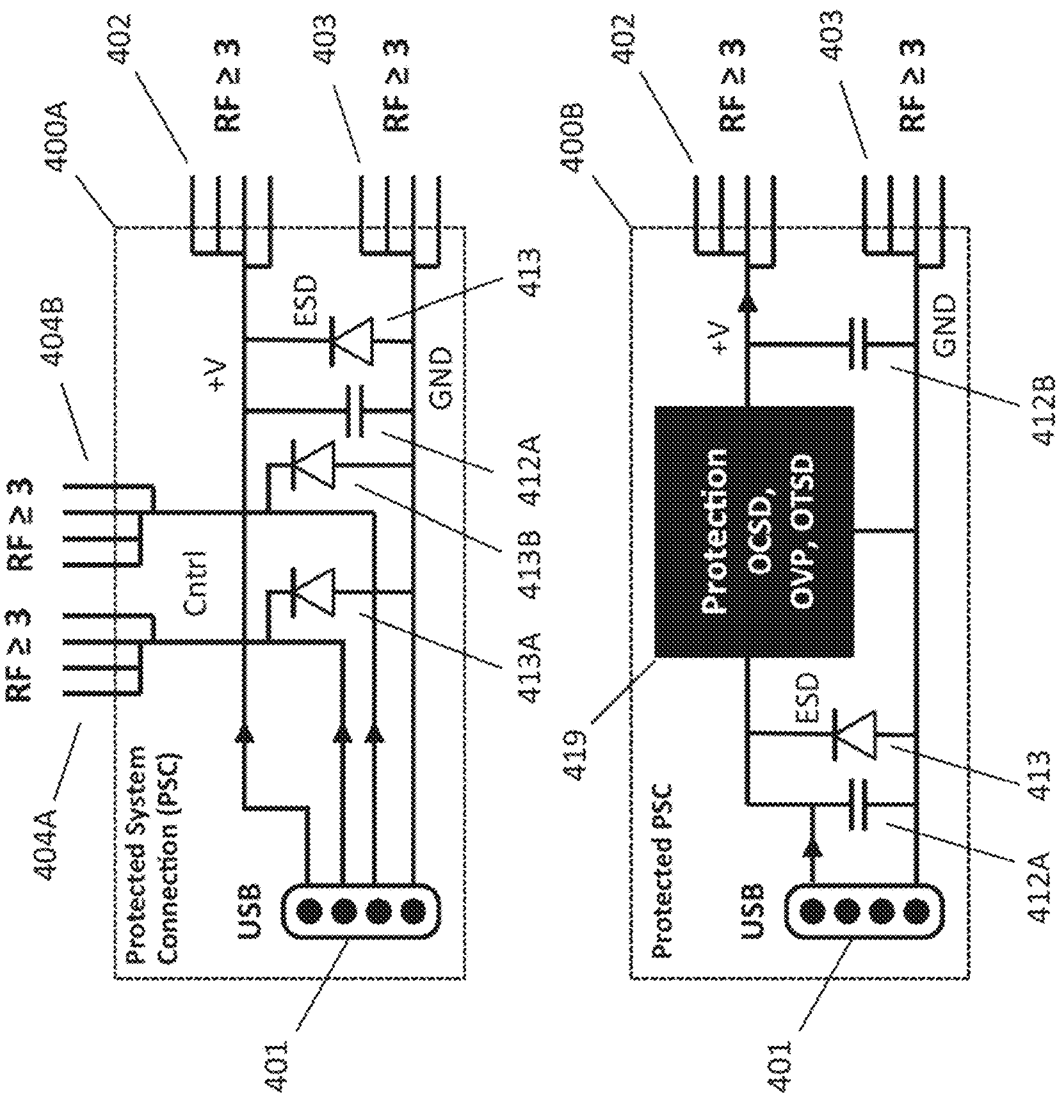
FIG. 34A comprises schematic examples of circuits of protected circuit connections.

Circuit function 404A in FIG. 34A comprises a basic connector 401, shown by example as a four-pin USB connector, with RF≥3 flex connectors for redundant interconnection to ground 403, +V (power) 402, and signals 404A and 404B. The addition of filter capacitor 412A and ESD protection diode 413 between +V and ground, along with ESD protection diodes 413A and 413B on signal lines 404A and 404B respectively, facilitate converting connector 401 into a protected system connection, i.e. PSC. The circuit can be modified into protected PSC 400B by including protection 419 which may comprise overcurrent shutdown circuitry (OCSD), a circuit that protects the system against short circuits and high currents; comprise over-temperature shutdown circuitry (OTSD), a circuit that protects the system against overheating; and overvoltage protection (OVP), a circuit that shuts off power to the system should an excessive voltage be input into connector 401.

Figure 34B:
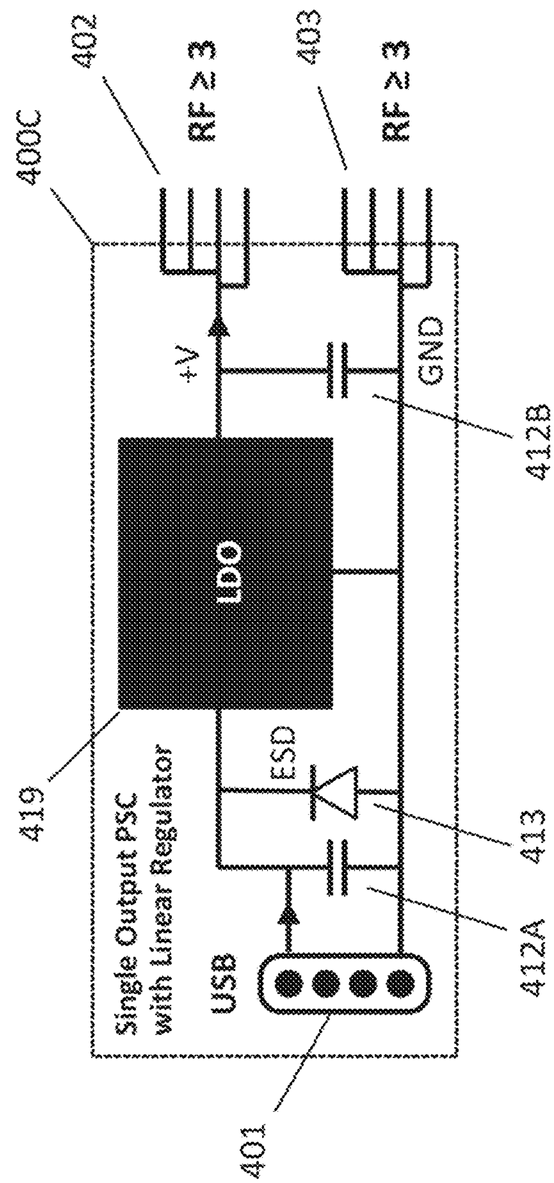
FIG. 34B is a schematic example of a protected circuit connection with linear voltage regulation.

Circuit 400C in FIG. 34B illustrates a single output PSC with a linear voltage regulated output. While their use in redundant distributed systems as disclosed herein is new, the basic operation of a low dropout (LOD) linear regulator is well known, and is described in numerous textbooks and online (https://en.wikipedia.org/wiki/Low-dropout_regulator). The power input of connector 401 combined with capacitor 412A and ESD protection diode 413 is connected to linear voltage regulator comprising LDO 419 with regulated output across capacitor 412B. The regulated voltage of LDO 419 is delivered to the system on multiple electrical paths comprising redundant output +V 402 and ground 403 filtered by output capacitor 412B. Since linear regulation can only output a lower voltage than its input, the output voltage +V of LDO 419 is necessarily lower than its input voltage. For example a 5V input may produce a 3.3V, 3V, 2.7V or 1.8V output voltage. As a critical circuit component, the interconnections utilize a redundancy factor RF≥3.

Figure 34C:
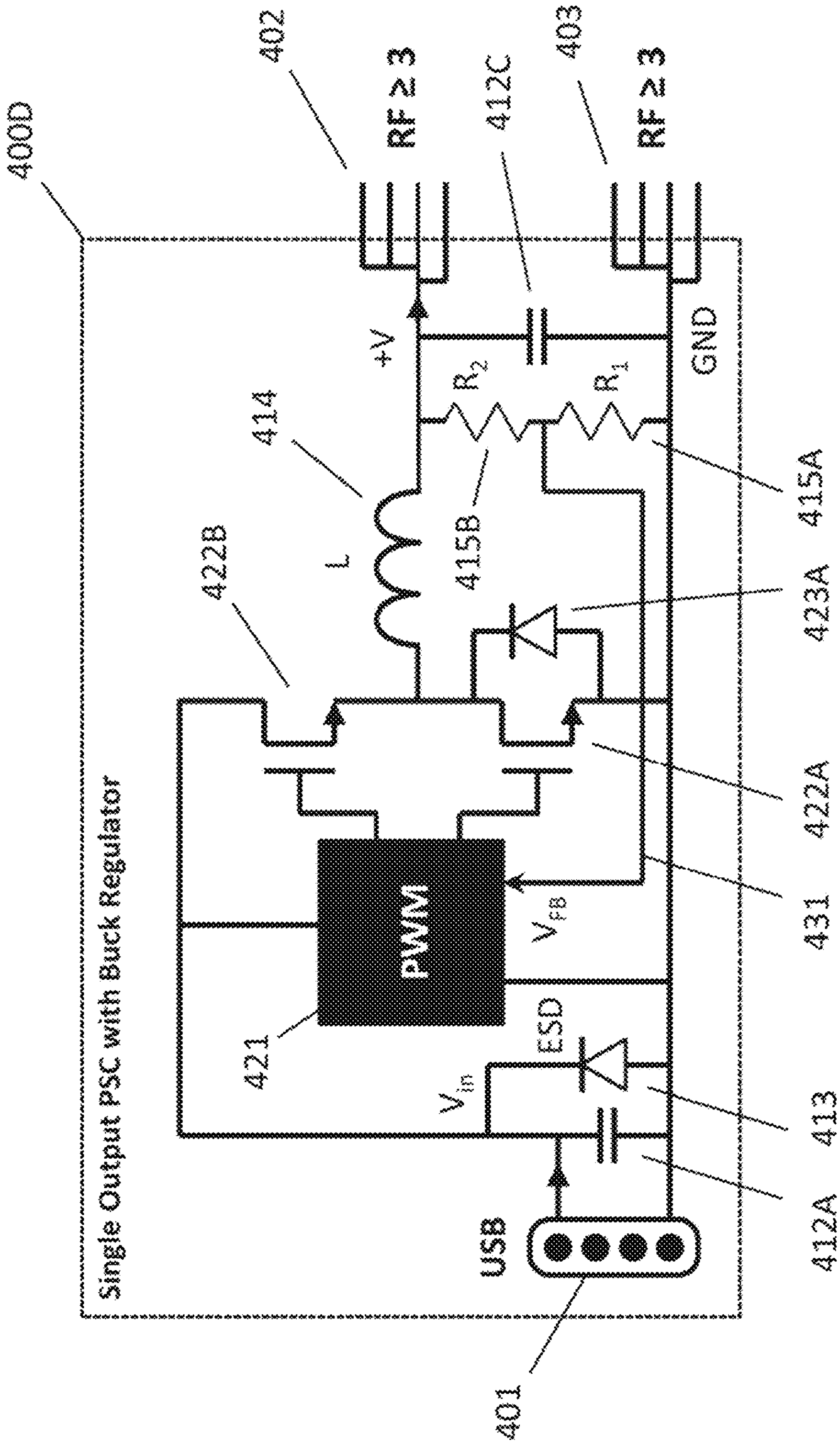
FIG. 34C is a schematic example of a protected circuit connection with step-down switching voltage regulation.

FIG. 34C illustrates circuit 400D comprising a single output PSC with synchronous Buck type switching voltage regulator. While their use in redundant distributed systems as disclosed herein is new, the basic operation of a synchronous Buck type switching regulator is well known, and is described in numerous textbooks and online (https://en.wikipedia.org/wiki/Buck_converter). The power input of connector 401 with capacitor 412A and ESD protection diode 413 is connected to step-down switching voltage regulator comprising a synchronous Buck converter topology with PWM controller 421, power MOSFET switch 422B, power MOSFET synchronous-rectifier 422A with an integral anti-parallel diode 423A, inductor 414 and output capacitor 412C. Resistor voltage divider comprising resistors 415B and 415A measure the output voltage and provide a feedback voltage $V_{FB}$ 431 used to dynamically modulate the PWM pulse width to adjust the output voltage +V to its target value. The regulated voltage of the Buck converter's low pass filter formed by inductor 414 and output capacitor 412C is supplied to the system on multiple redundant electrical paths comprising connections +V 402 and ground 403. Since a Buck switching regulator can only output a lower voltage than its input, the output voltage +V of the Buck converter is necessarily lower than its input voltage. For example a 5V input may produce a 1.8V, 1.2V, or 0.9V output voltage. As a critical circuit component, the interconnections utilize a redundancy of RF≥3.

Figure 34D:
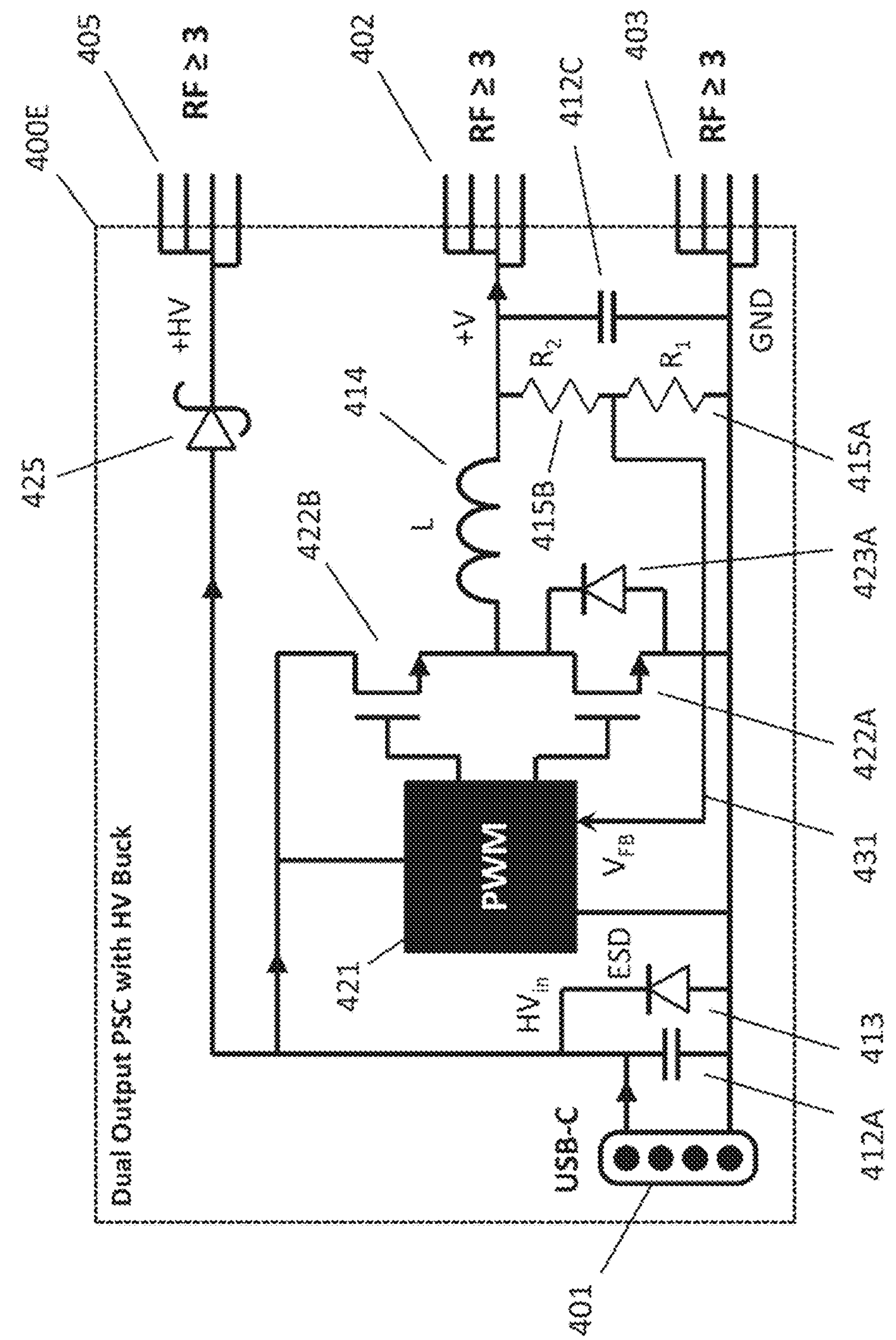
FIG. 34D is a schematic example of a high-voltage protected circuit connection with step-down switching voltage regulation.

FIG. 34D illustrates a high-voltage-input dual-output PSC circuit 400E with both high-voltage and step-down Buck regulator outputs. The high-voltage power input of connector 401 with capacitor 412A and ESD protection diode 413 is connected to output 405 through Schottky diode 425 and to step-down switching voltage regulator circuit. The high voltage output +HV may be used to power various electrical loads, e.g. strings of LEDs. The switching regulator needed to power low voltage circuitry utilizes a synchronous Buck converter topology comprising PWM controller 421, power MOSFET switch 422B, power MOSFET synchronous rectifier 422A with an integral anti-parallel diode 423A, inductor 414 and output capacitor 412C. Resistor voltage divider comprising resistors 415B and 415A measure the output voltage +V and provide a feedback voltage $V_{FB}$ 431 used to dynamically adjust the PWM pulse width to adjust the output voltage +V to its target value. The regulated output voltage of the Buck converter's low pass filter formed by inductor 414 and output capacitor 412C is supplied to the system through multiple electrical paths comprising redundant interconnections +V 402 and ground 403. Since a Buck switching regulator can only output a lower voltage than its input, the output voltage +V of the Buck converter is necessarily lower than its input voltage. For example a 40.5V input may produce a 5V, 3.3V, 3V, 2.7V, or 1.8V output voltage on output 402 and a 40V output voltage on output 405. As a critical circuit component, the interconnections utilize a redundancy factor of RF≥3.

Figure 34E:
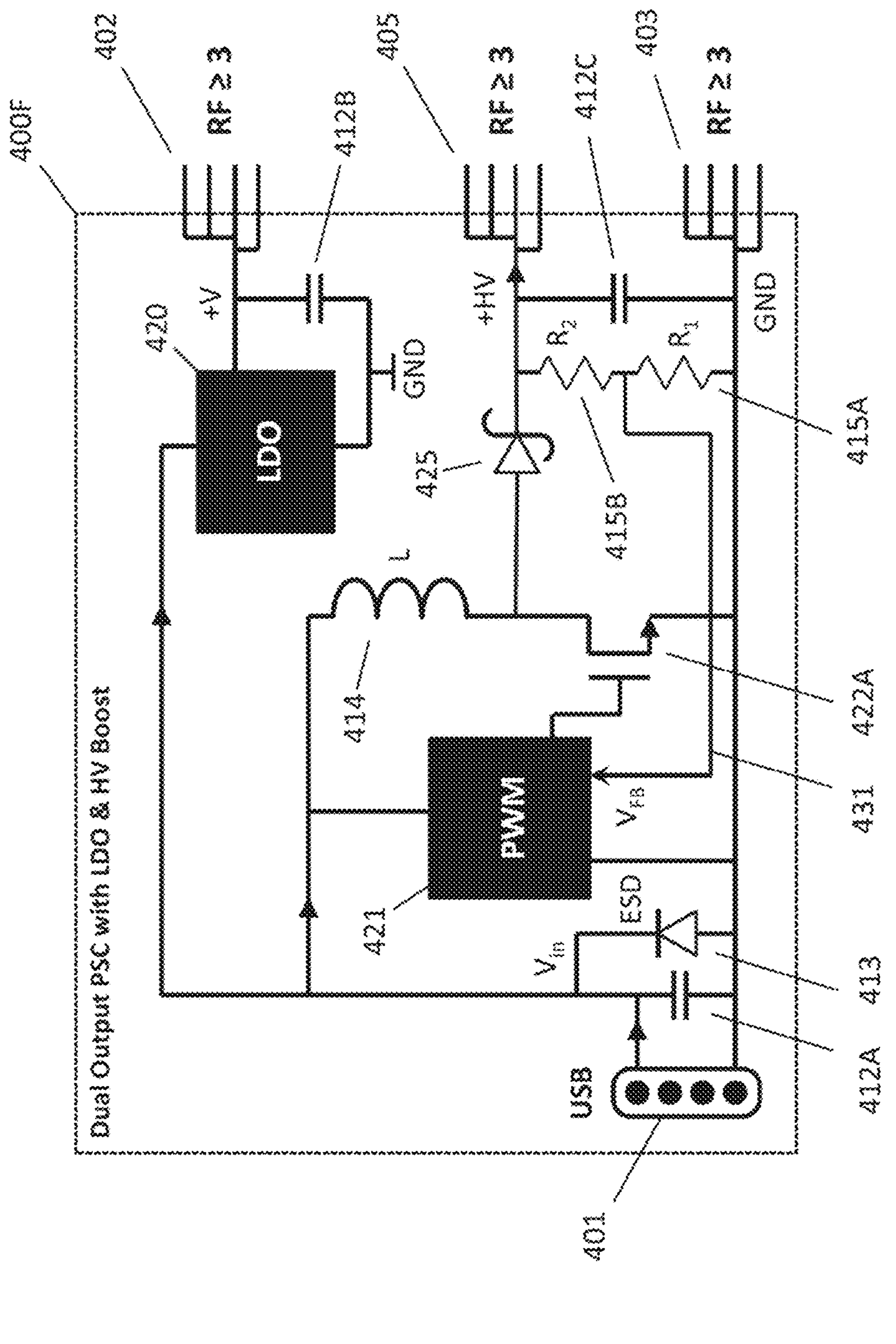
FIG. 34E is a schematic example of a protected circuit connection with high-voltage boost switching voltage regulation and linear voltage regulation.

FIG. 34E illustrates a dual-output PSC circuit 400F with both high-voltage step-up boost regulator and low-voltage linear voltage regulators. While their use in redundant distributed systems as disclosed herein is new, the basic operation of a boost switching regulator is well known, and is described in numerous textbooks and online (https://en.wikipedia.org/wiki/Boost_converter). The power input of connector 401, a low voltage input filtered by capacitor 412A and protected by ESD protection diode 413, is connected to LDO 420 and to a step-up switching voltage regulator. While other topologies may also be used, the step-up switching regulator as shown comprises a boost converter topology with PWM controller 421, power MOSFET switch 422A, Schottky diode 425, inductor 414 and output capacitor 412C. Resistor voltage divider comprising resistors 415B and 415A measures the output voltage +HV and provide a feedback voltage Vin 431 used to dynamically modulate the PWM pulse width constantly adjusting output voltage +HV to maintain its target value. The regulated voltage of the boost converter's low pass filter formed by inductor 414 and output capacitor 412C is output on multiple electrical paths comprising redundant interconnection +HV 405 and ground 403. Since a boost type switching-regulator can only output a higher voltage than its input, the output voltage +HV of the boost converter is necessarily higher than its input voltage. For example, a 5V input may produce a 40V output voltage on output 402. In contrast the regulated output voltage +V of LDO 420 present across capacitor 412B and output through redundant interconnections +V 405 and ground 403 necessarily must be lower than its input voltage. For example a 5V input may produce a 1.8V, 1.2V, or 0.9V output voltage. As a critical circuit component, the interconnections utilize a redundancy factor of RF≥3.

Figure 34F:
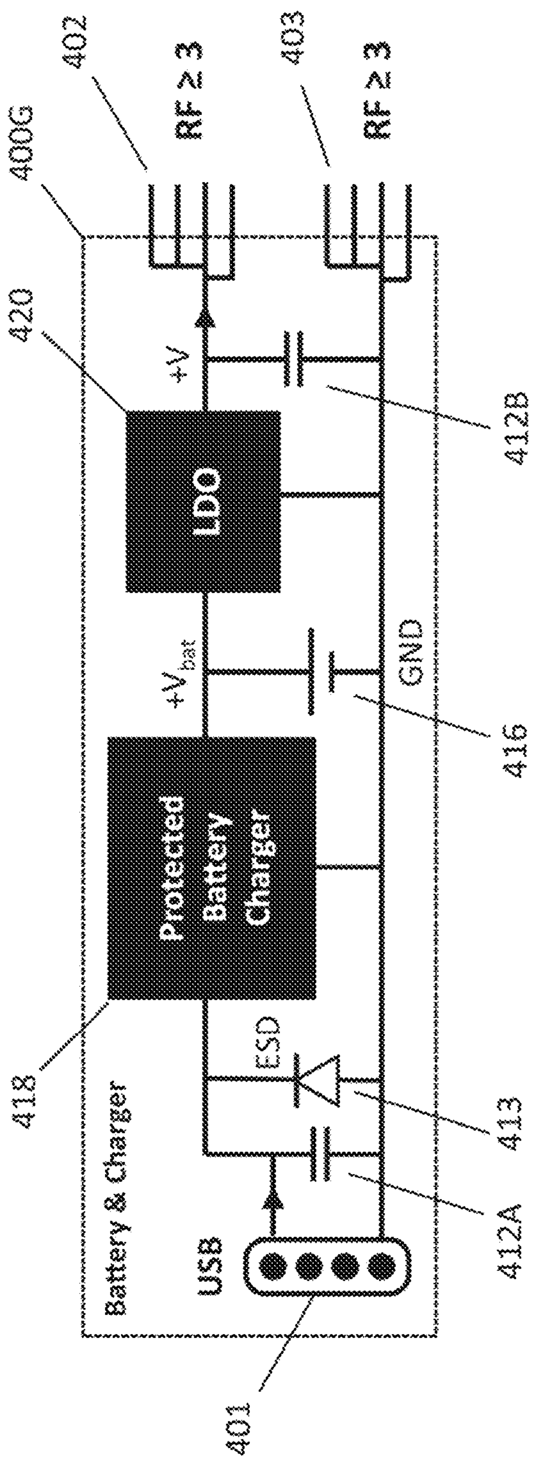
FIG. 34F is a schematic example of a battery and battery charger circuit.

FIG. 34F illustrates battery and battery charger circuit 400G comprising battery 416 and linear voltage regulator LDO 420 delivering a regulated output voltage +V to filtered by capacitor 412B across redundant connections +V 402 and ground 403. Charging of the battery is performed by protected battery charger 418 which insures the battery 416 is charged properly in a manner specific to the chemistry of the battery, protecting from over-charging, over-discharging, over-voltages on its input from connector 401, from shorted load conditions, and from over-temperature conditions. For example if battery 416 is a lithium ion or lithium polymer battery, protected battery charger 418 must be a charger specifically matched to the proper charging conditions of lithium ion type battery chemistries and charging methods. In actual use power is supplied to the battery through connector 401 during charging. When not charging, battery 416 supplies power to the system making it good for portable and wearable applications, e.g. in sports or biometric monitoring. While their use in redundant distributed systems disclosed herein is new, the basic operation of a protected battery charger is well known, and is described in numerous textbooks, application notes, and online (https://en.wikipedia.org/wiki/Battery_charger) both for linear chargers and inductor based "switching" chargers. As shown input capacitor 412A and ESD protection diode 413 facilitate additional protection of the protected battery charger 418. As a critical circuit component, the interconnections utilize a redundancy factor of RF≥3.

The aforementioned circuits and protected system connections involve the main power supplied to the disclosed distributed systems, which by definition represent a critical component required for operation of any electronic system or device. Other critical level circuit functions involve digital control of the system, key analog and digital circuits performing control, signal processing, radio frequency (RF) such as 4G, WiFi, WiMax, Bluetooth communication and wireline or bus communication, e.g. USB, Ethernet, IEEE1394, HDMI and others.

Figure 35A:
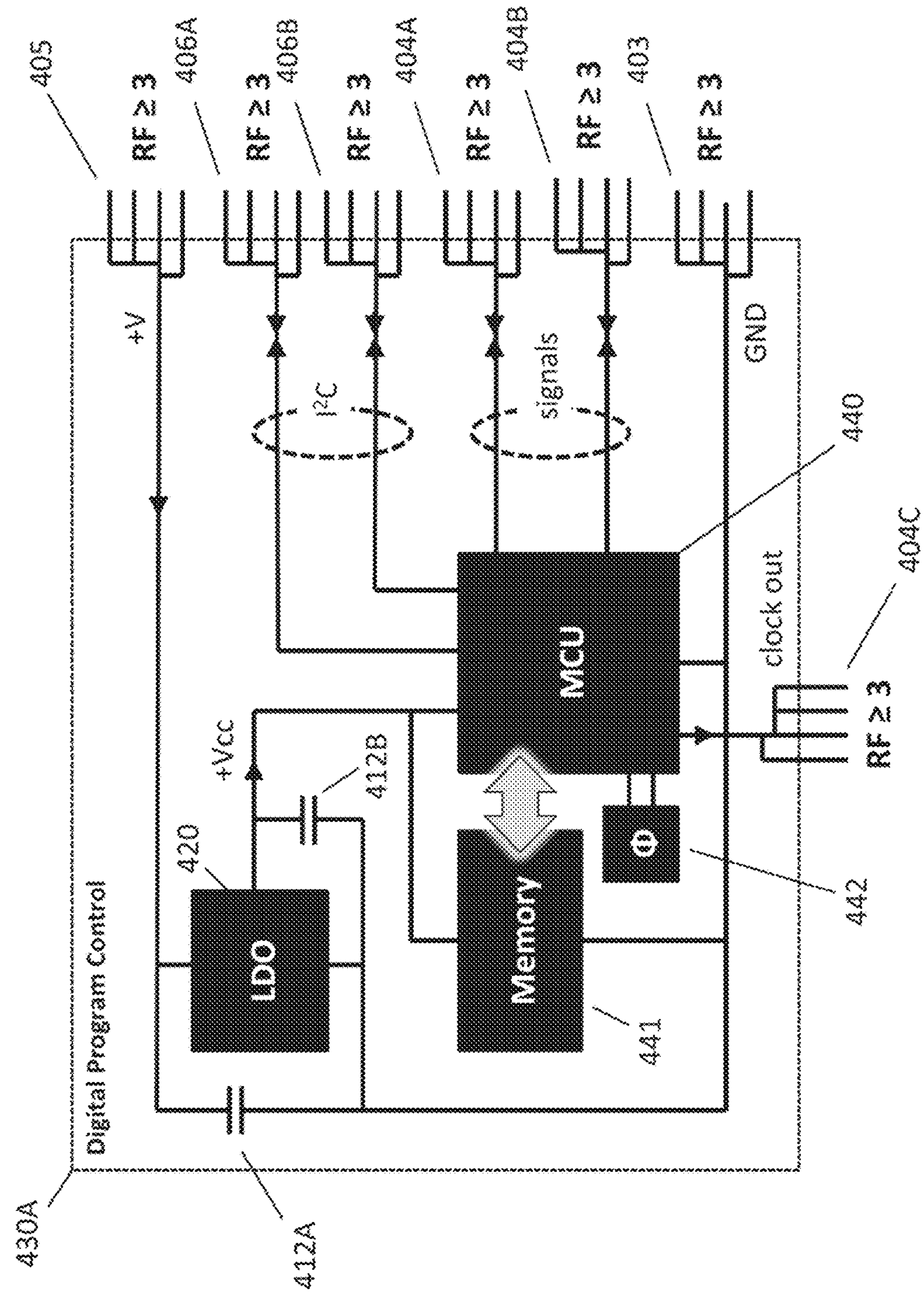
FIG. 35A is a schematic example of a digital program control circuit.

FIG. 35A illustrates one such critical control function, "digital program control" 430A whereby microcontroller unit MCU 440 executes software or firmware computer code stored in its on-chip memory or other stored in memory 441, typically comprising flash or EEPROM, and communicates with the rest of the system via digital bus 406A and 406B, e.g. using $I^2C$ communication, and through signal connections 404A and 404B. While two digital bus and two signal connections, the illustration is without limitation exemplary whereby the number of analog and digital signal and bus connections may be varied without changing the scope or meaning of the disclosed invention. Since MCU 440 utilizes "clocked" logic, a time source comprising a crystal, a MEMs time reference, or a R-C relaxation oscillator must be included as a clock signal 442 to advance a program sequentially through its various steps.

The central control firmware operating within MCU 440 may also distribute this same clock signal or more likely a lower frequency clock signal created by digitally dividing down the frequency of clock 442 using counters, to other circuits in the system. This shared clock signal, labeled "clock out", is delivered over redundant connections 404C to the circuits that need access to the clock data. Alternatively the clock out data may be delivered to every circuit component and ignored by those functions that don't require a time base for operation or synchronization. Digital program control 430A is powered by redundant connections +V 405 and ground 403. In the event that MCU or memory 441 operate on a lower voltage than +V, a dedicated LDO 420 with input and output filter capacitors 412A and 412B may be optionally included specifically to power the circuit locally, i.e. to operate as a point of load (POL) regulator. If not needed, LDO 420 can be eliminated. As a critical circuit component, the interconnections utilize a redundancy factor of RF≥3.

Figure 35B:
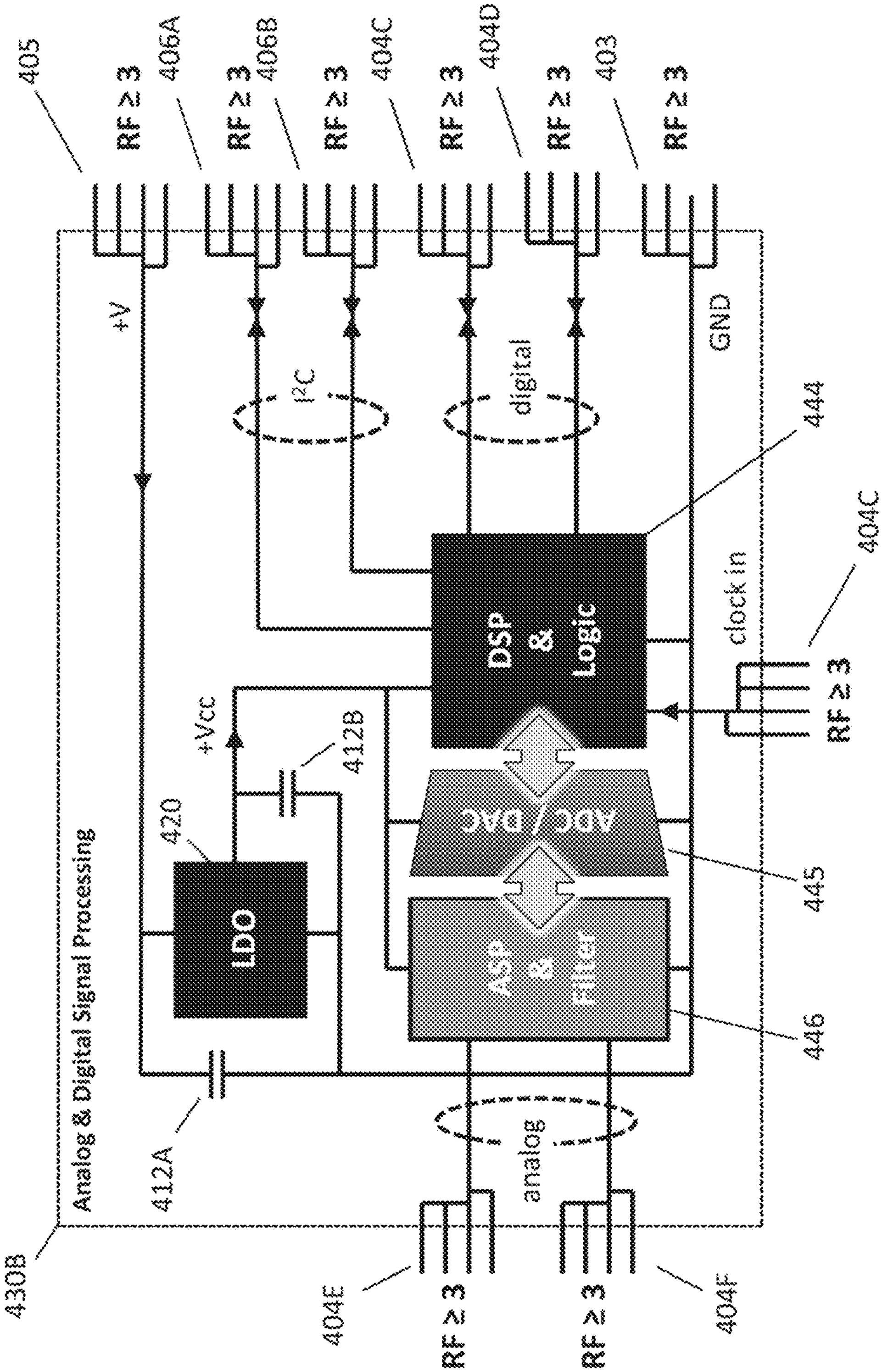
FIG. 35B is a schematic example of a analog and digital signal processing circuit.

Rather than utilizing a programmable software-based microcontroller, control of an electronic system may be performed by dedicated analog or digital circuitry as illustrated in FIG. 35B including analog signal processing circuitry ASP and filter 446, by programmable or hardwired logic and digital signal processing DSP circuit "signal processing" circuit 405, or by both. ADC/DAC circuit 445 performs analog-to-digital and digital-to-analog data conversion in unidirectionally or bidirectionally to facilitate communication and coordination between ASP and filter 446 and DSP and logic 444. As shown, ASP and filter 446 communicates to other circuits in the distributed system via multiple redundant analog signal lines 404E and 404F. Similarly DSP and logic 444 communicates to other circuits in the distributed system via multiple redundant digital signal lines 404C and 404D, and/or by digital bus communication lines 406B and 406C, using for example an $I^2C$ protocol. The digital circuitry may also utilize a synchronizing clock signal "clock in" connected to the circuit over a redundant digital connection 404C. Signal processing circuit function 430B is powered by redundant connections +V 405 and ground 403. In the event that the analog and digital circuitry operate on a lower voltage than +V, a dedicated LDO 420 with input and output filter capacitors 412A and 412B may be optionally included specifically to power the circuit locally, i.e. to operate as a point of load (POL) regulator. If not needed, LDO 420 can be eliminated. As a critical circuit component, the interconnections utilize a redundancy factor of RF≥3.

Figure 35C:
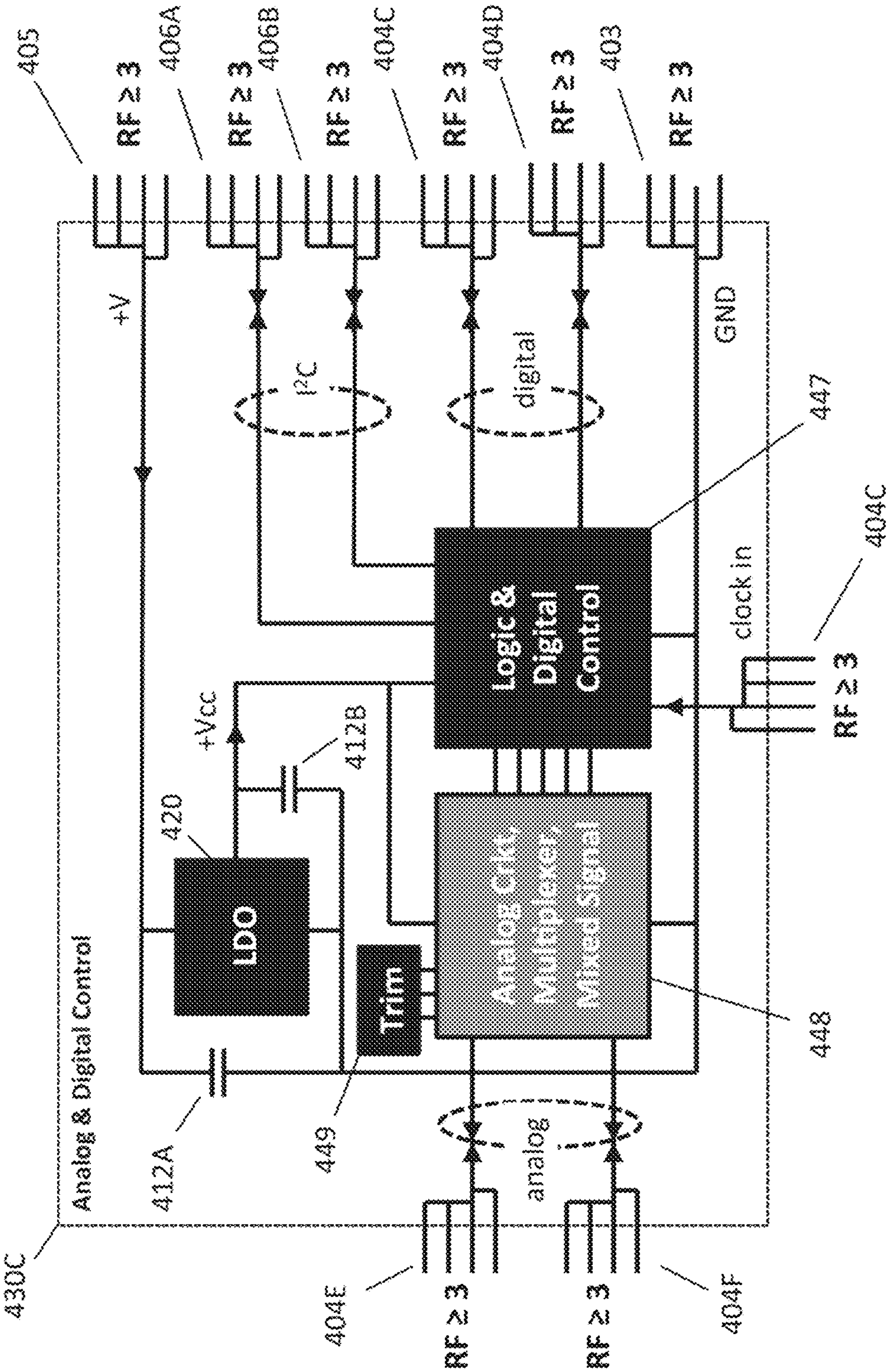
FIG. 35C is a schematic example of an analog and digital control circuit.

Rather than performing signal processing, in some potential applications of distributed electronic systems, analog and digital signal processing may be replaced by dedicated analog, digital or mixed signal ICs such as shown in FIG. 35C, including analog IC 448 integrating functions comprising analog circuitry, signal multiplexing, and mixed signal functions. Logic and digital control IC 447 performs dedicated digital functions. Alternatively, a distributed system may combine such dedicated analog and digital functions with various signal processing ICs and a microcontroller shown in the previous figures. As a critical circuit component, the interconnections utilize a redundancy factor of RF≥3.

Figure 35D:
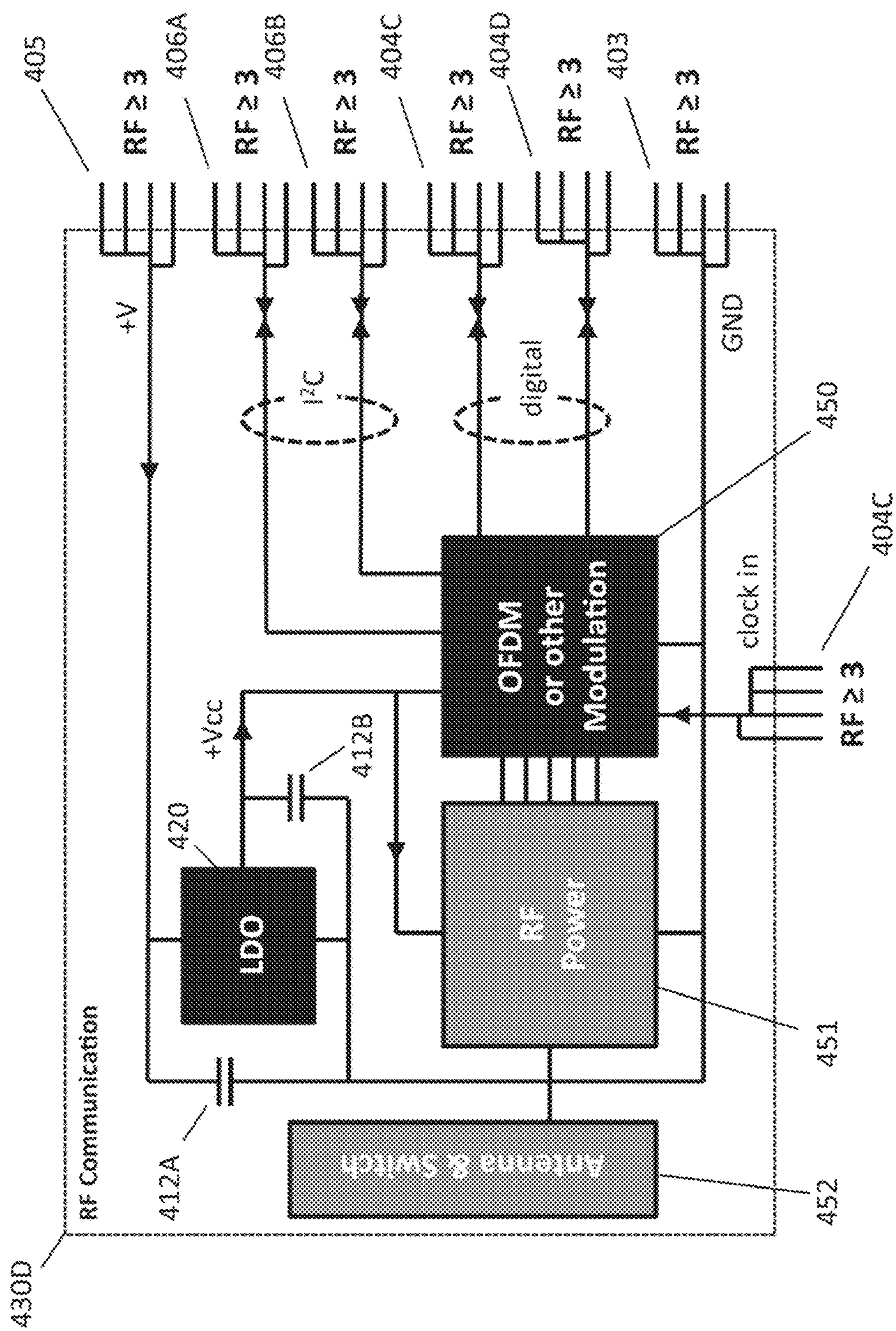
FIG. 35D is a schematic example of a RF communication circuit.

Finally, information may be communicated to other systems or other circuit functions within the same system wirelessly using radio frequency "RF communication" circuit function 430D shown in FIG. 35D. RF communication generally comprises three elements a modulation IC 450 performing the signal processing in accordance with some communication protocol such as OFDM, "orthogonal frequency division multiplexing" used in 4G and WiFi communication, an RF power stage 451 comprising radio or microwave frequency power amplification for both transmit and receive channels, and a switch and RF/microwave antenna array 452. The theory of operation of such radio frequency communication is beyond the scope of this disclosure, and is included herein as an example application of the communication function that can be integrated into the disclosed redundant distributed system. As a critical circuit component, the interconnections utilize a redundancy factor of RF≥3.

Important Circuit Functions

Figure 36A:
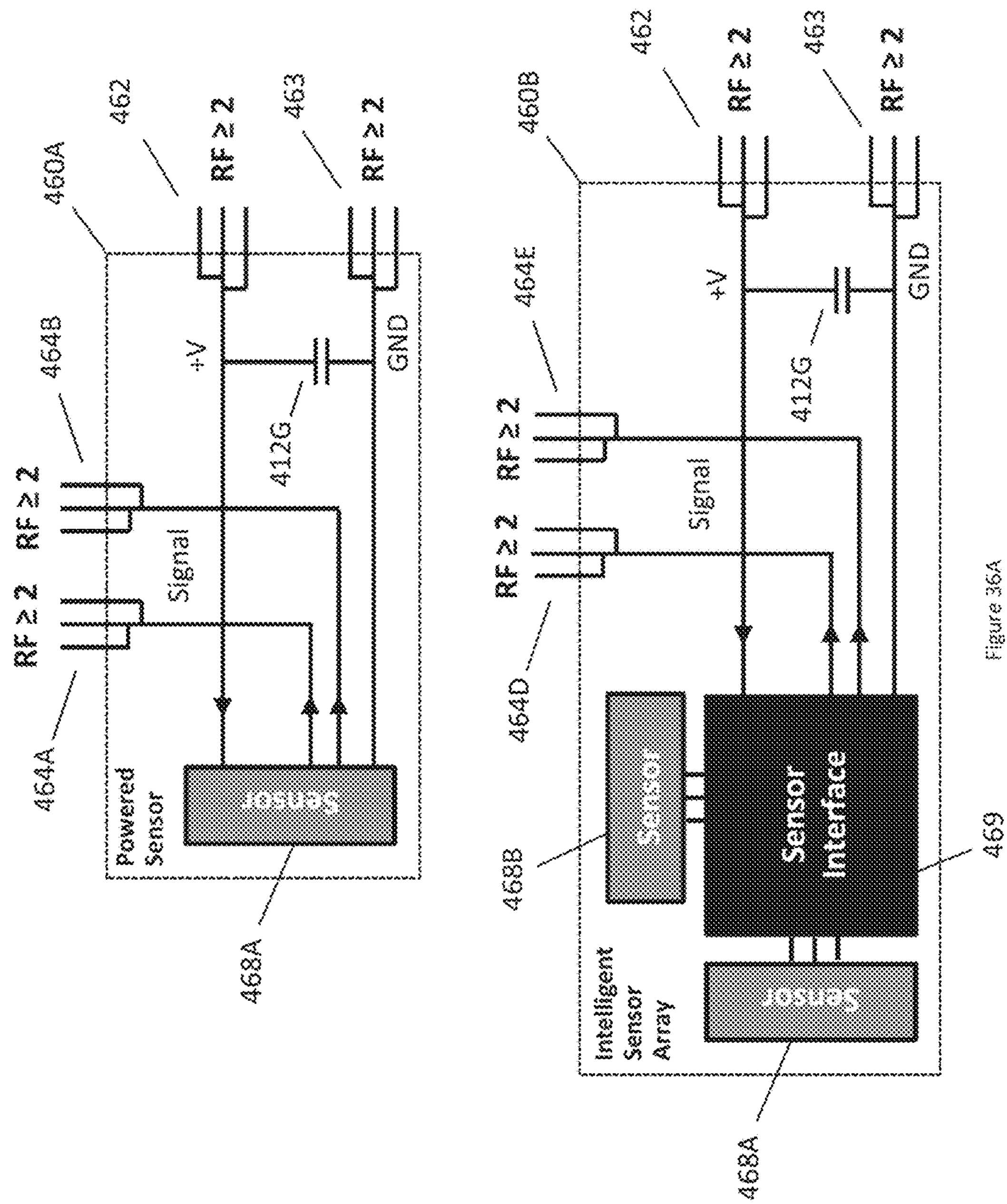
FIG. 36A comprises schematic examples of important-level powered sensor circuits.

Important circuit functions are circuits that perform required operations such as sensing, LED drive, monitoring, data gathering, etc. These important circuit functions essentially define a product's features and utility. One such important circuit is a powered sensor circuit 460A shown in FIG. 36A comprising a sensor 468A powered by redundant connections +V 462 and ground 463 and outputting a sensor output signal 464A and 464B for interpretation by other circuitry in the distributed system. The sensor may comprise a single component or an entire circuit combining a sensor with signal processing, buffers, sensor biasing, self-calibration functions, and other dedicated signal processing. Sensors include

- Temperature detection using semiconductor diodes or thermistors
- Magnetic detection using Hall effect sensors
- Chemical or bio-organism detection using visible or infrared light
- Tension detection using micro-machines or nano-machines
- Thermal imaging using IR detectors
- Chemical pH sensor
- Electro-potential detection for EEG, ECG, muscle contractions, etc.

For discrete sensors, the output signal, however, represents the real time data of the sensor as a digital or analog value, not data bus compatible information or bidirectional data flow. A higher functionality alternative to a powered sensor is an intelligent sensor array 460B also shown in FIG. 36A. In this circuit function, two sensors 468A and 468B send signals directly to sensor interface 469. The sensor interface processes the data converting into a more complex set of processed signals. These signals may include multiplexed analog signals, digitally encoded signals, or bus data communication, relayed to other circuit functions through redundant connections 464D and 464E. Sensor interface 469 is powered by the power delivered by redundant connections V+ 462 and ground 463. As an important circuit component, the interconnections utilize a redundancy factor of RF≥2.

Other important circuit functions include drivers for energy emitting devices. Energy emitting devices are useful in medical therapeutics, in imaging, in biometrics, and under development for disease detection, comprising LEDs and lasers (optical, ultraviolet, and infrared energy)
Micro-currents (electrical)
RF/microwave emitters (long wave electro-magnetic)
Ultrasound (vibrational/acoustic energy)
Thermal (vibrational/heat energy)

The energy emitting devices may comprise single point sources or multiple sources distributed over a large area. In therapeutics, the targeted area is intentionally subjected to the energy to stimulate a biochemical or biophotonic response, e.g. phototherapy, to stimulate enhanced activity of a chemical present or introduced in an organ or tissue, e.g. photodynamic therapy, or to stimulate muscle activity, e.g. micro-currents or thermotherapy. When coupled with the aforementioned sensors, sensitive detection of blood oxygen and detection of the presence of certain proteins, antigens, and microorganisms becomes possible.

Figure 36B:
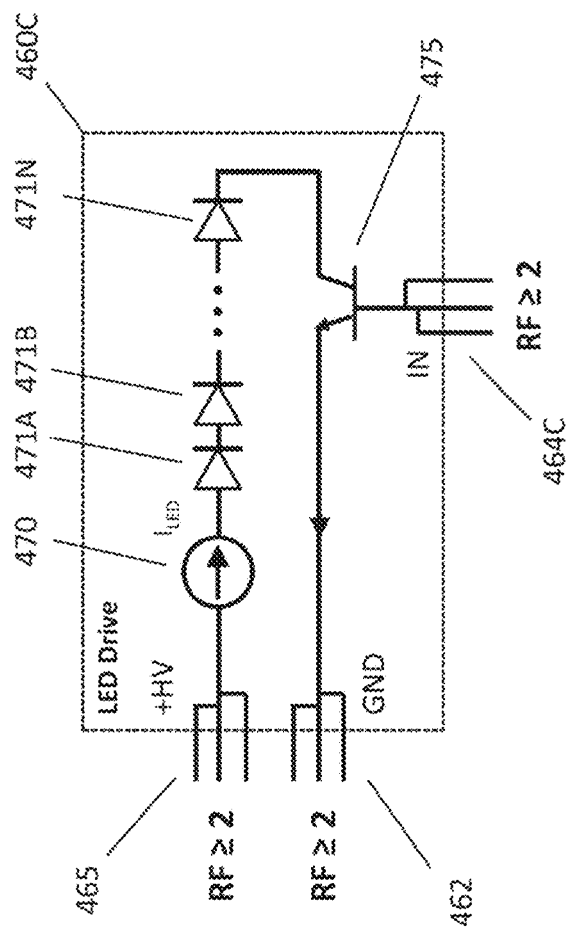
FIG. 36B is a schematic example of an important-level LED drive circuit.

One example of an important circuit function comprising a LED driver 460C is shown in FIG. 36B including a strings of series-connected LEDs 471A through 471N, current control device 470, and transistor 464C used to pulse the LEDs at controlled frequencies and duty factors. Power to the LED string is supplied through redundant connections +HV 465 and ground 462 and controlled by control signals driving redundant connection 464C connected to the base of transistor 475. Transistor 475 illustrated as a bipolar transistor may also comprise a MOSFET. As an important circuit component, the interconnections utilize a redundancy factor of RF≥2. Such important LED drive circuits comprise functions not repeated multiple times across an area, but only occur rarely or once per system, e.g. in a blood oxygen monitor using IR LEDs for oxygen detection.

Figure 36C:
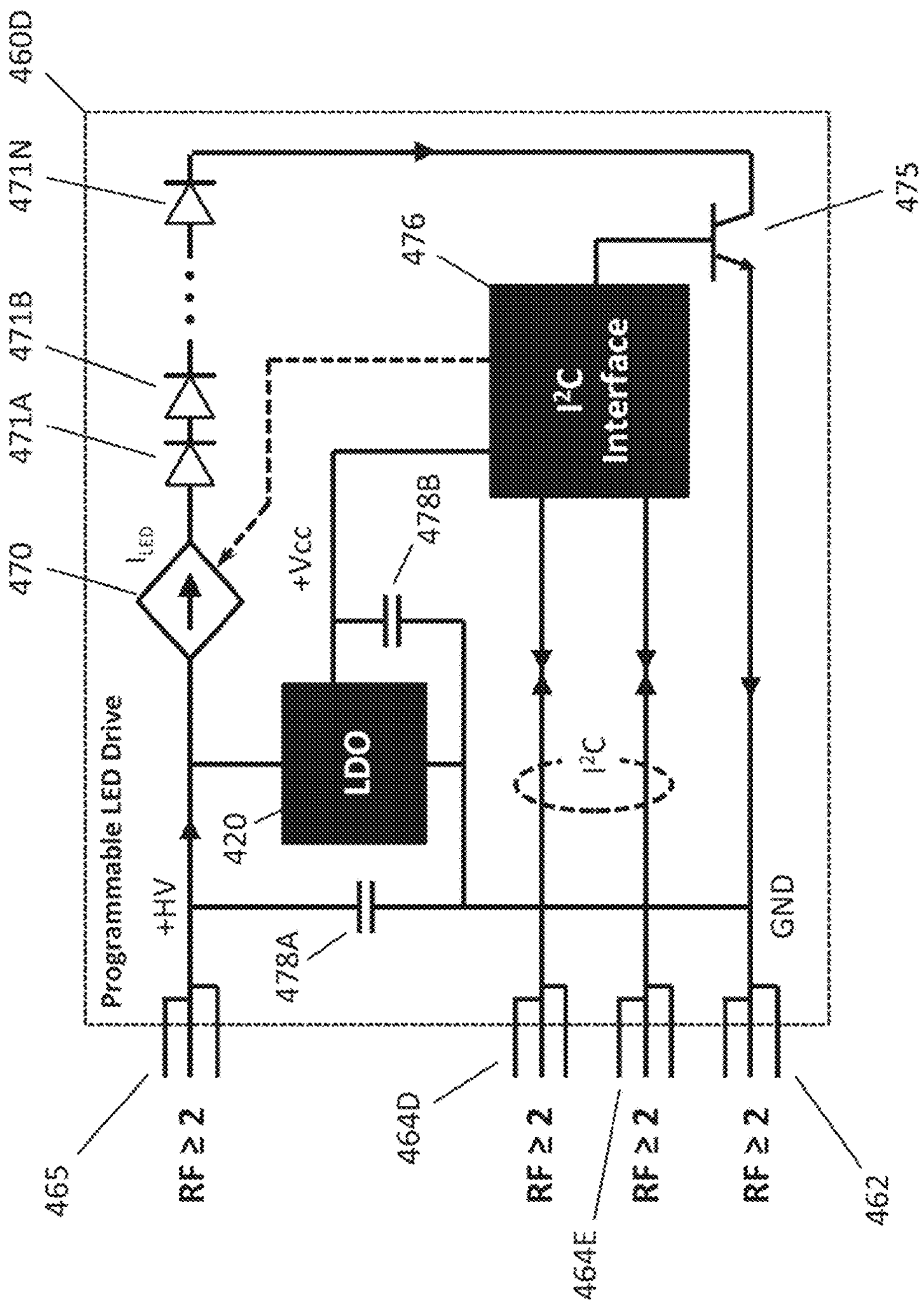
FIG. 36C is a schematic example of a programmable LED drive circuit with $I^2C$ interface.

Programmable LED drive 460D shown in FIG. 36C illustrates a more advanced form of LED drive able to respond to bus control through $I^2C$ interface 476 to determine the on and off time of LEDs 471 through 471N and to dynamically adjust the LED current $I_{LED}$ using programmable current source 470. Bus control of $I^2C$ interface 476 is achieved through $I^2C$ communication over redundant connections 464D and 464E. Power is delivered to programmable LED drive 460D over redundant connections +HV 465 and ground 462. Unless a low voltage supply is also provided to the circuit, LDO 420 derives power for $I^2C$ interface 476 from the +HV supply with input and output filter capacitors 478A and 478B. As an important circuit component, the interconnections utilize a redundancy factor of RF≥2.

Figure 36D:
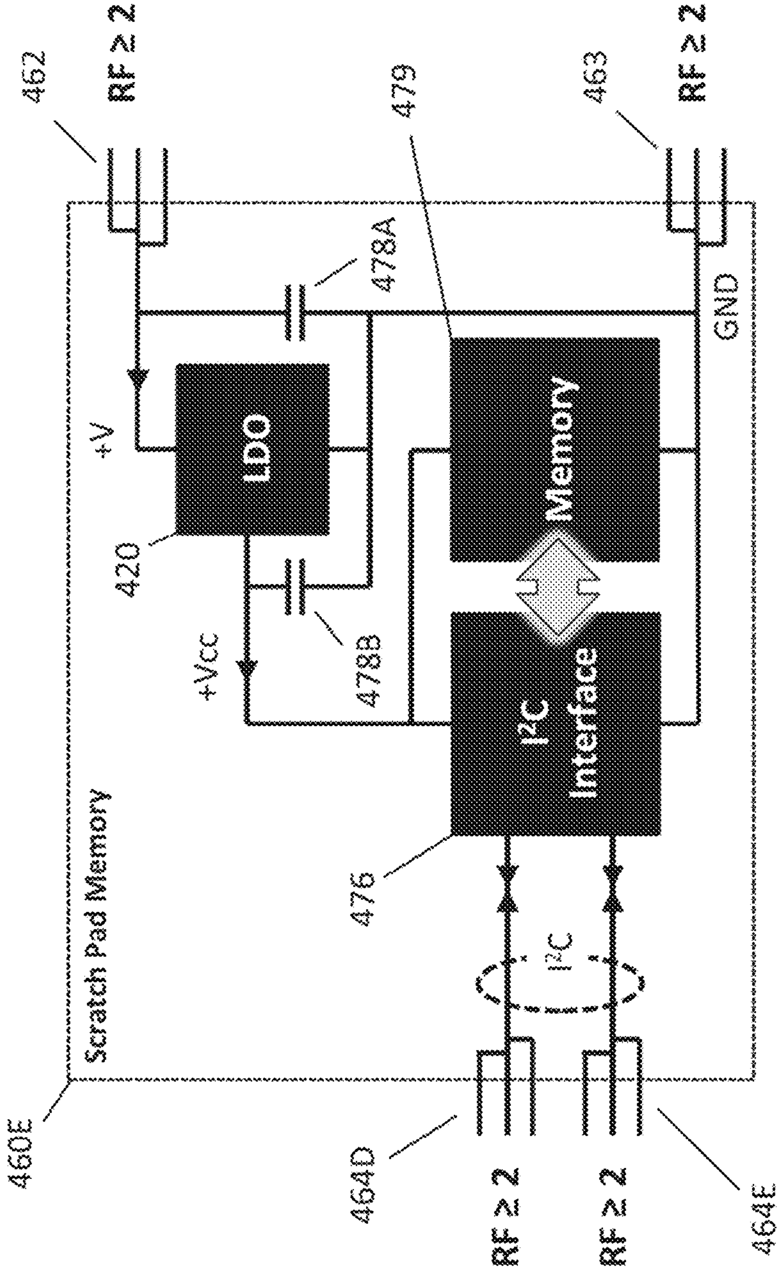
FIG. 36D is a schematic example of a scratch pad memory circuit with $I^2C$ interface.

Another important circuit function is "scratch pad memory" circuit 462 shown in FIG. 36D. The purpose of this circuit is to temporarily hold measured data in digital form locally until it can be communicated to a central microcontroller or to external devices communicating with the system via wireline bus such as $I^2C$ or wirelessly using RF communication. As shown $I^2C$ interface circuit 476 connected to an internal serial bus through redundant $I^2C$ connections 464D and 464E stores data it receives in memory 479 which may comprise SRAM or DRAM. Unlike program storage memory, "scratch pad" memory 479 is generally volatile, meaning it holds the data values temporarily only while power is present on the memory. Once the power is interrupted the data is irrevocably lost. Such memory often operates at low voltages lower than the system supply +V. Unless the proper low voltage supply is also provided to the circuit, LDO 420 is needed to supply the proper voltage for memory 479 and optionally for $I^2C$ interface 476. This voltage is developed from the +V supply supplied via redundant connection +V 462 and ground 463 with corresponding input and output filter capacitors 478A and 478B. As an important circuit component, the interconnections utilize a redundancy factor of RF≥2.

Figure 36E:
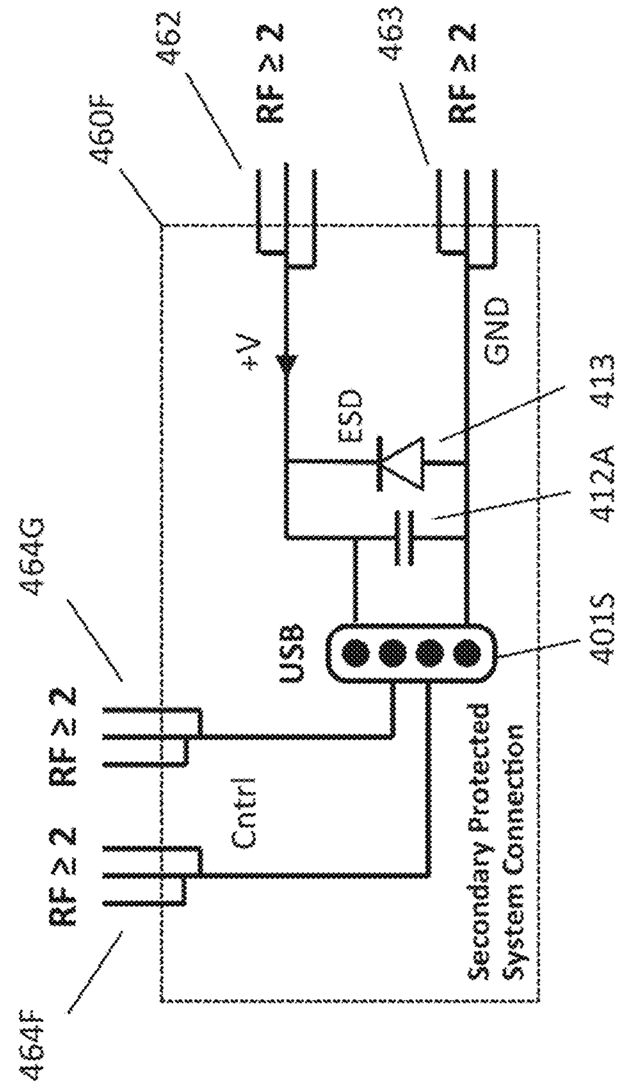
FIG. 36E is a schematic example of a secondary protected external connection circuit.

Another example of a important circuit function is that of a secondary PSC 460F, i.e. protected system connection, a supplemental connector 401S described in FIG. 36E used in addition to the primary connector to facilitate interconnection convenience. For example in LED LightPads, up to three LightPads may be driven from a common control signal and power source. While the primary LightPad connects directly to the controller device as described in FIG. 36A, the other two auxiliary LightPads connect to the primary pad through USB jumpers to secondary protected systems connections 464F between the pads, and not directly to the controller. As an important circuit component, the interconnections utilize a redundancy factor of RF≥2.

Basic Circuit Functions

In the disclosed distributed system, "basic" functions represent electronic circuitry that are not unique, and may in fact be repeated in multiple instances within a single system. For example, an LED LightPad used in phototherapy comprises numerous tiles or strings of LEDs covering a large area. An open circuit failure in any one single LED string disables operation of the LEDs in one small area, making that portion go "dark", but does not impede operation of the entire product. Interconnect failures of basic circuit functions are therefore not system-wide, but "locally" manifested affecting only a portion of a distributed system.

Figure 37A:
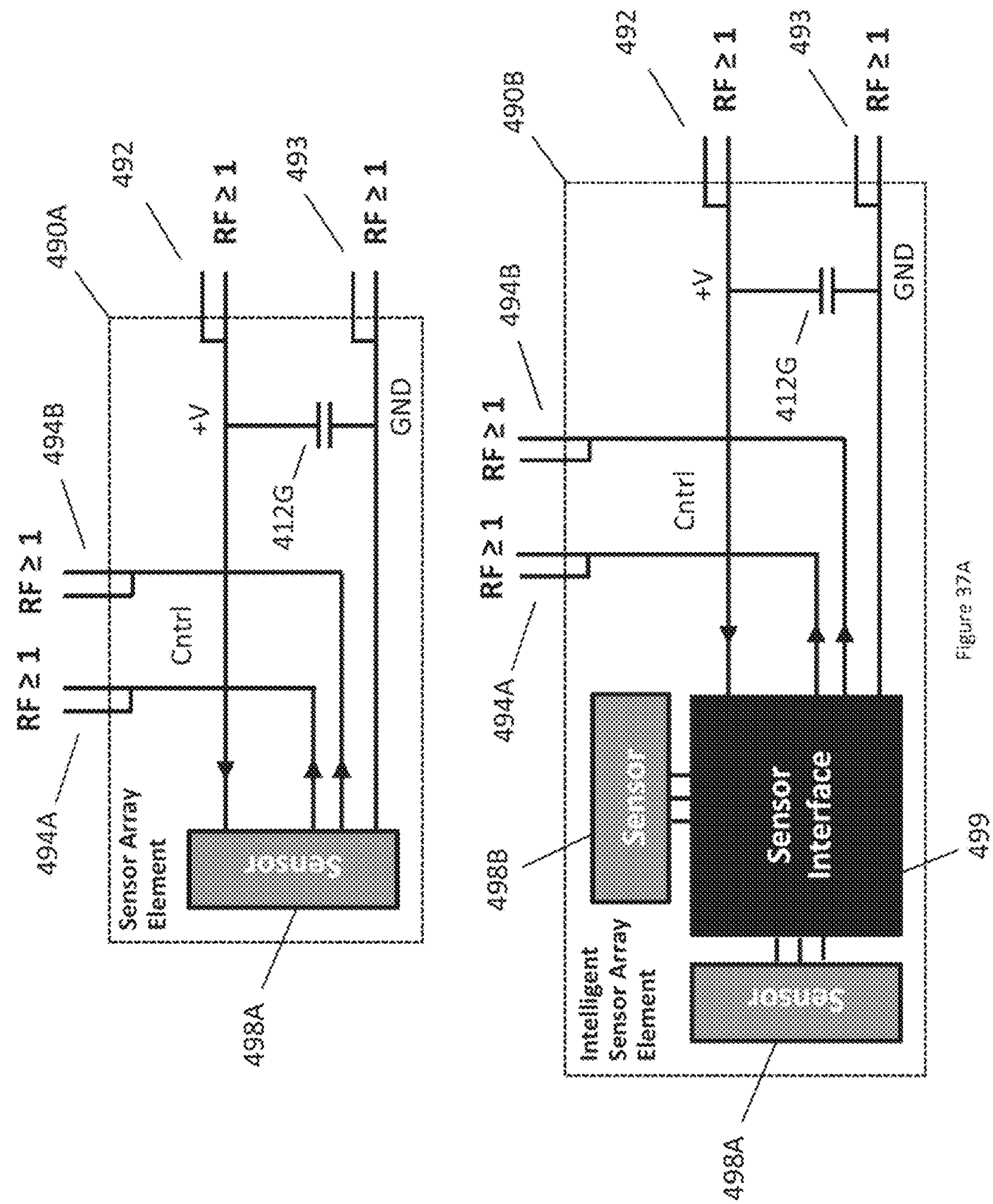
FIG. 37A comprises schematic examples of basic-level powered sensor circuits.

Two basic circuit functions commonly repeated over large areas of a distributed system are arrays of sensors, or of energy emitting devices such as LEDs. Sensor array element 490A and intelligent sensor array element 490B shown in FIG. 37A are two examples of basic circuit functions, essentially equivalent to their corresponding circuits 460A and 460B shown in FIG. 36A except that these circuits comprise constituent "elements" in an array or matrix. Each circuit element represents "one-of-many" identical components generally repeated in a regular pattern or fixed periodicity across the matrix or grid of PCBs. In a distributed system comprising "n" clones of the same basic circuit function, each circuit may be referred to as "1-of-n" circuit element.

For example, in a sensor array comprising a matrix of 32 sensor circuit elements, each sensor element comprises "1-of-32" circuit elements. Such elements may identified sequentially using ordinal numbers, e.g. $1^{st}$-of-32 elements, $5^{th}$-of-32 elements, $29^{th}$-of-32 elements, or for rectilinear grid patterns by using unique $C_{r,c}$ row-column matrix numbers described previously, where $C_{1,2}$ identifies the sensor located in the circuit in the $1^{st}$ row and $2^{nd}$ column of the matrix, $C_{4,4}$ identifies the sensor located in the circuit in the $4^{th}$ row and $4^{th}$ column of the matrix, etc. Because these sensor elements are repeated in many "instances" across the distributed system's grid, loss of any one of them does not imperil the overall system's operation.

Figure 37B:
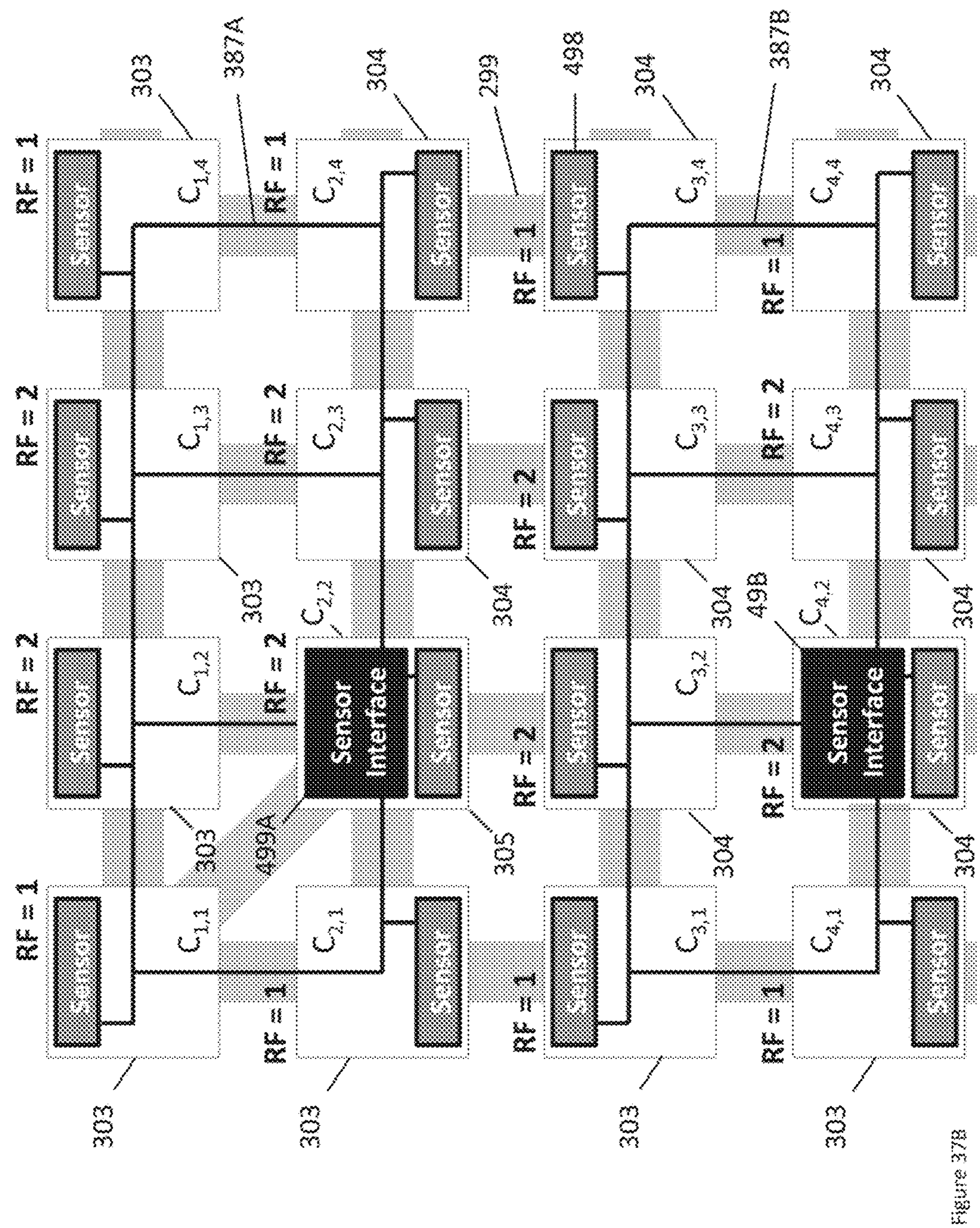
FIG. 37B is a schematic example of a distributed sensory array with interconnections to local sensor interface circuits.

An example of such a sensor matrix distributed in a grid pattern is shown in FIG. 37B where sensor elements 498 are distributed over an area in every rigid PCB in a matrix including PCBs connected to three flex 299 connectors, i.e. PCB 303; four flex connected PCBs 304, and five flex connected PCBs 305. As shown, in a matrix of 16 rigid PCBs, sensor element 498 is included in every rigid PCB in the matrix, i.e. from circuit $C_{1,1}$ to circuit $C_{4,4}$. All sensor elements 498 in the first two rows $C_{1,1}$ through $C_{1,4}$ and $C_{2,1}$ through $C_{2,4}$ connect to sensor interface 499A by signal bus 387A. Sensor interface 499A is located in the matrix on circuit $C_{2,2}$. Sensor bus 387A provides two connections, i.e. RF=1, to sensor elements 498 in circuits $C_{1,1}$, $C_{1,4}$, $C_{2,1}$, and $C_{2,4}$ and three connections with RF=2 to sensor elements in circuits $C_{1,2}$, $C_{1,3}$, and $C_{2,3}$. The sensor element in circuit $C_{2,2}$ does not depend on any flex connection since it shares the same rigid PCB as sensor interface 499A. Although rigid PCBs 303 with three flex connections are capable of supporting a RF=2 redundancy level, for sensor bus 387A, the sensor elements located in circuits $C_{1,1}$, $C_{1,4}$, $C_{2,1}$ and $C_{2,4}$ only achieve a redundancy level RF=1. This limited redundancy occurs because sensor bus 387A includes just two connections to the sensor elements in the first and fourth columns of the matrix. Sensor interface 499A connects to sensor bus 387A with three connections, and therefore achieves redundancy RF=2 in regards to its connectivity with sensor elements 498.

Similarly, sensor elements 498 in the third and fourth rows $C_{3,1}$ through $C_{3,4}$ and $C_{4,1}$ through $C_{4,4}$ connect to sensor interface 499B by signal bus 387B. Sensor interface 499B is located in the matrix on circuit $C_{4,2}$. Sensor bus 387B, distinct and electrically isolated from sensor bus 387A, provides two connections, i.e. RF=1, to sensor elements 498 in circuits $C_{3,1}$, $C_{3,4}$, $C_{241}$, and $C_{4,4}$ and three connections with RF=2 to sensor elements in circuits $C_{3,2}$, $C_{3,3}$, and $C_{4,3}$. The sensor element in circuit $C_{4,2}$ does not depend on any flex connection since it shares the same rigid PCB as sensor interface 499B. Although rigid PCBs 303 with three flex connections are capable of supporting a RF=2 redundancy level, for sensor bus 387B, the sensor elements located in circuits $C_{3,1}$, $C_{3,4}$, $C_{4,1}$, and $C_{4,4}$ only achieve a redundancy level RF=1. This limited redundancy occurs because sensor bus 387B includes just two connections to sensor elements in the first and fourth columns of the matrix.

The connectivity of sensor buses 387A and 387B exemplifies the concept of hierarchical redundancy—that just because the flex interconnections of a matrix of rigid PCB's are capable of supporting a higher level of redundancy, the application of the full degree of redundant interconnectivity is not necessarily warranted or utilized. As shown, the connectivity of sensor elements utilizes redundancy ranging from RF=1 to RF=2, exhibiting an overall redundancy LRF=1 and ARF=1.5. As multiple non-unique circuit functions, the array of sensor elements can be considered a basic level circuit function. In accordance with the table shown in FIG. 33, a RF≥1 qualifies as a "good" level redundant design methodology.

Figure 37C:
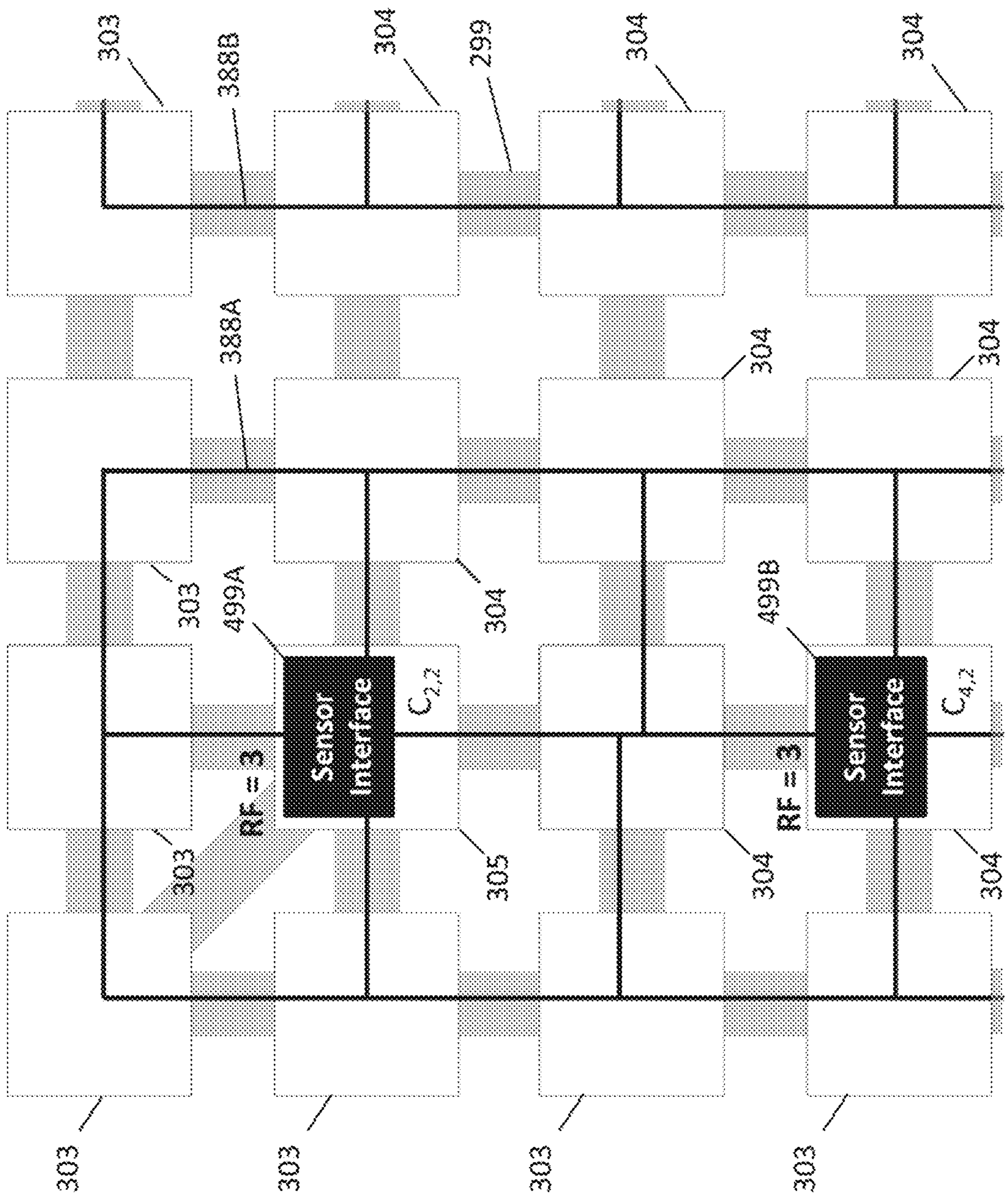
FIG. 37C is a schematic example of interconnected sensor interface circuits.

Despite the fact that distributed sensor elements 498 are identical, sensor buses 387A and 387B and electrically isolated and independent from one another. In order to consolidate the information for control or communication purposes, sensor interfaces 499A and 499B must communicate with one another and with a central microcontroller or signal-processing circuit function. This level of communication is hierarchically one level above the basic level, because an interconnection failure affecting the reporting of large arrays of sensors would disable operation of large areas of the distributed system. Looking at the same distributed sensor array system as described, an example of an "important" level of circuit function is illustrated in FIG. 37C where sensor interface circuit 499A located on circuit $C_{2,2}$, and circuit 499B located on circuit $C_{4,2}$ communicate to one another and to other circuit functions in the system over sensor control bus 388A. In a similar manner, other sensor interface circuits (not shown) may communicate over other bus connections, e.g. sensor control bus 388B. As shown each sensor interface circuit 499A and 499B connects to sensor control bus 388A through four distinct buses. Except for circuit $C_{2,2}$ which has RF=4, every component in the sensor control level exhibits a redundancy factor of RF=3 whereby from a system perspective, the sensor control level has a LRF=3 and ARF=3. Considering block level control and signal processing may be considered as an important level, then in accordance with the table shown in FIG. 33, a RF≥2 is considered a "good" level of redundant design methodology.

Figure 37D:
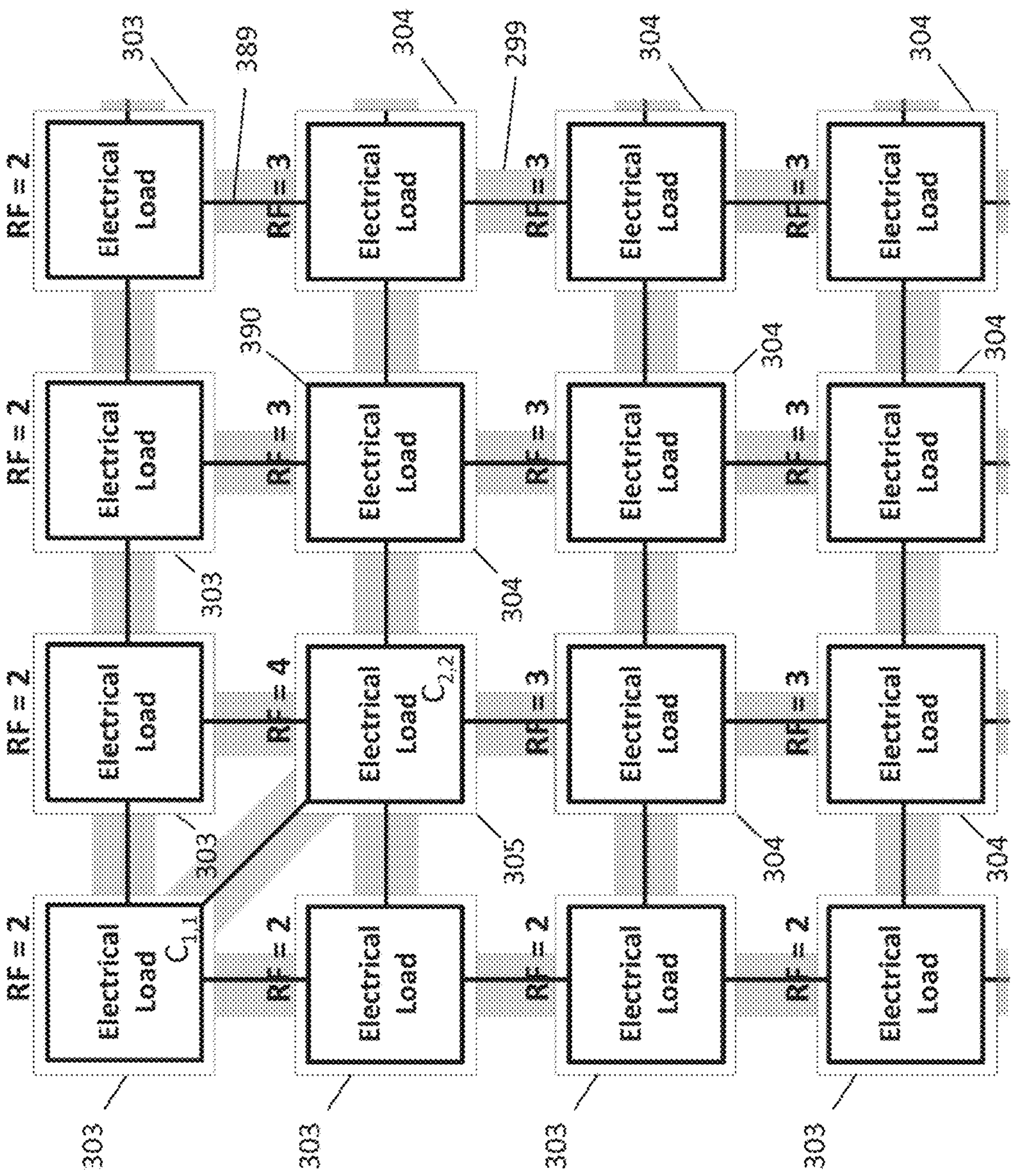

Considering the same system example, FIG. 37D illustrates the corresponding power distribution network. From a power perspective, every circuit function is simply an electrical load 390 regardless of whether it is a sensor or a sensor interface circuit. By distributing power over power bus 389 on every connector comprising flex 299, the maximum level of redundancy is achieved in power bussing. As shown the first row and first column of the matrix exhibit RF=2 while with the exception of circuit $C_{2,2}$, the remainder of the matrix exhibits RF uniquely has redundancy RF=4. Since none of the powered circuits shown comprise critical circuit functions, then in accordance with the table in shown in FIG. 33, a RF≥2 is considered a "good" level of redundant design methodology.

A summary of the hierarchical redundancy of the system described in shown in the table below. Other than critical circuit functions not present in the design, the redundancy factors of the circuit functions meets the criteria for that of a "good" redundancy design methodology.

| Circuit Function | Circuit # | # Flex | Power | Sensor Cntrl | Sensor |
|---|---|---|---|---|---|
| Sensor | $C_{1,1}$ | 3 | RF = 2 | | RF = 1 |
| Sensor | $C_{1,2}$ | 3 | RF = 2 | | RF = 2 |
| Sensor | $C_{1,3}$ | 3 | RF = 2 | | RF = 2 |
| Sensor | $C_{1,4}$ | 3 | RF = 2 | | RF = 1 |
| Sensor | $C_{2,1}$ | 3 | RF = 2 | | RF = 1 |
| Sensor & Interface | $C_{2,2}$ | 5 | RF = 4 | RF = 3 | RF = 2 |
| Sensor | $C_{2,3}$ | 4 | RF = 3 | | RF = 2 |
| Sensor | $C_{2,4}$ | 4 | RF = 3 | | RF = 1 |
| Sensor | $C_{3,1}$ | 3 | RF = 2 | | RF = 1 |
| Sensor | $C_{3,2}$ | 4 | RF = 3 | | RF = 2 |
| Sensor | $C_{3,3}$ | 4 | RF = 3 | | RF = 2 |
| Sensor | $C_{3,4}$ | 4 | RF = 3 | | RF = 1 |
| Sensor | $C_{4,1}$ | 3 | RF = 2 | | RF = 1 |
| Sensor & Interface | $C_{4,2}$ | 4 | RF = 3 | RF = 3 | RF = 2 |
| Sensor | $C_{4,3}$ | 4 | RF = 3 | | RF = 2 |
| Sensor | $C_{4,4}$ | 4 | RF = 3 | | RF = 1 |

Figure 38A:
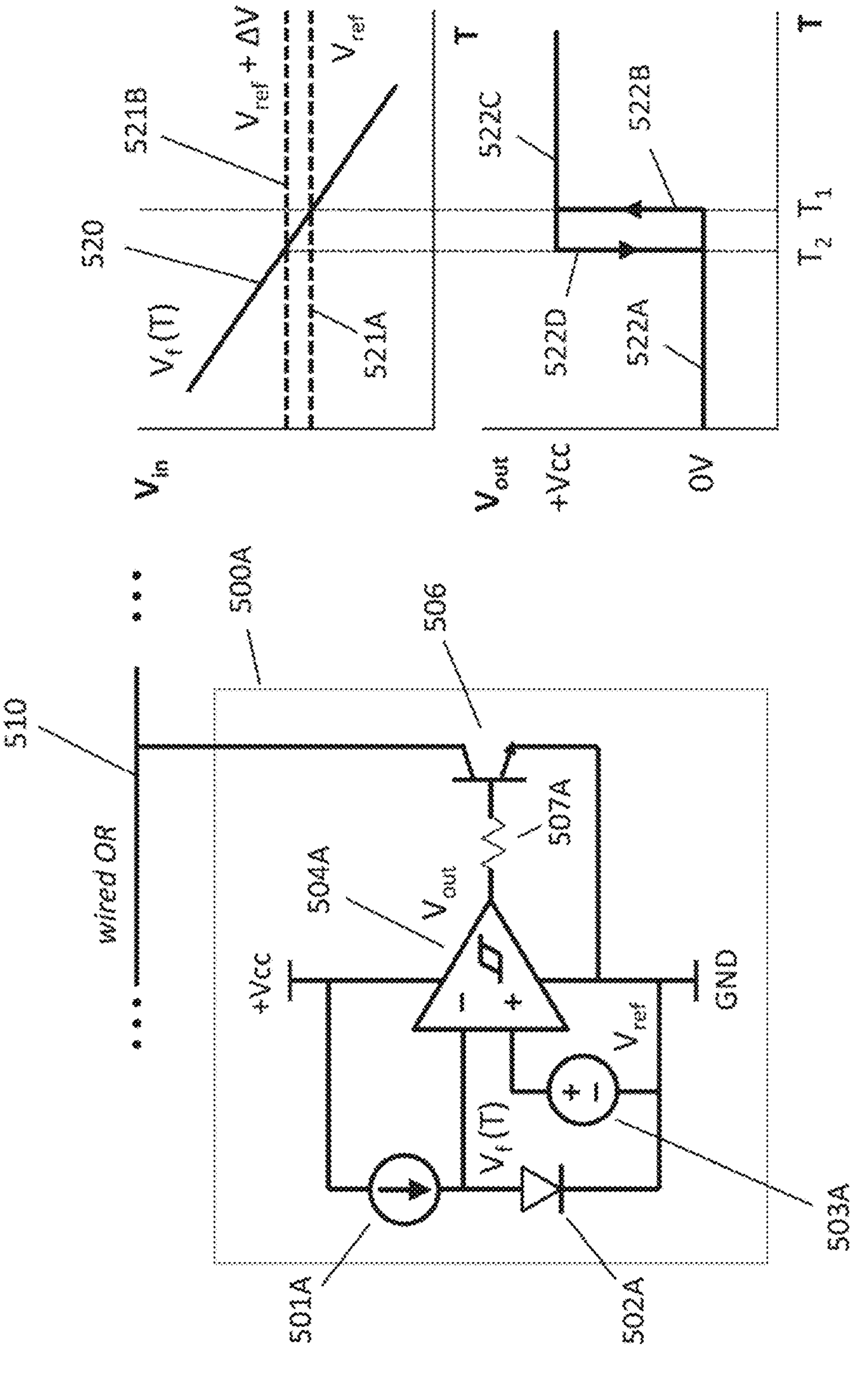

Implementation of sensor elements depends on the nature of the variable being sensed or monitored. While any physical parameter may be monitored, for the purpose of explanation and without limitation, a variety of temperature detection sensors are described here below. FIG. 38A illustrates an example of an over-temperature detection circuit used to prevent overheating, a feature important in both medical devices and in consumer electronics. Over-temperature detection circuit 500A comprises a forward biased P-N junction diode 502A biased by a fixed current 501A. As shown in the upper graph, under a fixed operating current the voltage $V_f(T)$ across a forward-biased diode declines in proportion to temperature as shown by curve 520. This $V_f(T)$ 520 voltage is input into comparator 504A and compared against a fixed voltage reference 503A having a temperature-independent voltage $V_{ref}$ 521A.

As shown, the fixed reference $V_{ref}$ 521A is connected to the comparator's positive input while the voltage 520 across temperature detecting diode 502A is wired to the comparator's negative input. So long that the diode's voltage is greater than $V_{ref}$ 521A, the negative input of comparator 504A exceeds the positive input and the output voltage Vow of comparator 504A is driven to ground, i.e. to 0 volts. With $V_{out}$=0V, the base of bipolar transistor 506 is biased into an off condition whereby wired-OR connection 510 remains floating. With increasing temperature, $V_f(T)$ for a silicon P-N diode declines a linear slope of approximately 2.2 mV/° C. At temperature $T_1$, curve $V_f(T)$ 520 crosses $V_{ref}$ 521A and the output voltage $V_{out}$ transitions 522B from ground to +Vcc 522C. When the output of comparator rises to Vcc, the voltage on the base of bipolar 506 increases to 0.7V, the bipolar collector conducts and pulls wired-OR connection 510. The excess voltage between Vcc and the bipolar base voltage is dropped across resistor 507A. The state change of the wired-OR line 510 indicates an overt-temperature condition has occurred. This information can be used to adjust the operating conditions of the system or shutdown the entire system.

In the event the cause of overheating is removed, the diode voltage $V_f(T)$ 520 rises until it crosses the voltage ($V_{ref}$+ΔV) 521B at temperature $T_2$. At $T_2$, a temperature slightly cooler than temperature than $T_1$, the output voltage $V_{out}$ of comparator 504A returns 522D to ground 522A and bipolar 506 turns off and releases wired-OR line 510. The threshold of the comparator is designed to have two trip points, $V_{ref}$ 521A during heating, and ($V_{ref}$+ΔV) 521B during cooling. These voltages are designed to be intentionally different, introducing hysteresis into the comparator to avoid uncontrolled oscillations, i.e. "chattering" at the transition point.

Figure 38B:
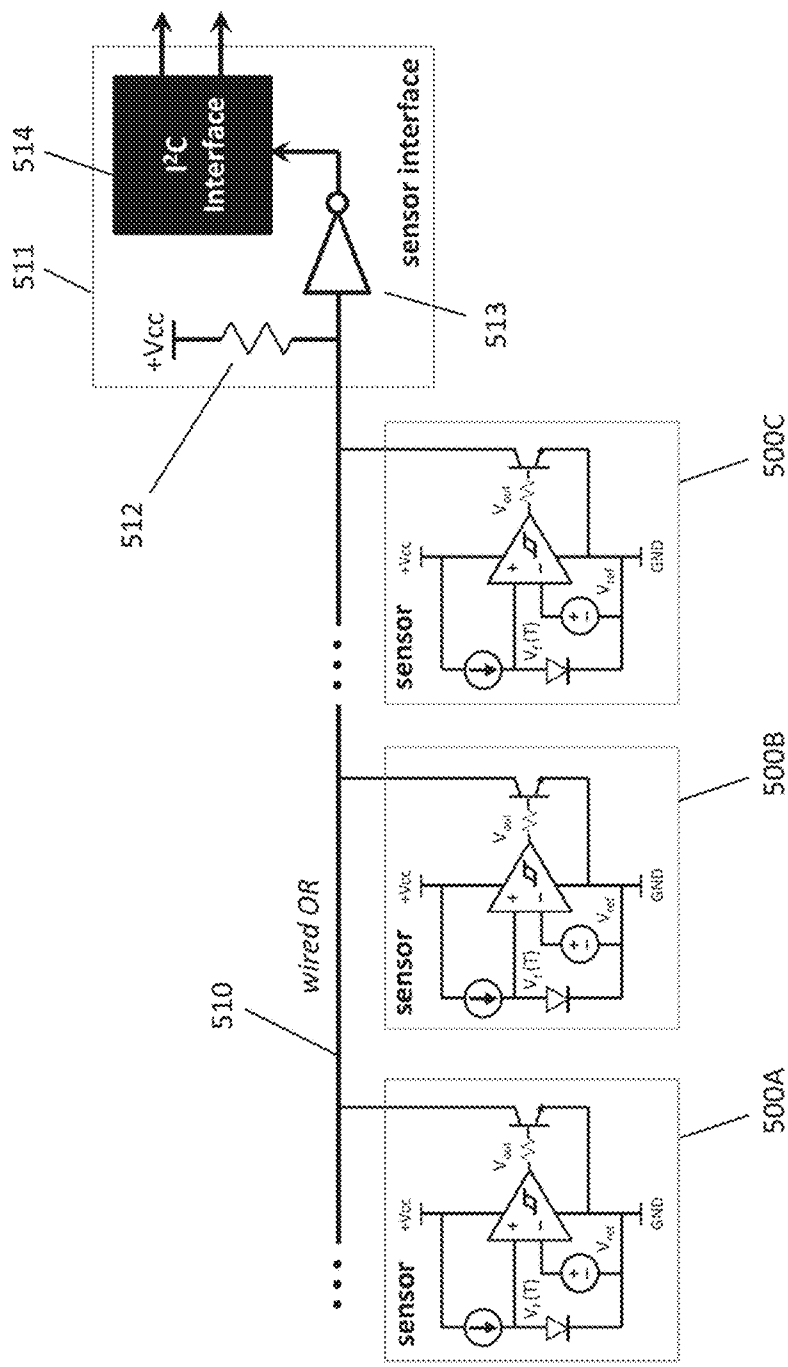

In a system, over-temperature detection 500A and identical circuits 500B, 500C and others are interconnected by wired-OR line 510 as shown in FIG. 38B. The reason line 510 is referred to as a wired-OR is because it performs the same Boolean operation as a logical "OR" gate, i.e. if any one of the bipolar transistors in circuits 500A, 500B, 500C and others (not shown) turns on, it pulls the line 510 to ground, otherwise pull-up resistor 512 pulls line 510 to Vcc. Inverter gate 513 in sensor interface 511 inverts the signal making the inverter's output low, i.e. ground, when line 510 is high, and output a high signal whenever wired-OR line 510 is pulsed on, i.e. whenever any one or more than one of the over-temperature detection circuits detects a over-temperature fault. $I^2C$ interface 514 converts the fault signal into serial communication for easy communication and processing within the system.

Figure 38C:
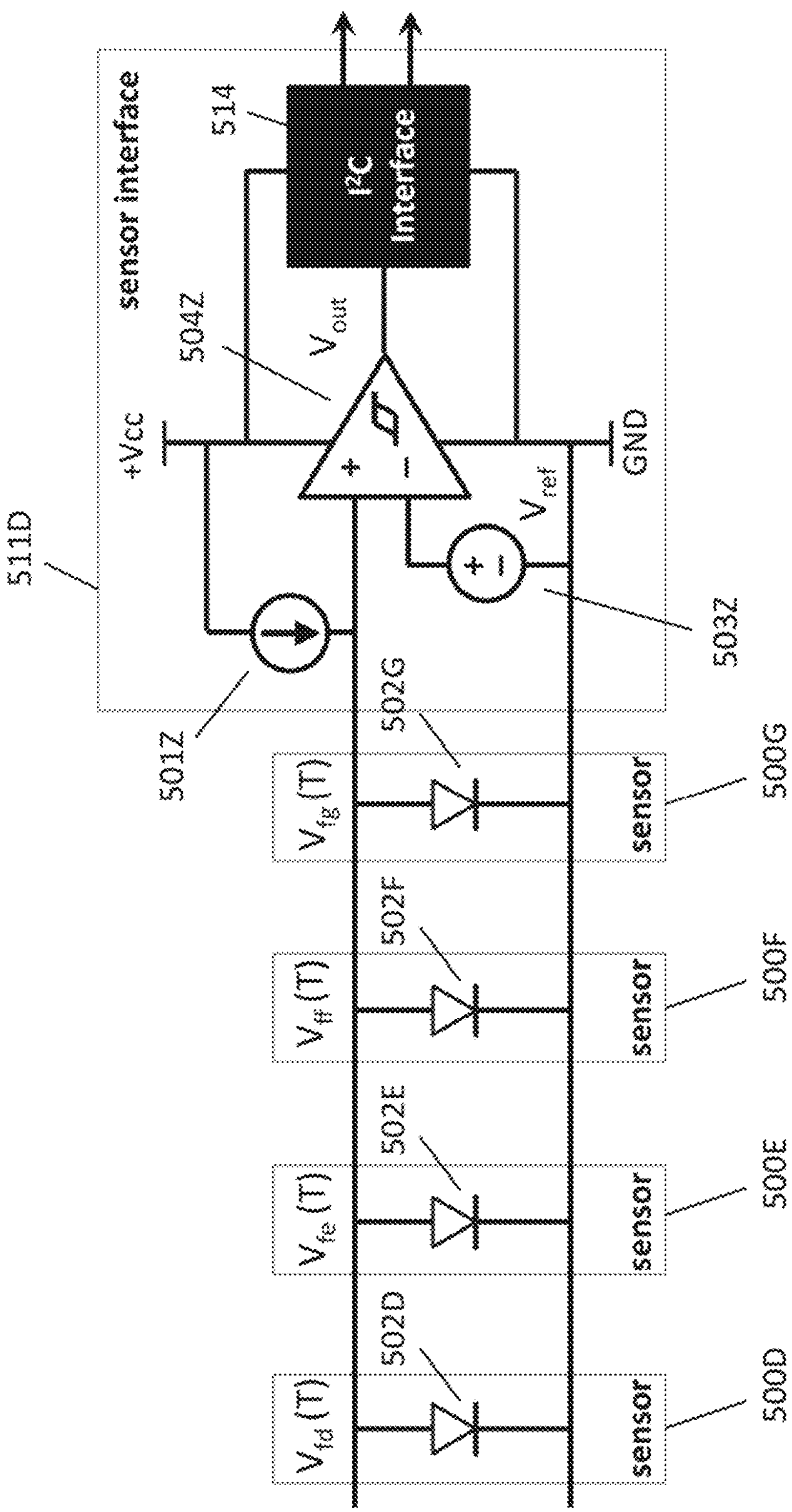

As an alternative to the wired-OR method, another method to monitor the possibility of an over-temperature condition within a distributed system is to parallel multiple forward biased diodes as shown in FIG. 38C. In this method each temperature sensing diode 502D, 502E, 502F, and 502G and others (not shown) are located on different PCBs comprising sensors 500D, 500E, 500*f*, 550G and others (not shown). Each forward biased diode carries a fraction of current 501Z. The voltage across the parallel combination of the diodes is equal to whichever diode has the lowest voltage, either voltage $V_{fd}(T)$, $V_{fe}(T)$, $V_{ff}(T)$, $V_{fg}(T)$, or others (not shown). This lowest voltage is compared against fixed reference 503Z by comparator 504Z and the output is converted into serial bus communication by $I^2C$ interface 514. To improve accuracy, the diode sensors can be calibrated during manufacturing.

Although temperature detection circuits measure an analog parameter such as the voltage across a forward biased P-N semiconductor diode, the resistance across a thermistor, or the potential across a thermoelectric device such as Peltier junction, the use of a comparator converts the analog temperature information into a simple "digital" yes/no assessment—is the circuit too hot or not? The purpose of an over-temperature detection circuit is by its namesake a circuit assessing if an over-temperature condition has occurred or is about to occur. If it has, actions can be taken to shut-off all or portions of the circuit to reduce power dissipation until it returns to safe operation. If an over-temperature condition involves shutting down circuitry the protection function may be referred to as an over-temperature shutdown or OTSD circuit. In other variations of the circuit, two comparators are employed—one to detect the over-temperature condition, and a second to detect that the system is getting hot but has not yet over-heated, i.e. providing a warning of a potential problem.

Figure 39A:
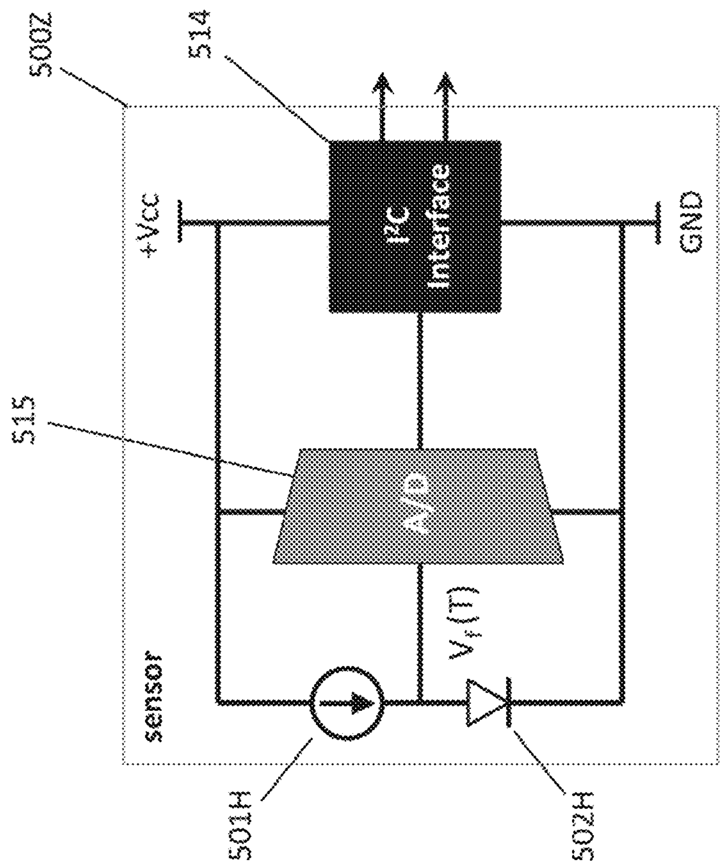
Figure 398:
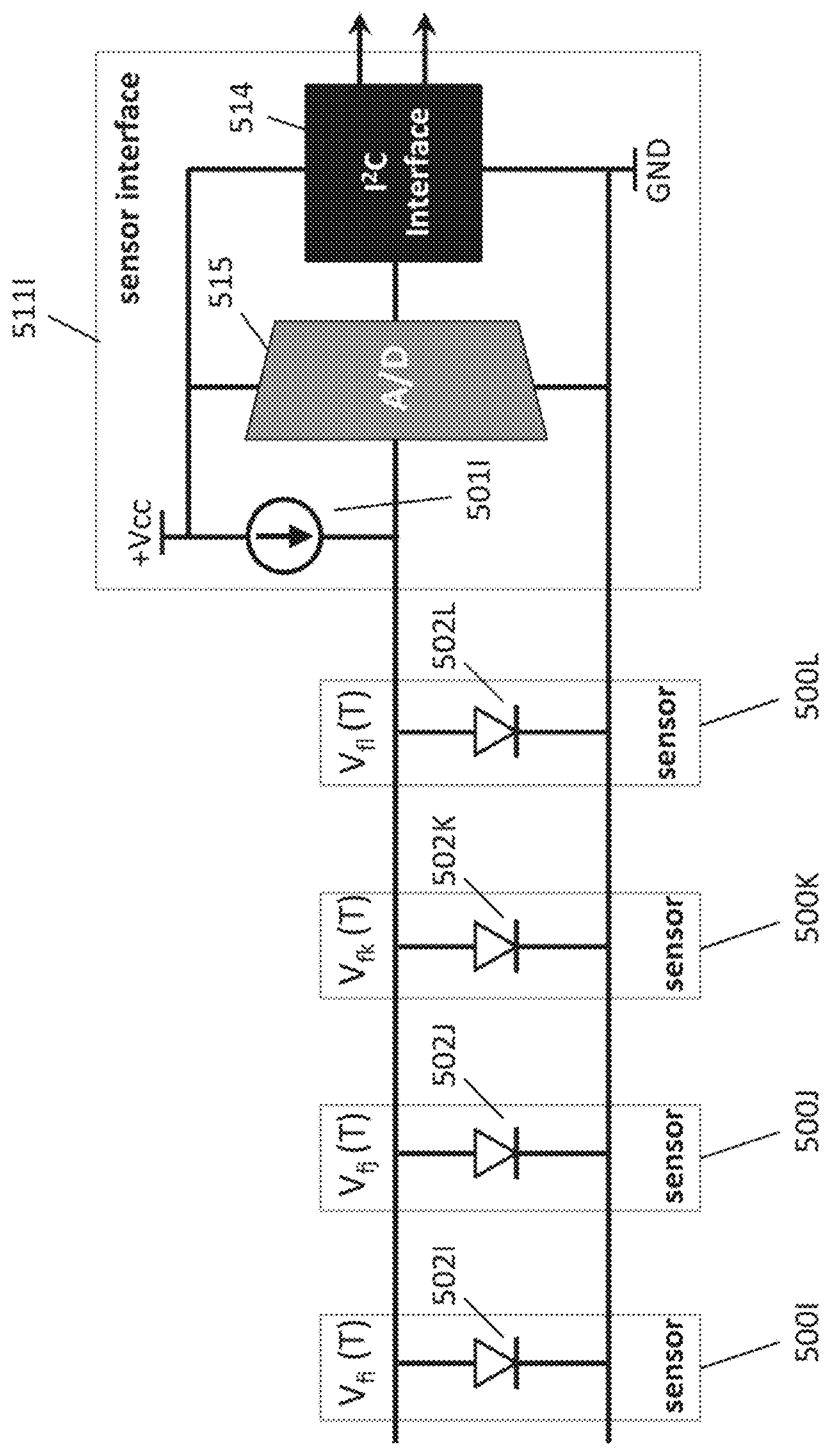

Alternatively if a quantitative monitoring of temperature is required, e.g. in a thermometer function, an analog measurement of the temperature sensor can be made by utilizing an analog-to-digital (A/D) converter as that shown in FIG. 39A. For example, the voltage $V_f(T)$ across a temperature sensor such as forward biased P-N junction 502 operating at a fixed bias by current source 501H is monitored by A/D converter 515 and converted into serial data by $I^2C$ interface 514 for communication to other circuitry in the system. If the signal coming from a sensor and being input into the A/D converter is too small for the resolution or sensitivity of the data converter an operational amplifier may be used to boost the signal.

Since $I^2C$ interface 514 or any other serial bus communication method utilizes "serial information", reporting of temperature over the serial bus is not continuous. Instead the measured data is "sampled", i.e. sent in bursts either at regular intervals, or upon request by a central control circuit or microprocessor. In the case of temperature monitoring, there is no real need to utilize continuous data because the temperature of any object changes slowly, over a period of milliseconds, seconds, or minutes while electronics reacts in microseconds, essentially instantly in comparison to changes in temperature. In other words, temperature monitoring appears to be real time and instantaneous even though it is not.

In order to perform quantitative monitoring of sensors over a large area, several methods may be employed comprising

Figure 39C:
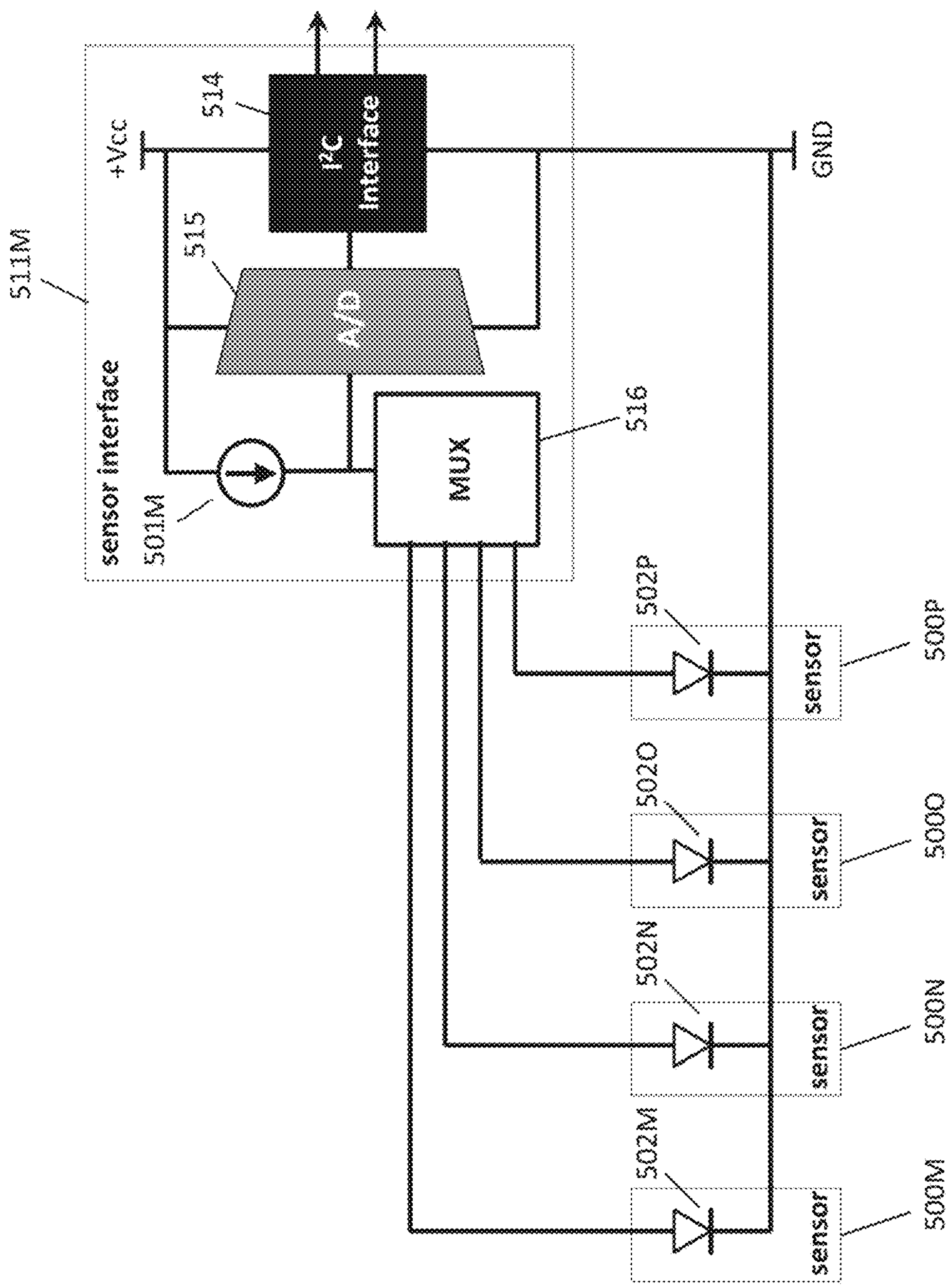
Figure 39D:
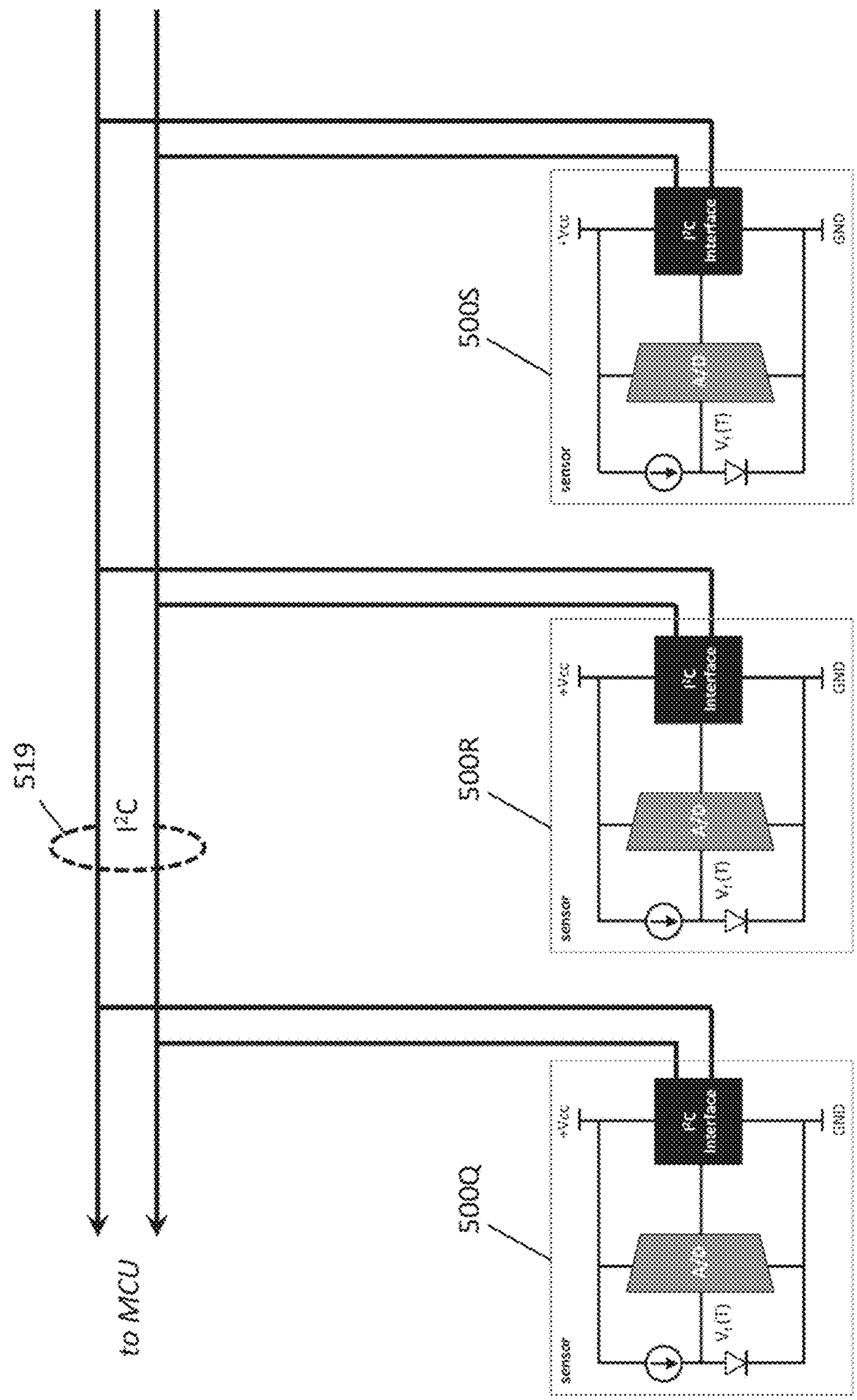

- Paralleling the sensors, detecting and digitizing only the lowest voltage sensor component, converting it into serial data, then communicating the data over a serial bus to a central control circuit or microprocessor as shown in FIG. 39B.
- Multiplexing the analog data from each sensor, digitizing each sensor's voltage data and converting it into serial data, then communicating the data over a serial bus to a central control circuit or microprocessor as shown in FIG. 39C.
- Digitizing the data of each sensor and converting it into serial data, then communicating the data for each sensor over a serial bus to a central control circuit or microprocessor as shown in FIG. 39D).

Referring to FIG. 39B, parallel temperature sensors 500I, 500J, 500K, 500L and others (not shown) comprising forward biased P-N diodes such as 502I, 502J, 502K, 502L and others (not shown) driven by a shared current source 502I produces a single analog value essentially comprising the voltage of lowest voltage diode, whether $V_{fi}(T)$, $V_{fj}(T)$, $V_{fk}(T)$, $V_{fi}(T)$ or others (not shown). This lowest voltage value is digitized by A/D converter 515 in sensor interface 5111 and converted into serial data by $I^2C$ interface 514. Provided the diodes are well matched or calibrated, the lowest voltage diode will represent the warmest sensor, i.e. the hottest part of the system.

In FIG. 39C, temperature-sensing diodes 502M, 502N, 5020, 502P and others (not shown) distributed across circuits 500M, 500N, 5000, 500P and others (not shown) are individually monitored and driven by current source 501M using analog multiplexer MUX 516 included in sensor interface 511M. During multiplexing, the data is sequentially digitized by A/D converter 515 and communicated to the system over a serial interface such as $I^2C$ 514. The advantage of multiplexing the sensors is that each sensor can be individually monitored to know what the data is and where it came from. One disadvantage of multiplexing is that it requires multiple interconnections across PCBs to each separate sensor, making a fully redundant implementation challenging.

An alternative approach is to replicate sensor circuit 500Z for every sensor and use $I^2C$ bus 519 to relay the information from each sensor to the system's MCU. As shown in FIG. 39D, each sensor circuit 500Q, 500R, 500S and others (not shown) each send out data at regular intervals or upon request over the digital bus. How the MCU sorts through its incoming data to distinguish redundant data from unique measurements is disclosed later in this application.

In a manner similar to sensors, distributed drivers for energy emitting devices such as LEDs may comprise "important" circuit functions occurring uniquely in a single instance in a system, or may comprise a "basic" function of constituent "elements" in an array or matrix. Each circuit element represents "one-of-many" identical components generally repeated in a regular pattern or fixed periodicity across the matrix or grid of PCBs. In a distributed system comprising "n" clones of the same basic circuit function, each driver circuit may be referred to as "1-of-n" circuit element. An example of a unique driver includes an LED driver used with performing optical chemical analysis such as blood oxygen detection. In contrast, a basic circuit function LED driver includes a matrix of LED elements used to illuminate a large area, for example in a LightPad used as part of a phototherapy system.

LED driver 550A with redundancy RF≥1 shown in FIG. 40A represents one such basic circuit function in LED drive—functionally equivalent to the important level LED drive 460C shown previously in FIG. 36B except for its lower redundancy factor interconnectivity. As shown LED driver 550A comprises strings of series-connected LEDs 571A through 571N, current control device 570, and transistor 574C used to pulse the LEDs at controlled frequencies and duty factors. Power to the LED string is supplied through redundant connections +HV 555 and ground 552 and controlled by control signals driving redundant connection 554C connected to the base of transistor 575. Transistor 575 illustrated as a bipolar transistor may also comprise a MOSFET.

Including the LEDs, the circuit for LED drive 550A may be repeated into a grid or array pattern to cover a large area. For example, in the LED array shown in FIG. 40B a matrix of 16 LED driver circuit elements is distributed across a matrix of rigid PCBs electrically connected by flex 299. Each LED driver 550 element comprises "1-of-16" LED drive circuit elements. Such elements may identified sequentially using ordinal numbers, e.g. $1^{st}$-of-16 elements, $5^{th}$-of-16 elements, $15^{th}$-of-316 elements, or for rectilinear grid patterns by using unique $C_{r,c}$ row-column matrix numbers described previously, where $C_{1,2}$ identifies the LED drive circuit located in the circuit in the $1^{st}$ row and $2^{nd}$ column of the matrix, $C_{3,2}$ identifies the LED drive circuit located in the circuit in the $3^{rd}$ row and $2^{nd}$ column of the matrix, and $C_{4,4}$ identifies the LED driver located in the lower right corner, i.e. the circuit in the $4^{th}$ row and $4^{th}$ column of the matrix, etc. Because these LED drivers are repeated in many "instances" across the distributed system's grid, loss of any one of them does not imperil the overall system's operation. As shown, the corner PCB 302 has only two flex connections. With exception of the corner, column 1 and row 1, i.e. the entire leftmost column and topmost row, both comprise PCBs 303 each with 3 flex connections. The remainder of the LED matrix utilizes PCBs 304 with four flex connections.

Because the basic level circuit function of distributed LED requires only a limited redundancy factor of RF≥1, the signal level communication to the LED drivers does not fully utilize the available redundancy. As shown in FIG. 40B, LED signal bus 580 comprises a single line per row of PCBs, i.e. in rows 1 through 4, but only includes connections in two columns, specifically in column 1 and column 3. The resulting signal distribution delivers three LED signal bus 580 connections with RF=2 to circuit $C_{1,3}$ and to (non-corner) column 1 circuits $C_{2,1}$, $C_{3,1}$, and $C_{4,1}$ and delivers four LED signal bus connections with RF=3 to column 3 circuits $C_{2,3}$, $C_{3,3}$ and $C_{4,3}$ but only provides a RF=1 level of redundancy to the remaining circuit elements including those in the corner, i.e. circuit $C_{1,1}$, and in even numbered columns such as column 2 comprising circuits $C_{1,2}$, $C_{2,2}$, $C_{3,2}$, and $C_{4,2}$, column 4 comprising circuits $C_{1,4}$, $C_{2,4}$, $C_{3,4}$, and $C_{4,4}$ and so on In summary for the LED signal bus elements shown in FIG. 40B, aside from the first row and first column, the network comprises alternating columns of RF=1 and RF=3 with the LRF=1 and ARF≥1.63, thereby meeting the requirement of RF≥1 for a basic circuit function in a design with "good" redundancy. If the array is made larger, the first row and first column have a diminutive impact on the average redundancy factor, so in the limit ARF shall approach a value of RF=2.

To facilitate digital bus communication for controlling the LEDs, an $I^2C$ interface 514 can be included to drive LED signal bus 580 as shown in FIG. 40C. In this example bus interface is connected into the network with RF=3 but many of the elements being driven have a lower redundancy, i.e. RF=2 or RF=1, whereby LRF=1 and AVRF≥1.8 with an exact value depending on the size of the array.

The limitation of this LED drive design methodology is that the LEDs in each LED driver are restricted to the same PCB as their drive electronics, i.e. to maintain the desired level of redundancy the LEDs, current source, and transistor are constrained within the same rigid PCB. Splitting the LEDs up from one PCB and distributing them across multiple PCBs automatically degrades the redundancy. This issue is illustrated in FIG. 40D, where although they are electrically connected in series, current source 570 and LEDs 571A and 571B are located within circuit $C_{1,1}$, LEDs 571C, 571D, 571E and 571F are located within circuit $C_{1,1}$, and LEDs 571G and 571H along with transistor 575 are located within circuit $C_{3,1}$. So even through the power connections to current source 570 on PCB 302 have redundancy RF=1, the connection between the cathode of LED 571B and the anode of LED 571C in PCB 303 has only one electrical path 579A, and therefore has no redundancy, i.e. RF=0. The same problem exists for the connection between the cathode of LED 571F and the anode of 571G—a single break in the connection 579B disables conduction in all the LEDs resulting in a failure of all three circuits $C_{1,1}$, $C_{2,1}$, and $C_{3,1}$. The resulting system redundancy is LRF=0 which does not meet the "good" redundant design criteria for a basic level circuit function.

The remedy to this problem is achieved by including redundant paths for the LEDs. One such approach is shown in FIG. 40E, where in addition to series connections 579A between circuits $C_{1,1}$, and $C_{2,1}$, a second redundant connection 579C between the cathode of LED 571B and the anode of LED 571C is physically routed through circuits $C_{1,2}$ and $C_{2,2}$. Although the connection routes through the PCBs containing circuits $C_{1,2}$ and $C_{2,2}$ the conductors are not electrically connected to any other circuitry on the intermediate PCBs. Similarly, in addition to series connections 579B between circuits $C_{2,1}$ and $C_{3,1}$, a second redundant connection 579D between the cathode of LED 571F and the anode of LED 571G is physically routed through circuits $C_{2,2}$ and $C_{3,2}$. Although the connection routes through the PCBs containing circuits $C_{2,2}$ and $C_{3,2}$ the conductors are not electrically connected to any other circuitry on the intermediate PCBs. In this redundant design, the redundant routing occurs through the adjacent column, in this case to the column of PCBs located to the right of the LED string itself. While this works for a large area, it becomes problematic for the rightmost column—losing its redundancy. To meet the required level of redundancy for a system this last column cannot include active circuitry.

A superior redundant design methodology is illustrated in FIG. 40F, where in column 1 in addition to series connections 579A between circuits $C_{1,1}$ and $C_{2,1}$, a second redundant connection 579C between the cathode of LED 571B and the anode of LED 571C is physically routed through circuits $C_{1,2}$ and $C_{2,2}$, and where in column 2 in addition to series connections 579E between circuits $C_{1,2}$ and $C_{2,2}$, a second redundant connection 579G between the cathode of LED 572B and the anode of LED 572C is physically routed through circuits $C_{1,1}$ and $C_{2,1}$. Although redundant connection 579C traverses circuits $C_{1,2}$ and $C_{2,2}$ to provide redundancy to the first column LED drive circuit's connection 579A and although redundant connection 579G traverses circuits $C_{1,1}$ and $C_{2,1}$ to provide redundancy to the second column LED drive circuit's connection 579E, the redundant interconnections have no electrical interactions with the circuitry located on the PCBs through which they traverse. The same method applied to achieve redundancy between the first and second row circuitry is similarly used for the second and third rows. As such redundant connection 579D traversing but not electrically connected to circuits $C_{2,2}$ and $C_{3,2}$ provides redundancy for series LED connection 579B and similarly redundant connection 579H traversing but not electrically connected to circuits $C_{2,1}$ and $C_{3,1}$ provides redundancy for series LED connection 579F. In this manner, the LED drive circuitry maintains a redundancy of RF=1, i.e. two connection paths in every LED string, even though the LEDs are split and distributed across different PCBs. By maintaining a LFR≥1, a "good" redundancy performance level is achieved for basic level circuitry in the distributed LED drive system.

Another example of a basic level circuit function with RF≥1 is shown in FIG. 41 for a point-of-load voltage regulator 581 driving local electrical loads 582 and for local electrical energy storage 583 shown in FIG. 42. Local energy storage is beneficial to reduce the need to carry high currents across a distributed system and to avoid current spikes in the flex interconnections by supplying transient surges locally over short distances. As illustrated in FIG. 43, the energy storage device 583A may comprise a high capacitance value conventional capacitor 412H or as shown in circuit 583B may comprise a super-capacitor 584. Unlike conventional capacitors, the unique chemistry of the super capacitor requires a charging circuit 584 and small filter capacitor 412G.

Another important element used in redundant circuits is the role of rigid PCBs as circuit interconnects. Shown in FIG. 44, these interconnect links may comprise an L shape connection, including power 462, one or more signal lines 464, and ground 460 used to interconnect two flex connections. Alternatively in T-shaped link 586, the conductors connect to three flex connections, and in "+ shaped" cross-point link 587 connects four separate flex connectors making sure power 462, ground 460 and signal lines 464 connect only to their like-kind connections. In cross under 588, four flex connectors comprising two sets of circuits cross under one another without connecting, i.e. power 462A connects to two flex connector but does not electrically connect to power 462B, ground 460A connects to two flex connector but does not electrically connect to ground 460B, and signal lines 464A connects to their corresponding signal lines on two flex connector but do not electrically connect to any 464B signal lines.

Ancillary Circuit Functions

The roles of ancillary level circuit functions are primarily for providing information and for facilitating convenient use of a device.

Failure of an ancillary circuit function does not impair operation of a device.

Hierarchically Redundant Distributed Electronic System

Combining critical, important, basic and ancillary level functions in a hierarchically redundant distributed electronic system made in accordance with this invention, a 3D bendable large area or wearable device with high interconnect reliability can be realized.

An example of a hierarchical design is illustrated in FIG. 45 integrating an array of sensors 498, voltage regulator 400D, battery and charger with protected system connection 400A, local energy storage 583, sensor interface 499, signal processing DSP 430B, central control MCU 430A, and WiFi radio link 430D into a single wearable 3D bendable electronic system. System connectivity as shown comprises a single two connector PCB 302 in the corner circuit $C_{1,1}$, three connector PCBs 303 in the first row and first column circuits $C_{1,2}$, $C_{1,3}$, $C_{1,4}$, $C_{2,1}$, $C_{3,1}$, and $C_{4,1}$, and four connector PCBs 304 throughout the remainder of the system. The system can be broken into several functional levels including power distribution system shown in FIG. 46A, and signal distribution shown in FIG. 47. As shown FIG. 46A illustrates an overview of the power distribution systems comprising Circuit $C_{2,3}$—power source PSC 400A comprising a protected system connection, battery charger, and battery Circuit $C_{3,3}$—voltage regulator 400D Circuit $C_{4,1}$—local energy storage 583 comprising capacitor or super-capacitor and charger T-shaped links for circuits $C_{1,4}$, $C_{2,1}$, and $C_{4,1}$ Electrical loads for remaining circuit elements The power distribution system comprises two power buses. Specifically unregulated power bus 590 conducts power from unregulated voltage sources while power bus 592 distribute a low-voltage regulated voltage. Some systems may also distribute a high voltage bus, e.g. 40V. FIG. 46B illustrates the power distribution network for unregulated power bus 590, connecting the PSC (battery) 400A to voltage regulator 400D, both utilizing redundancy RF=3. FIG. 46C illustrates voltage regulator 400D connects to regulated voltage bus 592 using redundancy RF=3. As such the power distribution system has a redundancy of LRF=3.

The bussing of the power to various electrical loads depends on the importance of the circuit being powered. Critical electric loads in circuits $C_{3,2}$, $C_{3,4}$, and $C_{4,3}$ receive power using voltage bus 592 connections with redundancy RF=3. Voltage bus 592 delivers power to storage capacitor 583 with RF=2, and to non-critical electrical loads 591 with redundancy varying from RF=1 to RF=3. Signal distribution shown in FIG. 47 illustrates signal bus 594 connects to critical circuits DSP 430B, MCU 430A, and sensor interface 499 with redundancy RF=3, to important circuit functions such as WiFi radio 430D with redundancy RF=2, and to basic circuits such as the sensor array elements 498 with redundancy ranging from RF=1 to RF=3. A summary of the redundancy employed in this system is shown in the table below:

| Circuit Function | Circuit # | !!! Level | # of Flex Connects | Unregulated Power | Regulated Power | Signal Distribution |
|---|---|---|---|---|---|---|
| Sensor | $C_{1,1}$ | Basic | 2 | | RF = 1 | RF = 1 |
| Radio (WiFi) | $C_{1,2}$ | Important | 3 | | RF = 2 | RF = 2 |
| Sensor | $C_{1,3}$ | Basic | 3 | | RF = 2 | RF = 2 |
| T-shaped Link | $C_{1,4}$ | Basic | 3 | | (RF = 2) | (RF = 2) |
| T-shaped Link | $C_{2,1}$ | Basic | 4 | | (RF = 2) | (RF = 2) |
| Sensor | $C_{2,2}$ | Basic | 4 | | RF = 3 | RF = 3 |
| PSC (battery) | $C_{2,3}$ | Critical | 4 | RF = 3 | (RF = 3) | (RF = 3) |
| Sensor | $C_{2,4}$ | Basic | 4 | | RF = 3 | RF = 3 |
| Sensor | $C_{3,1}$ | Basic | 3 | | RF = 2 | RF = 2 |
| Sensor Interface | $C_{3,2}$ | Critical | 4 | | RF = 3 | RF = 3 |
| Sensor & Voltage Reg. | $C_{3,3}$ | Critical | 4 | RF = 3 | RF = 3 | RF = 3 |
| DSP | $C_{3,4}$ | Critical | 4 | | RF = 3 | RF = 3 |
| Local Energy Storage | $C_{4,1}$ | Important | 3 | | RF = 2 | (RF = 2) |
| Sensor | $C_{4,2}$ | Basic | 4 | | RF = 3 | RF = 3 |
| MCU | $C_{4,3}$ | Critical | 4 | | RF = 3 | RF = 3 |
| Sensor | $C_{4,4}$ | Basic | 4 | | RF = 3 | RF = 3 |

From the above table the design achieves redundancy RF≥3 for every critical function, redundancy RF≥3 for every important function, and RF≥1 for every basic function. As such the design methodology represent a "good" level of redundancy for a distributed system.

Redundant Signal Communication & Protocol

The communication protocol of signals sent among the various PCBs and circuits depends on the nature of the product or system and the operating frequency of the system. Since many applications of distributed systems involves biometric monitoring or medical applications operating at natural frequencies in the audio spectrum or slower, i.e. below 20 kHz, the required speed for communication among the circuits in a distributed system is relatively slow by electronic standards. Communication data rates in the range of several hundred kilohertz, similar to the frequencies of the $I^2L$ standardized bus protocol, are generally adequate for both analog and digital signal distribution a distributed system. Rather than the issue of speed, the main consideration unique to distributed systems is how the distributed network can impact the timing, waveform shape, and synchronization of identical signals routed across quasi-parallel, i.e. redundant signal paths. The flowing section discusses the impact of implementing electronic systems over large areas and how to address the problematic issues arising in real-world redundant physical systems. In other cases, a common clock frequency must be distributed across an entire distributed system for the purpose of synchronization. Clock reconstruction is discussed, as well in this section, but as a separate topic.

FIG. 48 illustrates an idealized distribution of an identical signal sent as three separate signals QA, Q, and 4*c* labeled as corresponding waveforms 603A, 603B, and 603C, where the signals from signal source 600 are sent to signal receiver 601 over three distinct and separate redundant interconnection paths 602A, 602B and 602C. The signal source and signal receiver shown could represent any circuitry described previously, representing either critical, important, basic, or ancillary level functions. Ideally, if the redundant paths 602A, 602B and 602C are equal in length and have identical parasitic resistance, capacitance, and inductance, the three signals received by receiver 601 will be identical to those originally sent by signal source 600. Barring the possibility of perfectly matched conduction paths, the next most ideal condition would represent the case where waveforms 602A, 602B and 602C were all delayed or distorted in precisely the same manner, so that their arrival at receiver 601 would represent a single consistent analog waveform, albeit different from the original "as sent" waveform.

Unfortunately as shown in FIG. 49, such an idealized condition is unlikely, and that each waveform may be altered in time, i.e. delayed, or changed in shape, i.e. distorted by the propagating electrical network carrying the signals. As shown original signal 603A experiences a phase shift delay resulting in waveform 603A' arriving late compared to waveform 603B' which did not experience such a delay and arrived closely matching its original waveform 603B. Even worse, waveformn 603C' as shown, suffered distortion, changing the analog content of the waveform itself, meaning the amplitude versus time changed.

As illustrated in FIG. 50A, when these three signals arrive at their destination circuit, hard wiring the three connections 602A, 602B, and 602C into a single node in junction link 601 results in a new waveform 603X comprising resulting signal $\Phi_X$ different than any one of the incoming signals and different from the original. This signal distortion represents changes in time, amplitude, and harmonic frequency content. Whether the receiving circuit is able to utilize this noisy and distorted waveform depends on what the circuit is and how sensitive it is to high frequency content, i.e. fast dynamic perturbations in signal $\Phi_X$. For example, if the receiving circuit can only react to slow changes, for example for a circuit averaging a human ECG signal (heart pulse), it may ignore the high frequency noise altogether. If the receiving circuit is capable of reacting to high frequencies, e.g. a RF modulator in a radio transmitter, the extra noise may interfere with communication, lower the radio's signal-to-noise performance, shorten its usable broadcast range, and possibly result in the emission of unwanted and even illegal electromagnetic interference (EMI).

One simple method to remove unwanted noise and distortion from signal propagation is to employ a low-pass filter as an input to any circuit as shown in Figure SOB where connection 602X carrying signal $\Phi_X$ with time domain waveform 603X has a corresponding frequency domain distribution 606X. The frequency domain harmonic content 606X is a plot of the magnitude of the signal $|\Phi_X(f)|$ at each frequency f. The graph is platted with the abscissa ranging from low frequency on the left to high frequency on the right. Although frequency domain distribution 606X has less high frequency content than it does low frequency, it still has significant high frequency elements—meaning at a lot of energy is present in trouble-making high-frequency components. Through filter circuit 605, low pass filter envelope 607, cuts the high frequency components resulting in lower frequency harmonic 606Y content shown by the graph in the upper right hand corner of the illustration. Output 602Y therefore carries an output signal $\Phi_Y$ corresponding to time domain waveform 603Y, smoother and better behaved than incoming waveform 603X.

Another problem with junction link 601 as shown, the three incoming interconnections 602A, 602B, and 602C connect together at one point, i.e. they are shorted together at a circuit's input. While such a connection is immune to open circuit failures, if anything happens to short one of the lines, the entire circuit will fail. Although this is an unlikely failure mode for flex connections, one way to provide immunity to failure from shorted signal lines is by realizing signal link 601 using an analog summing node 610 as shown in FIG. 50C. Implementation of analog summing-node 610 comprises a multiple input operational amplifier 611, in the example shown with three inverting inputs connected to inputs carrying signals $\Phi_A$, $\Phi_B$, and $\Phi_C$ connected through corresponding input resistors 612A, 612B, and 612C each having matched resistances $R_{in}$. For stability each input uses negative feedback from the output connection 602X to the op amp's negative inputs using resistors 613A, 613B and 613C respectively, all matched to the same resistance value $R_{fb}$. In this manner the signal are added, i.e. averaged, and if one signal fails open or short, it doesn't prevent the amplifier from recreating the signal to support normal circuit operation.

Another method to avoid phase delay issues with redundant circuit connections is by using only one of the incoming signals as selected using a analog multiplexer 615 or "mux" as shown in FIG. 50D. As shown, analog multiplexer 615 comprises a three-in one-out analog multiplexer or "SP3T" electronic switch. SP3T is a switch naming convention meaning a "single-pole triple-throw" switch—one where a single connection can be routed to one of three switch positions, in this case selecting one of the signals $\Phi_A$, $\Phi_B$, and $\Phi_C$ on inputs 602A, 602B or 602C and routing it to its output 602X, i.e. producing signal output $\Phi_X$. The key issue is how can link 601 know which switch to select.

This problem is solved by the function of activity monitor circuit 616, an electronic circuit that detects two or more inputs with time varying signals on then, i.e. "active inputs". Activity monitor 616 then selects one of those inputs as the output of link 601 by selecting the switch position of analog multiplexer 615 using mux control signal 617. In most cases a broken flex connection will result in one input to link 615 showing no activity, in which case either of the other two may be selected. If, in the unlikely case, two flex circuits are damaged and two input, e.g. 602A and 602B are both dead, then only input 602C shows activity and it will be selected. In the absence of any activity on any input the multiplexer retains its last selection. The risk of no-activity can be overcome by instructing the sending circuit to occasionally send out a ping message just to let the system know it is still alive and the connection is still intact and operational.

FIG. 50E illustrates another means to filter noisy input signals resulting from hard-wired connections of multiple redundant inputs. As shown link 601 employs a sample and hold circuit 620 to take an analog sample of the mixed signal $\Phi_X$ at a regular interval set by clock 607 having a frequency φ significantly higher than that of signal $\Phi_X$, i.e. where $(\Phi >> \Phi_X$. The resulting output signal $\Phi_X$ of sample and hold circuit 620 comprises a series of analog voltage stair steps 603Z approximately following the shape original mixed waveform 603X. By employing a fixed clock frequency φ, the variable frequency noise content in waveform 603X is replaced by a known frequency noise corresponding to clock 607. Because the noise is a defined fixed frequency, it is simple for filter 605 to remove it resulting in a smooth well behave output waveform 603Y representing the reconstructed signal by $\Phi_Y$.

Managing phase delay in digital signal communication in a distributed system is significantly easier than processing analog signals. As shown in FIG. 51A, the primary effect of sending digital pulses over redundant paths is any propagation delay results in a phase shift of the signals where waveforms 623A, 623B and 623C in this case representing digital signals $\Phi_A$, $\Phi_B$, and $\Phi_C$ are shifted slightly in time, i.e. where waveform 623B starts and ends slightly later than waveform 623A, and where waveform 623C starts and ends slightly later than waveform 623C. For example, after a time $t_{sig}$, the on time of the first incoming signal, the logic gate driving signal line 602A switches to a low state, i.e. to logic "0". Meanwhile, the logic gate driving signal line 603A is still trying to drive the signal to a high state, i.e. to logic "1". Since two logic gates cannot drive the same line to two different logic states concurrently, a wired OR logic connection is not possible.

To prevent contention among the logic gates, Boolean logical "OR" gate 621 is introduced to logically sum the three logic input signals $\Phi_A$, $\Phi_B$, and $\Phi_C$ representing redundant digital connections. The OR gate results in output 602W producing a logical "1" state when one, or more than one, of its inputs are high, i.e. $\Phi_W=\{(\Phi_A+\Phi_B+\Phi_C\}$. The resulting waveform 623W transitions to a high state concurrent to the first incoming waveform 623A but does not drop to logic low after a time 624A of duration $t_{sig}$. Instead, the output remains at logic "high" for an additional time 624B of duration Δt until all the inputs to OR gate 621 drop to their low state. The result is the width of pulse 623W is longer in duration than the incoming pulses, otherwise the signal and digital data content of the redundant communication is preserved.

FIG. 51B illustrates that if a fixed duration on time is required, the output of OR gate 621 can be fed into the input to logical AND gate 625. Clock or timer 607 feeds the second input to AND-gate 625, commences counting only upon trigger 626, representing a state change in the output of OR gate 621. During the time that both the output of OR gate 621 and the output of clock or timer 607 are high, the output 623Q of AND gate 625 remains high. After a set duration, e.g. after a duration $t_{sig}$, the output of clock or timer 607 goes low and so too does the output of logic gate 625, resulting in output waveform 623Q of fixed duration.

Redundant Clock Communication & Protocol

In a manner similar to processing a set of redundant incoming signals to avoid analog distortion and digital data contention, the distribution and processing of clock signals in a redundant system requires selecting the best available clock signal to synchronize any given circuit. Rather than analyzing multiple clock signals to reconstitute clock signals and identify the best, source in accordance with this disclosure two specific methods are recommended to achieve the highest level of clock consistency in a redundant electronic system. These two methods are as a follows:

In the case of clocked serial bus communication such as $I^2C$, the shift register used for loading data should utilize the clock signal present on the same flex interconnect as its associated data bus. In other words, the clock signal paired with a specific serial data bus should be used for clocking the data during a data bus read operation since this signal matches the data bus in propagation delay.

For system clock synchronization, the first clock signal to arrive at the clock inputs to a given circuit and PCB should be used for system synchronization. Delayed clock signals arriving on other clock input lines within the same clock cycle should be ignored until the next cycle commences.

One means to ignore the late arriving signals is shown in the redundant clock generator circuit shown in FIG. 52 where incoming clock signals $\varphi_1$, $\varphi_2$, and $\varphi_3$ on buses 630A, 630B and 630C are combined by Boolean logic OR gate 636 to produce a single waveform 639 of varying duration in a manner similar to that shown in FIG. 51A. To produce a consistent clock signal the leading edge of the pulse triggers a one shot 637, a circuit that, one triggered, produces a digital pulse 640 of a predefined duration and ignores any additional inputs for a defined period, i.e. it doesn't retrigger while its in its logical high output state. In this manner a clean clock pulse used for driving a circuit is derived from multiple redundant signals. The resulting clock signal will be of the same duration even in different circuits 635A, 635B, and 635C, but the leading clock edge for pulses 641A, 641B, and 641C will occur at different times based on how far away the particular circuit is from the clock source. In this way a circuit's clock coincides with its signals and functions locally even that occurs at a later time on the trailing edge of a distributed system PCB than it does at the source, operating in a manner similar to the function of time zones—to manage information locally.

Redundant Serial Bus Communication & Protocol

Another method to facilitate communication across a distributed system is through the use of a serial bus. Unlike analog and digital data that are sequenced in time against a system clock and delivered to every circuit, even to circuits not requiring access to the data, data packets sent over a serial bus can contain important information needed to instruct a receiving circuit whether to process an incoming packet or ignore it, whether or not the information relates to a specific type of circuit function, e.g. sensor data, and whether two incoming packets have identical senders and content, i.e. whether the packets represent unique or redundant information. Time information can also be used to insure the proper sequencing of packets.

As shown in the example network of FIG. 53A, data bus communication involves two distinct functions, reading or receiving incoming packets from the bus, and writing or sending data onto the bus. These serial buses can realize point-to-point communication between only two devices, such as USB, or can be used attached onto a shared common bus. While the data bus, e.g. bus data 640A, is often graphically represented as a single line or wire, in reality it commonly may comprise from 1 to 7 distinct lines plus an optional separate clock line.

Electrically, a serial bus may comprise a single set of signals sent concurrently to every device in the network or system, or may alternatively be sent in point-to-point communication between only two circuits, then replicated and sent on to other devices in the serial network. Operating as a receiver, in the case of a shared electrical bus, one function of the serial interface circuitry is to receive every incoming message or data packet, temporarily store it, decide whether or not it is one of the intended recipients of the data packet, and then either pass the packet's data content on to the local circuit in the same PCB for use, or otherwise to discard it—in other words, to first accept the message then decide if it should be used on not. Since the data packet being received has already been sent to every network connected circuit anyway, each receiving bus transceiver has no responsibility in forwarding the message on across the serial bus.

In point-to-point serial communication each circuit receiving a packet carries the responsibility to forward identical copies of the received data packets on to its neighbors in the data network, and concurrently to decide if the received data is also intended for use in its particular circuit. In such instances, there is not common electrical connection or conductor shared by multiple circuits. Instead each transceiver electrically operates both as a receiver and a signal repeater, whereby message forwarding occurs irrespective of whether the received data packet is intended for use by the particular circuit and PCB or not.

So regardless of whether the serial bus is electrically connected to every device by shared connections to a common set of conductors, i.e. the physical bus layer or otherwise, the interconnected devices still operate as though they all share a common serial data bus and interconnectivity. The principle of a data bus operating as a unified data link without actually sharing common electrical connections can best be understood by considering the 7-layer OSI model (https://en.wikipedia.org/wiki/OSI_model). In this model, the physical or Pill "Layer 1" for a network comprises the electrical or hardware connection between devices while the "Layer 2" data, i.e. the data link layer, determines whether a device recognizes itself as part of a network. The circuit schematic representation of serial communication for Layer 1 and Layer 2 may be identical or may be differ.

For example in a serial bus comprising a shared electrical connection to every network connected circuit, serial bus 640A represents both a physical Layer 1 and a data-link Layer 2 equivalent circuit. In the case where a serial bus is realized using repeaters and point-to-point communication, however, serial bus 640A illustrates only the data link layer but not the underlying electrical network. This "virtual connection" is analogous to placing a phone call over a global network. While the user experiences a single continuous connection exclusively between callers, the actual routing of signals is not continuous not does it follow any one defined electrical path. Because the data moves across the network at a high data rate compared to the real time data being transferred, in this case sound, the serial bus appears to the user as a direct unbroken connection between sender and receiver even though the data is sent in interrupted bursts of data over multiple paths.

Ignoring the subtleties of Layer 1 electrical connections, as a data link connection, serial buses carry information arranged in serial data packets sent sequentially over data bus 640A. The bus data may include content, i.e. the information being conveyed across the distributed system. Such content may comprise digital "words" representing data, instructions, or code, or may comprise a digital representation of an analog signal or waveform, i.e. digitized analog data, including sound, EEG waveforms, ECG waveforms, frequency distributions output from a DSP performing fast Fourier transforms (FFT) or other mathematical operations on real-time sensor data. The bus data may also include routing and other command and control functions, e.g. an ACK message acknowledging a message has been received. Some, but not all, serial communication buses include a separate dedicated serial clock signal, bus clock 641A, a clock signal used to clock data into and out-of shift registers. The data bus clock may be completely distinct from any system clock or derived from the system clock as its reference time base.

Some serial buses also employ a master-slave architecture where one specific circuit is control of managing the serial bus communication while in others the relationship among parties is peer-to-peer with the first to transmit taking control of the bus until they it is released for other "callers" to send data. FIG. 53A illustrates an example of a master-slave serial architecture where serial bus transceiver 660A illustrates an exemplary master serial bus controller comprising master transmit 663A, master receive 664A, and handshaking 662 functions. In contrast serial bus transceivers 660B and 660C illustrate slave serial bus controllers comprising slave transmit 663B and 663C, slave receive 664B and 664C, and handshaking 662 functions. In such architectures, master transceiver 660A controls serial communication, and provides operating instructions to circuits connected to slave transceivers 660B, 660C and others (not shown). The slave devices, in turn, can send responses delivering measurement or status data back to the controller.

Serial bus communication protocol avoids the issue of multiple circuits trying to send information across a shared bus simultaneously, a condition known as "bus contention". The means by which serial data bus communication avoids bus contention is known as "handshaking", a protocol specific communication negotiated among devices attached to the serial bus comprising a hardware or firmware implementation represented schematically as "handshaking" 662.

Numerous serial communication technologies exist, each with their own specific algorithms and communication protocols. Various PHY (Layer 1) implementations of a serial bus comprising a common electrical connection exist, including $I^2C$, SMB, and $AS^2CBus$. Point-to-point serial bus protocols comprising PHY (Layer 1) implementations of a serial bus requiring hubs or repeaters to propagate the serial data messages across the network include SCSI, Ethernet, IEEE1394 (Firewire), MIDI, and USB. In general, "hubless" inter-circuit communication throughout a distributed system using common electrical connections such as $I^2C$ involve less overhead and lower cost than more complex point-to-point serial bus serial communication methods. As a communication method, serial bus communication including the aforementioned international standard protocols, are well known to those skilled in the art. As such, basic serial bus operation will not be elaborated further here except as it relates to adapting serial bus operation in reliably executing communication in a distributed system with redundant interconnectivity.

Whether realized by shared-bus or point-to-point PHY (Layer 1) implementations, the adaptation of serial communication in distributed electronics with redundant communication poses a number of challenges unique to redundant communication. The serial bus interface implementations shown here below are intended to demonstrate, by example and without limitation, the adaptation of serial communication in redundant communication methods and protocols. In particular, upon receiving multiple data packets and before knowing whether to utilize or ignore incoming data, a receiving bus interface must interpret and resolve the following questions regarding incoming data packets, i.e. incoming messages, namely:

- Do the incoming messages received represent distinct and unique data packets from multiple senders or did they emanate from a common sender?
- If sent from a common sender, do the incoming messages represent unique messages sequentially sent at different times, or are any small differences in the send time attributable to delays in data serialization?
- Allowing for serial communication delays, if the messages were sent concurrently from the same sender, i.e. if the incoming messages represent redundant data packets, what packet should be chosen for use by the receiving circuit?

Addressing these questions dynamically as data arrives in any given circuit is important to achieve reliable operation of a distributed system with redundant interconnections. Since multiple messages may arrive at a given circuit's redundant bus inputs concurrently or overlapping in time and without warning, multiplexing a single serial interface circuit to capture the incoming messages including both address and data content is not possible. During multiplexing, incoming data on a given circuit's inputs will easily be missed and lost. Instead, each serial interface transceiver must be prepared to receive multiple incoming messages in their entirety "simultaneously", even before it has time to interpret what to do with the data.

One method to accomplish this task is to include a separate serial bus transceiver for each serial bus connection on a given circuit and rigid PCB. Such an approach, requiring from two to eight serial interfaces per PCB can be costly both in board real estate and in its build-of-material production expense, i.e. high BOM costs. Rather than implementing numerous unique serial interfaces on every circuit and PCB in a distributed system, a more efficient method involves employing a buffer to capture the incoming data in real time, shared with a single multiplexed serial interface to analyze and interpret the data. In this manner the buffer, implemented as part of a redundant bus interface capture the data no matter when and how quickly it arrives, and the serial interface circuit has time to analyze it and decide a course of action before new messages arrive.

The use of a redundant serial interface is shown in FIG. 53B where three conventional serial data buses 640A, 640B, and 640C are combined with corresponding redundant bus interfaces 665A, 665B, and 665C to realize multiple redundant communication circuits 669A, 669B and 669C. As shown each redundant bus interface, e.g. redundant bus interface 669B, is able to directly connect to multiple serial data buses 640A, 640B, and 640C and their corresponding serial bus clocks 641A, 641B and 641C, capturing messages as it arrives, operating independently as to when serial interface circuit 660B interprets the incoming data packets sent by serial interface circuit 669A.

One implementation of the redundant bus interface 665 is shown in FIG. 54A where data arriving on serial data bus 640A is copied, i.e. clocked by bus clock 641A into shift register and RAM storage first of "address buffer A" 643A, then of "read data buffer A" 644A. Approximately at the same time data arriving on serial data bus 640B is copied, i.e. clocked by bus clock 641B into shift register and RAM storage first of "address buffer B" 643B, then of "read data buffer B" 644B and likewise data arriving on serial data bus 640C is copied, i.e. clocked by bus clock 641C into shift register and RAM storage first of "address buffer C" 643C, then of "read data buffer C" 644C. Each read data buffers 644A, 644B, and 644C are then checked for parity and checksum errors. Corrupted data is removed from memory 645. Magnitude comparators then compare each bit in the addresses loaded into the address buffers 643A, 643B, and 643C against a predefined circuit ID# 647, and determine if the address match, i.e. if this circuit was intended to receive the message, or not. The decisions of the magnitude comparators are then fed into "data control" 648, identifying any or all messages intended for this address.

After determining the messages intended for this particular circuit as a target destination, data control 648 checks the data content in memory 645 comprising read buffers 644A, 644B and 644C to determine if they have the same send time, i.e. are they redundant. If the messages are confirmed to be redundant, data control 648 selects the oldest data packet and loads the data into data register 649 where it is passed to the circuitry on the local PCB.

As shown in FIG. 54B, writing data onto a redundant serial bus involves transferring data into data register 653 under control of data control 648. The data loaded includes the destination address of the packet and its content. This data is merged with circuit ID# 647 data, i.e. the source address of the data packet to be transmitted, along the time 650, the time data transmit "write" packet was created. Once prepared, the data is loaded into serial address buffer 652 and write data buffer 653 in preparation for being transmitted onto the serial buses. As controlled by clock 651, serial bus interface 651A transmits the write data onto serial bus 640A, serial bus interface 651B transmits the write data onto serial bus 640B, and serial bus interface 651C transmits the write data onto serial bus 640C. In this way the data content and two redundant copies are transmitted on the serial bus to other circuits in the distributed system.

One possible data format for a redundant serial data packet is shown in FIG. 54C identifying the destination address 670 of the data packet, the source address 671 of the circuit used to generate the data packet, the time the data packet was created 672, and the data packet's content 674, i.e. its payload. In the OSI model, the addresses may be considered as media access control or MAC addresses corresponding to OSI Layer 2, the link layer. Instance# 673 is an optional field used to tag redundant data packets. Instance#=0 is the first instance of the data, instance#=1 is the $1^{st}$ redundant copy of the same packet, instance#=2 is the $2^{nd}$ redundant copy of the same packet, etc.

When a redundant bus interface receives a new data packet, the interface can filter incoming packets from a given data source to identify redundancy using data from the field containing time 672, instance#673, or other unique packet data embedded in payload 574. In this manner redundant packets can be employed reliably to insure redundancy in the command and control of a distributed system, offering an added degree of redundancy beyond that of redundant electrical interconnects.

Redundant Mechanical Design

The mechanical design of a distributed electronic system made in accordance with this invention must fulfill a number of design objectives, namely:

- Covering the desired area needed for distributing components including sensors, LEDs, or other energy emitting devices.
- Offering sufficient area to integrate control circuitry and power to the system.
- Provide redundant power and signal distribution throughout the system.
- Facilitating a 3D bendable printed circuit or other flexible substrate able to conform to any desired shape available, especially in cases of wearables and medical devices where the system must flexibly and snugly conform to the shape of the body or body parts of a human or animal.
- Avoiding breakage or mechanical failure of electrical connections of board mounted components during repeated cycles of flexing, including preventing solder cracking, trace lifting, broken traces, lead breakage, solder ball cracking, and components falling off a PCB, achieved in part by minimizing stress and deformation of the printed circuit board to which semiconductors and other components are mounted.
- Facilitating flex connections able to survive tens of thousands of flexing cycles without fail, including avoiding flex breakage, tearing of the flex, and ripping of the flex-to-rigid PCB interface.
- Preventing water, sweat, blood, or chemical damage to components and PCB traces, including without limitation suppressing the likelihood of moisture induced electrical shorts, corrosion, filament formation, salt and ionic compound shorts.

In a manner similar to the electrical redundancy described previously, mechanical redundancy involves designing a redundant array to minimize the risk of mechanical damage to the rigid-flex PCB. The mechanical strength of a rigid PCB in a redundant distributed system depends on the location of the rigid PCB in the matrix and the number of its associated connections. One way to gauge the strength of redundant mechanical design is to categorize each flex connector by its unsupported degrees of freedom or DOF. For example as shown FIG. 55A for corner PCB 702, one degree of freedom comprises x-direction stress 770X, which can result in tear stress 701X in flex 299. Tear stress is a special type of bending stress wherein along a given direction line (in the plane of the material subjected to the tear stress), one side of the line is being pulled upward in a direction orthogonal to the material, and on the other side of the line dividing the same material is being pulled downward, i.e. perpendicular to the material in the opposite direction to the upward force. So a tear force is actually two bending forces, one upward and another downward applying force along a line separating the two regions. Intuitively, tear force can be understood by considering the ripping of a piece of paper, or in geology as slip displacement along an earthquake fault line separating to geographic (tectonic) plates.

A second degree of freedom comprises y-direction stress 770Y, which can result in tear stress 701Y in flex 299. A third direction of stress 700W on corner PCB 302 support comprises diagonally oriented motion, resulting in additional torque on tear stress 701X and 701Y. For this reason, corner PCB is described as DOF=2+, meaning it exhibits damage risk in the x, y, and diagonal orientations. The strength of corner PCB 702 can be improved by adding diagonal 299B to the corner resulting in corner PCB 703A shown in FIG. 55B. The addition of diagonal flex 299B stretches the x-direction stress 700X dividing tear stress 701X across two flex connectors as similarly y-direction stress 700Y lowering tear stress 701Y. To clarify, although the line along which a tear occurs or is likely to occur may casually be referred to as the direction of the tear or tear force, the actually force exerted during the tearing of a material, in this case the flex PCB layer, in perpendicular to the sheet of the material being torn.

For non-corner edge PCBs, three connector PCB 703B shown in FIG. 56A experiences stress 770Y primarily only in the y-direction, resulting in a DOF=1. While bending force may be exerted in both directions, an array of flex interconnected rigid PCBs provides mechanical support to the structure, distributing the force across a large area and making any center element impossible to tear. This property is similar to a sheet of plastic or Christmas wrapping paper where tears never originate in the center but instead always start from an edge and then propagate across the sheet. In such a process, the propagation of the tear converts center portions into edges, i.e. material adjacent to the tear act as edges and cannot resist the tearing force as well as center portions before the tear commenced and propagated from the edge or corner.

In short, for the range of forces incurred during normal use of a 3D pad, tearing forces can rip only vertical edges, horizontal edges, or corners of the flex material in a rigid-flex PCB. As such, horizontally oriented T-shaped rigid-flex PCB elements can only be ripped vertically, vertically oriented T-shaped rigid-flex PCB elements can only be ripped horizontally, and corner pieces are subject to tearing along both axes, i.e. two degrees of freedom. Corner pieces may be reinforced by adding a diagonal oriented flex connection for extra support, but the corner is still subject to tearing in both x and y orientations. As such edge pieces have 1 DOF, but the corners unavoidably are subject to 2 DOF. Internal pieces, those with + shaped connections (or more), are not subject to any degrees of freedom because the mess holds everything together, i.e. DOF=0.

As shown in FIG. 56B, the strength of edge PCBs can be improved by adding diagonals 299B, whereby 5-connection PCB 705 reduces the y-direction stress 701Y reducing tear stress 701Y by spreading the force across flex 299 and 299B. FIG. 57 illustrates two designs for internal PCBs with zero degrees-of-freedom, i.e. DOF=0, meaning there is no tearing force as exist in corner and edge PCBs. Despite the lack of tear stress, the mechanical strength of a distributed network with eight-connection PCB 708 is still greater than four-connection PCB 704.

A graph of the overall damage resistance of a distributed system is shown in FIG. 58 for various redundant designs. For corner elements with DOF=2+, three connector PCB 703A is stronger than two-connector PCB 703A but weaker than DOF=1 edge PCB designs comprising three-connector PCB 703B and a superior strength design five-connector PCB 705. Without any tear risks, internal PCBs are superior to DOF=1 and DOF=0, ranked in increasing strength as four-connector PCB 704, six-connector PCB 706, and eight-connector PCB 708.

FIG. 59 illustrates the elements of overall damage resistance strength versus flexural strength, where the flexural or bending strength ranges from rigid and inflexible to easily bendable. A graph of tearing resistance 691 illustrates high tearing resistance at low flexural strength, meaning a more rigid flex connector is less likely to tear. At high flexural strength, meaning using a highly bendable flex connector, the tearing resistance drops substantially. Conversely, a curve of flexural-strength versus flex-cracking resistance 692, i.e. resistance against breakage of a flex connection, illustrates that a more rigid (less bendable) flex connector is more susceptible to cracking failures. The overall curve of damage resistance strength 693 versus flexural strength illustrates a tradeoff of two competing mechanisms, where the optimum strength occurs at moderate levels of flexibility, no too bendable and not too rigid.

Redundant Geometric Designs

The design of FIG. 60A illustrates square rigid PCBs on a square grid design 750 comprising rectilinear combination of corner, edge, and inside PCBs 702, 703, and 704. Based on square PCBs arranged on a square grid pattern, design 750 is useful for square, rectangular, and belt-shaped applications. The rigid PCBs are interconnected by flex 299 interconnects oriented on a rectilinear grid.

An alternative geometric design 760 also shown in FIG. 60A comprises hexagonal shaped rigid PCBs arranged on a hexagonal grid including corner PCB 713A, horizontal edge PCBs 713B and 715A, vertical edge PCBs 714, and inside PCBs 716. Based on hexagonal PCBs on a hexagonal grid pattern, design 760 is useful for curved, round, cupped, and irregularly shaped surfaces. The rigid PCBs are interconnected by flex 299 interconnects oriented vertically on a rectilinear grid and horizontally using diagonal 299B interconnects.

FIG. 60B illustrates variations of square rigid PCBs on a square grid design 751 comprise corner three-flex-connected PCB 703A, four flex-connected edge PCBs 704A and internal PCBs 706B with six flex connections. This design offers a greater mechanical strength for corner PCB 703A than that of design 750 shown previously as well as improving the mechanical strength of the edge PCBs from three to four flex connectors. Internal PCB strength improves from four to a robust six flex connector design. A slight variation of PCB design 751 is shown in PCB design 752 on the right side illustration where a single x-shaped connection 299X is added to the upper left corner of the matrix, otherwise the PCB utilizes a homogeneous pattern of connectors 299 on a square grid with diagonal connectors 299B.

FIG. 60C illustrates two variations on a basket-weave pattern offering superior mechanical support throughout. The basket weave pattern comprises flex connectors 299 arranged in a square or rectangular grid and diagonal flex connectors 299B oriented on both ascending and descending diagonals. As such corner PCB 703A, edge PCBs 705A, and internal PCBs 708 exhibit mechanical support from 3, 5, and 8 flex connectors respectively. In basket weave PCB design 753 the rigid PCBs are square, while in basket weave PCB design 754, they are rectangular.

FIG. 60D illustrates that the size of the rigid PCBs need not be uniform throughout the PCB matrix so long the size of the PCBs surrounding a enlarged PCB is compensated by the addition of smaller PCBs surrounding it. For example, in design 755 on the left, internal PCB 724Y is made larger than PCB 704 shown in FIG. 60A. To accommodate the greater area consumer by this enlarged element, PCBs 722, 723, and 724 are reduced in size proportionately in comparison to a uniform PCB.

The right side illustration in FIG. 60D illustrates another PCB design 756 using non-uniformly sized PCBs. In this design, despite the addition of large area PCB 734Z, the size of the surrounding PCBs not being reduced, the issue of the PCBs being too close in the corners and impeding bending can be avoided by "clipping" corners increasing the corner to corner spacing and eliminating the sharp edges of the rigid PCB. By eliminating the sharp edges, the design also reduces the risk the PCB design 756 may penetrate and damage any silicone or flexible plastic enclosure in which it is assembled during bending and normal use. In the design methodology, enlarged PCB 734Z with four flex connectors has all four corners clipped and therefore comprises an irregular octagonal. Three and four flex connected PCBs 733 and 734 facing enlarged PCB 734Z as shown have two corners clipped forming an irregular hexagonal while two, three and four flex connected PCBs 732A, 733A, and 734A have only one clipped corner thereby comprising an irregular pentagram.

Design 757 shown in FIG. 60E illustrates that more than one instance of enlarged corner clipped PCB 734Z can be included in the design, shown by example located on a diagonal. Using this method more PCBs become available for integrating control circuitry while smaller sized uniformly distributed PCB elements are well suited for sensors, LEDs, or other energy emitting devices. In design 758, the addition of narrow flex connector 299X oriented on the PCB matrix's diagonal, not only provides added mechanical support, but an opportunity for electrical redundancy of the power distribution circuit.

In all the aforementioned geometric PCB designs it should be understood that the word "PCB" has multiple meanings depending on the context of its use. Firstly, the entire matrix including both the rigid PCB portions and the flex PCB interconnections merged into the rigid PCB elements comprises one single heterogeneous printed circuit board, i.e. a rigid flex PCB. In other discussions, the term PCB is used to refer to only the rigid portions of the heterogeneous rigid-flex PCB and not to the entire matrix. In a similar context, the term "flex" or "flex connector" is meant to refer to those portions of the heterogeneous PCB that are not rigid. Therefore, without ambiguity the term PCB refers either to the entire heterogeneous rigid-flex PCB or to the rigid PCB portions thereof depending on the context of the discussion.

Another important point in the mechanical design of the distributed PCB as disclosed herein, is the fact that the term rigid PCB is not restricted to the prior art definition of a rigid PCB as a stiff board comprising FR4, glass, or phenolic material, but may included any PCB material more rigid and "less flexible" than the flex portions of the PCB. For example, rather than using glass or phenolic material, the rigid portion of the rigid-flex PCB may comprise regions with thicker layers of polyimide or of polyimide comprising a chemical composition offering reduced flexibility and bending than that used in the flex portions of the PCB. Such interpretations of a rigid-flex to mean a PCB with flexible and less flexible islands intermixed is introduced herein as a "quasi-rigid-flex" PCB or QRF PCB. Fabrication of rigid-flex and newly disclosed QRF PCBs is discussed later in this disclosure and will not be elaborated upon further here.

PCB Construction

Aside from a plan view of its geometric design, the mechanical construction of a distributed PCB with redundant interconnects can be illustrated by cross sectional images of the PCB in various locations or "cut lines", the specific path a particular cross section illustrates. One example is shown in FIG. 61 illustrates a rigid-flex PCB with unprotected copper interconnections. As shown, the flex PCB comprises insulating layer 801A sandwiched by metal layers 802A and 802B typically comprising patterned copper. In some portions of the cross section shown and in other portions (not shown in this specific cross section), this flex PCB is sandwiched into the middle of a rigid PCB comprising insulating layers 805A and 805B and laminated with patterned metal layers 806A and 806B. In general, flex PCB metal layers 802A and 802B are thinner than rigid PCB metal layers 806A and 806B. The specific cross section of metal layers 802A, 802B, and 806A illustrates a continuous metal stripe while metal layer 806B is shown patterned. The exact pattern of each layer in a cross section depends on the location of the cut line.

One limitation of the design as shown is the exposure of all the copper layers to the risk of moisture and corrosion. Provided the entire system including the PCB and all components mounted on it are enclosed in a coating, e.g. plastic, silicone, polymeric coatings, etc., then protection of the metal layers is unnecessary. If however, environmental risks to moisture, chemicals, salt, sweat, and other fluids exist, then the metal layers need to be coated or encapsulated by another protective layer of electrically insulating material. A protected version of a similar rigid-flex PCB is illustrated in FIG. 62 where insulator 801B protects metal layer 802A and insulator 801C protects metal layer 802B completely sealing the flex PCB from moisture and the risk of mechanically induced scratches. In the rigid portion of the PCB, insulating layer 807B as shown protects metal layer 806B but insulating layer 807A protects only a portion of metal layer 806A. Some portions of metal layer 806A remain unprotected as depicted by opening 809. These openings are unavoidably required for soldering components onto the rigid portion of the rigid-flex PCB.

In the disclosed system, the electrical interconnection of the various metal layers within a given rigid PCB, between rigid PCBs, and within flex PCB's can be accomplished without the need for wires, connectors or solder joints, using conductive vias. These conductive vias comprise conductive columns of metal or other low resistance materials formed perpendicular to the various metal layers and may penetrate two or more metal layers to facilitate multilevel connectivity and non-planar electrical topologies, i.e. circuits where conductors must cross one other without becoming electrically shorted. For example, FIG. 63 illustrates one possible cross section of a flex PCB where conductive traces comprising metal layers 802A and 802B are shorted by vertically oriented conductive via 811A. Depending on its fabrication process, conductive via 811A may comprise, copper, solder, solder paste, conductive epoxy, or other metallic or electrically conductive compounds. The various fabrication processes capable of manufacturing such a structure will be described later in this application.

In many cases one conductor must cross another without electrically shorting the two traces together. These "cross-under" connections require a minimum of two metal layers in order to facilitate the cross under. FIG. 64 illustrates a cross section of a cross-under realized in a flex PCB or in the flex PCB portion of a rigid-flex PCB. As shown, for +V connected conductive trace 822A to bypass GND connected conductive trace 821F it must connect to lower metal layer 802B through conductive via 811A, pass under GND connected conductive trace 821F, then return to the upper metal layer 822A through a second conductive via 811A. For patterned portions of metal layers 802A and 802B where the metal is removed, another insulating material, i.e. insulator 803A and 8038 are added to maintain planarity of the sandwich layers.

An example of the use of multiple cross-under connections is illustrated in FIG. 65A where T-shaped link in a flex PCB where +V connection comprising conductive trace 821A connects to conductive trace 822A through cross-under 823A, physically passing beneath but remaining electrically isolated from conductive traces 821B through 821F. The connection electrical connection from cross-under 823A to conductive traces 822A and 821 occurs through conductive vias 824. For power connections such as +V, GND, +HV, etc., the use of more than one via per vertical interconnection is recommended to insure low contact resistance, minimize via-induced voltage drops, and to limit the via's current density to avoid electromigration failures. In a similar manner, signal bussing over conductive traces 821B, 821C, 821D, and 821E connects to corresponding conductive traces 822B, 822C, 822D, and 822E through respective cross-unders 823B, 823C, 823D, and 823E, physically passing beneath numerous unrelated conductive traces without any electrical connections. In the T-shaped link shown, GND biased conductive traces 821F and 822F are interconnected directly with no need for a cross-under connection. FIG. 23B illustrates one example of the use a T-shaped link 295 realized in flex 300 in a redundant electrical topology.

This use of cross-under connections in a T-shaped flex PCB link can be extended to a + shaped link in a manner illustrated by FIG. 65B, where +V power distribution over conductive traces 822A and 821A are connected through cross under 823A, GND power distribution over conductive traces 822F and 821F are connected through cross under 823F, and signal distribution over conductive traces 822B, 822C, 822D, and 822E and 821F to corresponding conductive traces 821B, 821C, 821D, and 821E is facilitated through cross-unders 823B, 823C, 823D, and 823E respectively. Power distribution connections employ two or more conductive vias 824 per link while signal connections generally require only one via per link. FIG. 22C illustrates one example of the use a "+ shaped" link 296 realized in flex 300 in a redundant electrical topology.

Redundant interconnection methods can also be applied to flex PCB cross-under with no electrical links. For example in FIG. 65C, electrical traces 822A through 822F cross under electrical traces 821A through 82 IF using corresponding cross-unders 823A through 823F with no connection between the two sets of conductive traces. The cross-under methods shown can be adapted to rigid PCBs as well, and become especially versatile when adapted to the rigid PCB portions of a rigid-flex PCB as implemented in this disclosure. As shown in FIG. 66A, a cross section of the rigid portion of a rigid-flex PCB can employ a through via 831 connecting all four metal layers 806A, 802A, 802B, and 806B together. Alternatively, partial vias may be used to connect two or three metal layers without shorting all the layers together. For example, in the cross section of FIG. 66B, partial via 832 connects metal layer 806A to metal layer 802A, buried via 833 connects metal layer 802A to metal layer 802B, partial via 834 connects metal layer 806B to metal layer 802B, and tri-layer via 835 connects metal layer 806B to both metal layers 802B and 802A.

An example of the use of cross-unders in rigid PCBs is shown in the power and signal distribution bus of FIG. 67. The bus, in this case a parallel collection of top-layer metal traces 821A through 821F circumscribe rigid PCB 828 facilitating connections to two or more flex 820 connections. In the example shown, the bus connects to a second set of metal traces 822A to 822F. Although the connections 821A through 821F constitute continuous metal traces spanning flex 820 onto rigid PCB 828, of opposing metal traces 822A through 822F only metal trace 822F connects directly to 821F, the outer most metal trace. The remaining metal traces 821A to 821E interconnect to metal traces 822A to 822E through corresponding cross-unders 822A to 822E. Such single layer parallel metal traces consume a large amount of PCB real estate.

To save space, the traces can be stacked as shown in the top view and side view illustrations of FIG. 68 where trace 841D comprises metal layer 806A, trace 841C comprises buried metal layer 802A connected through conductive via 832, trace 841B comprises buried metal layer 802B connected through conductive via 836, and trace 841A comprises bottom-side metal layer 807B connected through conductive via 831.

Additional layers can be added to provide support to flex connectors. For example, FIG. 69A shows a three conductive layer flex material at the cross section A-A' of FIG. 69B, including metal layers 802A, 802B, and 802C, surrounded by insulating layers 801A, 801B, and 801C, and 801D. As shown in the plan view of FIG. 69B, metal layer 802C is a patterned so as to form a metallic mesh 852 and thereby provide additional mechanical support to the interface between flex 851 to rigid PCB 850. To increase its strength and flexibility, the mechanical support layer 802C comprises a metallic mesh 852 (or alternatively, a basket-weave pattern) with a solid metal rail at its outer periphery.

Metal layer 802C may be fabricated in the same manner as any other metal layer. As shown in FIGS. 698 and 69C, metal layer 802C comprises a transverse metal bar portion 854, which may be anchored to rigid PCB 850 by multilayer supporting vias 855 for added strength and stress relief. The vias 855 may connect to other metal layers, but the mesh 852 is not necessarily biased to any circuit potential. The mesh 852 may therefore have a floating potential or be biased to ground, or any other fixed potential. If the mesh 852 is biased to a time varying potential, care must be taken to prevent it from radiating EMI noise, e.g. by slowing down the frequency or switching rise times. In many embodiments, however, the mesh 852 is electrically floating. The specific pattern of mesh 852 shown in FIG. 69B is exemplary only and is not meant to be limiting in the density or design of the mesh or basket-weave pattern. The metal connections of metal layer 802C shown within the rigid PCB 850 are included to illustrate that the metal layer 802C can be used for electrical interconnections within the rigid PCB 850, even if its role within flex 851 is solely to provide mechanical support.

Cross section B-B', shown in FIG. 69C, illustrates how the mechanical connection of rigid PCB 850 to metal layer 802C is supported by conductive vias 855, which for stability are tied into top metal layer 806A above and into buried metal layer 802A below. Cross section C-C', shown in FIG. 69D, shows the construction of the conductive mesh 852 portion of metal layer 802C, illustrated by alternating pieces of metal and insulator. The metal layers 802A, 802B and 802C are not necessarily electrically isolated but may be interconnected to each other in other cross sectional planes within rigid PCB 850.

For the purposes of this disclosure the term basket weave pattern can be considered as one geometric pattern example of a mesh, specifically with elements spaced at regular intervals, i.e. with regular periodicity, and generally comprising elements perpendicular and parallel to the edge of the flex connection. The term mesh has a broader meaning, describing any pattern or grid, including diagonally oriented elements forming a regularly or irregularly spaced grid, and includes the basket weave pattern, as one possible example. Other patterns may comprise fish bone or herring bone shapes, grids with elements spaced non-uniformly in logarithmic fashion or using other geometric progressions, e.g.

elements spaced with increasing density up to some maximum density (minimum spacing), then decreasing in density in the reverse of the same progression.

The broad meaning of mesh then refers to any repeating structure or geometric pattern, uniform or only semi-regular, used to strengthen the flex PCB and its connection to a rigid PCB. Mechanistically, the use of a conductive mesh connection (including basket weave patterns) between a flex and rigid PCB naturally increases the bending and tearing strength, because it spreads damage force across multiple elements. These conductive elements, being relatively ductile, are within limits able to bend and deform without cracking. This mesh design principal is the 2D (planar) analog to the molecular structures of polymers, wood, or fiberglass or carbon reinforced materials—materials exhibiting higher breaking strengths than solid materials (in some cases even stronger than steel). The distributed force principal is utilized not only in the mesh's design, but by also in the design of the flex PCB's connection to the rigid PCB. As such, the mesh-to-rigid-PCB connection is not held by a single point, but instead is distributed across a line or conductive strip containing multiple vias to firmly anchor the mechanical connection.

The elements used to form the mesh or basket weave stress relief may comprise a metal layer such as copper or alternatively may comprise any bendable strong material. While theoretically the mesh could comprise a patterned non-conductive material, most bendable materials comprise metals or semimetals. The added benefit of employing metal to form the mesh is the layer can also be used to carry signals (or power) among the rigid PCBs in accordance with the redundant interconnect design methods disclosed herein.

The mesh connection technique can be applied to any interconnection layer within the flex connector, either in the first metal layer, the second metal layer, or in three-layer metal flex connectors the third metal layer. Fabrication of the mesh does not require any additional or special processing steps, but instead uses the photolithography used to define, pattern, and etch the metal in that specific interconnection layer. As such, the metal layer used to form a mesh is either deposited or laminated onto the other flex PCB sandwich structure. The layer is then coated with photoresist or dry resist and patterned using a mask that defines both electrical interconnections and the mechanical strengthening mesh structure. The metal is the etched to form the defined pattern and the metal is then coating with a protective insulating layer. Note that during the metal etching process steps, if the metal to be etched is covered with an insulator (remaining for example as part of a prior laminate fabrication process sequence) then this protective layer must be etched and removed before the underlying metal can be etched.

The structure can be augmented to add extra metal layers on either the flex PCB 851 or the rigid PCB 850 portion of the rigid-flex PCB. In one example shown in FIG. 69E an additional metal layer 806C and insulating layer 807C is used to facilitate the layers from the rigid PCB 850. Since the rigid PCB 850 also sandwiches the three conductive layer flex, the rigid PCB 850 in essence comprises a six layer PCB enabling realization of complex electronic systems.

Distributed Rigid-Flex PCB Fabrication—

Fabrication of rigid-flex PCBs for distributed systems differs significantly from prior-art flex PCBs and conventional rigid-flex PCBs shown in the background section of this application. In the prior art, flex PCBs are not designed for repeated flexing and twisting. As such, flex PCBs suffer from tearing, cracking, broken interconnections, and components falling off the PCB. Prior art rigid-flex PCBs suffer additional flex failures occurring at the flex-rigid interface due to localized stresses. Based on our own experimental data, repeated flex tests performed on rigid-flex PCBs fabricated by contract manufacturers using conventional rigid-flex manufacturing methods have been found to fail under flexing tests in a period of weeks, with some PCB failing after only three days of flexing cycles. Such rapid wear-out failures are problematic and completely unusable for products subjected to repeat bending needed in medical and wearable applications. In contrast the disclosed distributed rigid-flex PCBs survive continuous flex testing over a period of many months, enduring 30,000 to 70,000 flexing cycles without failure or performance degradation. Under normal commercial use profiles, the number of flexing cycles corresponds to five to ten years of use.

Aside from reliability considerations, manufacturability is another important consideration in product quality. Today's existing flex and rigid-flex fabrication processes are also not directly applicable to PCBs covering large areas, e.g. PCB of hundreds of millimeters in length and/or width, but instead are limited to small PCBs, typically the size of cell phones and smaller. Rigid PCBs are manufactured over larger areas, e.g. in computer motherboards, but are fabricated on a rigid substrates and cannot bend or flex without breaking or cracking. As a vestige of early PCB manufacturing techniques and low-cost factories constructed in the 1950's and 1960's, PCB fabrication today relies on uniform material deposition and undistorted optical patterning to maintain consistency and product quality.

Such primitive methods do not perform well in fabrication of PCBs occupying large areas. For example, manufacturers of large-panel LCD mother-glass for HDTVs facing similar challenges required investments of hundreds of millions of dollars in order to achieve good uniformity across the LCD panels. Because of the economic limitation of PCB manufacturers' low gross profit margins, no such investment in PCB factories can be justified. As such, the commercial PCB manufacturing industry has been relegated to "low-tech" manufacturing methods and capability. Given these manufacturing limitations, present day PCB factories using conventional processes and manufacturing methods are incapable of producing products comprising uniformly constructed arrays of rigid PCBs distributed across a large mesh of flex interconnections, i.e. distributed electronic systems realized in a rigid-flex system.

Without the need for substantial capital investment, the distributed rigid-flex fabrication sequence disclosed herein minimizes adverse large area effects by minimizing sensitivity to process parameters, e.g. using a laser having a wavelength tuned to be absorbed only by a material being cut, and by constraining manufacturing to smaller areas, processed repeatedly to cover the full PCB area. Such methods include fabrication employing moving head and newly available 3D printers, as well as moving belt processes, and "step and repeat" optical patterning and deposition methods. Redundant design methodologies complement the robust distributed rigid-flex manufacturing disclosed herein, together facilitating high quality manufacturing of high reliability products based on rigid-flex distributed electronic systems and circuits.

The general process flow for distributed rigid-flex PCB manufacturing is shown in FIG. 70. The process flow is exemplary illustrating, without limitation, a disclosed process framework for which the unique manufacturing requirements and challenges of a distributed rigid-flex PCB are identified, considered, and addressed. In the flow as shown, a flex PCB forms a distributed mesh interconnecting rigid PCB "islands", where the flex layer passes through each rigid PCB island as a central layer, i.e. the flex is sandwiched within rigid PCB exterior layers. As such, the flex PCB is first fabricated utilizing the steps "flex PCB formation" (step 990) and optional "blind via formation" (step 991) followed by rigid PCB attaching (step 992) where a top rigid PCB is attached onto one side of the flex PCB, and subsequently a bottom rigid PCB is attached onto the other side of the flex PCB.

The process flow shown fabricates a three PCB layer sandwich, i.e. a rigid-flex-rigid or RFR sandwich. Each rigid and each flex layer may comprise one, two, or more conductive layers. Cross sections shown illustrate a dual metal flex PCB sandwiched by two single-metal layer rigid PCBs ultimately resulting in the example RFR sandwich PCB shown in FIG. 82E. The process, however, can be modified to create any number of rigid-flex PCB sandwiches with each PCB comprising multiple metal layers. For example, each rigid PCB can utilize from one to six metal layers in total limited only by thickness considerations.

If "thick" metal is needed, the thick metal preferably should preferentially for manufacturability, purposes, comprise the last "outermost" metal layer, i.e. the topmost metal layer of the top rigid PCB or the bottom-most metal layer of the bottom PCB, or both. Thick metal is beneficial for ground and power but generally not needed for signal routing. Flex PCB can also comprise multiple layers, e.g. from one to four layers. But unlike the rigid PCB where only cost and thickness dictate the number of embedded metal layers, in a flex PCB each additional metal layer reduces the flexibility of the flex layer, increasing the risk of an interconnect failure due to cracking or breakage.

As described in a RFR sandwich the flex PCB is sandwiched within two rigid PCBs. While it is possible to utilize a single rigid PCB attached to one side of the flex to form a "R-F" sandwich, without securing the flex on both sides the mechanical strength of the rigid-flex connection is diminished. Other variants of the process flow may involve repeating the steps to form multiple flex interconnect layers, e.g. to form a RFRFR sandwich comprising two flex interconnection layers interspersed among three rigid PCB layers. While such an option may be beneficial in highly redundant systems and military applications, in normal flexible electronics used in wearable and medical products such hyper-redundancy may be costly and unwarranted. After rigid PCB attaching (step 992), the rigid PCB metal layers are patterned using optical photolithography and metal etching, as shown in the step entitled "metal patterning" (step 993). Thereafter "via formation" (step 994) is used to create an electrical connection from the top rigid PCB metal to the flex layer, i.e. a "top via", to create an electrical connection from the bottom rigid PCB metal to the flex layer, i.e. a "bottom via", or to form a via all the way through the RFR sandwich, i.e. a "thru via". In "thick metal formation" (step 995) metal is plated onto exposed metal both filling the exposed vias and increasing the thickness of the outmost metal layers. Alternatively the vias may be filled previously in via formation step (step 994). In another embodiment, the sequence of thick metal formation (step 995) and via formation (step 994) is reversed.

After the metal interconnections are completed and the vias formed and filled, the rigid PCB can be removed in those portions of the rigid-flex PCB where only flex connections are located, i.e. in the bendable portion of the rigid-flex PCB. This removal process, shown as the step entitled "rigid PCB removal" (step 996), is critical in producing a reliable distributed rigid-flex PCB. Performed improperly, removal of the rigid PCB layers may damage the underlying flex layer resulting in yield loss or premature flex failures during normal use. The last step, "flex patterning" (step 997) is performed to remove unneeded portions of the flex insulator to maximize rigid-flex PCB bendability and interconnect flexibility. Each of these fabrication steps is further detailed in the following description and corresponding graphics.

The steps flex PCB formation (step 990), and blind via formation (step 991) are further detailed in FIG. 71 describing the details for one possible process flow, entitled "flex fabrication". As shown, flex PCB formation (step 990) comprises the sequence laminate metal onto flex (step 990A), pattern flex PCB top metal (step 900B), pattern flex PCB bottom metal (step 900C), followed by planarize and cap flex PCB (step 990D). Blind via formation (step 991) follows thereafter. Each of these steps involves several sub-steps or operations described by bullet points as shown. For example, pattern flex PCB top metal (step 990B) involves the operations (i) coat photoresist (ii) expose resist with photomask (iii) develop and bake photoresist, and (iv) etch top metal then strip photoresist. These process operations are illustrated in the following cross sections to exemplify their application in flex fabrication.

FIG. 72A illustrates flex PCB formation (step 990) comprising laminating a flexible insulating layer 801A and adhesive layer 808A to a flexible metal layer 802A. The insulator layer 801A may comprise a polymer including polyether ether ketone (PEEK), polyaryletherketone (PAEK), polyethylene napthalate (PEN), polyetherimide (PEI), along with various fluropolymers (FEP) and copolymers, flexible plastic substrate, or other flexible insulating layer including polyester, or silk. Layer thicknesses range from 10 μm to 150 μm, but thinner layers are preferable for superior flexibility.

Adhesive layer 808A, also known as a bonding adhesive, may comprise an epoxy, an insulating potting compound, acrylic adhesives, polyimide adhesives and other glues. The adhesive may be applied as a sheet, a spray, a gel, or a paste. While adhesive layer 808A is depicted as a separate layer, it may also be impregnated into the insulating material 801A. For metal layer 802A, a metal foil, generally copper, is most commonly used as the conductive element of a flexible laminate. As shown in the center drawing of FIG. 72A, after the top metal lamination, adhesive layer 808B is applied to exposed side of insulating layer 801A, and then insulating layer 801A is bonded to metal 802B. Lamination of the dual layer metal flex PCB is then completed by applying pressure at an elevated temperature on the sandwich comprising top metal 802A, intermediate insulator 801A, and bottom metal 802B. (Note: As used herein, words such as "bond," "attach" and the like as applied to the layers of a PCB structure do not require that the layers being "bonded" or "attached" necessarily be in direct contact with each other, but rather they may be "bonded" or "attached" via an intermediate layer or layers. For example, if it is said that Insulating Layer A is "bonded" or "attached" to Layer B (whether Layer B is another insulating layer or a conductive layer), an Insulating Layer C could be interposed between Layer A and Layer B.)

After lamination, the flex PCB is ready for metal patterning used to define metal traces for signals, ground, power as well as links, cross unders, and basket weave stress relief metal. As shown in FIG. 72B, patterning of the top metal layer 802A is performed by coating photoresist layer 812A, then exposing the light sensitive resist to light 819 through an "top flex-metal" photomask 813A followed by chemical developing of photoresist 812A. During developing, some portions of the resist wash away, specifically opening 817A, while other portions remain. In preparation for etching, baking then used to harden photoresist 812A.

As described previously, in conventional PCB manufacturing, copper layers are patterned to form electrical circuits generally through the process of "photolithography", transferring an image to photoresist from a computer generated optical mask or "photomask", developing, and then baking the photoresist followed by performing a metal etch. The same photolithographic method may be applied on other materials other than metal, e.g. glass, coatings, plastics, etc. While the disclosed "patterning" process illustrates a specific sequence for metal pattern definition comprising conventional dry resist photolithography, the distributed rigid-flex PCB made in accordance with this invention is not limited to any one particular method, but instead is (with the exception of large area PCBs), agnostic to the patterning method. Large area PCBs face unique issues incompatible with conventional photolithography. Novel and inventive solutions to address these issues are disclosed subsequently in this disclosure. Regardless of the specific methods of photolithography employed, the photolithographic patterning process transfers a mask pattern to the metal. This pattern defines where metal connections are to be located, where metal is required to form multi-layer via connections, and where a conductive mesh is to be formed to enhance the mechanical strength of the flex PCB and its connections to rigid PCBs.

A variety of permutations and combinations of conventional and novel photolithographic methods are illustrated in FIG. 83A. In the example shown, layer 1002 represents a material to be etched, layer 1000 represents a layer not to be etched, and layer 1001 represents an intervening layer. The first step comprises either application of dry photoresist film 1003B or spreading a viscous emulsion, a resist coat 1003A atop layer 1002. After photoresist film 1003B is applied, a low temperature baking operation or "soft bake" is performed to stiffen resist 1003C without degrading its photosensitivity. Next photoresist layer 1003C (which represents either photoresist film 10031 or photoresist layer 1003A, as the case may be) is exposed to light 1009 through the patterned mask 1004 thereby transferring the image. The photoresist layer 1003C is sensitive to exposure to short wavelength light such as blue or ultraviolet light, but not to longer wavelength visible light, e.g. colors such as yellow or red light.

While photomasking is applicable for conventional PCBs, the large areas of distributed rigid-flex PCBs make photomask based photolithographic imaging problematic. To overcome this limitation, as disclosed herein, the optical photomask is replaced with a direct laser write of the photoresist layer 1003C, using a laser beam 830A. Unlike the exposure through a photomask, in the disclosed direct write exposure, a laser is scanned across the PCB to expose photoresist 1003C. The laser beam 830A can be scanned over large areas using either a scanning lens or a moveable laser head, or alternatively by moving the PCB on a conveyor belt, rail, or table.

After exposing the photoresist, the resist is "developed" causing the photoresist to be washed away in some regions and retained in others as defined by the portions of the photoresist exposed to light and those is the shadow of the photomask. After developing the photoresist, the organic photoresist layer mimics the pattern of the mask through which it was exposed, covering the layer 1002 in some regions and not in others.

The portions of layer 1002 that are protected by the photoresist and those that are exposed to etching depend on whether a "positive" or a "negative" photoresist is employed. Positive and negative photoresists react to light in an opposite or complementary manner. Specifically, for positive photoresist, any photoresist regions exposed to light causes the exposed chemical bonds to break, washing away that portion of the photoresist during the developing process. Since photoresist 1003C is removed in the light exposed areas 1010A, then only in the shadow of the photomask features is photoresist 1003D retained, meaning that the remaining photoresist pattern exactly duplicates the photomask features, i.e. dark areas are protected from etching. Everywhere else the metal will be etched away.

In the case of negative photoresist, any photoresist regions exposed to light causes the exposed chemical bonds to cross-link, not break, preserving only the exposed portions of the photoresist during the developing process and washing away the photoresist in the photomask's shadow. Since photoresist 1003C is preserved only in the light exposed areas where it becomes photo-polymerized photoresist 1003E, all dark areas will result opening 1010B to be etched away. The resulting developed photoresist features are therefore exactly opposite, i.e. the negative image, of the photomask or dark areas.

So the mask polarity, i.e. the dark features and clear portions of the photomask, or their direct write equivalent, must correspond to whatever photoresist is employed in the masking operation. After exposure, the photoresist is "hard baked" at a high temperature to strengthen it to withstand prolonged exposure to acid etches. Because the photoresist comprises an organic compound, it is relatively insensitive to exposure to acids, especially after hard baking. Layer 1002 is then etched in acid and thereafter the mask is removed. The etchant is chosen to attack layer 1002 but not etch interfacial layer 1001. As such, layer 1000 remains protected from etching while layer 1002 is removed in opening 1011A using positive resist 1003D and removed in opening 1011B using positive resist 1003E. The acid is chosen based on the chemical composition of the material to be etched. For example, copper etches generally employ nitric, sulfuric, or hydrofluoric acids either in pure form, diluted by water, or mixed either hydrogen peroxide or some other compound. Ferric chloride or ammonium hydroxide may also be used. The composition of various copper etches can be found online, for example at http://www.cleanroom.byu.edu/wet_etch.phtml. Etches for oxide generally contain hydrofluoric acid (OF). Alternative etch methods include dry etching comprising plasma and reactive ion etching (RIE), where an inert gas is temporarily made chemically reactive in the presence of an ionizing electromagnetic field. The directionality of the dry etch. i.e. its anisotropy, can be controlled by introducing a static DC electric field oriented perpendicular to the surface of the PCB. Plasma etches and RIE are expensive Photolithography is not the only method available for patterning a PCB. As shown, patterning large area PCBs can also be accomplished using silk-screening or using mask printing as shown in FIG. 83B. In silk-screening processes, silkscreen 1005 acts as a mask controlling the areas coated by a protective emulsion 1006A, which after baking hardens into hard-mask 1007. The mask protects a portion of layer 1002 while allowing area 1010B to be removed.

As a new novel embodiment of the invention, a protective emulsion 1006B is selectively printed using movable print head 1008. After baking, this emulsion hardens into hard-mask 1007. To facilitate positioning of the print head atop the PCB, large flat bed printers or moving belt linear printers may be adapted to accurately dispense the etch-resistant emulsion. Adapting a flat bed printer mechanism, the PCB to be printed is positioned on a fixed table located beneath a print head with two-dimensional movement. i.e. adapting an x-y printer to dispense the masking emulsion 1006B. Alternatively, a linear scanner printer combined with a conveyer belt or substrate "feeder" can be used to slowly push the PCB under the print head while the print head scans back and forth depositing the masking emulsion 1006B.

The foregoing methods as described and disclosed facilitate numerous means by which a PCB's features can be defined. In general, patterning through etching involves (i) depositing or laminating a layer to be patterned (ii) covering the material to be etched with a patterned etch-resistant mask formed by photomasking, laser direct writing, silk-screening, or printing (iii) etching the material, and (iv) removing the mask. These methods have been summarized here above and for brevity's sake, will not be repeated in the rigid-flex PCB fabrication sequences. It should be understood that for all the process flows shown herein, although the method shown comprises a photomask exposure of a dry photoresist, any of the described methods are applicable in the patterning and etching of rigid-flex PCB features. It should also be understood that, without limitation, the patterning of large area PCB's specifically benefit from the newly disclosed laser PCB direct write and printing techniques.

Returning to the drawing entitled "etch top flex metal" shown in FIG. 72C, metal 802A located directly beneath resist opening 217A is removed, patterning the metal into multiple traces using the etch methods described above. The process is then repeated for patterning the bottom metal layer 802B starting with coating photoresist 812B followed by photolithographic patterning by light 819 defined by photomask 813B. As shown in FIG. 72D, developing of photoresist 812B open windows 817B, which after metal etch removes portions 817B of metal 802B. After etching, photoresist 812B is removed.

In the center drawing shown in FIG. 72C, metal 802B is coated by photoresist 802B then as shown in the bottom illustration, the resist is exposed to light 819 through "bottom flex-metal" photomask 813B. In FIG. 72D, after developing, photoresist 812D is removed to create opening 817B followed by etching of bottom metal 802B and stripping of photoresist 812B. In FIG. 72E, an insulating material is printed, coated, or deposited into opening 817A to form planarizing fill 804A on the flex top side and into bottom side opening 817B to form planarizing fill 804B whereby gaps 817A and 817B are filled planarizing the layer with corresponding insulating materials 804A and 804B. This insulating material, e.g. a polyimide, can be deposited as an emulsion across the entire, then planarized using a soft rubber blade, i.e. a squeegee, or by selectively printing the planarizing filler only in the locations required. In FIG. 72F, protective caps comprising insulating material 801B with adhesive layer 808D and insulating material 801C with adhesive layer 808C are laminated onto the patterned flex PCB. The resulting flex PCB comprising a capped flex laminate is shown in the top cross section of FIG. 73A.

To facilitate interconnects between flex metal layers 802A and 802B, a conductive via is required. Since this via is sandwiched between rigid PCB layers, such a conductive via can be referred to as "blind via", meaning there is no easy way to visually align a rigid PCB feature to the blind via. Blind via formation is accomplished using photolithography starting with coating the topside of the flex PCB with photoresist 812C, exposing the resist with light 819 through photomask 813C. As shown in FIG. 73B, after developing, opening 817C is used to define via etch location. Thereafter, via-hole formation can be etched using wet chemistry, i.e. acids, or by using dry etching methods. In the case of wet chemical etching, however, the chemical etchants must be changed to remove each layer in succession, i.e. etching cap 801B, metal 802A, insulator 801A, metal 802D, and optionally cap 801C. After etching the via, an optional sidewall deposition of copper using flash evaporation is performed to form sidewall metal 814A.

In FIG. 73C, the etched via is filled or partially filled with a metal or other electrically conductive material. In the case where the etched via is filled fully with metal 811A, the metal can be grown using electroplating to overflow the filled via, then etched back to planarize the metal's surface. Alternatively in conductive via 811B, the metal does not completely fill the opening. In multi-filled via 81 IC a solder paste or other conductive material is deposited or printed to fill the etched via hole. Referring again to the process flowchart in FIG. 70, after flex PCB formation blind via formation (step 991), the distributed rigid-flex PCB is now ready for rigid PCB attaching (step 992) and metal patterning (step 993). Starting with a completed flex PCB laminate as its starting material, the steps comprising part I of rigid-flex fabrication are shown in FIG. 74 including the operations "laminate top rigid PCB onto flex" (step 992A) and "laminate bottom rigid PCB onto flex" (step 992B), followed by the operations entitled "pattern top metal" (step 993A) and "pattern bottom metal" (step 993B).

As illustrated in FIG. 75A, the "laminate top rigid PCB onto flex" operation (step 992A) starts with fabricating the top rigid PCB laminate starting with rigid insulator 805A comprising fiberglass or other stiff polymers coated with adhesive 808D then bonded to metal 802D typically comprising a copper film sheet. This metal laminate is then attached to the top of the previously fabricated flex PCB. After heating and the application of pressure rigid insulator 805A becomes bonded to flex cap layer 801B. Although adhesive 808D is illustrated as a separate layer for clarity's sake, the adhesive may be impregnated into rigid insulator 805A, i.e. the combination forms a self-gluing insulator sheet or "pre-preg" layer.

The rigid lamination process is next repeated for the bottom side of the rigid-flex PCB as illustrated in FIG. 75B.

This process entitled "laminate bottom rigid PCB onto flex" operation (step 992B) starts with fabricating the bottom rigid PCB laminate starting with rigid insulator 805B comprising fiberglass or other stiff polymers coated with adhesive 808E then bonded to metal 802E typically comprising a copper film sheet. This metal laminate is then attached to the bottom of the previously fabricated flex PCB. After heating and the application of pressure rigid insulator 805B becomes bonded to flex cap layer 801C. Although adhesive 808E is illustrated as a separate layer for clarity's sake, the adhesive may be impregnated into rigid insulator 805B, i.e. the combination forms a self-gluing insulator sheet or "pre-preg" layer.

The operation "pattern top metal" (step 993A) is illustrated in FIG. 76A where photoresist 812D is applied to the PCB's topside, baked, exposed to light 819 through photomask 813D, then etched to remove the exposed portions of top metal 802D, after which photoresist 812D is removed, leaving a patterned top metal layer. The operation "pattern bottom metal" (step 993B) is illustrated in FIG. 76B where photoresist 812E is applied to the PCB's backside, baked, exposed to light 819 through photomask 813E, then etched to remove the exposed portions of bottom metal 802E, after which photoresist 812E is removed, leaving a patterned bottom metal layer The resulting four layer metal rigid-flex PCB compatible with distributed electronic systems is shown in FIG. 76C. The metal thicknesses of all four metal layers 802D, 802A, 802B, and 802E are defined by the thicknesses previously chosen for the copper sheets used in the flex and rigid lamination processes. A fifth metal layer 802C (not shown) may be included in the process sequence either as part of the flex PCB or in the top rigid PCB if additional interconnection layers are required.

Having completed the part I of rigid-flex fabrication, the PCB is now ready for part II of rigid-flex fabrication as detailed in the flow chart shown in FIG. 77 involving "via formation" (step 994) including "top via formation" (step 994A) combined with either a "thru via formation" (step 994B) or followed by a "bottom via formation" (step 994C), followed by thick metal formation (step 995).

The role of the top via is to facilitate an electrical connection between top metal 802D and flex metal 802A. The top via can be used alone or in some instances, stacked atop blind via 811A to indirectly facilitate electrical connection between top metal 802D and flex metal 802B. As shown successively in FIG. 78A, FIG. 78B and FIG. 78C, top via fabrication is similar to the steps used previously for forming buried via 811A, starting with coating of photoresist 812F, exposing the resist to light 819 through photomask 813F, developing and baking exposed photoresist 812F to expose portions of top metal 802D to define the top via location, followed by top via etch of all the layers from the top surface of the PCB down to flex metal 802A. Flex metal 802A however is not removed. After stripping photoresist 812F, metal sidewall 814F is then deposited or evaporated onto the sides of the etched via. While at this step, the top via can be filled with metal or other conductive material, it is efficient to form top, thru and bottom vias then fill them all in a single plating operation rather than filling them one at a time.

The role of the thru via is to facilitate an electrical connection between top metal 802D to every other metal layer including flex metals 802A and 802B and bottom metal 802E. As shown successively in FIG. 79A, FIG. 79B and FIG. 79C, thru via fabrication is similar to the steps used previously for forming the top via starting with coating of photoresist 812G, exposing the resist to light 819 through photomask 813G, developing and baking exposed photoresist 812G to expose portions of top metal 802D to define the thru via location, followed by thru via etch of all the layers from the top surface of the PCB down to and including bottom metal 802E. After stripping photoresist 812G, metal sidewall 814G is then deposited or evaporated onto the sides of the etched via.

While at this step, the thru via can be filled with metal or other conductive material, it is efficient to form top, thru and bottom vias then fill them all in a single plating operation rather than filling them one at a time. Via etching for top and thru vias can be shared as well, where thru via definition is formed first and etched partially then top via is defined and etched to its target depth. Provided the mask opening for the top via is open atop the thru via location, the thru via will continue to etch during the top via etching process reaching its final targeted depth, i.e. to penetrate the entire RFR sandwich.

The role of the bottom via is to facilitate an electrical connection between bottom metal 802E and flex metal 802B. The bottom via can be used alone or in some instances, stacked atop blind via 811A to indirectly facilitate electrical connection between bottom metal 802E and flex metal 802A. As shown successively in FIG. 80A, FIG. 80B and FIG. 80C, bottom via fabrication is similar to the steps used previously for forming the top via starting with coating of photoresist 812H, exposing the resist to light 819 through photomask 813H, developing and baking exposed photoresist 812H to expose portions of bottom metal 802E to define the bottom via location, followed by bottom via etch of all the layers from the bottom surface of the PCB up to flex metal 802B. Flex metal 802B however is not removed. After stripping photoresist 812H, metal sidewall 814H is then deposited or evaporated onto the sides of the etched via. While at this step, the bottom via can be filled with metal or other conductive material, it is efficient to form top, thru and bottom vias then fill them all in a single plating operation rather than filling them one at a time.

The process for thick metal formation involves plating copper on top of any exposed metal conductors and to fill any unfilled vias. FIG. 81 illustrates a cross section of a distributed rigid-flex PCB after thick metal plating. As shown, metal plating deposits thick top metal 829D atop any exposed thin top metal 802D, filling top via 811F and thru via 811G (not shown) in the process. The same plating operation also deposits thick bottom metal 829E atop any exposed thin top metal 802E, concurrently filling bottom via 811H.

The next step in the distributed rigid-flex fabrication sequence is to remove the top and bottom rigid PCBs in the portions of the rigid-flex PCB intended to be flex only, i.e. in the bendable portions of the PCB. FIG. 82A illustrates the use of laser 830A selectively scanned only across portions of the distributed rigid-flex PCB using a laser wavelength absorbed by rigid insulator 805A but not by metal 802A. For example a $CO_2$ or niobium-YAG laser with wavelengths in the infrared spectrum are absorbed by most glasses and insulators but not by copper or other yellow metals. The result of the selective top rigid PCB removal is shown in the cross section of FIG. 82B where rigid insulator 805A is removed entirely from the flex portion of the PCB without damaging the underlying flex PCB. Laser-scan 830B shown in FIG. 82C is then used to remove bottom rigid insulator 805B resulting in the rigid-flex PCB shown in FIG. 82D where the flex portions of the distributed PCB comprise entirely flex PCB connections and the rigid portions comprise the RFR sandwich. All regions include patterned metal and vias.

FIG. 82E illustrates the distributed rigid-flex PCB after a protective coating 839D and 839E are coated on top of portions of the rigid PCB. This protective layer acts as a solder mask during soldering of components onto the PCB during SMT surface mount assembly. Methods to selectively deposit a material on only a portion of a PCB are shown in the cross sectional process flows summarized in FIG. 84. Methods include silk-screening an emulsion 1026A through a patterned silkscreen 1005 or using a movable print head 1008 to print an emulsion 1026B in select locations and at defined thicknesses. After curing, the emulsion changes into a protective encapsulant 2027A employed both as scratch protection and as a solder mask during SMT assembly.

Alternatively the deposited layer may be etched back to form a coating 1027B coplanar with adjacent metal layers.

The final step before PCB assembly is to remove the unused portions of the flex PCB using laser 844 as shown in FIG. 82F. In these unused portions of the flex PCB, no metal is present. The metal was previously replaced with planarizing insulators 804A and 804B during flex fabrication (see FIG. 72E and FIG. 72F). The same flex PCB cross-section after laser flex-removal is shown in FIG. 82G, where the flex has been completely removed. In cross sections where the flex PCB is not removed, e.g. as shown in FIG. 82H, laser 844 has no effect on the PCB's construction appearing identical to that the construction prior to laser flex removal.

The use of a laser to remove the rigid PCB material from select portions of the rigid-flex PCB and to cutaway unneeded remaining portions of the flex material provides superior process control not possible using mechanical methods such as sawing, cutting or grinding of material. Even so, any damage occurring to the flex layer when processing the RFR sandwich, especially during removal of rigid insulator layers, can permanently damage the flex and greatly shorten its useful life and its ability to survive repeated flexing cycles. One way to reduce the risk of flex damage is through the introduction of an interfacial layer between rigid and flex layers in the RFR sandwich. This modified process flow is shown sequentially starting with FIG. 85A where interfacial layers 849Y and 849Z comprising an uncured organic, epoxy, or polymeric material are deposited on the top and bottom of the capped flex laminate. In FIG. 85B, the interfacial layer is treated chemically or optically to harden portions 849A and 849C while leaving portions 849B and 849D in a less rigid state. This hardening is accomplished by creating crosslinking of chemical bonds and polymerization using selective deposition or printing of a chemical reactant or catalyst only on portions 849A and 849C. Alternatively, this effect can be accomplished by using light induced polymerization in a compound similar to a photoresist using photomasking or laser direct write techniques disclosed previously.

After interfacial layer deposition, rigid insulator layers 805A and 805B are attached, after which the normal fabrication sequence continues resulting in the cross section shown in FIG. 85C. During the rigid PCB removal using either laser or chemical methods, interfacial layers 849B and 849D act as a protective butter layer, preventing damage to the flex PCB and to its cap layers 801B and 801C. After rigid PCB removal, the resulting cross section is shown in FIG. 85D.

FIG. 86A illustrates in simplified form the use of an interfacial layer sandwiched between rigid insulator 805B and flex cap 801A comprising alternating regions of hardened interfacial layers 849A and non-hardened interfacial layers 849B. After laser 830A removal of portions of rigid insulators 805B, non-hardened interfacial layers 849B are removed, leaving flex PCBs including flex caps 801A undamaged. Alternatively, as shown in FIG. 86B, the non-hardened interfacial layers can be replaced by air gaps 849C. Referring a top view of a rigid-flex PCB during fabrication, FIG. 87A illustrates that a full sheet of rigid insulator 1030A removed by laser 803A scanned in horizontal and vertical stripes to form discrete rigid-flex islands 1031. After patterned laser removal of rigid insulator 1030A, the underlying flex PCB layer 1032 is exposed as shown in FIG. 87B. Subsequent laser-patterning cuts the exposed portions of flex 1032 into a well-defined pattern of flex connections 1033 including rectangular and diagonal connectors 1033. Alternatively as shown in FIG. 88, the top rigid insulator can be pre-patterned with a matrix of rigid insulator islands 1030B connected by a matrix of thin rigid-PCB strips 1030C. During laser removal of the thin rigid-PCB strips 1030C, the underlying flex PCB 1032 holds rigid insulator islands 1030B in place. Thereafter, as in the previous example shown in FIG. 87B, subsequent laser-patterning cuts the exposed portions of flex 1032 into a well-defined pattern of flex connections 1033 including rectangular and diagonal connectors 1033.

Quasi-Rigid-Flex PCB Fabrication

An alternative to the disclosed distributed rigid-flex PCB and fabrication methods thereof is a new PCB technology, referred to as a quasi-rigid-flex PCB or "QRF" printed circuit board. Unlike rigid-flex PCBs constructed using stacked layers of metallic, rigid and flex insulating laminates, the disclosed QRF substrate comprises a flex PCB locally strengthened by less flexible layers of polymeric materials or polyimide compounds, deposited or printed into isolated islands held in place by its underlying flex PCB. In one example process sequence, fabrication starts with a flex PCB comprising a capped flex laminate. As shown in FIG. 89A, the flex PCB is then printed with insulator material through movable print head 1008.

By employing printing, insulator 1018A is deposited in different regions and at different thicknesses to facilitate quasi-rigid support, to protect flex regions from etching and to define via locations. The thickest portion of insulator 1018A is printed on the top side of quasi-rigid PCB sandwich areas, thin insulator 1018B is printed to protect the topside of flex PCB from etching, and opening 1019A has no deposited insulator.

Similarly, as shown in FIG. 89B, the thickest portion of insulator 1018C is printed on the bottom side of quasi-rigid PCB sandwich areas, thin insulator 1018D is printed to protect the bottom side of flex PCB from etching, and opening 1019B has no deposited insulator. The thin printed insulator layers 1018B and 1018D and the exposed portions of cap layers 801B and 801C are then etched for a controlled time using wet chemical etchants. The thickness of thin insulator layers 1018B and 1018D are chosen to protect cap layers 801B and 801C while openings 1019A and 1019B are etched to expose metal layers 802A and 802B. In this manner the openings 1019A and 1019B serve to function as vias without the need for photomasking.

In FIG. 89C, moveable print head 1008 then prints a layer of thin metal or conductive solder paste embedded with metal particles. The topside printing fills the top via with conductive material 1048A and deposits a thin layer of conductive material 1048B on other areas in the quasi-rigid island. The bottom side printing fills the bottom via with conductive material 1048C and deposits a thin layer of conductive material 1048D on other areas on the quasi-rigid island. In FIG. 89D, thick metal 1049A and 1049B is plated atop thin conductor layers 1048B and 1048D. After printing protective encapsulant layers 1050A and 1050B, the resulting cross section shown in FIG. 89E comprises a completed quasi-rigid-flex PCB formed without the use of photomasking.

PCB Assembly & Moisture Protection

After forming the described rigid-flex PCB, the final steps in fabrication of a distributed rigid-flex system involves surface mount assembly of the printed circuit board followed by protection of the electronic system against mechanical damage, moisture, and other environmental conditions.

As illustrated in the cross section of a rigid-flex PCB shown in FIG. 90, an array of multiple rigid-flex PCB islands interconnected by a shared flex PCB 1055 is next populated by the mounting of electronic components using surface mount assembly. For the sake of clarity, metal layers and vias not exposed to soldering, i.e. embedded with the flex and rigid PCBs, are excluded from the drawing. In SMT assembly, an acronym for surface mount technology, electrically-conductive external portions of components comprising copper leads, solder balls, gold bumps, exposed conductive pads on leadless packages, copper tabs and leads on power packages, "feet" in footed packages, or other electrical connections are soldered into place, facilitating both mechanical support and electrical connections. Lead-free solder may comprise tin or alloys thereof including silver, copper, silver, bismuth, indium, zinc, antimony, and traces of other metals. Lead-free solders typically have melting points 5° C. to 20° C. higher than those containing lead (chemical symbol Pb). Soldering may involve wave soldering where solder flows over the exposed leads and PCB traces. Alternatively, solder may be printed onto the rigid PCB prior to component placement, followed by heating to melt the solder and permanently attach the components. Such a method is known as a solder reflow process. An alternative assembly method involves the mounting of through-hole leaded components.

In the example shown in FIG. 90, passive components 1060A, 1060B, and 1060C, integrated circuits 1061 and 1062, and LEDs 1063 or other sensors or emitters (not shown) are soldered onto PCB metal traces 1049A and 1049B. PCB copper traces not to be soldered are protected by a solder mask comprising encapsulation 1050A and 1050B. Likewise, with no exposed metal, the soldering process does not affect flex 1055. While conventional SMT assembly performed on rigid PCBs achieves its mechanical support during component mounting and soldering from the mechanical strength of the PCB, in a distributed rigid-flex PCB as disclosed, additional support is required to prevent unwanted flexing during manufacturing.

One possible means of support during bonding is shown in FIG. 91, where frame 1068 supports the rigid portions of a distributed rigid-flex PCB using pins 1069. These pins prevent deformation and bending during pick and place of components during the SMT process. The frame and pins may comprise metal or any strong rigid material such as reinforced polymers of fiberglass. Additional pins can be added to support larger rigid PCB dimensions. The frame may be permanently part of the bonding equipment or alternatively, part of a carrier attached to the rigid-flex PCB.

Moisture protection, i.e. waterproofing, can be achieved by spraying the rigid PCBs with a coating or acrylic layer, or as shown in FIG. 92, by submerging the PCB into a waterproof emulsion 1071 in bath 1070. Inset 1074 illustrates, in the case where an optical sensor or LED 1063 is included in the SMT assembled PCB. To prevent the waterproof emulsion 1071 from affecting the optical properties of an LED or sensor, the depth of the fluid in bath 1070 should not cover the optical components. After drying or curing, the resulting waterproofed PCB is shown in FIG. 93 where the moisture protection 1072 covers most or all of the metallic leads and traces, eliminating or at least greatly diminishing the PCB's sensitivity to moisture, corrosive chemicals, salt water, sweat, or other conductive fluids.

After moisture protection, the distributed rigid-flex PCB is mounted into a polymeric case or cover 1076 as shown in FIG. 94. Because optical components such as LEDs 1063 require openings 1077 to facilitate optical transmission in or out of the system, cover 1076 is not hermetically sealed and relies on moisture protection 1072 to prevent damage. An alternative method is to inject a polymeric molding compound into a mold encapsulating the distributed rigid-flex PCB. Even then, the risk of delamination between the polymeric mold and protruding optical components from repeated flexing necessitates the use of moisture protection 1072.

Practical Applications of 3D Bendable Distributed PCBs

The combination of rigid-flex PCB fabrication, distributed PCB designs, and electrical redundancy can be applied for a variety of wearable electronics and medical devices. The flexibility of the disclosed bendable PCB design and fabrication process offers tremendous versatility for conforming electronic devices to unusual and curved surfaces of the human body, equally adapted to veterinarian and equine medicine. Using square, rectangular, and hexagonal arrays of rigid or quasi-rigid PCBs interconnected by a redundant matrix of flex interconnections and stress relief, shapes supported include flat, curved, rounded, semispherical bendable pads, including Belts and wide belts
Collars and headbands
Cuffs, arm bands, and wrist bands
Cap and helmet shapes
Facemasks
Reconfigurable arrays The 3D bendable PCB design methods and geometries, fabrication processes, and redundant electrical architecture disclosed herein can be adapted to a variety of shapes. Practical applications of this technology are included here to exemplify, without limitation, this versatility.

One such application is the collar or belt shape comprising an elongated pad designed to circumscribe the neck, waist, headbands, cuffs, wristbands, and armbands. FIG. 95A illustrates top and bottom exterior view of a flexible belt shaped LightPad comprising belt 1100. In the LightPad as shown, LEDs emit light through openings 1103 while the polymeric pad protects the bendable rigid-flex PCBs from mechanical damage and moisture. Connector 1102 comprises a mechanically strengthened USB connector. The belt includes an adjustable length using strap 1101 and pin 1104. The belt shaped LightPad is shown in various exterior views including top, bottom, edge and end views as shown in FIG. 95B.

An expanded view of the belt shaped LightPad comprising rigid-flex PCB 1110 with top cover 1100W and bottom cover 1100Y is shown in FIG. 95C. Rigid-flex PCB 1110 includes USB connector 1102C strengthened by rigid plastic sheath 1102B and inserted into connector opening 1102A. A close up perspective view of the underside of cover 110Z and the rigid-flex PCB comprising rigid PCBs 1110A and flex interconnection 1110B is shown in FIG. 95D. Pin 1104 made of printed rigid plastic is included during LightPad assembly.

FIG. 95E illustrates various views of the tops and bottom polymeric covers including top cover exterior view 1100W, top cover interior view 1100X, bottom cover interior view 1100Y, and bottom cover interior view 1100Z. Placement of the rigid-flex PCB 1110 into the polymeric pad shown in bottom cover interior view 1100Y is detailed in FIG. 95F. The center expanded view illustrates USB connector 1102C including protective sheath 1102B. Another expanded view details the location and mounting of pin 1104.

The assembly of the LightPads shown in the flow chart and corresponding perspective views of FIG. 96 includes installation of the USB support sheath in step 1130A while frame 1119 provides additional mechanical support to rigid-flex PCB 1110Z during processing. In step 1130B, frame 1119 is removed resulting in assembled rigid-flex PCB 1110 mounted into bottom cover 1100Y in step 1130C. During this step pin 1104 is inserted into the cover, after which in step 1130D the top cover is glued into place resulting in final belt shaped LightPad 1100. FIG. 97 illustrates top and bottom perspective view photographs highlighting LED openings 1103 and USB connector 1102.

Perspective photographs of rigid-flex PCB 1100 in various fabrication steps are shown in FIG. 98 including the top illustration of PCB 11110Z prior to SMT assembly and prior to removal of support frame 1119, the center illustration of the underside view of rigid-flex PCB 1110 after SMT assembly highlighting LEDs 1103A, and the bottom illustration of the topside view of rigid-flex PCB 1110 after SMT assembly highlighting USB connector 1102C.

The final belt-shaped LightPad and its associated cables is shown in FIG. 99. FIG. 100 illustrates four views of the rigid-flex PCB used in the belt shaped LightPad design, illustrating the top metal 1141 alone and in combination with top flex metal 1144A and 1144B, bottom flex metal 1145, and bottom metal 1148 layers. As shown, top-metal 1141 includes solder pads 1142 to mount LEDs, and top-metal to top-flex-metal via 1143. Top-metal to top-flex-metal via 1143 also appears on the top-flex-metal layer along with metal traces 1144A for electrical power and signal routing and stress relief metal basket weave 1144B.

Bottom metal flex 1145 includes stress relief basket weave 1145 and bottom-flex-metal to bottom-metal via 1147 which also appears on the layer for bottom metal 1148. In this manner, the various metal layers complete a specific circuit while providing mechanical stress relief.

FIG. 101A illustrates top and bottom exterior view of three reconfigurable LightPads comprising center LightPad 1115A and side LightPads 1115B. In the LightPads as shown, LEDs emit light through openings 1153 while the polymeric pad protects the bendable rigid-flex PCBs from mechanical damage and moisture. Connector 1154 comprises a mechanically strengthened USB connector. Center LightPad 115A includes three USB connectors 1154 while each of side connectors 1151B includes two USB connectors 1154.

The reconfigurable LightPads include an adjustable length strap 1152. Each of reconfigurable LightPads 1115A and 1115B is shown in various exterior views including top, bottom, edge and end views in FIG. 101B. The assembly of the rigid-flex PCB 1159 mounted into bottom cover 1151Z and top cover 1151W is shown in the exploded view of FIG. 102. USB connector 1154D comprising rigid sheath 1154C and board mounted USB electrical connector 1154B is covered by polymeric cover 1154A to produce completed USB connector 1154. An expanded view is shown in FIG. 103A identifying rigid PCBs 1159A interconnected in a redundant array by flex connectors 1159B. FIG. 103B illustrates a side view of the rigid-flex PCB assembled into the polymeric covers.

FIG. 104 illustrates various views of the tops and bottom polymeric covers including top cover exterior view 1151W, top cover interior view 1151X, bottom cover interior view 1151Y, and bottom cover interior view 1151Z. Polymeric straps used to hold the reconfigurable LightPads together include polymeric straps 1152 and rigid plastic pins 1157.

Perspective photographs of a rigid-flex PCBs is shown in FIG. 106A including the top view of rigid PCB 1159A and flex 1159B prior to and after SMT assembly and prior to removal of support frame 1160, and FIG. 106B comprising rigid-flex PCB 1159 including LEDs 1153A. Top and underside photos of polymeric LightPads are shown in FIG. 107.

Other shapes adaptable as LightPads or as sensor arrays using hexagonal rigid-flex PCBs include cranial cap of FIG. 108 including underside view 1160A and top perspective view 1160B, facial mask 1161 in FIG. 109, and cup shaped LightPad for knees, heels, shoulders, elbows, etc. shown in perspectives 1162A through 1162D in FIG. 110.

We claim:

1. A rigid-flex printed circuit board (PCB) comprising an array of rigid printed circuit boards (PCBs) positioned at locations on a flexible PCB, said flexible PCB extending through said rigid PCBs and comprising a network of flexible connectors interconnecting said rigid PCBs, said array comprising a first rigid PCB and a second rigid PCB, a first flexible connector extending between said first and second rigid PCBs, said first flexible connector comprising a first electrical line electrically connecting said first and second rigid PCBs, wherein said rigid-flex PCB further comprises at least one redundant current path in parallel with said first electrical line electrically connecting said first and second rigid PCBs, said redundant current path extending through one or more flexible connectors in said network other than said first flexible connector.

2. The rigid-flex PCB of claim 1 wherein said redundant current path extends through at least one rigid PCB in said array other than said first and second rigid PCBs.

3. The rigid-flex PCB of claim 2 wherein said array of rigid PCBs are arranged in a rectangular grid, and wherein a plurality of flexible connectors connect each of said rigid PCBs to neighboring rigid PCBs to form an orthogonal network of flexible connectors.

4. The rigid-flex PCB of claim 3 wherein said network of flexible connectors comprises a diagonal flexible connector.

5. The rigid-flex PCB of claim 4 wherein said network of flexible connectors comprises an x-shaped junction link.

6. The rigid-flex PCB of claim 3 comprising an end cap external to said rectangular grid, said end cap comprising an arrangement of flexible connectors connecting all of said rigid PCBs along one side of said of said array.

7. The rigid-flex PCB of claim 3 comprising a flexible connector extending outside a perimeter of said rectangular grid.

8. The rigid-flex PCB of claim 2 wherein said array of rigid PCBs are arranged in a hexagonal grid.

9. The rigid-flex PCB of claim 8 wherein a plurality of flexible connectors connect each of said rigid PCBs to neighboring rigid PCBs.

10. The rigid-flex PCB of claim 1 wherein said first electrical line is for carrying an electrical signal from said first rigid PCB to said second rigid PCB.

11. The rigid-flex PCB of claim 1 wherein said first electrical line is for supplying electrical power from said first rigid PCB to said second rigid PCB.

12. The rigid-flex PCB of claim 1 wherein said first electrical line is for providing a ground potential to said first rigid PCB and to said second rigid PCB.

13. The rigid flex PCB of claim 1 further comprising a metallic mesh physically connected to said rigid PCB and extending over said first flexible connector.

14. The rigid-flex PCB of claim 1 wherein neither a plug nor a socket is used to connect said first flexible connector to either of said first rigid PCB or said second rigid PCB.

15. The rigid-flex PCB of claim 1 further comprising a plurality of a light-emitting diodes (LEDs), each of said LEDs being mounted on one of said rigid PCBs in said array.

16. The rigid-flex PCB of claim 13 wherein said rigid PCBs and said flexible PCB are encased in a flexible pad, an opening being formed in said flexible pad around each of said LEDs such that each of said LEDs is exposed to an environment surrounding said flexible pad.

17. The rigid-flex PCB of claim 1 wherein said first rigid PCB comprises a first portion and a second portion, said first portion of said first rigid PCB being located on a first side of said flexible PCB, said second portion of said first rigid PCB being located on a second side of said flexible PCB such that said flexible PCB is sandwiched between said first and second portions of said first rigid PCB.

18. The rigid-flex PCB of claim 17 wherein said first portion of said first rigid PCB comprises:

a first metal layer; and a first rigid insulating layer, said first rigid insulating layer being located between said first metal layer and said flexible PCB.

19. The rigid-flex PCB of claim 18 wherein said flexible PCB comprises second and third metal layers separated by a first flexible insulating layer, said second and third metal layers being flexible.

20. The rigid-flex PCB of claim 19 wherein said second portion of said first rigid PCB comprises:

a fourth metal layer; and a second rigid insulating layer, said second rigid insulating layer being located between said fourth metal layer and said flexible PCB.

21. The rigid-flex PCB of claim 20 wherein said second and third metal layers are exposed to an outside environment in an area of said flexible PCB not sandwiched between said first and second portions of said first rigid PCB.

22. The rigid-flex PCB of claim 20 wherein said flexible PCB further comprises:

a second flexible insulating layer positioned between said second metal layer and said first rigid insulating layer; and a third flexible insulating layer position between said third metal layer and said second rigid insulating layer.

23. The rigid-flex PCB of claim 22 wherein said second metal layer is covered by said second flexible insulating layer and said third metal layer is covered by said third flexible insulating layer in an area of said flexible PCB not sandwiched between said first and second portions of said first rigid PCB.

24. The rigid-flex PCB of claim 22 further comprising a conductive via through said first rigid insulating layer and said second flexible insulating layer, said conductive via electrically connecting said first and second metal layers.

25. The rigid-flex PCB of claim 22 further comprising a conductive via through said first flexible conductive layer, said conductive via electrically connecting said second and third metal layers.

26. The rigid-flex PCB of claim 22 further comprising a conductive via through said first rigid insulating layer, said second flexible conductive layer, said first flexible conductive layer, and said first flexible insulating layer said conductive via electrically connecting said first, second and third metal layers.

* * * * *